US010504584B2

(12) United States Patent
Aoyama et al.

(10) Patent No.: US 10,504,584 B2
(45) Date of Patent: Dec. 10, 2019

(54) DISPLAY METHOD AND DISPLAY DEVICE

(71) Applicant: Panasonic Intellectual Property Corporation of America, Torrance, CA (US)

(72) Inventors: Hideki Aoyama, Osaka (JP); Mitsuaki Oshima, Kyoto (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

(21) Appl. No.: 15/838,791

(22) Filed: Dec. 12, 2017

(65) Prior Publication Data

US 2018/0114566 A1 Apr. 26, 2018

Related U.S. Application Data

(63) Continuation of application No. PCT/JP2016/087072, filed on Dec. 13, 2016.
(Continued)

(30) Foreign Application Priority Data

Dec. 17, 2015 (JP) ................................ 2015-245738
May 18, 2016 (JP) ................................ 2016-100008
(Continued)

(51) Int. Cl.
*G11C 5/02* (2006.01)
*G11C 11/418* (2006.01)
(Continued)

(52) U.S. Cl.
CPC .......... *G11C 11/418* (2013.01); *G02B 27/017* (2013.01); *G06F 3/011* (2013.01);
(Continued)

(58) Field of Classification Search
CPC ........ G11C 11/418; G06F 3/011; G06F 3/012; G06F 3/013; G06F 3/04842; G06F 3/04847; G06F 3/1454; G06F 3/147
See application file for complete search history.

(56) References Cited

U.S. PATENT DOCUMENTS 4,807,031 A 2/1989 Broughton et al.
6,801,719 B1 * 10/2004 Szajewski ............ G02B 3/0056 348/64
(Continued)

FOREIGN PATENT DOCUMENTS

CA 2927809 A1 7/2015
CN 101009760 A 8/2007
(Continued)

OTHER PUBLICATIONS

Communication pursuant to Article 94(3) EPC dated Sep. 25, 2018 for the related European Patent Application No. 13867350.4.
(Continued)

*Primary Examiner* — Pho M Luu
(74) *Attorney, Agent, or Firm* — Greenblum & Bernstein, P.L.C.

(57) ABSTRACT

A display method capable of displaying an image valuable to a user is provided. The display method for a display device to display an image includes: obtaining a captured display image and an image for decoding by an image sensor capturing a subject; decoding the image for decoding to obtain light identification information (light ID); transmitting the light ID to a server; obtaining an augmented reality (AR) image and recognition information corresponding to the light ID from the server; out of the captured display image, recognizing a region corresponding to the recogni-
(Continued)

tion information as a target region; and displaying the captured display image with the AR image superimposed on the target region.

15 Claims, 305 Drawing Sheets

Related U.S. Application Data

(60) Provisional application No. 62/338,071, filed on May 18, 2016, provisional application No. 62/276,454, filed on Jan. 8, 2016, provisional application No. 62/268,693, filed on Dec. 17, 2015.

(30) Foreign Application Priority Data

| | | |
|---|---|---|
| Jun. 21, 2016 | (JP) | 2016-123067 |
| Jul. 25, 2016 | (JP) | 2016-145845 |

(51) Int. Cl.

| | |
|---|---|
| ***H04B 10/116*** | (2013.01) |
| ***H04N 21/4223*** | (2011.01) |
| ***H04N 13/332*** | (2018.01) |
| ***G02B 27/01*** | (2006.01) |
| ***G06F 3/01*** | (2006.01) |
| ***G11C 11/419*** | (2006.01) |
| ***G06F 3/14*** | (2006.01) |
| ***G09G 3/34*** | (2006.01) |
| ***G09G 5/14*** | (2006.01) |
| ***H04N 21/239*** | (2011.01) |
| ***H04N 21/442*** | (2011.01) |
| ***H04N 21/4722*** | (2011.01) |
| ***G06F 3/0488*** | (2013.01) |
| ***G06F 3/0484*** | (2013.01) |
| ***G06F 3/147*** | (2006.01) |
| ***G09G 3/00*** | (2006.01) |
| ***G06Q 30/02*** | (2012.01) |
| ***G06K 9/00*** | (2006.01) |
| ***G06K 9/32*** | (2006.01) |
| *G02B 27/64* | (2006.01) |
| *H01L 51/50* | (2006.01) |
| *H04W 4/80* | (2018.01) |

(52) U.S. Cl.

CPC .............. *G06F 3/012* (2013.01); *G06F 3/013* (2013.01); *G06F 3/04842* (2013.01); *G06F 3/04847* (2013.01); *G06F 3/04883* (2013.01); *G06F 3/147* (2013.01); *G06F 3/1454* (2013.01); *G06K 9/00671* (2013.01); *G06K 9/3233* (2013.01); *G06Q 30/0241* (2013.01); *G09G 3/001* (2013.01); *G09G 3/346* (2013.01); *G09G 5/14* (2013.01); *G11C 11/419* (2013.01); *H04B 10/116* (2013.01); *H04N 13/332* (2018.05); *H04N 21/2393* (2013.01); *H04N 21/4223* (2013.01); *H04N 21/44218* (2013.01); *H04N 21/4722* (2013.01); *G02B 27/646* (2013.01); *G09G 2360/144* (2013.01); *G09G 2370/022* (2013.01); *G09G 2370/04* (2013.01); *G09G 2370/042* (2013.01); *G09G 2370/06* (2013.01); *G09G 2370/10* (2013.01); *G09G 2370/16* (2013.01); *G09G 2370/18* (2013.01); *G09G 2380/10* (2013.01); *H01L 51/5012* (2013.01); *H04W 4/80* (2018.02)

(56) References Cited

U.S. PATENT DOCUMENTS

| | | | | |
|---|---|---|---|---|
| 8,248,467 | B1 | 8/2012 | Ganick et al. | |
| 8,334,901 | B1 | 12/2012 | Ganick et al. | |
| 8,773,577 | B2 * | 7/2014 | Velarde | H04N 5/232 348/364 |
| 9,153,010 | B2 * | 10/2015 | Tezuka | H04N 1/40068 |
| 2002/0167701 | A1 | 11/2002 | Hirata | |
| 2004/0161246 | A1 | 8/2004 | Matsushita et al. | |
| 2005/0169643 | A1 | 8/2005 | Franklin | |
| 2007/0046789 | A1 | 3/2007 | Kirisawa | |
| 2008/0055041 | A1 | 3/2008 | Takene et al. | |
| 2008/0187318 | A1 | 8/2008 | Osanai | |
| 2009/0002265 | A1 | 1/2009 | Kitaoka et al. | |
| 2009/0214225 | A1 | 8/2009 | Nakagawa et al. | |
| 2010/0034540 | A1 | 2/2010 | Togashi | |
| 2011/0007160 | A1 | 1/2011 | Okumura | |
| 2011/0007171 | A1 | 1/2011 | Okumura et al. | |
| 2011/0019016 | A1 | 1/2011 | Saito et al. | |
| 2011/0025730 | A1 | 2/2011 | Ajichi | |
| 2011/0063510 | A1 | 3/2011 | Lee et al. | |
| 2011/0064416 | A1 | 3/2011 | Rajagopal et al. | |
| 2011/0069971 | A1 | 3/2011 | Kim et al. | |
| 2011/0135317 | A1 | 6/2011 | Chaplin | |
| 2011/0216049 | A1 | 9/2011 | Jun et al. | |
| 2012/0077431 | A1 | 3/2012 | Fyke et al. | |
| 2012/0188442 | A1 | 7/2012 | Kennedy | |
| 2012/0206648 | A1 | 8/2012 | Casagrande et al. | |
| 2013/0055072 | A1 * | 2/2013 | Arnold | G06T 15/005 715/240 |
| 2013/0208027 | A1 | 8/2013 | Bae et al. | |
| 2013/0329440 | A1 | 12/2013 | Tsutsumi et al. | |
| 2013/0330088 | A1 | 12/2013 | Oshima et al. | |
| 2014/0186052 | A1 | 7/2014 | Oshima et al. | |
| 2015/0139552 | A1 | 5/2015 | Xiao et al. | |
| 2017/0140457 | A1 | 5/2017 | Kaku et al. | |

FOREIGN PATENT DOCUMENTS

| | | | |
|---|---|---|---|
| CN | 102811284 | A | 12/2012 |
| EP | 1912354 | A1 | 4/2008 |
| EP | 2503852 | A1 | 9/2012 |
| EP | 2538584 | A1 | 12/2012 |
| EP | 2940892 | A1 | 11/2015 |
| JP | 2002-290335 | | 10/2002 |
| JP | 2004-334269 | A | 11/2004 |
| JP | 2006-237869 | A | 9/2006 |
| JP | 2007-189341 | A | 7/2007 |
| JP | 2007-264905 | A | 10/2007 |
| JP | 2007-274052 | | 10/2007 |
| JP | 2008-192000 | A | 8/2008 |
| JP | 2008-252570 | A | 10/2008 |
| JP | 2009-117892 | A | 5/2009 |
| JP | 2010-226172 | A | 10/2010 |
| JP | 2010-278573 | A | 12/2010 |
| JP | 2011-023819 | A | 2/2011 |
| JP | 2011-029735 | A | 2/2011 |
| JP | 2011-223060 | A | 11/2011 |
| JP | 2012-073920 | A | 4/2012 |
| JP | 2012-169189 | A | 9/2012 |
| JP | 2012-195763 | A | 10/2012 |
| JP | 2013-506226 | | 2/2013 |
| JP | 2013-223209 | A | 10/2013 |
| JP | 2015-509336 | A | 3/2015 |
| JP | 2015-119469 | A | 6/2015 |
| JP | 2015-524103 | | 8/2015 |
| JP | 2015-179392 | A | 10/2015 |
| TW | M506428 | U | 8/2015 |
| WO | 1994/026063 | A1 | 11/1994 |
| WO | 1999/044336 | A1 | 9/1999 |
| WO | 2003/036829 | A1 | 5/2003 |
| WO | 2006/123697 | A1 | 11/2006 |
| WO | 2007/004530 | A1 | 1/2007 |
| WO | 2009/113415 | A1 | 9/2009 |
| WO | 2009/144853 | A1 | 12/2009 |
| WO | 2011/041466 | | 4/2011 |

(56) References Cited

FOREIGN PATENT DOCUMENTS

| | | | |
|---|---|---|---|
| WO | 2013/109934 | A1 | 7/2013 |
| WO | 2013/175803 | A1 | 11/2013 |
| WO | 2014/103155 | | 7/2014 |
| WO | 2015/145544 | | 10/2015 |
| WO | 2018/088380 | A1 | 5/2018 |

OTHER PUBLICATIONS

The Extended European Search Report dated Oct. 9, 2018 for the related European Patent Application No. 16861768.6.
Communicatioin pursuant to Article 94(3) EPC dated May 31, 2018 for the related European Patent Application No. 13867015.3.
The Extended European Search Report dated Oct. 22, 2018 for the related European Patent Application No. 16863834.4.
Communication pursuant to Article 94(3) EPC dated Mar. 15, 2018 for the related European Patent Application No. 13869275.1.
English Translation of Chinese Search Report dated Jun. 19, 2017 for the related Chinese Patent Application No. 201380066377.0.
English Translation of Chinese Search Report dated Oct. 31, 2017 for the related Chinese Patent Application No. 201380067922.8.
English Translation of Chinese Search Report dated Nov. 2, 2017 for the related Chinese Patent Application No. 201480056651.0.
English Translation of Chinese Search Report dated Dec. 14, 2017 for the related Chinese Patent Application No. 201480045974.X.
Christos Danakis et al., "Using a CMOS Camera Sensor for Visible Light Communication", 3rd IEEE Workshop on Optical Wireless Communications (OWC'12), pp. 1244-1248, Dec. 7, 2012.
Australian Examination Report dated Mar. 12, 2018 for the related Australian Patent Application No. 2014371943.
Communication pursuant to Article 94(3) EPC dated Apr. 10, 2018 for the related European Patent Application No. 13868307.3.
Communication pursuant to Article 94(3) EPC dated Apr. 10, 2018 for the related European Patent Application No. 13868043.4.
Communication pursuant to Article 94(3) EPC dated Apr. 17, 2018 for the related European Patent Application No. 13866548.4.
The result of consultation of Jul. 20, 2018 dated Jul. 27, 2018 for the related European Patent Application No. 13868814.8.
International Search Report of PCT application No. PCT/JP2016/087072 dated Mar. 21, 2017.
Communication pursuant to Article 94(3) EPC dated Jun. 14, 2018 for the related European Patent Application No. 13869196.9.
Communication pursuant to Article 94(3) EPC dated Jun. 20, 2018 for the related European Patent Application No. 13868814.8.
Summons to attend oral proceedings pursuant to Rule 115(1) EPC dated Apr. 3, 2019 for the related European Patent Application No. 13867905.5.
English Translation of Chinese Search Report dated Apr. 22, 2019 for the related Chinese Patent Application No. 201710626611.0.
The Extended European Search Report dated Dec. 13, 2018 for the related European Patent Application No. 16875643.5.
Office Action of the U.S. Patent and Trademark Office dated Jun. 21, 2018 for the U.S. Appl. No. 15/381,940.
International Search Report of PCT application No. PCT/JP2019/014013 dated Jun. 18, 2019.

* cited by examiner

FIG. 34

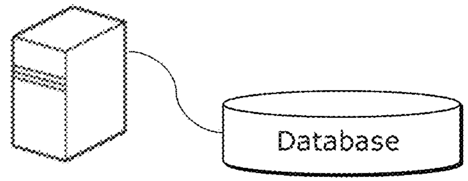

| ID | Data | Condition | Number of accesses | Number of successful accesses |
|---|---|---|---|---|
| 1000 | http://~~~ | From 2013/10/10 09:00 to 2013/10/25 20:00 | 1234 | 567 |
| 2000 | "Hello world" | Number of successful accesses is less than or equal to 100 | 153 | 100 |
| 3000 | 10% off | Female only | 9999 | 666 |
| 4000 | Position data (east longitude, north latitude, altitude, floor number, room number, etc.) | None | 2 | 2 |

(a)ID-data table

| ID | User ID | Time | Ancillary information | Whether or not data is provided |
|---|---|---|---|---|
| 1000 | 35393 | 2013/10/25 19:11 | Male, age 20, student ... | ○ / http://~~~ |
| 1000 | 49282 | 2013/10/25 19:57 | Female, age 30, housewife ... | ○ / http://~~~ |
| 1000 | 222 | 2013/10/25 20:15 | Male, age 40, civil servant ... | × / "Error" |
| 2000 | 30455 | 2013/10/27 12:12 | Female, age 50, unemployed ... | ○ / "Hello world" |

(b) Access log table

FIG. 131A

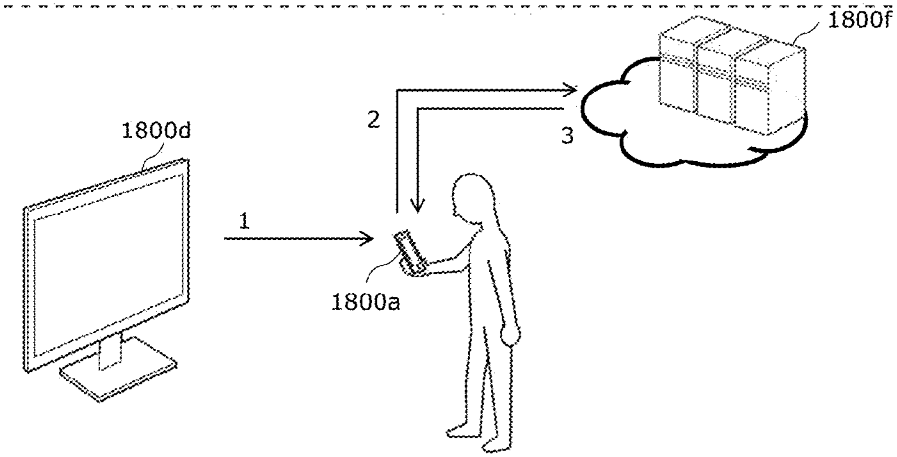

| | 1 | 2 | Server | 3 | Receiver operation |
|---|---|---|---|---|---|
| a | Content ID, ongoing content reproduction time point | Content ID | | Content | Reproduce content from point of time of (ongoing content reproduction time point + elapsed time since ID reception) |
| b | Content ID, ongoing content reproduction time point | Content ID, ongoing content reproduction time point | | Partial content on and after ongoing content reproduction time point | Reproduce partial content after point of time of (elapsed time since ID reception) |
| c | Transmitter ID, ongoing content reproduction time point | Transmitter ID | Identify content that is being reproduced, from reproduction schedule of each transmitter and server time point | Content | Reproduce content from point of time of (ongoing content reproduction time point + elapsed time since ID reception) |
| d | Transmitter ID, transmitter time point | Transmitter ID, transmitter time point | Identify content that is being reproduced, from reproduction schedule of each transmitter and server time point | Content, ongoing content reproduction time point | Reproduce content from point of time of (ongoing content reproduction time point + elapsed time since ID reception) |
| e | Transmitter ID | Transmitter ID | Identify content that is being reproduced, from reproduction schedule of each transmitter and server time point | Content, content reproduction start time point | Clock setting of receiver Reproduce content from point of time of (receiver time point – content reproduction start time point) |

FIG. 160

| FLEN [bit] | Lengthof ID/DATA [bit] |
|---|---|
| 000 | For experiment |
| 001 | 32 |
| 010 | 64 |
| 011 | 128 |
| 100 | 256 |
| 101 | 512 |
| 110 | 1024 |
| 111 | 2048 |

(a)

| FLEN [bit] | Lengthof ID/DATA [bit] |
|---|---|
| 0000 | For experiment |
| 0001 | For experiment |
| 0010 | 4 |
| 0011 | 8 |
| 0100 | 16 |
| 0101 | 32 |
| 0110 | 64 |
| 0111 | 128 |
| 1000 | 256 |
| 1001 | 512 |
| 1010 | 1024 |
| 1011 | 2048 |
| 1100 | 4096 |
| 1101 | 8192 |
| 1110 | 16384 |
| 1111 | 32768 |

| Length tobe checked | Length of CRC | Generator polynomial |
|---|---|---|
| <= 16 | 8 | X8 + X7 + X6 + X4 + X2 + 1 |
| <= 64 | 12 | X12 + X11 + X3 + X2 + X + 1 |
| <= 256 | 16 | X16 + X15 + X2 + 1 |
| <= 1024 | 20 | |

(a)

| Length tobe checked | Length of CRC | Generator polynomial |
|---|---|---|
| <= 16 | 8 | X8 + X7 + X6 + X4 + X2 + 1 |
| <= 64 | 12 | X12 + X11 + X3 + X2 + X + 1 |
| <= 256 | 16 | X16 + X15 + X2 + 1 |
| >256 | 24 | X24 + X23 + X18 + X17 + X14 + X11 + X10 + X7 + X6 + X5 + X4 + X3 + X + 1 |

| PRE [slot] | | Length of DATAPART [bit] |
|---|---|---|
| Last address | Not last address | |
| 1101 0000 0000 | 0000 0000 1101 | 64 |
| 1011 0000 0000 | 0000 0000 1011 | 32 |
| 1100 1000 0000 | 0000 0001 1001 | 16 |
| 1001 1000 0000 | 0000 0001 0011 | 8 |
| 1010 1000 0000 | 0000 0001 0101 | 4 |

(a)

| PRE [slot] | Length of DATAPART [bit] |
|---|---|
| 1101 0000 0000 | 64 (Not last address) |
| 1011 0000 0000 | 32 (Not last address) |
| 1100 1000 0000 | 16 (Not last address) |
| 1001 1000 0000 | 8 (Not last address) |
| 1010 1000 0000 | 4 (Not last address) |
| 0000 0001 0101 | Last address |

(b)

| PRE [slot] | The number of divisions |
|---|---|
| 1110 0000 0000 | 1 (Not divided) |
| 0000 0000 0111 | 1 (Not divided) |
| 0000 0000 1101 | 2 |
| 0000 0000 1011 | 4 |
| 0000 0001 0101 | 6 |
| 0000 0001 0011 | 8 |
| 0000 0001 1001 | 10 |

| ADDR [bit] | Address of DATAPART |
|---|---|
| 0000 | 0 |
| 0001 | 1 |
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | 10 |
| 1011 | 11 |
| 1100 | 12 |
| 1101 | 13 |
| 1110 | 14 |
| 1111 | 15 |

(a)

| PARTNUM [bit] | The number of divisions |
|---|---|
| 000 | 2 |
| 001 | 4 |
| 010 | 6 |
| 011 | 8 |
| 100 | 10 |
| 101 | 12 |
| 110 | 14 |
| 111 | 16 |

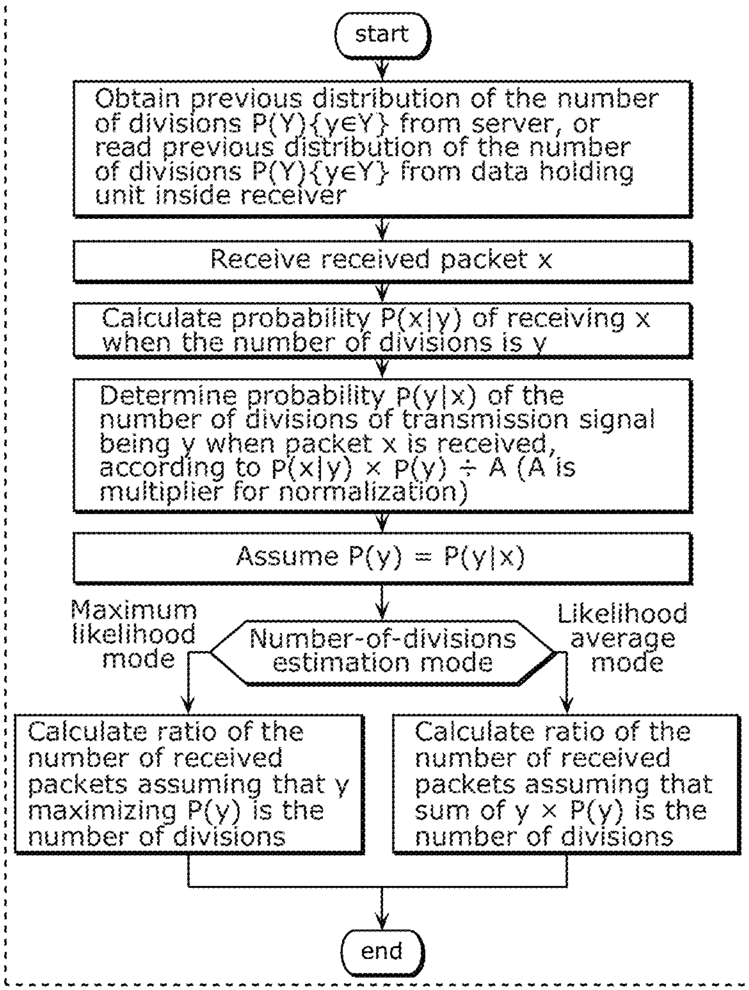

Previous distribution of the number of divisions is:
- determined as distribution of the number of transmitters that transmit data divided by such number of divisions
- determined for each packet length
- determined for each application
- determined for each identifiable range where receiver is present

| Address of received packet | | The number of divisions y | | | A | The number-of-divisions estimation mode | |
|---|---|---|---|---|---|---|---|
| | | 4 | 6 | 8 | | Maximum likelihood mode | Likelihood average mode |
| | P(y) | 0.333 | 0.333 | 0.333 | | 6 | 6.000 |
| Address 1 | P(x\|y) | 0.250 | 0.167 | 0.125 | | | |
| | P(y)P(x\|y) | 0.083 | 0.056 | 0.042 | 0.181 | | |
| | P(y\|x) | 0.462 | 0.308 | 0.231 | | 4 | 5.538 |
| Address 2 | P(x\|y) | 0.250 | 0.167 | 0.125 | | | |
| | P(y)P(x\|y) | 0.115 | 0.051 | 0.029 | 0.196 | | |
| | P(y\|x) | 0.590 | 0.262 | 0.148 | | 4 | 5.115 |
| Address 5 | P(x\|y) | 0.000 | 0.167 | 0.125 | | | |
| | P(y)P(x\|y) | 0.000 | 0.044 | 0.018 | 0.062 | | |
| | P(y\|x) | 0.000 | 0.703 | 0.297 | | 6 | 6.593 |

Calculation example

FIG. 181
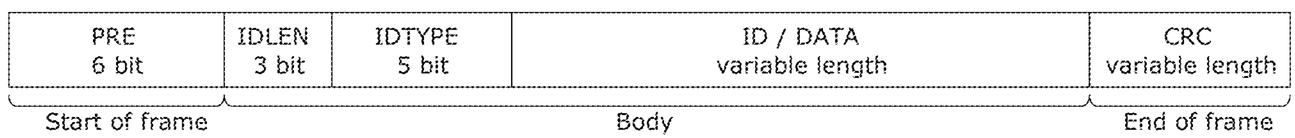
(a)
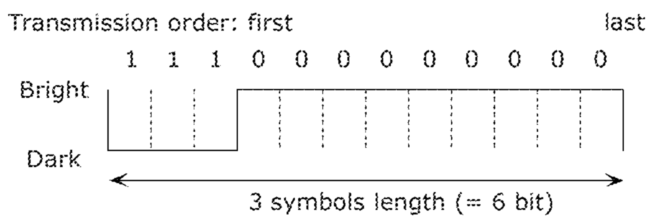
(b)
| IDLEN [bit] | Lengthof ID/DATA [bit] |
|---|---|
| 000 | reserved |
| 001 | 32 |
| 010 | 64 |
| 011 | 128 |
| 100 | 256 |
| 101 | 512 |
| 110 | 1024 |
| 111 | reserved |
(c)

FIG. 183

| Number of frames | Length of DATAPART [bit] | | | | |
|---|---|---|---|---|---|
| | 4 | 8 | 16 | 32 | 64 |
| 1 | 4 | 8 | 16 | 32 | 64 |
| 2 | 8 | 16 | 32 | 64 | 128 |
| 3 | 12 | 24 | 48 | 96 | 192 |
| 4 | 16 | 32 | 64 | 128 | 256 |
| 5 | 20 | 40 | 80 | 160 | 320 |
| 6 | 24 | 48 | 96 | 192 | 384 |
| 7 | 28 | 56 | 112 | 224 | 448 |
| 8 | 32 | 64 | 128 | 256 | 512 |
| 9 | 36 | 72 | 144 | 288 | 576 |
| 10 | 40 | 80 | 160 | 320 | 640 |
| 11 | 44 | 88 | 176 | 352 | 704 |
| 12 | 48 | 96 | 192 | 384 | 768 |
| 13 | 52 | 104 | 208 | 416 | 832 |
| 14 | 56 | 112 | 224 | 448 | 896 |
| 15 | 60 | 120 | 240 | 480 | 960 |
| 16 | 64 | 128 | 256 | 512 | 1024 |

FIG. 185

| PTYPE [bit] | Partitiontype of BODY |
|---|---|
| 00 | Singleframe compatible |
| 01 | Data stream |
| 10 | reserved |
| 11 | reserved |

(a)

| PTYPE [bit] | Partitiontype of BODY |
|---|---|
| 0 | Singleframe compatible |
| 1 | Data stream |

| Lengthof ID [bit] | Number of frames | DATAPART [bit] | Joined data [bit] | IELEN [bit] | IDTYPE [bit] | CRC [bit] | PADDING [bit] |
|---|---|---|---|---|---|---|---|
| 32 | 7<br>14 | 8<br>4 | 56 | 3 | 5 | 12 | 2 |
| 64 | 6<br>12 | 16<br>8 | 96 | 3 | 5 | 16 | 6 |
| 128 | 5<br>10 | 32<br>16 | 160 | 3 | 5 | 16 | 6 |
| 256 | 5<br>10 | 64<br>32 | 320 | 3 | 5 | 24 | 30 |
| 512 | 9 | 64 | 576 | 3 | 5 | 24 | 30 |

FIG. 187

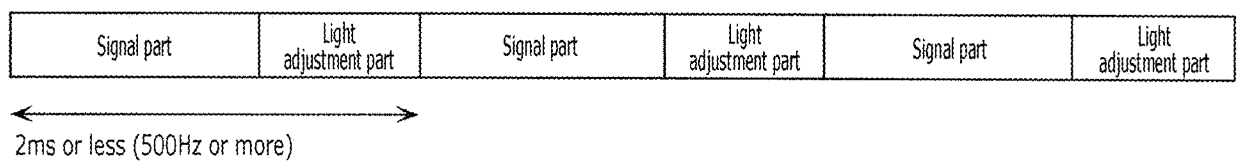

| | | |
|---|---|---|
| 2ms or less | 500Hz or more | Subject is not seen in camera because of extremely bright state |
| 2.5ms or less | 400Hz or more | Subject is not seen in camera because of bright state |
| 3ms or less | 333Hz or more | Subject is not seen in human eye because of dark state in both transmission light and environment light |
| 4ms or less | 250Hz or more | Subject is not seen in human eye in almost all normal states |
| 5ms or less | 200Hz or more | Subject is not seen in camera in about indoor brightness |
| 8.3ms or less | 120Hz or more | Subject cannot be recognized by human when transmission light is bright |
| 10ms or less | 100Hz or more | Subject cannot be recognized by human when surroundings are bright |
| 16.7ms or less | 60Hz or more | Critical frequency at which human can recognize blinking |

$(P_1, P_2, P_3, P_4) = (100, 100, 100, 100)$
$D_{Ri} = 120 + 20x_i$ ($i \in 1$ To 4, $x_i \in 0$ To 15)
$D_{Li} = 120 + 20 \times (15 - x_i)$ Only one of Data L and Data R is required
Dimming: Luminance adjustment (not required)
C1 > 100 when Data R is included
C2 > 100 when Data L is included
(Constants are provisional numbers)

16 bits include
4-bit : Address
8-bit : Data
4-bit : Error detection $(P_1, P_2, P_3) = (160, 180, 160)$ $D_{Ri} = 180 + 20\ x_i\ (i \in 1 \text{ To } 4,\ x_i \in 0 \text{ To } 15)$ Pulse width < 10

| | Signal A (both sides) | Signal A (single side) | Signal B |
|---|---|---|---|
| Longest [us] | 2560 | <1520 | 2420 |
| Shortest [us] | 2560 | 880 | 1220 |

FIG. 190

| | IEC (4 bit) | IEC (8 bit) | Method of embodiment (One side of Data) | Method of embodiment (Both sides of Data) |
|---|---|---|---|---|
| Maximum luminance | 75% | 75% | 82% | 69% |
| Minimum luminance | 46% | 42% | 18% | 31% |

In case where signal part + light adjustment part is 4ms or less (250Hz or more)

FIG. 197

PHY Mode 1 (For ID communication)

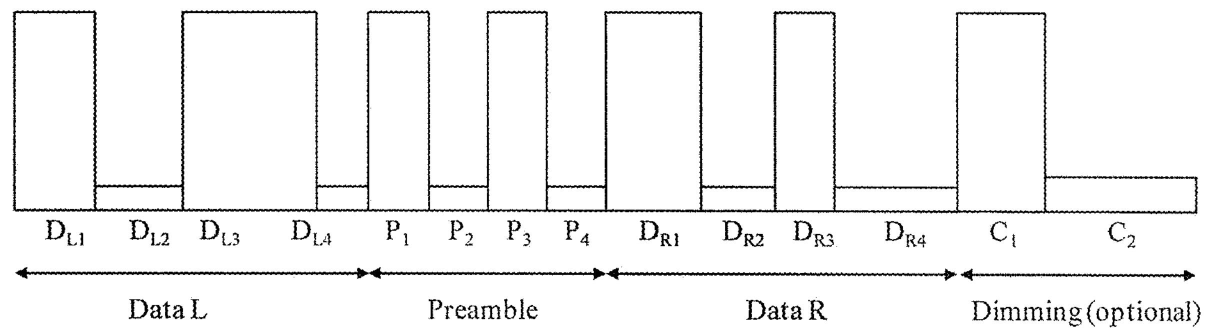

$(P_1, P_2, P_3, P_4) = (100, 90, 90, 100)$ $D_{Ri} = 120 + 20 \times x_i$ ($i \in 1$ To $4$, $x_i \in 0$ To $15$)

$D_{Li} = 120 + 20 \times (15 - x_i)$

Only one of Data L and Data R is required
- Range of luminance adjustment can be increased by transmitting only either one
- Only convenient part to middle of Data L or Data R may be transmitted
- For example, transmit only $D_{L3}$, $D_{L4}$, $D_{R1}$, $D_{R2}$ Dimming: Luminance adjustment (not required)
- C1 > 50 when Data R is included
- C2 > 50 when Data L is included

PHY Mode 1b (For ID communication)

$(P_1, P_2, P_3, P_4) = (100, 90, 90, 100)$ [us]
$D_{Ri}$ = V4PPM × 8 (50 us in width)
$D_{Li}$ = V4PPM × 8 (Data identical to $D_{ri}$, average luminance may be changed)

Only one of Data L and Data R is required
When only either Data is included, insert 1111 or 0000 into omitted place
Dimming: Luminance adjustment (not required)

PHY Mode 3 (For continuous communication)

$(P_1, P_2, P_3, P_4) = (50, 60, 60, 50)$ $D_{2i} = D_{2i+1} = 50 + 15 \times x_i$ ($x_i \in$ 0 To 15, i=1 To 2N)

N is fixed value

Alternatively, N can be variable-length by initial several bits indicating length of N Transmission length can be reduced or light can be adjusted by $D_{2i} + D_{2i+1} = 100 + 20x_i$ PHY Mode 3 (For continuous communication)

$(P_1, P_2, P_3, P_4) = (100, 90, 90, 100)$ [us]

$D_{Ri} = 4$ VPPM $\times$ 8 (50 us in width)

$D_{Li} = 4$ VPPM $\times$ 8 (Data identical to $D_{ri}$, average luminance may be changed)

Only one of Data L and Data R is required

When only either Data is included, insert 1111 or 0000 into omitted place

Dimming: Luminance adjustment (not required)

FIG. 203

Packet Modulation

| | | | bit 1 | bit 2 | bit 3 | bit 4 | |
|---|---|---|---|---|---|---|---|
| $x_1$ | = | ( | $P_1$ | $D_{a1}$ | S | $D_{b1}$ | ) |
| $x_2$ | = | ( | $P_2$ | $D_{a2}$ | $A_1$ | $D_{b2}$ | ) |
| $x_3$ | = | ( | $P_3$ | $D_{a3}$ | $A_2$ / $D_{a6}$ | $D_{b3}$ | ) |
| $x_4$ | = | ( | $P_4$ | $D_{a4}$ | $A_2$ / $D_{a5}$ | $A_3$ / $D_{b4}$ | ) |

A : Address
D : Data
P : Parity
S : Stop bit

Packet length can be reduced when $D_b$ is 0 by placing $D_b$ at fourth bit
Packet length can be reduced when number of packet divisions is small by placing A3 at fourth bit
Stop may be performed when data is all 0, instead of stop bit
Efficiency is better than 0 stop when number of divisions is 8 or less, by using stop bit
Placing in upper bit can make it unlikely that reception error occurs in important stop bit and address
Further performing conversion as in right table reduces change of 0 and 1 and can make it unlikely that error occurs

| w | x (Bit representation) |
|---|---|
| 0 | 0 (0000) |
| 1 | 1 (0001) |
| 2 | 3 (0011) |
| 3 | 2 (0010) |
| 4 | 6 (0110) |
| 5 | 7 (0111) |
| 6 | 5 (0101) |
| 7 | 4 (0100) |
| 8 | 12 (1100) |
| 9 | 13 (1101) |
| 10 | 15 (1111) |
| 11 | 14 (1110) |
| 12 | 10 (1010) |
| 13 | 11 (1011) |
| 14 | 9 (1001) |
| 15 | 8 (1000) |

FIG. 204

Packet Parity

| | | | bit 1 | bit 2 | bit 3 | bit 4 | |
|---|---|---|---|---|---|---|---|
| $x_1$ | = | ( | $x_{11}$ | $x_{12}$ | $x_{13}$ | $x_{14}$ | ) |
| $x_2$ | = | ( | $x_{21}$ | $x_{22}$ | $x_{23}$ | $x_{24}$ | ) |
| $x_3$ | = | ( | $x_{31}$ | $x_{32}$ | $x_{33}$ | $x_{34}$ | ) |
| $x_4$ | = | ( | $x_{41}$ | $x_{42}$ | $x_{43}$ | $x_{44}$ | ) |

$P_1 = x_{11} = XOR(x_{23}, x_{33}, x_{43})$
$P_2 = x_{21} = XOR(x_{13}, x_{33}, x_{43})$
$P_3 = x_{31} = XOR(x_{13}, x_{23}, x_{43})$
$P_4 = x_{41} = XOR(x_{13}, x_{23}, x_{33})$

P1 = x13 = XOR(x21, x32)
P2 = x23 = XOR(x31, x42)
P3 = x33 = XOR(x41, x12)
P4 = x43 = XOR(x11, x22)

P1 = x13 = x31
P2 = x23 = x41
P3 = x33 = x11
P4 = x43 = x21

P1 = x11 = XOR(x13, x23)
P2 = x21 = XOR(x23, x33)
P3 = x31 = XOR(x33, x43)
P4 = x41 = XOR(x43, x13)

P1 = x13 = XOR(x21, x42)
P2 = x23 = XOR(x31, x12)
P3 = x33 = XOR(x41, x22)
P4 = x43 = XOR(x11, x32)

Error correction and detection can be efficiently performed by using such parity

FIG. 210

Data Size

| Packet Division | Data Size [bit] a | a + b |
|---|---|---|
| 1 | 4 | 7 |
| 2 | 9 | 16 |
| 3 | 9 | 16 |
| 4 | 14 | 25 |
| 5 | 16 | 31 |
| 6 | 20 | 39 |
| 7 | 24 | 47 |
| 8 | - | 47 |
| 9 | - | 49 |
| 10 | - | 56 |
| 11 | - | 63 |
| 12 | - | 70 |
| 13 | - | 77 |
| 14 | - | 84 |
| 15 | - | 91 |
| 16 | - | 98 |

FIG. 211

Data Size

| | a | | | b | | | |
|---|---|---|---|---|---|---|---|
| Packet Division | Total | Parity | Data | Total | Parity | Data | Total Data |
| 1 | 4 | 0 | 4 | 3 | 0 | 3 | 7 |
| 2 | 10 | 1 | 9 | 7 | 0 | 7 | 16 |
| 3 | 14 | 5 | 9 | 11 | 4 | 7 | 16 |
| 4 | 19 | 5 | 14 | 15 | 4 | 11 | 25 |
| 5 | 20 | 4 | 16 | 19 | 4 | 15 | 31 |
| 6 | 24 | 4 | 20 | 23 | 4 | 19 | 39 |
| 7 | 28 | 4 | 24 | 27 | 4 | 23 | 47 |

| | a | | | b | | | |
|---|---|---|---|---|---|---|---|
| Packet Division | Total | Parity | Data | Total | Parity | Data | Total Data |
| 1 | 4 | 0 | 4 | 3 | 0 | 3 | 7 |
| 2 | 10 | 1 | 9 | 7 | 0 | 7 | 16 |
| 3 | 14 | 1 | 13 | 11 | 4 | 7 | 20 |
| 4 | 19 | 1 | 18 | 15 | 4 | 11 | 29 |
| 5 | 20 | 1 | 19 | 19 | 4 | 15 | 34 |
| 6 | 24 | 1 | 23 | 23 | 4 | 19 | 42 |
| 7 | 28 | 1 | 27 | 27 | 4 | 23 | 50 |

| | a | | | b | | | |
|---|---|---|---|---|---|---|---|
| Packet Division | Total | Parity | Data | Total | Parity | Data | Total Data |
| 1 | 4 | 0 | 4 | 3 | 0 | 3 | 7 |
| 2 | 10 | 1 | 9 | 7 | 0 | 7 | 16 |
| 3 | 14 | 1 | 13 | 11 | 5 | 6 | 19 |
| 4 | 19 | 1 | 18 | 15 | 5 | 10 | 28 |
| 5 | 20 | 2 | 18 | 19 | 4 | 15 | 33 |
| 6 | 24 | 2 | 22 | 23 | 4 | 19 | 41 |
| 7 | 28 | 2 | 26 | 27 | 4 | 23 | 49 |

| | a + b | | |
|---|---|---|---|
| Packet Division | Total | Parity | Data |
| 8 | 63 | 16 | 47 |
| 9 | 63 | 14 | 49 |
| 10 | 70 | 14 | 56 |
| 11 | 77 | 14 | 63 |
| 12 | 84 | 14 | 70 |
| 13 | 91 | 14 | 77 |
| 14 | 98 | 14 | 84 |
| 15 | 105 | 14 | 91 |
| 16 | 112 | 14 | 98 |

Packet Division Summary

| Packet Division | Data Size [bit] Short mode | Data Size [bit] Full mode | Error Check Code |
|---|---|---|---|
| 1 | 4 | 7 | - |
| 2 | 10 | 16 | Parity bit (1 + 1) |
| 3 | 10 | 17 | CRC (6+4) |
| 4 | 14 | 25 | CRC (5+4) |
| 5 | 19 | 34 | |
| 6 | 16 | 31 | Reed-Solomon (2 * 4 bit + 2 * 4 bit) |
| 7 | 20 | 39 | |
| 8 | 24 | 47 | |
| 9 | - | 55 | Reed-Solomon (2 * 8 bit) |
| 10 | - | 56 | Reed-Solomon (2 * 7bit) |
| 11 | - | 63 | |
| 12 | - | 70 | |
| 13 | - | 77 | |
| 14 | - | 84 | |
| 15 | - | 91 | |
| 16 | - | 98 | |

FIG. 228

Packet Division Summary version 2

| Packet Division | Data Size [bit] Short mode | Full mode | Error Check Code |
|---|---|---|---|
| 1 | 4 | 7 | - |
| 2 | 10 | 16 | Parity bit (1 + 1) |
| 3 | 15 | 25 | |
| 4 | 14 | 25 | CRC (5+4) |
| 5 | 19 | 34 | |
| 6 | 20 | 39 | CRC (4+4) |
| 7 | 24 | 47 | |
| 8 | 28 | 55 | |
| 9 | - | 55 | Reed-Solomon (2 * 8 bit) |
| 10 | - | 56 | Reed-Solomon (2 * 7bit) |
| 11 | - | 63 | |
| 12 | - | 70 | |
| 13 | - | 77 | |
| 14 | - | 84 | |
| 15 | - | 91 | |
| 16 | - | 98 | |

FIG. 229

Packet Division Summary version 3

| Packet Division | Data Size [bit] Short mode | Full mode | Error Check Code |
|---|---|---|---|
| 1 | 4 | 7 | - |
| 2 | 10 | 16 | Parity bit (1 + 1) |
| 3 | 15 | 22 | Parity bit + CRC (1+4) |
| 4 | 14 | 25 | CRC (5+4) |
| 5 | 19 | 34 | |
| 6 | 16 | 31 | Reed-Solomon (2 * 4 bit + 2 * 4 bit) |
| 7 | 20 | 39 | |
| 8 | 24 | 47 | |
| 9 | - | 55 | Reed-Solomon (2 * 8 bit) |
| 10 | - | 56 | Reed-Solomon (2 * 7bit) |
| 11 | - | 63 | |
| 12 | - | 70 | |
| 13 | - | 77 | |
| 14 | - | 84 | |
| 15 | - | 91 | |
| 16 | - | 98 | |

FIG. 257
(a)
Image for decoding $P_{dec11}$
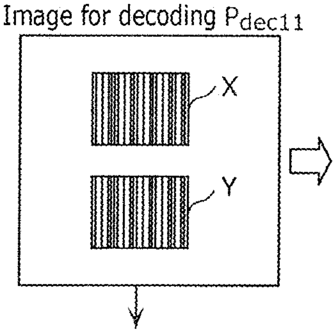
| | Address | Data |
|---|---|---|
| X | 0 | 5 |
| Y | 0 | 5 |
(b)
Image for decoding $P_{dec12}$
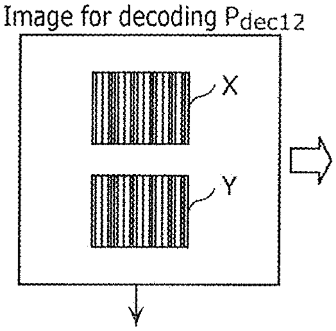
| | Address | Data |
|---|---|---|
| X | 1 | 2 |
| Y | 1 | 2 |
(c)
Image for decoding $P_{dec13}$
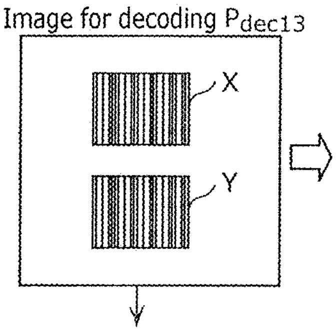
| | Address | Data |
|---|---|---|
| X | 2 | 8 |
| Y | 2 | 7 |
(d)
Image for decoding $P_{dec14}$
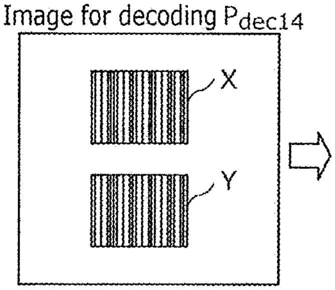
| | Address | Data |
|---|---|---|
| X | 3 | 4 |
| Y | 3 | 7 |
(e)
| Address | 0 | 1 | 2 | 3 | 4 | 5 | 6 | 7 | 8 | 9 |
|---|---|---|---|---|---|---|---|---|---|---|
| Light ID of X | 5 | 2 | 8 | 4 | 3 | 6 | 1 | 9 | 4 | 3 |
| Light ID of Y | 5 | 2 | 7 | 7 | 1 | 5 | 3 | 2 | 7 | 4 |

FIG. 304

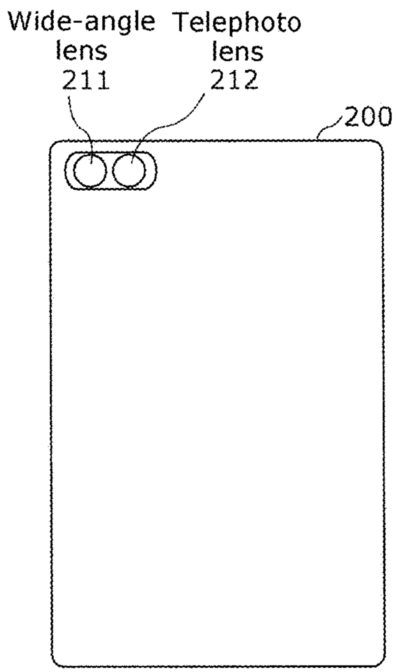

| Method for using lenses | |
|---|---|
| Method A | Always use telephoto lens |
| Method B | When bright line pattern region is included in image for decoding obtained using wide-angle lens, switch camera lens to telephoto lens and obtain image for decoding |
| Method C | Use wide-angle lens to obtain captured display image, and use telephoto lens to obtain image for decoding |
| Method D | Switch between wide-angle lens and telephoto lens in response to user operation |
| Method E | Switch between wide-angle lens and telephoto lens according to decoding result |

DISPLAY METHOD AND DISPLAY DEVICE

BACKGROUND

1. Technical Field

The present disclosure relates to a display method, a display device, a recording medium, and the like.

2. Description of the Related Art

In recent years, a home-electric-appliance cooperation function has been introduced for a home network, with which various home electric appliances are connected to a network by a home energy management system (HEMS) having a function of managing power usage for addressing an environmental issue, turning power on/off from outside a house, and the like, in addition to cooperation of AV home electric appliances by internet protocol (IP) connection using Ethernet® or wireless local area network (LAN). However, there are home electric appliances whose computational performance is insufficient to have a communication function, and home electric appliances which do not have a communication function due to a matter of cost.

In order to solve such a problem, Patent Literature (PTL) 1 discloses a technique of efficiently establishing communication between devices among limited optical spatial transmission devices which transmit information to a free space using light, by performing communication using plural single color light sources of illumination light.

CITATION LIST

Patent Literature

PTL 1: Unexamined Japanese Patent Publication No. 2002-290335

However, the conventional method is limited to a case in which a device to which the method is applied has three color light sources such as an illuminator. In addition, a receiver that receives the transmitted information cannot display an image valuable to a user.

SUMMARY

One non-limiting and exemplary embodiment provides a display method and the like that enable display of an image valuable to a user.

In one general aspect, the techniques disclosed here feature a display method for a display device to display an image. The display method includes: obtaining a captured display image and an image for decoding by an image sensor capturing a subject; decoding the image for decoding to obtain light identification information; transmitting the light identification information to a server; a plurality of sets of an augmented reality image, recognition information, and identification information being stored in the server, out of the plurality of sets, obtaining, from the server, the augmented reality image and the recognition information included in each of the sets including the identification information that agrees with the light identification information; out of the captured display image, recognizing a region corresponding to the recognition information as a target region; and displaying the captured display image with the augmented reality image superimposed on the target region.

The present disclosure can provide a display method capable of displaying images valuable to a user.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

These general and specific aspects may be implemented using a system, a method, an integrated circuit, a computer program, or a computer-readable recording medium such as a CD-ROM, or any combination of systems, methods, integrated circuits, computer programs, or computer-readable recording media. Also, these general or specific aspects may be implemented in an aspect in which a computer program that executes the method according to one embodiment is stored in a recording medium of the server and distributed to a terminal from the server in response to a request from the terminal.

BRIEF DESCRIPTION OF THE DRAWINGS

FIG. 34 is a diagram illustrating an example of operation of a transmitter and a receiver in Embodiment 4;

FIG. 107 is a diagram for describing signal processing of a transmitter in Embodiment 12;

FIG. 108 is a flowchart illustrating an example of a reception method in Embodiment 12;

FIG. 109 is a diagram for describing an example of a reception method in Embodiment 12;

FIG. 110 is a flowchart illustrating another example of a reception method in Embodiment 12;

FIG. 111 is a diagram illustrating an example of a transmission signal in Embodiment 13;

FIG. 112 is a diagram illustrating another example of a transmission signal in Embodiment 13;

FIG. 113 is a diagram illustrating another example of a transmission signal in Embodiment 13;

FIG. 114A is a diagram for describing a transmitter in Embodiment 14;

FIG. 114B is a diagram illustrating a change in luminance of each of R, G, and B in Embodiment 14;

FIG. 115 is a diagram illustrating persistence properties of a green phosphorus element and a red phosphorus element in Embodiment 14;

FIG. 116 is a diagram for explaining a new problem that will occur in an attempt to reduce errors in reading a barcode in Embodiment 14;

FIG. 117 is a diagram for describing downsampling performed by a receiver in Embodiment 14;

Figure 118:
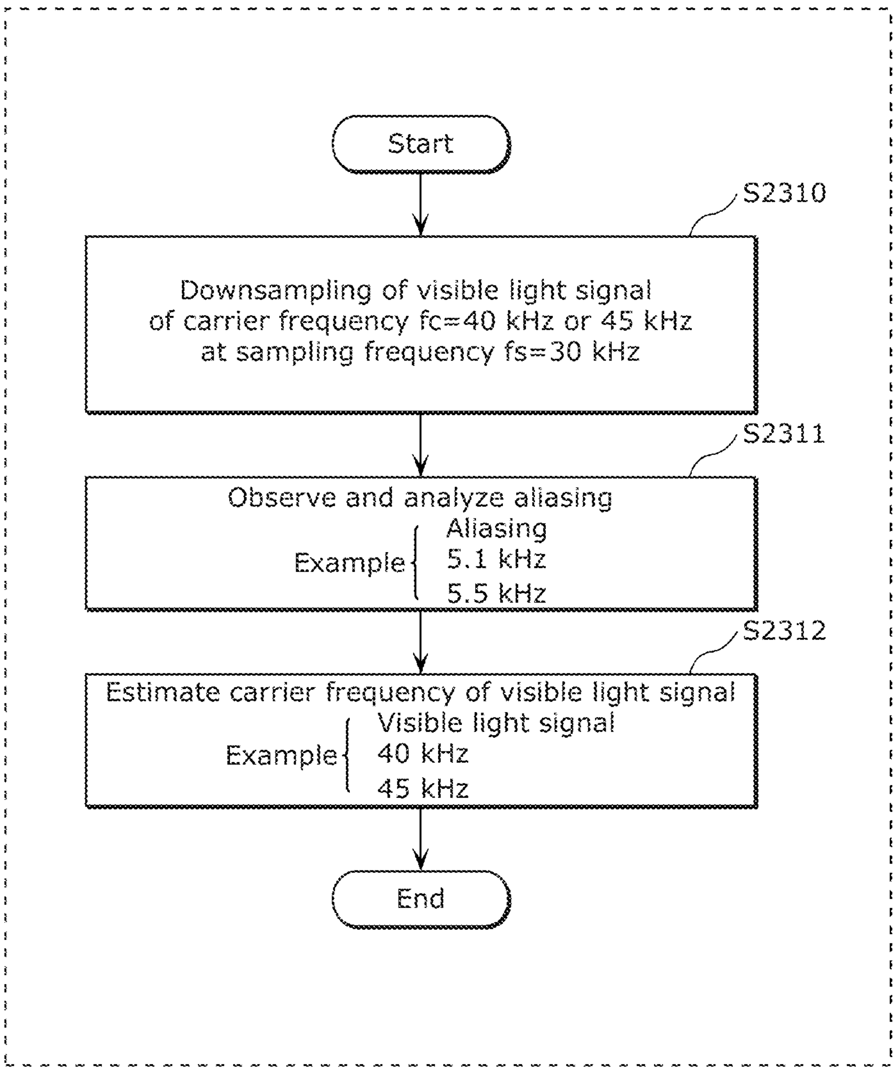
Figure 119:
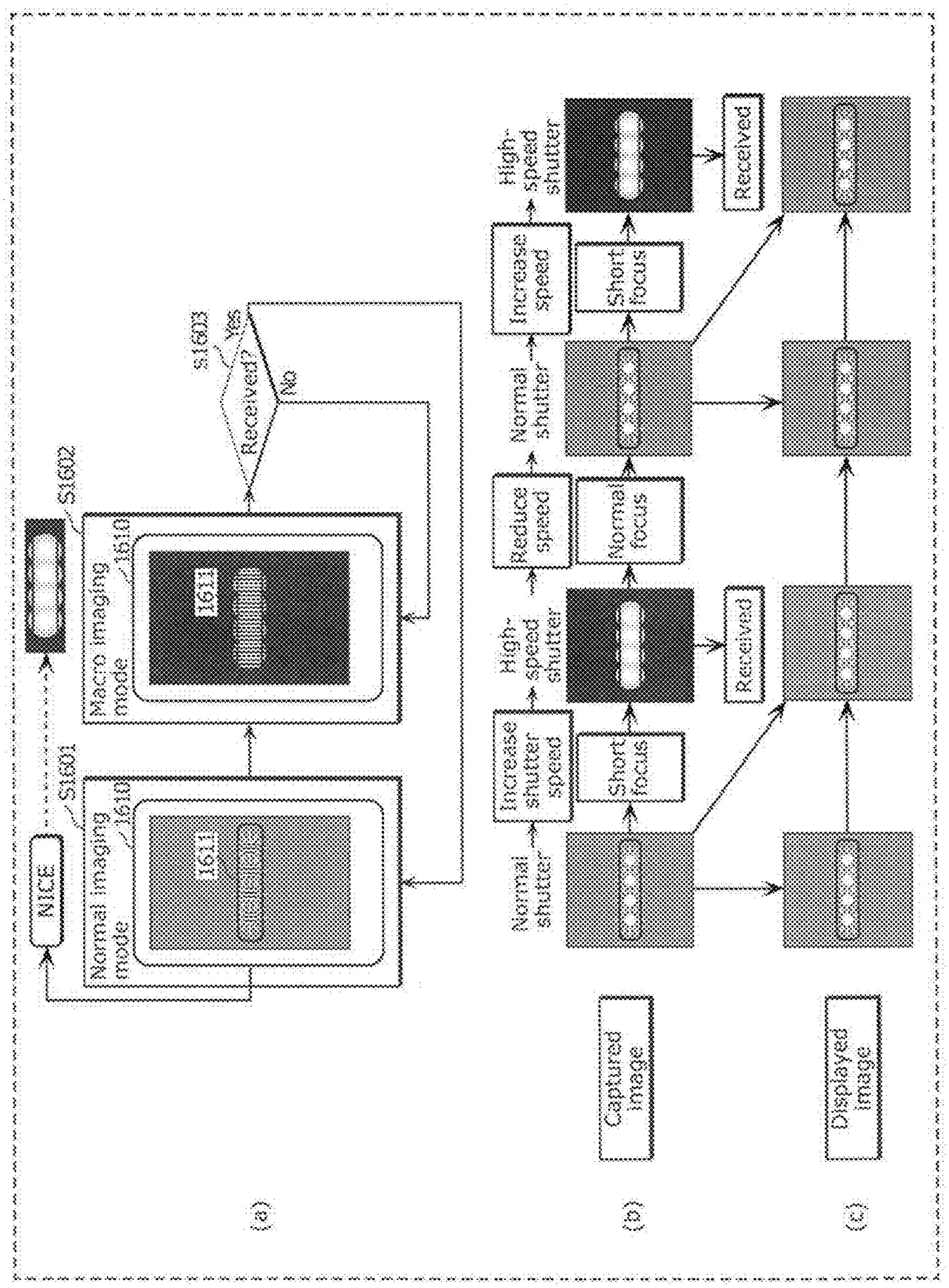
Figure 120:
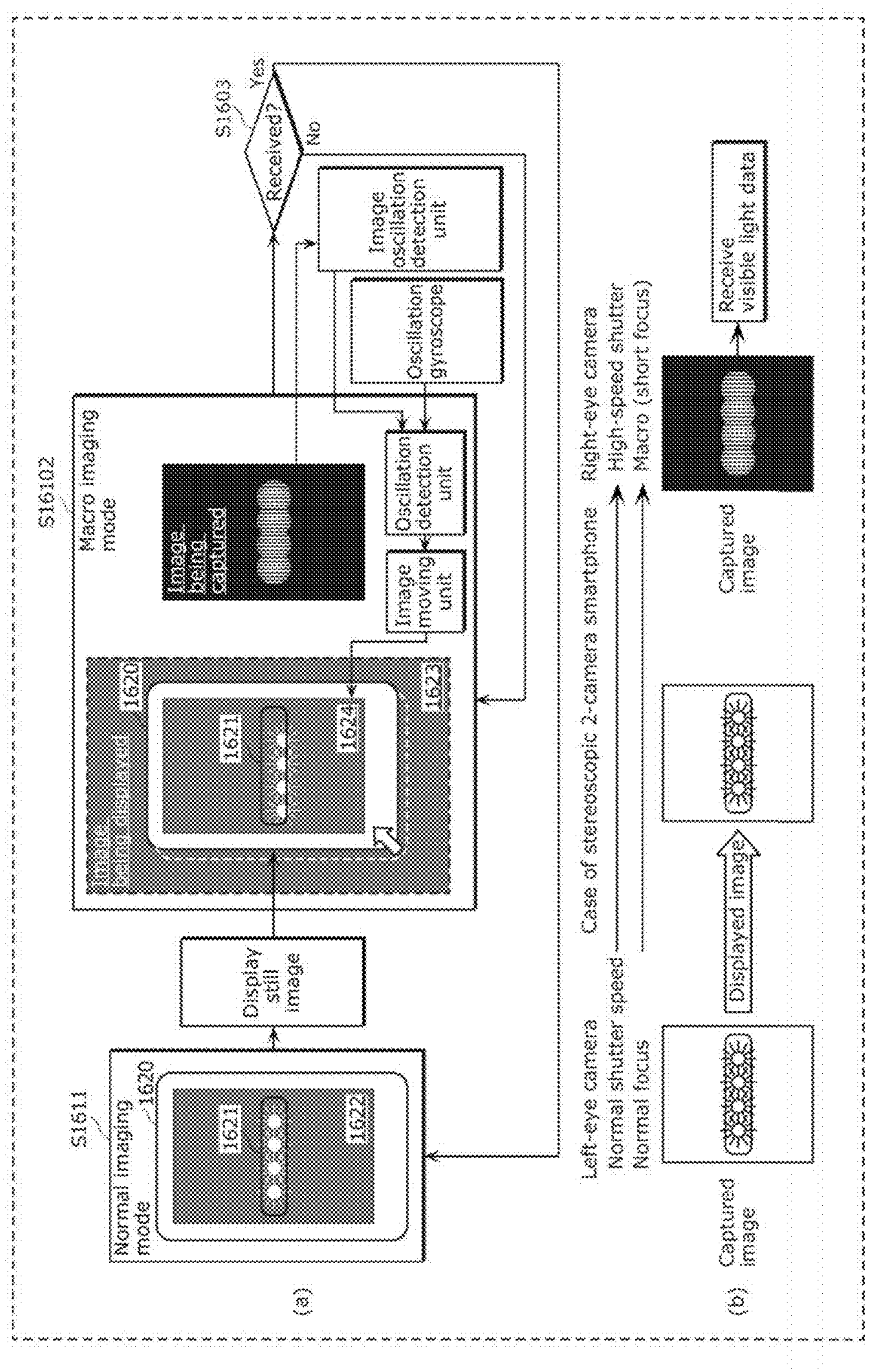
Figure 121:
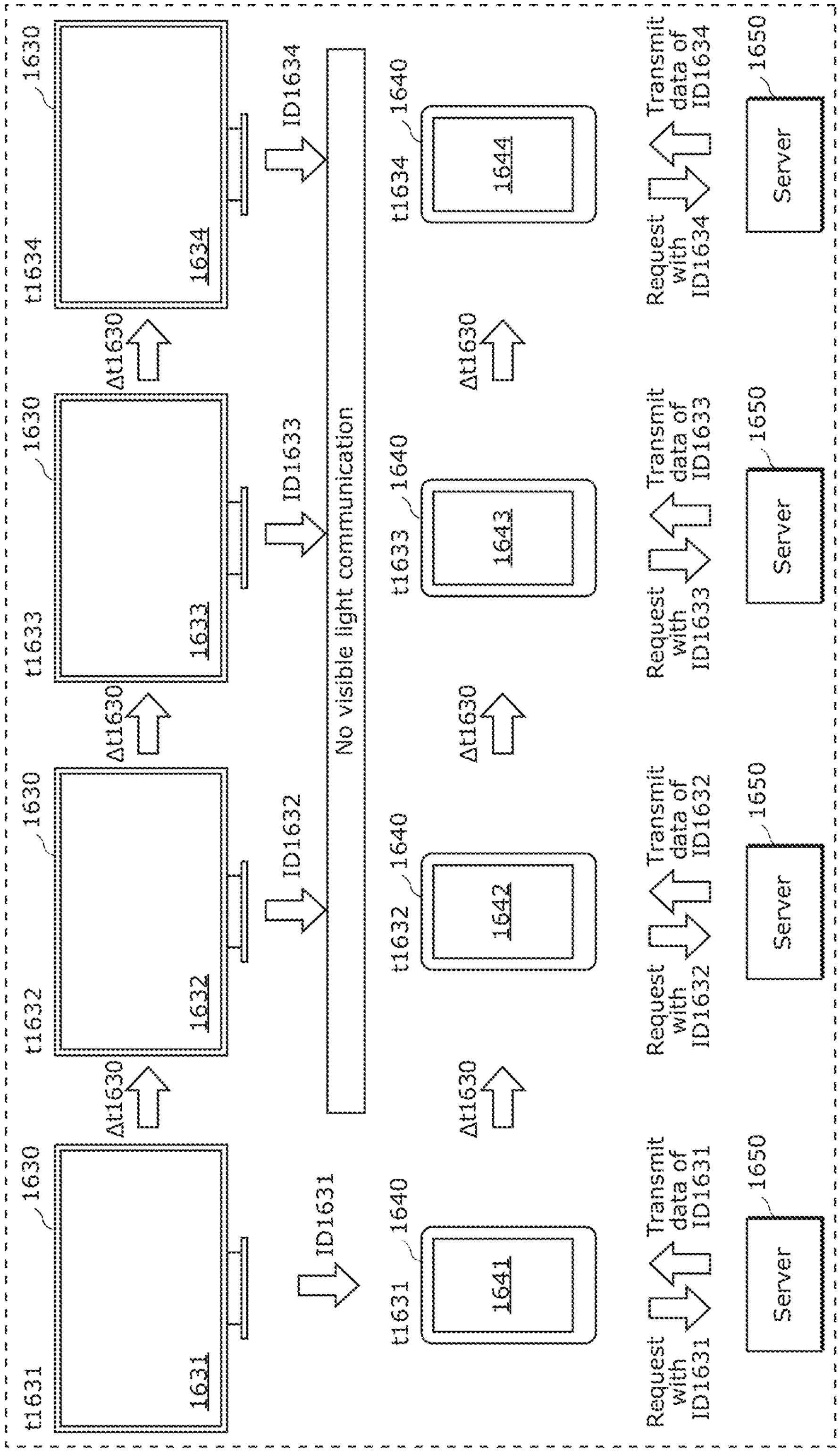
Figure 122:
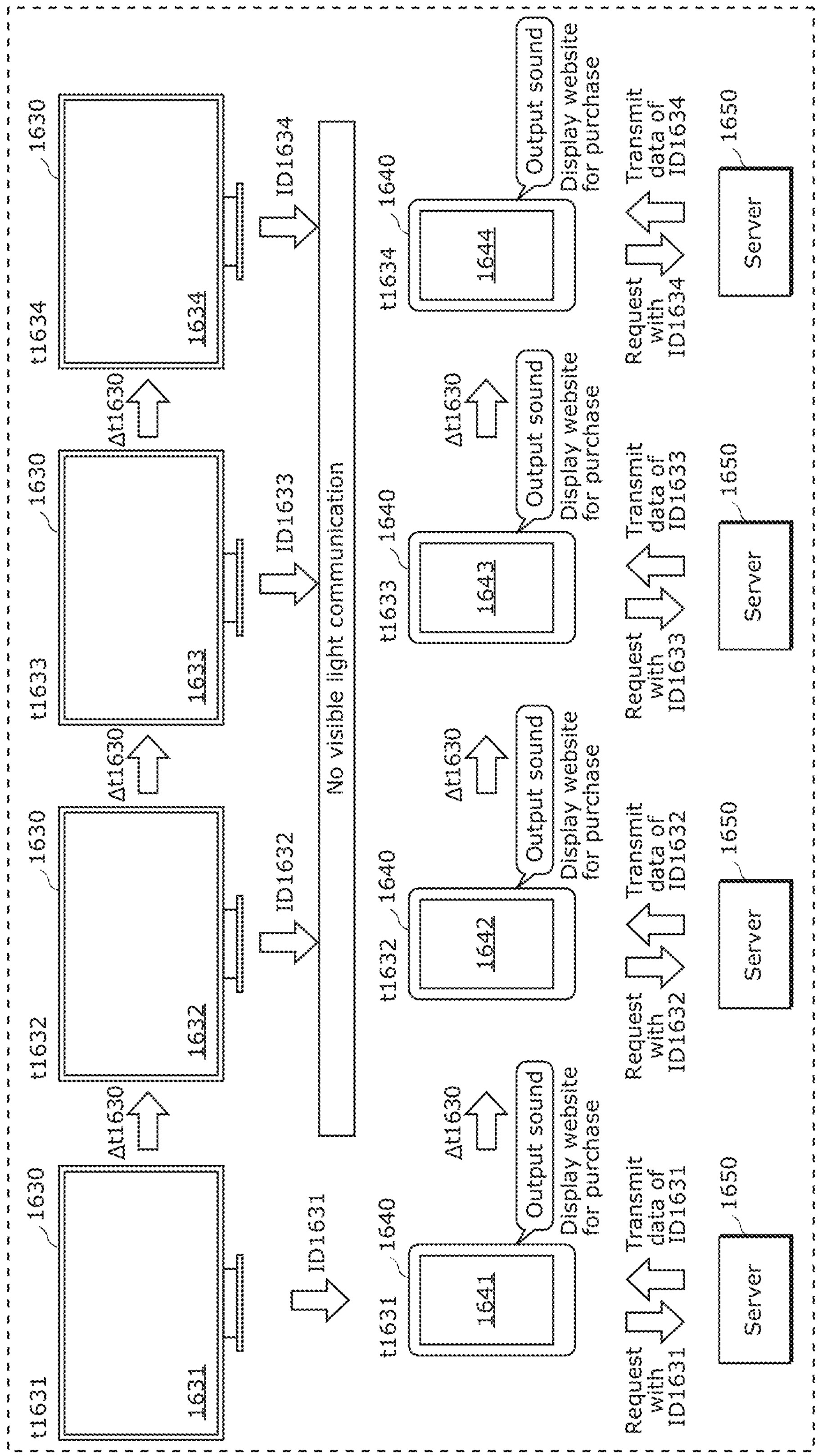
Figure 123:
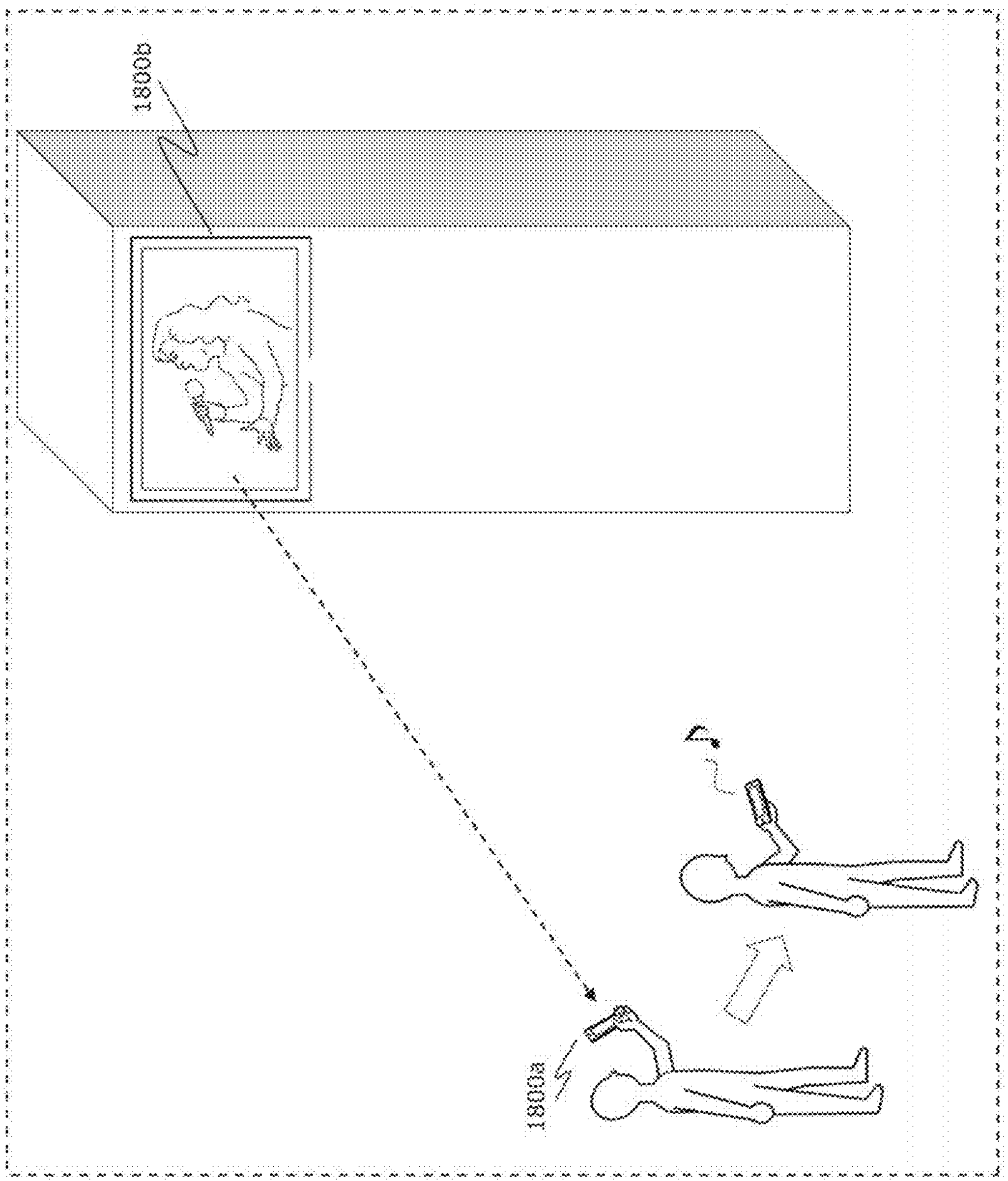
Figure 124:
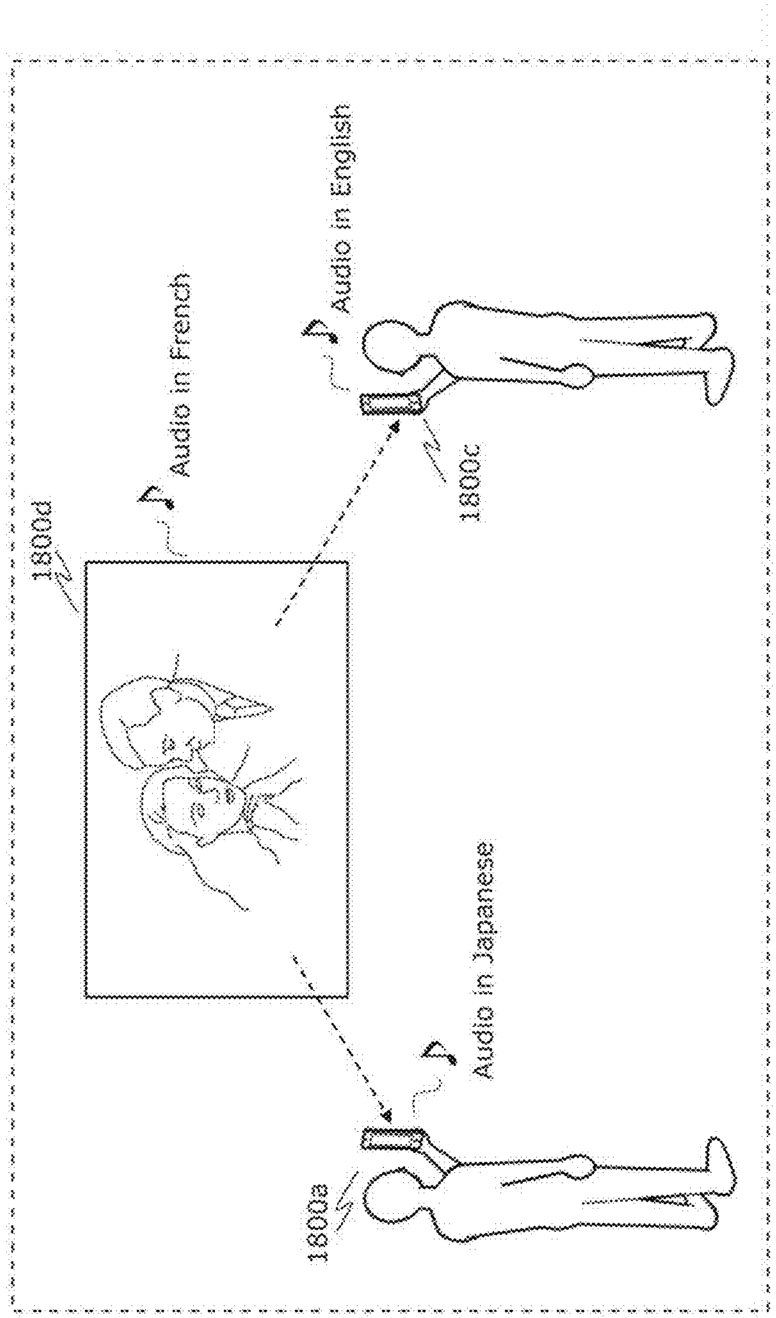
Figure 125:
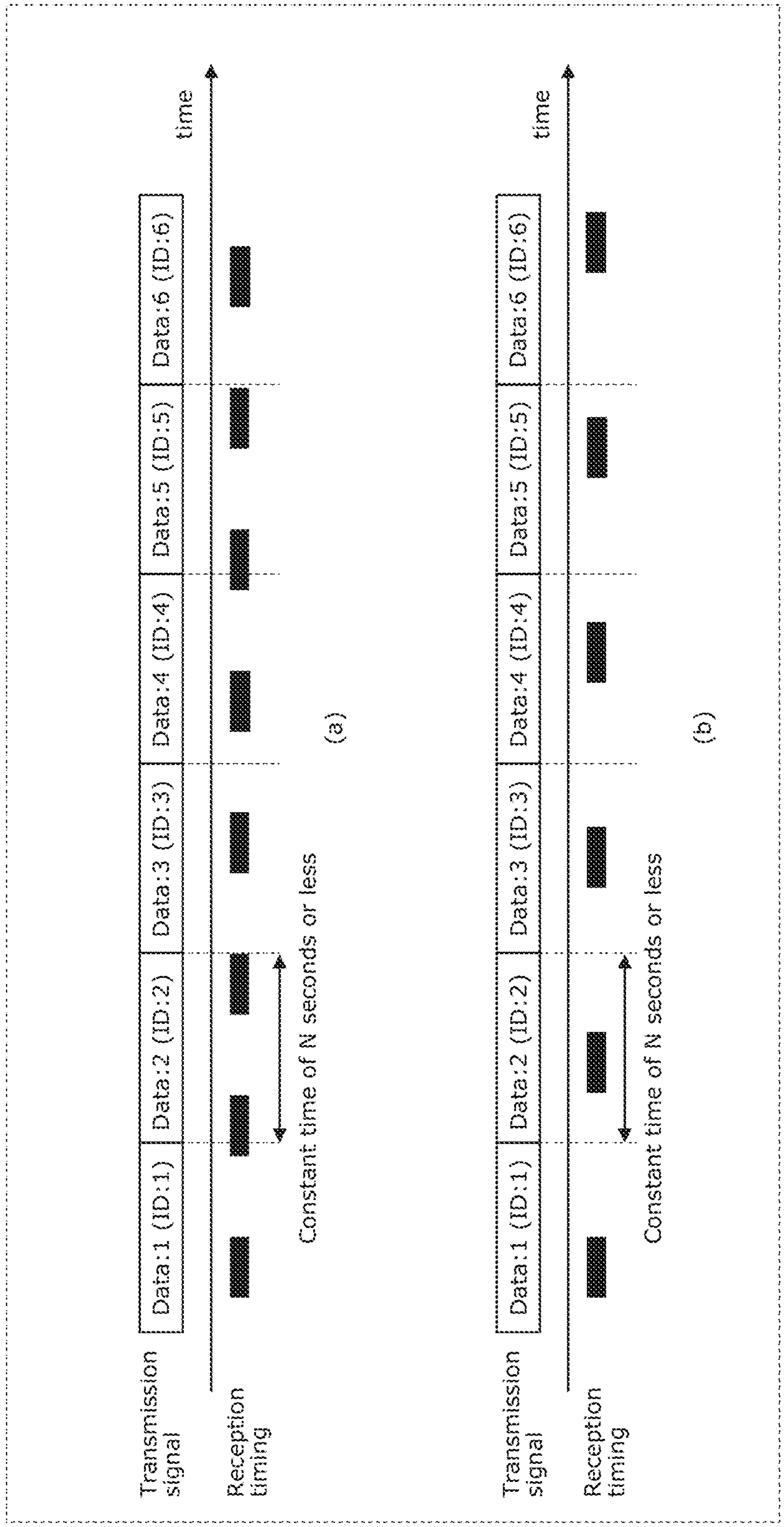
Figure 126:
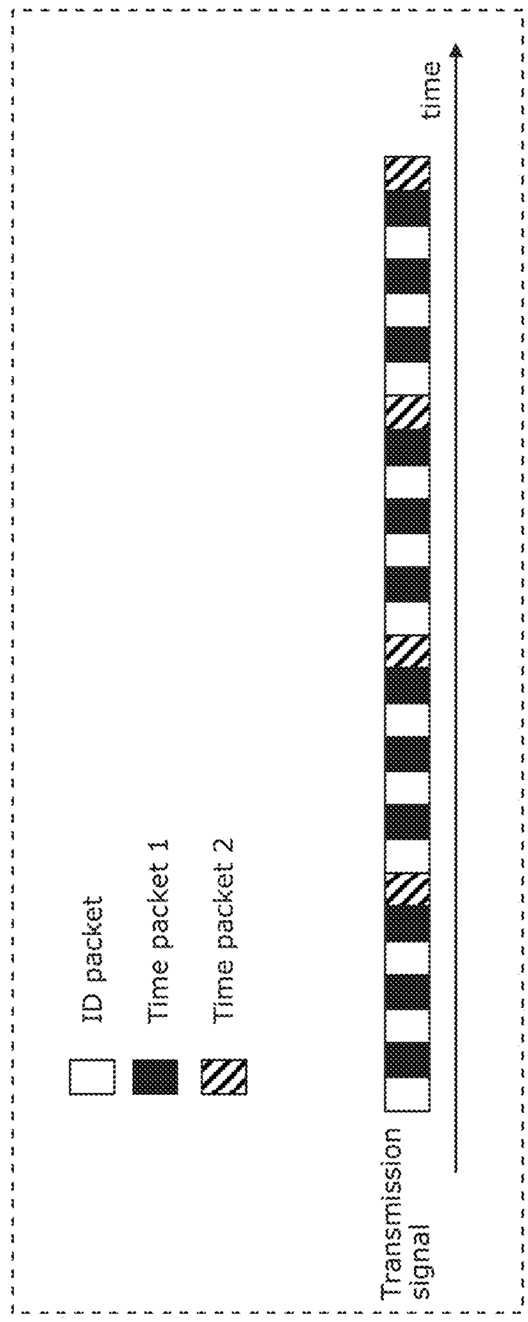
Figure 127:
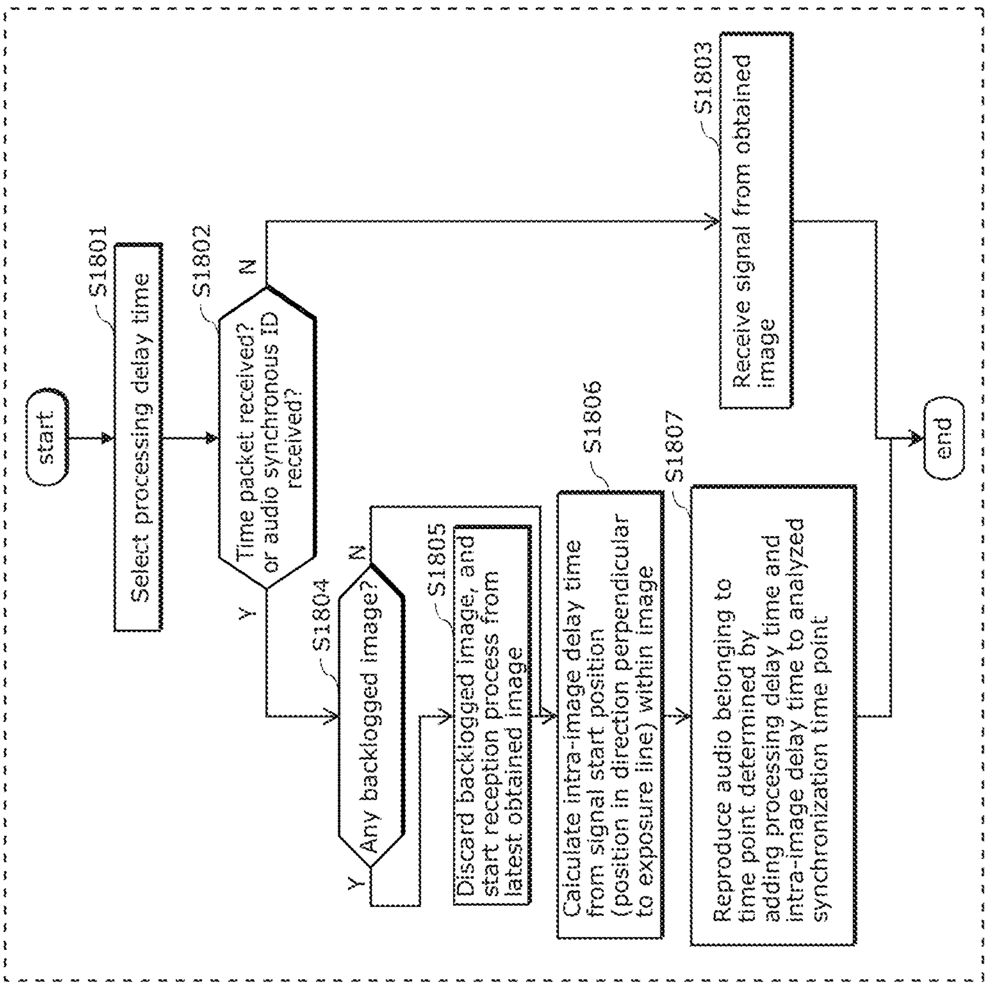
Figure 128:
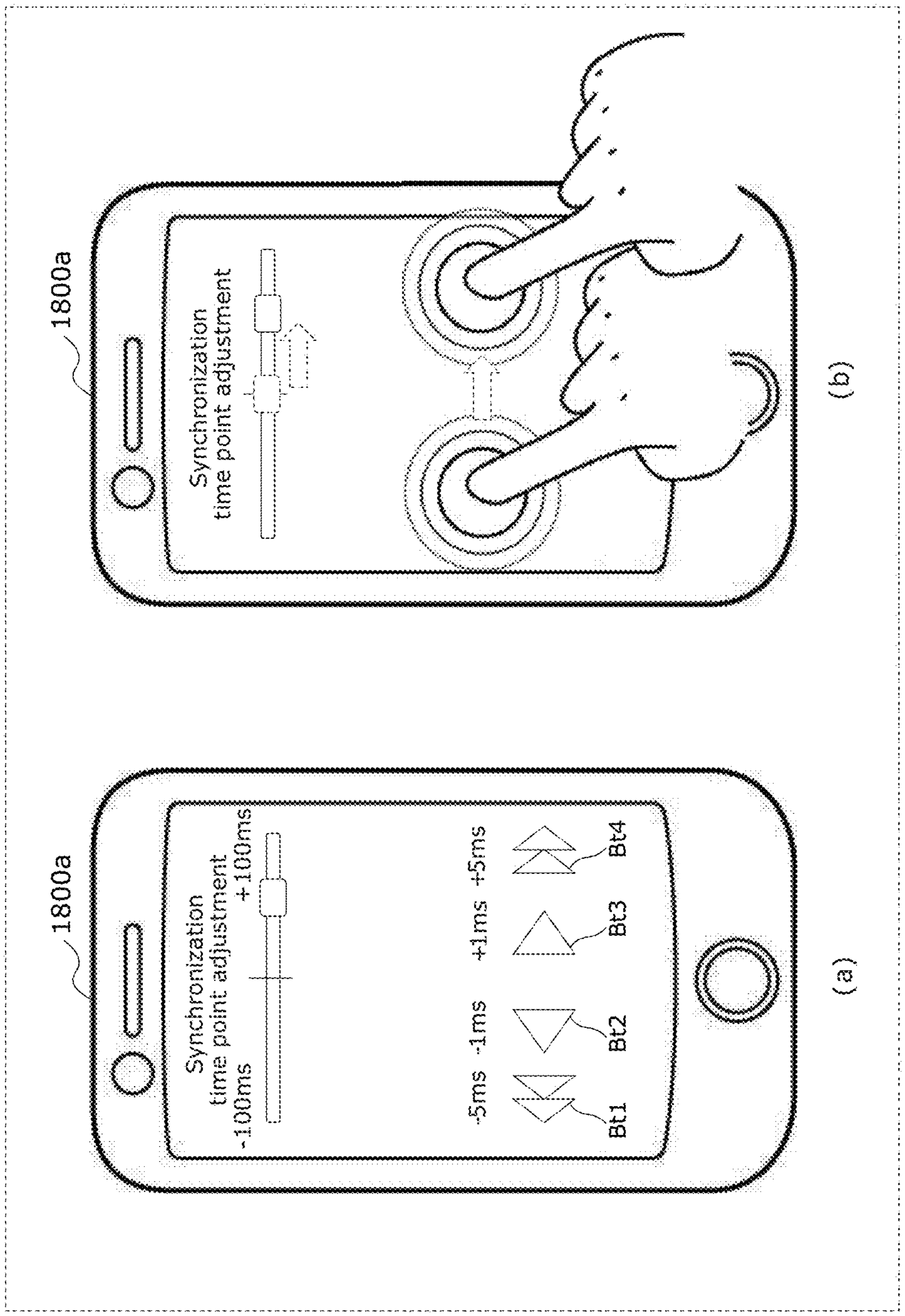
Figure 129:
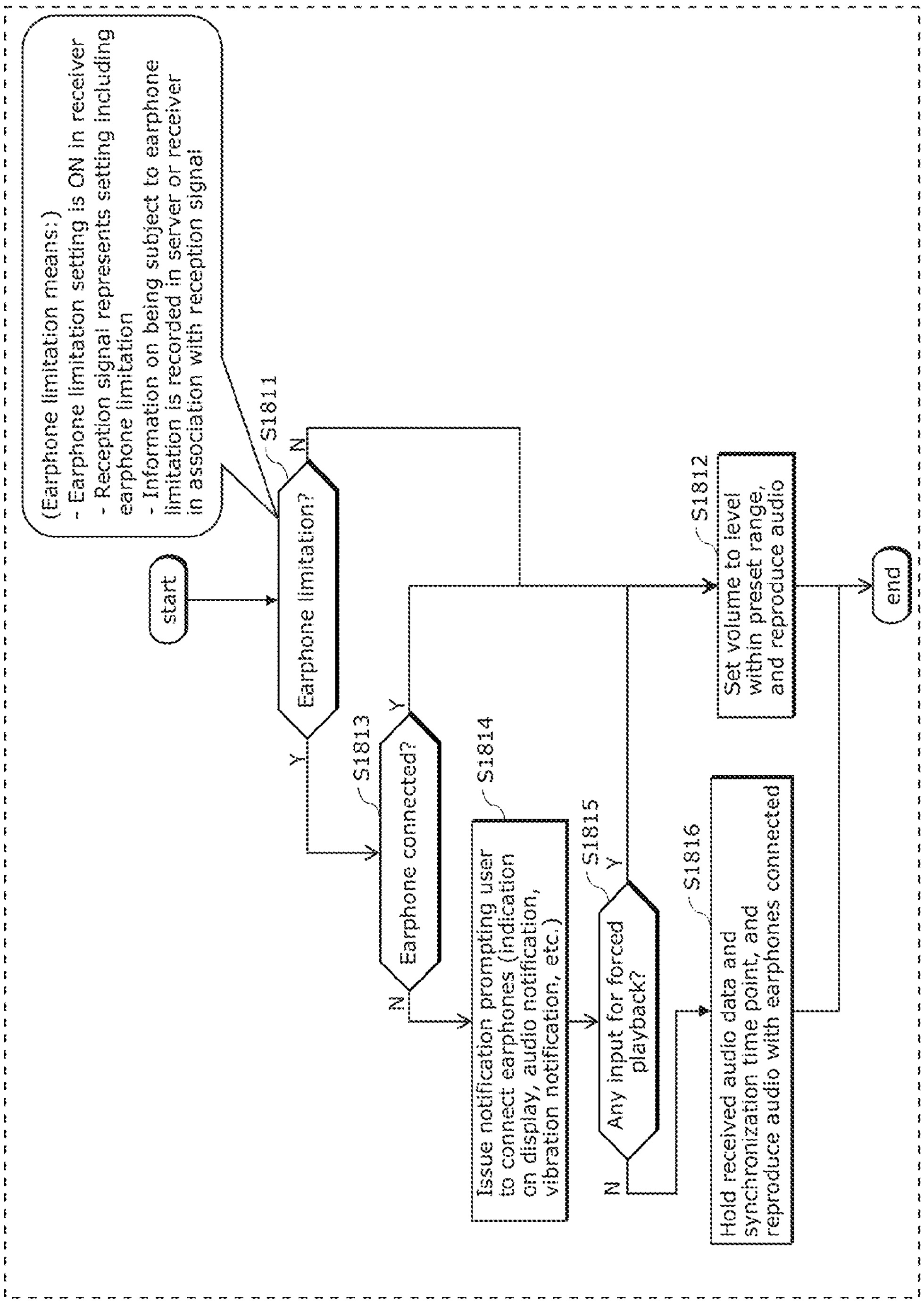
Figure 130:
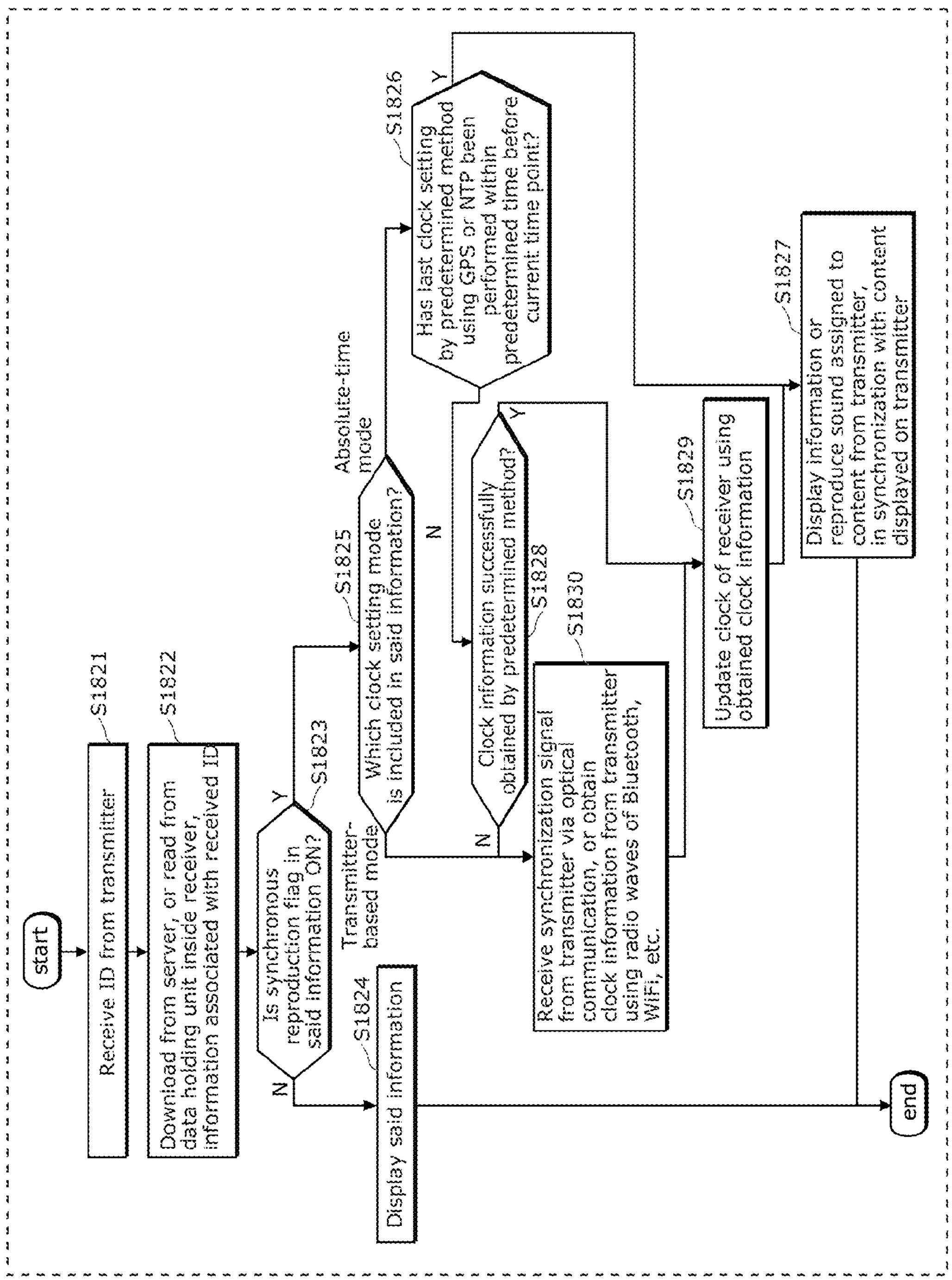
Figure 131B:
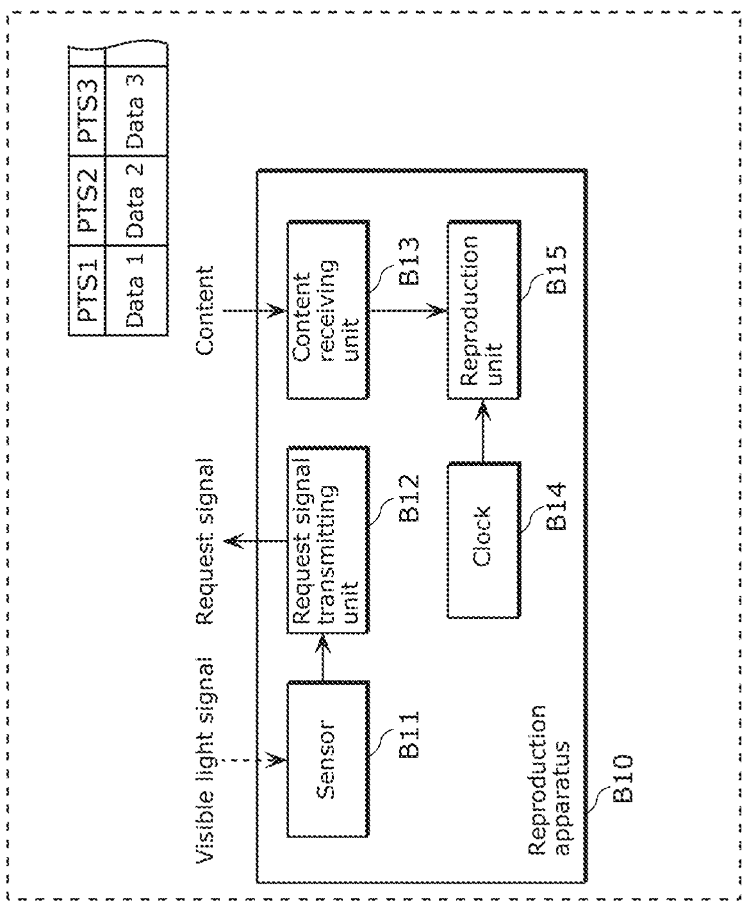
Figure 131C:
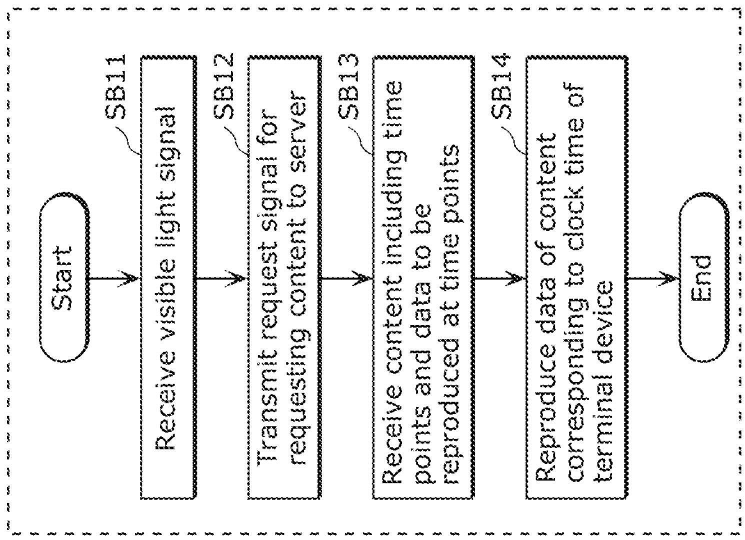
Figure 132:
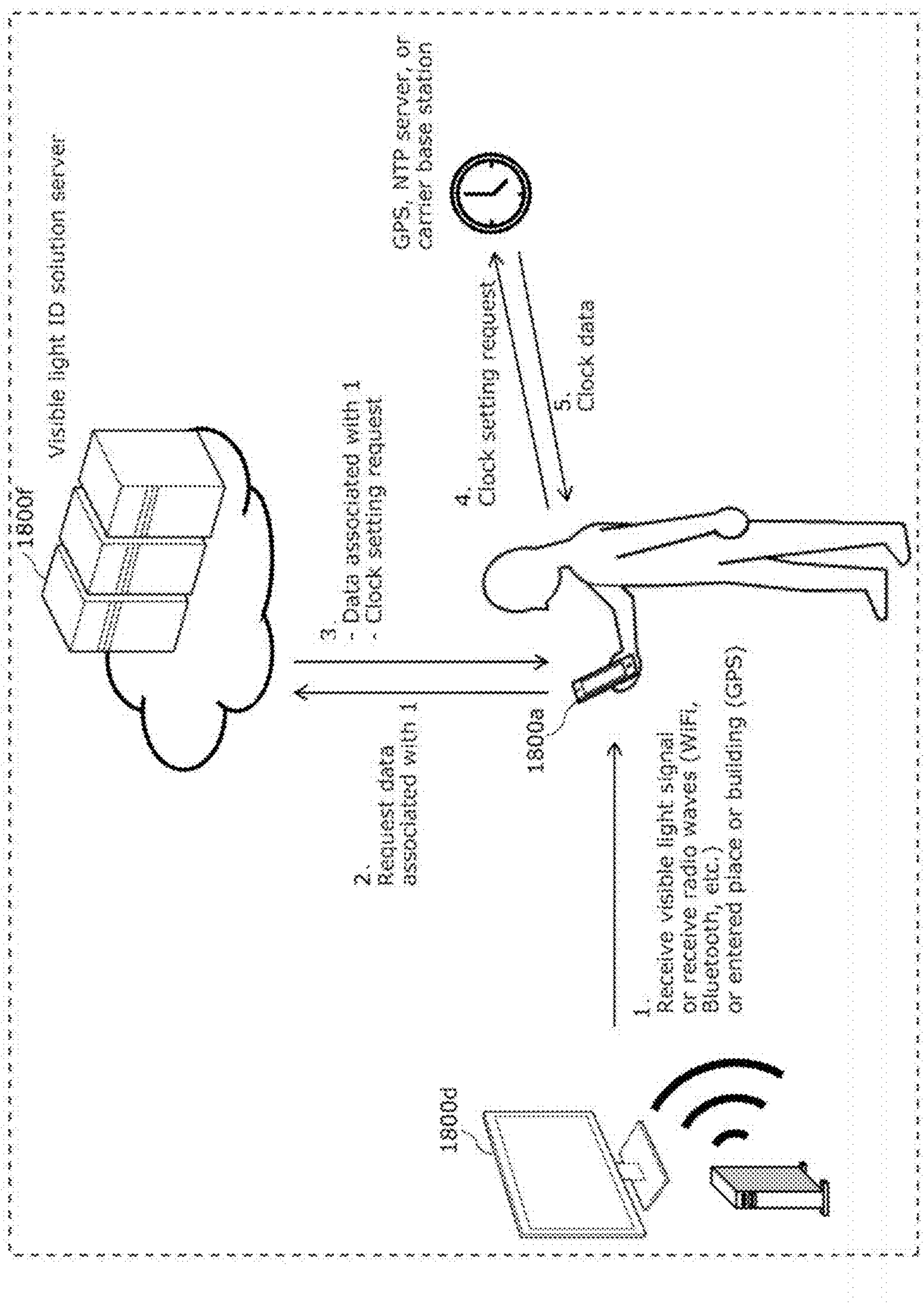
Figure 133:
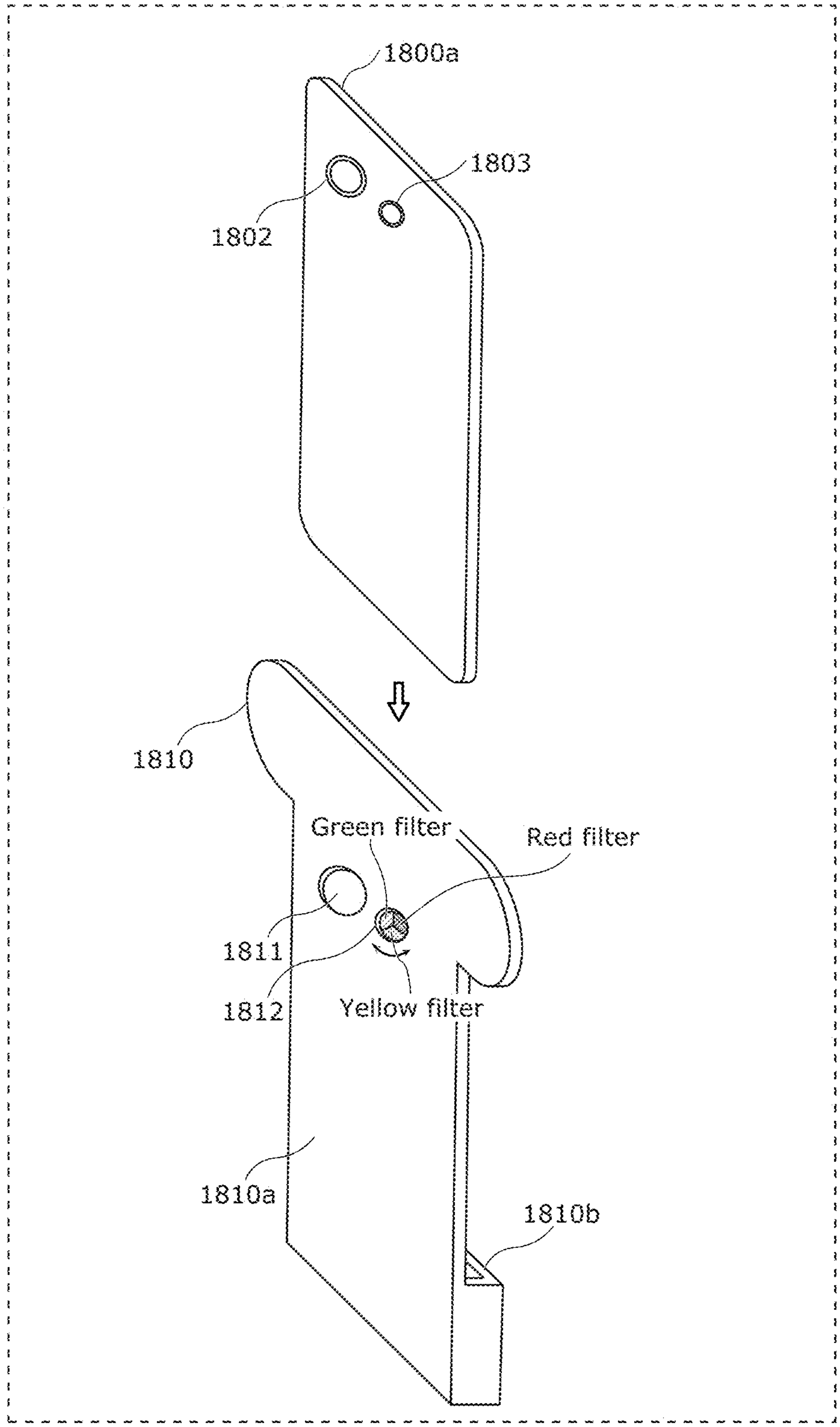
Figure 134A:
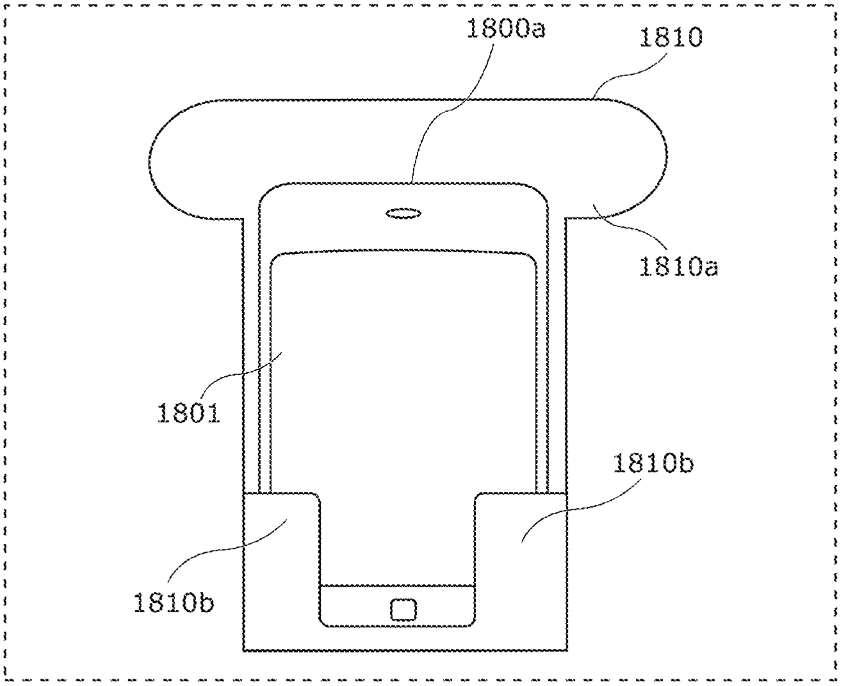
Figure 134B:
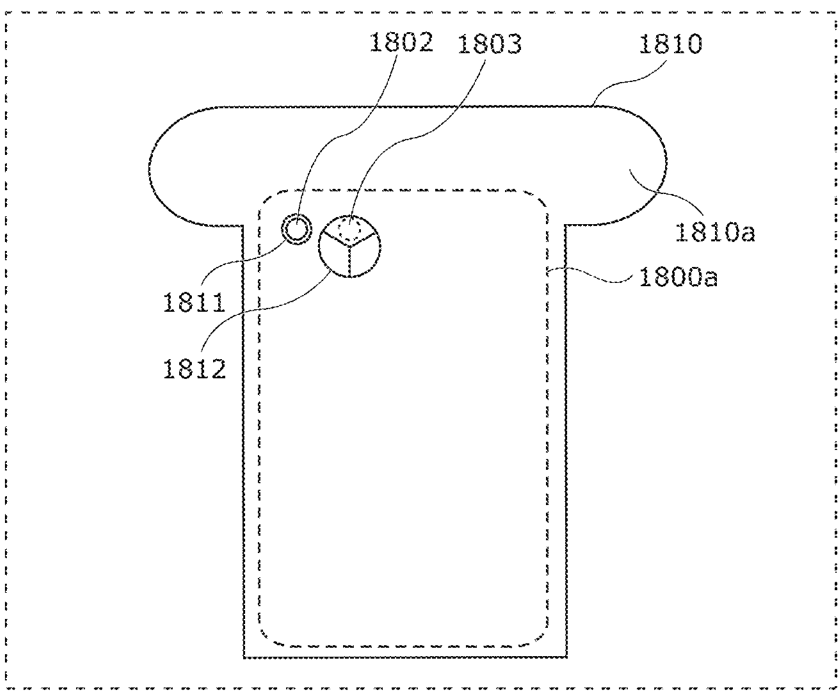
Figure 135:
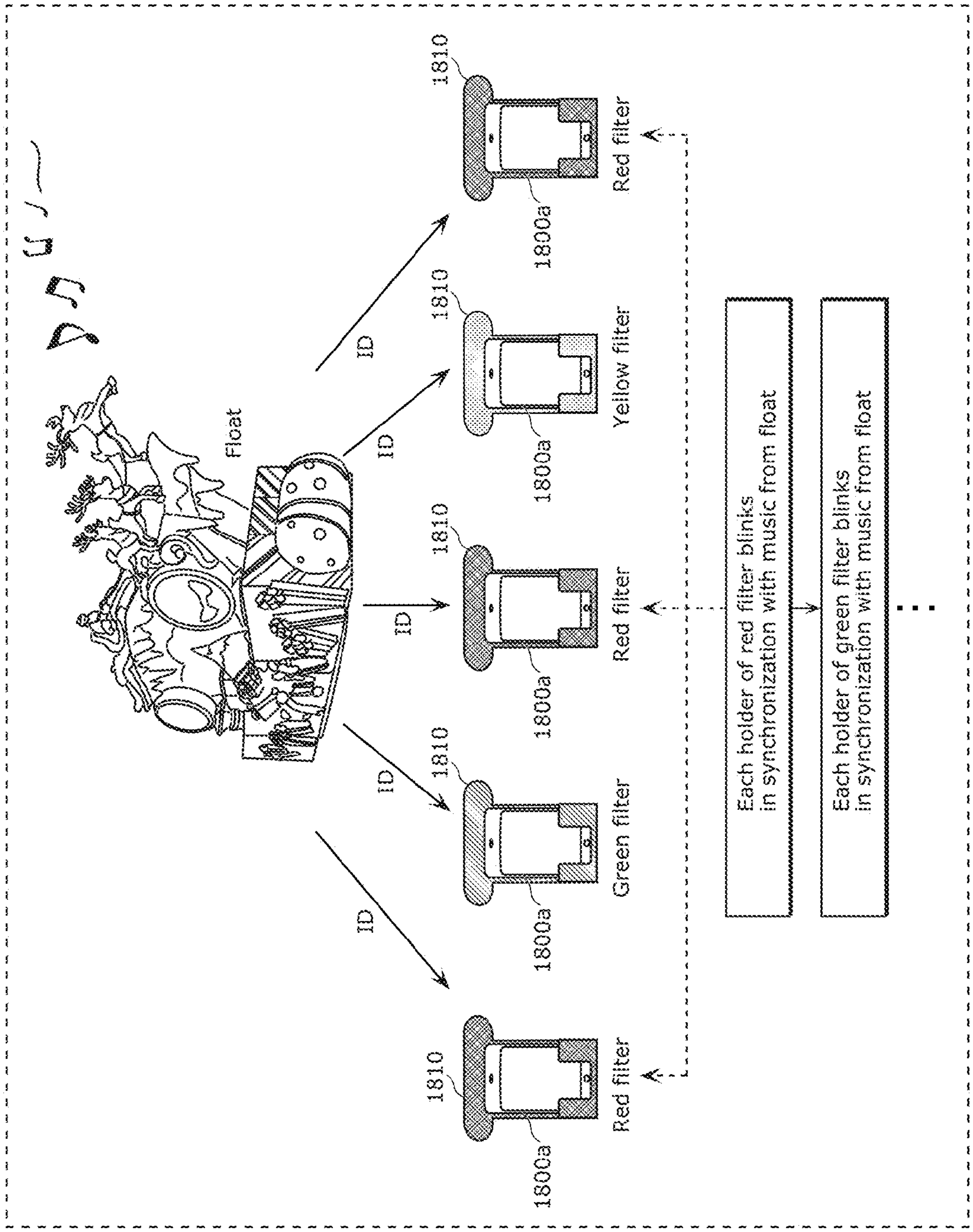
Figure 136:
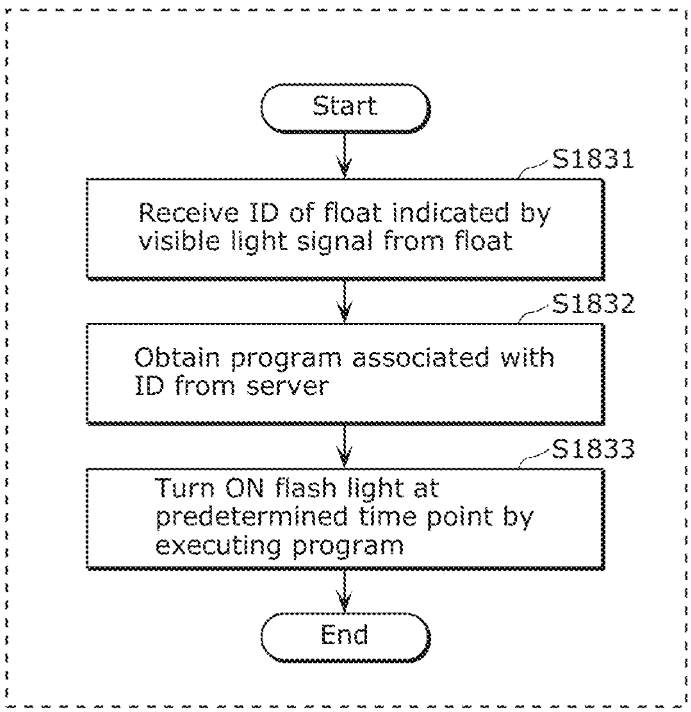
Figure 137:
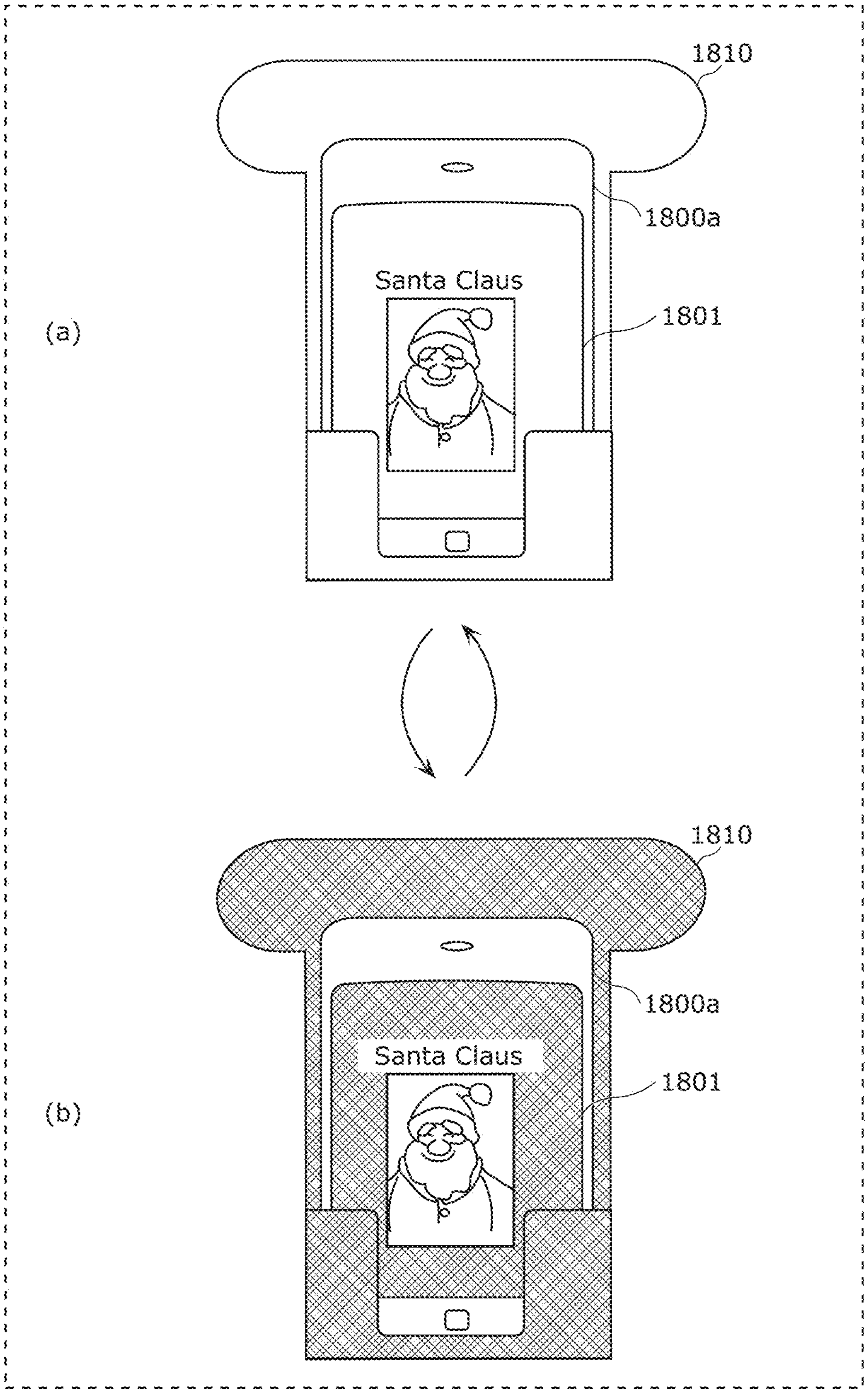
Figure 138:
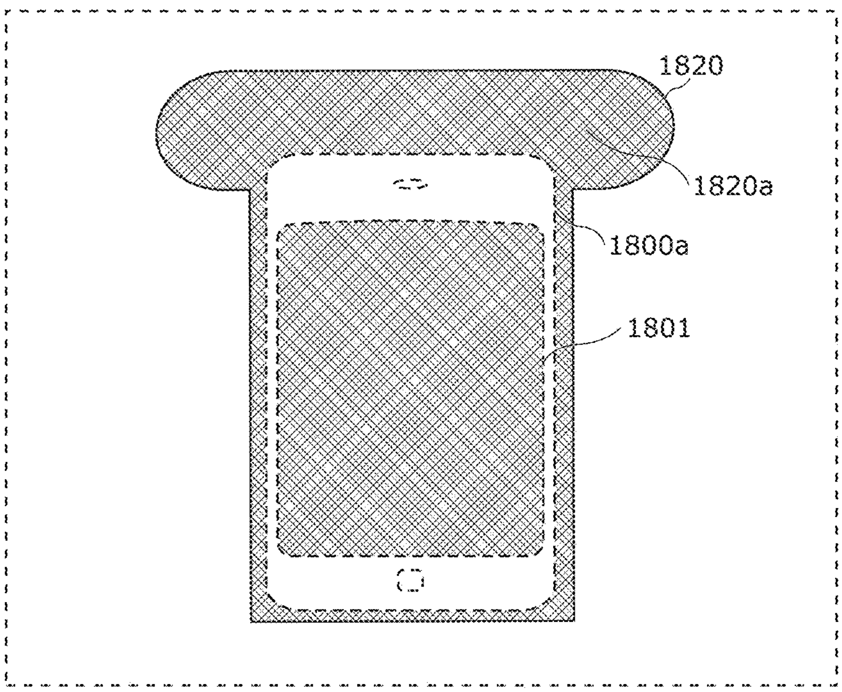
Figure 139A:
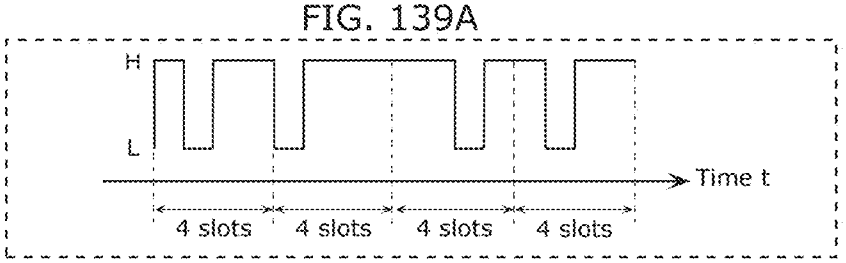
Figure 139B:
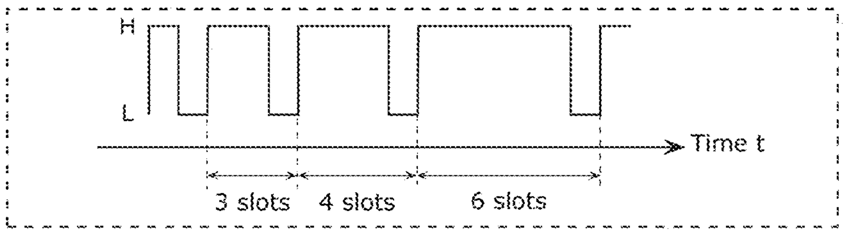
Figure 139C:
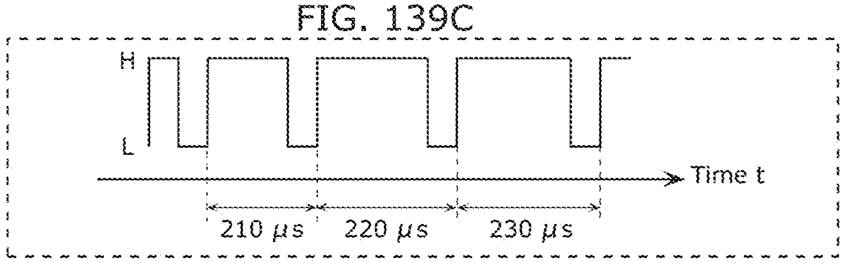
Figure 139D:
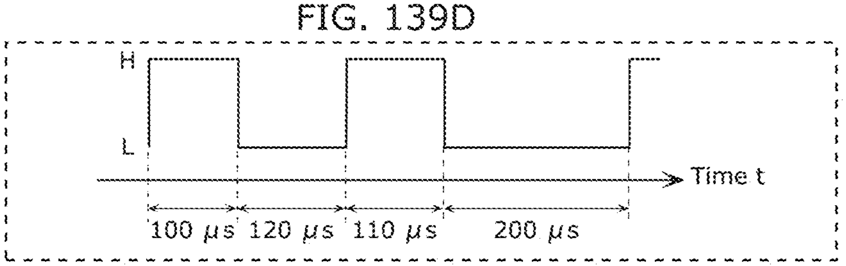
Figure 140:
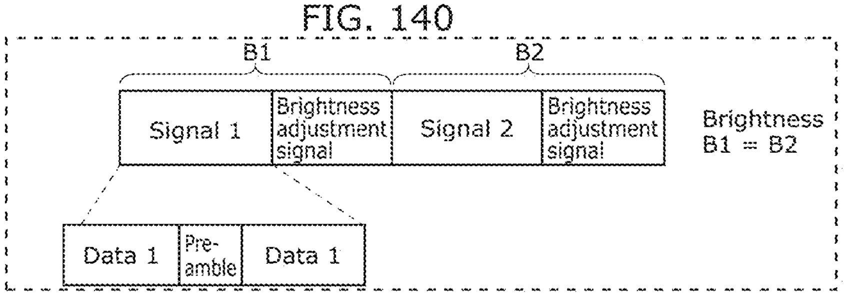
Figure 141:
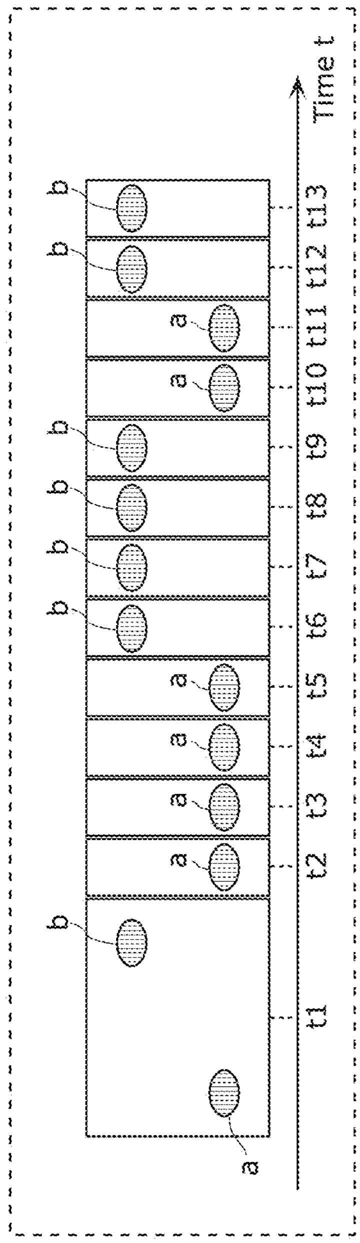
Figure 142:
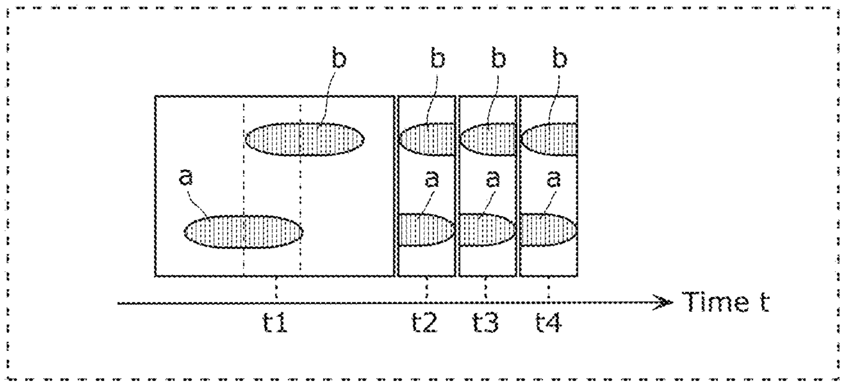
Figure 143:
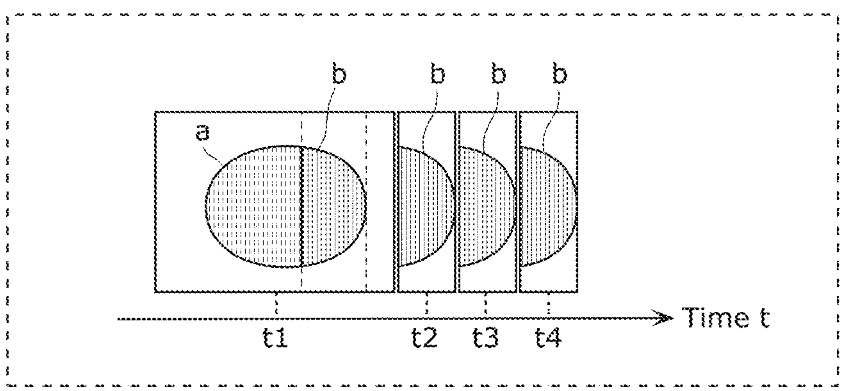
Figure 144:
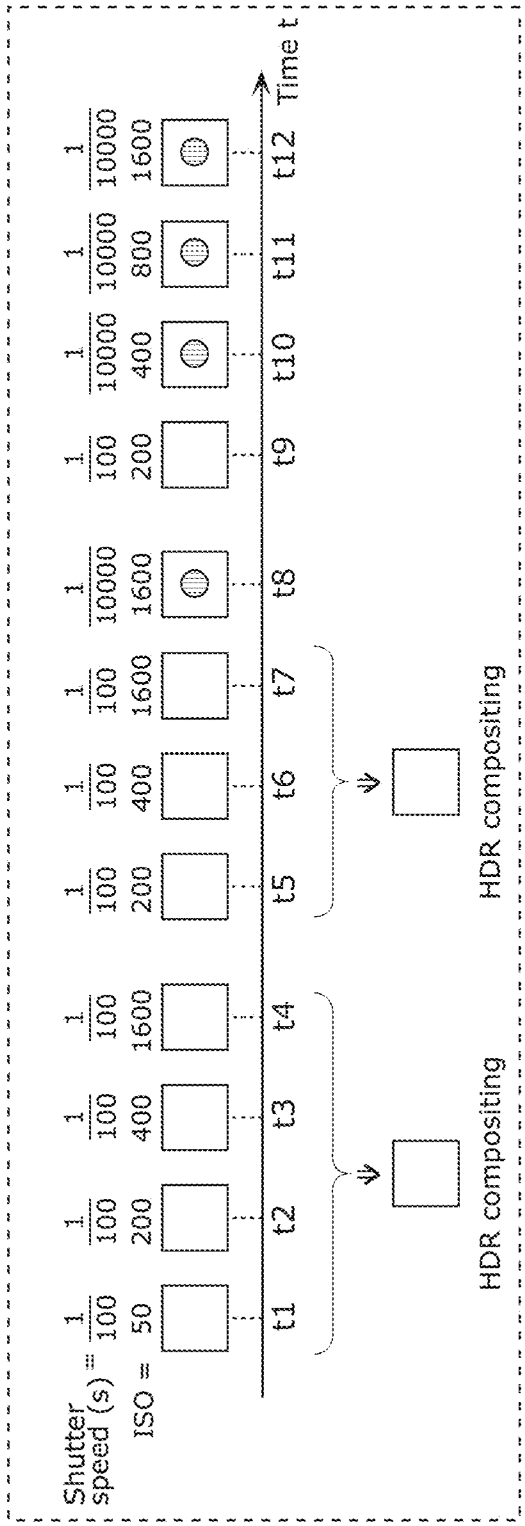
Figure 145:
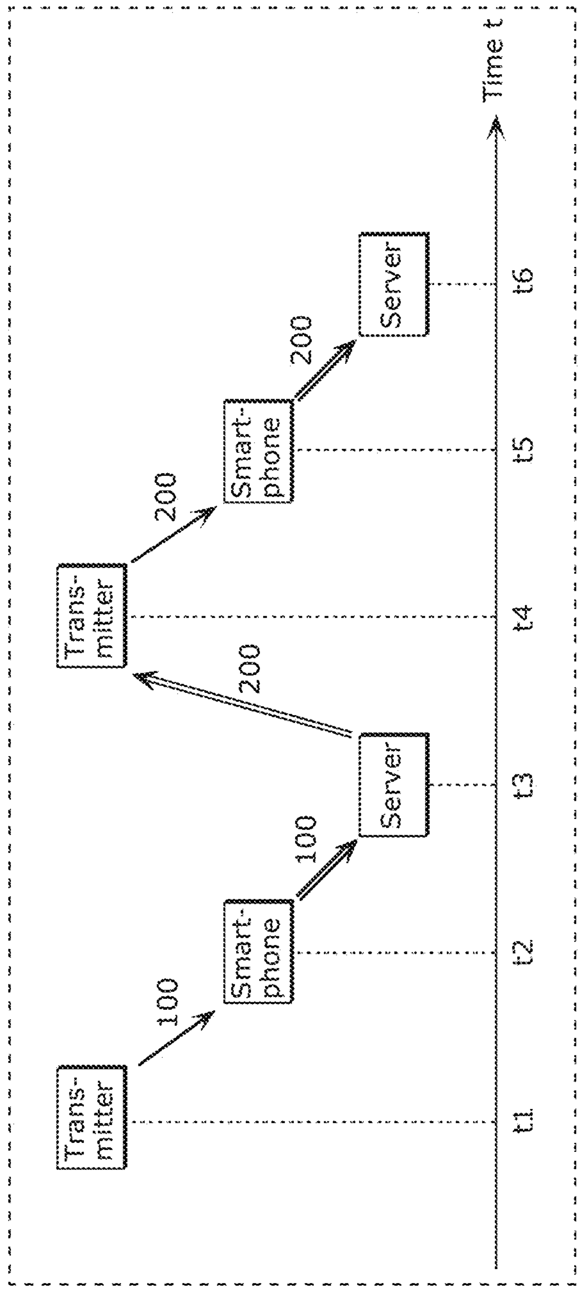
Figure 146A:
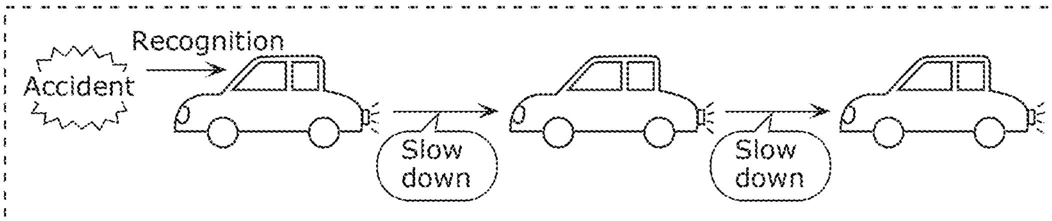
Figure 146B:
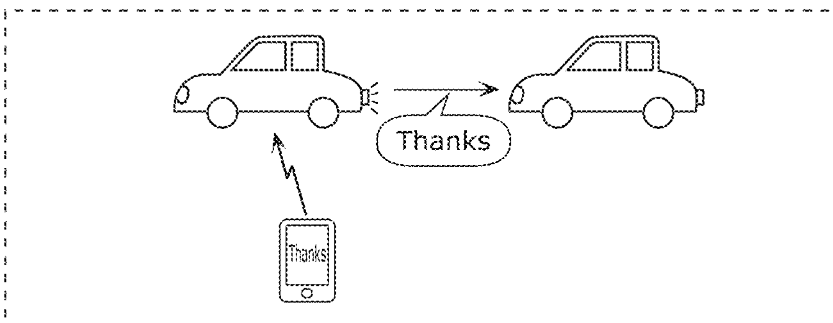
Figure 147:
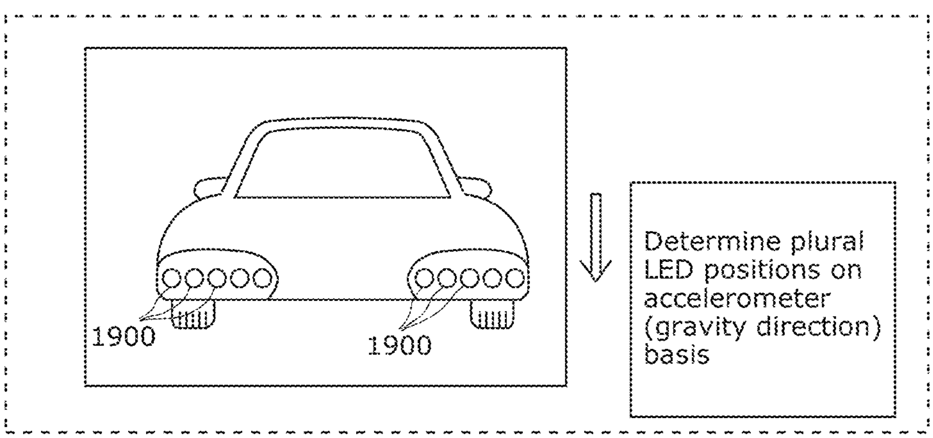
Figure 148:
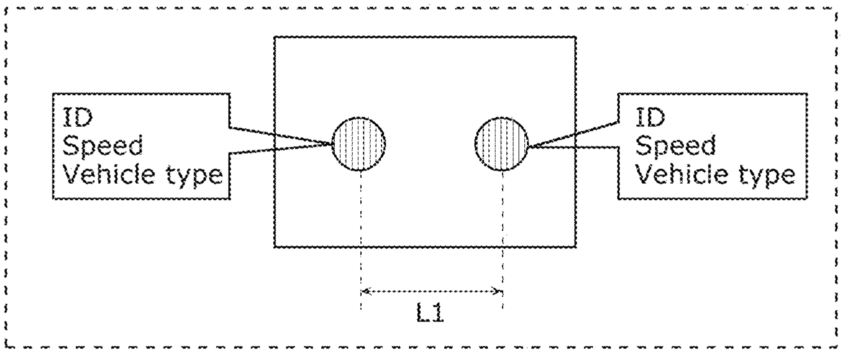
Figure 149:
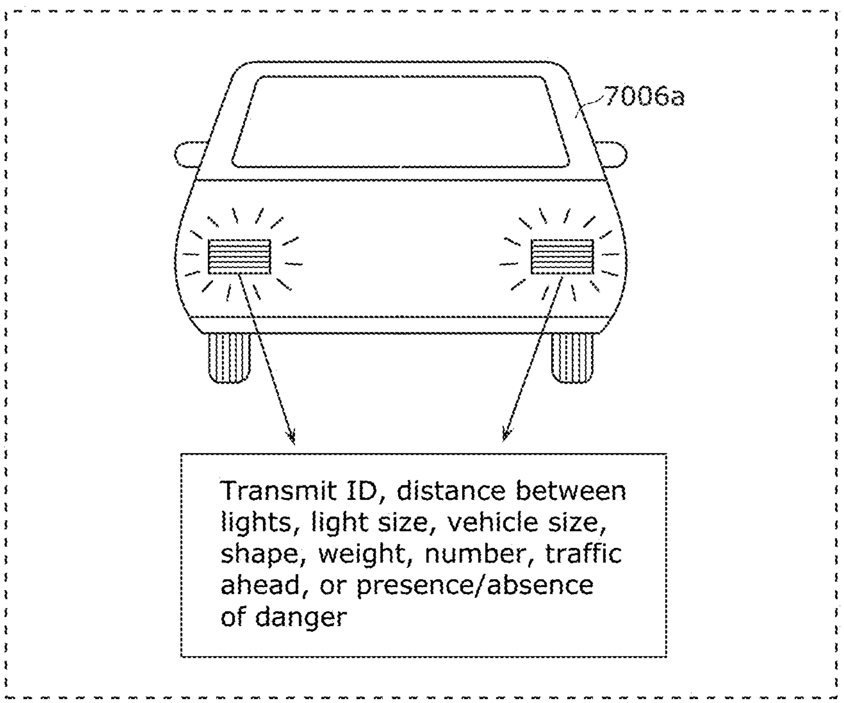
Figure 150:
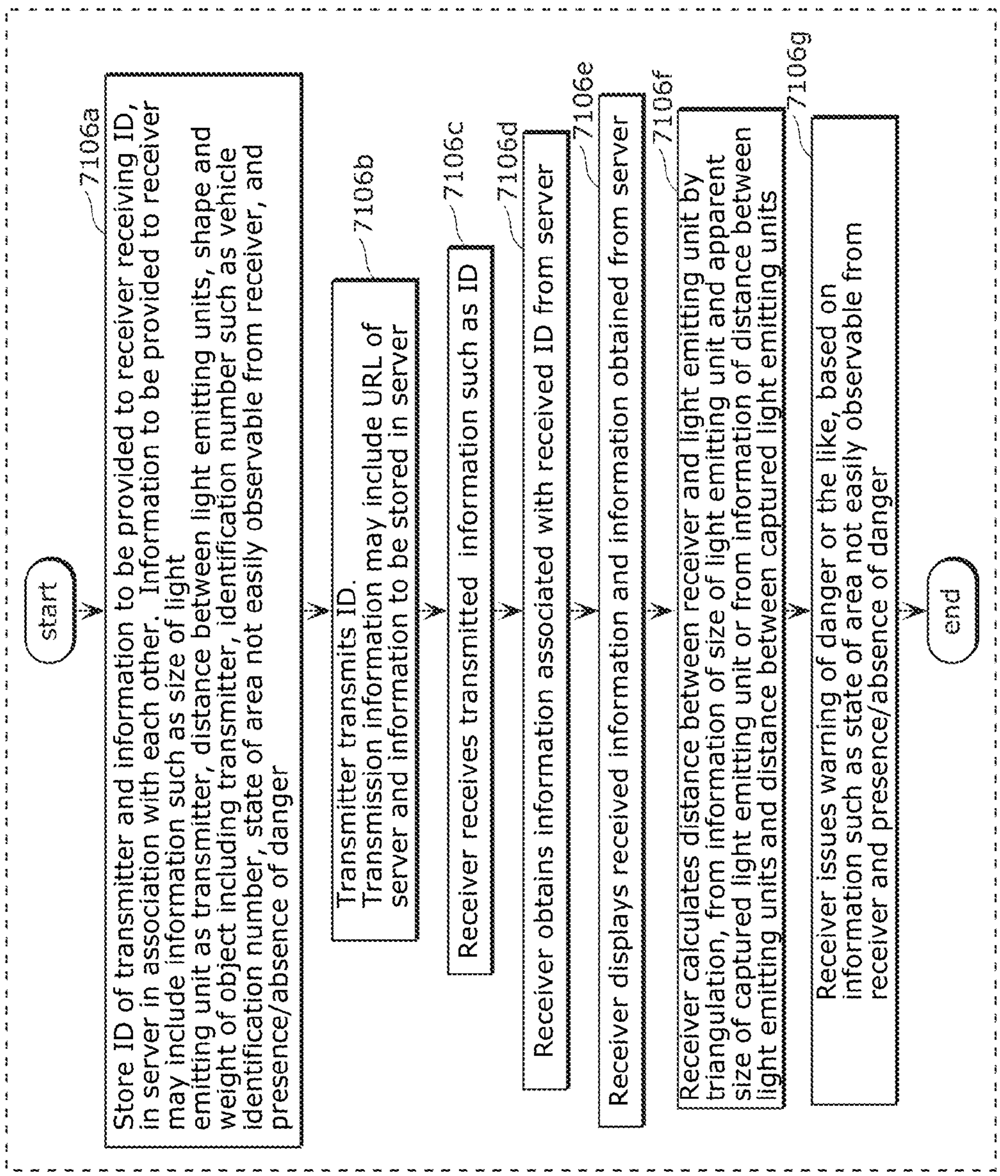
Figure 151:
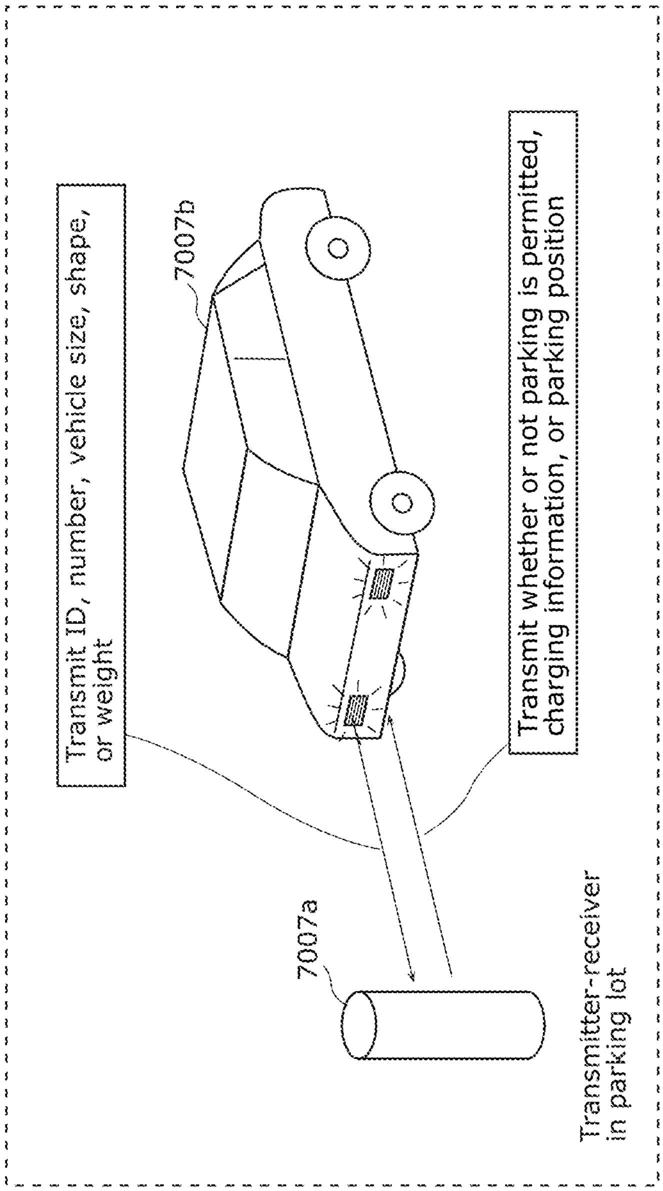
Figure 152:
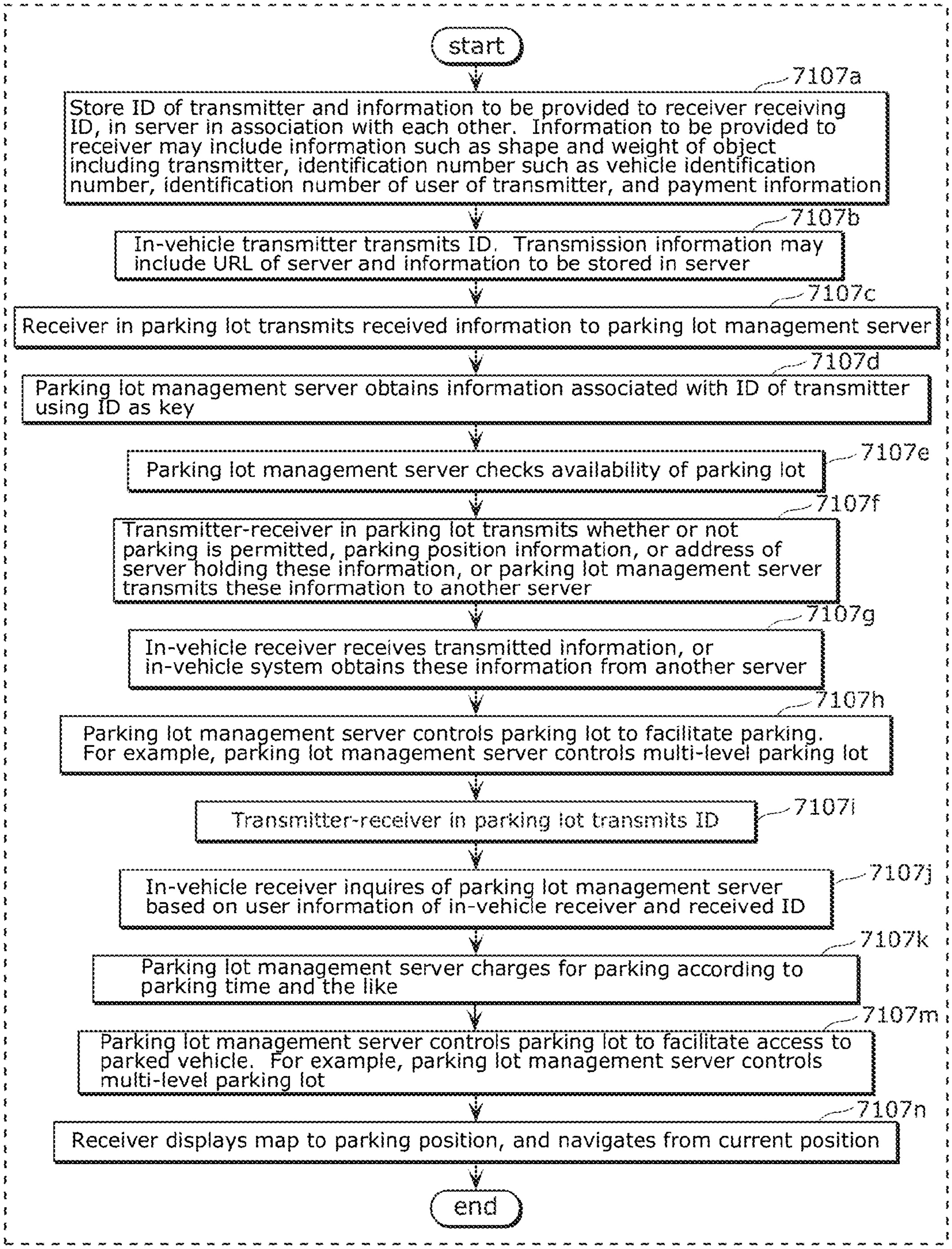
Figure 153:
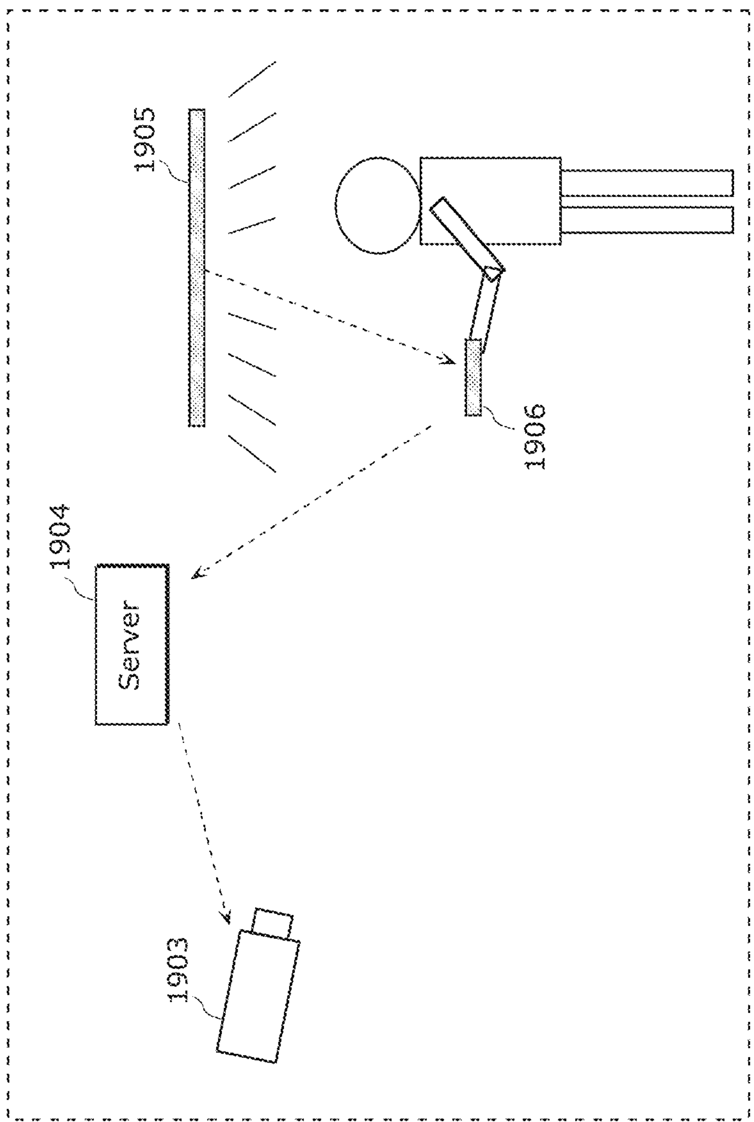
Figure 154:
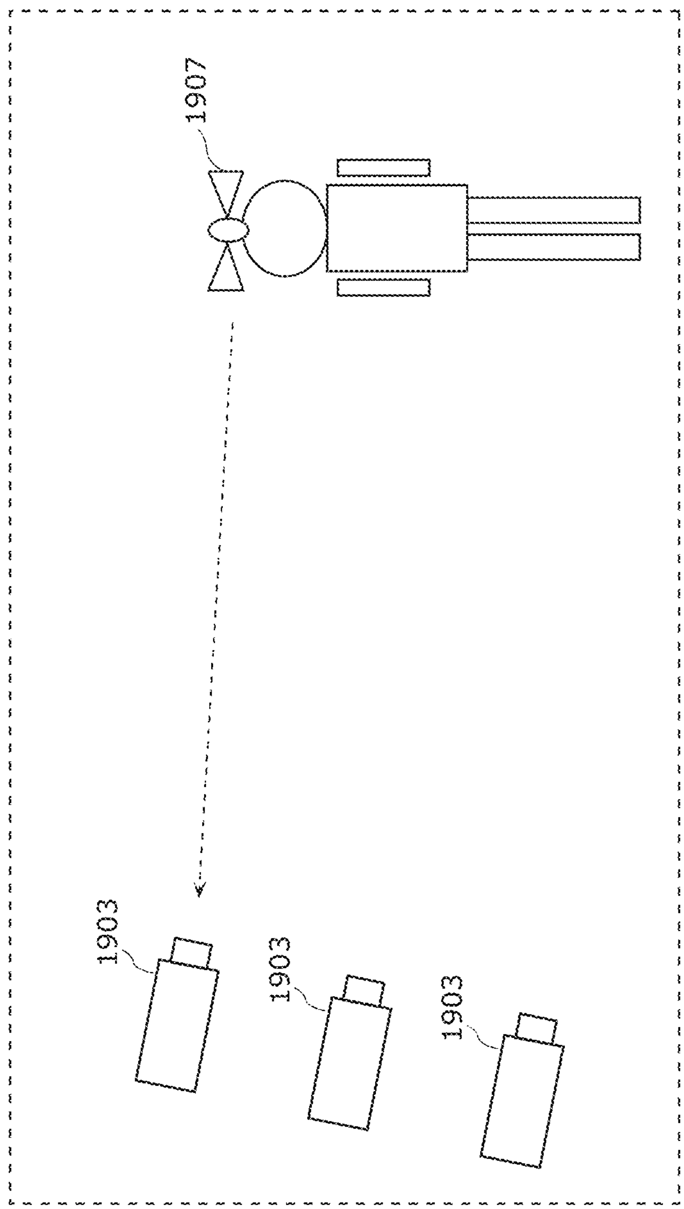
Figure 155:
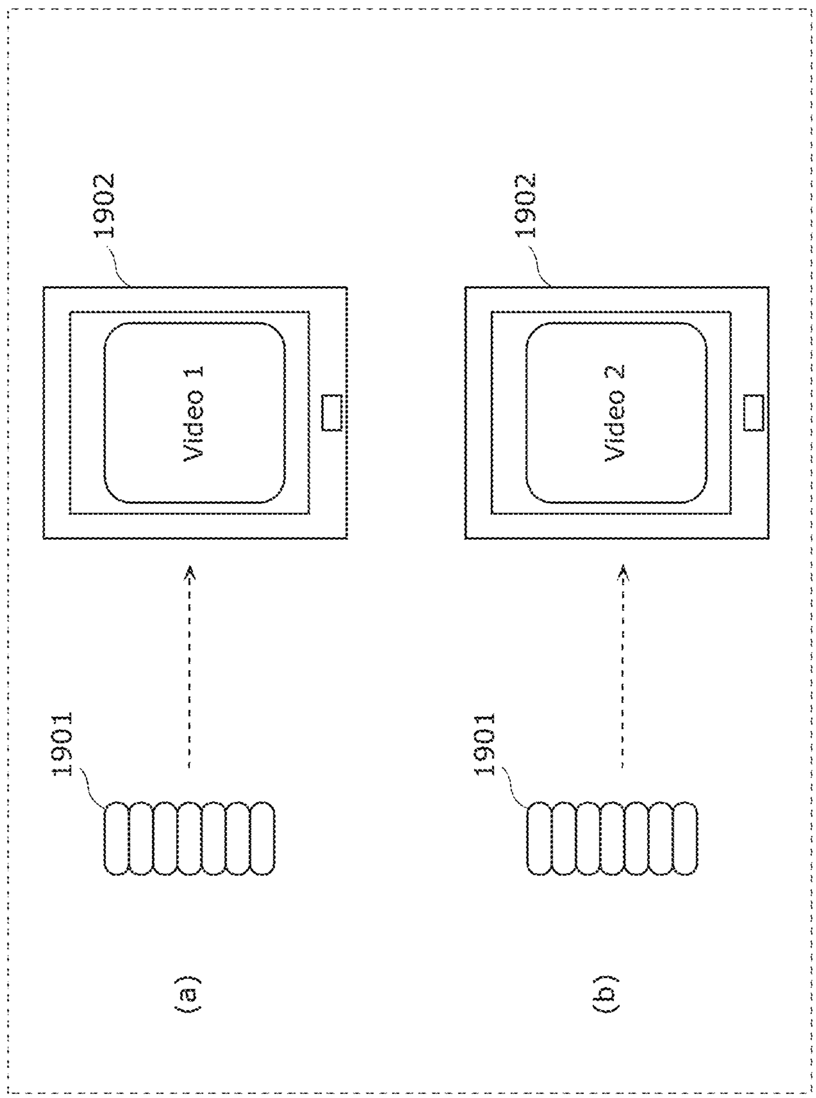
Figure 156:
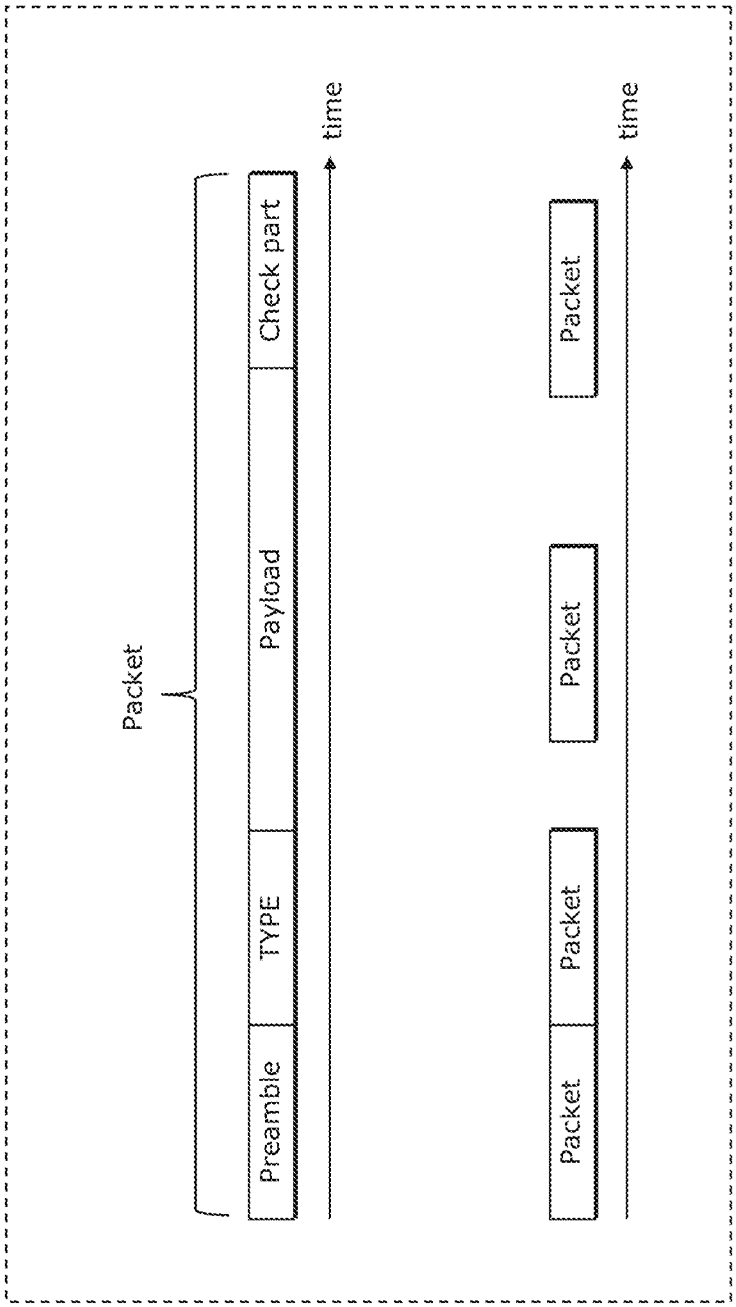
Figure 157:
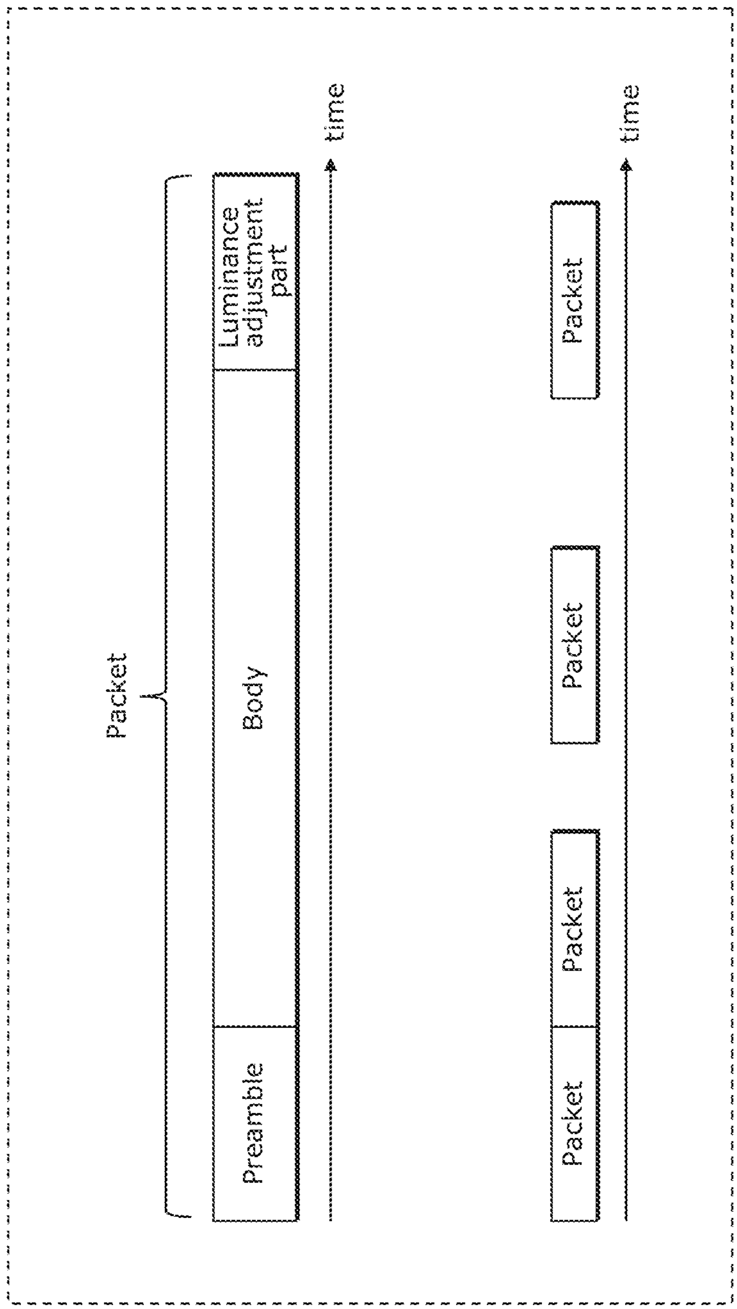
Figure 158:
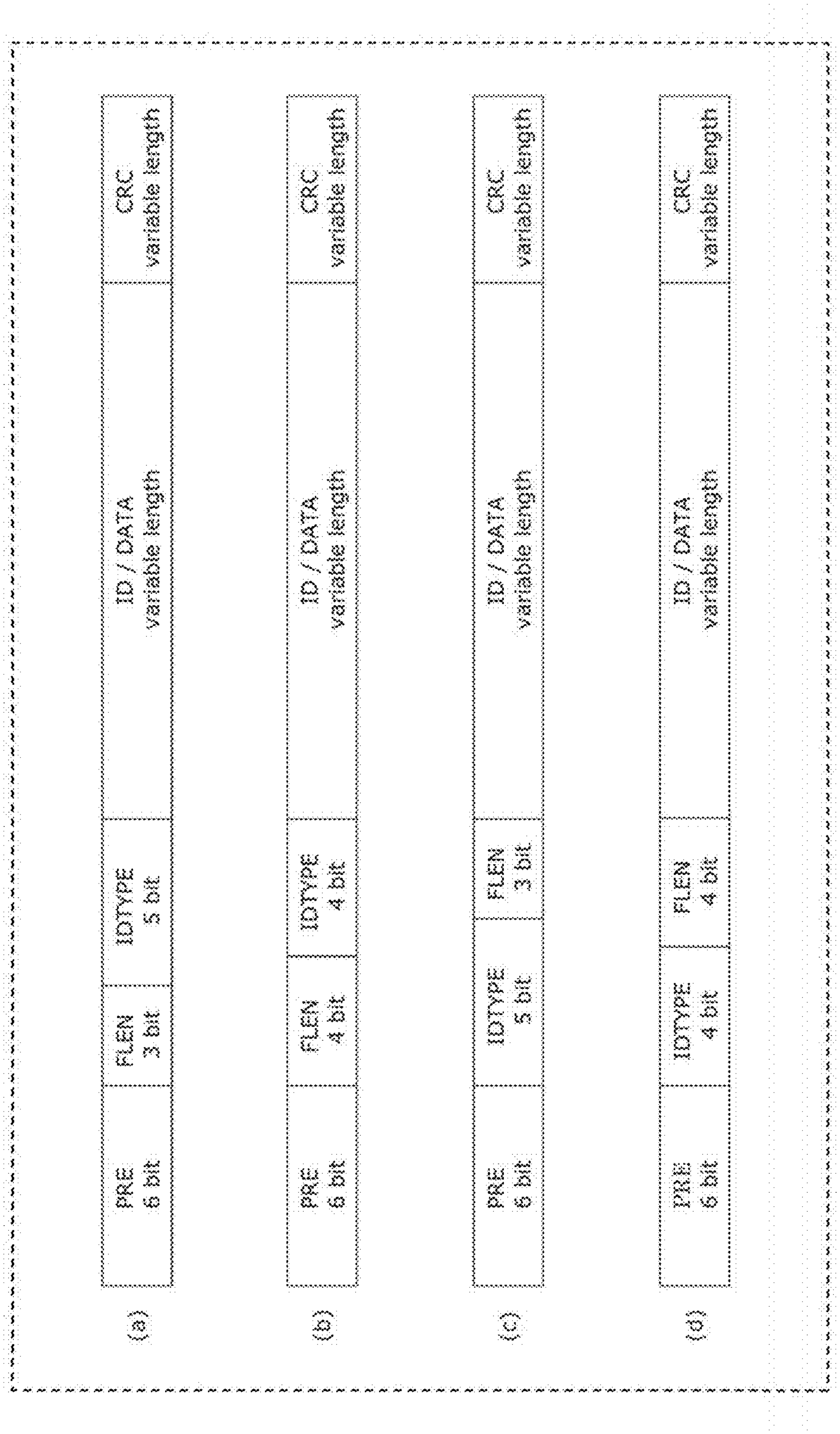
Figure 159:
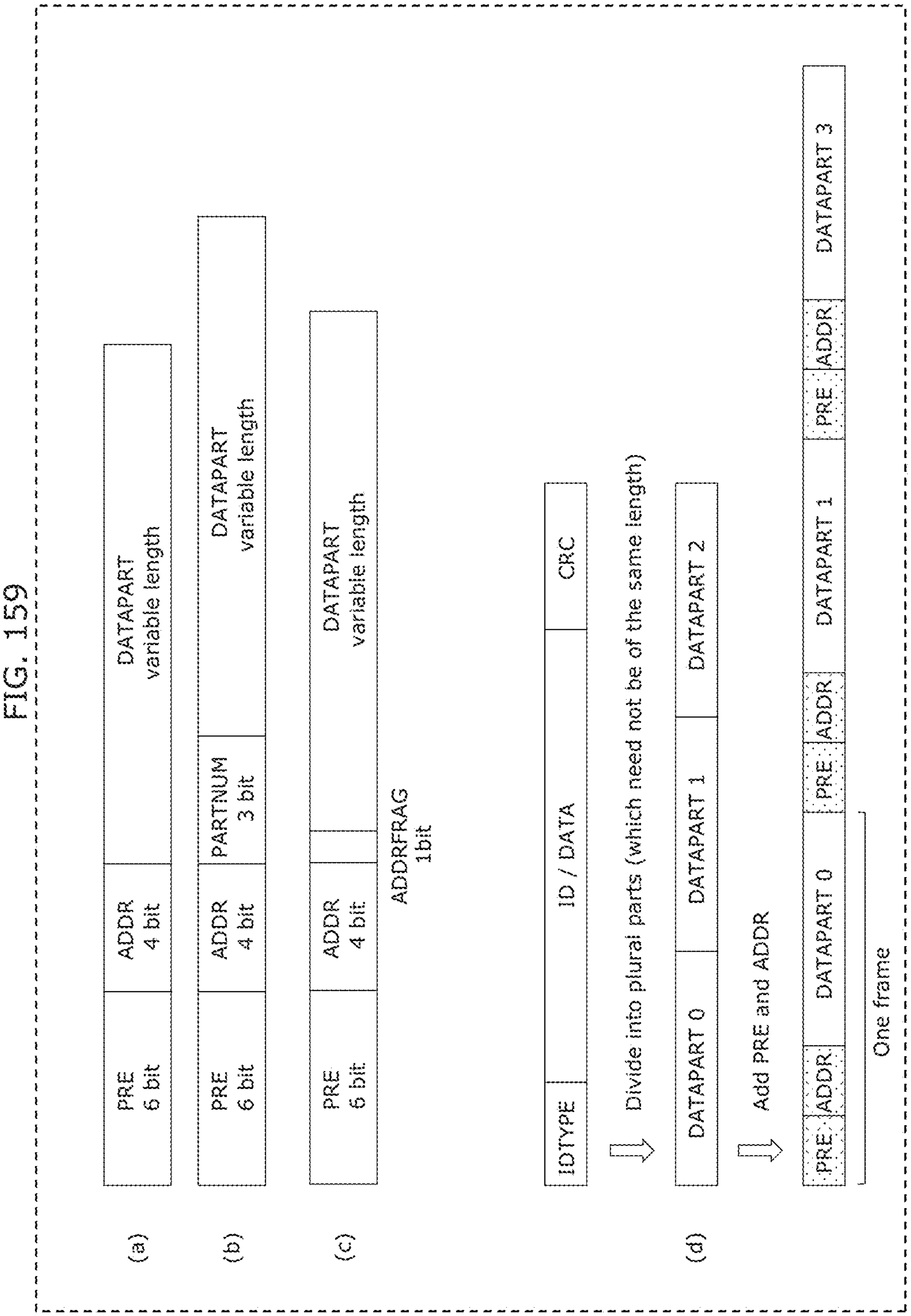
Figure 164:
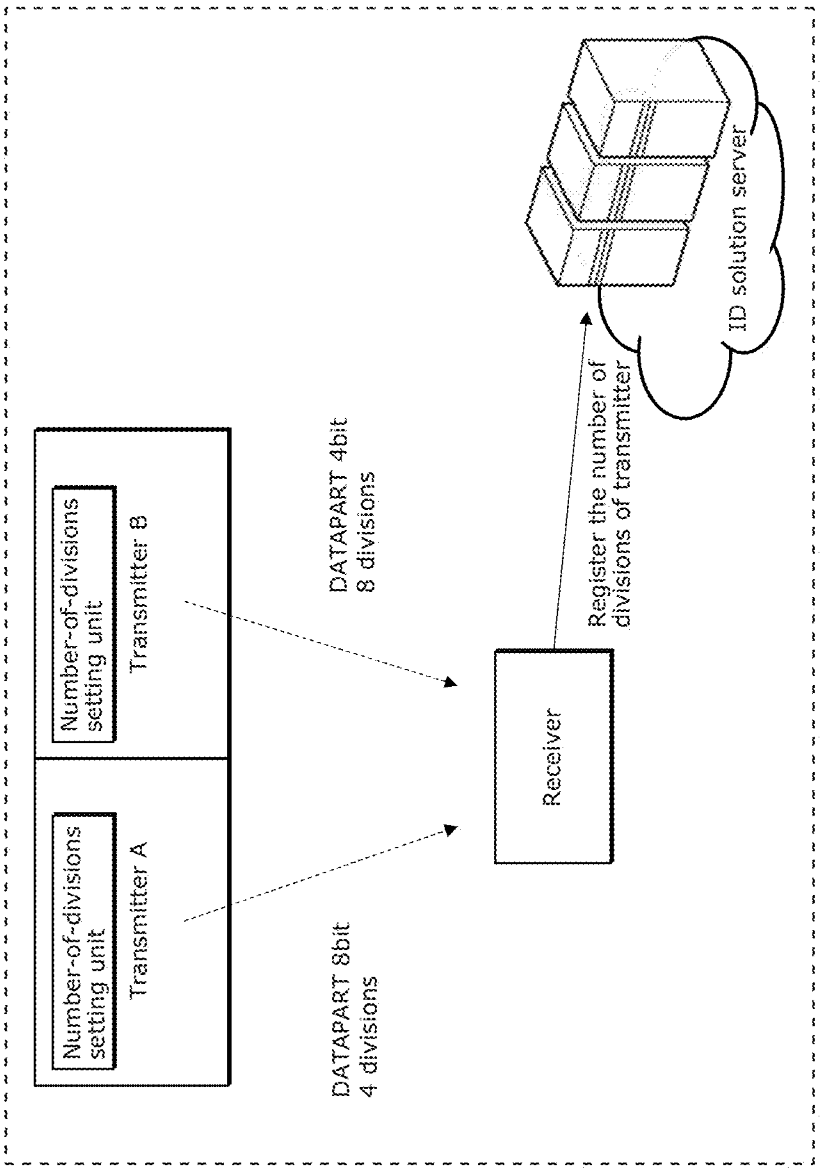
Figure 165:
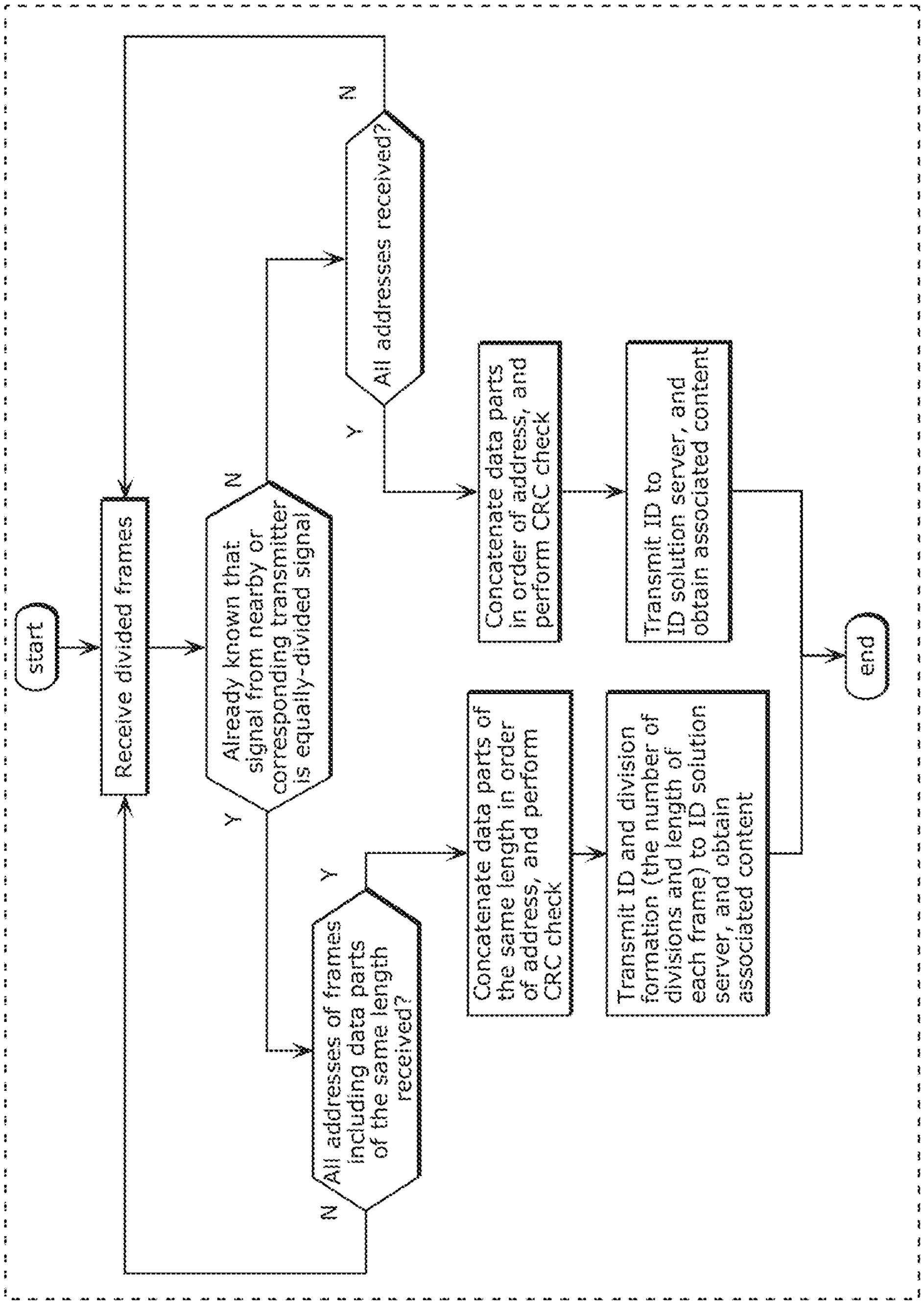
Figure 166:
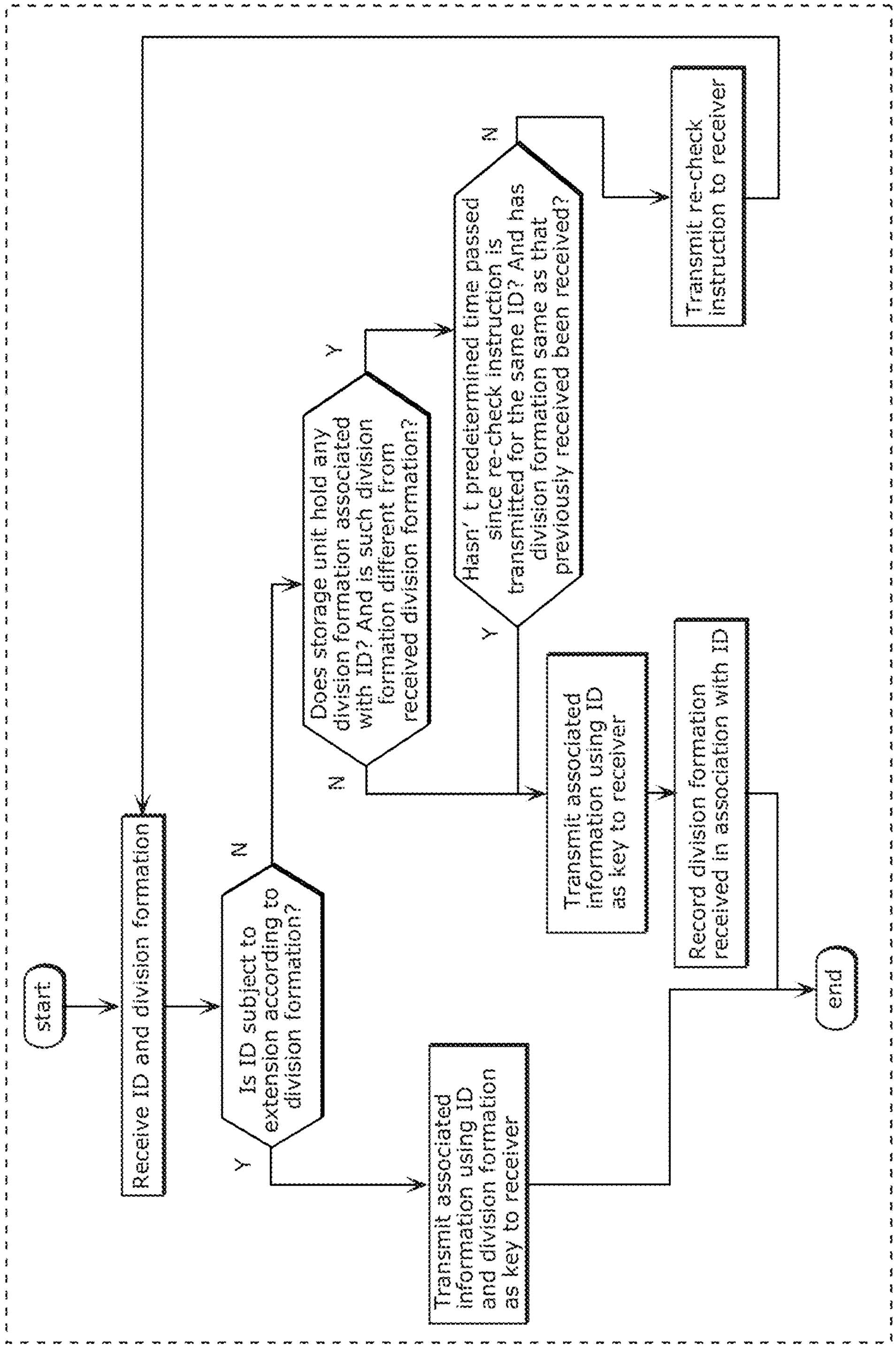
Figure 167:
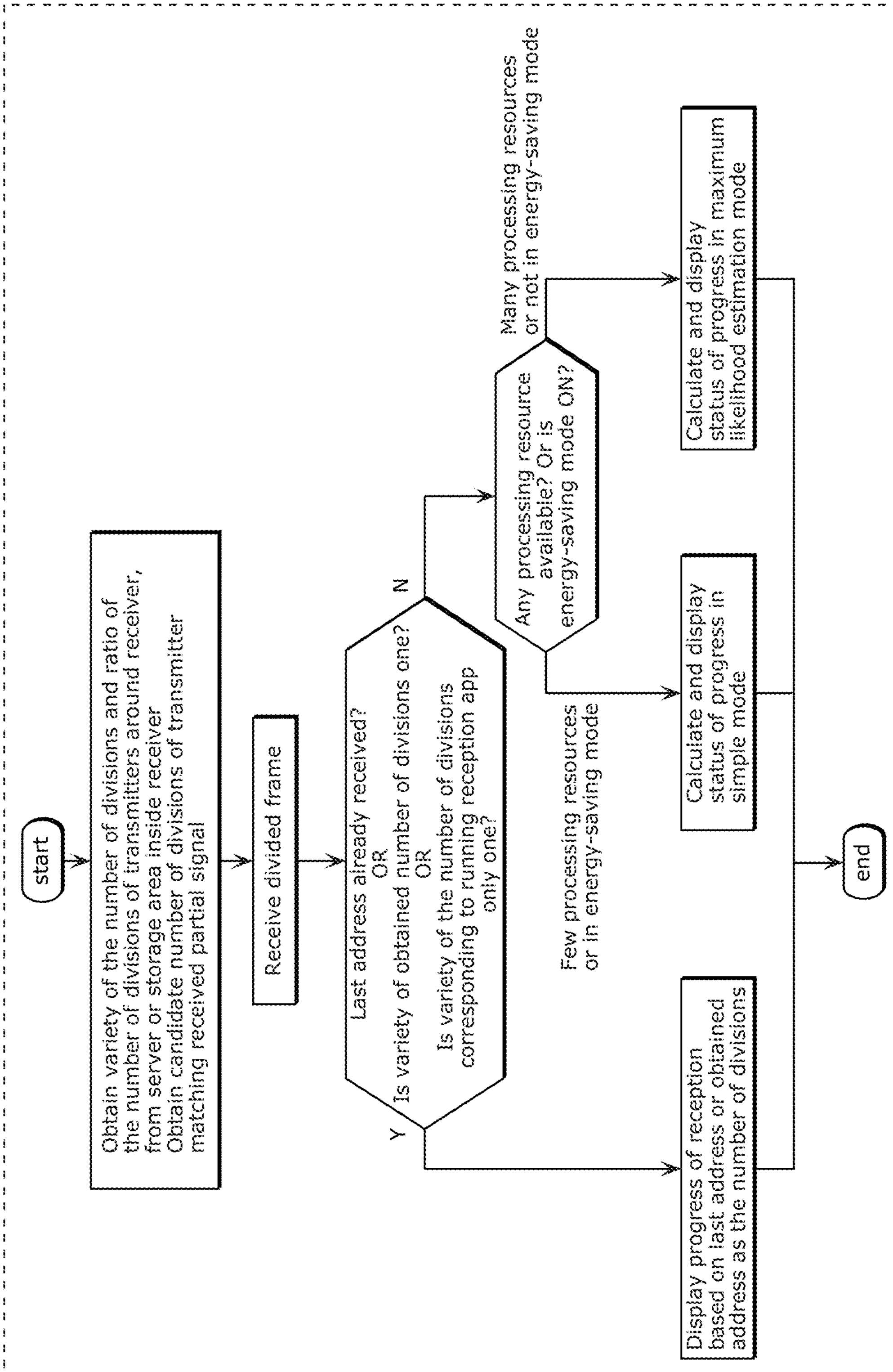
Figure 168:
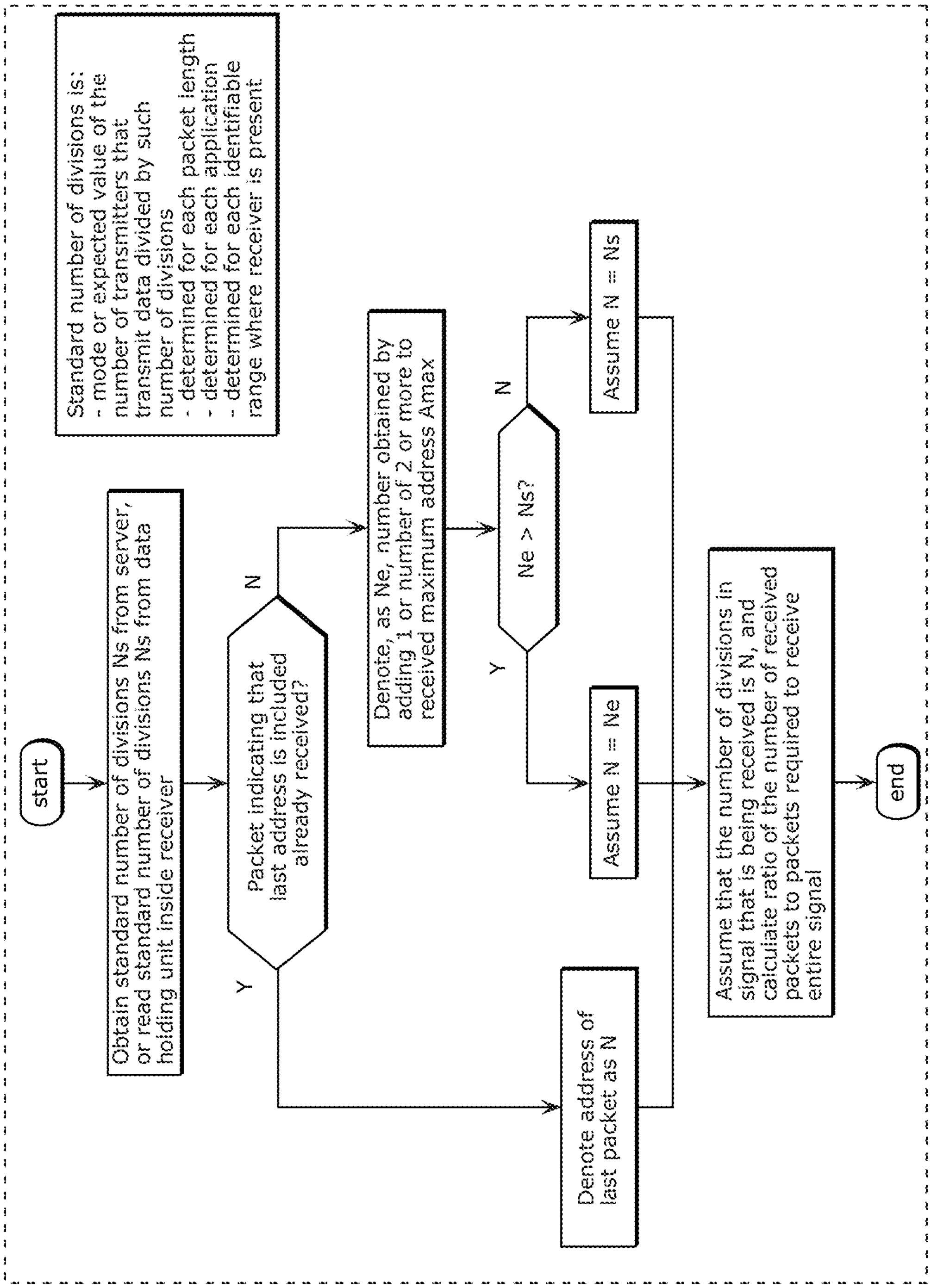
Figure 170:
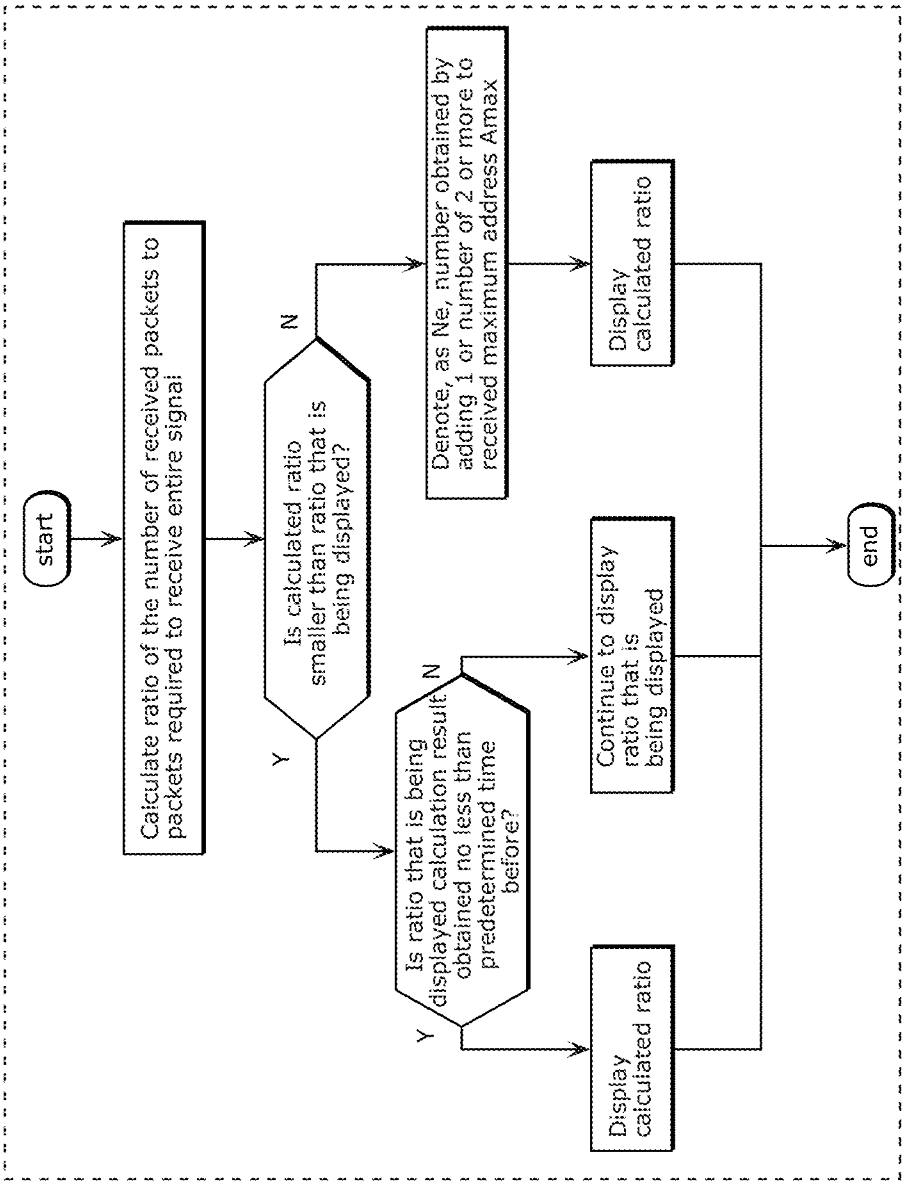
Figure 171:
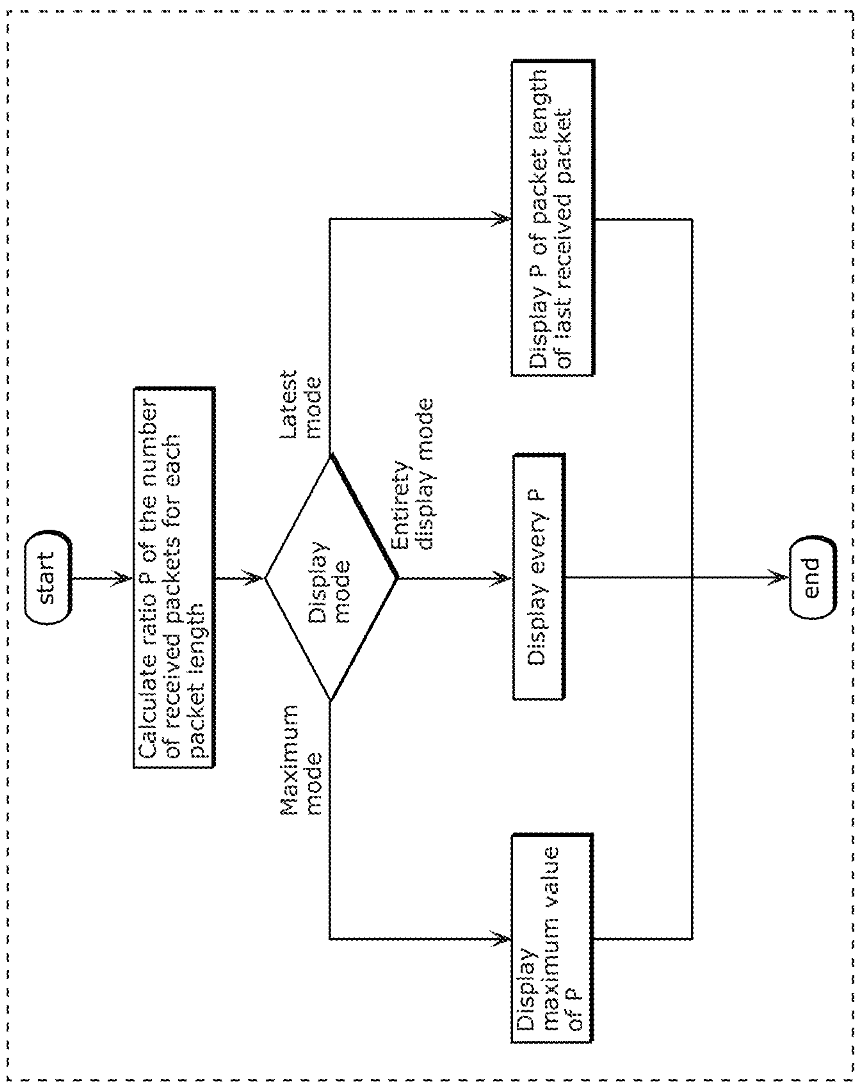
Figure 172:
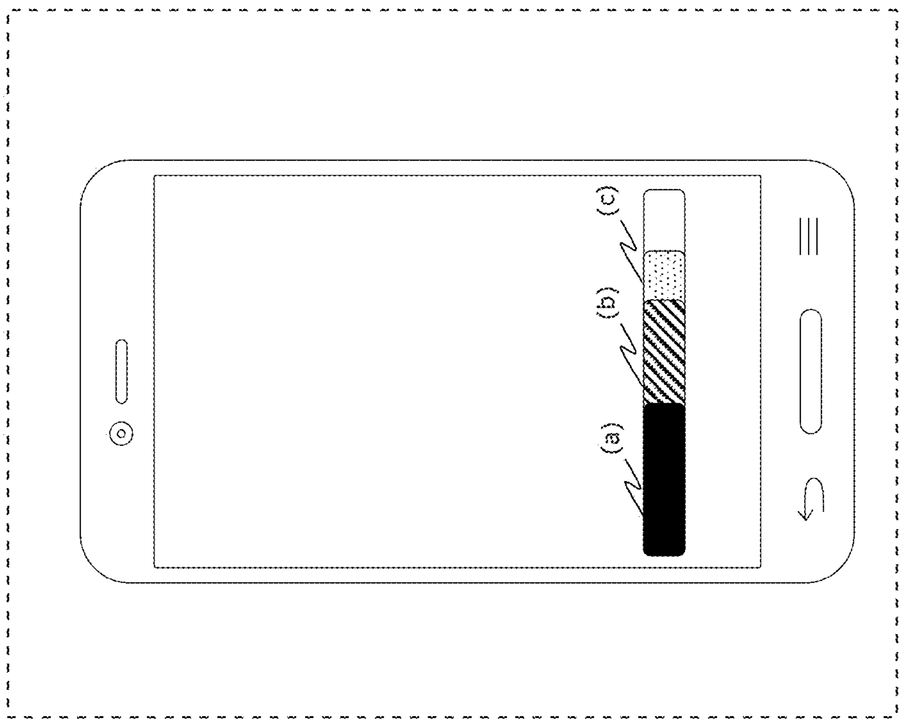
Figure 173:
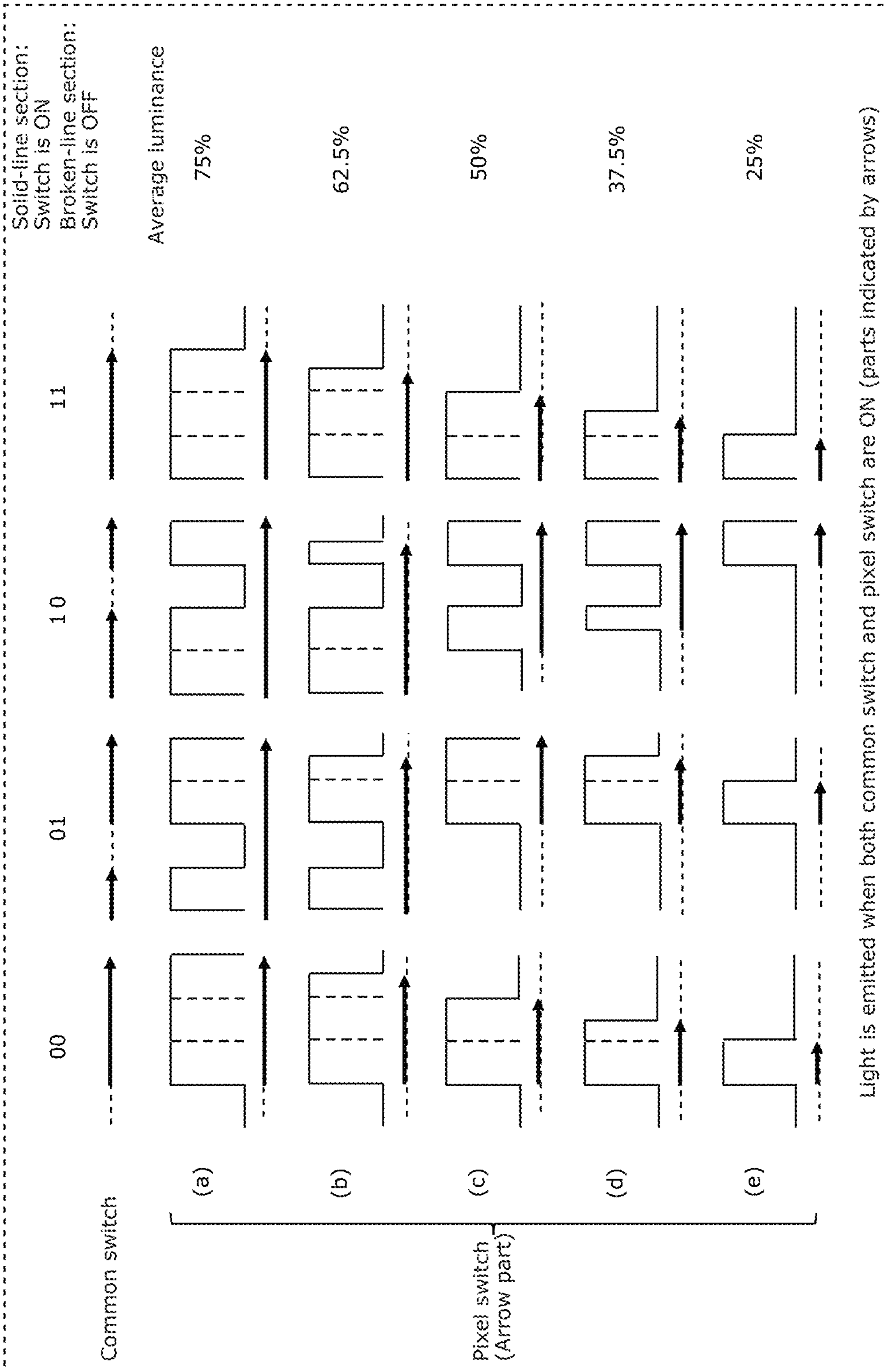
Figure 174:
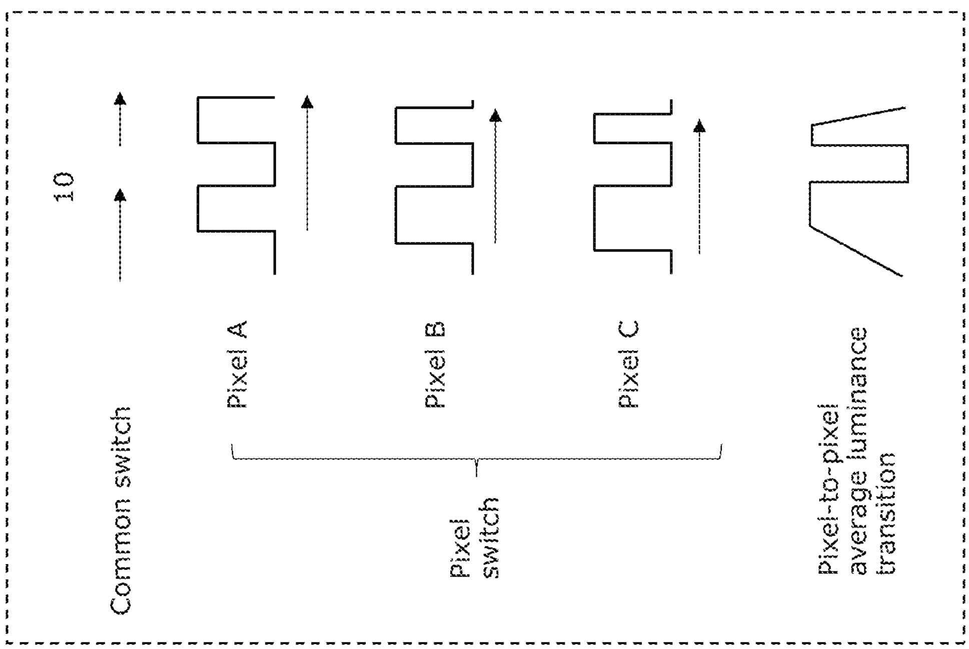
Figure 175:
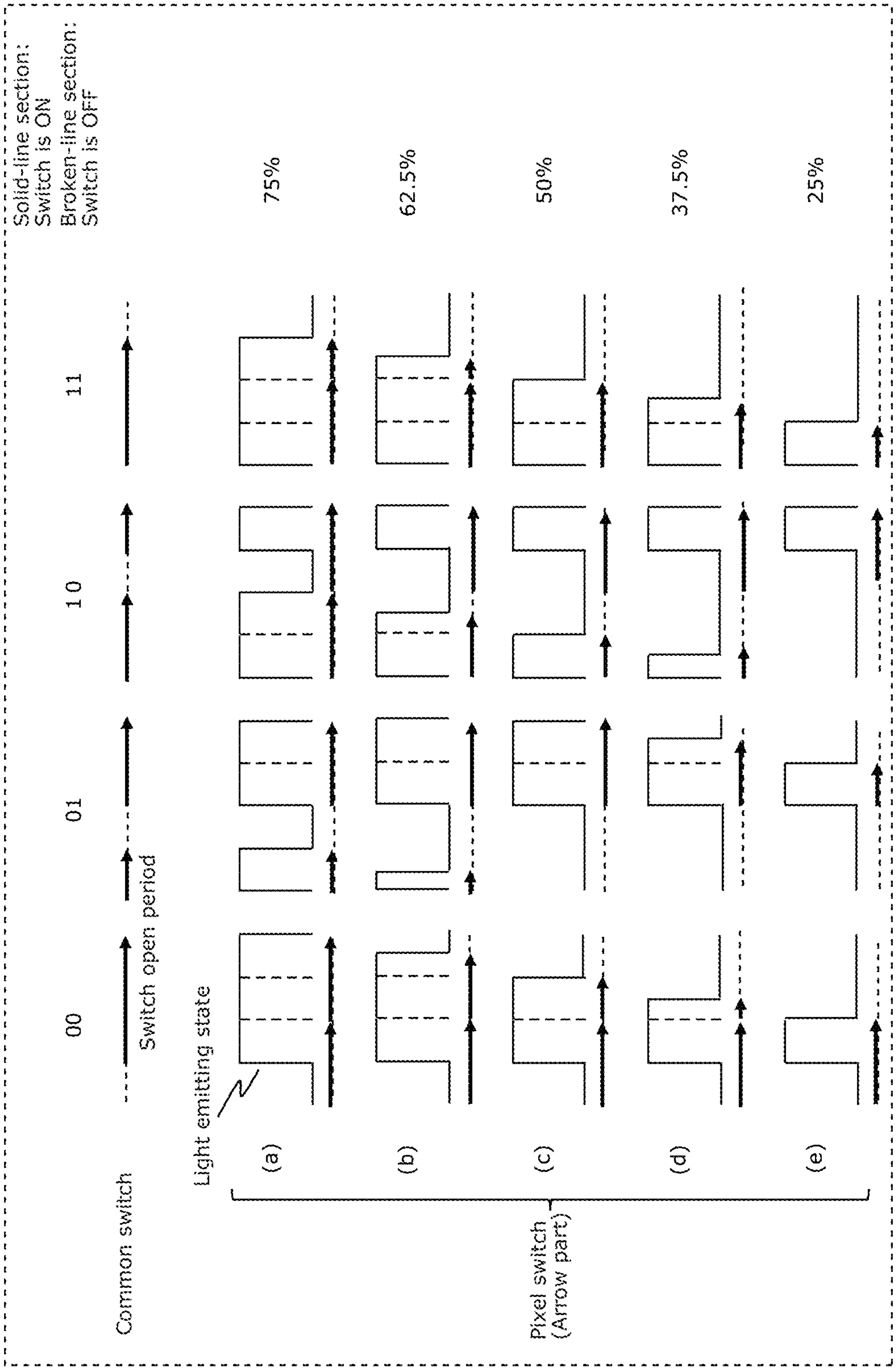
Figure 176:
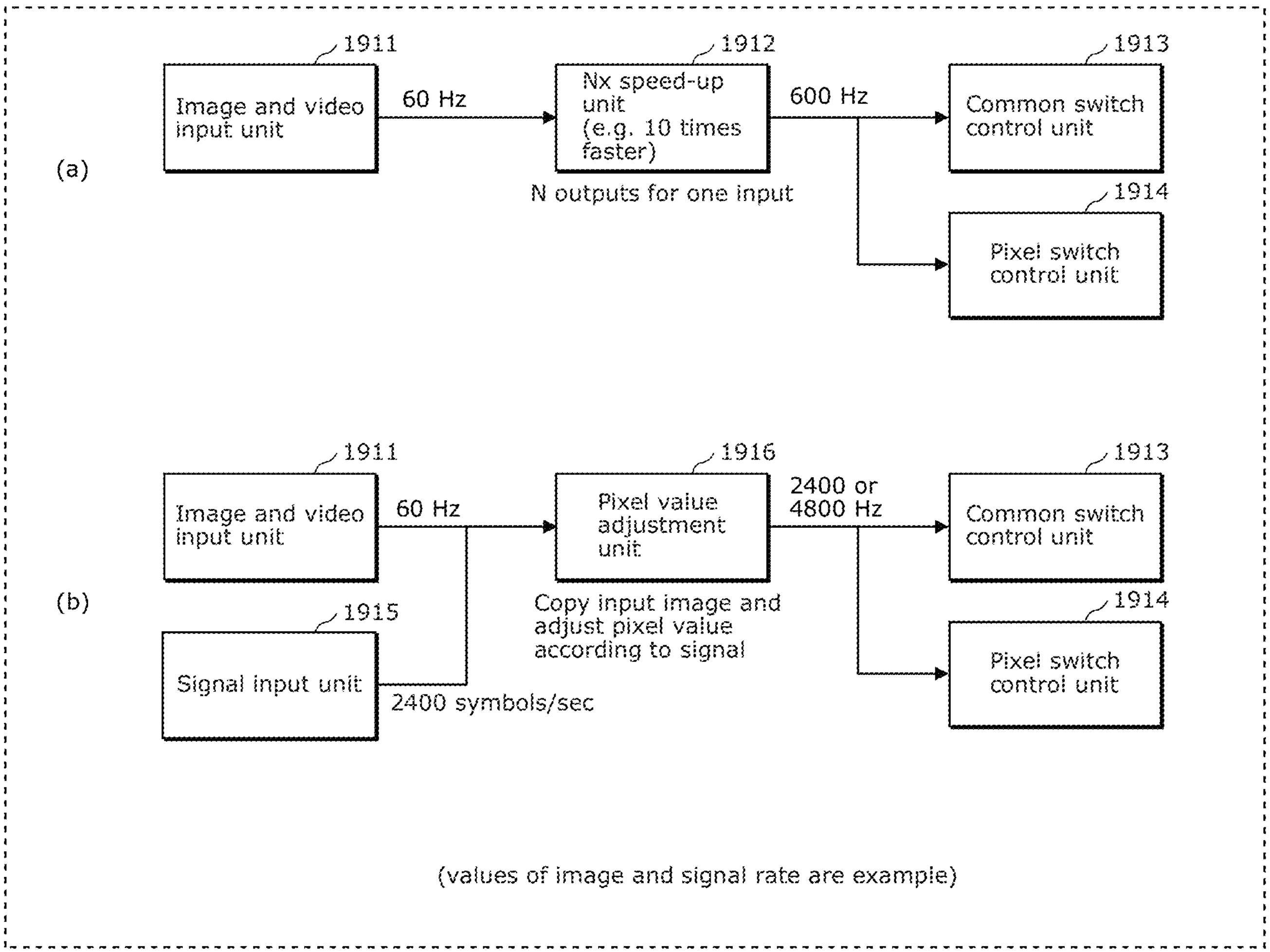
Figure 177:
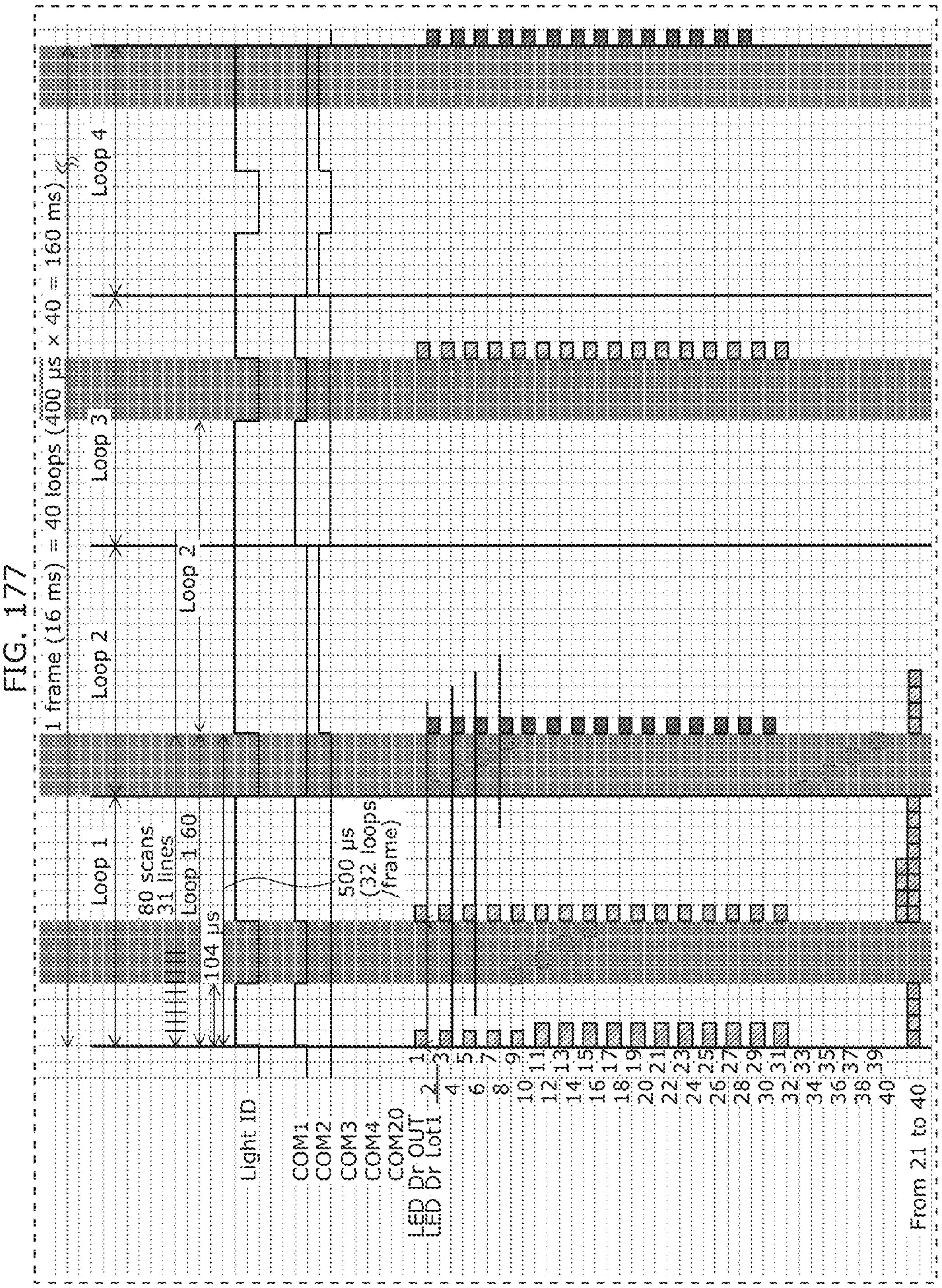
Figure 178:
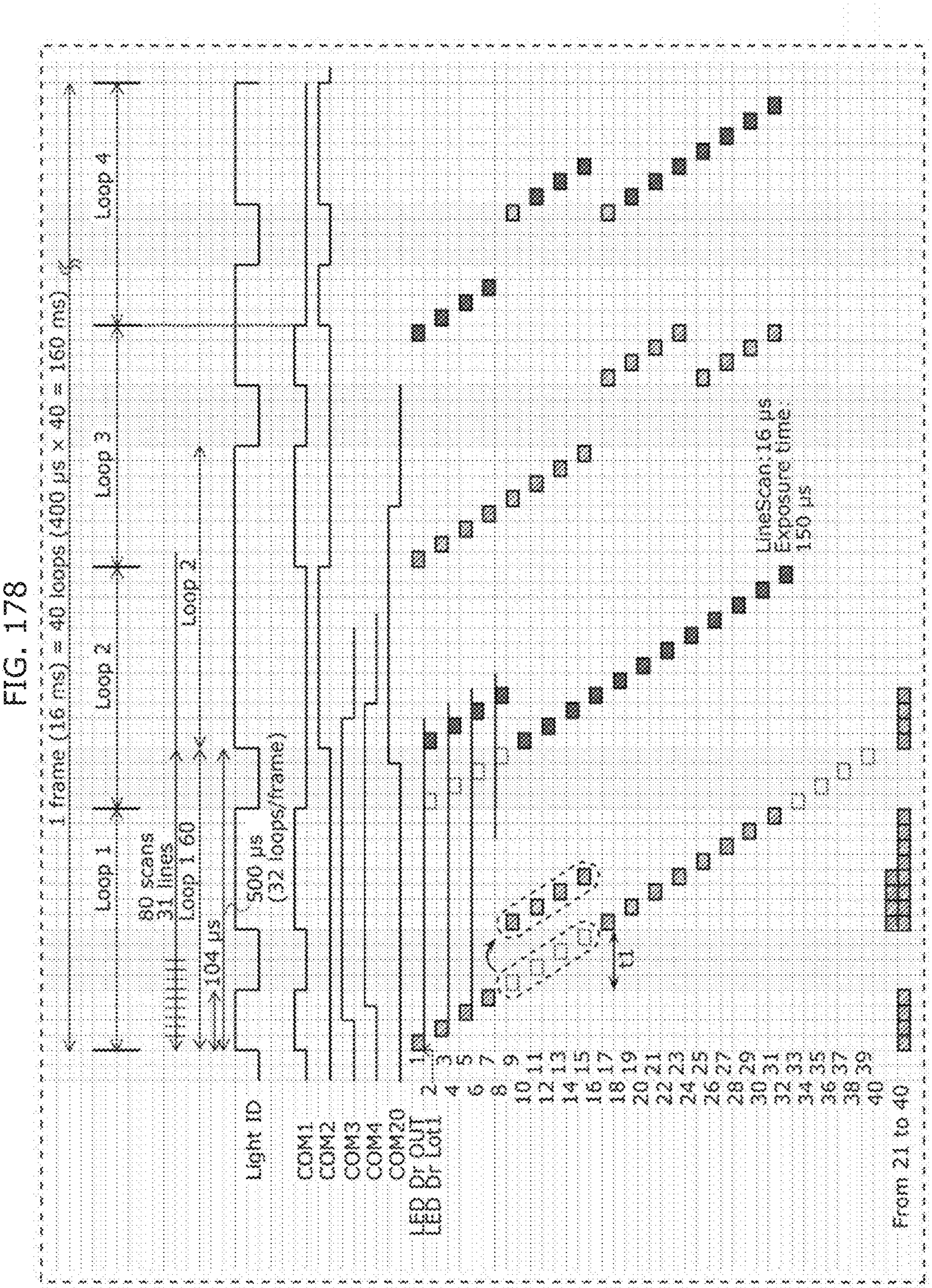
Figure 179:
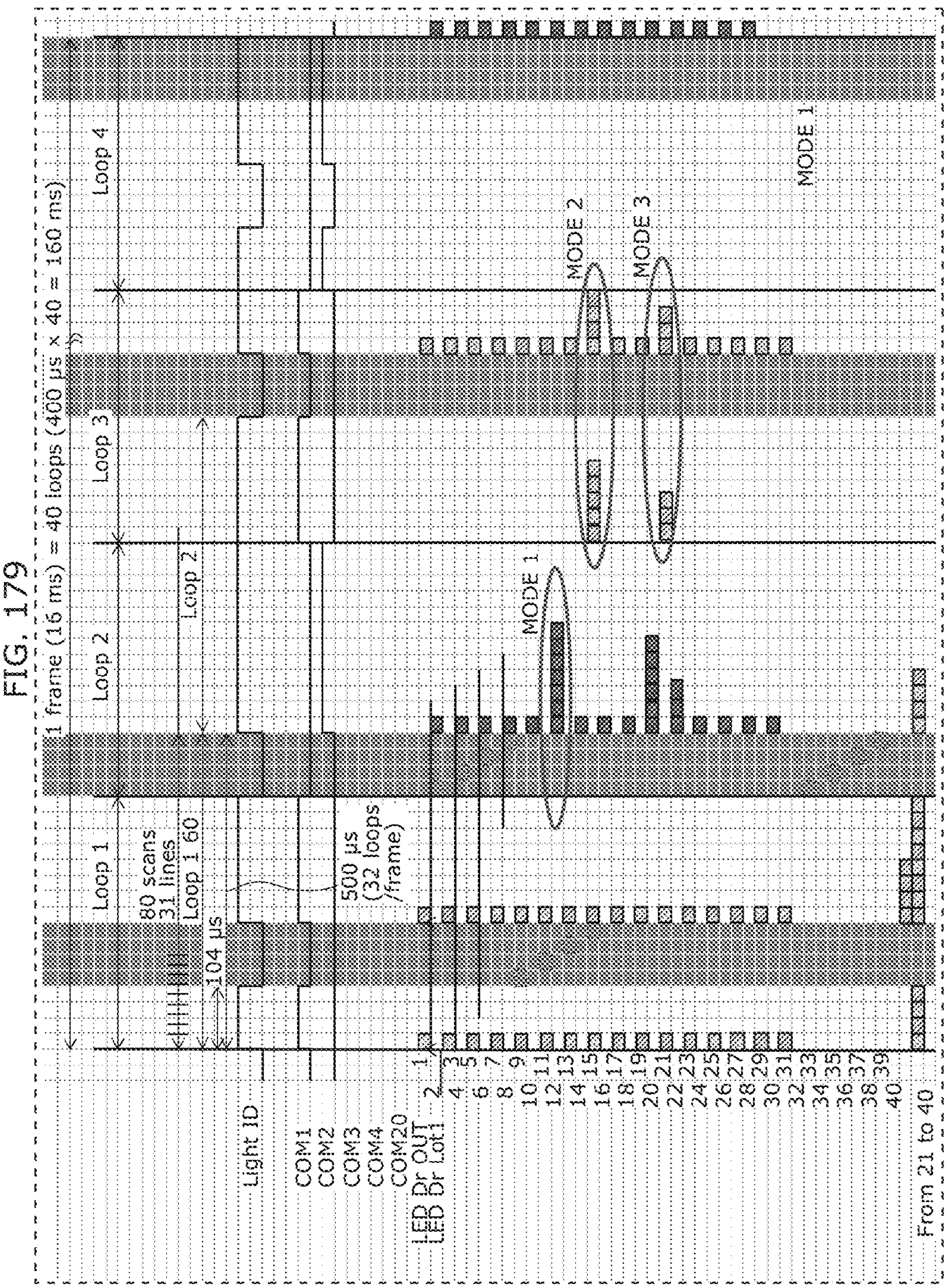
Figure 180B:
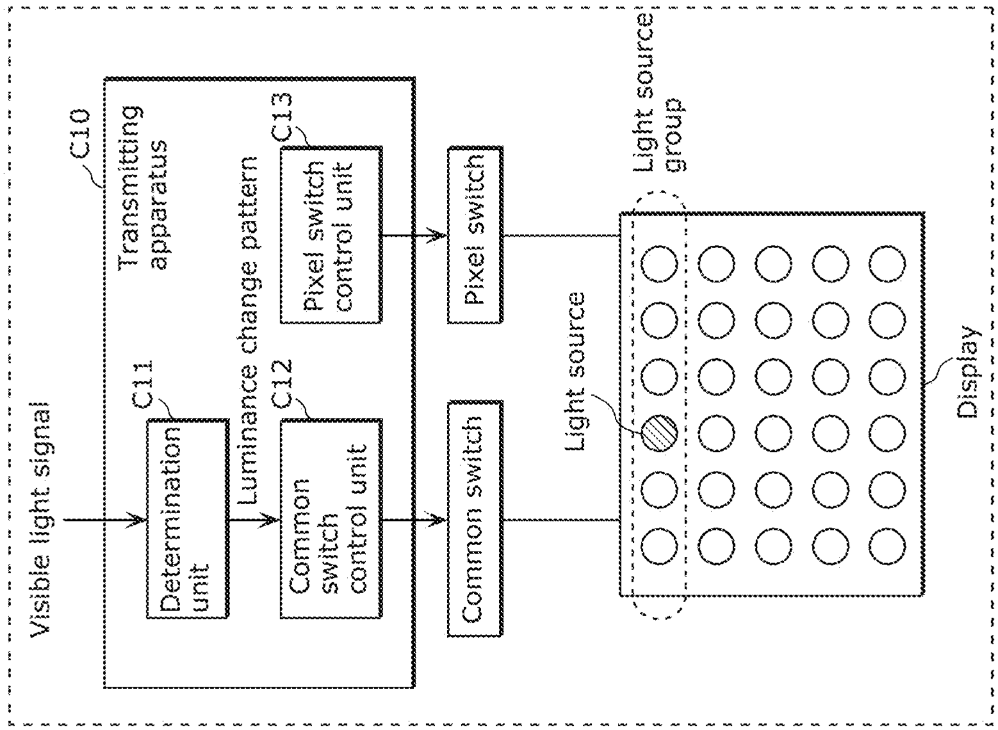
Figure 180A:
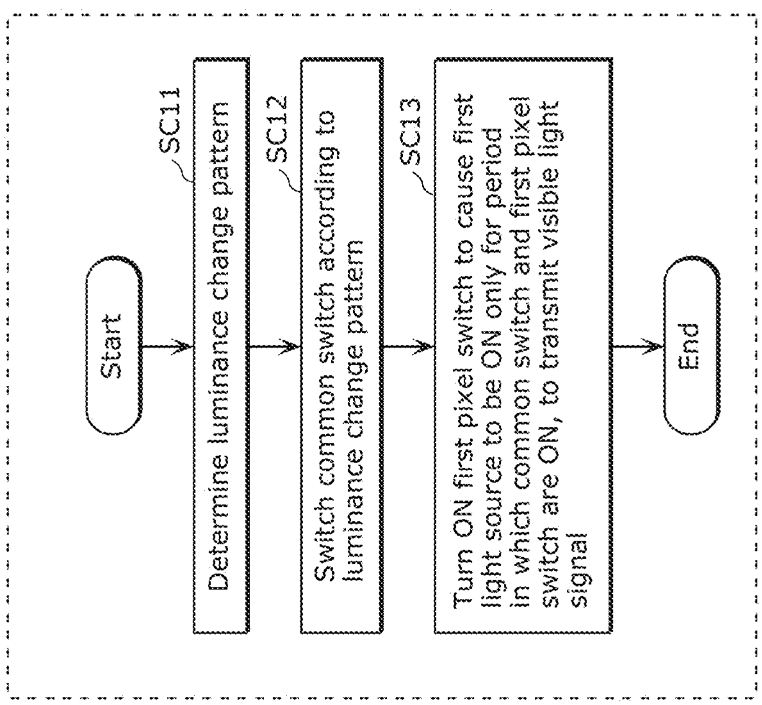
Figure 182:
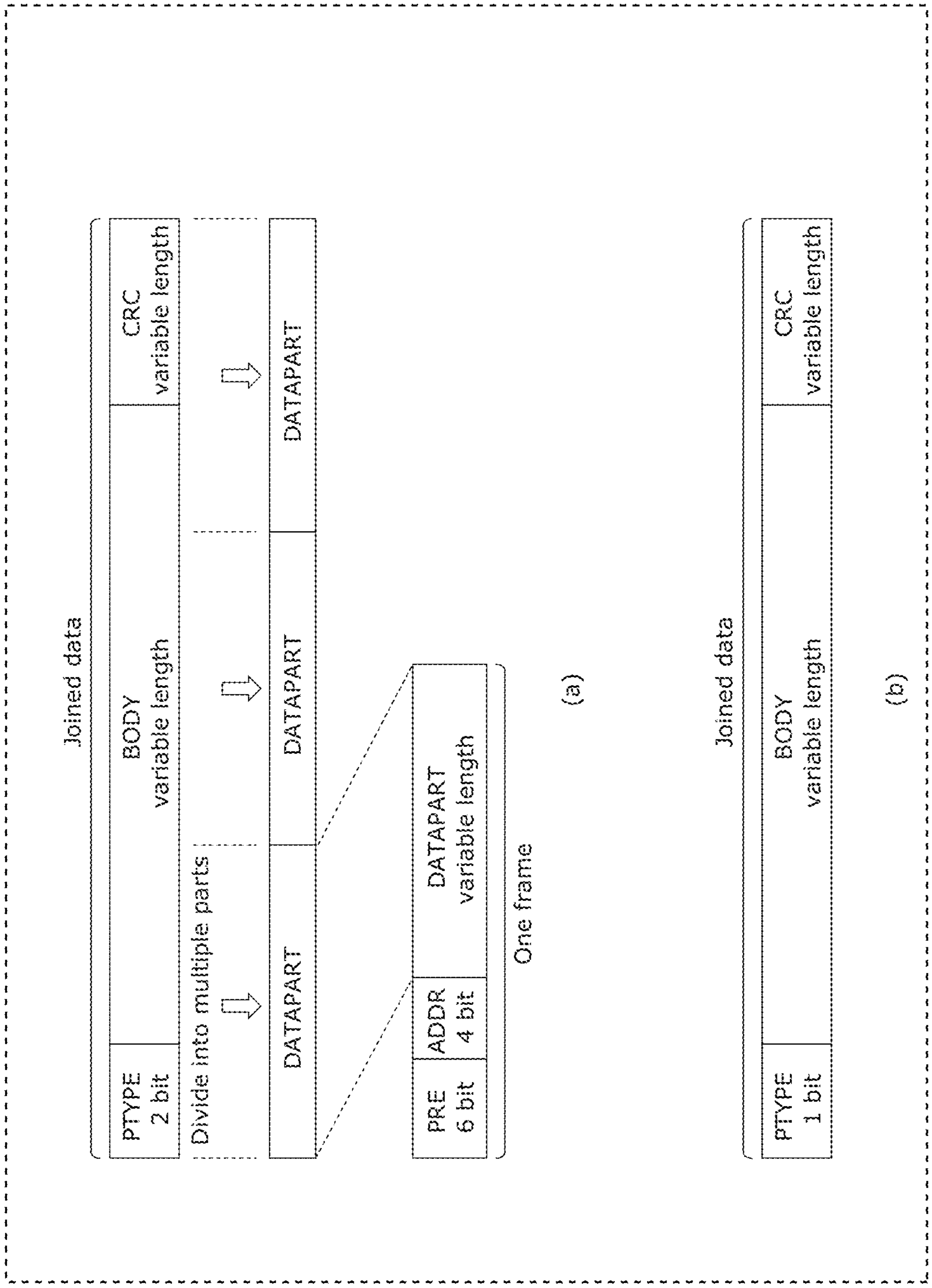
Figure 184:
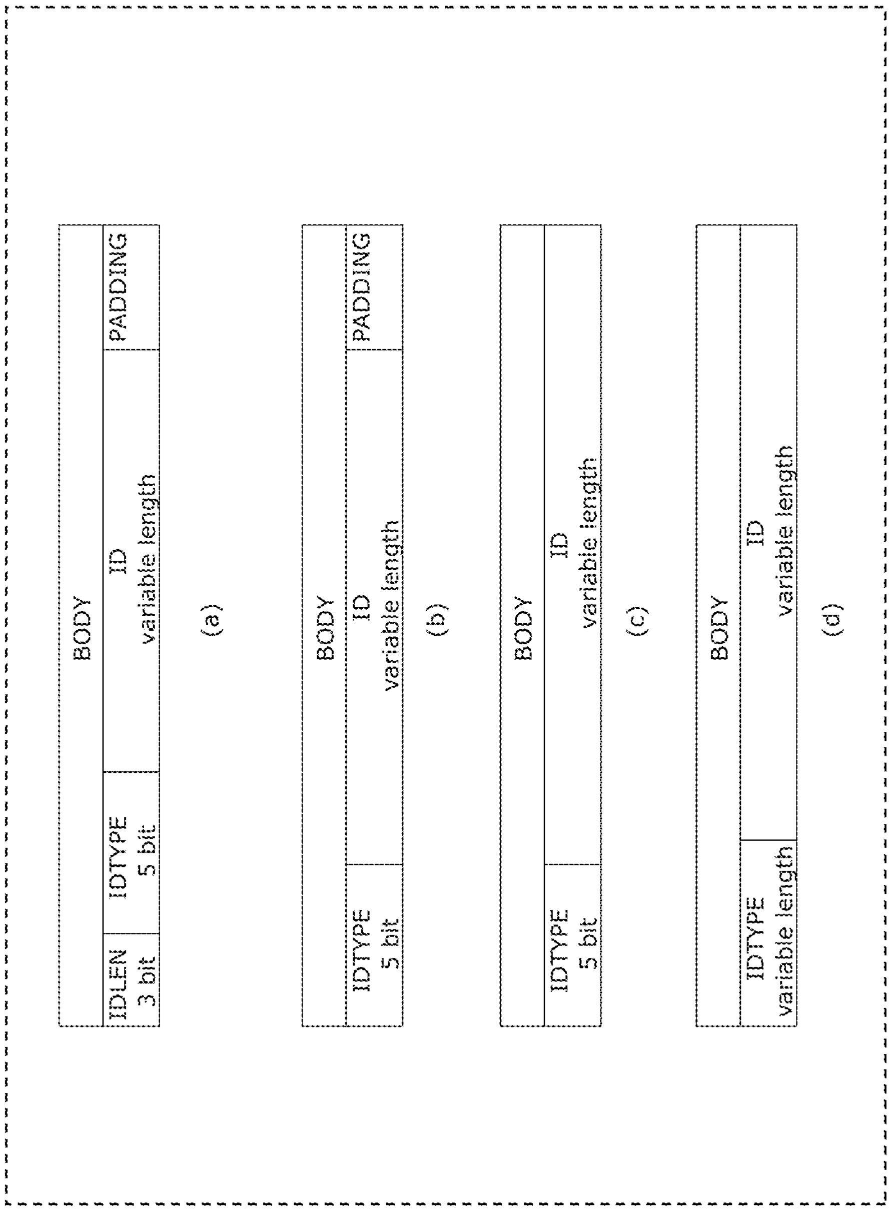
Figure 188:
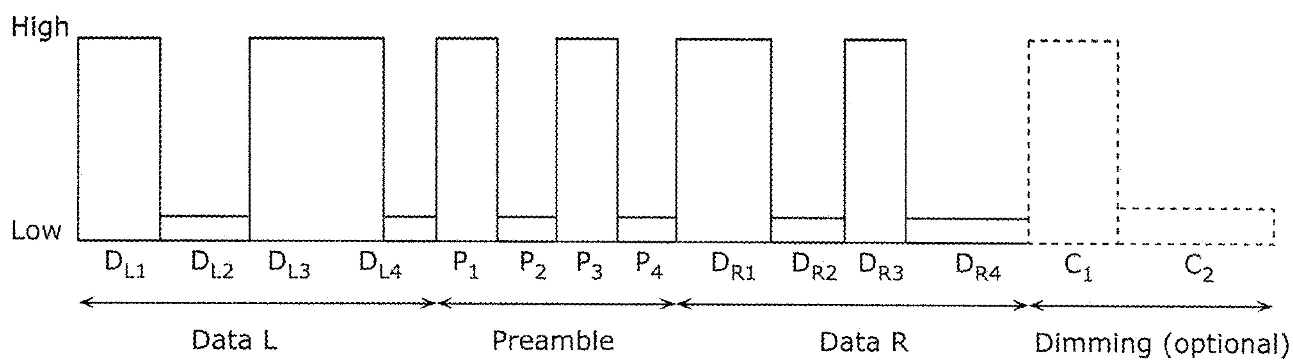
Figure 189A:
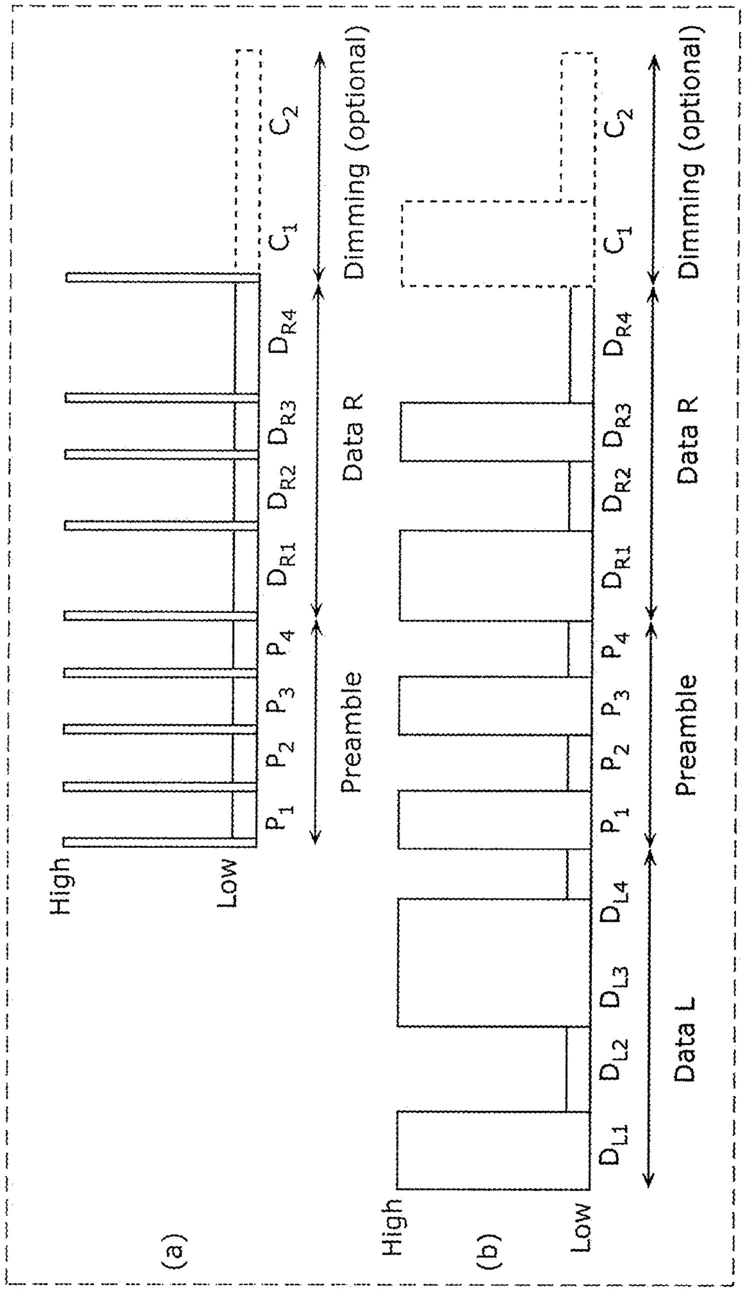
Figures 189B, 189C:
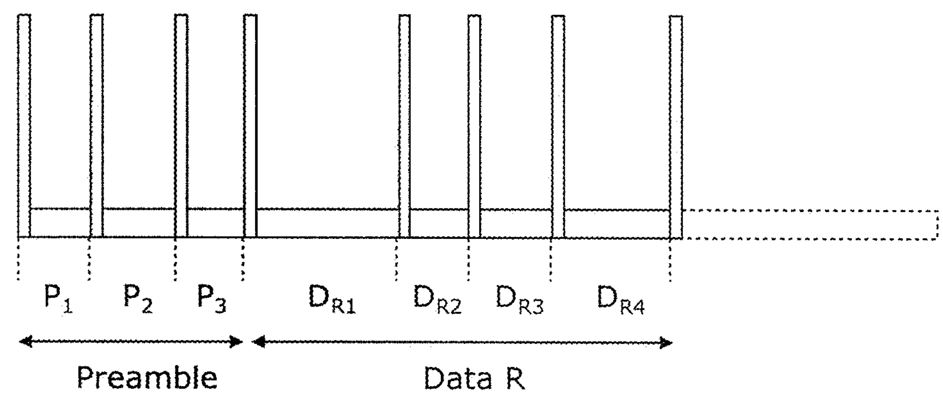
Figure 191:
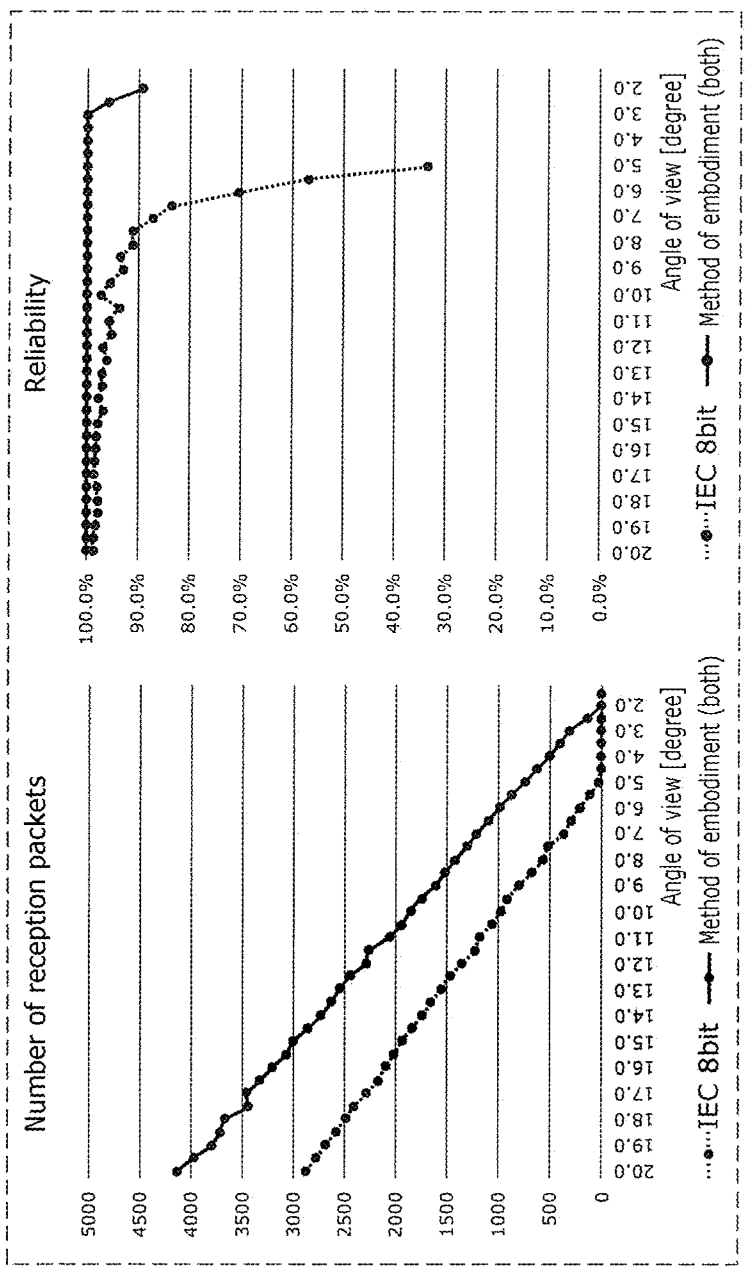
Figure 192:
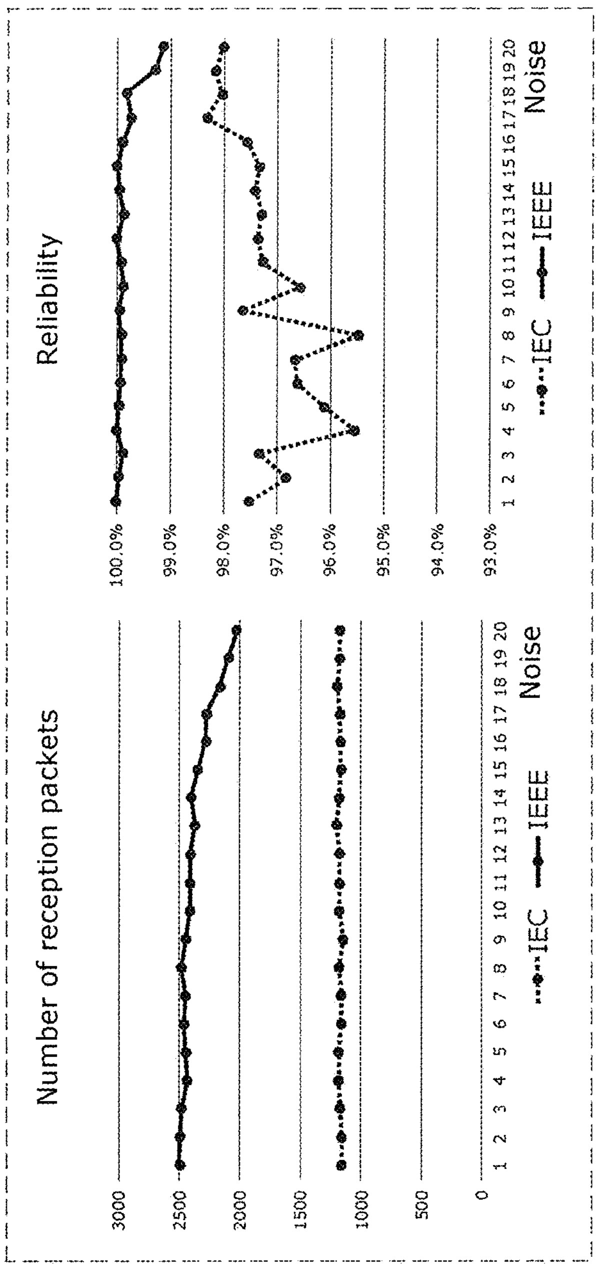
Figure 193:
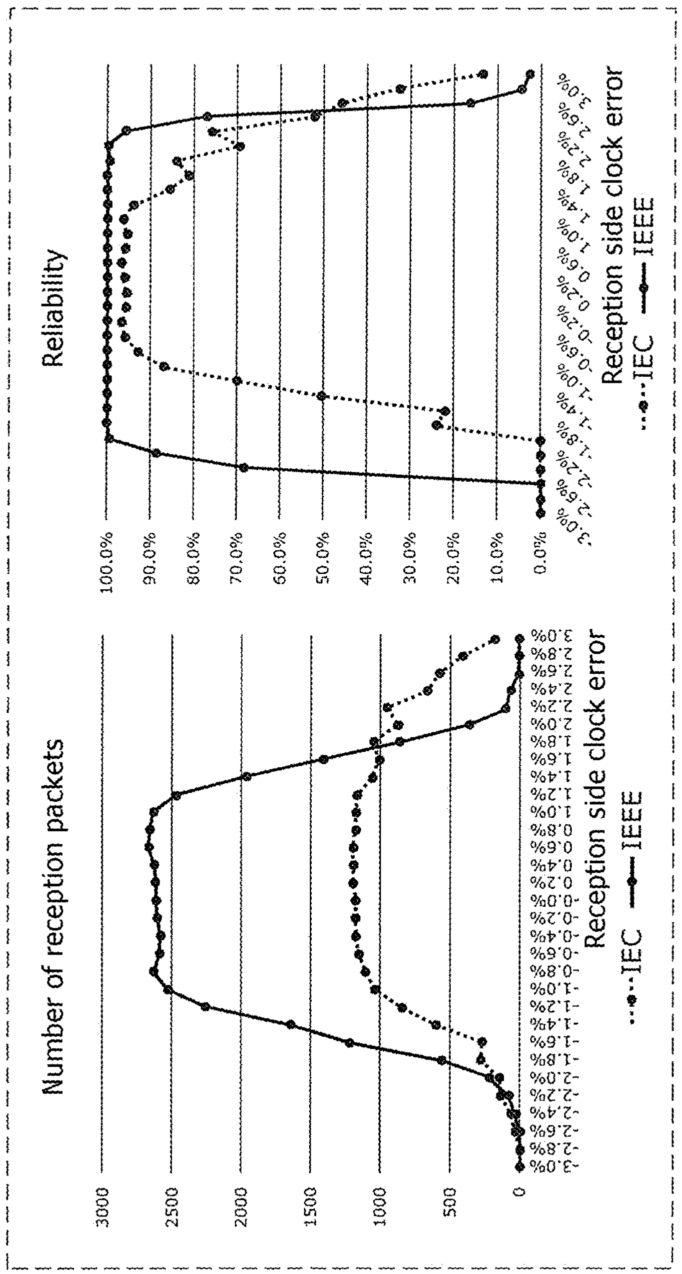
Figure 194:
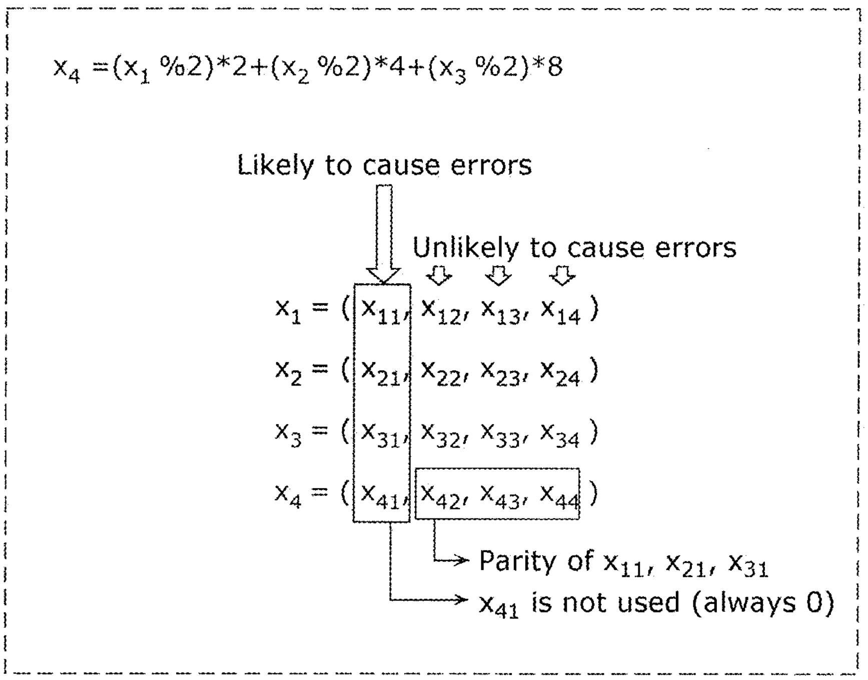
Figure 195A:
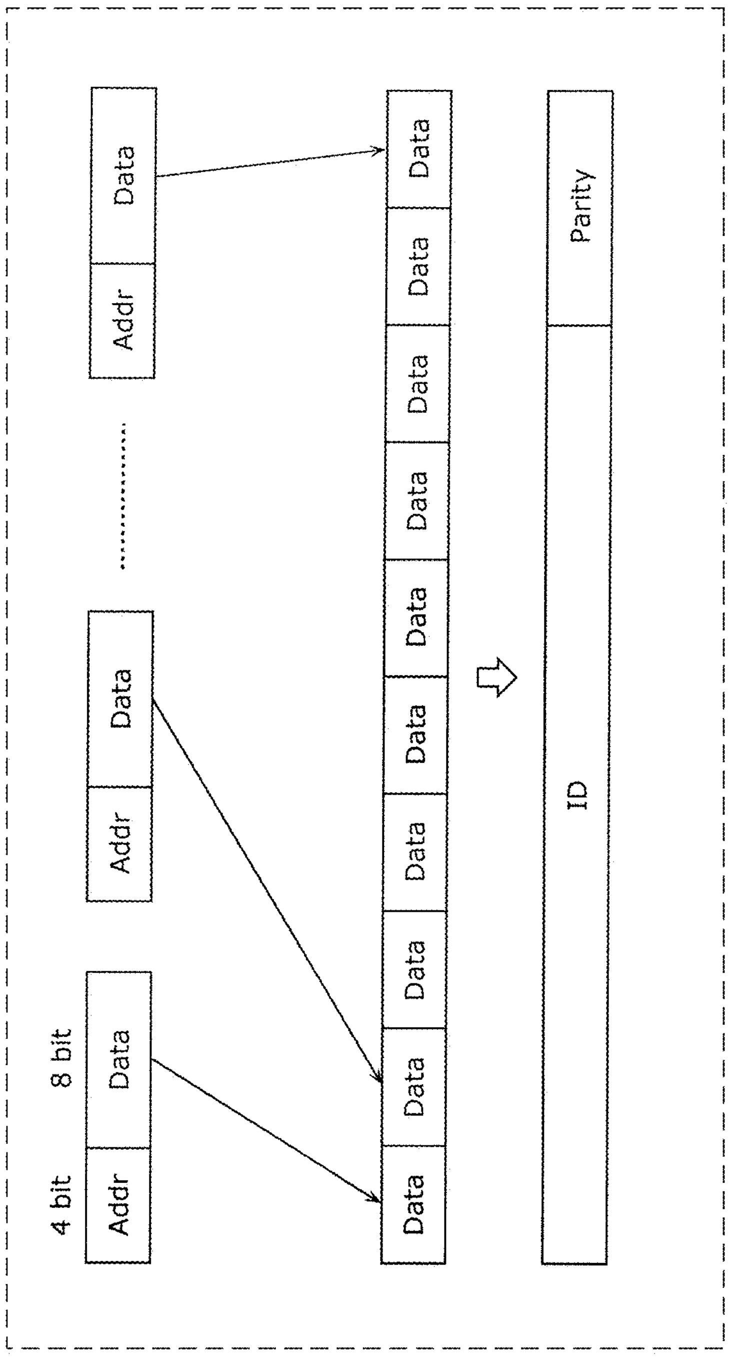
Figure 195B:
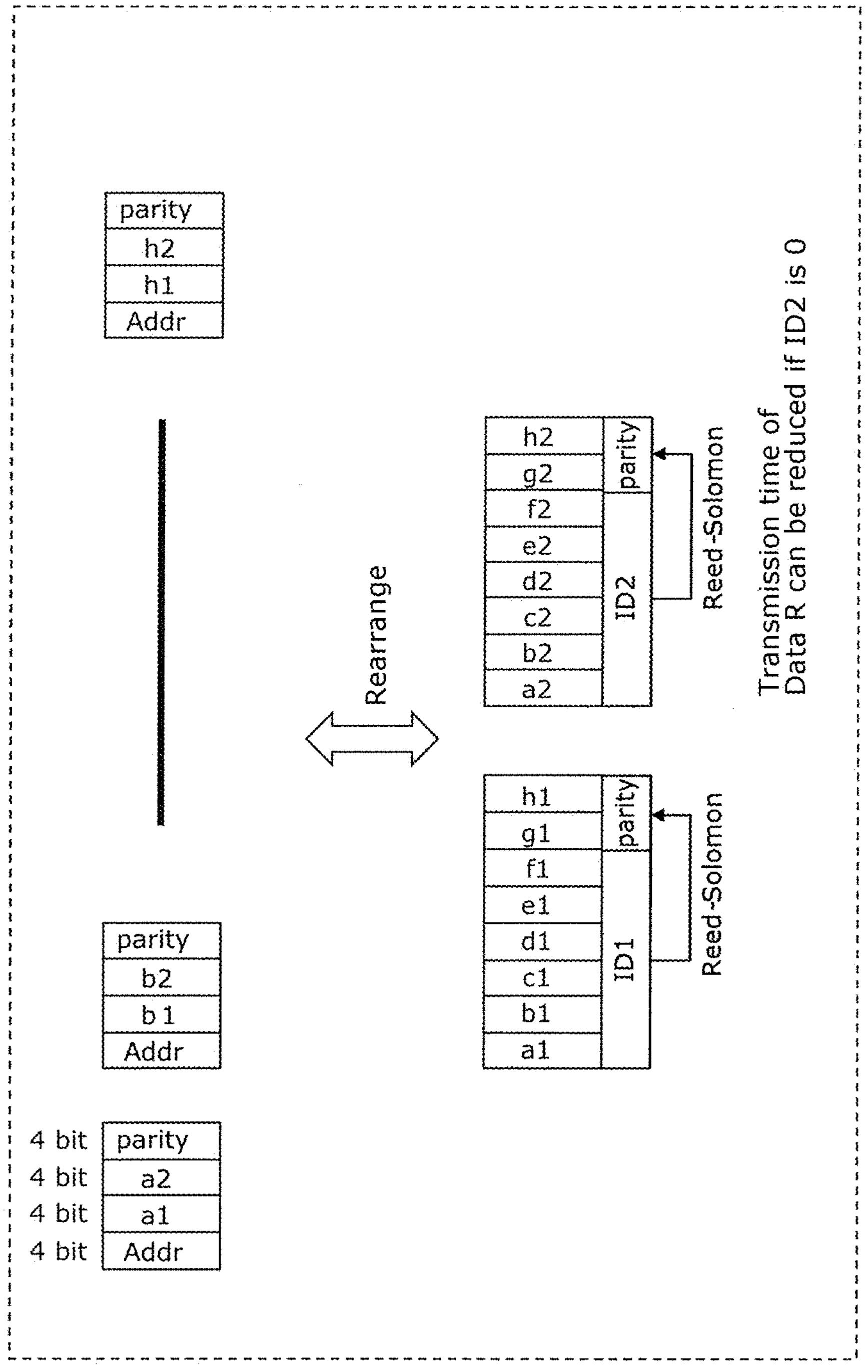
Figure 196:
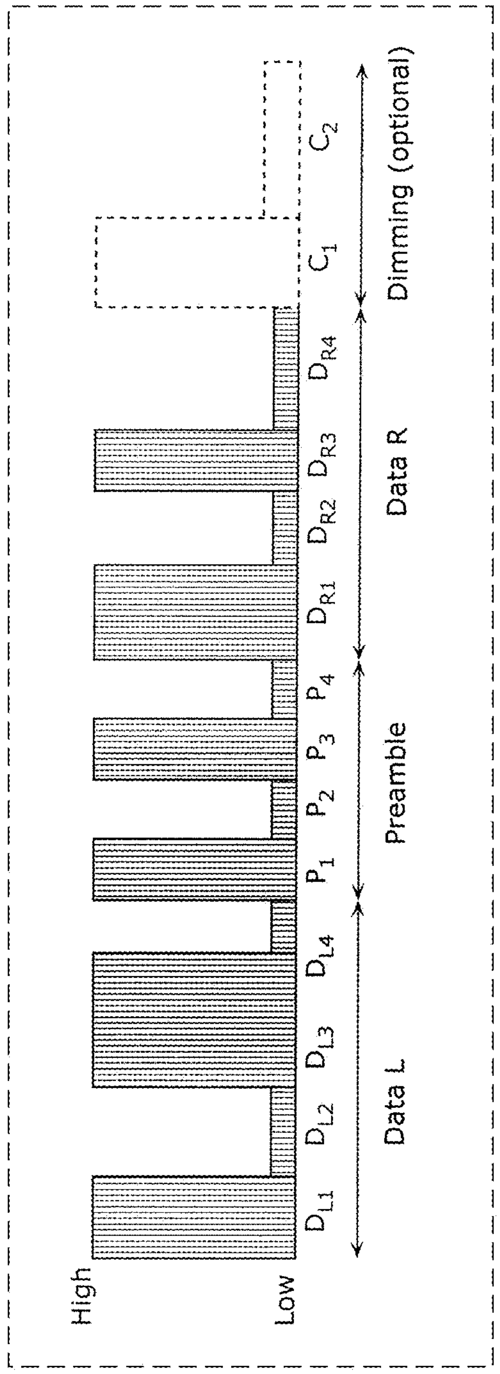
Figure 198:
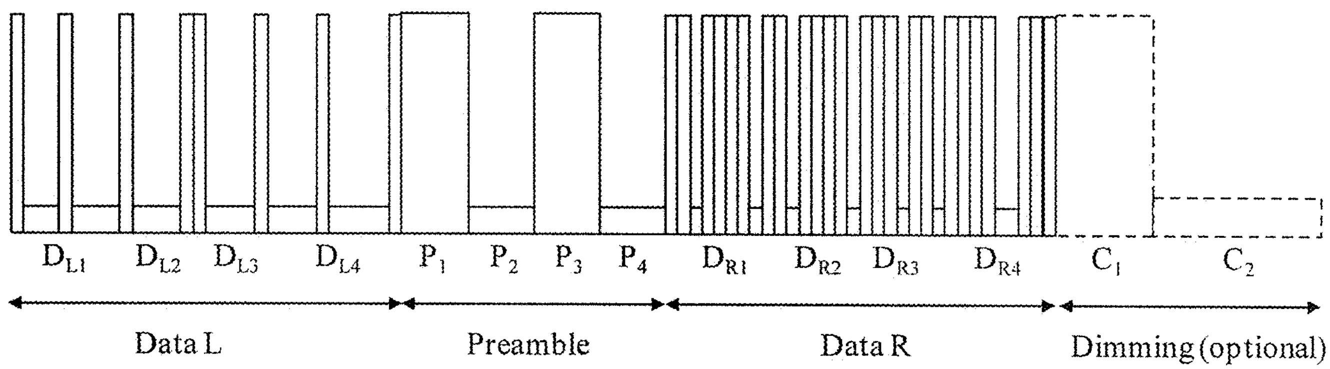
Figure 199:
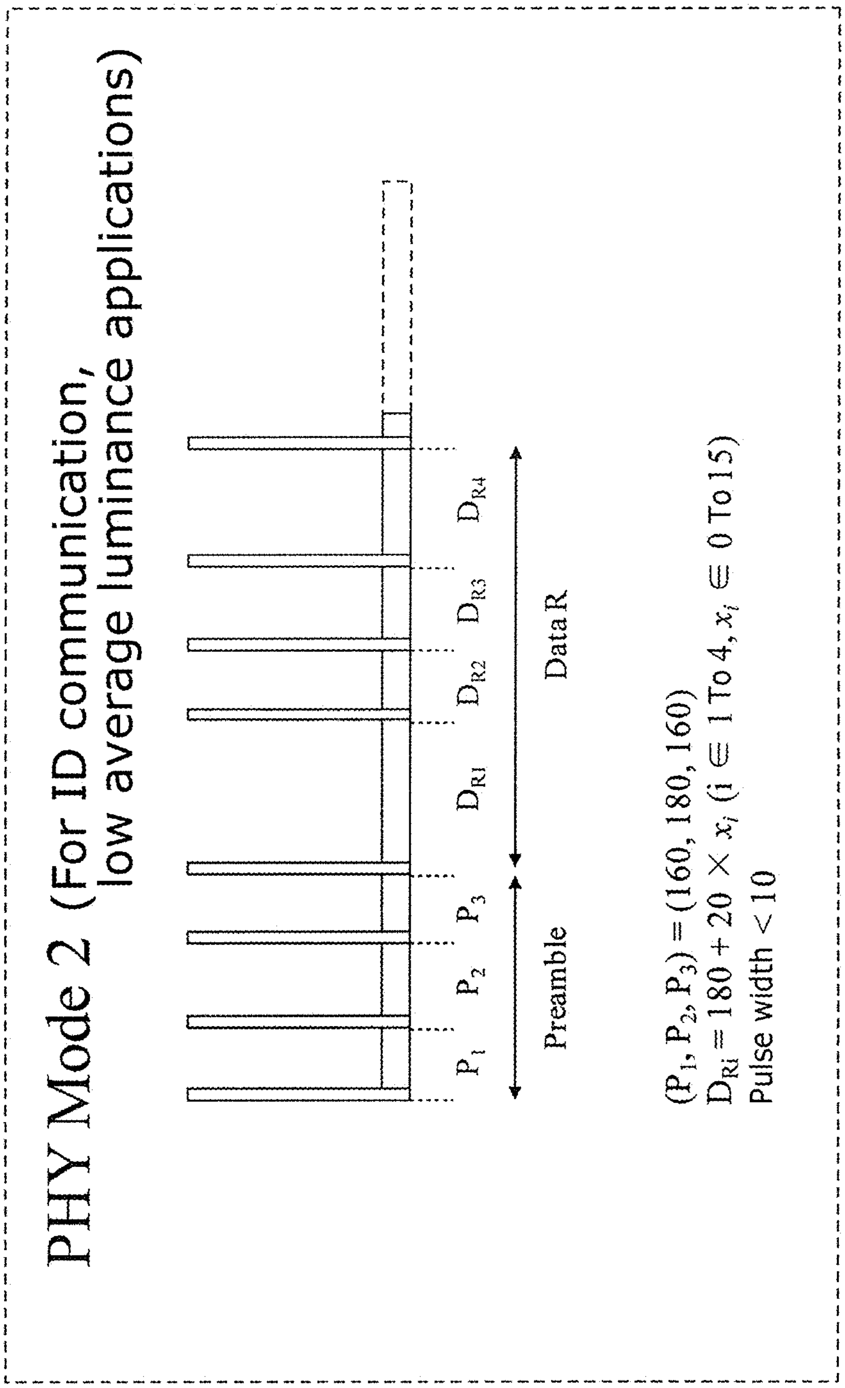
Figure 200:
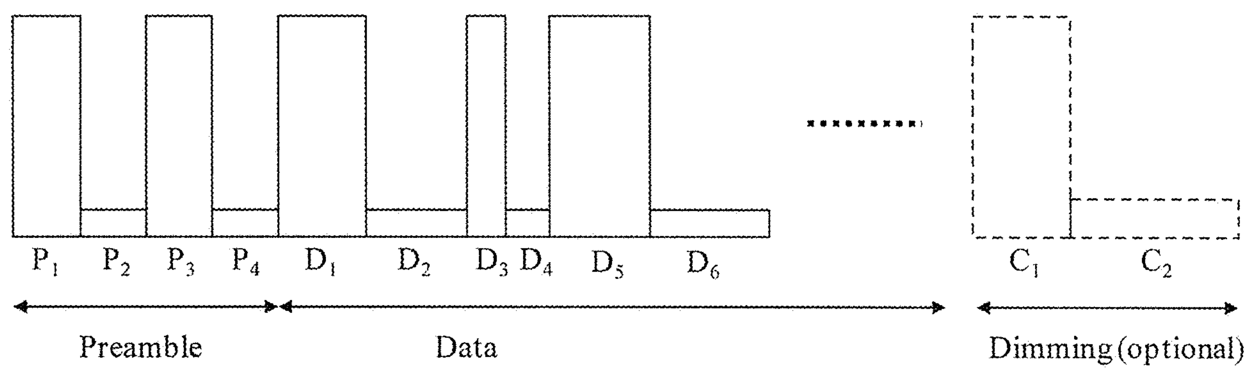
Figure 201:
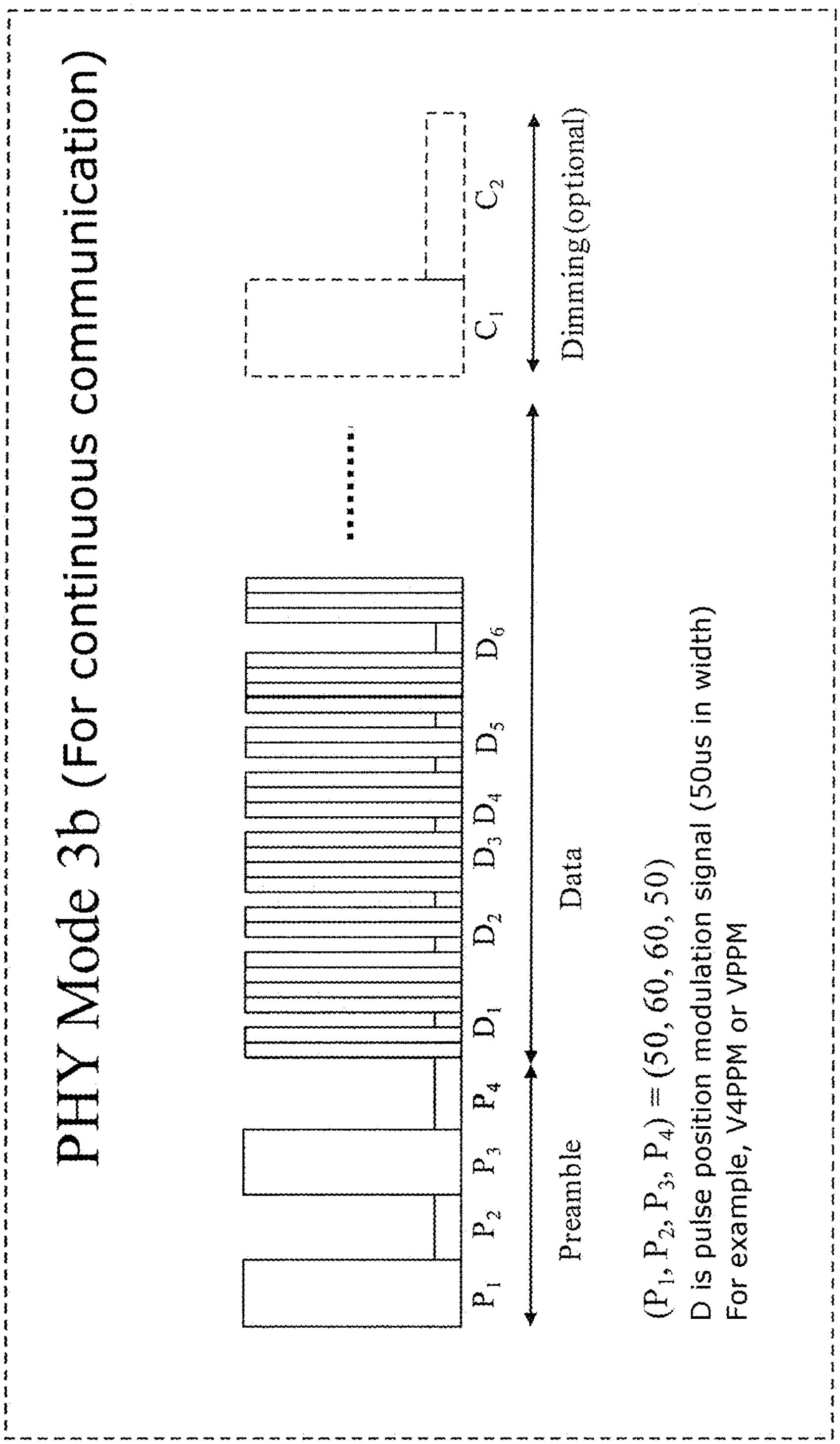
Figure 202:
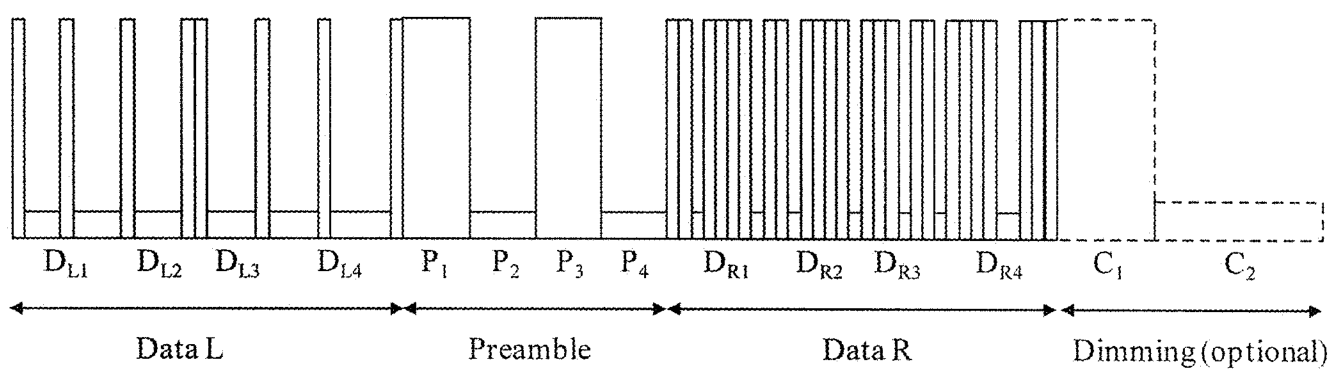
Figure 205:
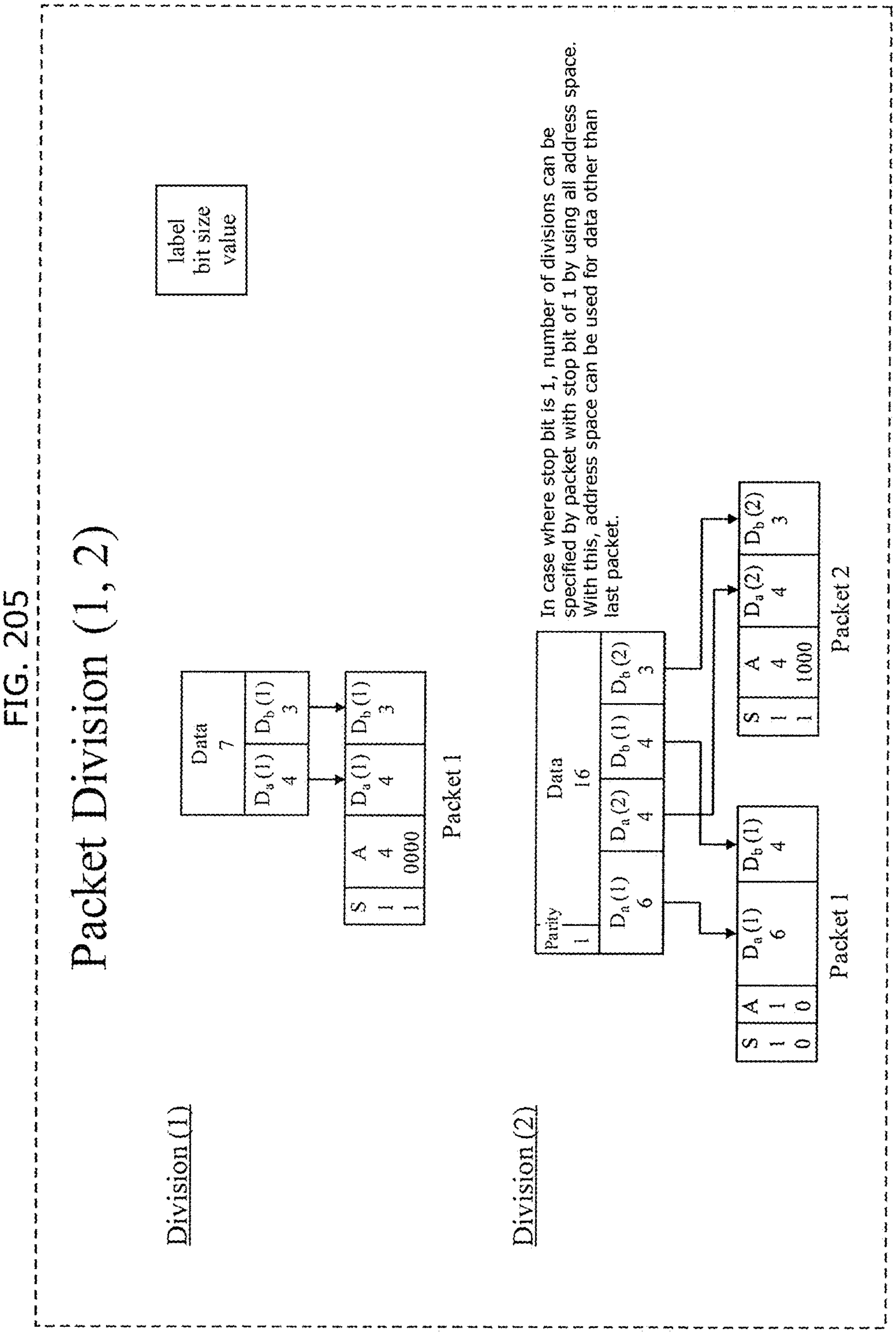
Figure 206:
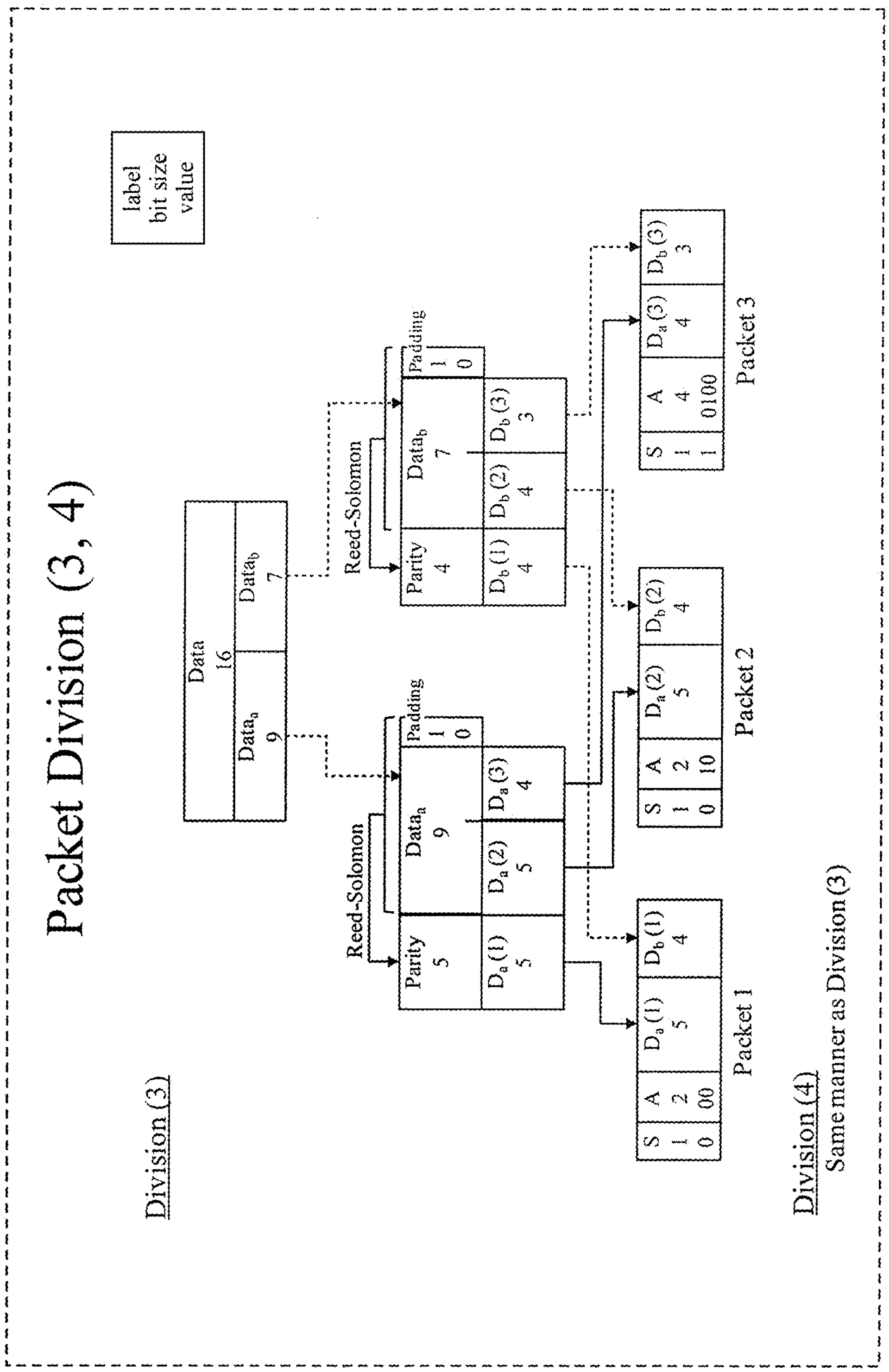
Figure 207:
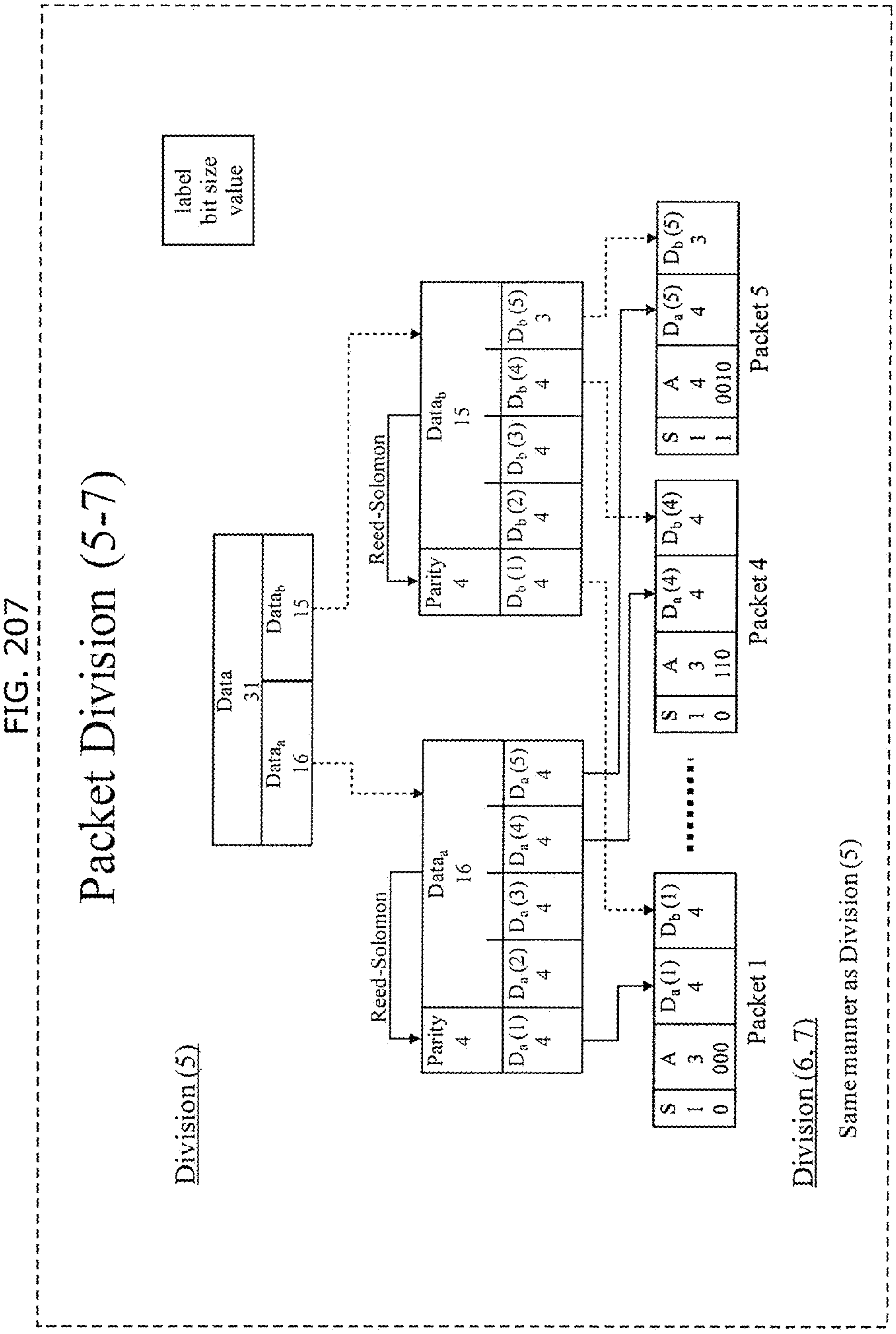
Figure 208:
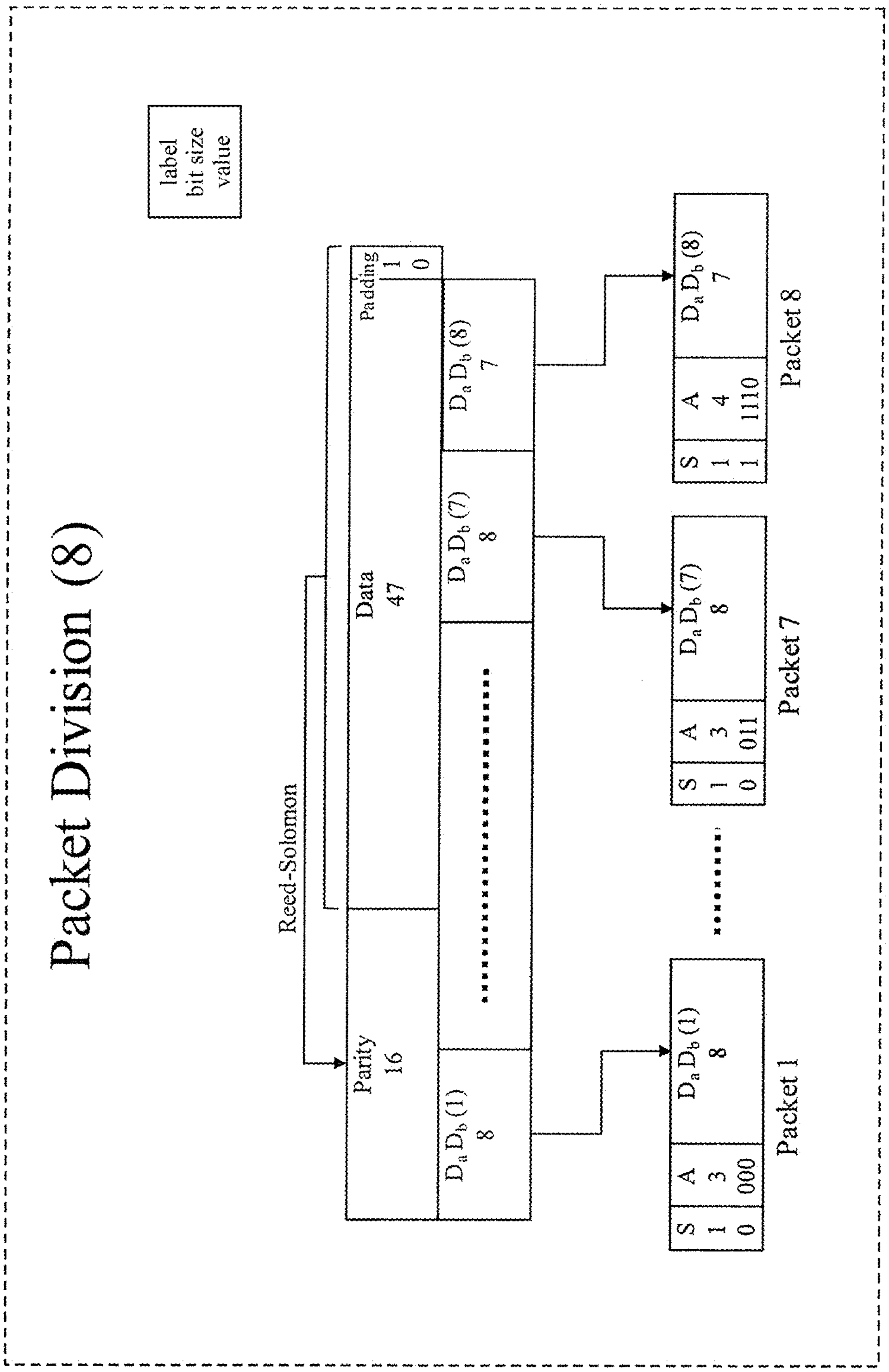
Figure 209:
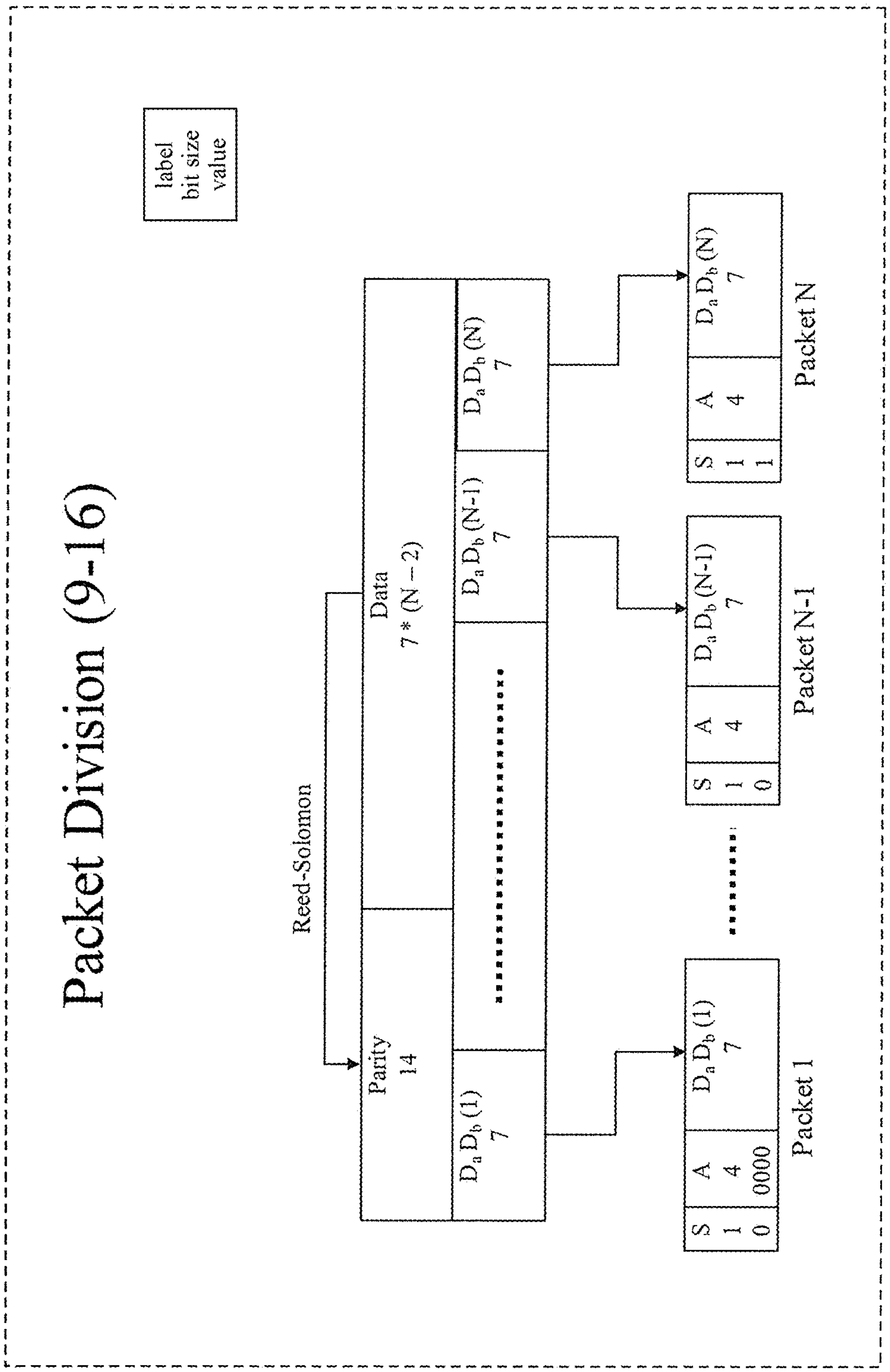
Figure 212:
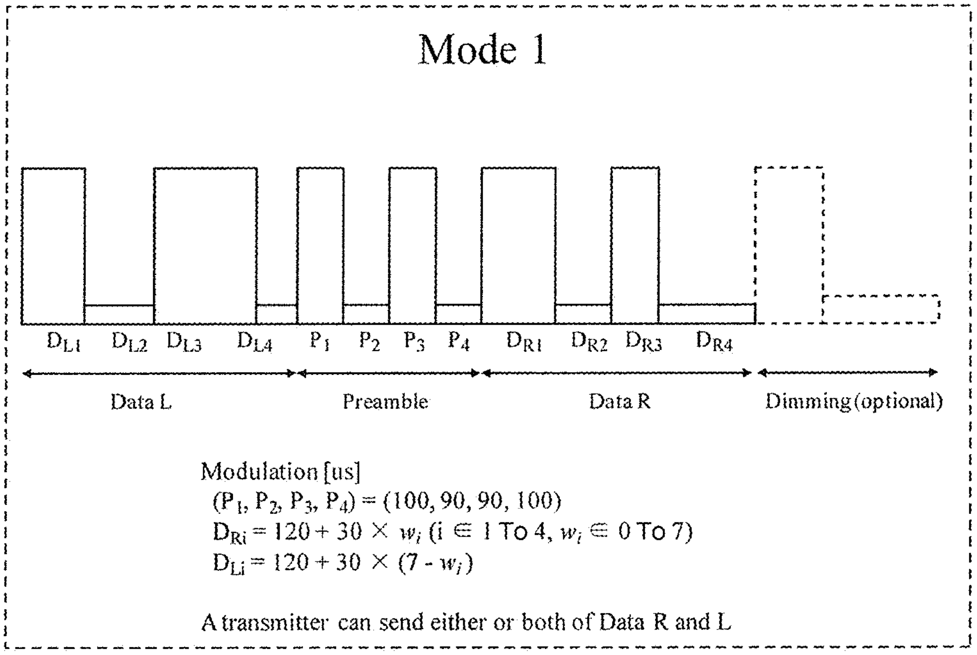
Figure 213:
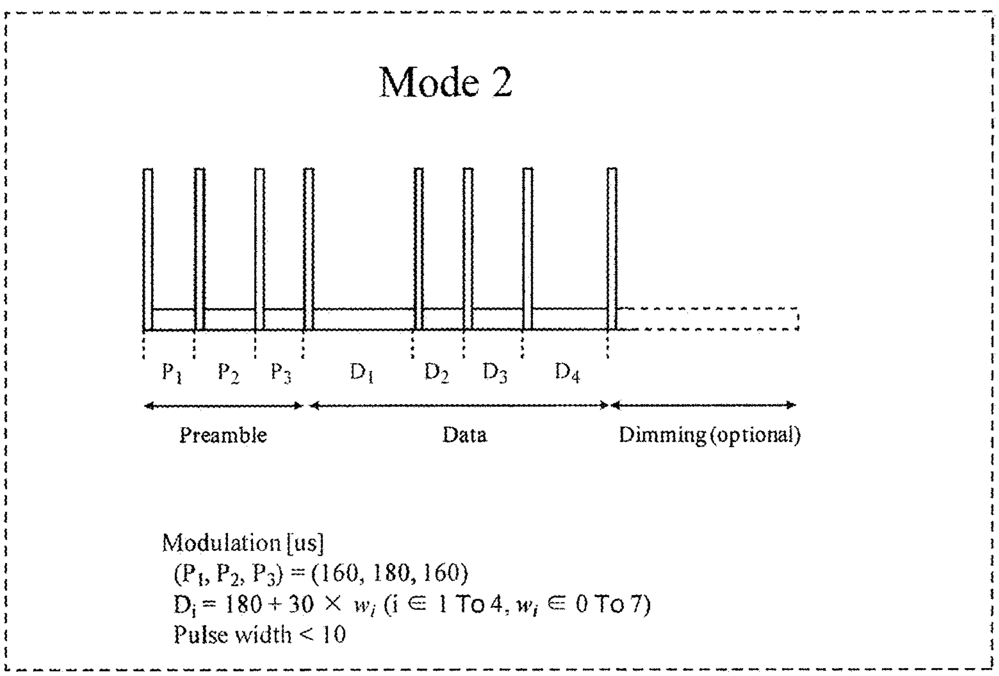
Figure 214:
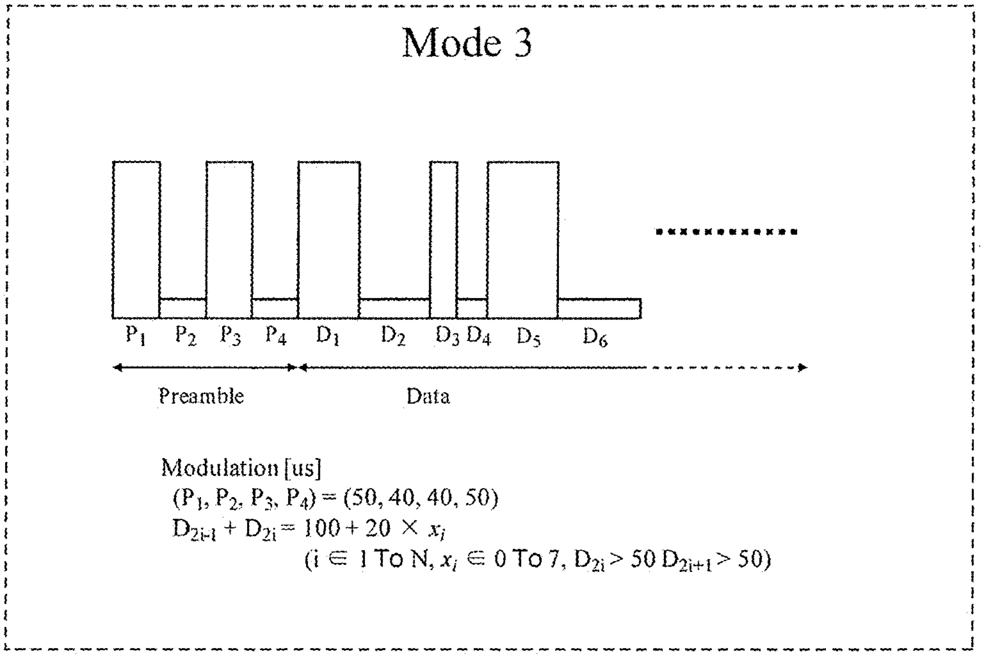
Figure 215:
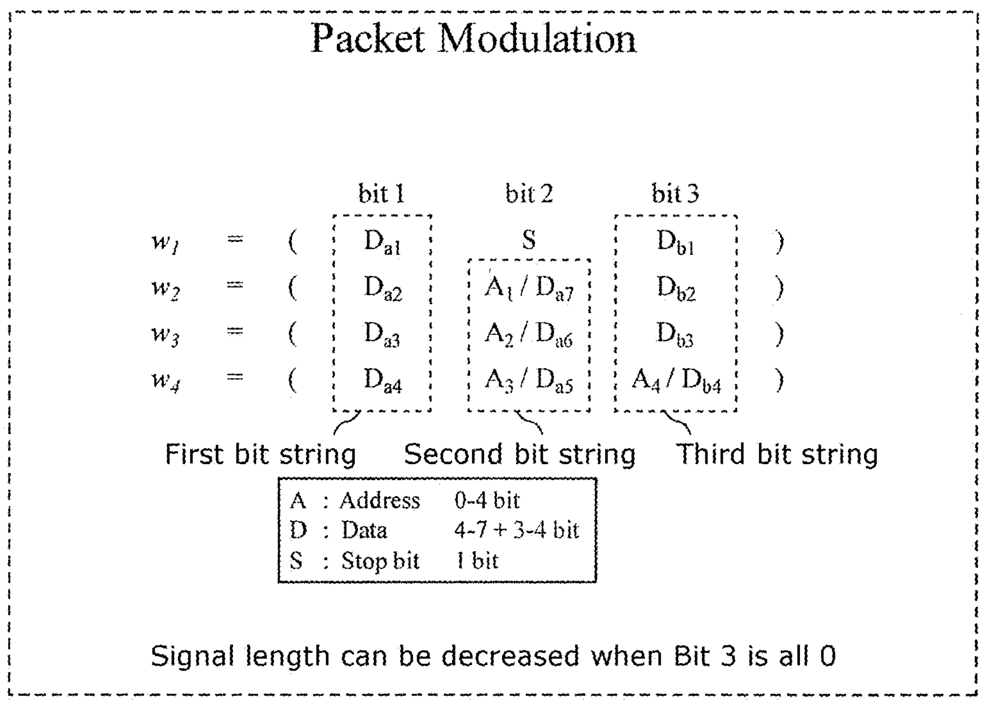
Figure 216:
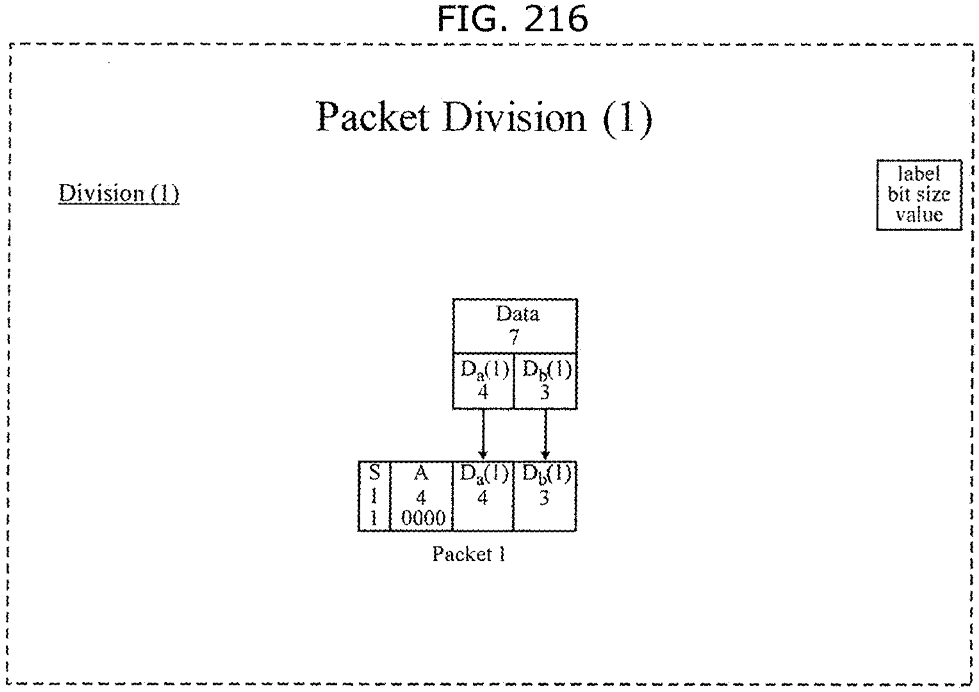
Figure 217:
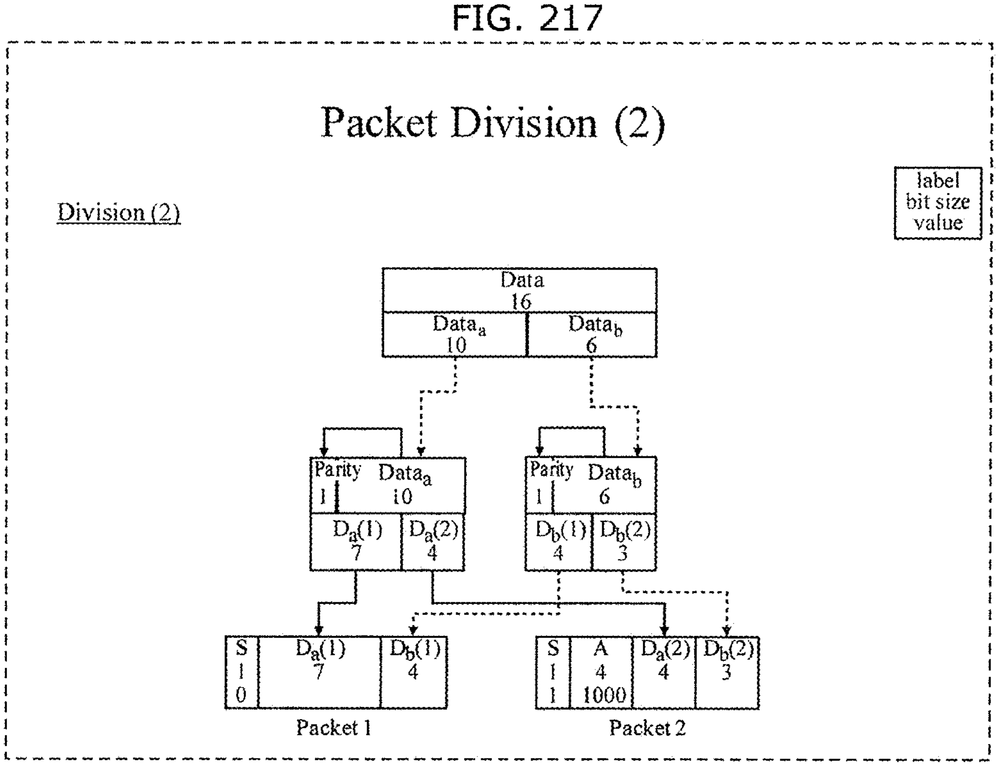
Figure 218:
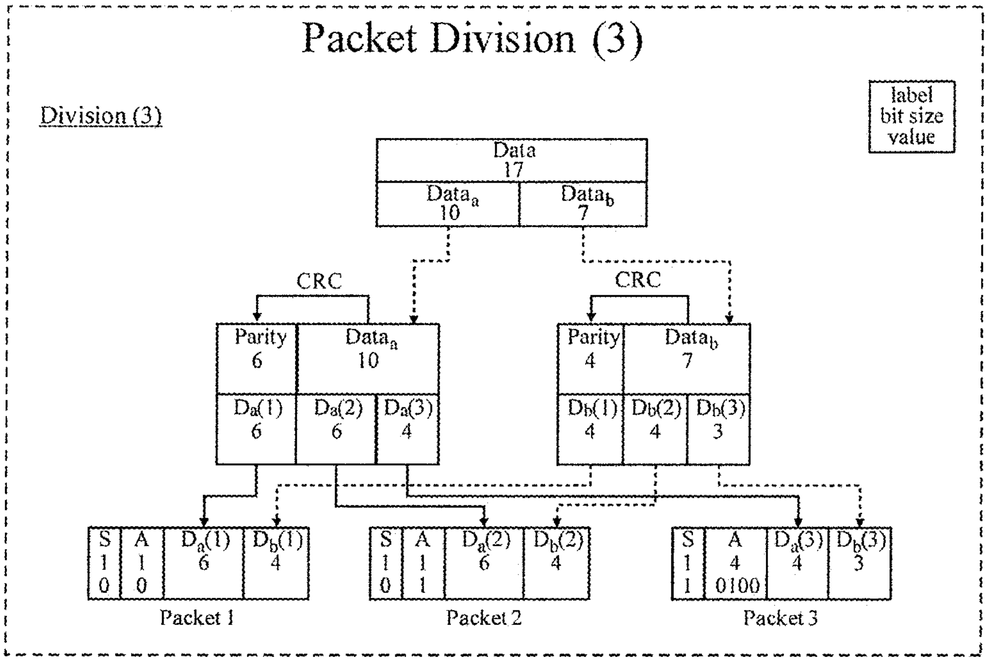
Figure 219:
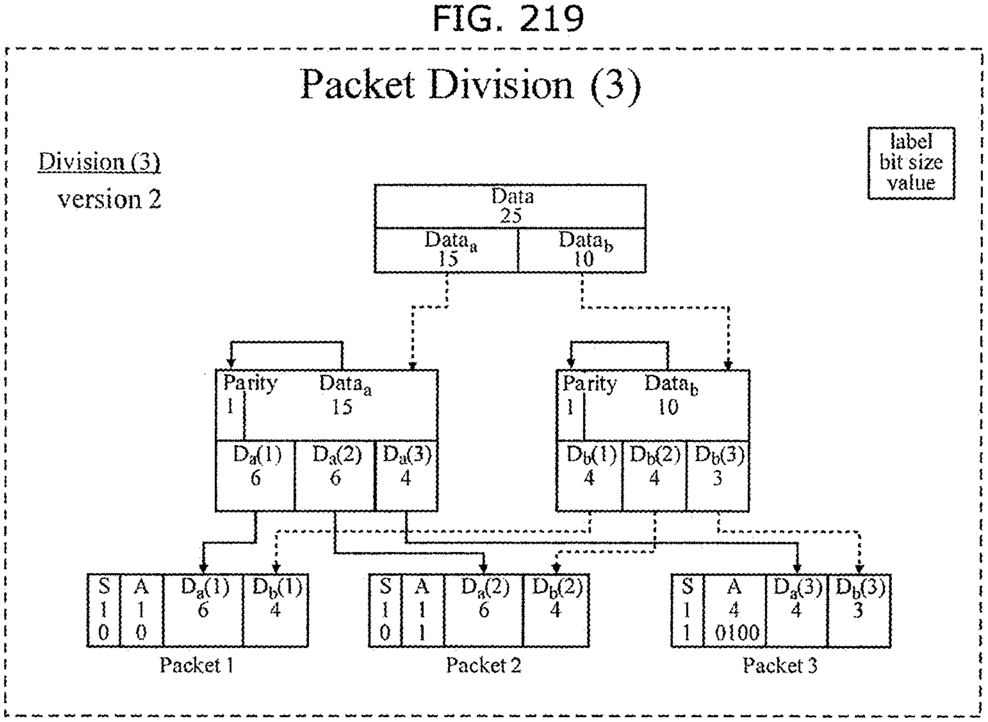
Figure 220:
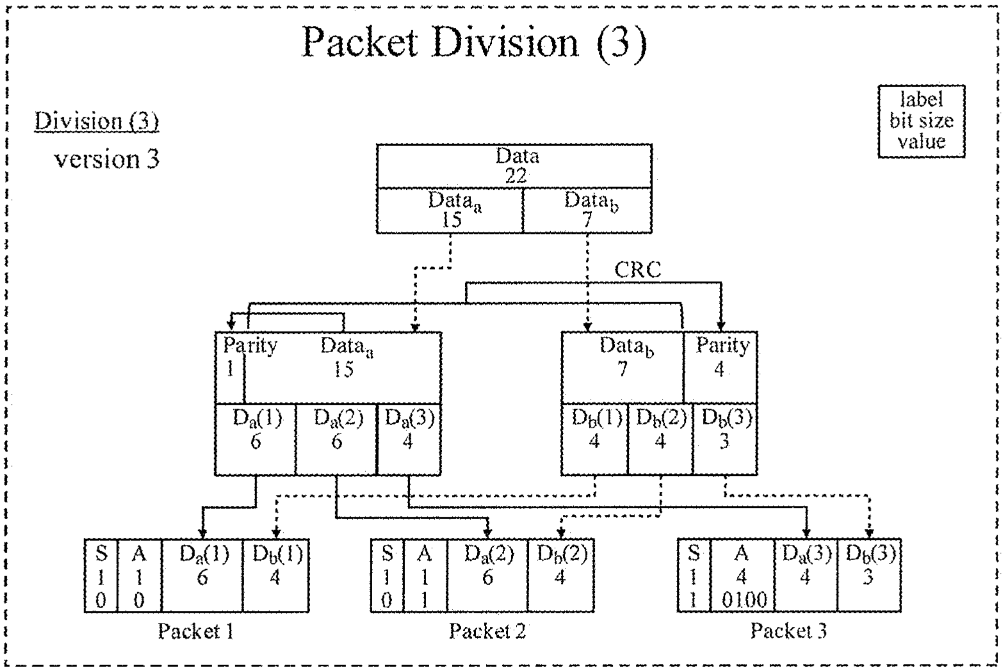
Figure 221:
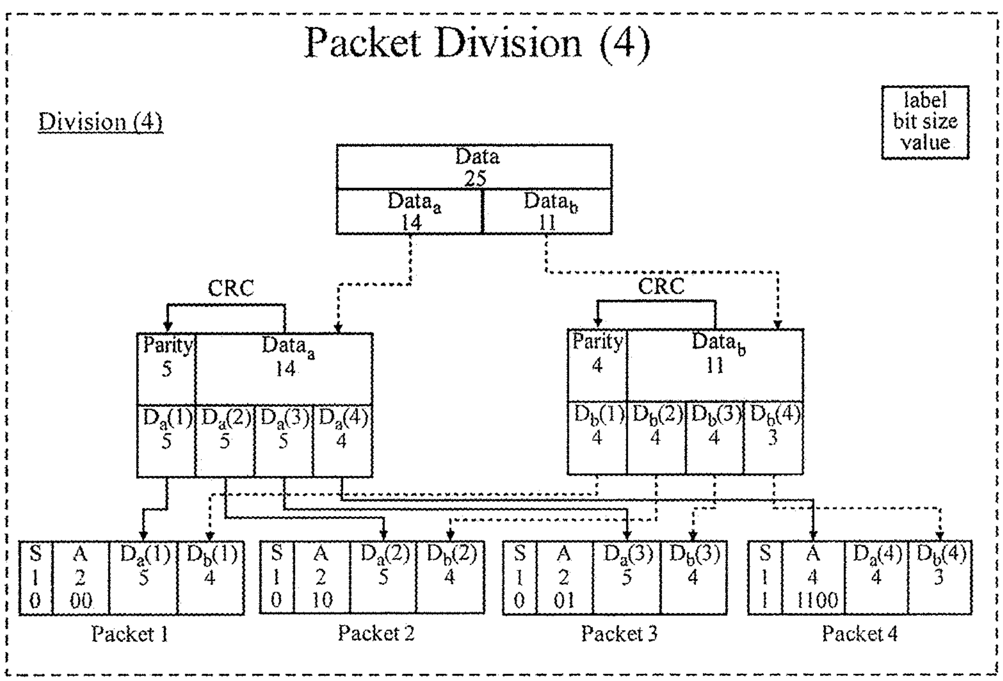
Figure 222:
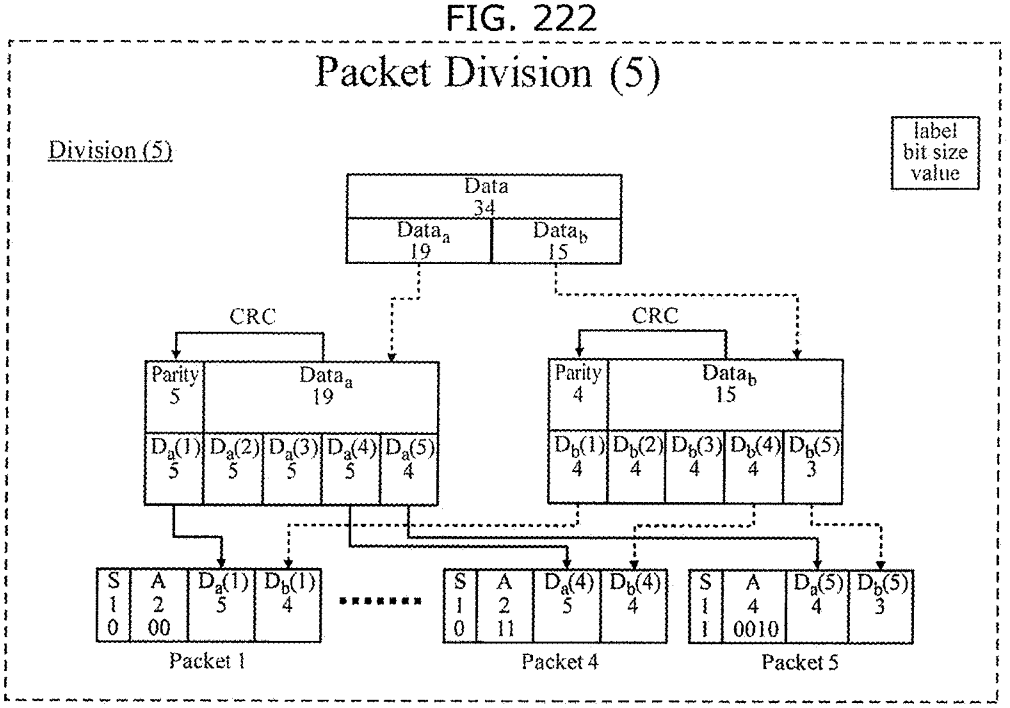
Figure 223:
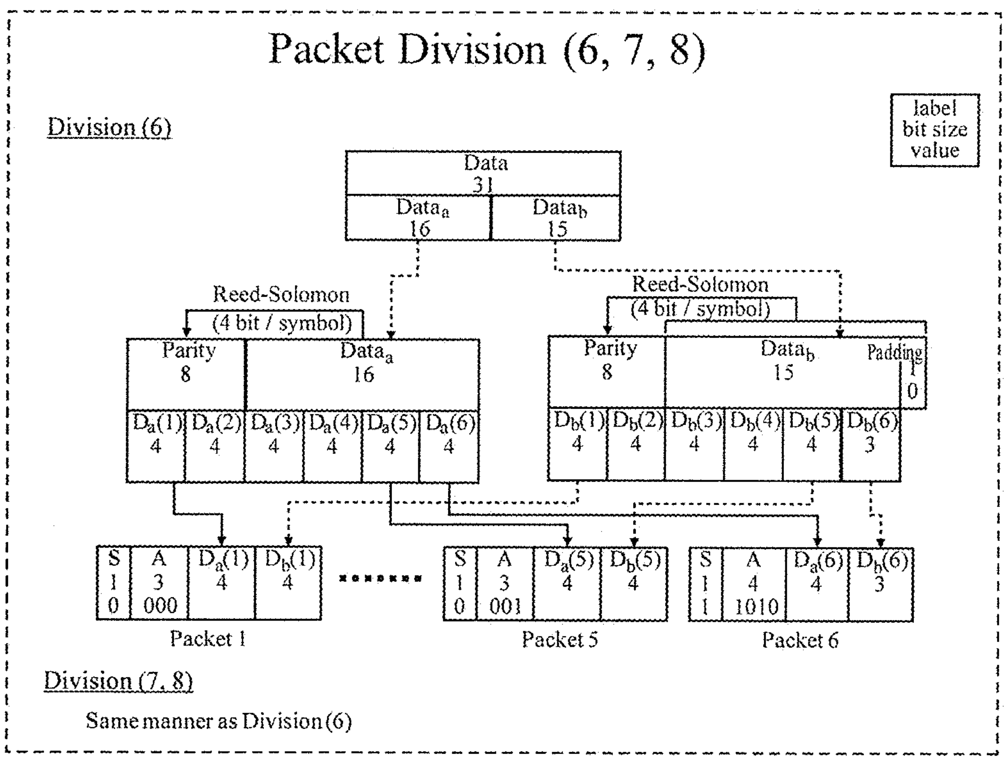
Figure 224:
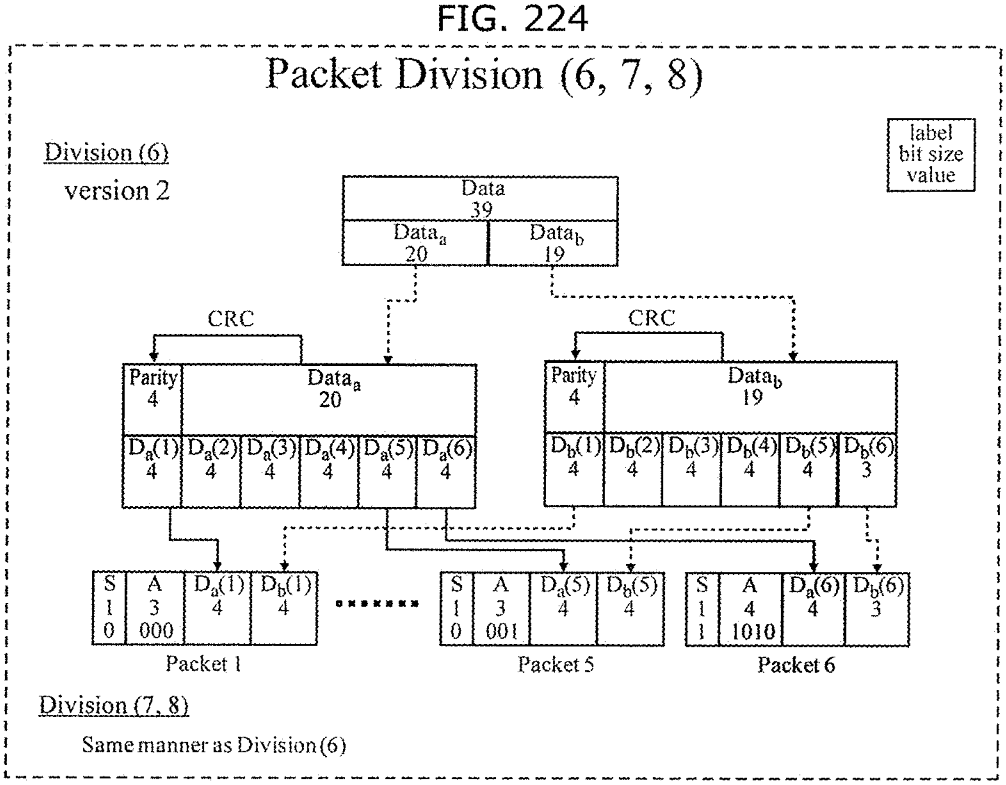
Figure 225:
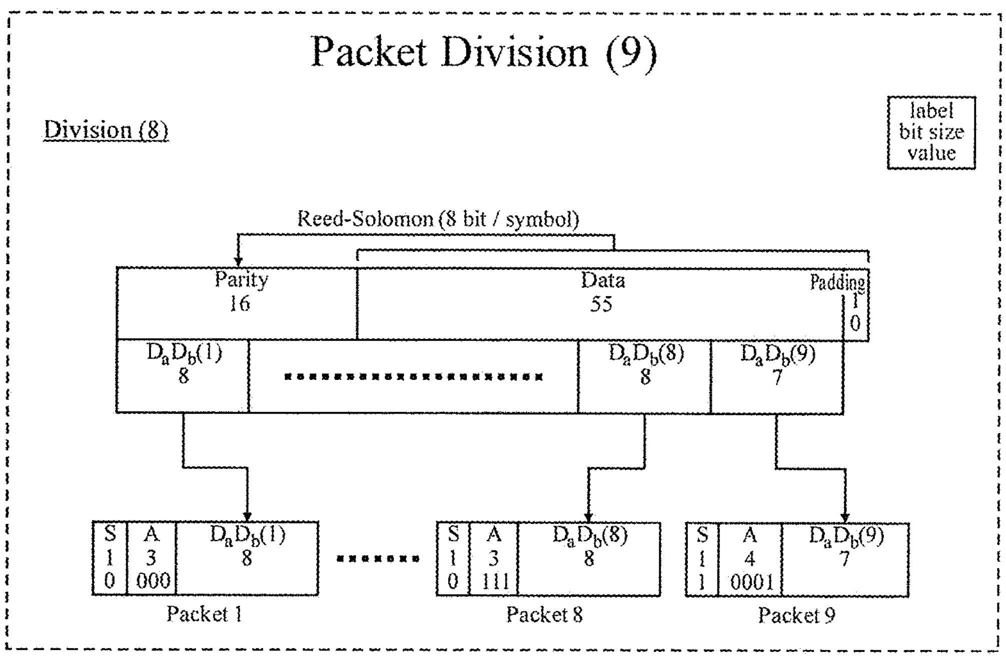
Figures 226, 227:
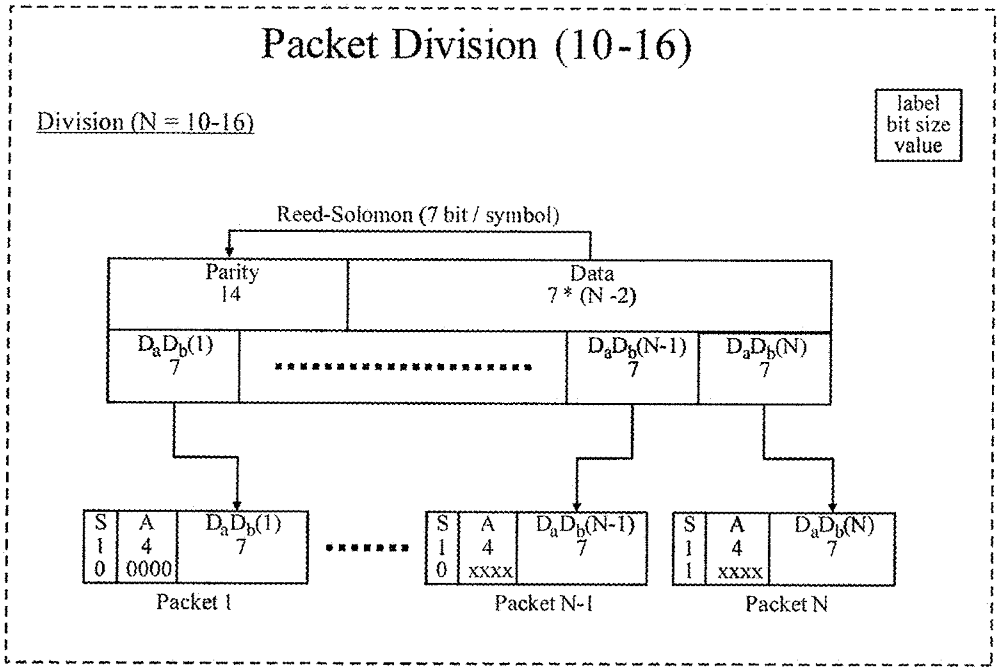
Figure 230A:
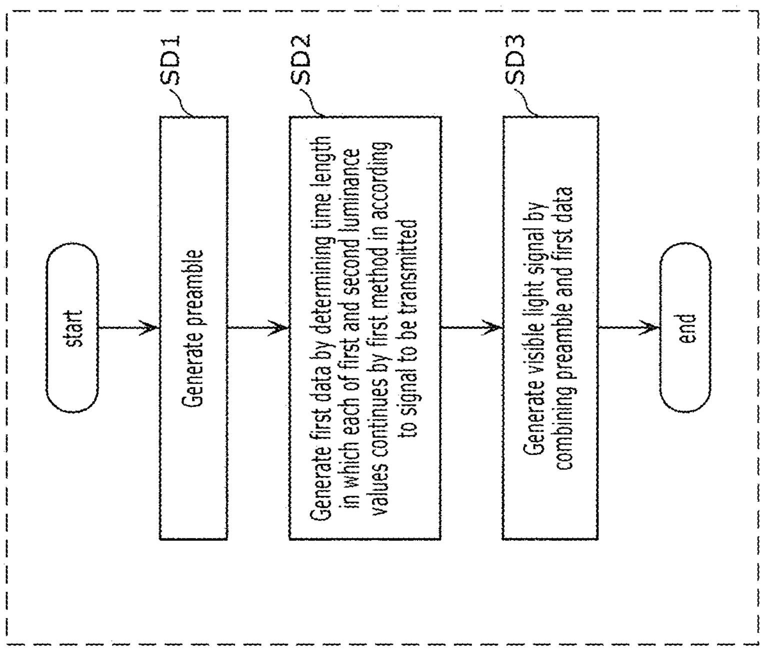
Figure 230B:
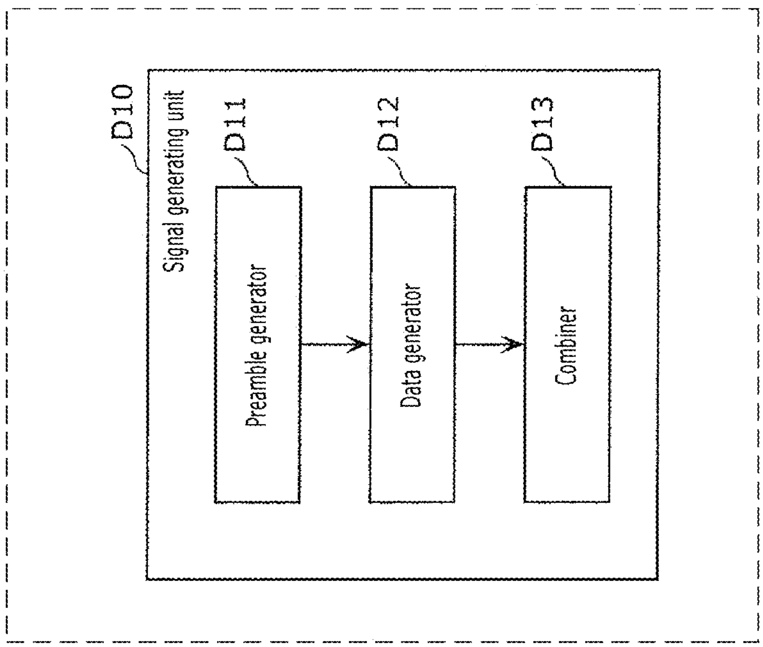
Figure 231:
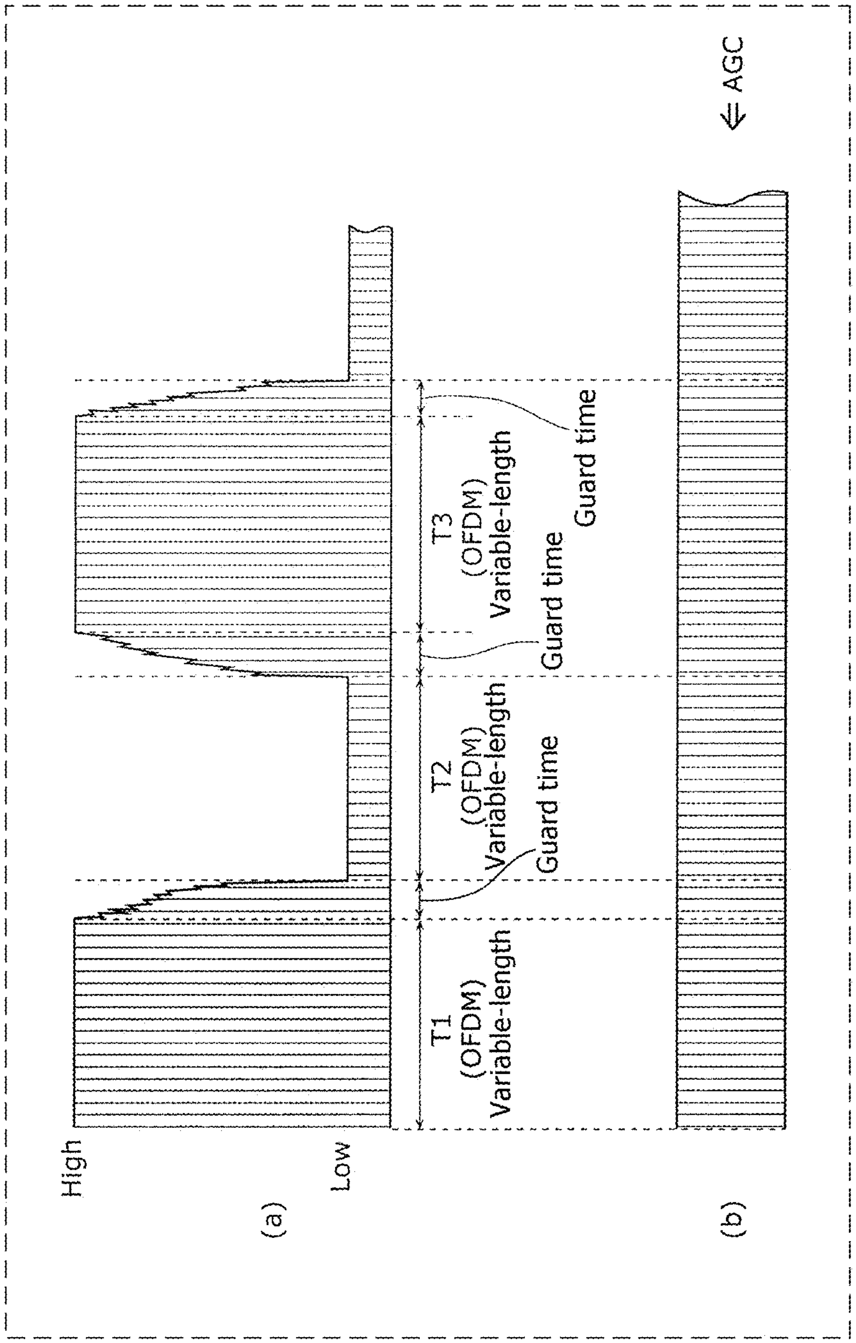
Figure 232A:
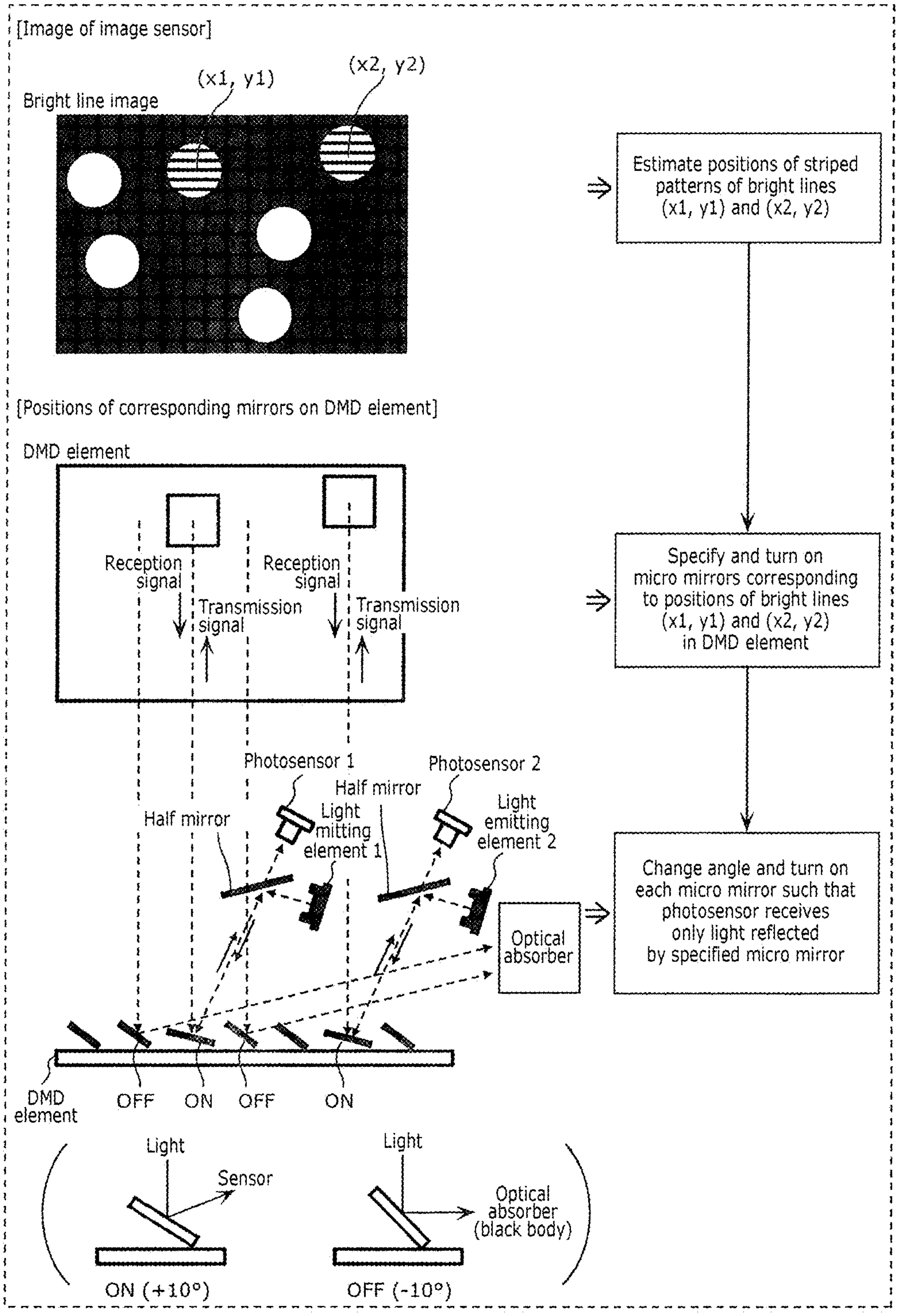
Figure 232B:
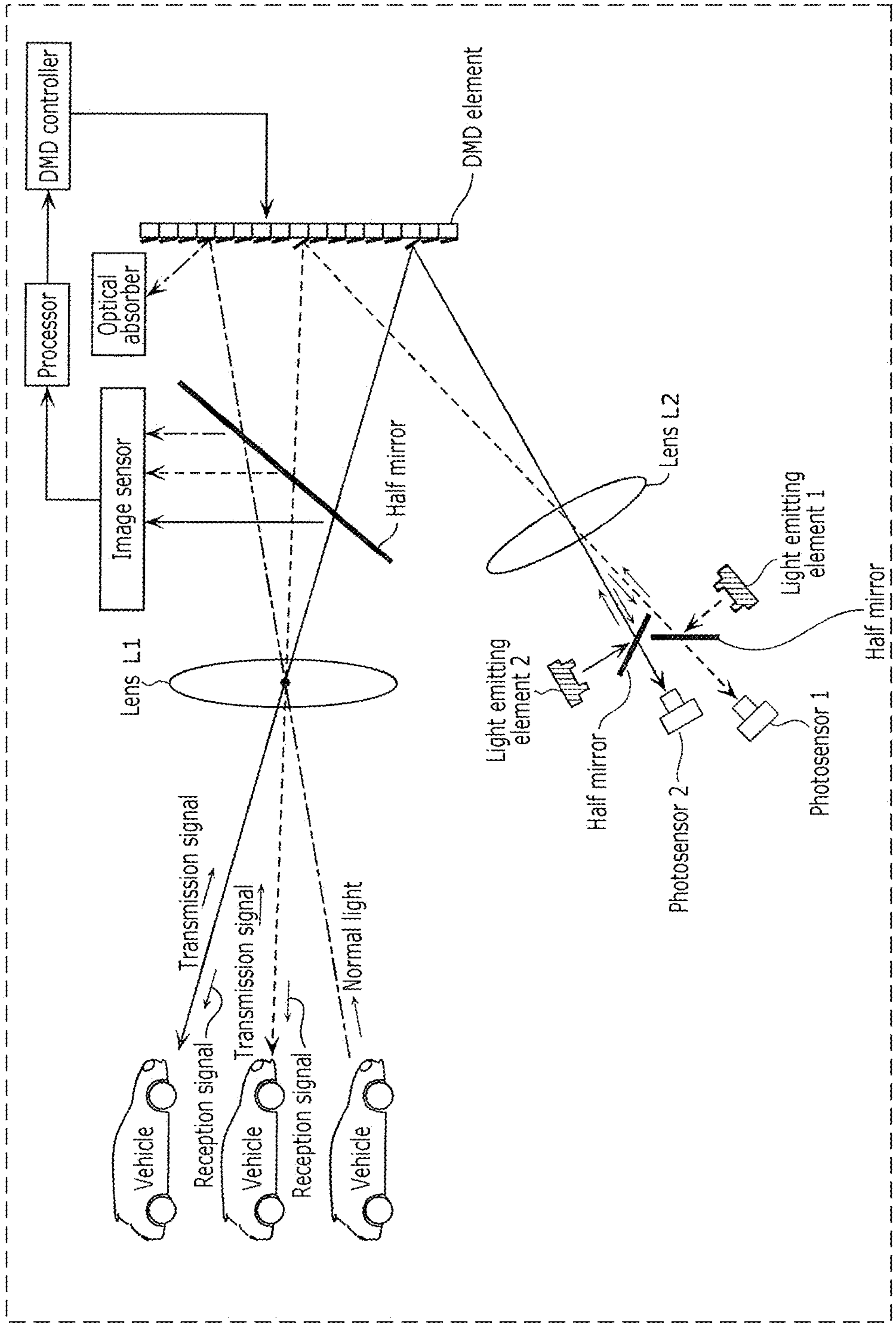
Figure 233:
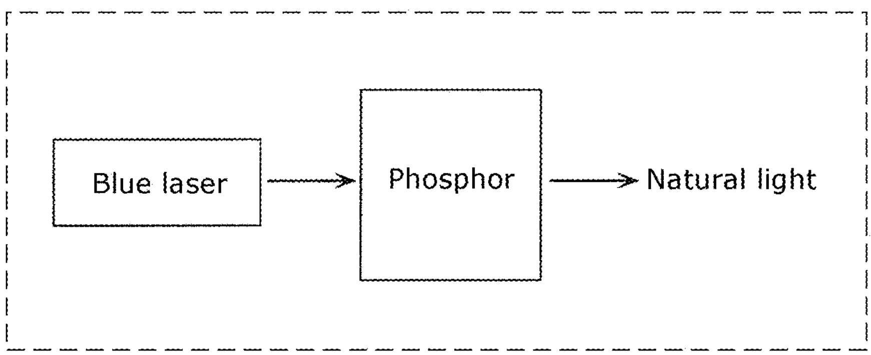
Figure 234:
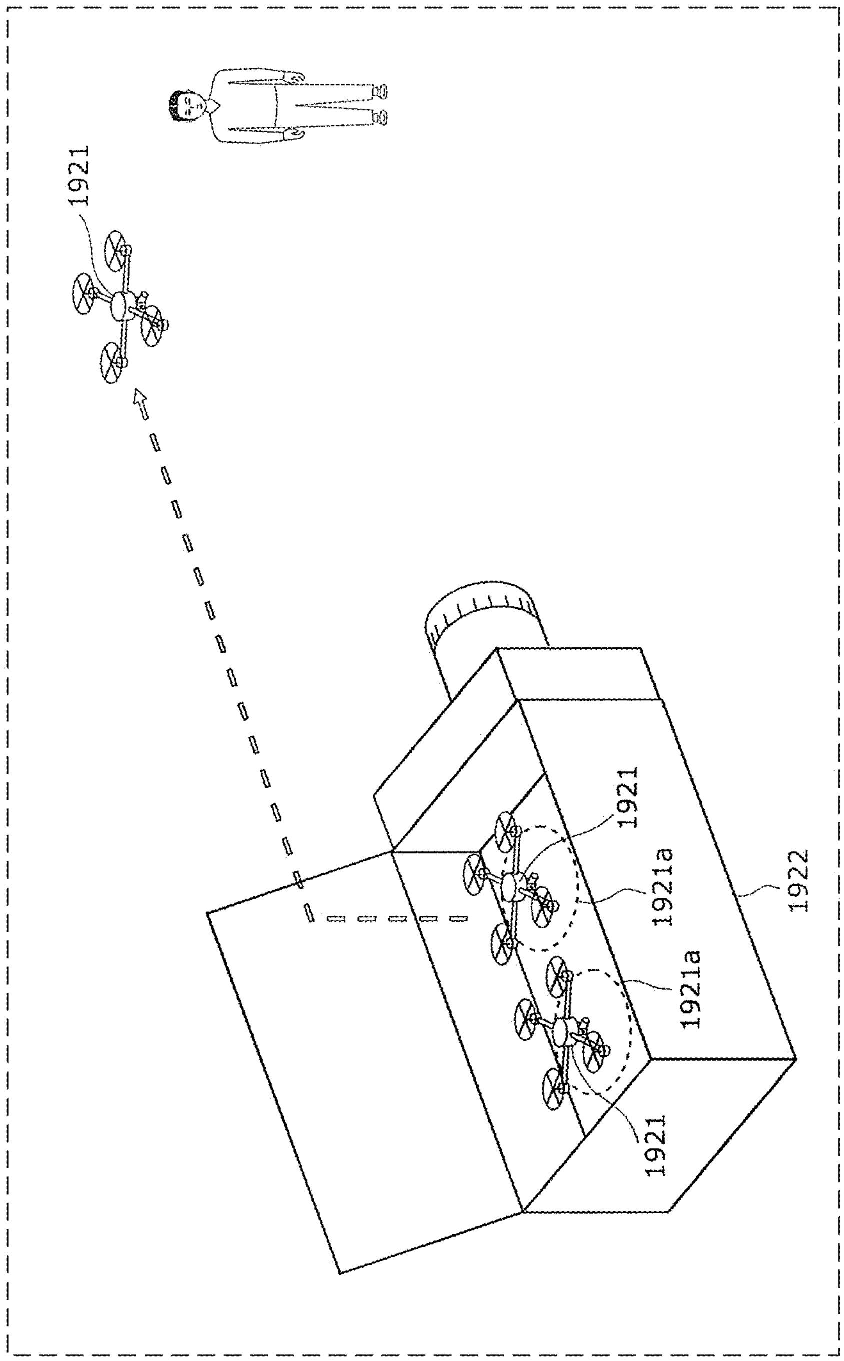
Figure 235:
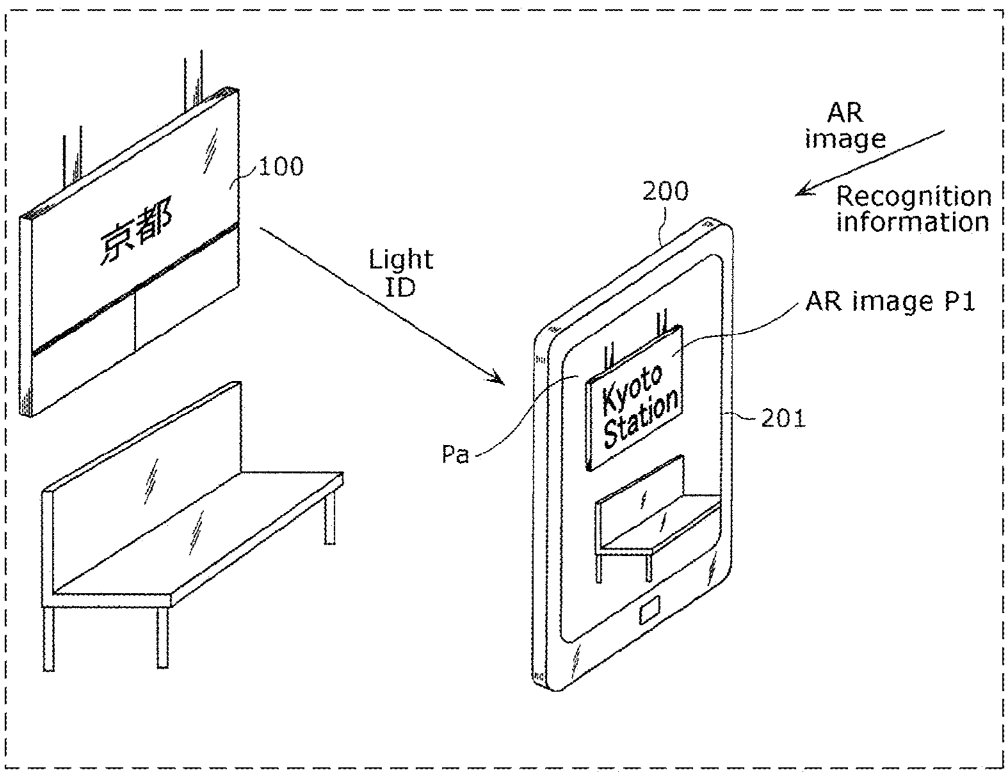
Figure 236:
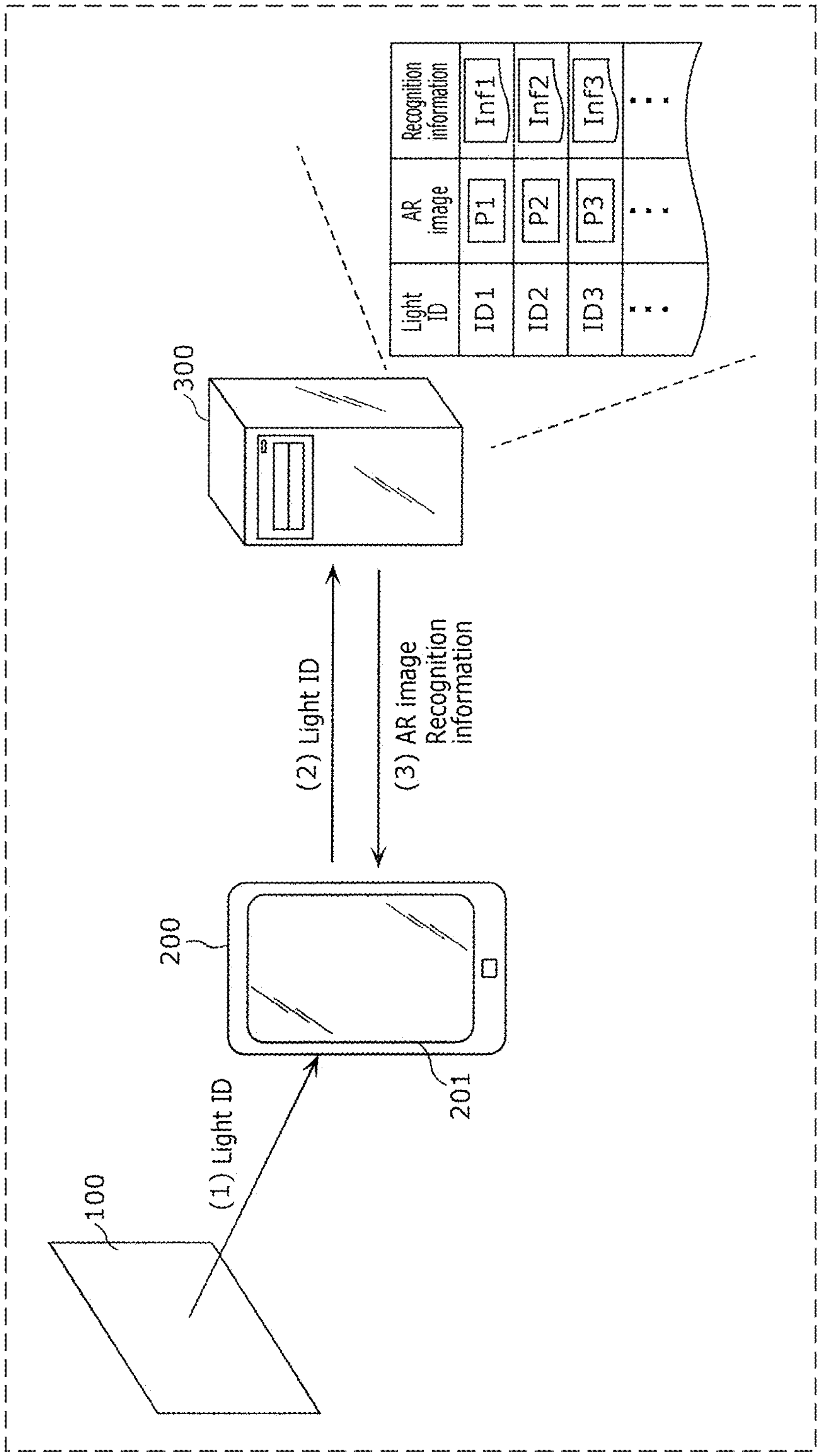
Figure 237:
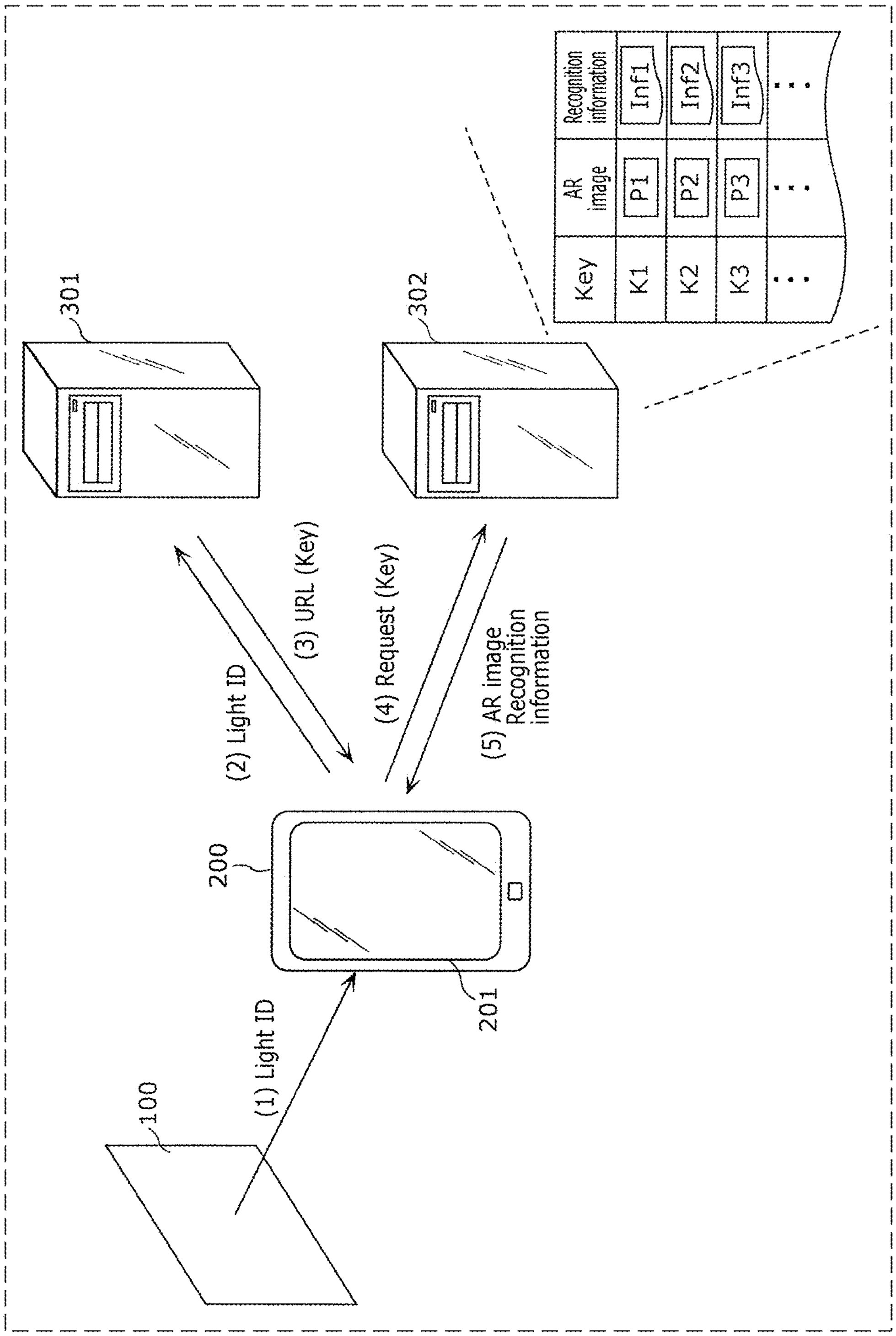
Figure 238:
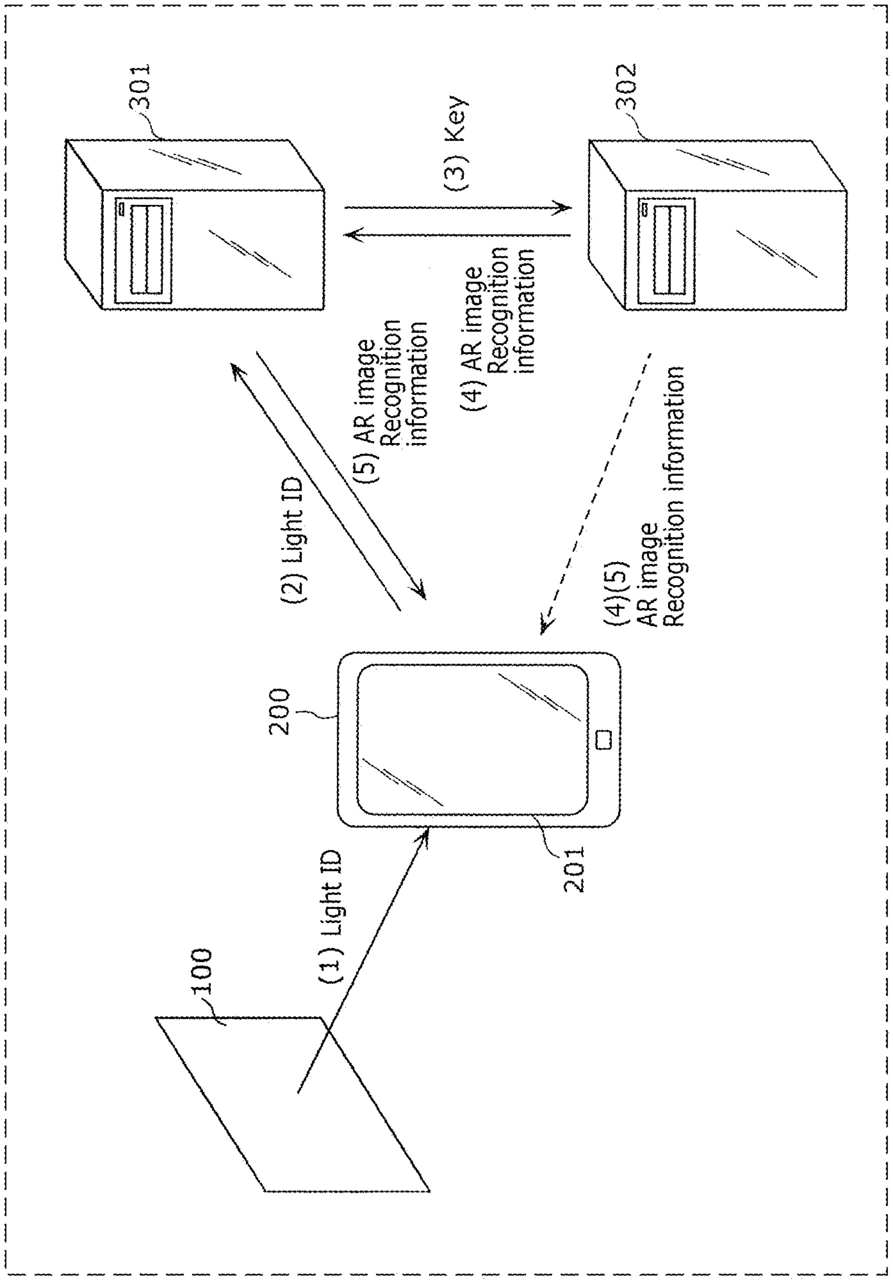
Figure 239:
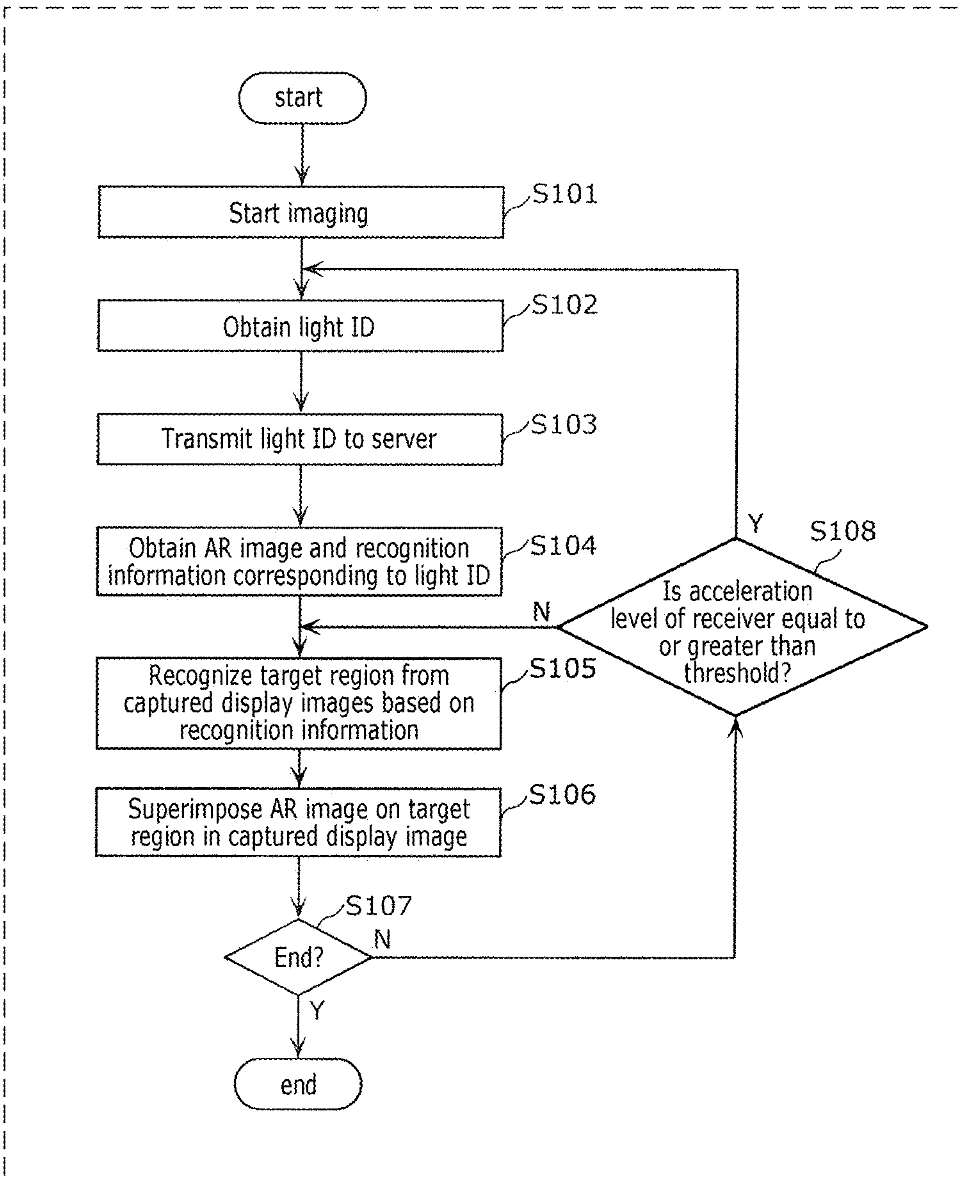
Figure 240:
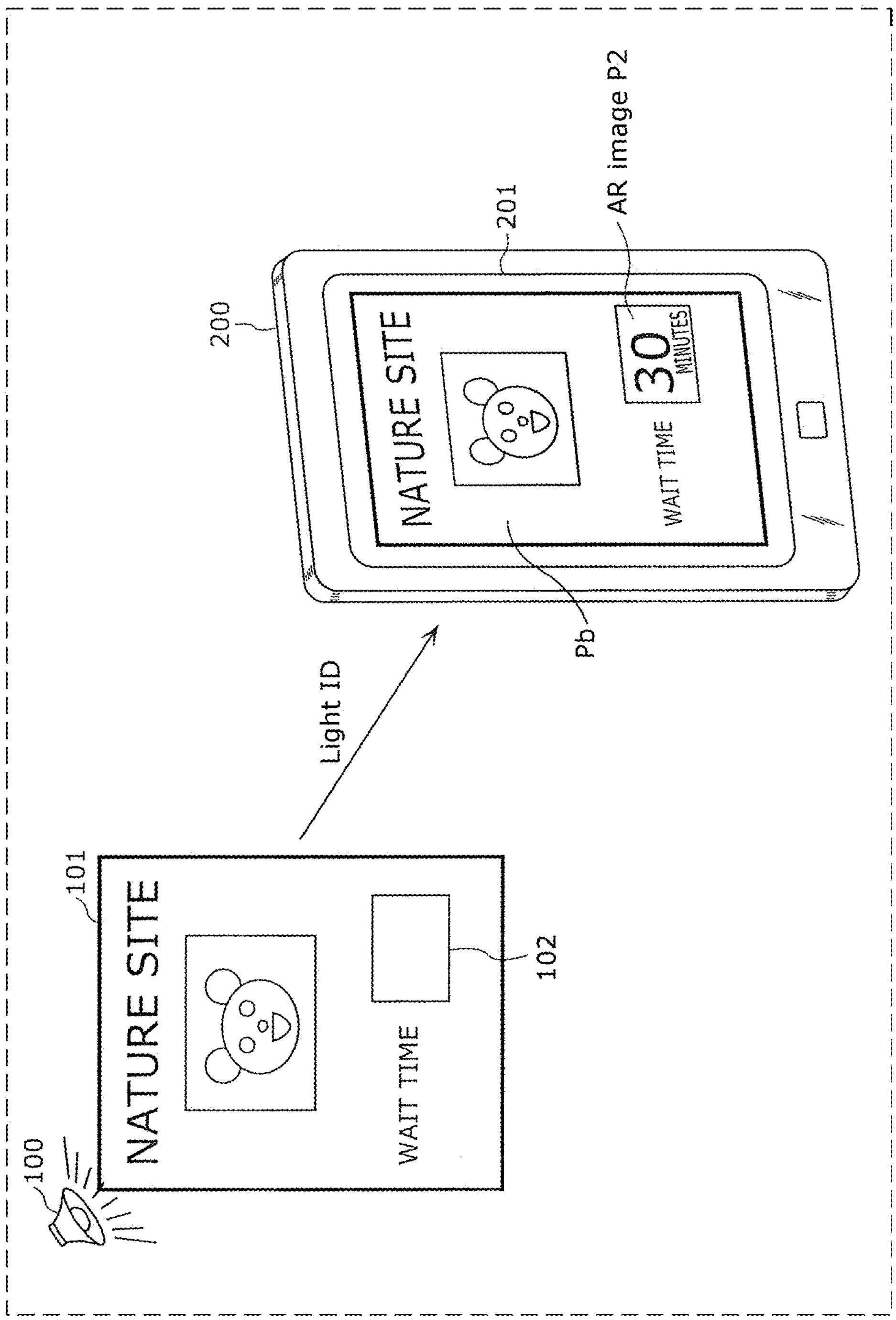
Figure 241:
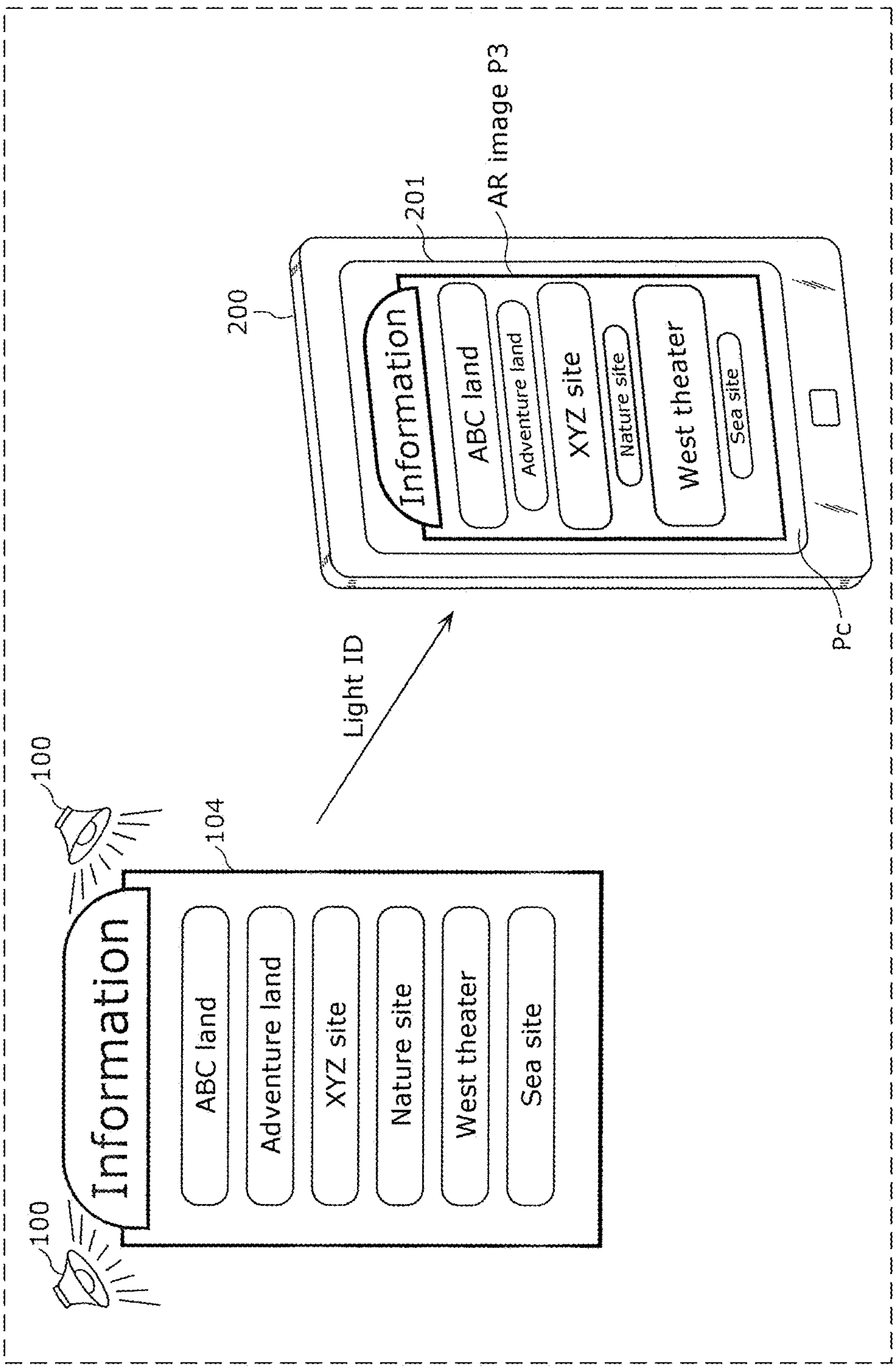
Figure 242:
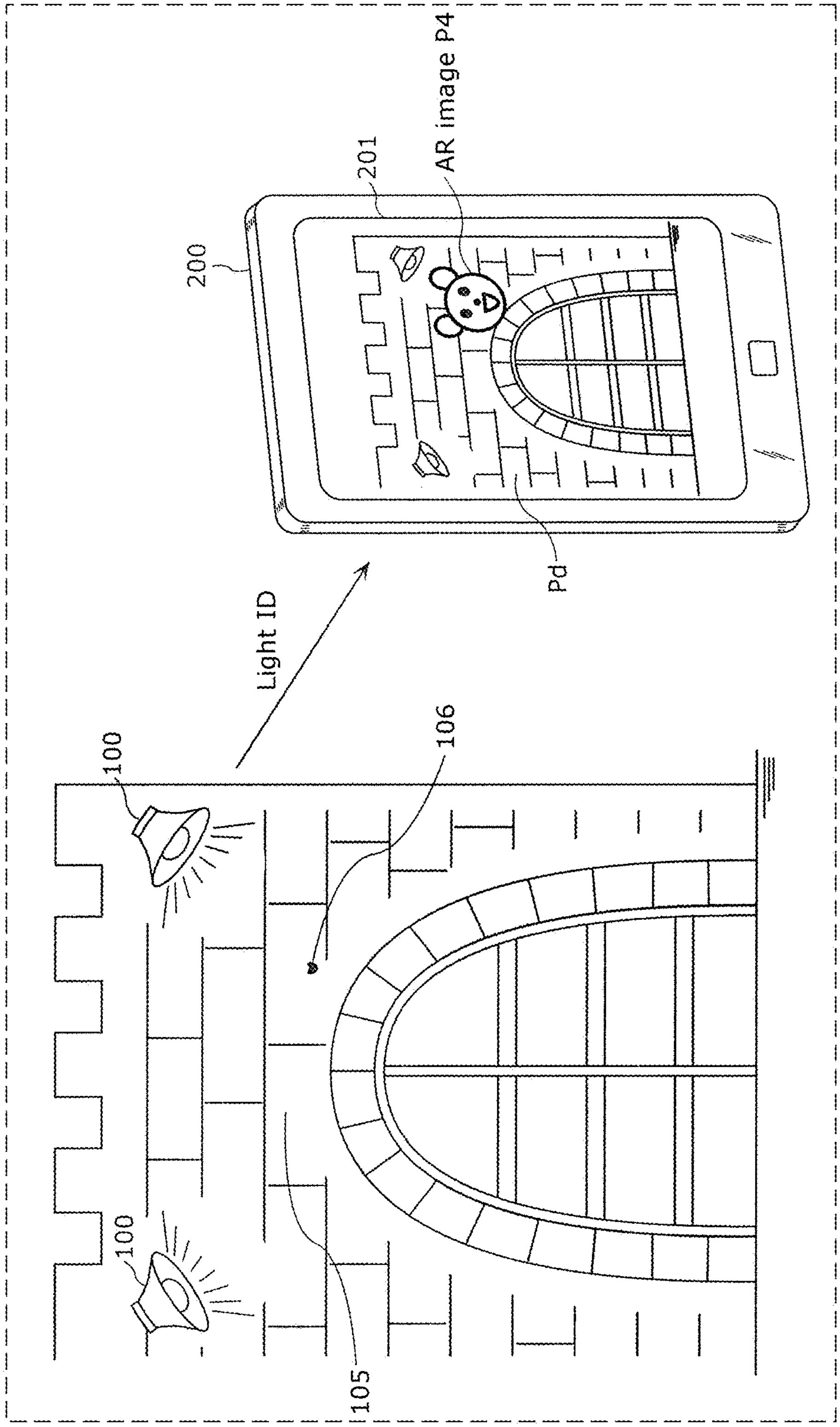
Figure 243:
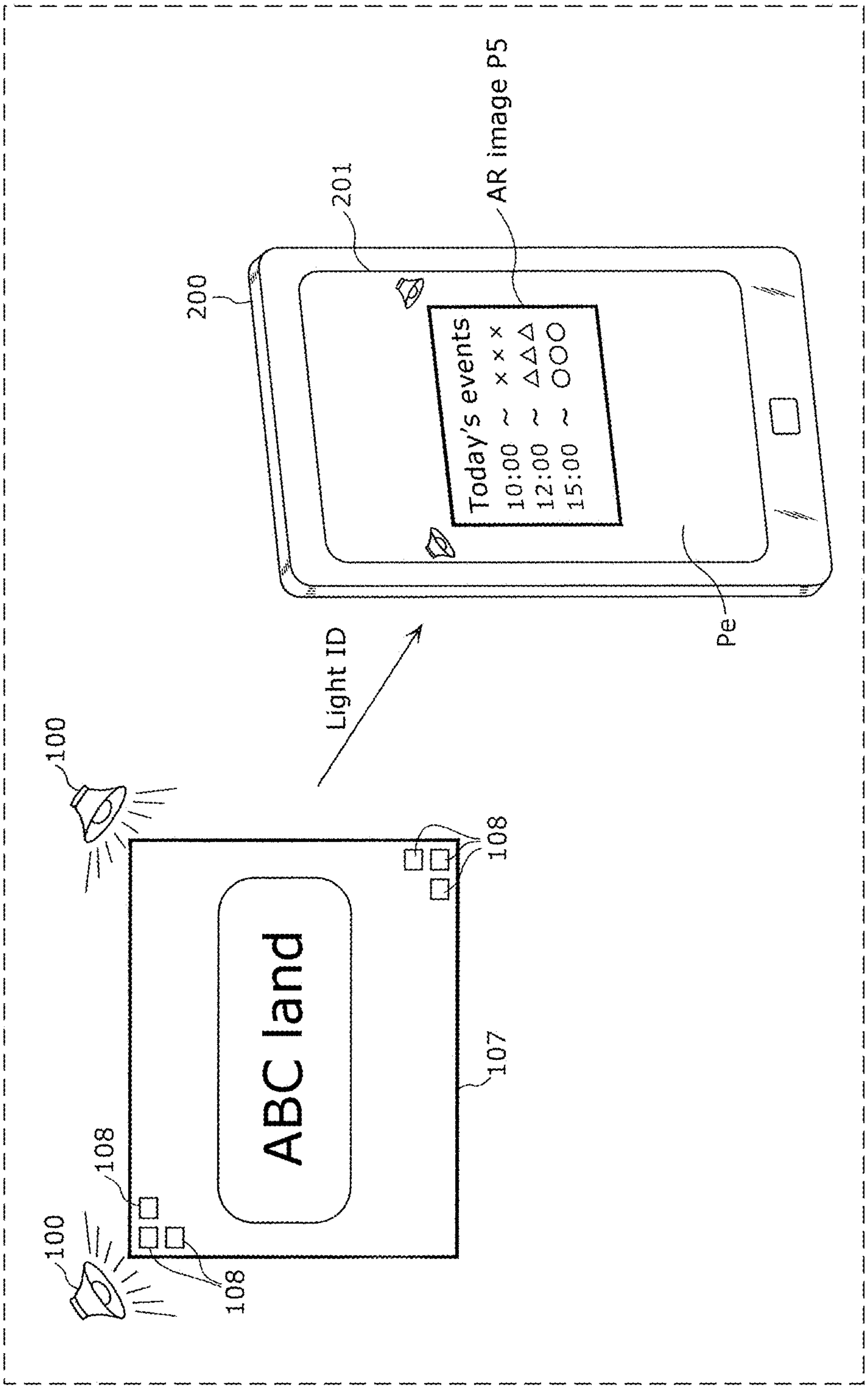
Figure 244:
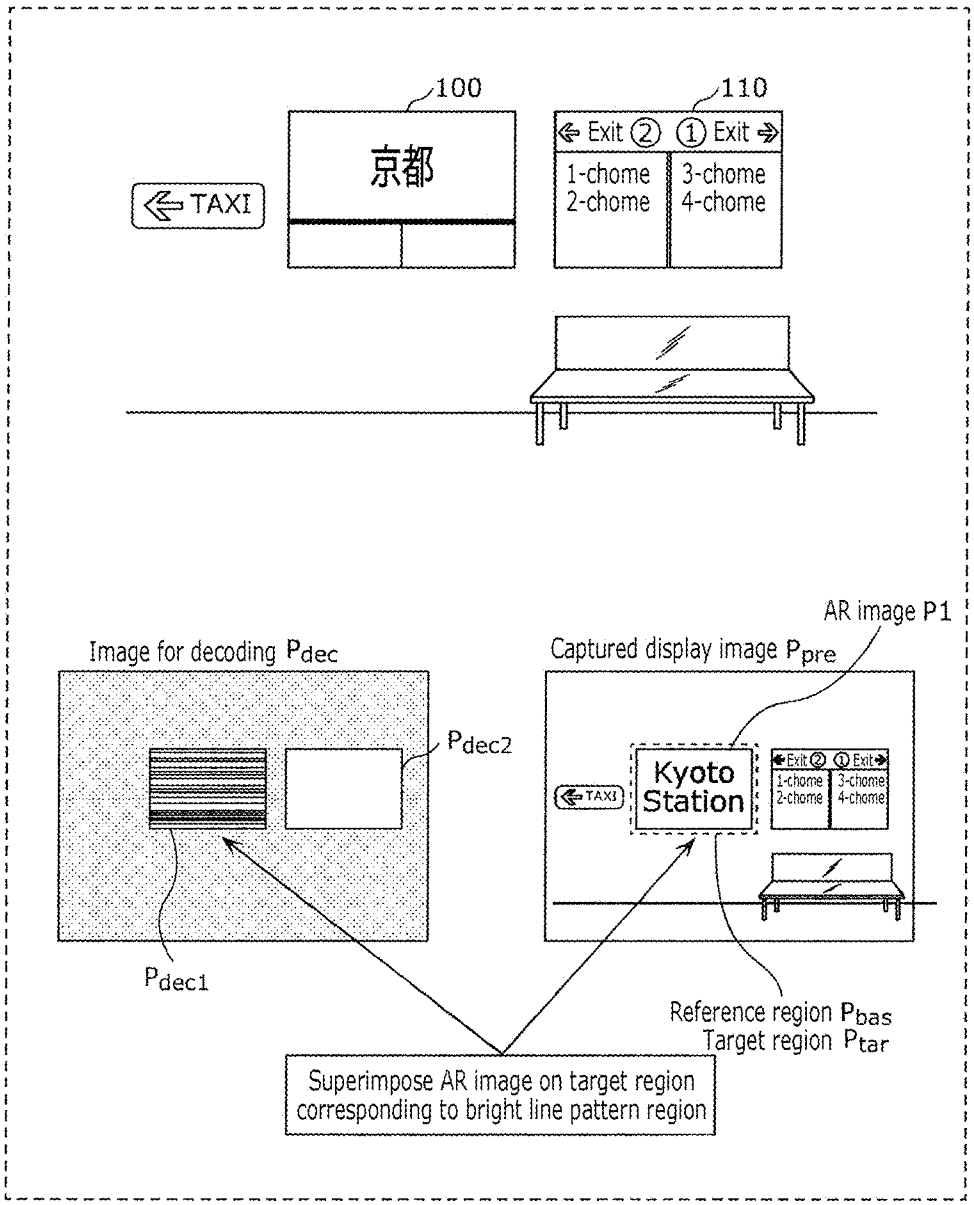
Figure 245:
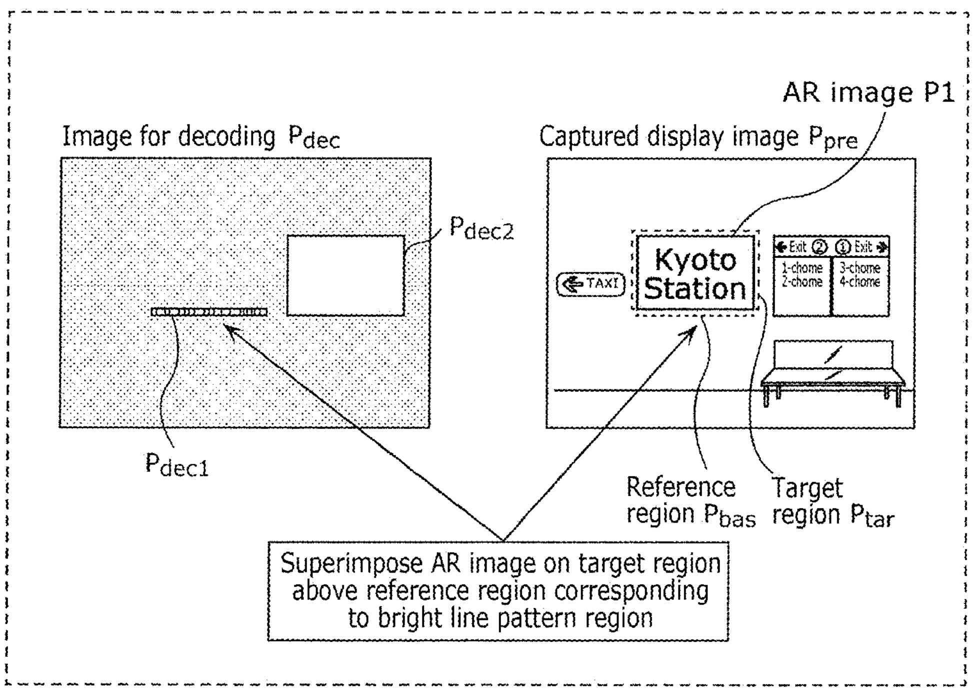
Figure 246:
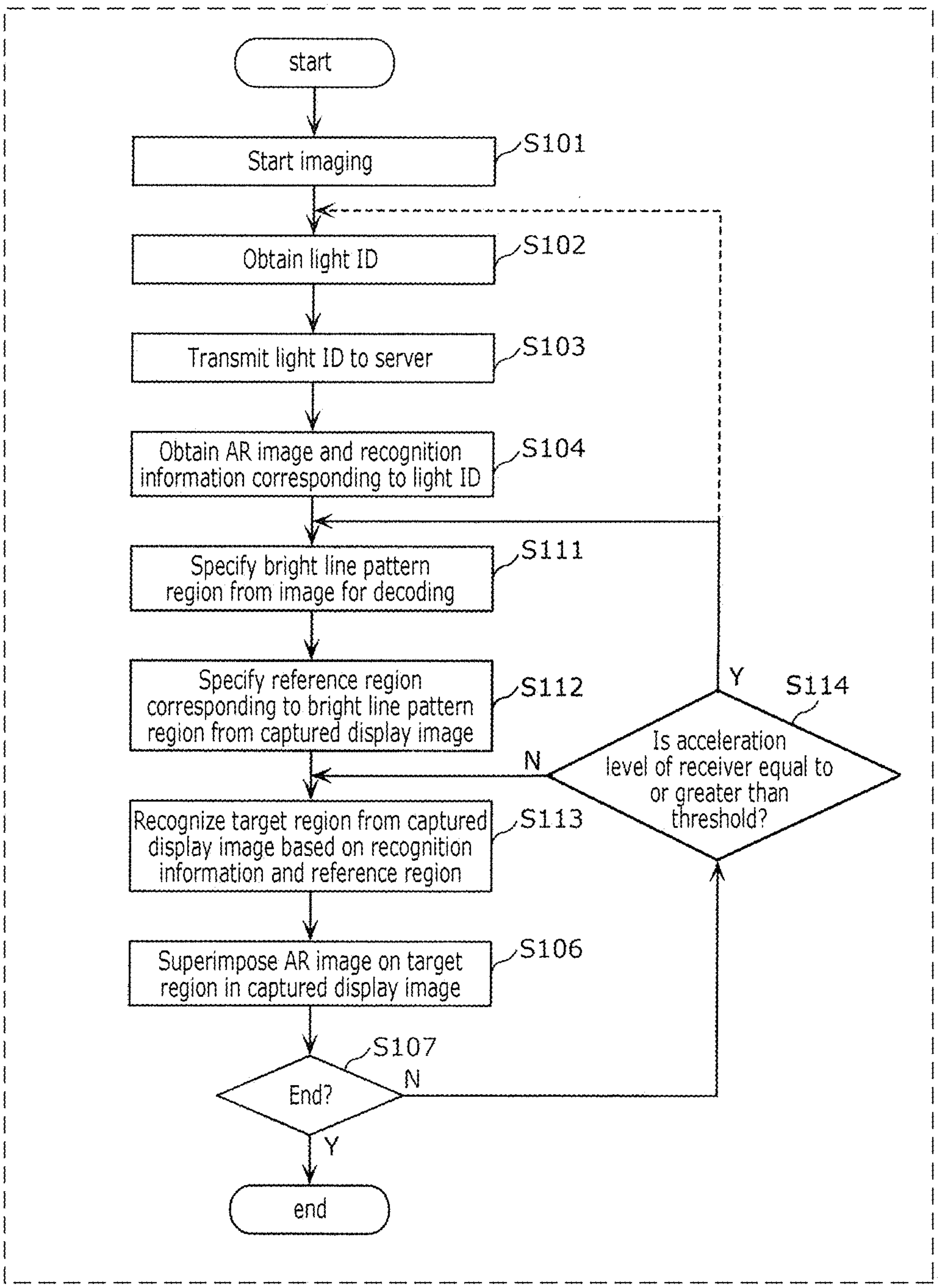
Figure 247:
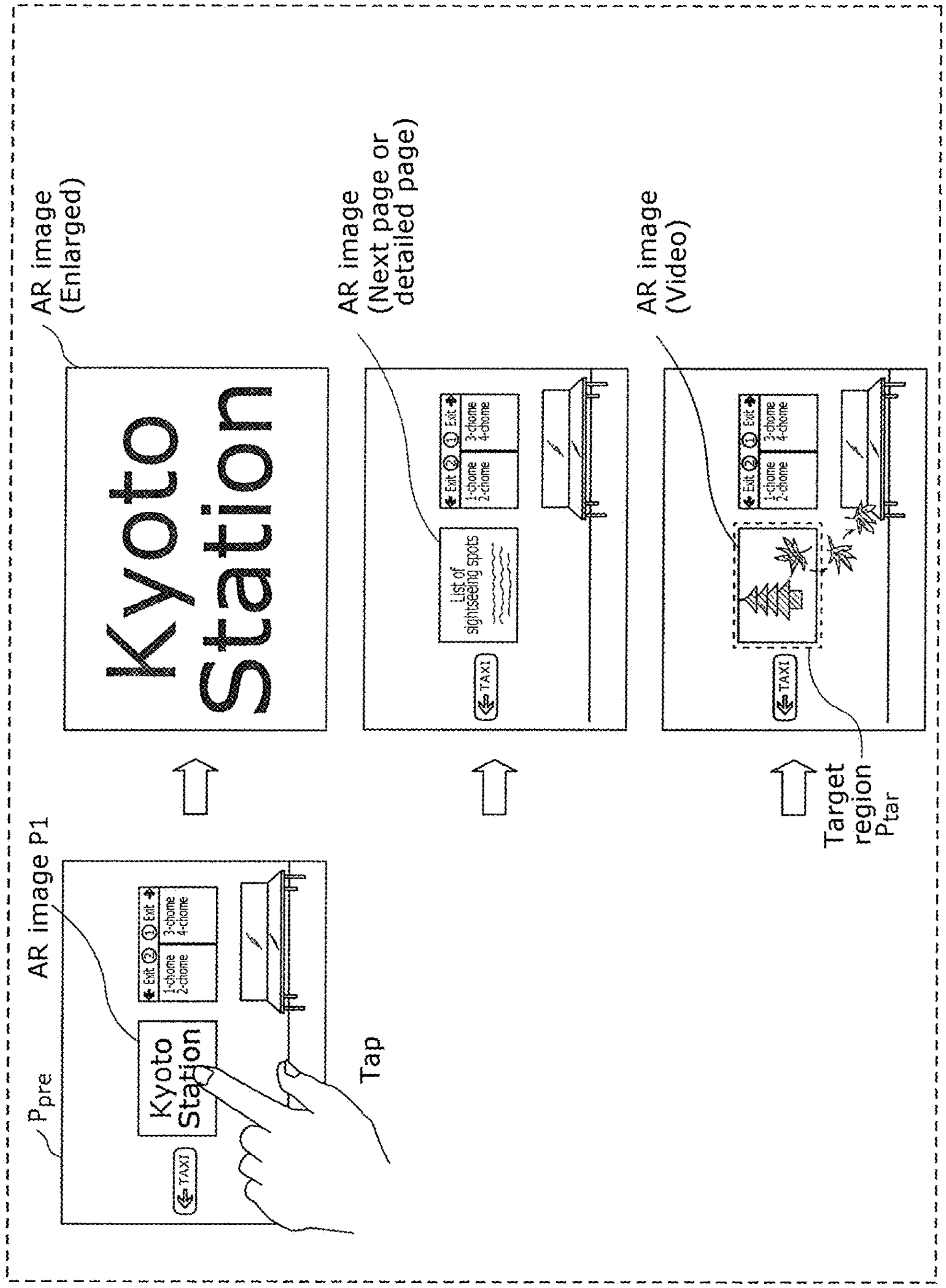
Figure 248:
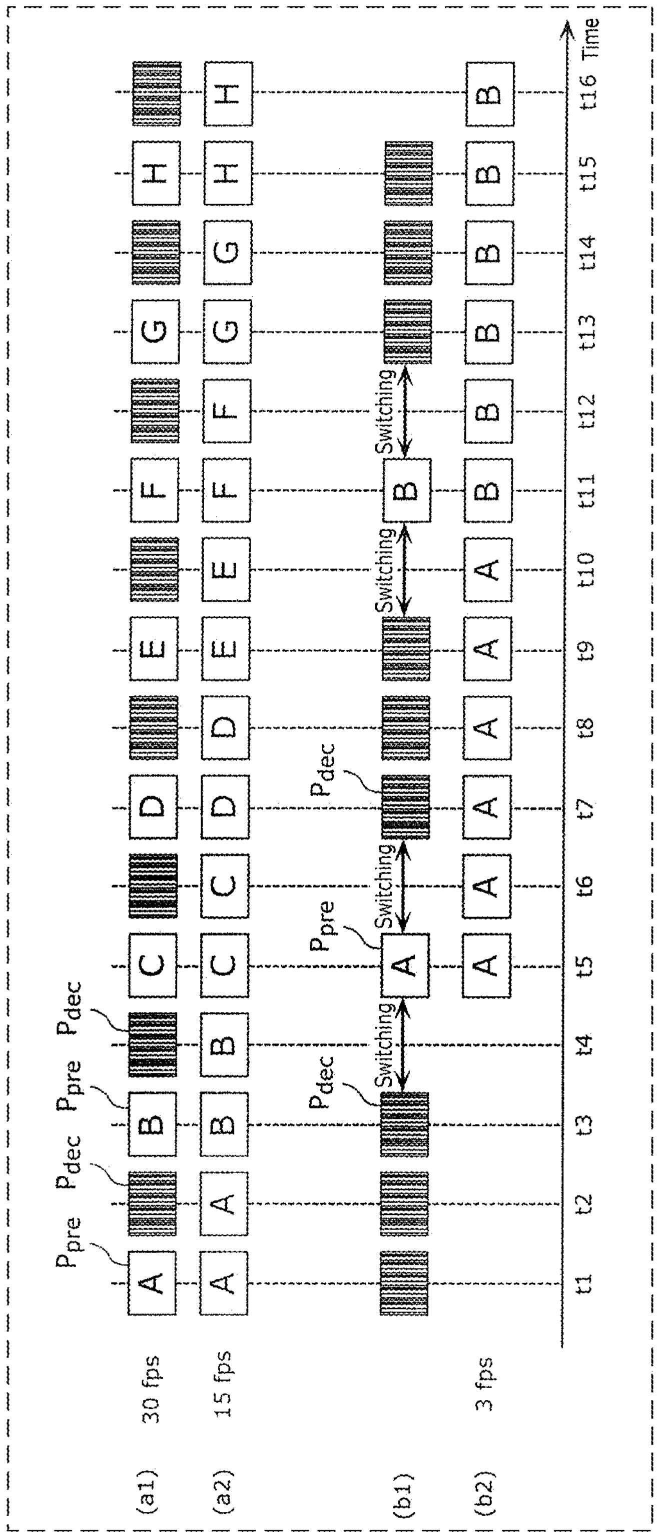
Figure 249:
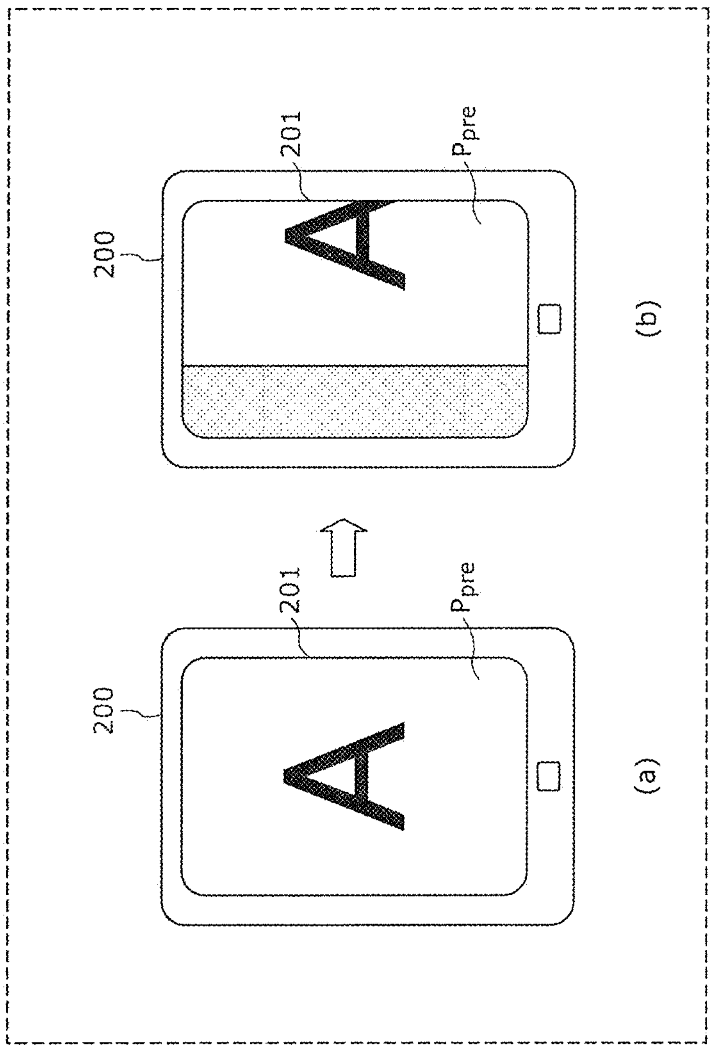
Figure 250:
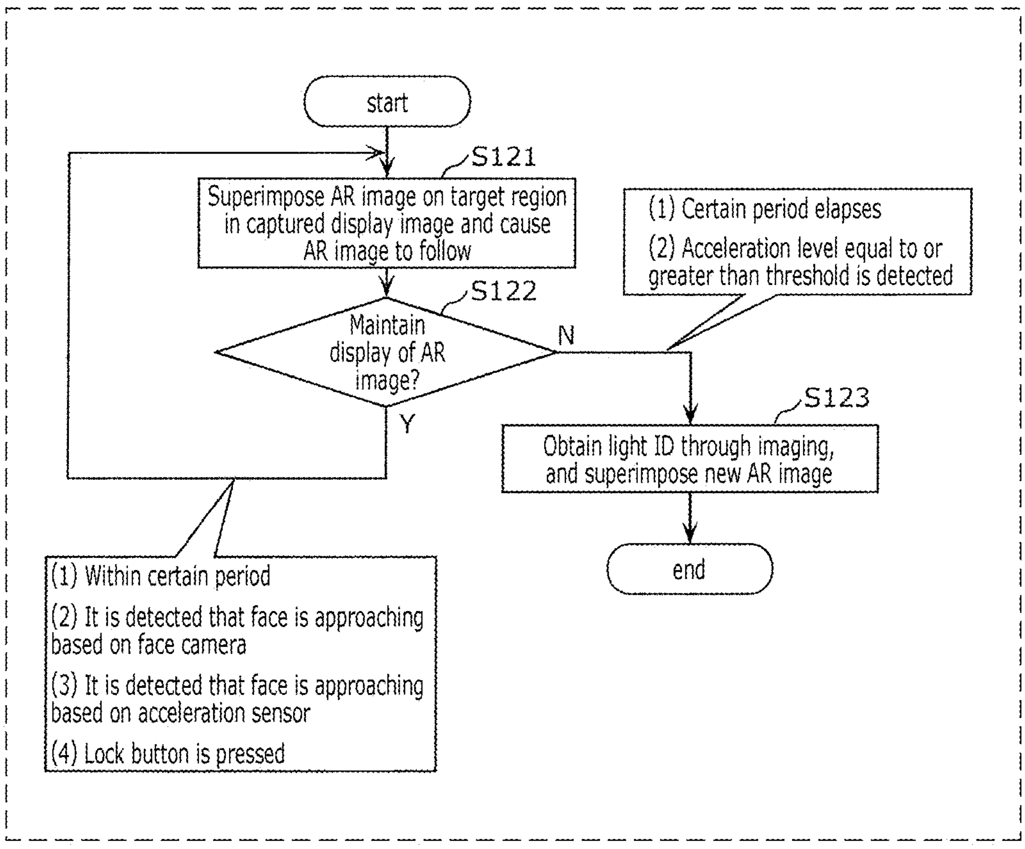
Figure 251:
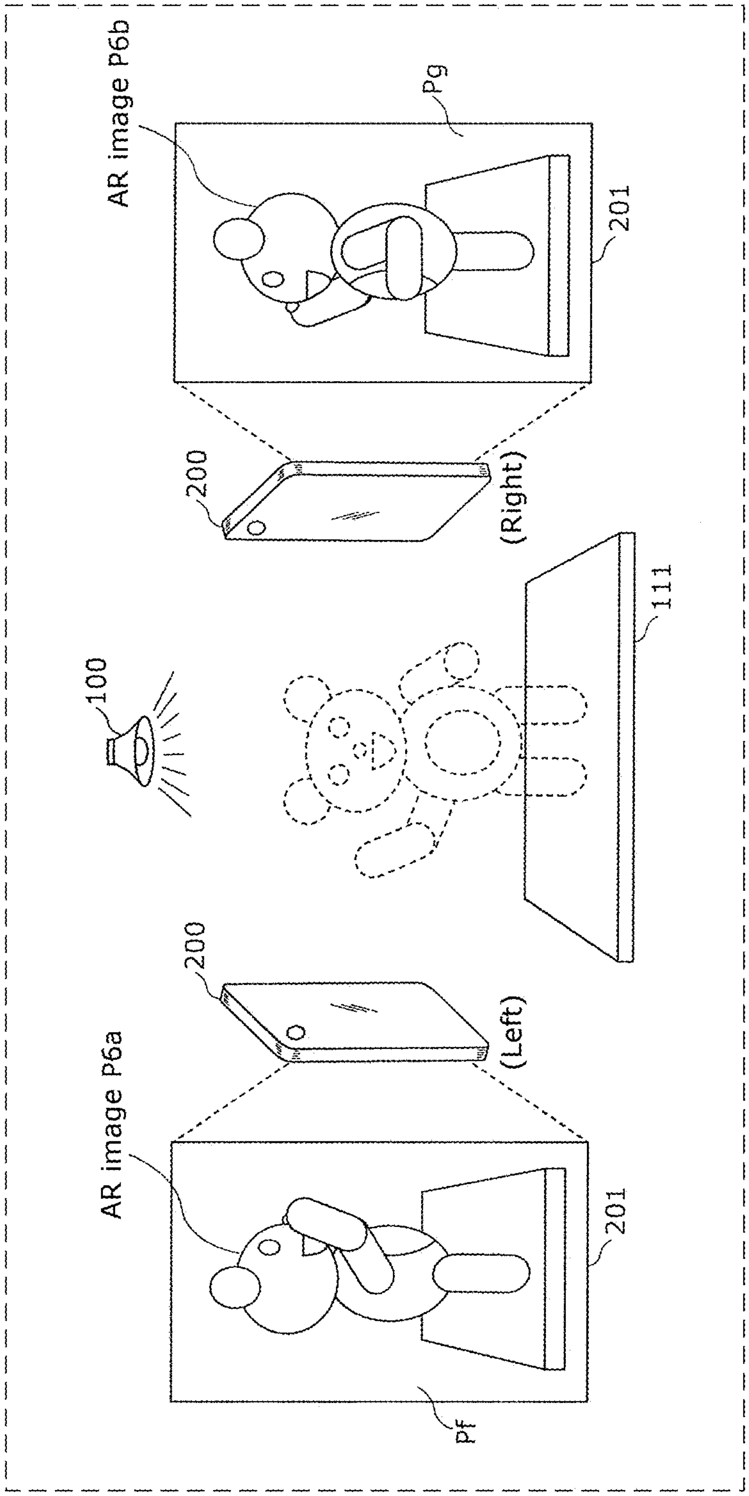
Figure 252:
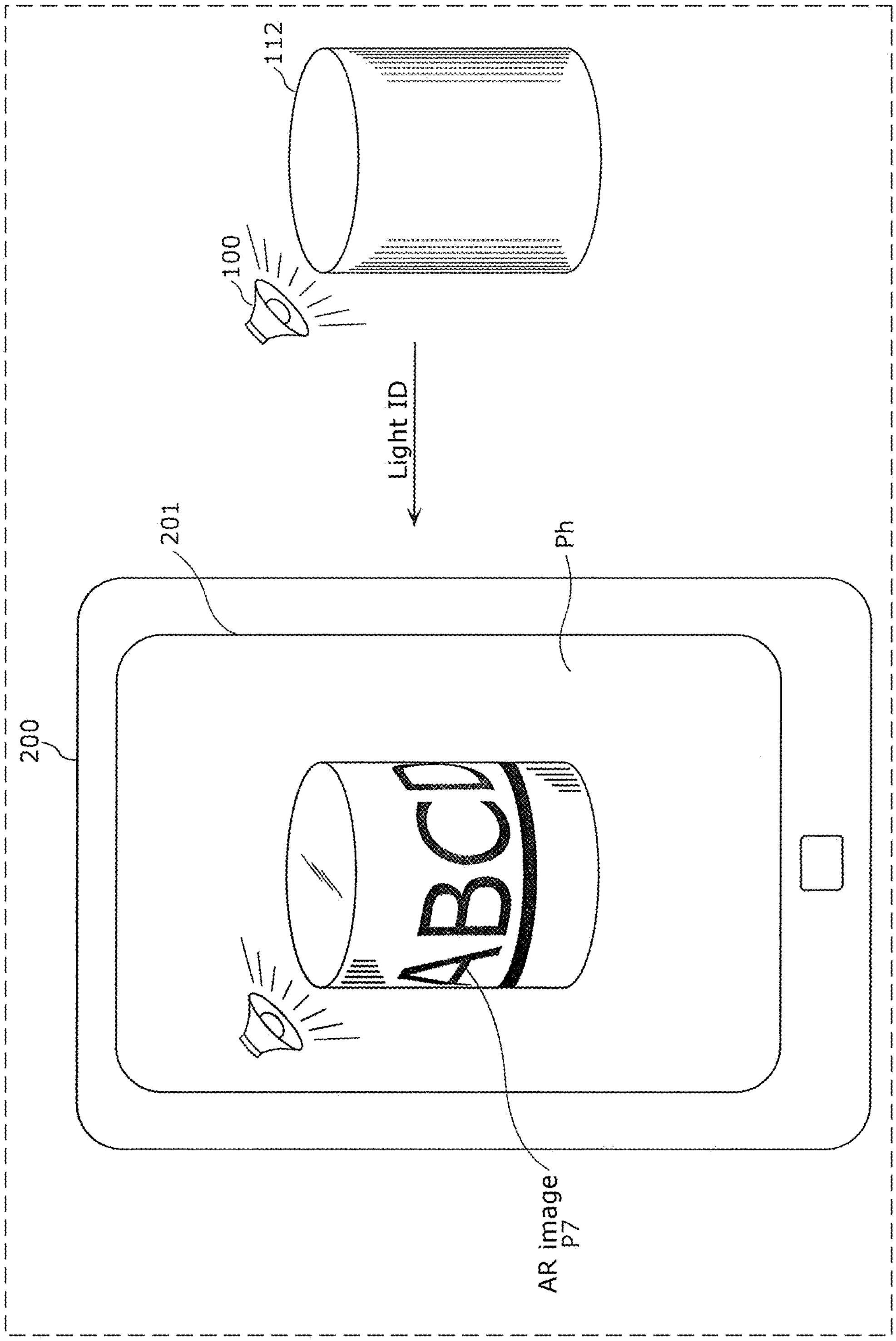
Figure 253:
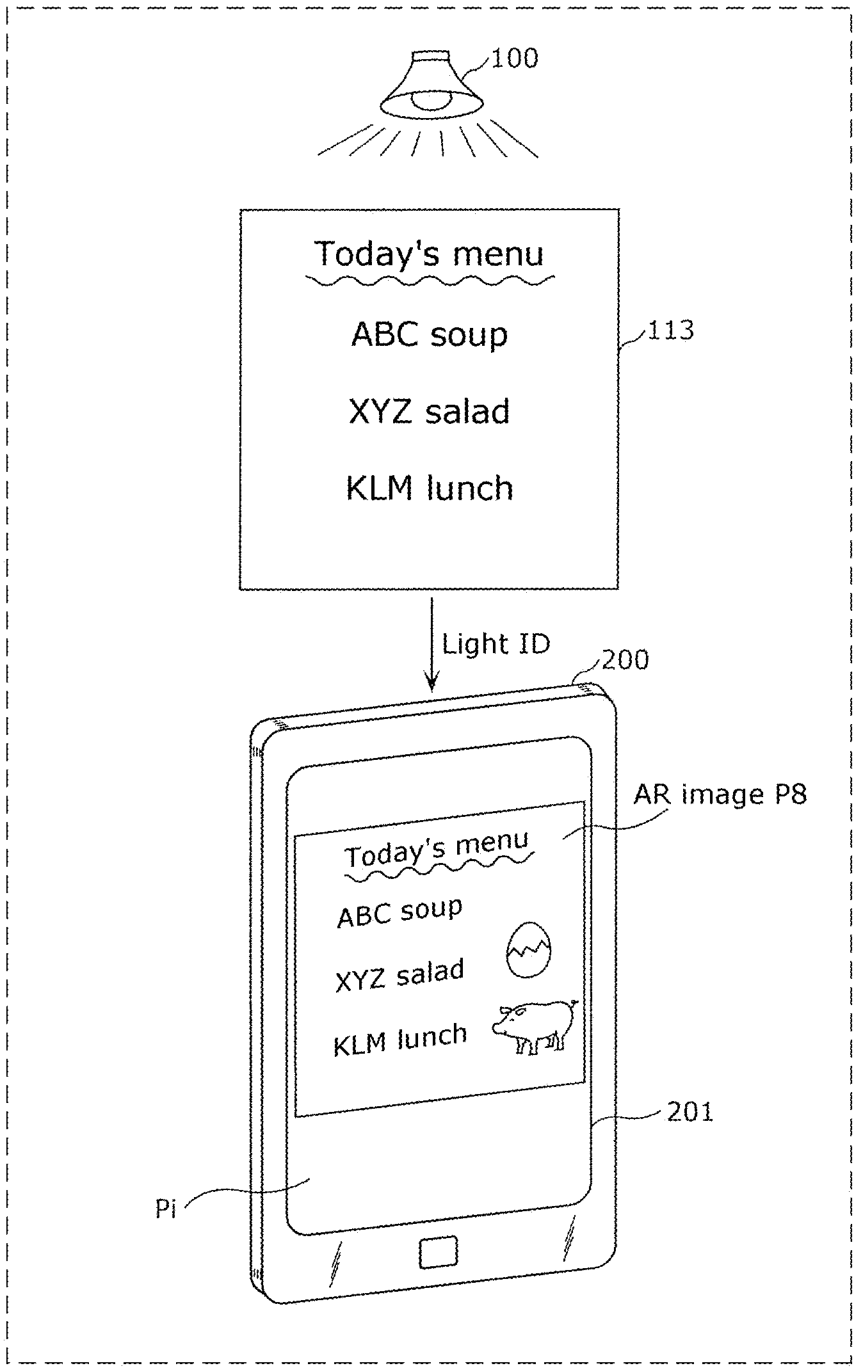
Figure 254:
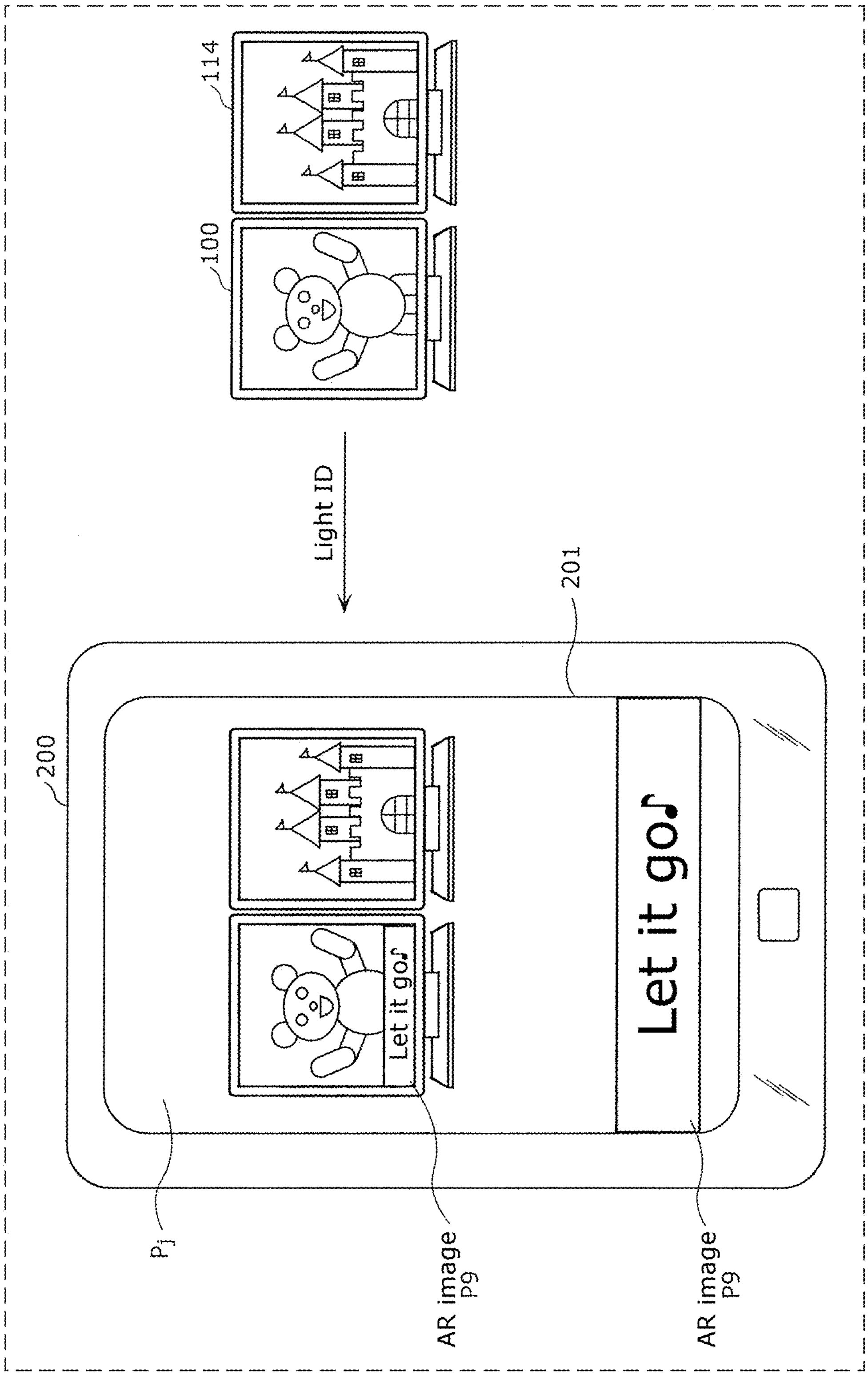
Figure 255:
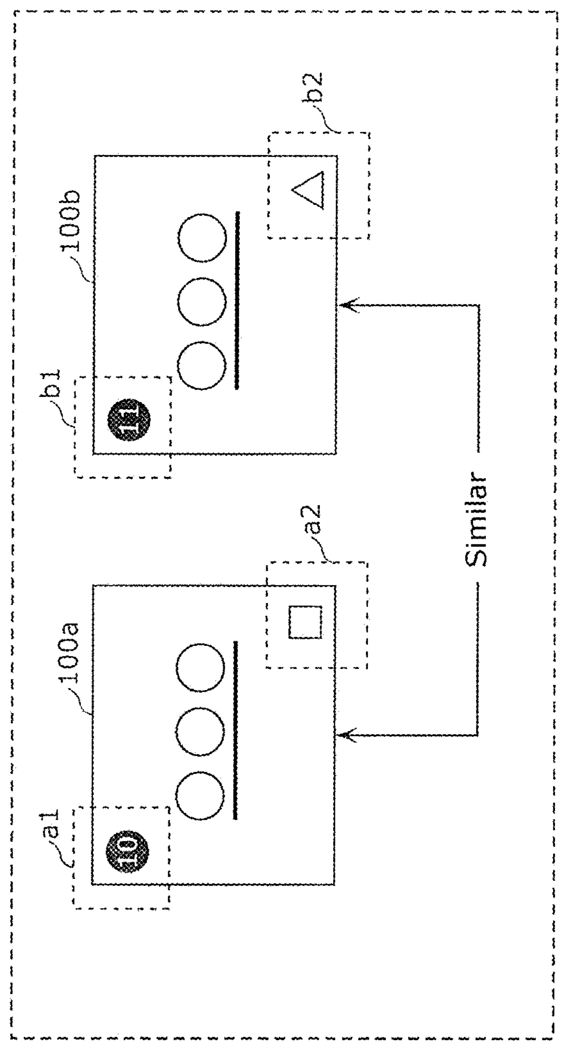
Figure 256:
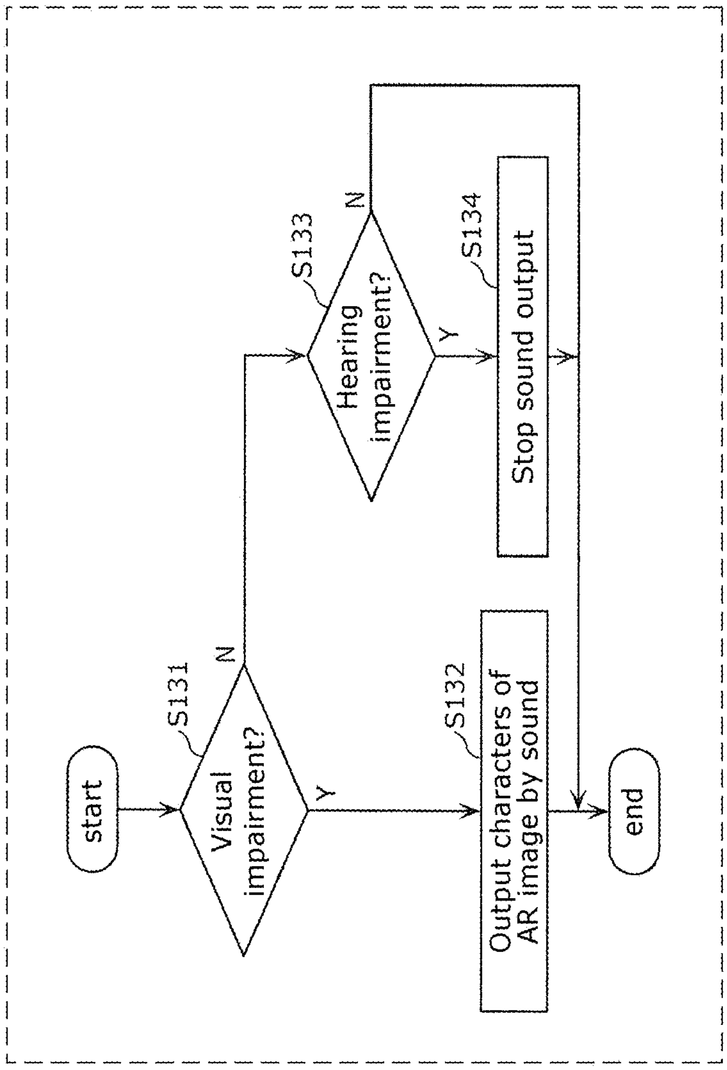
Figure 258:
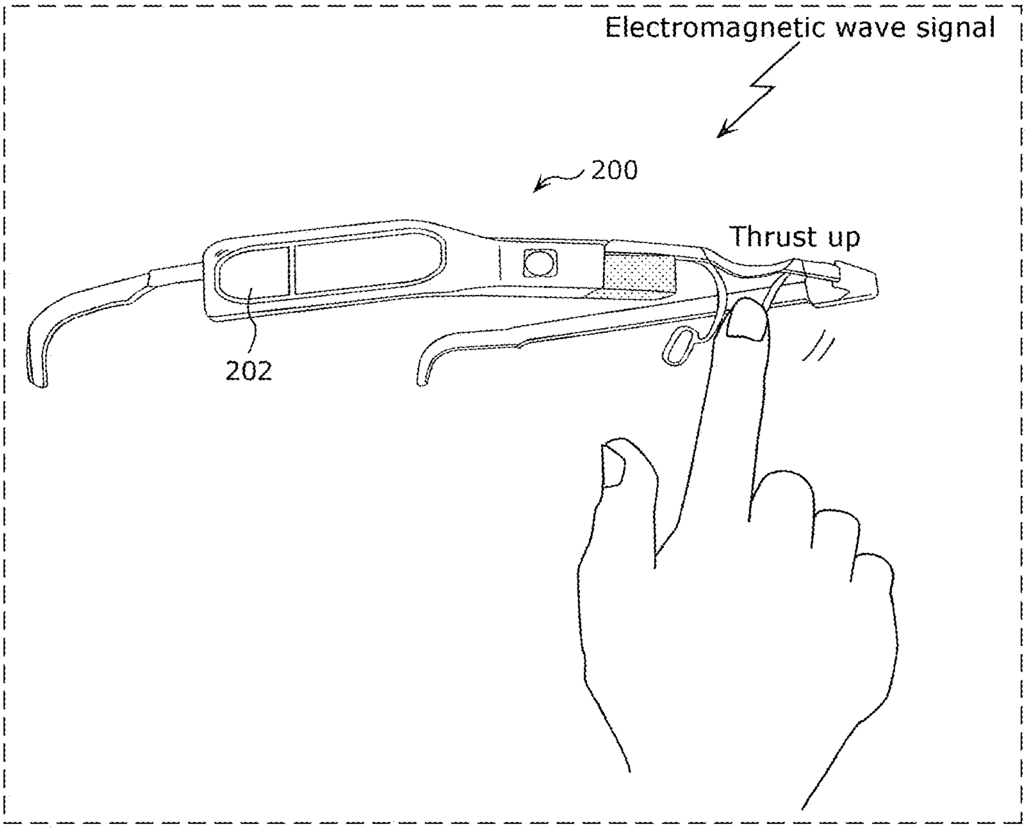
Figure 259:
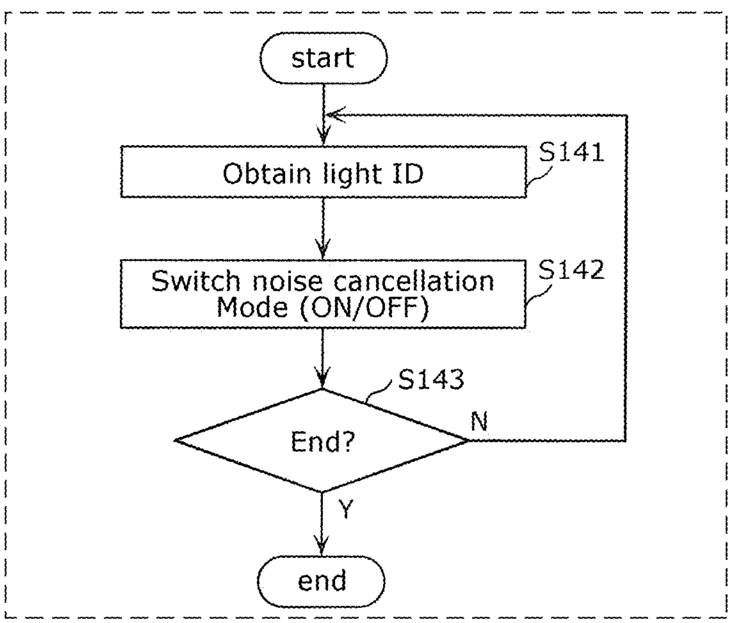
Figure 260:
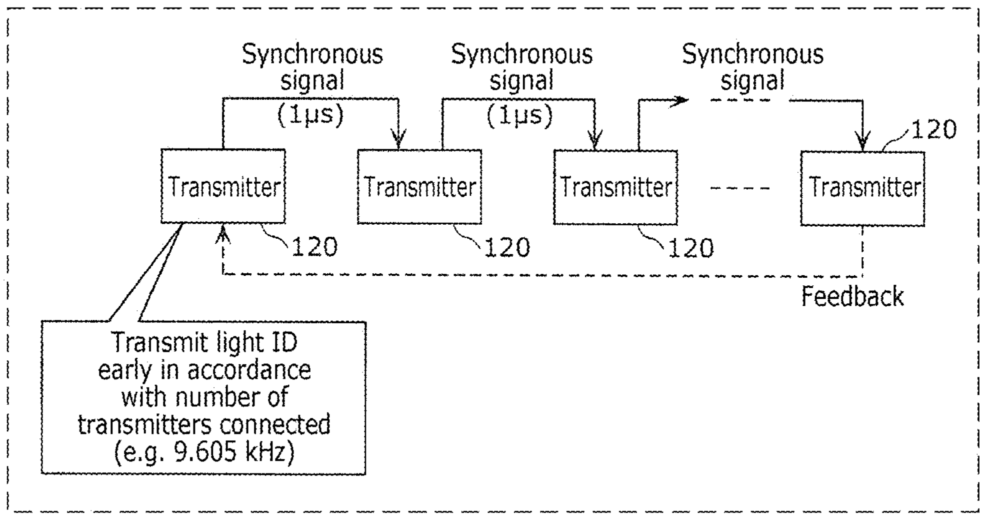
Figure 261:
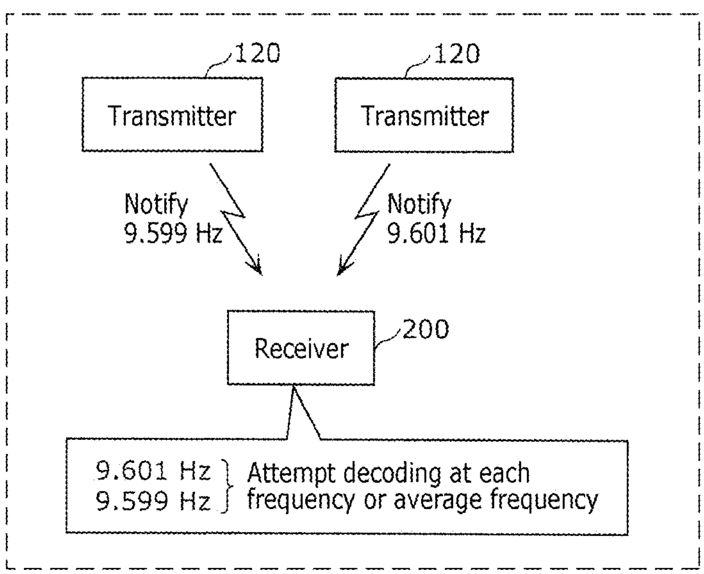
Figure 262B:
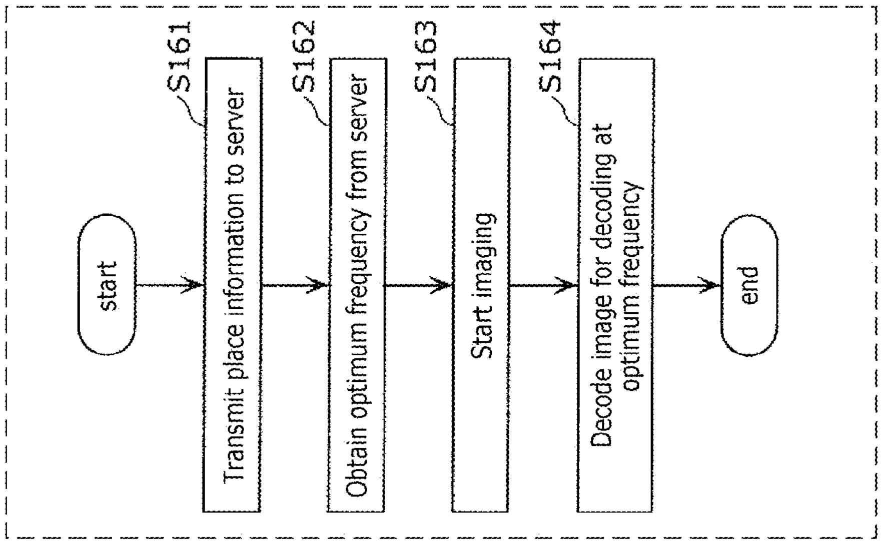
Figure 262A:
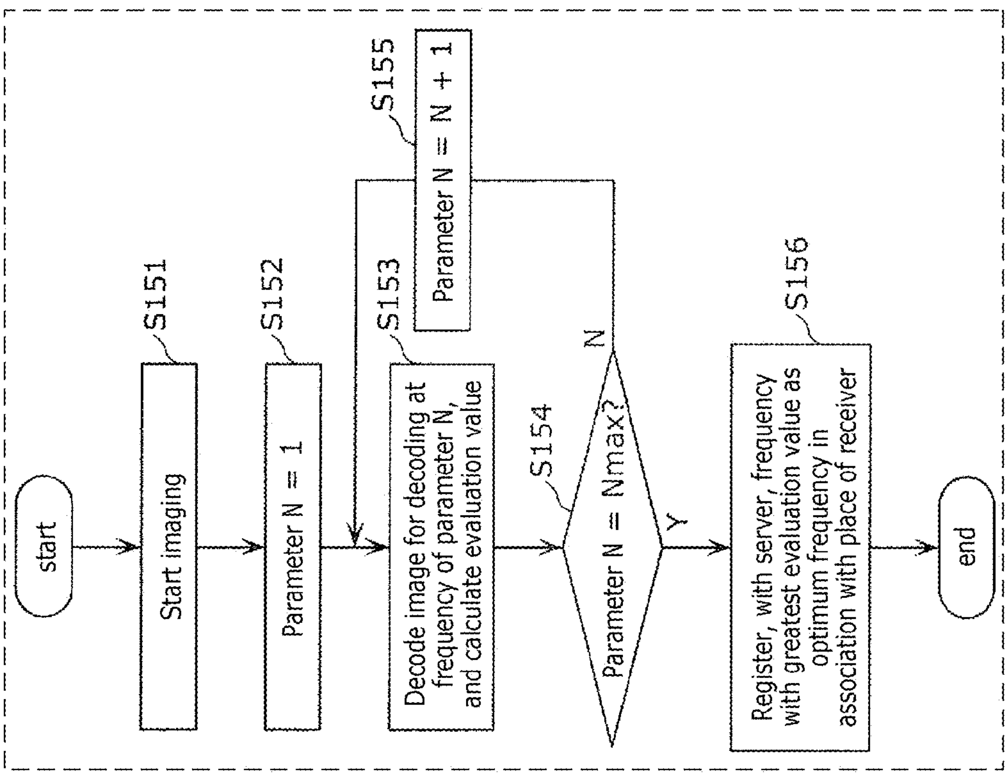
Figure 263A:
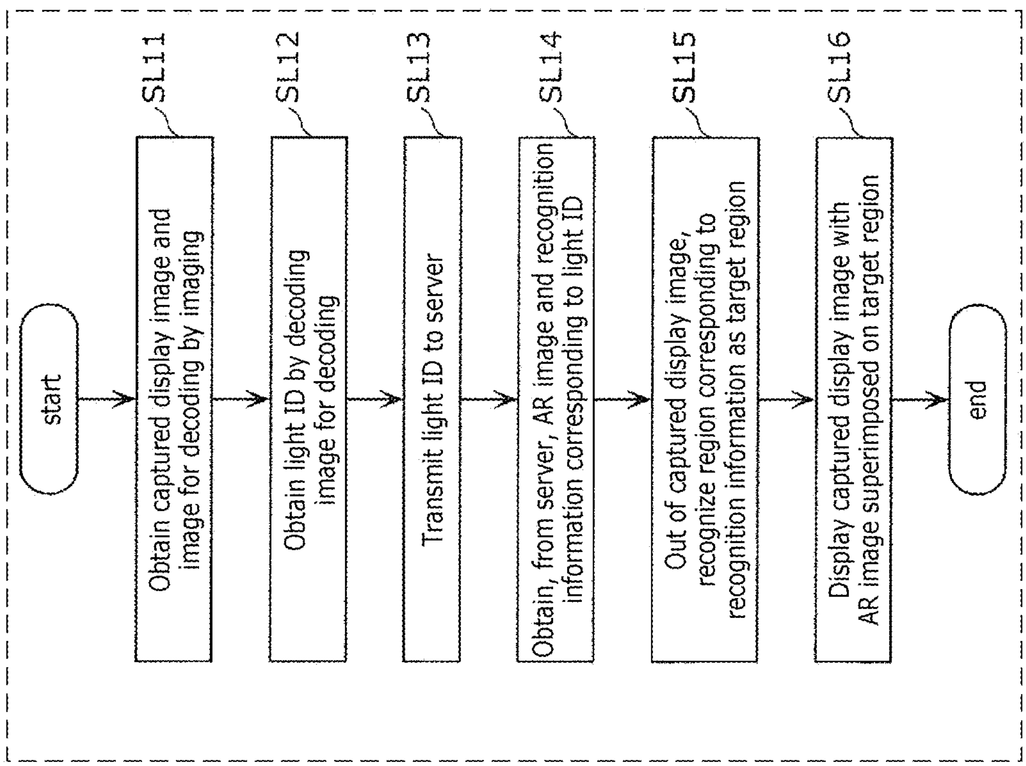
Figure 263B:
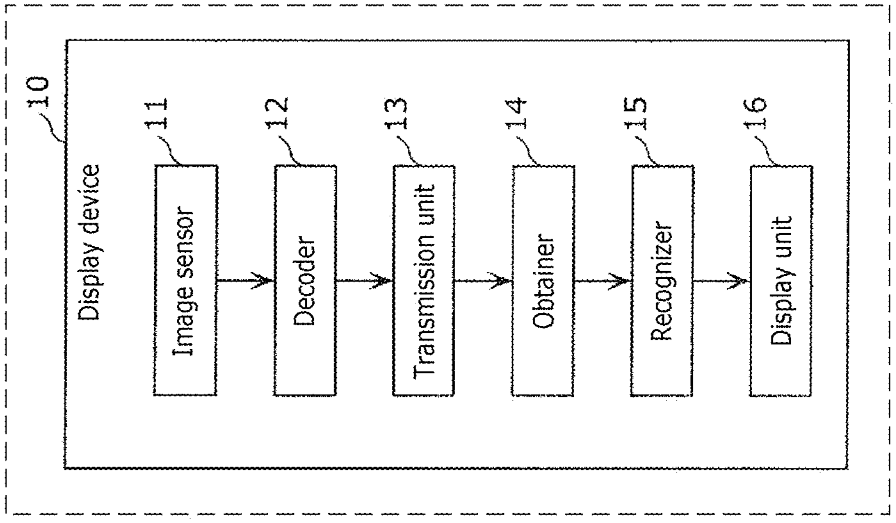
Figure 264:
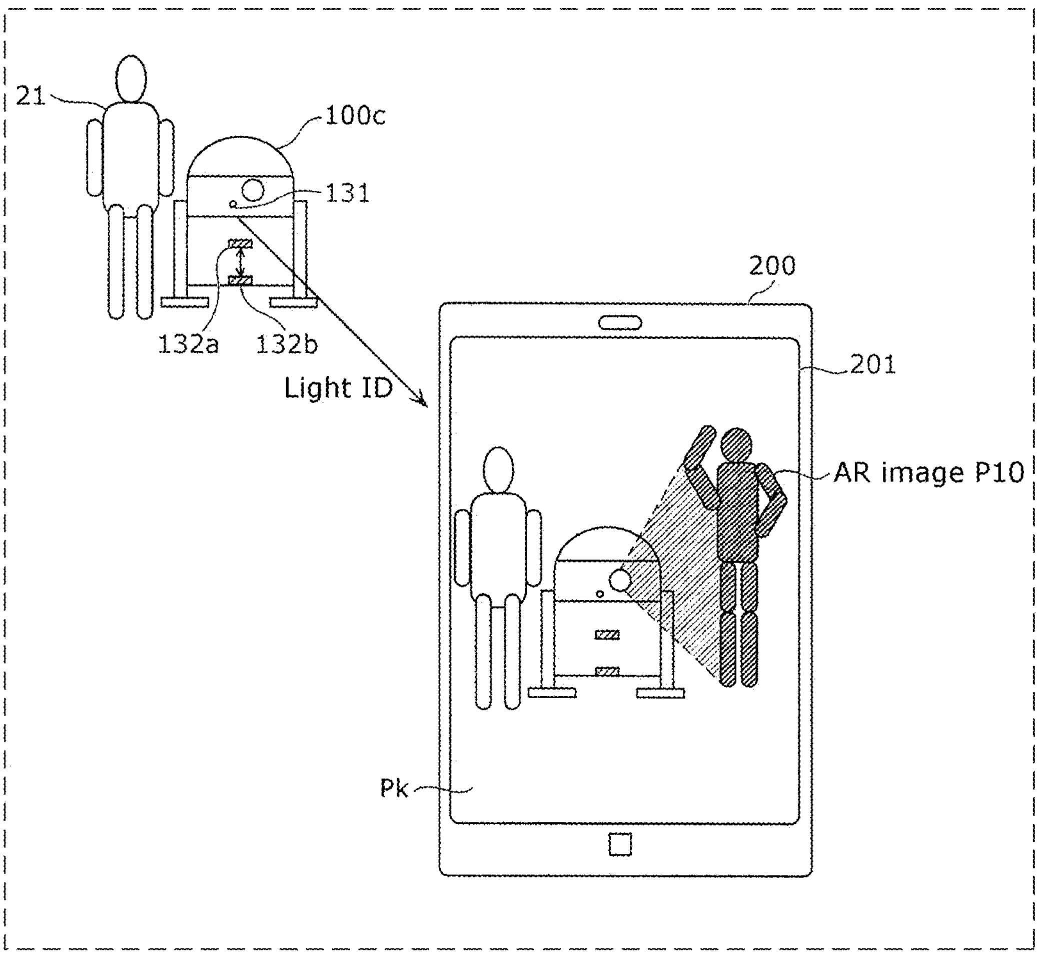
Figure 265:
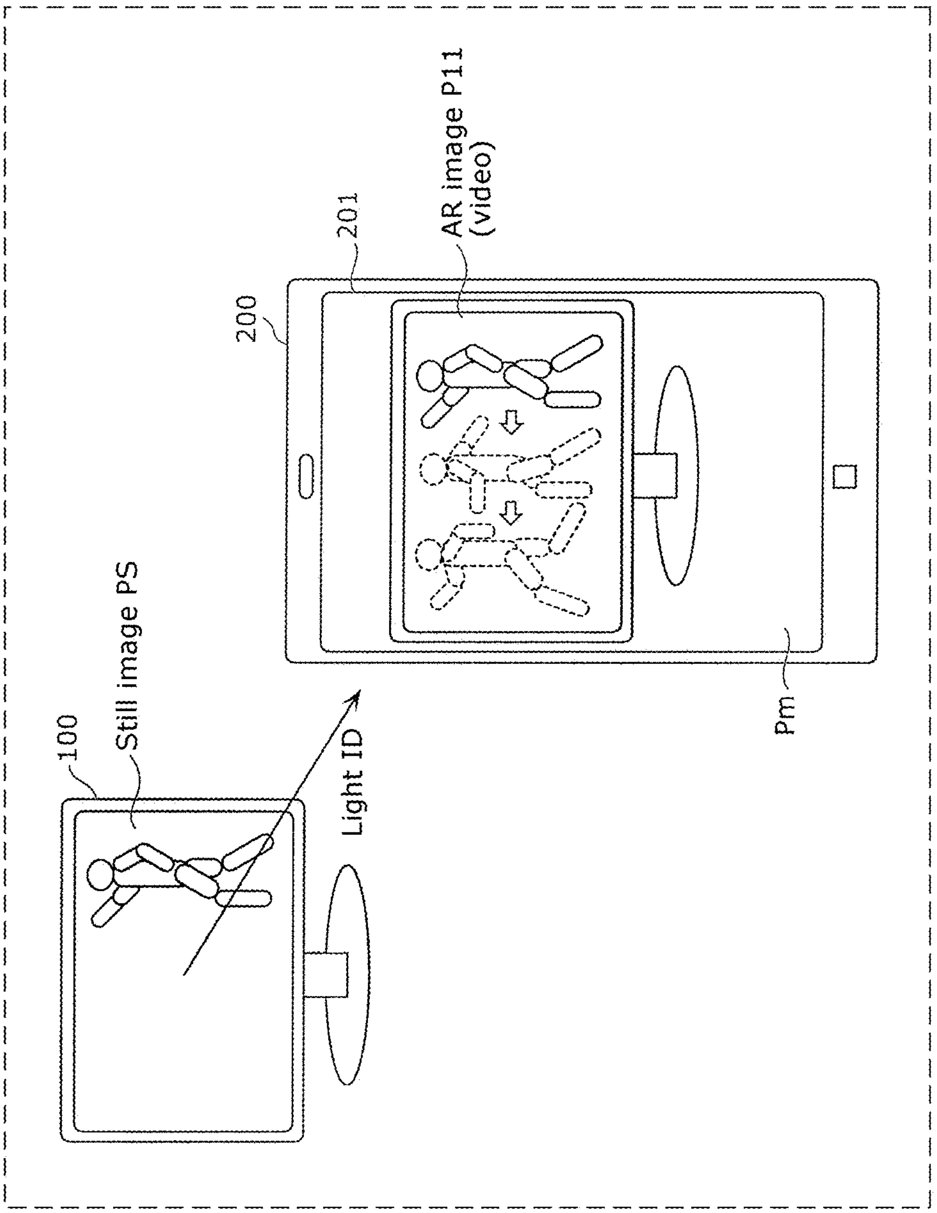
Figure 266:
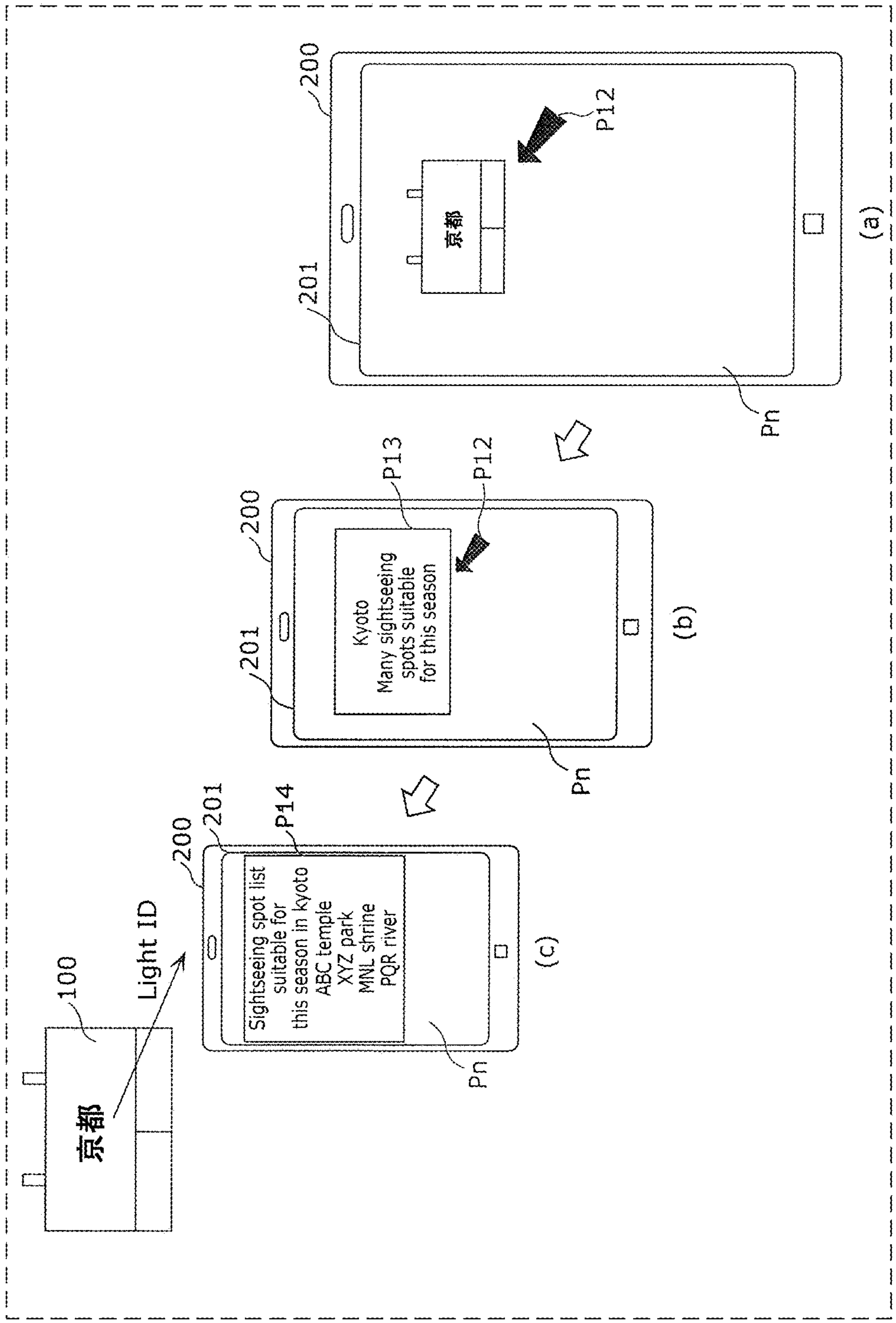
Figure 267:
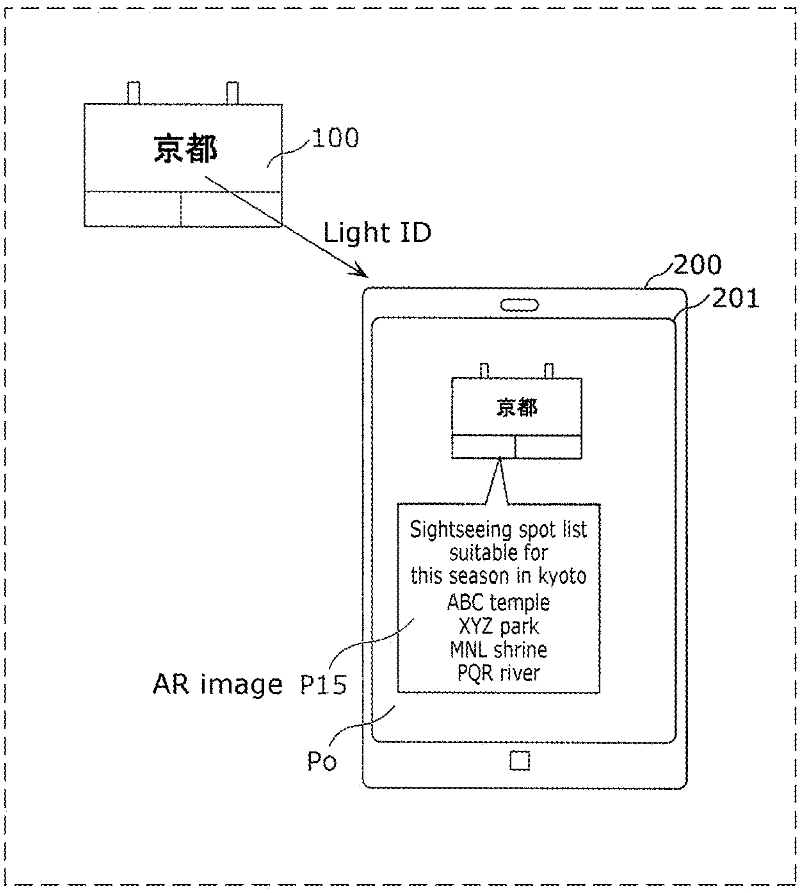
Figure 268:
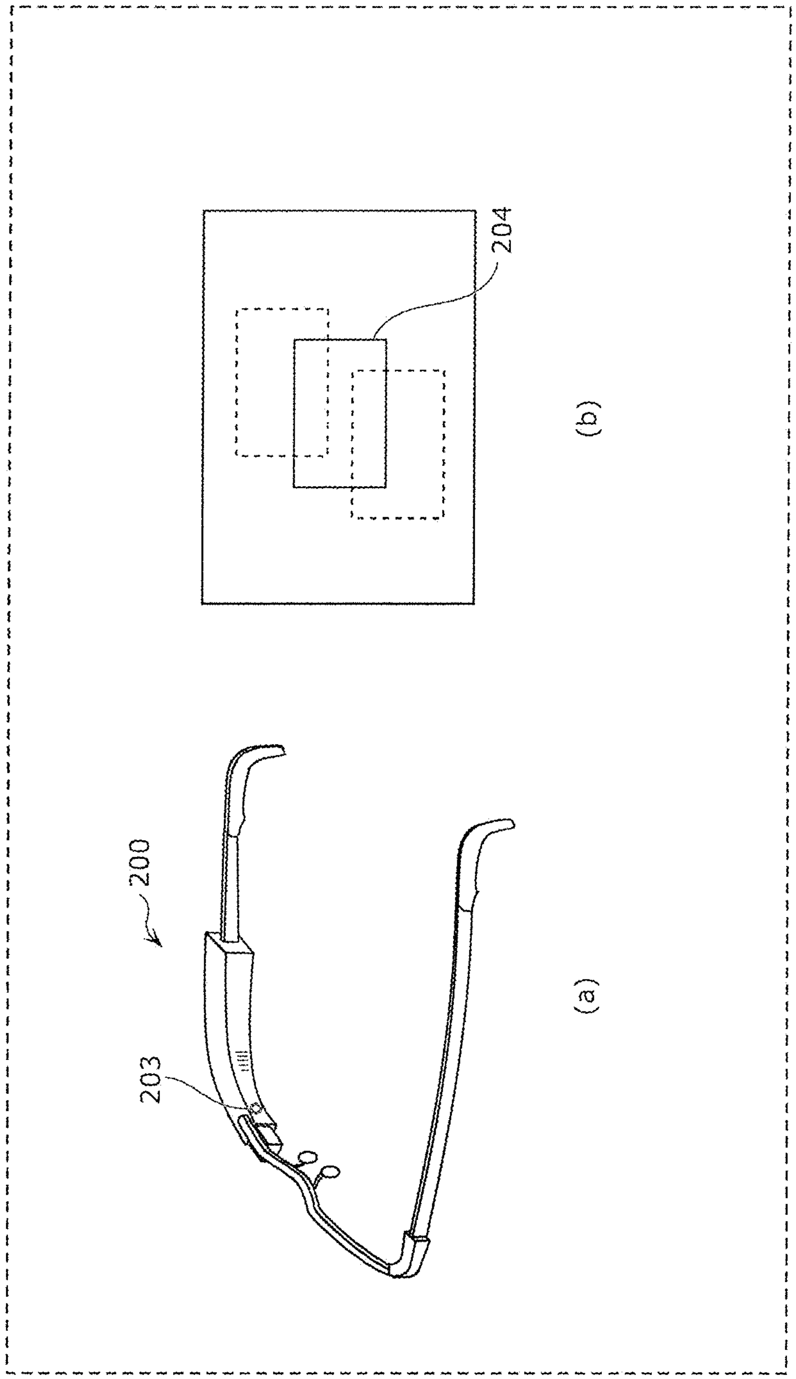
Figure 269:
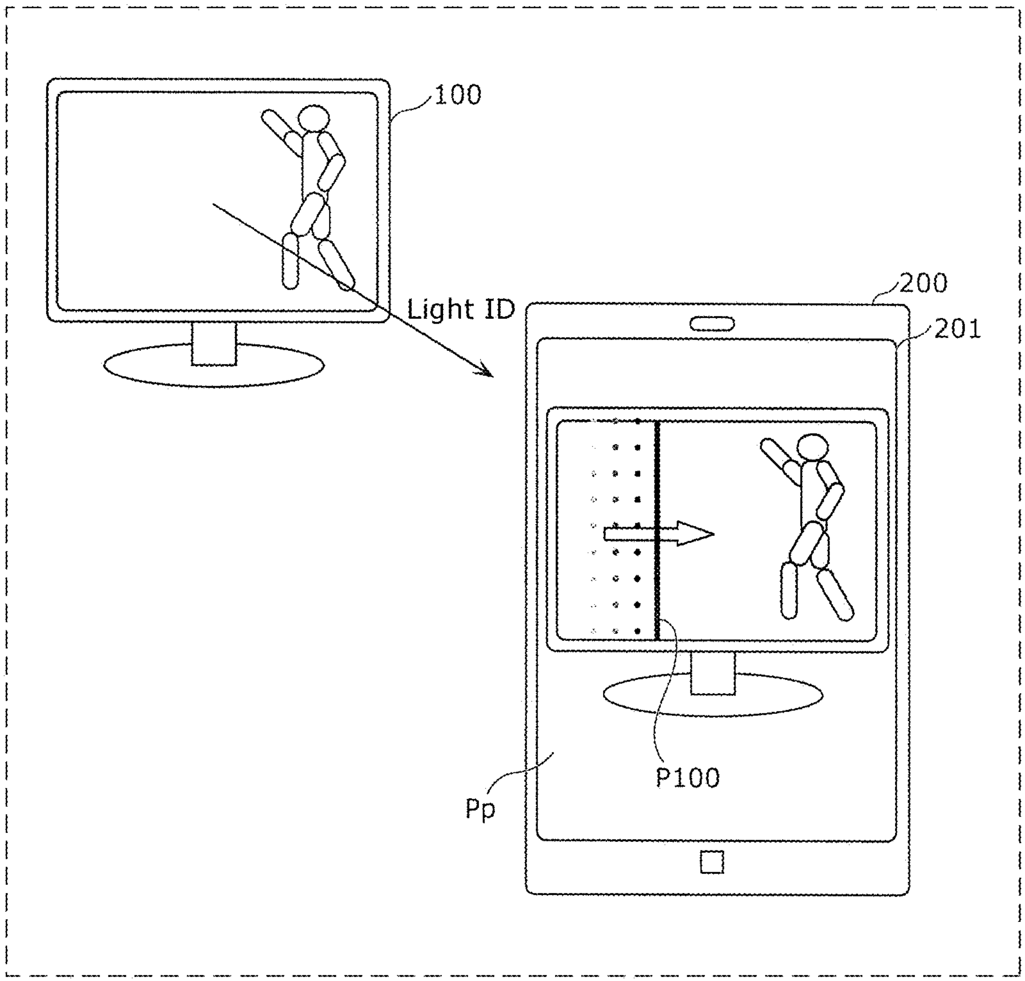
Figure 270:
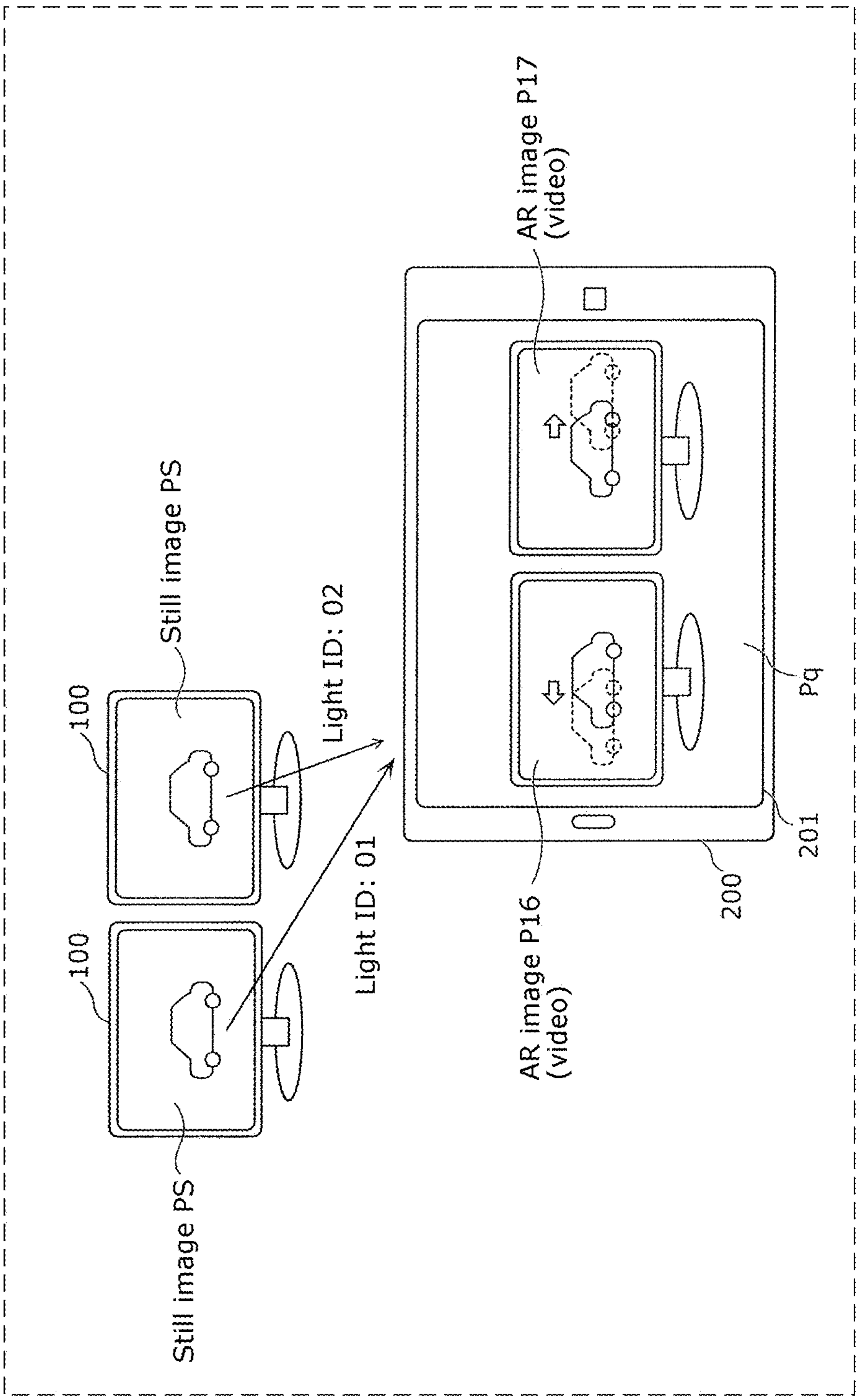
Figure 271:
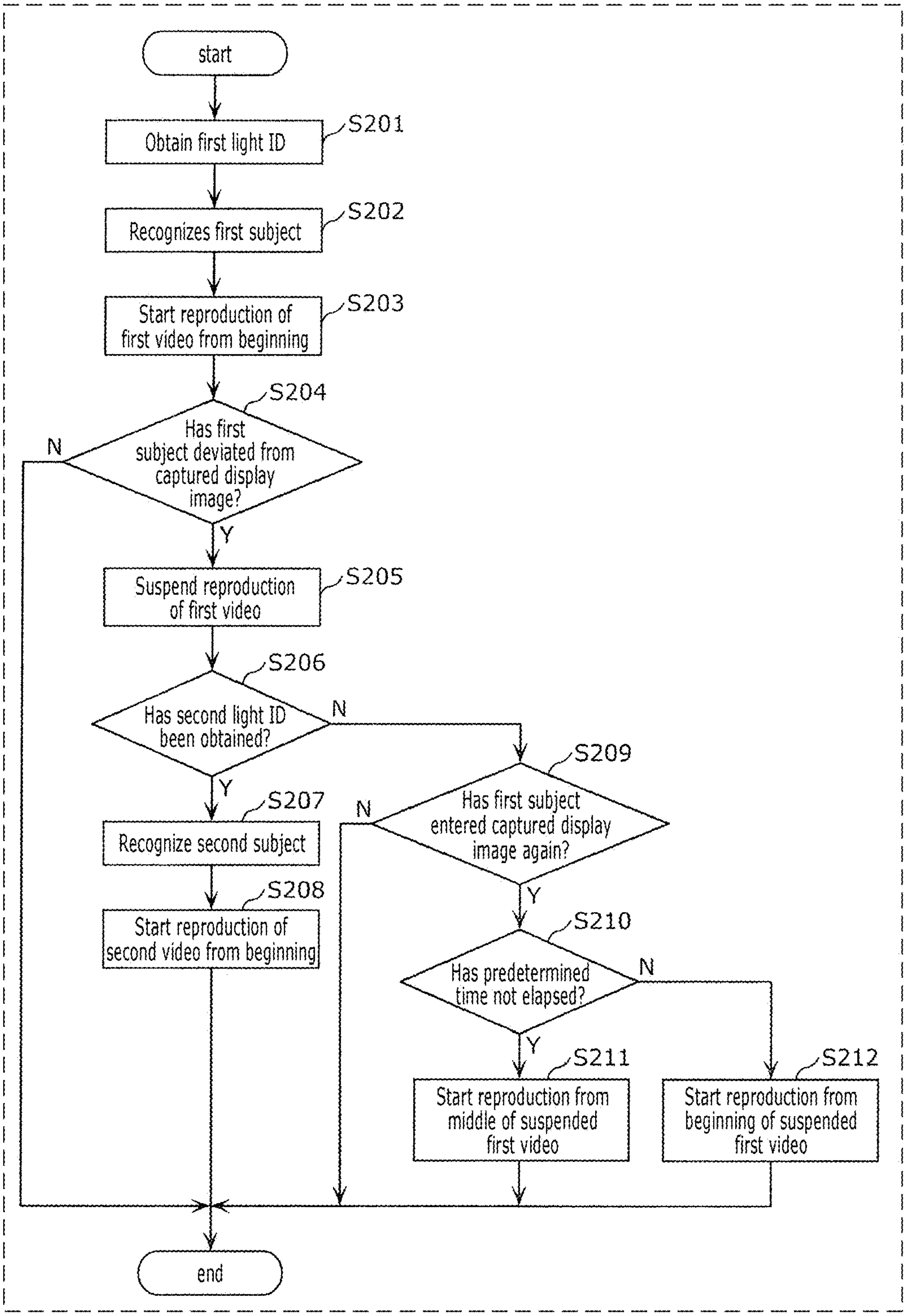
Figure 272:
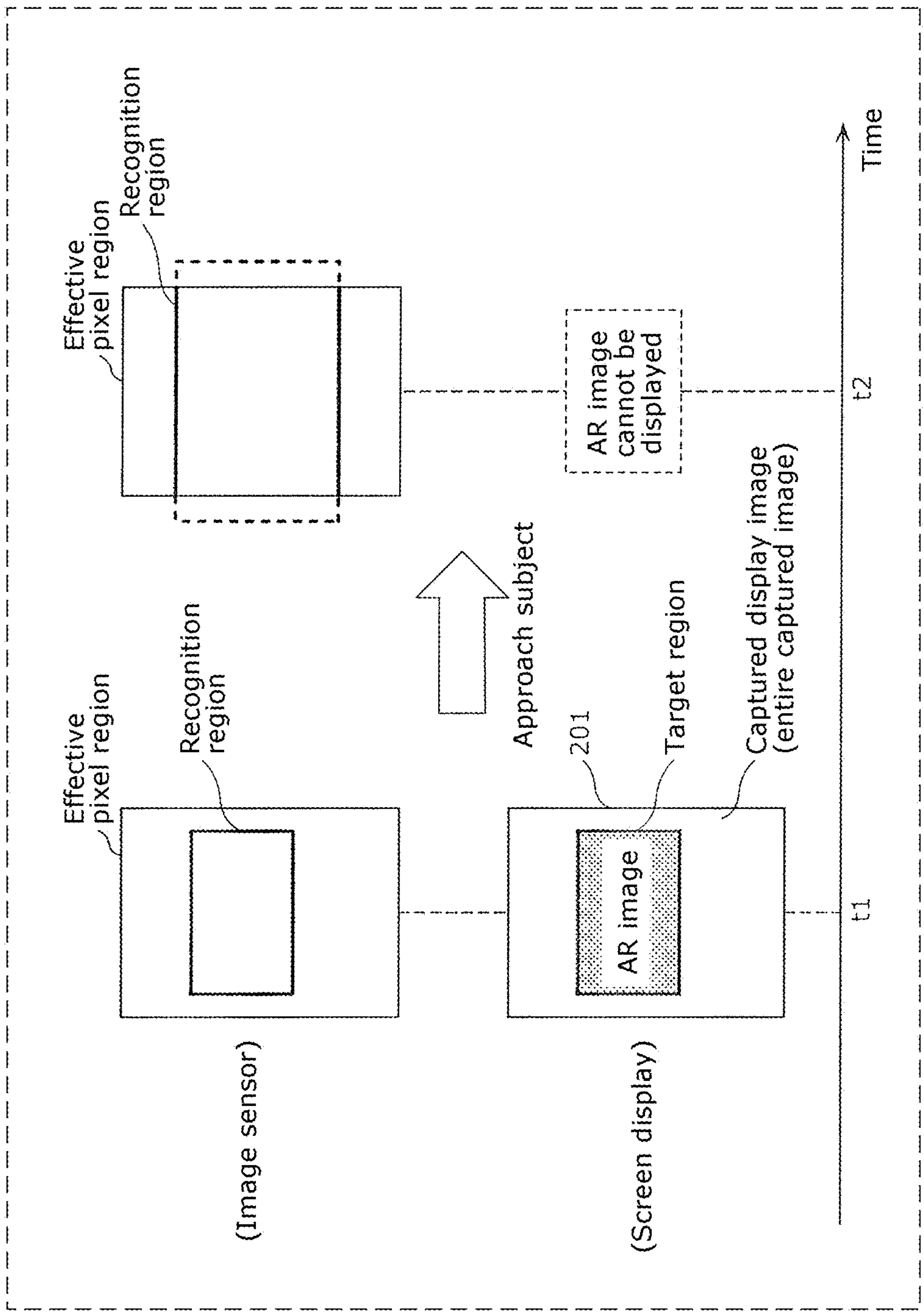
Figure 273:
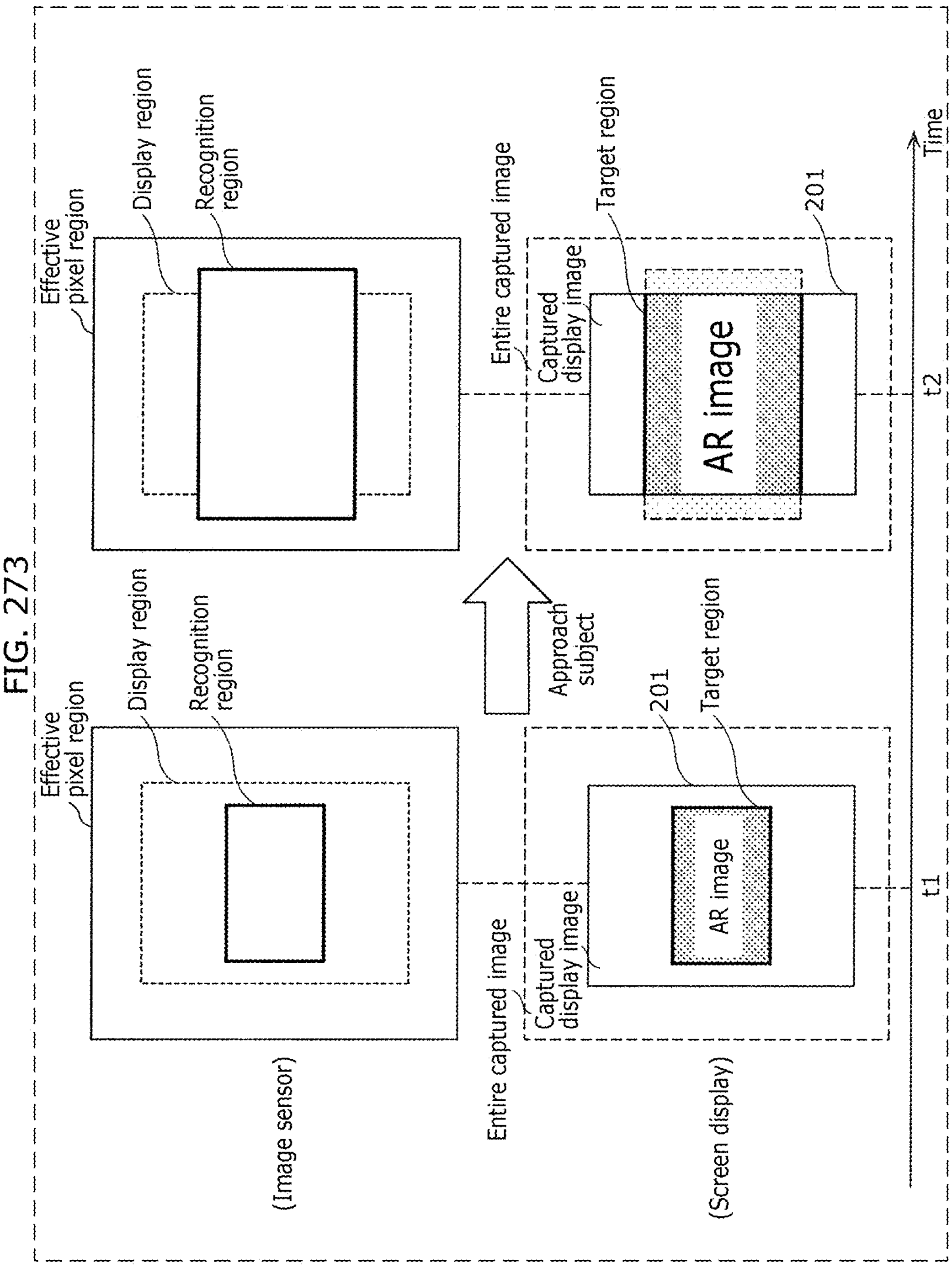
Figure 274:
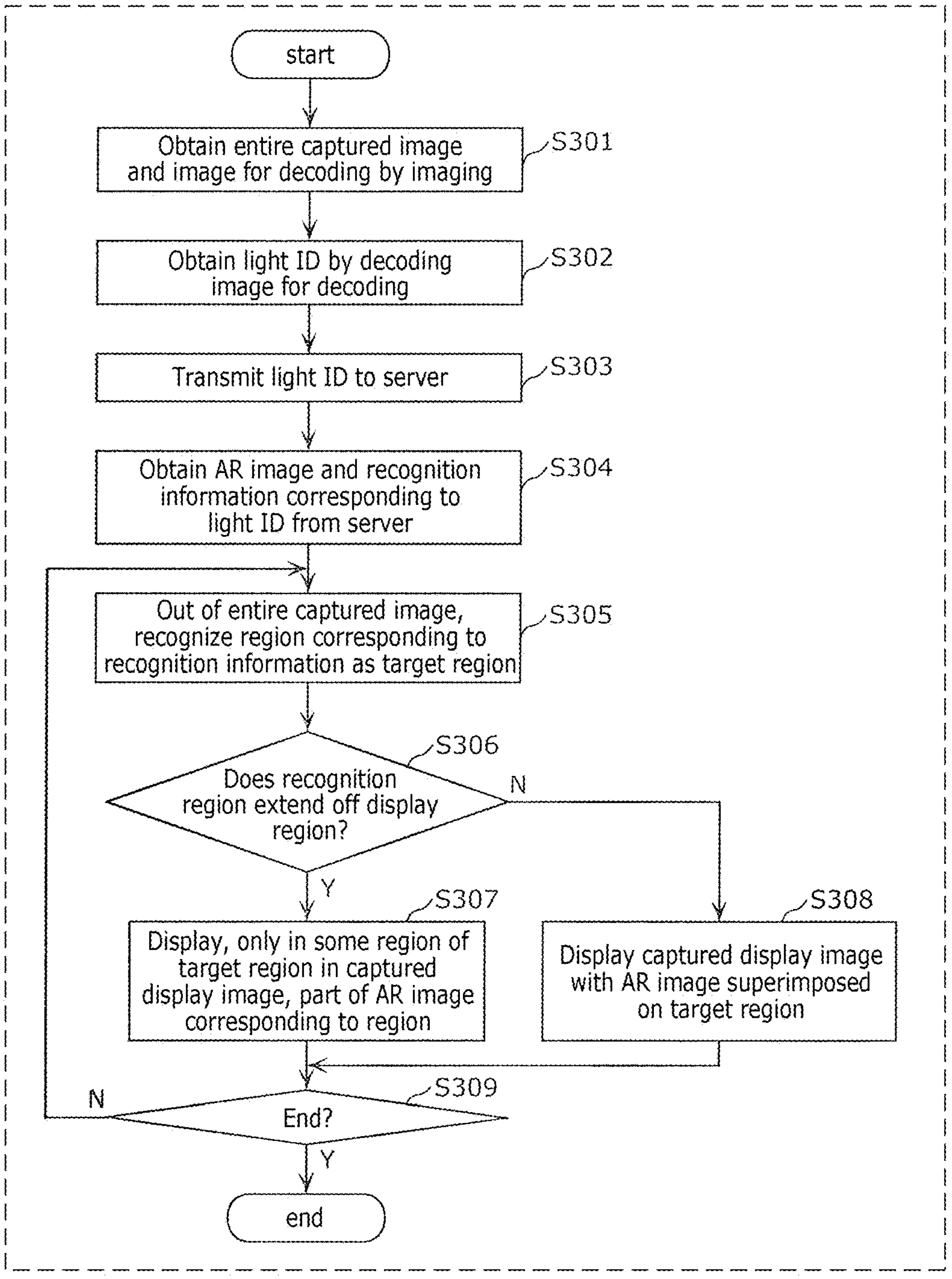
Figure 275:
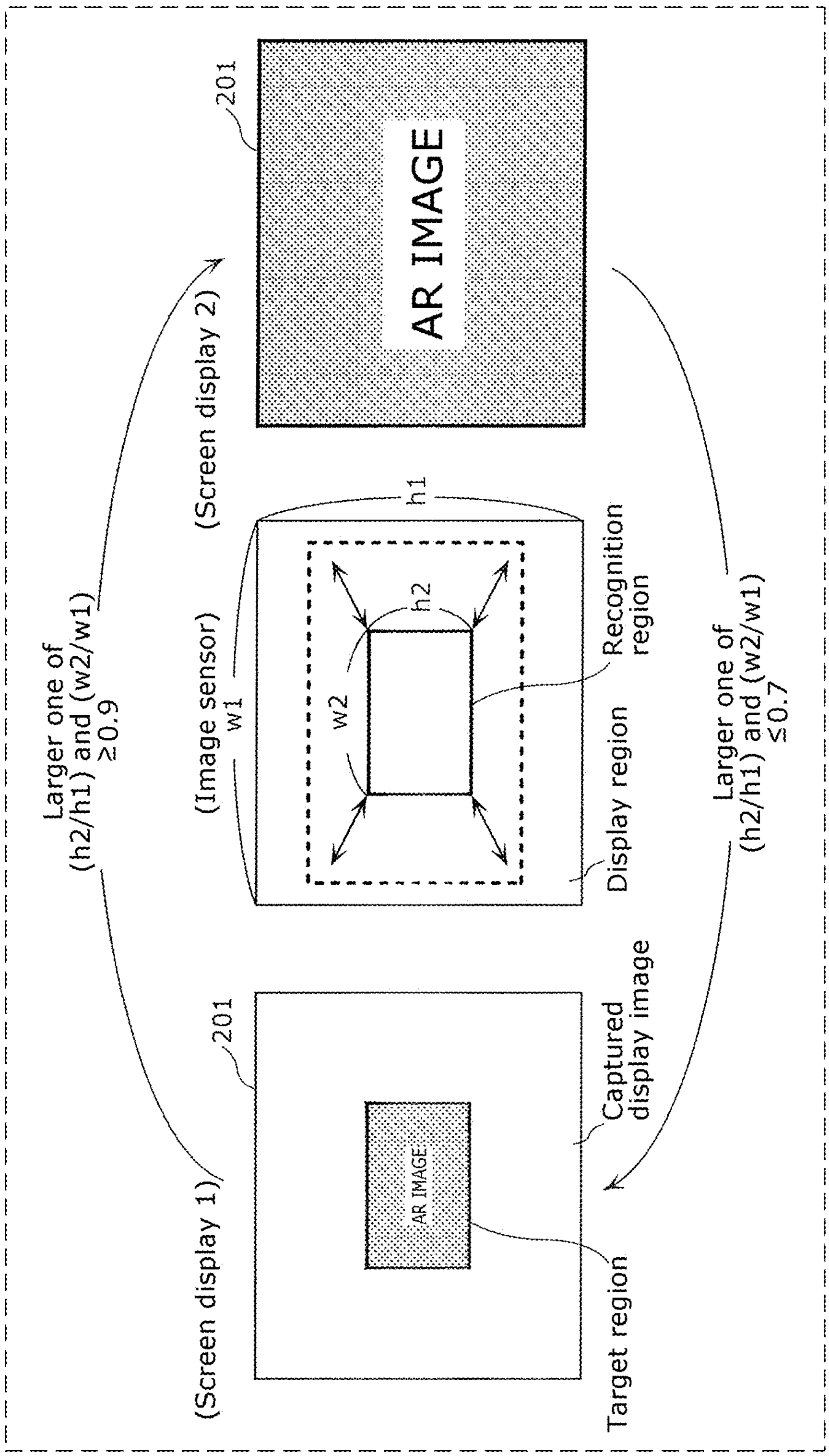
Figure 276:
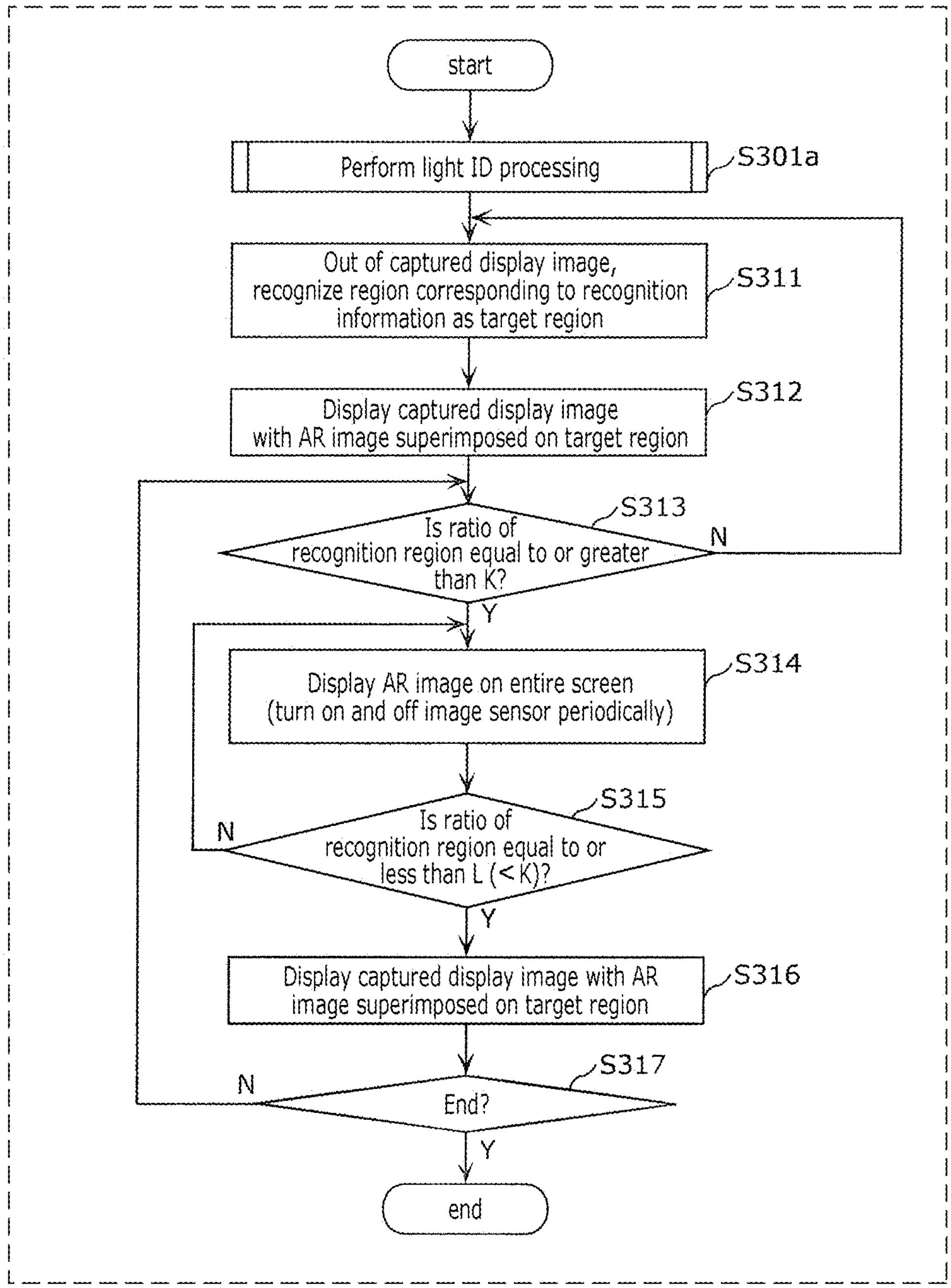
Figure 277:
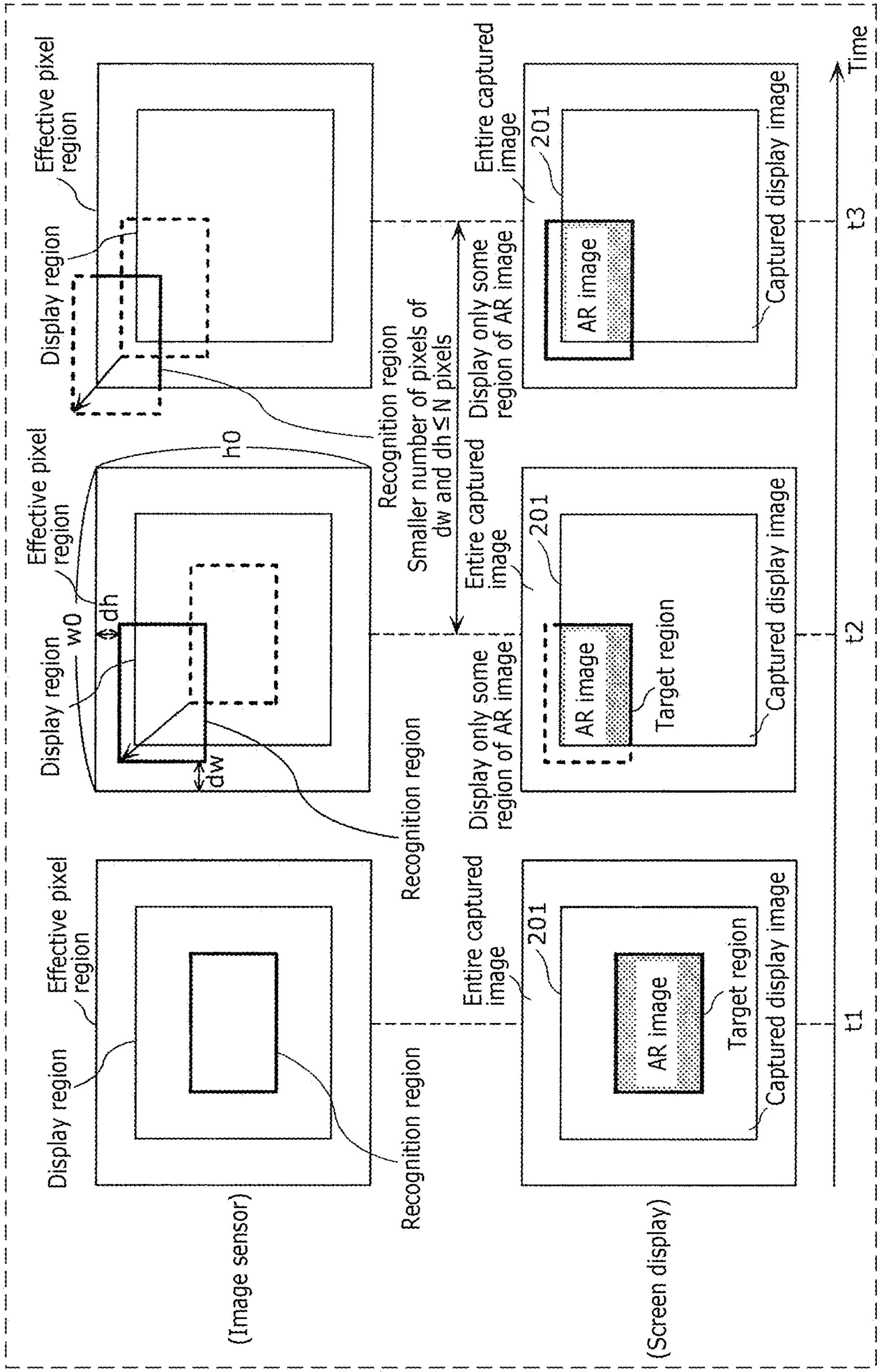
Figure 278:
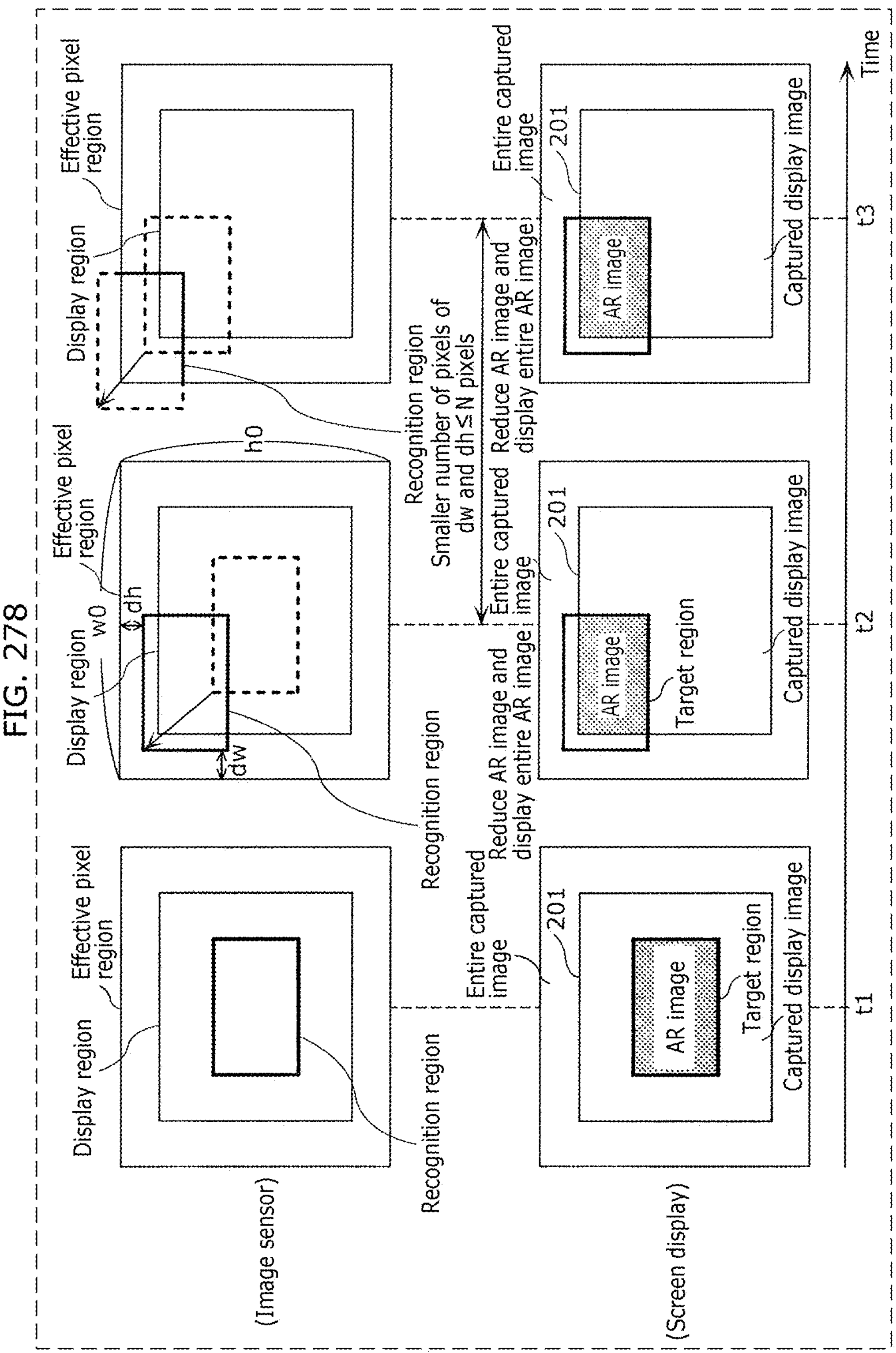
Figure 279:
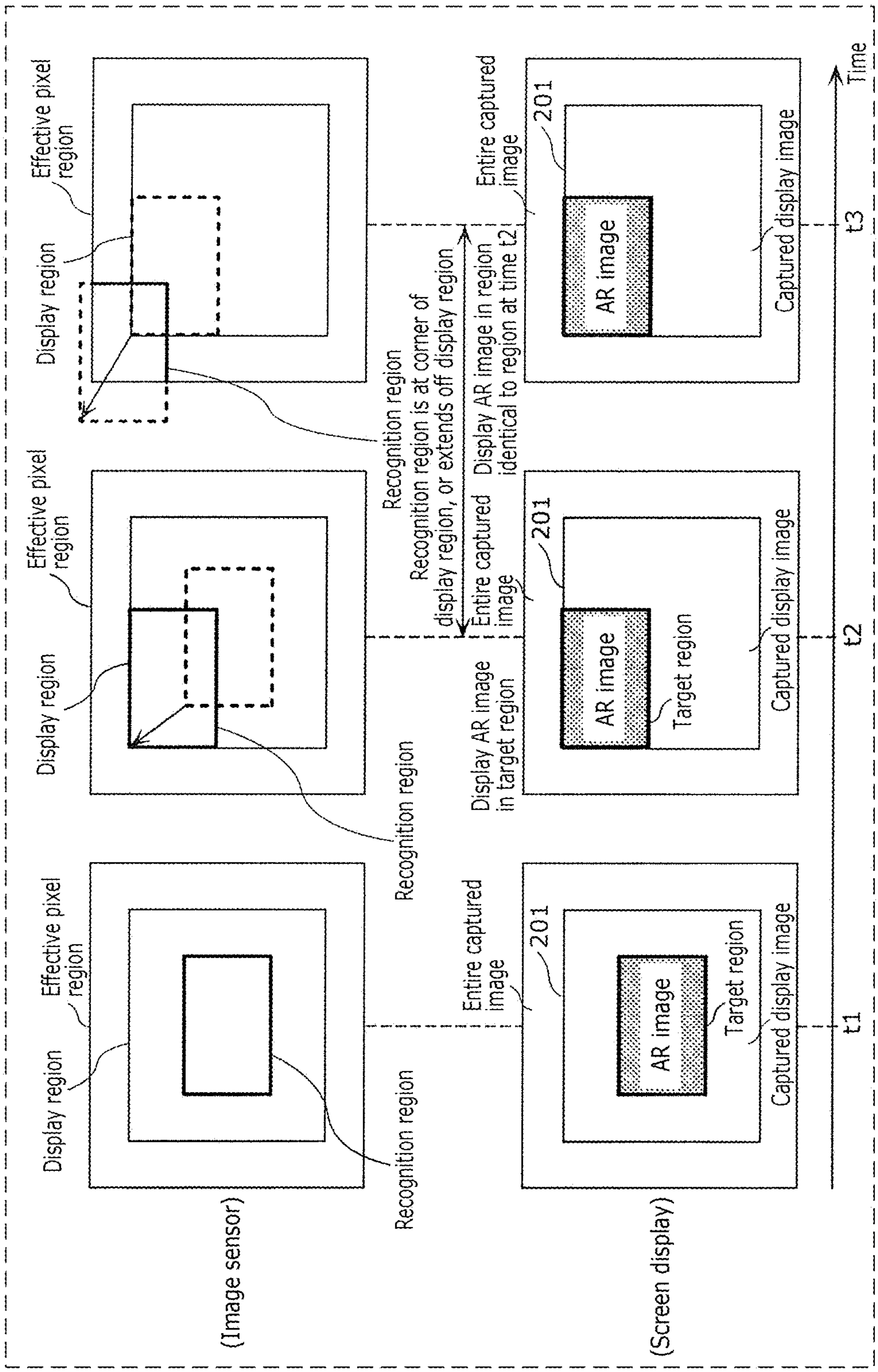
Figure 280:
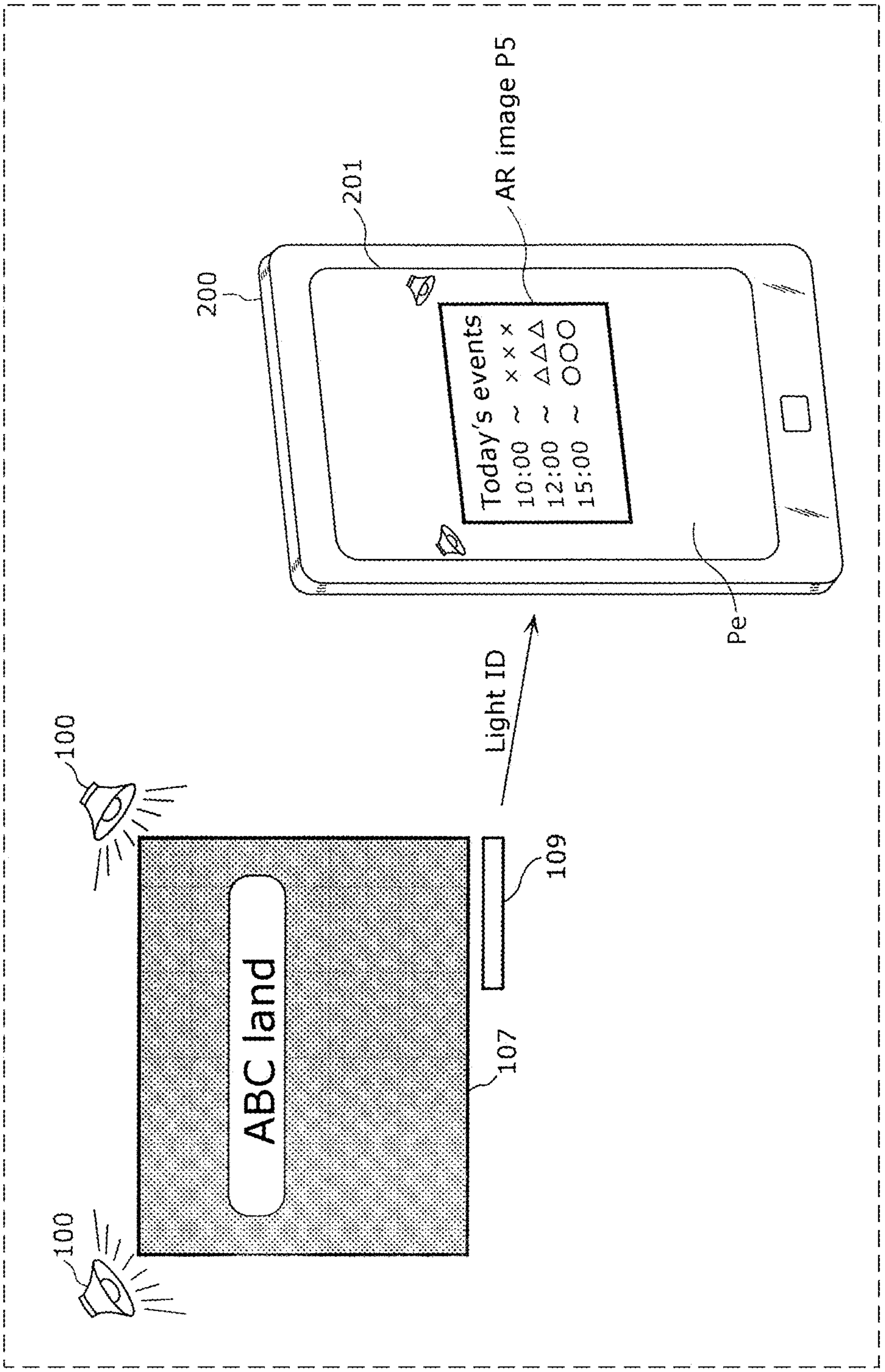
Figure 281B:
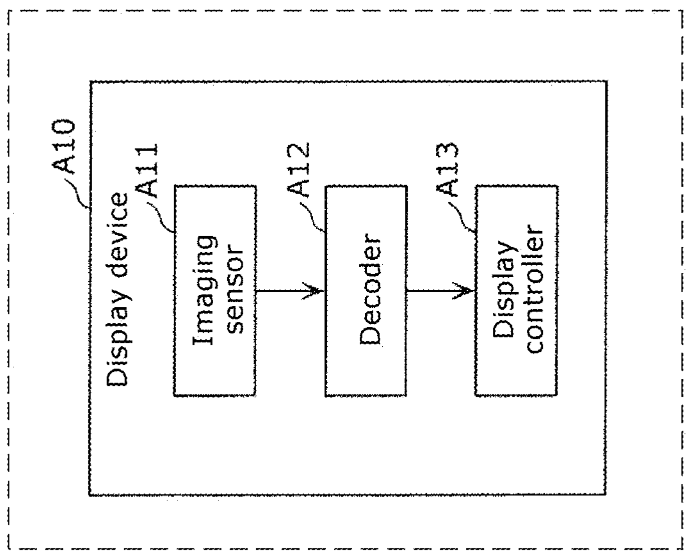
Figure 281A:
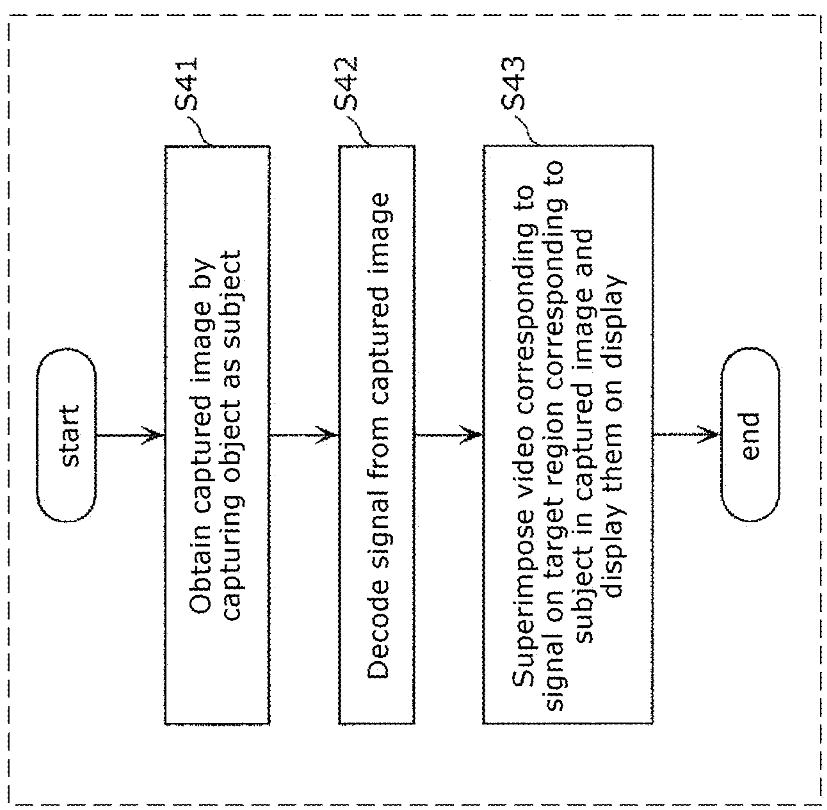
Figure 282:
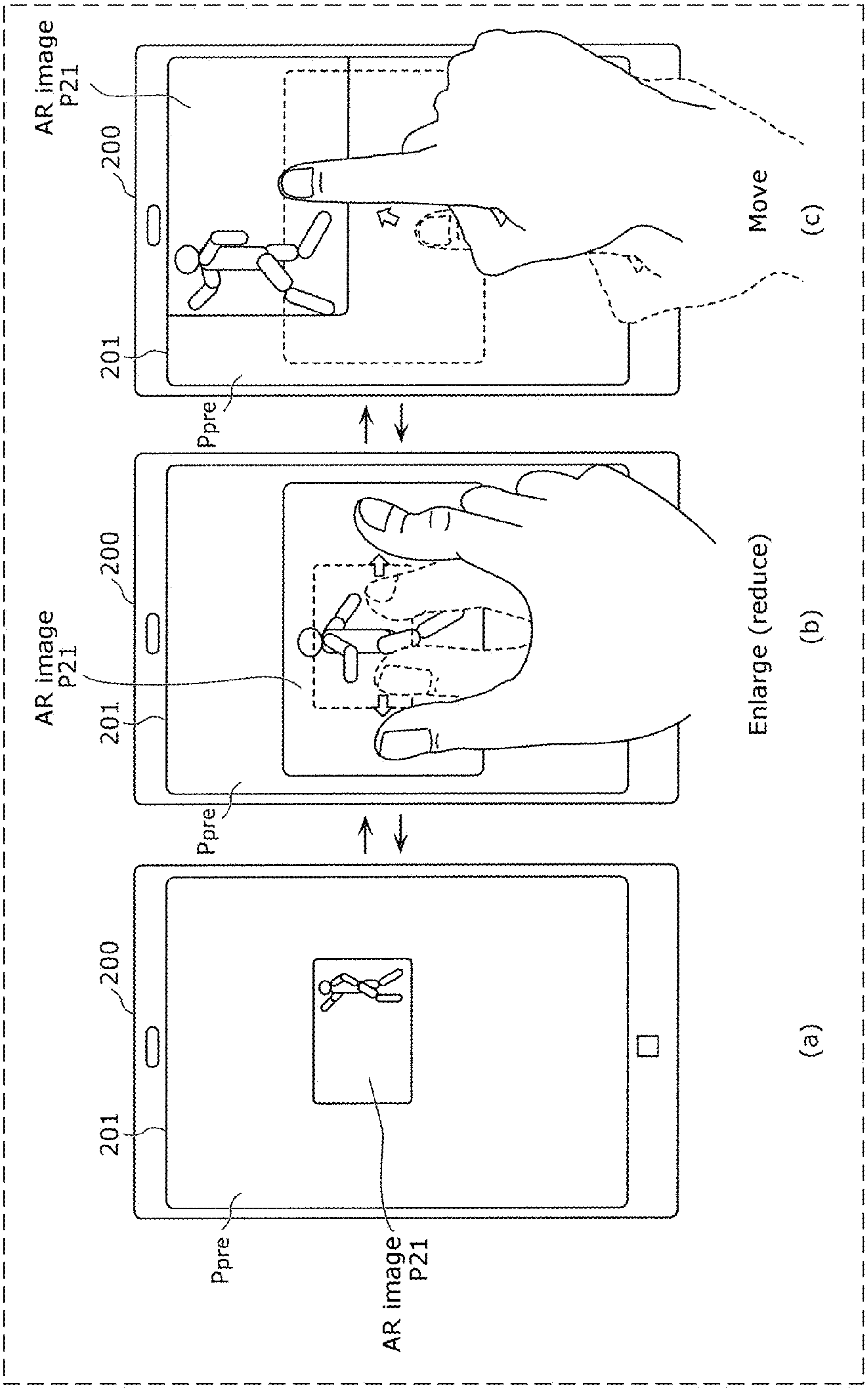
Figure 283:
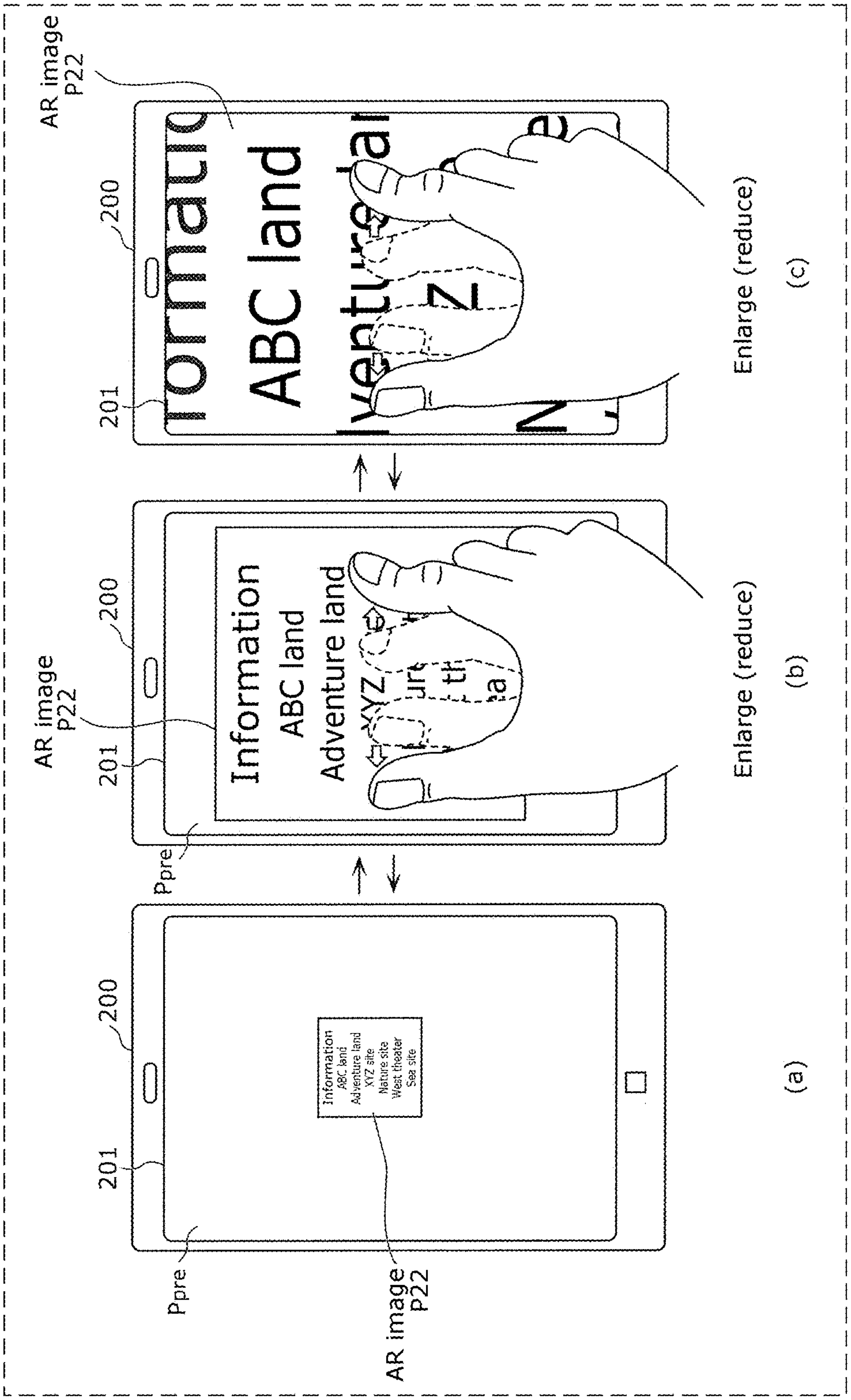
Figure 284:
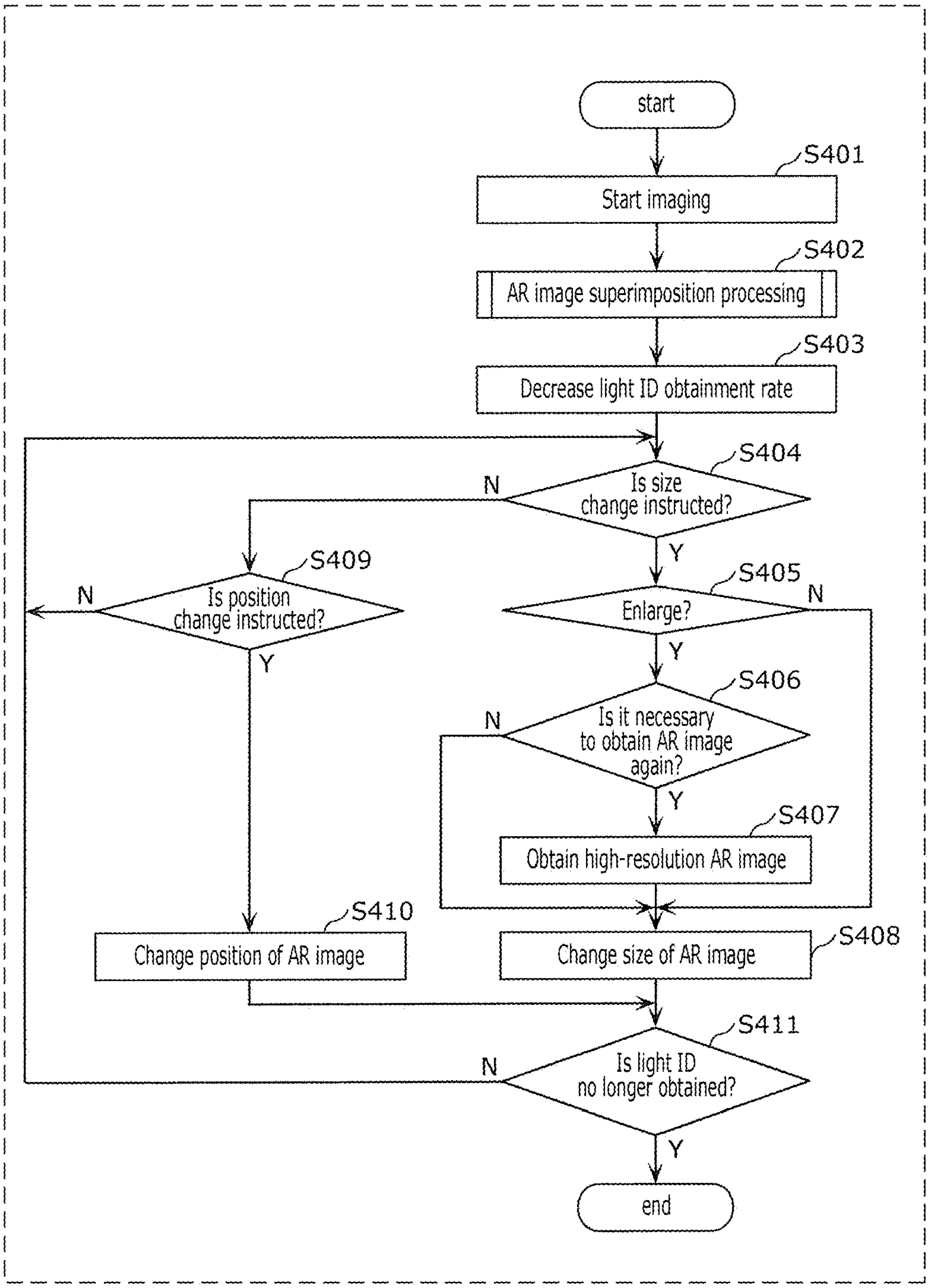
Figure 285:
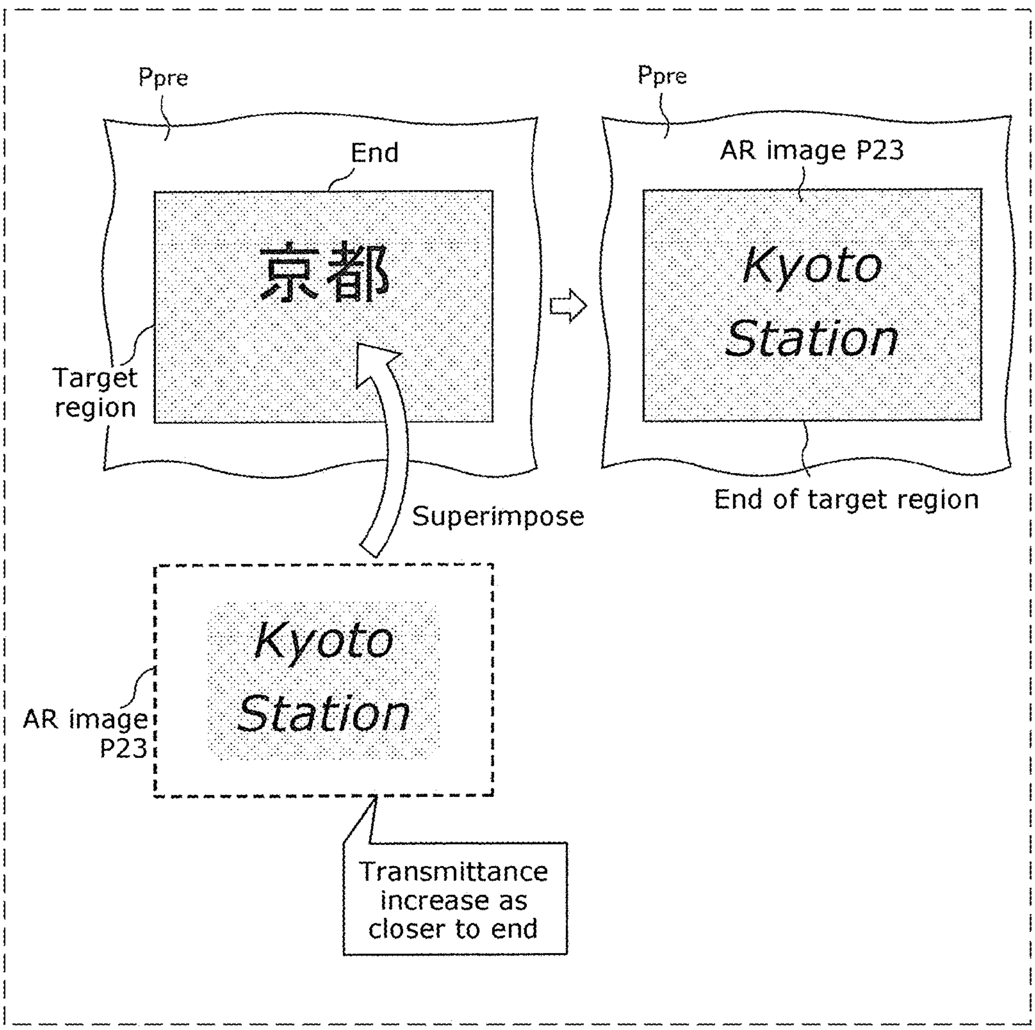
Figure 286:
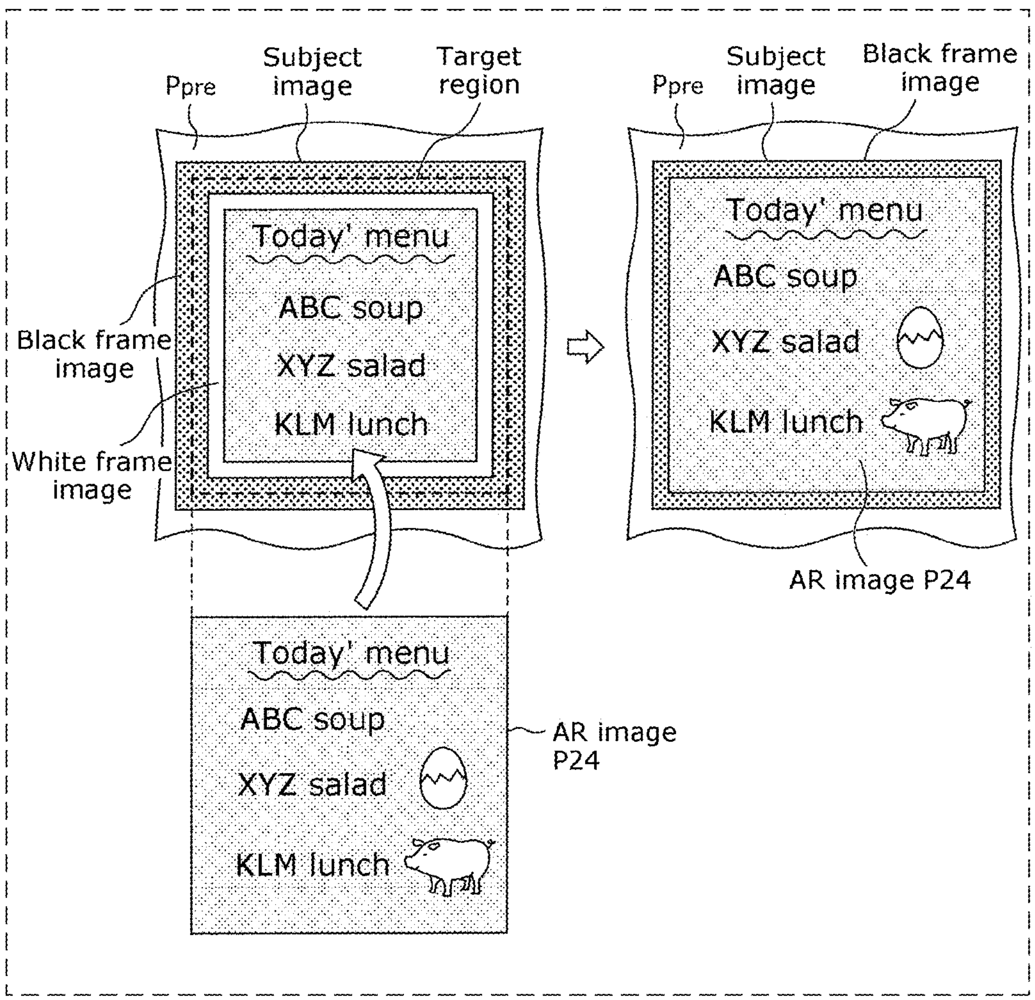
Figure 287:
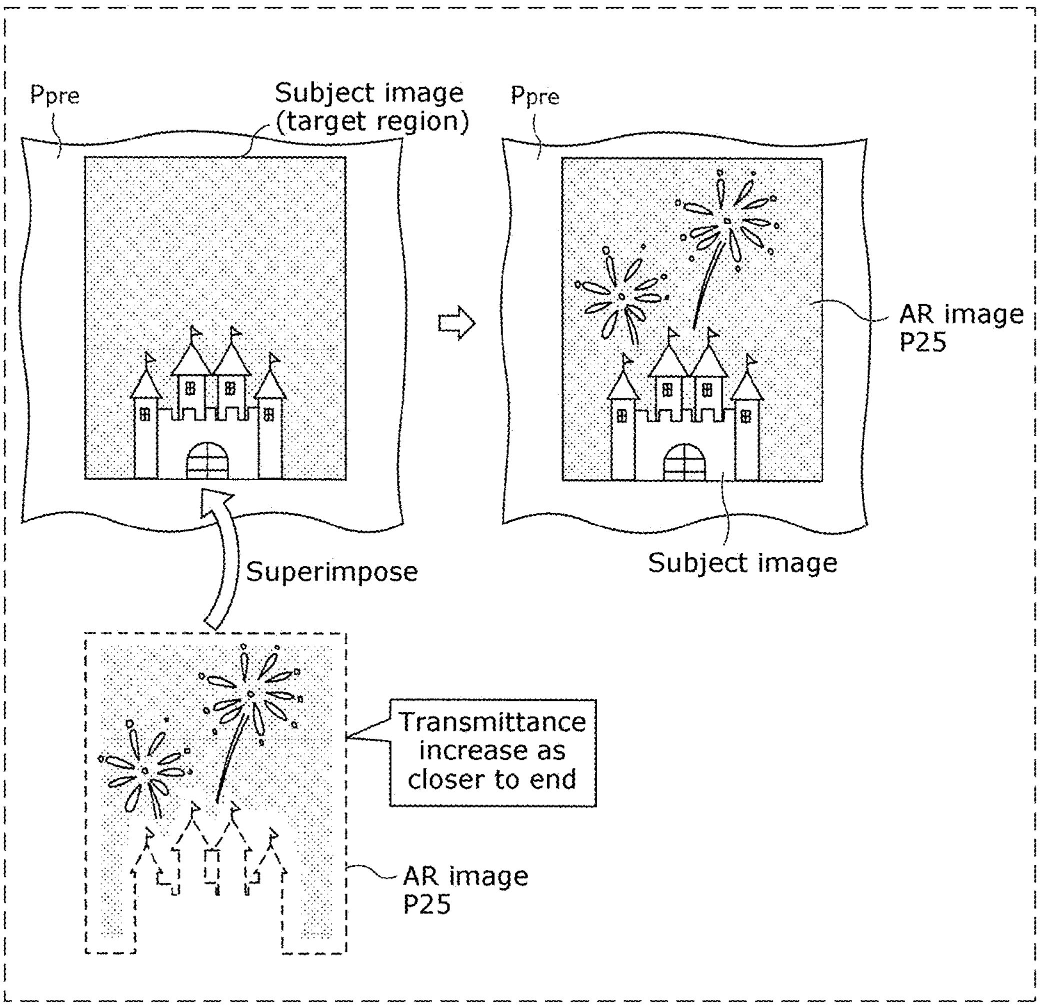
Figure 288:
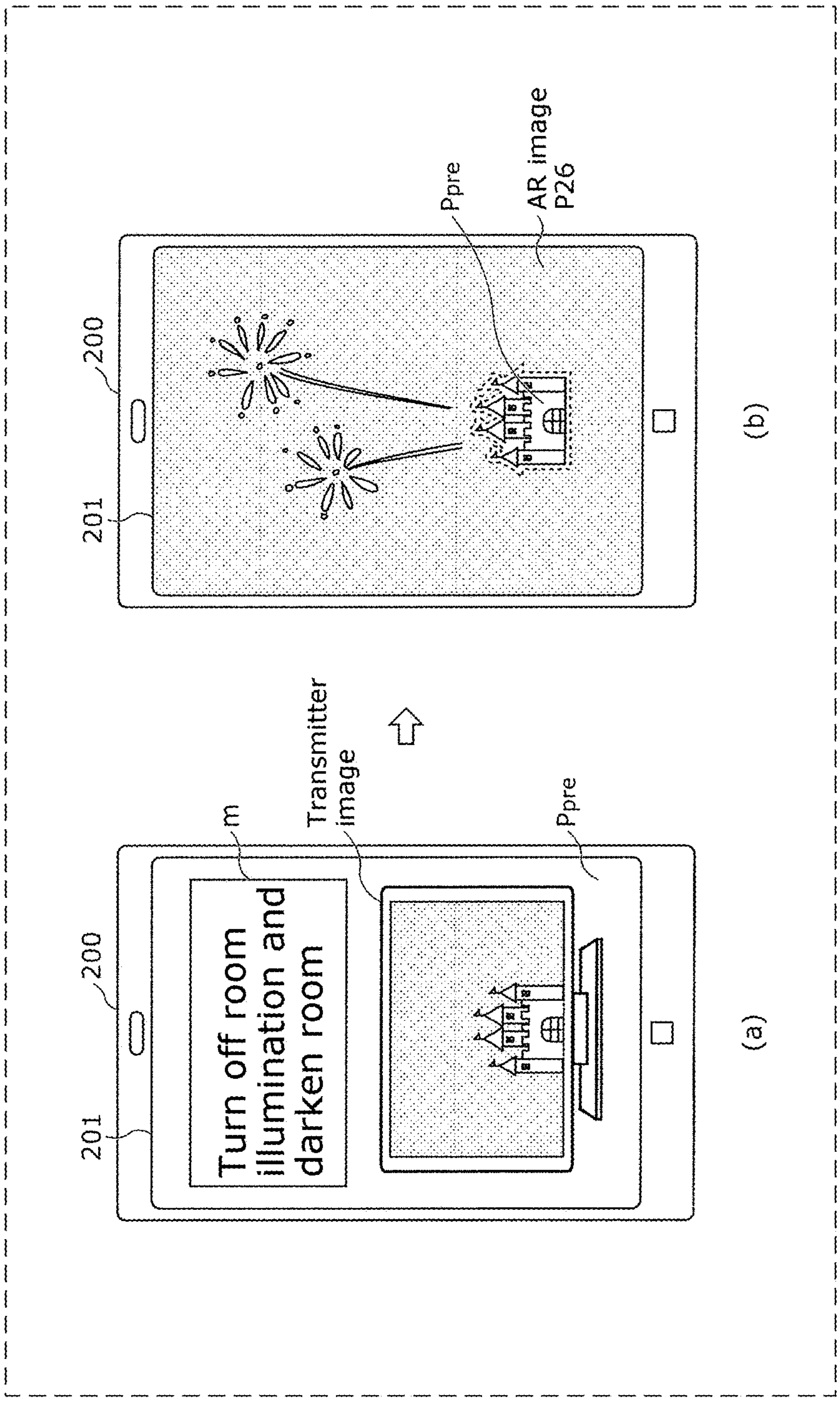
Figure 289A:
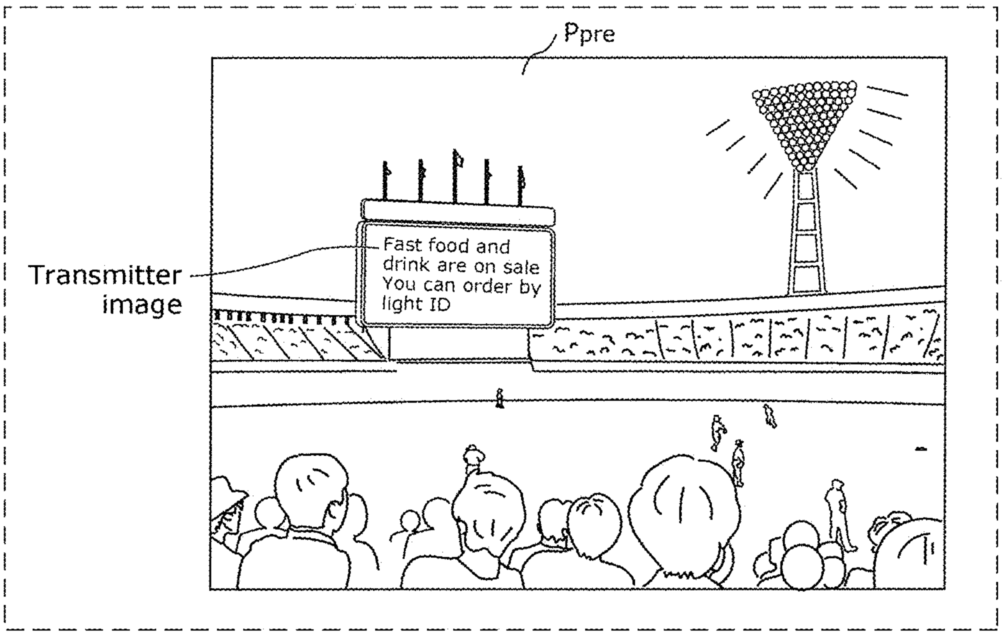
Figure 289B:
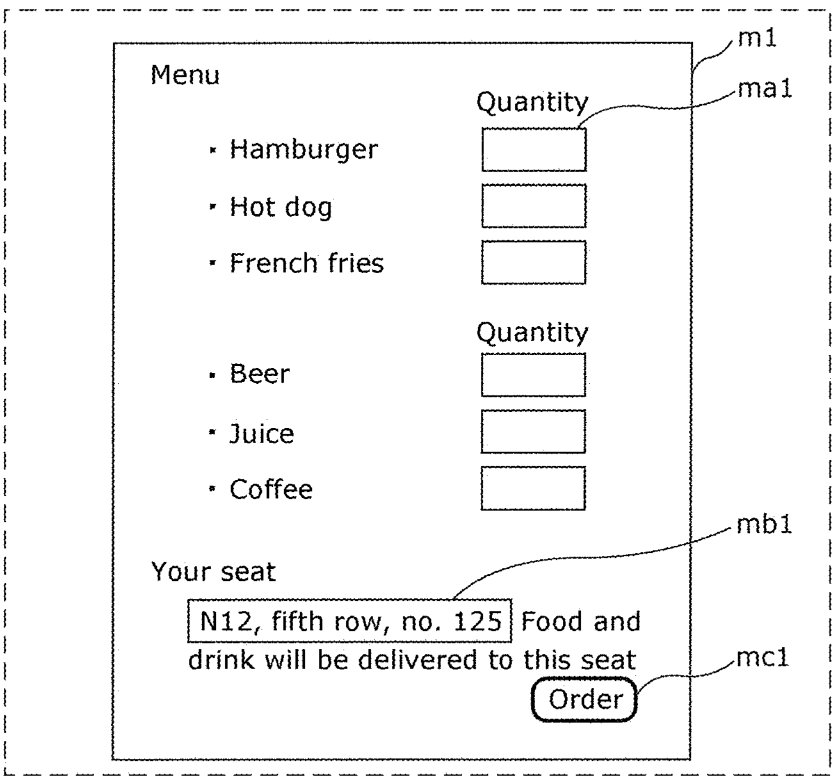
Figure 290:
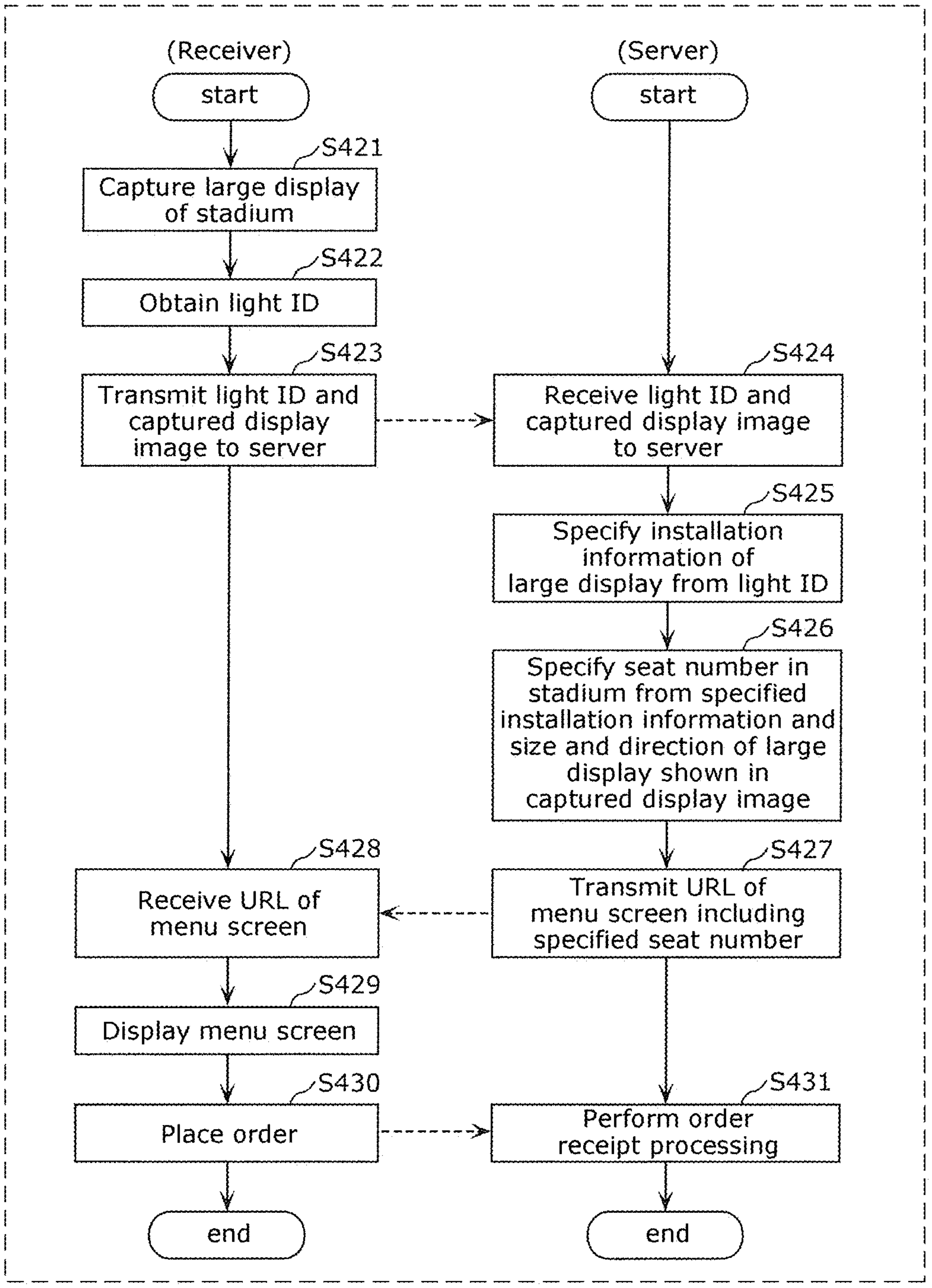
Figure 291:
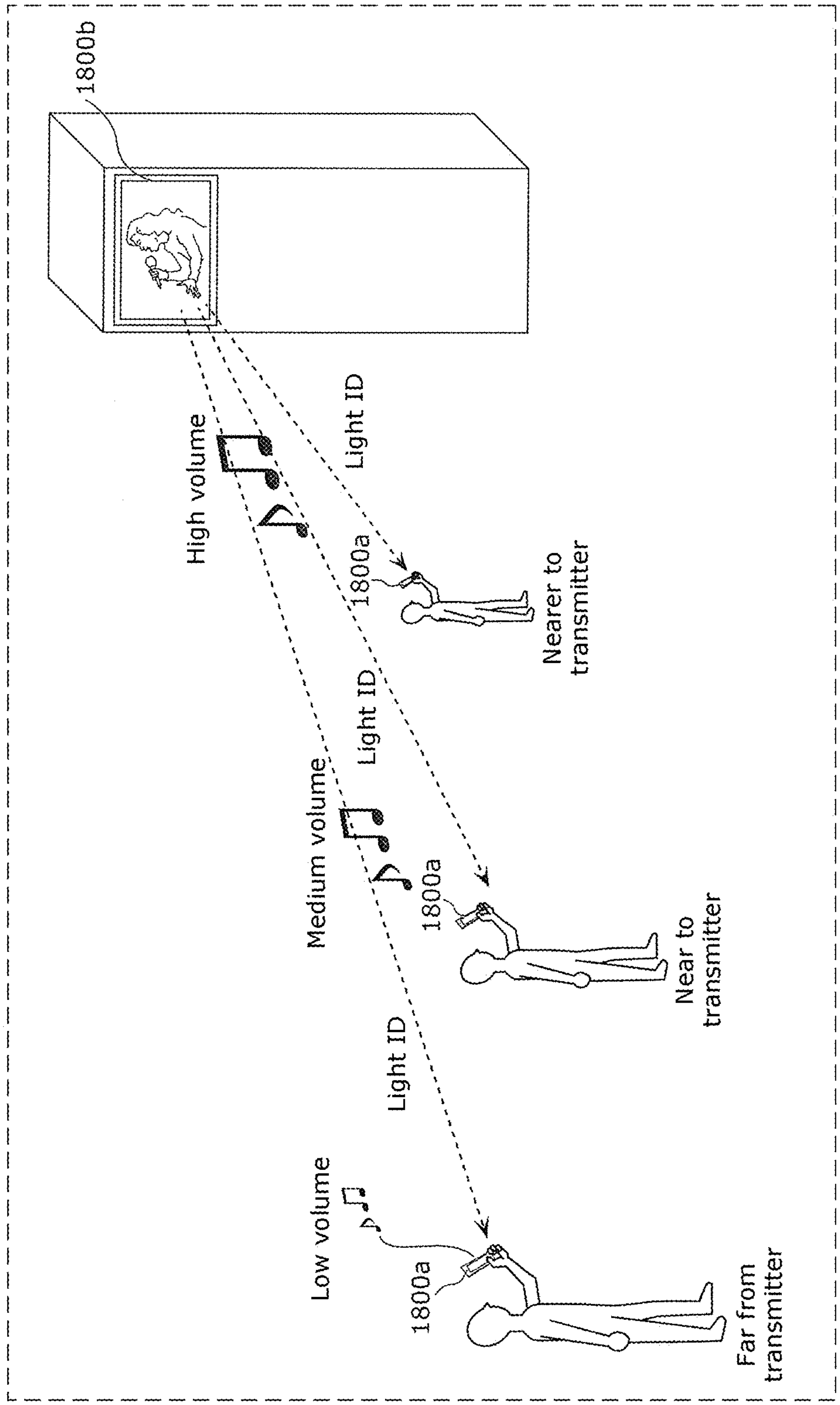
Figure 292:
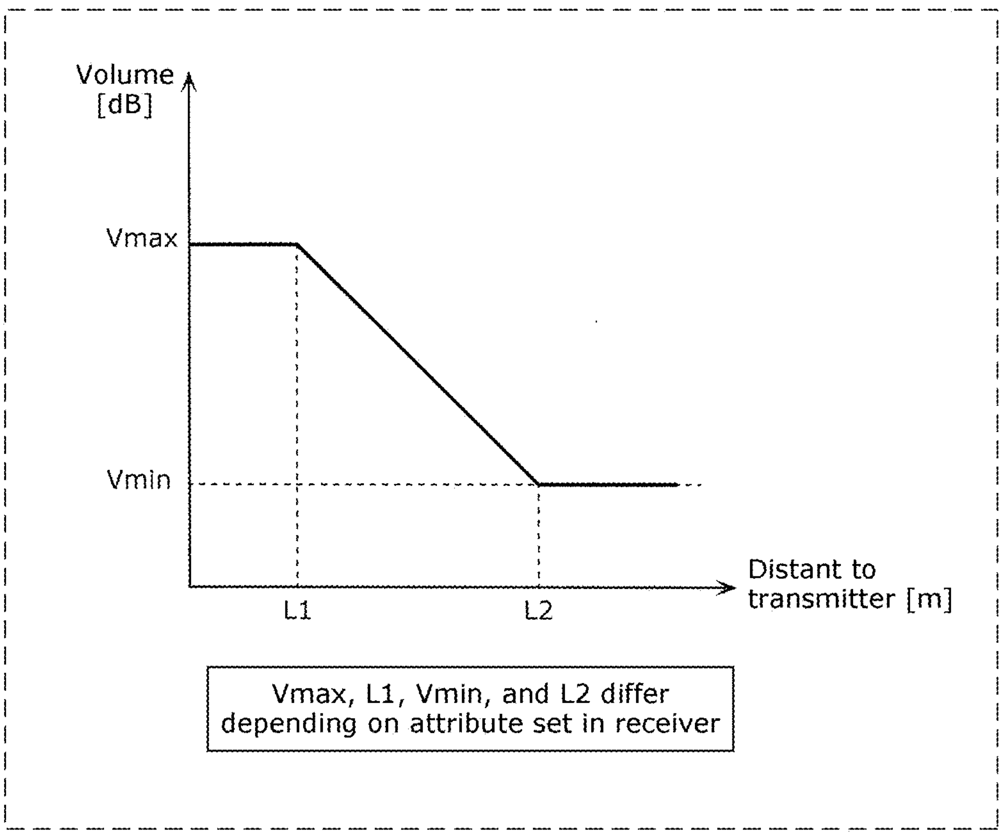
Figure 293:
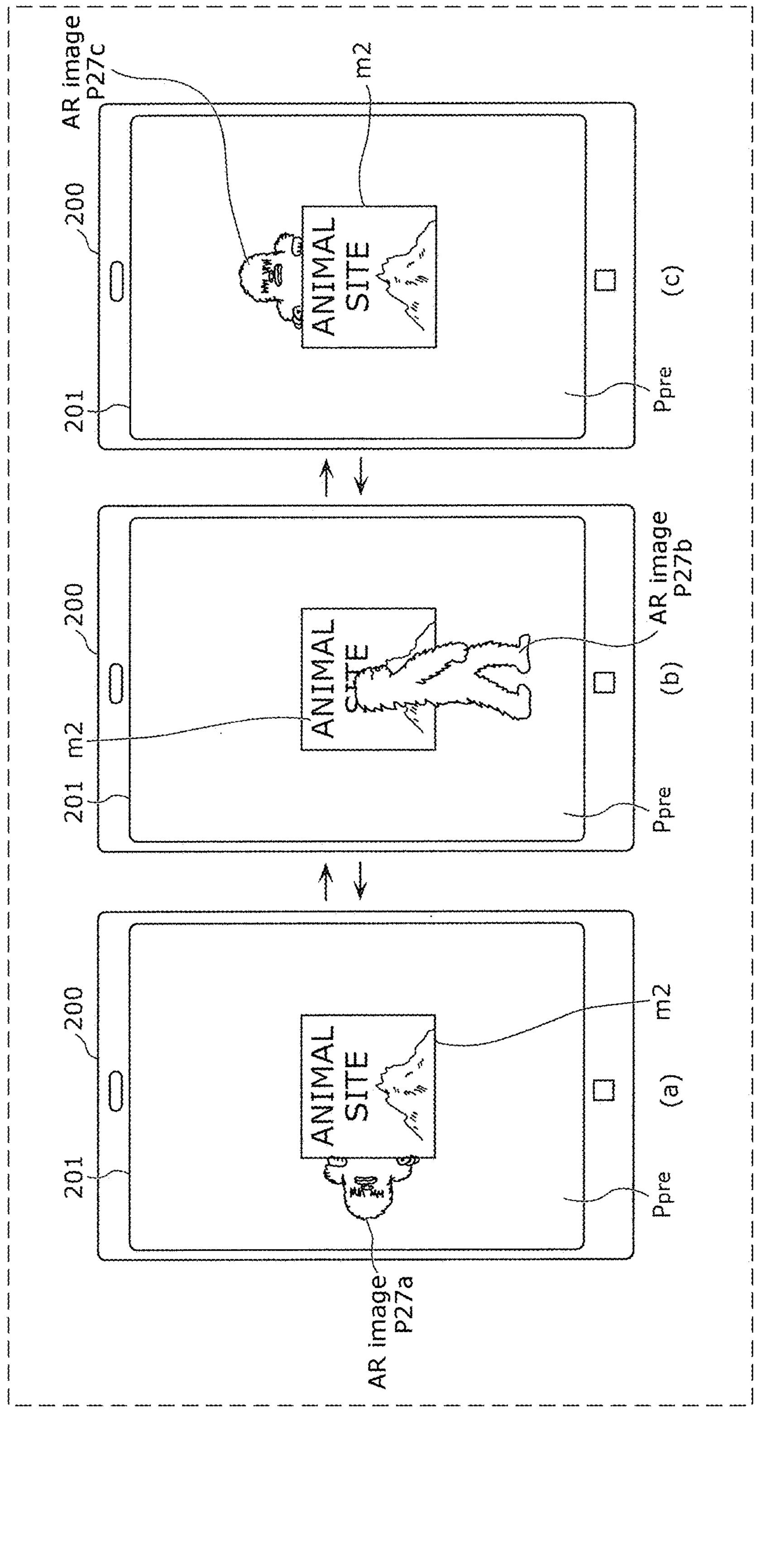
Figure 294:
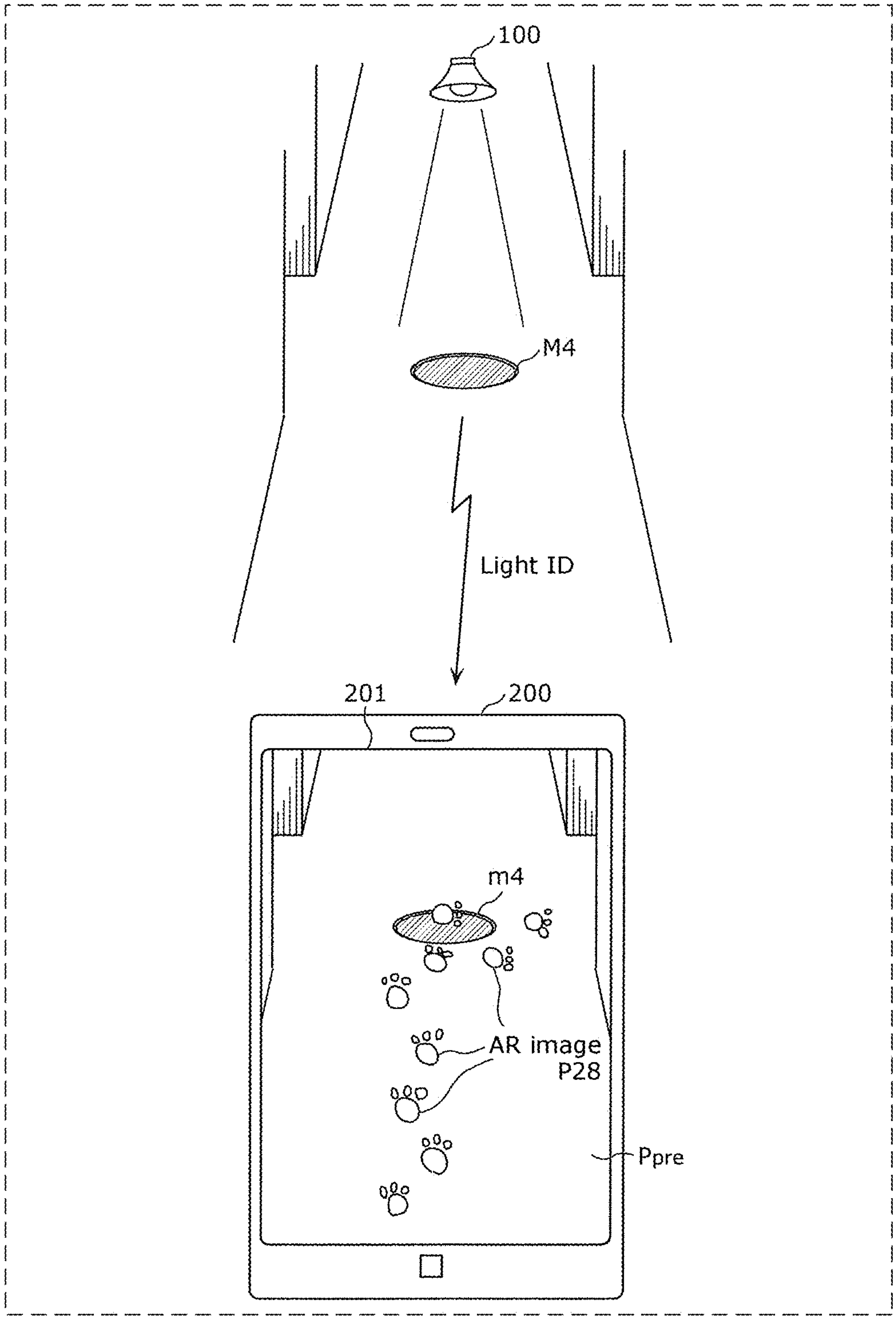
Figure 295:
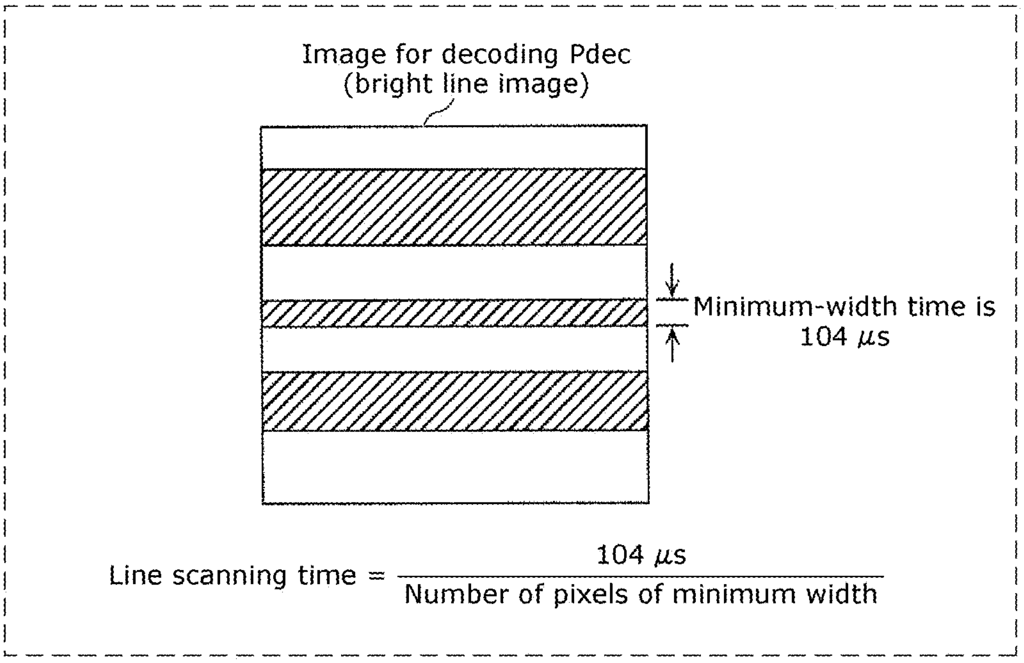
Figure 296:
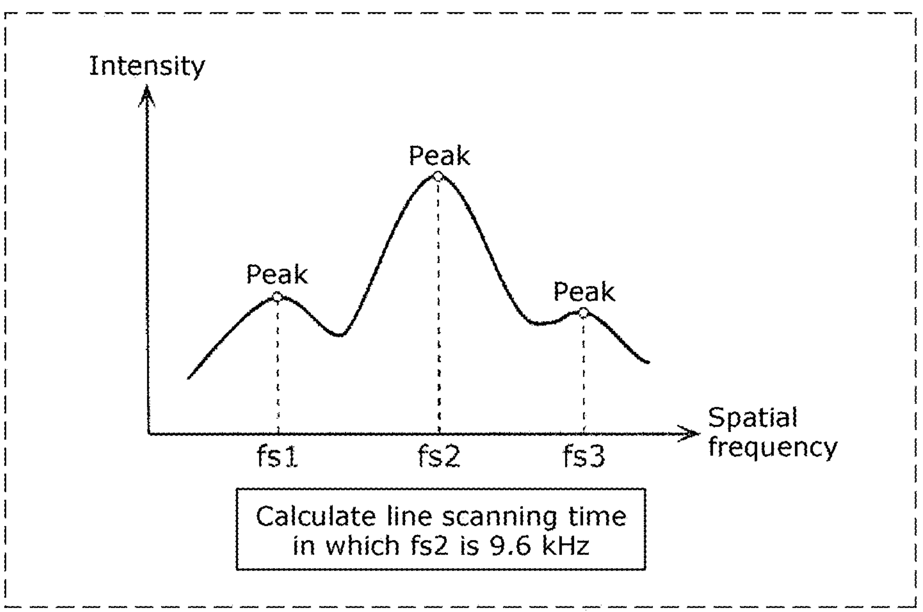
Figure 297:
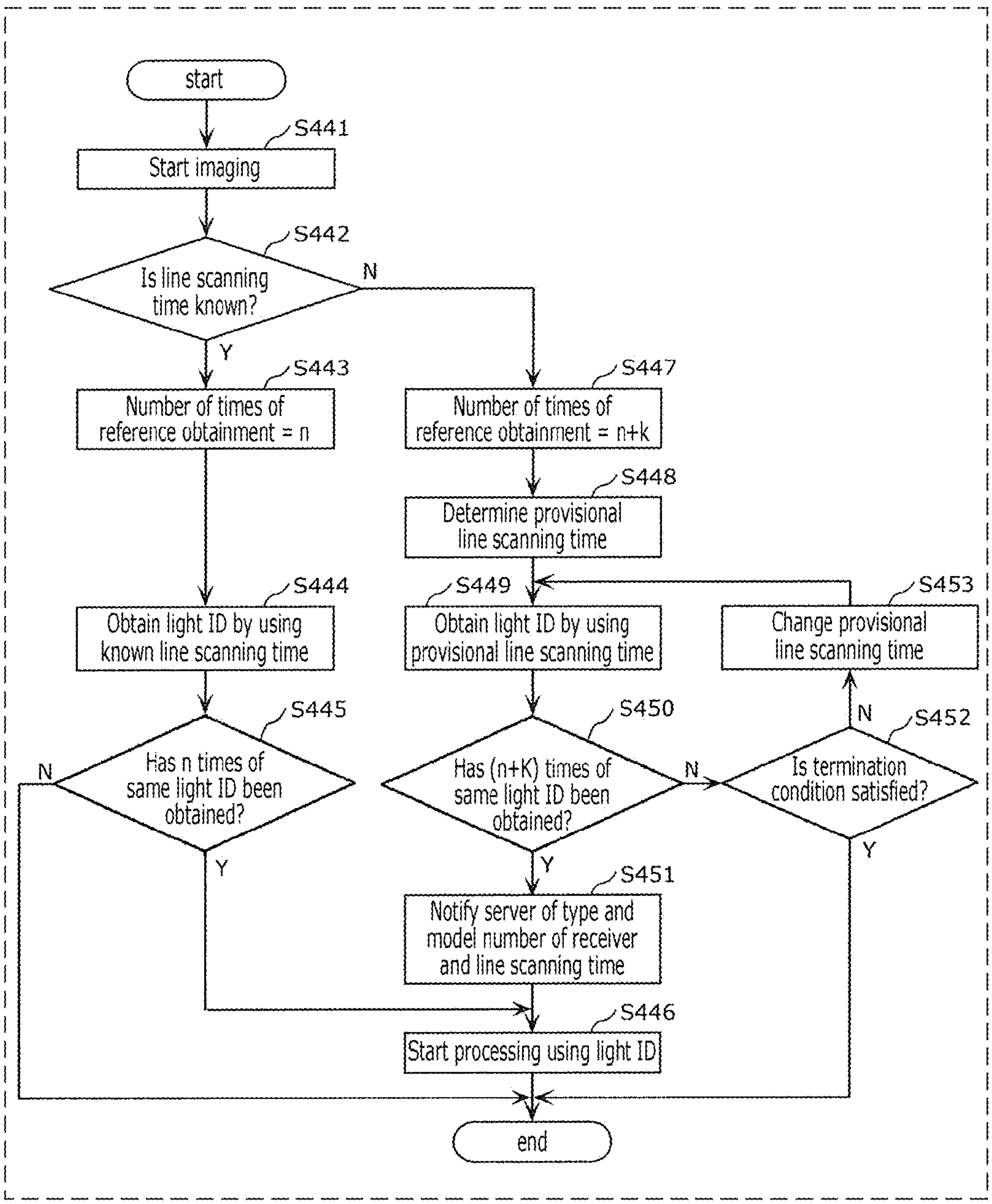
Figure 298:
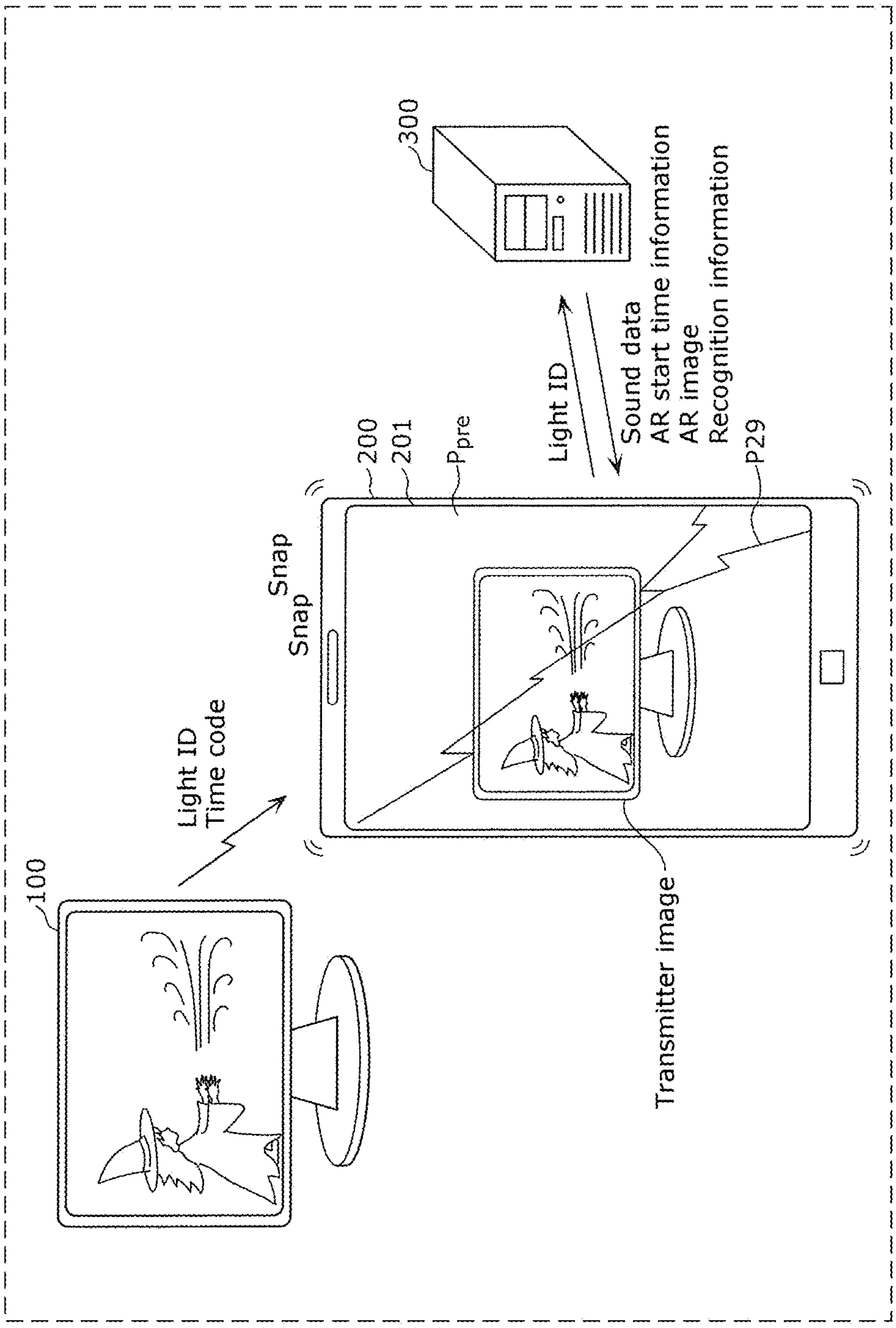
Figure 299:
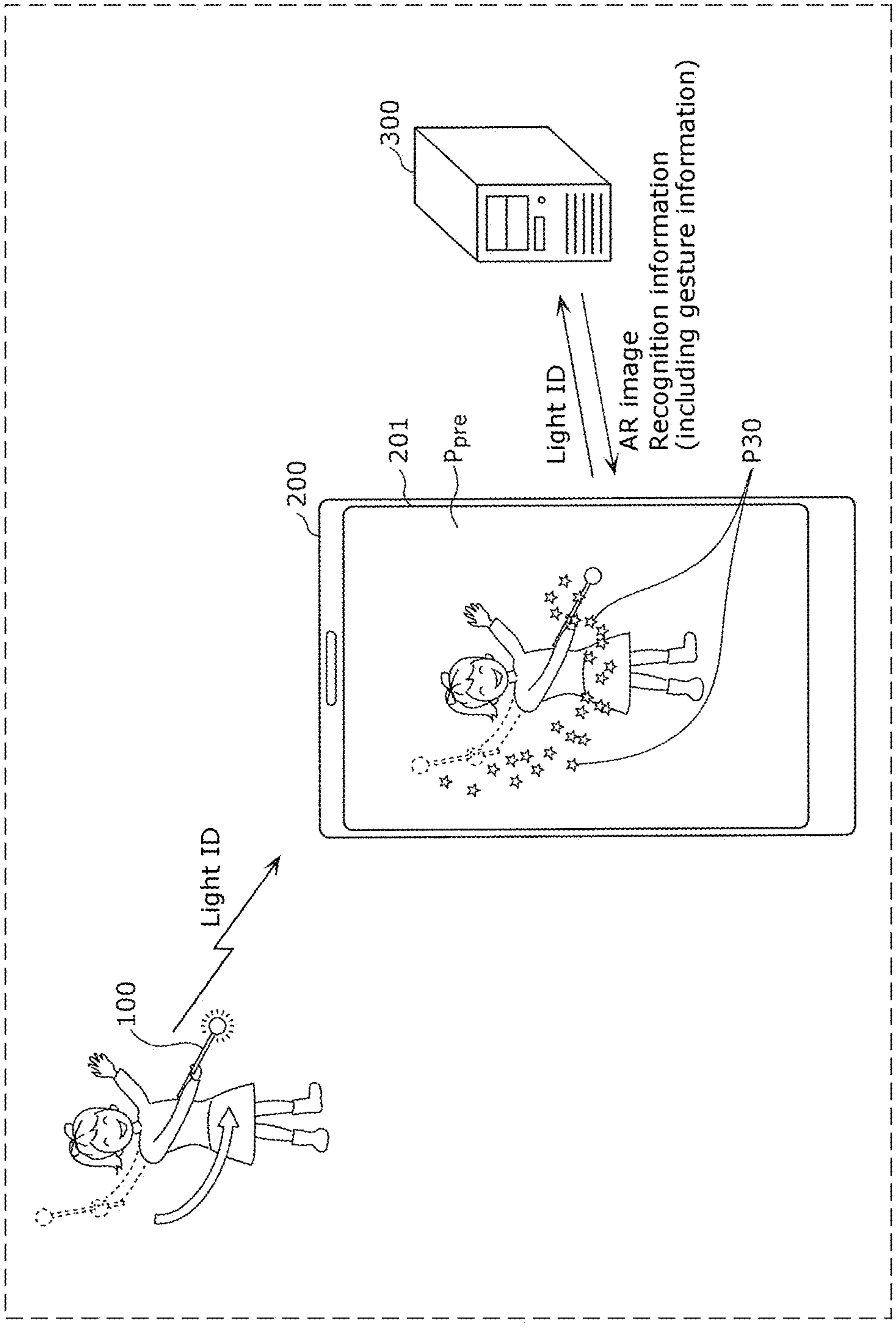
Figure 300:
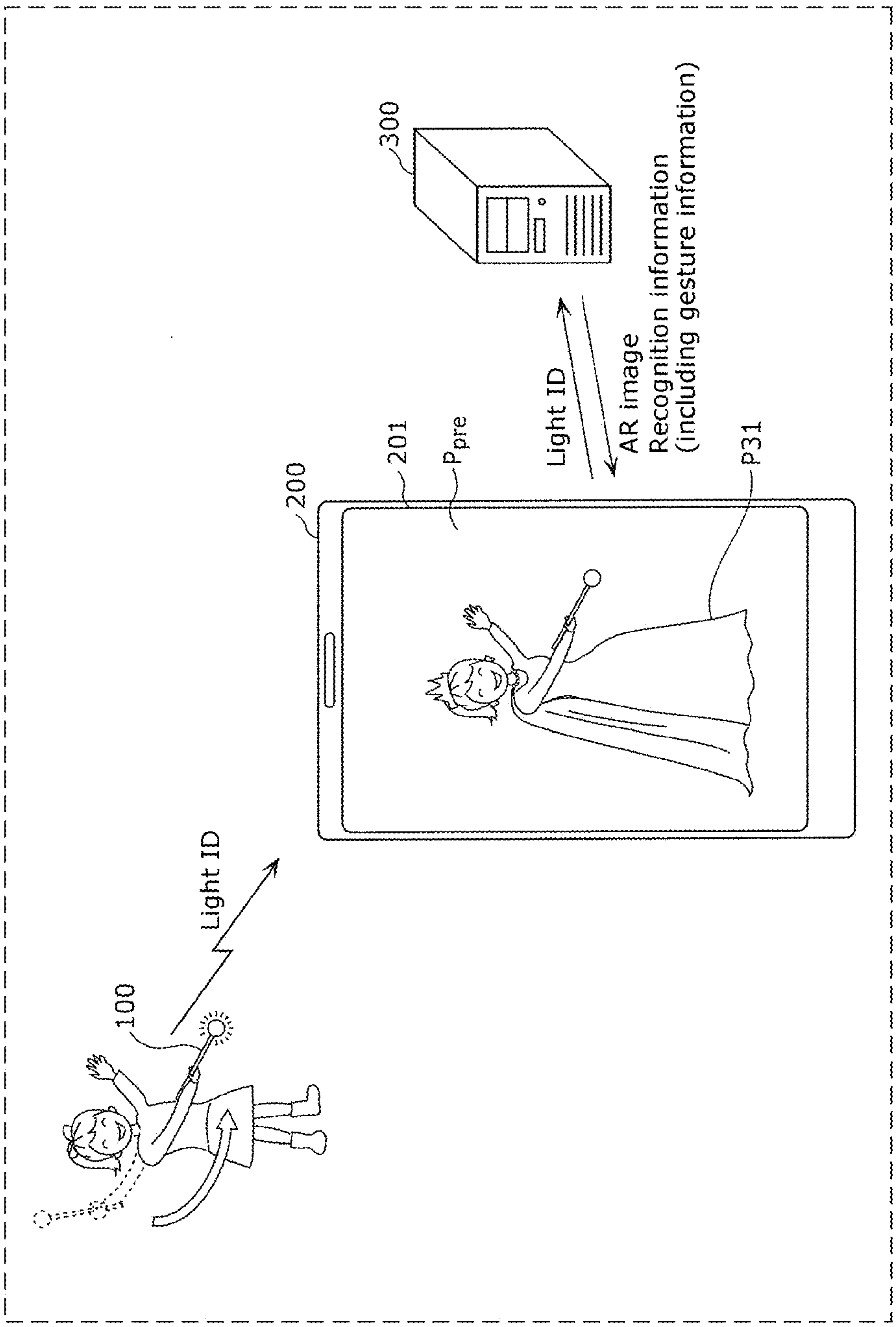
Figure 301:
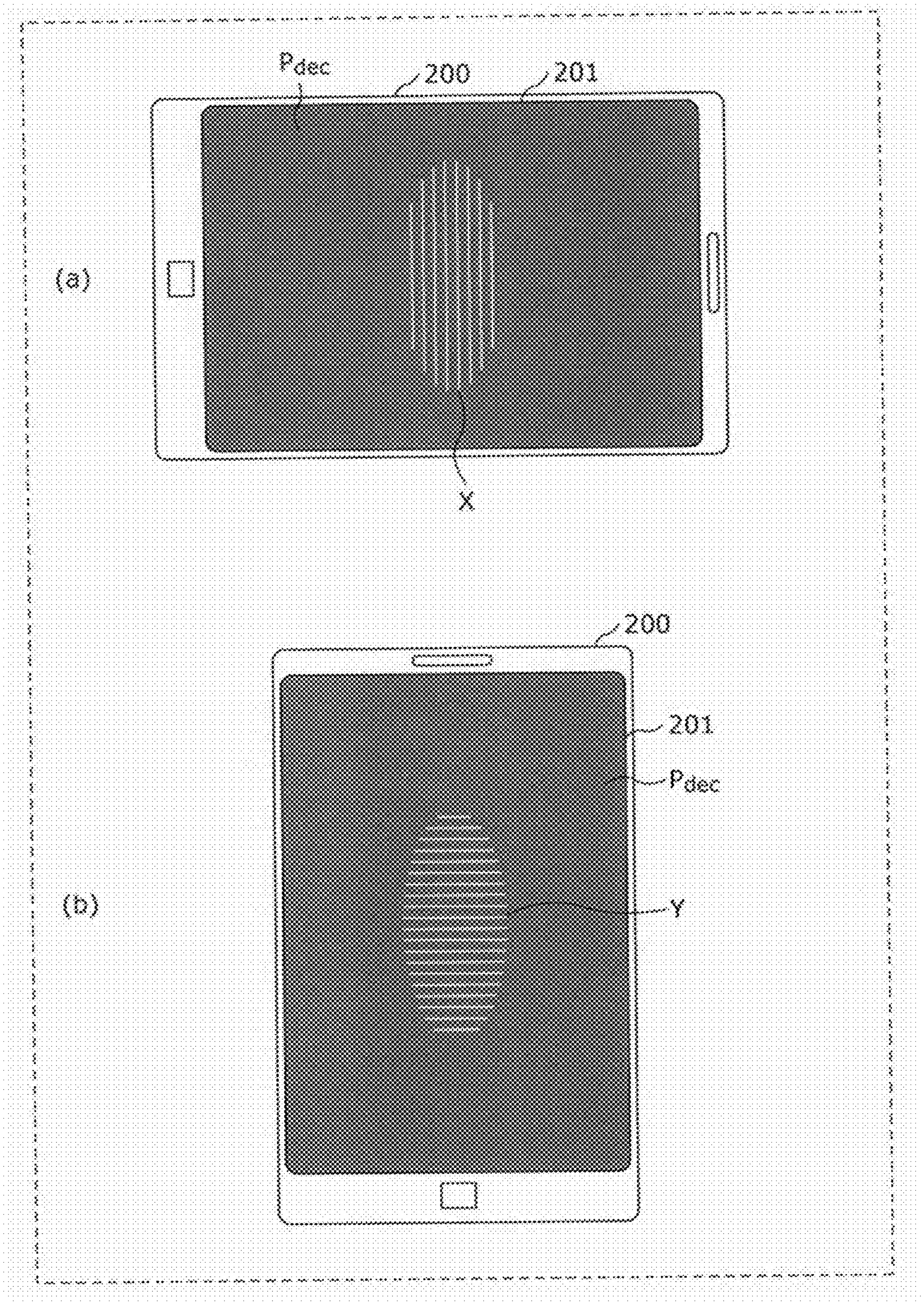
Figure 302:
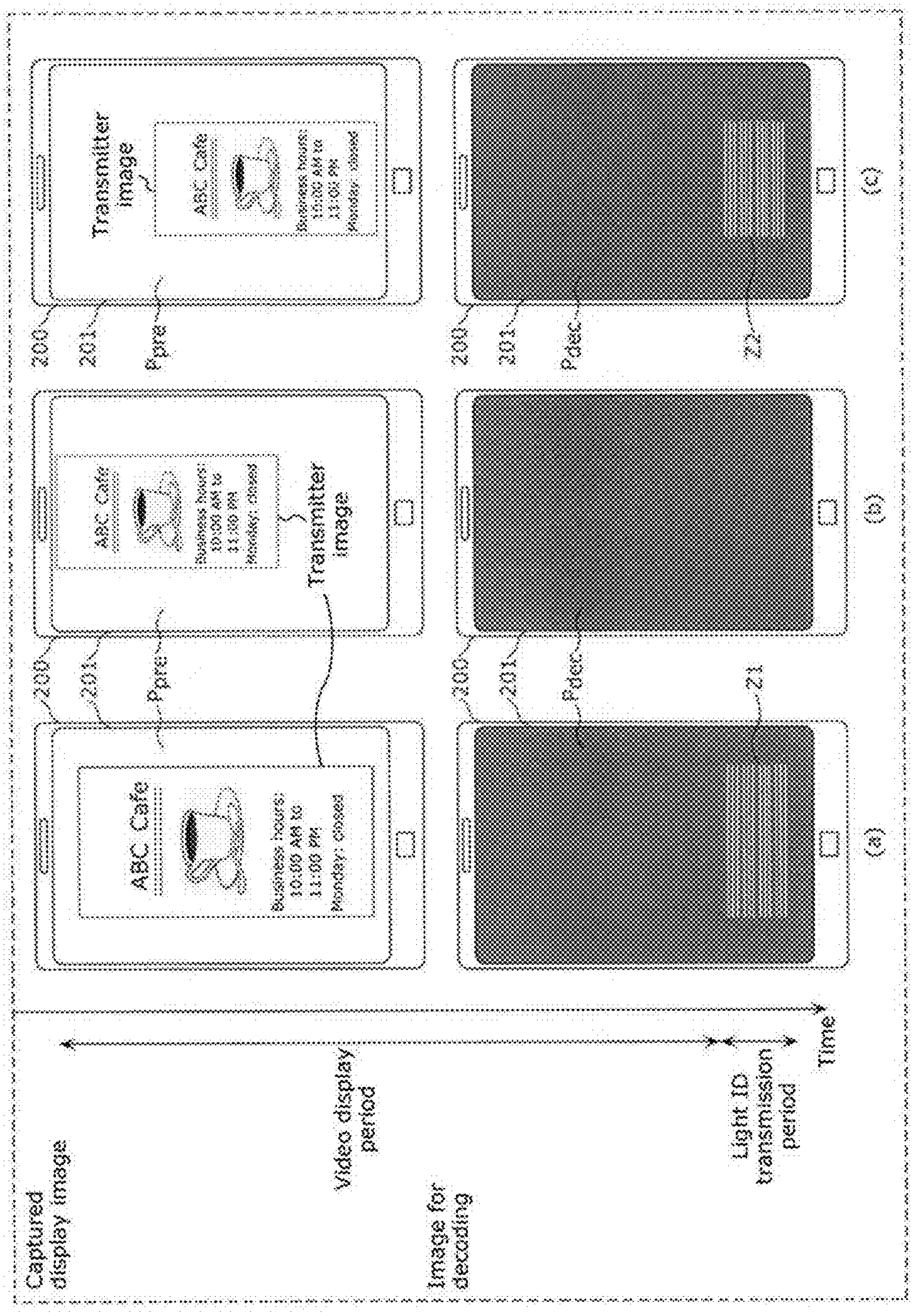
Figure 303:
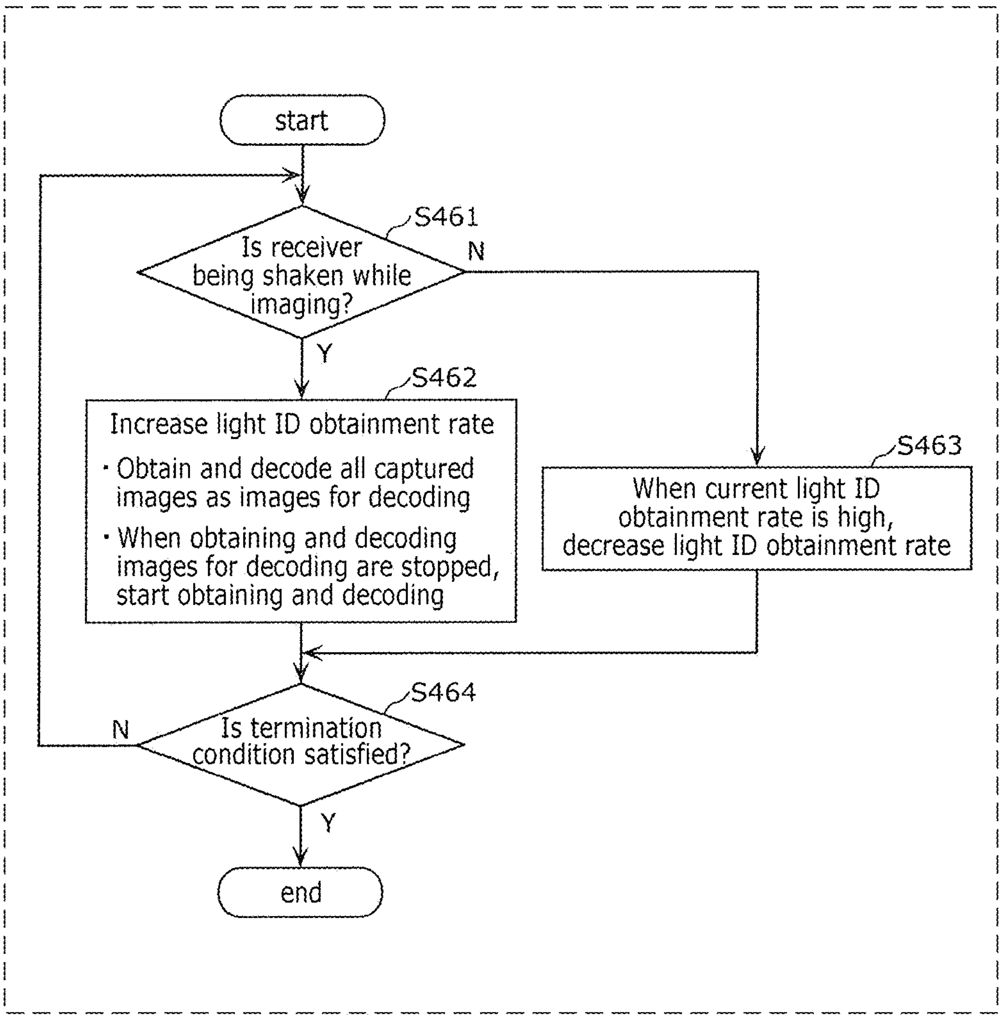
Figure 305:
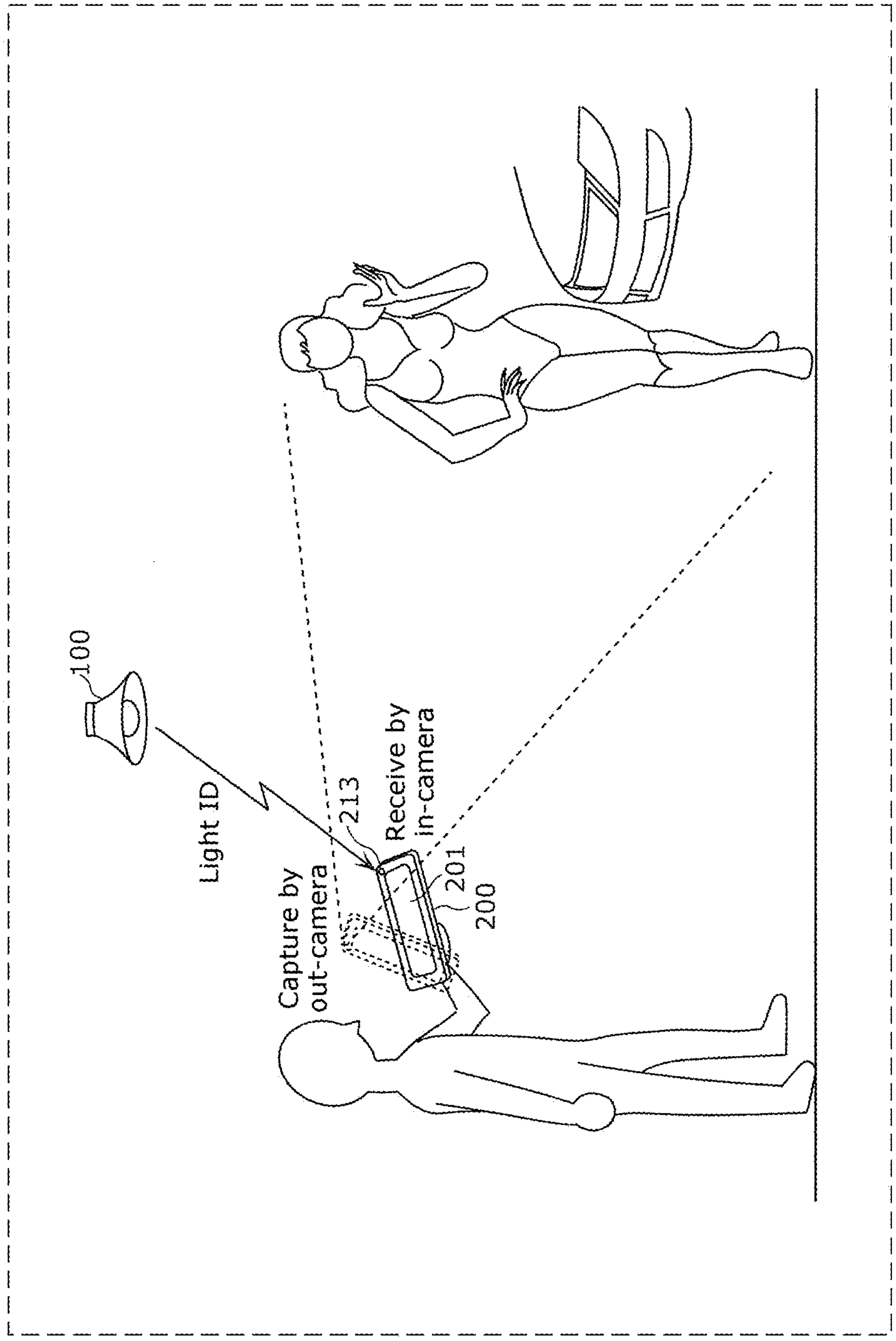
Figure 306:
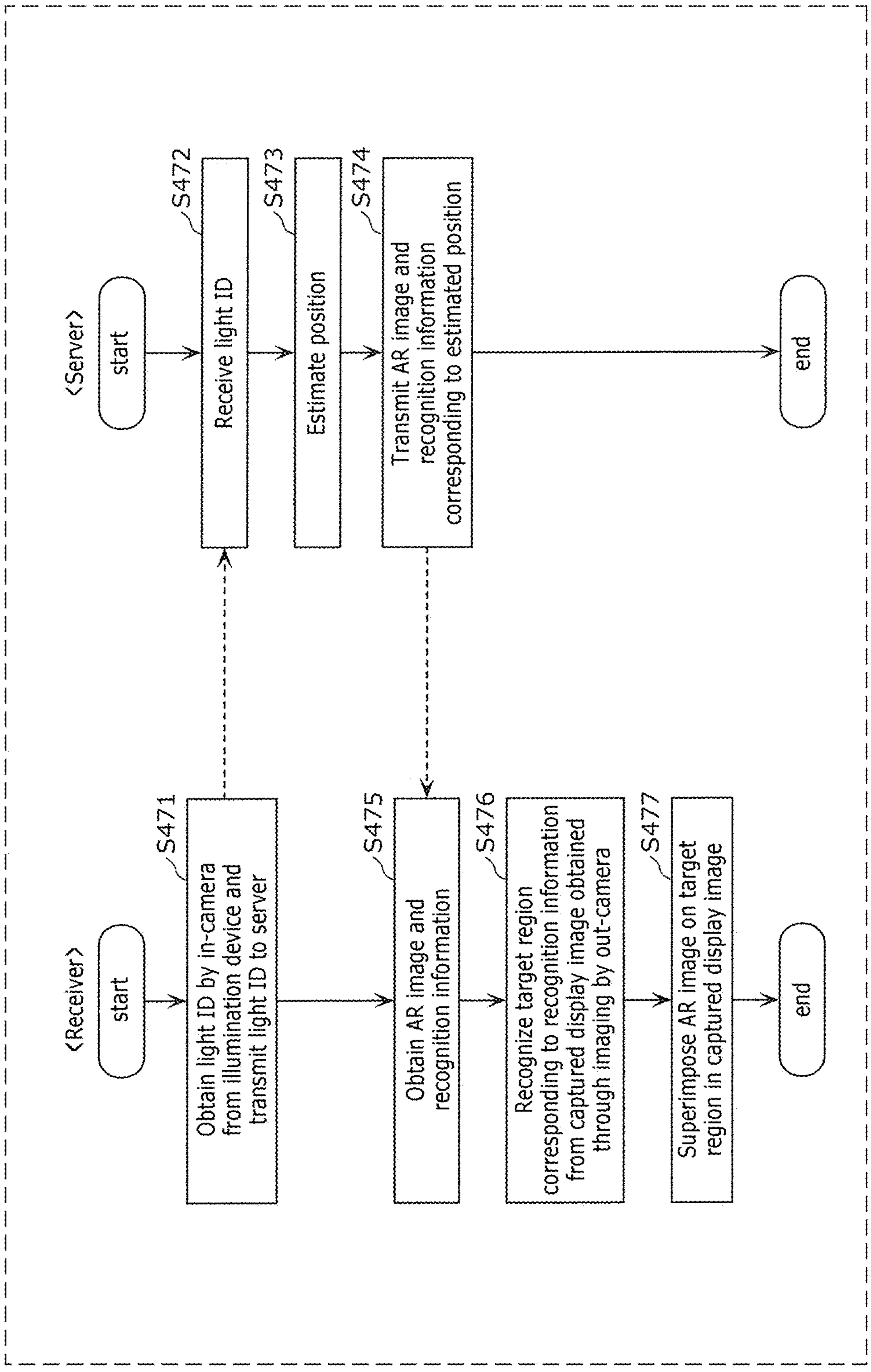
Figure 307:
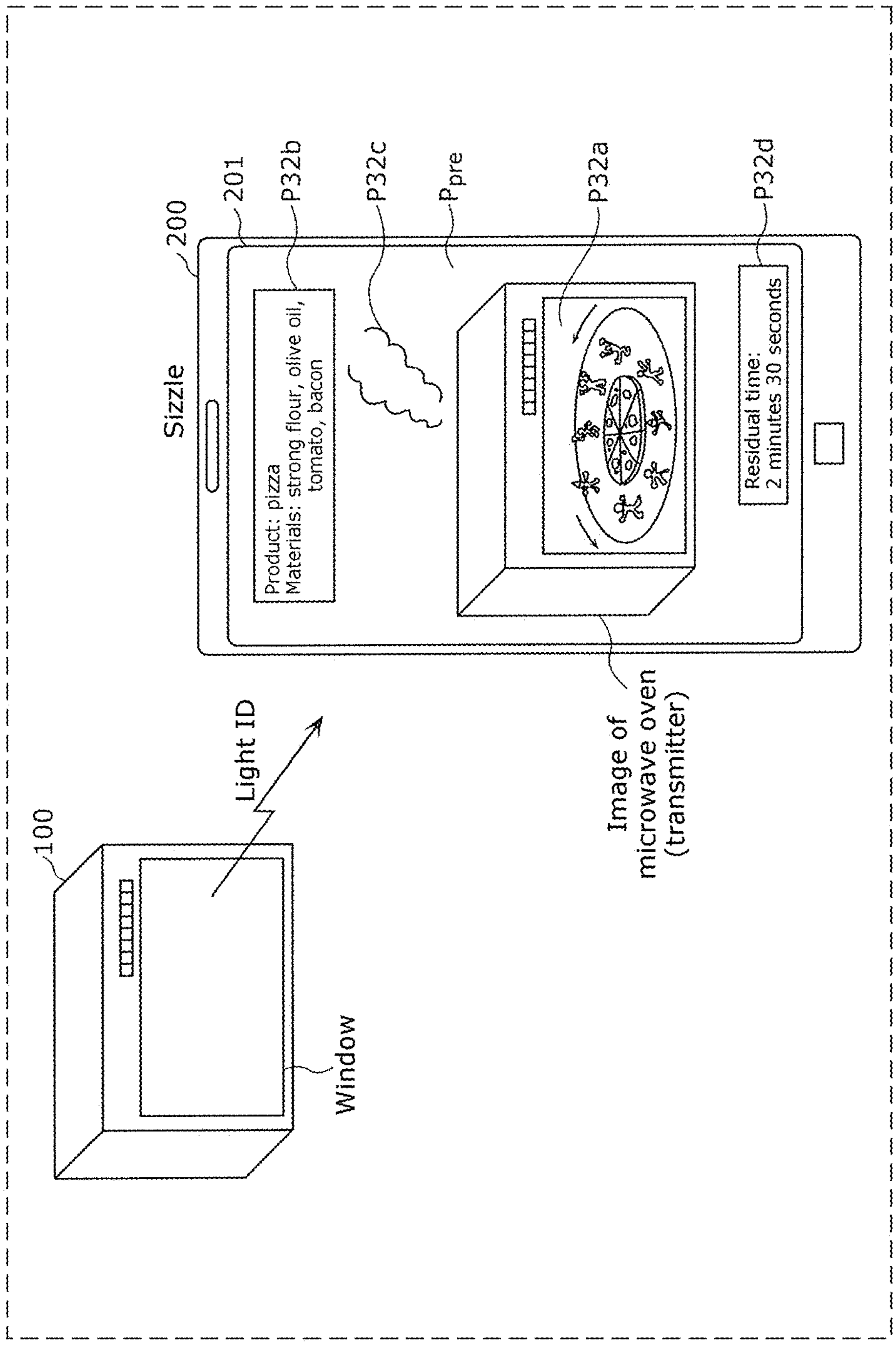
Figure 308:
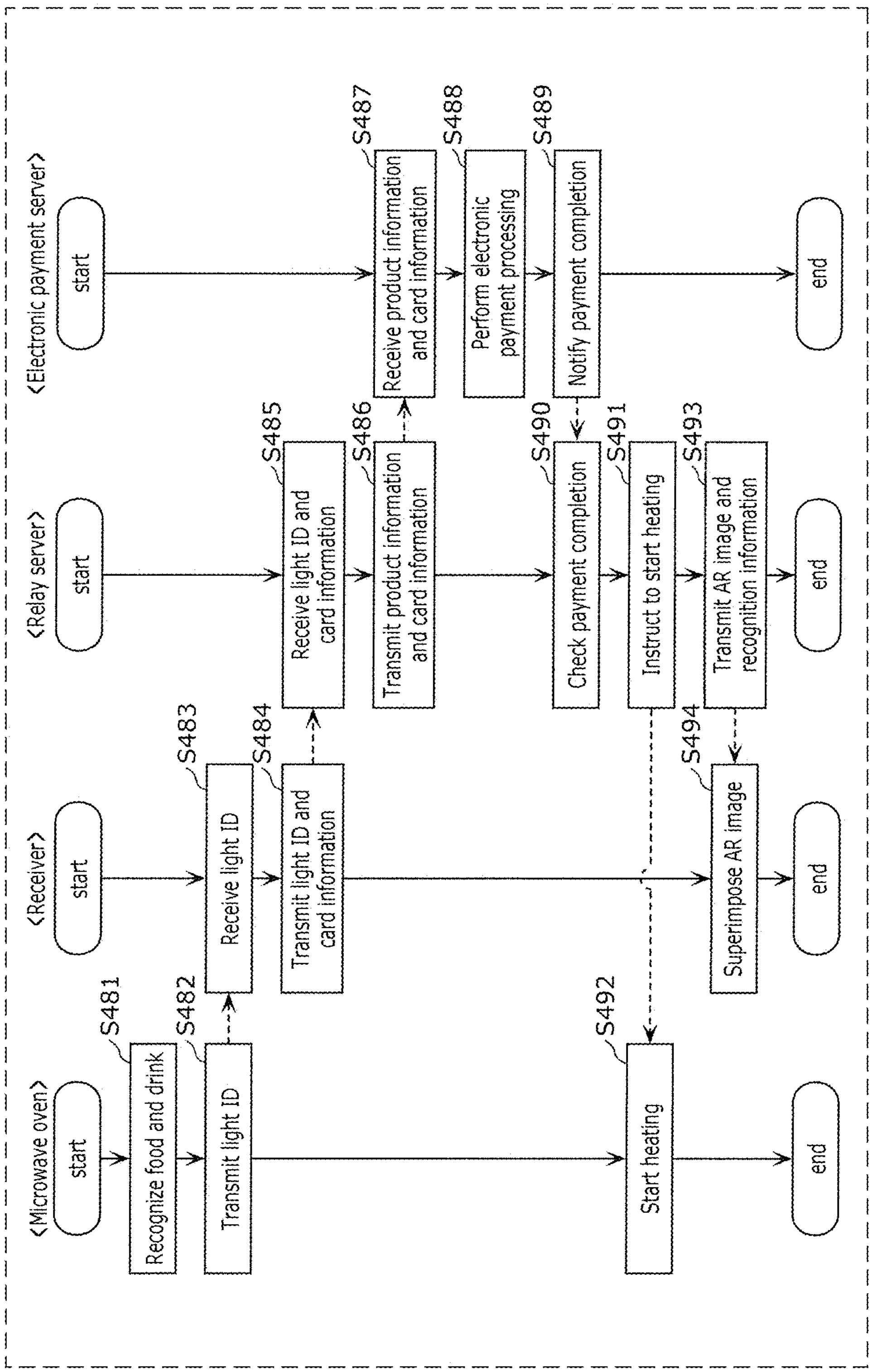
Figure 309:
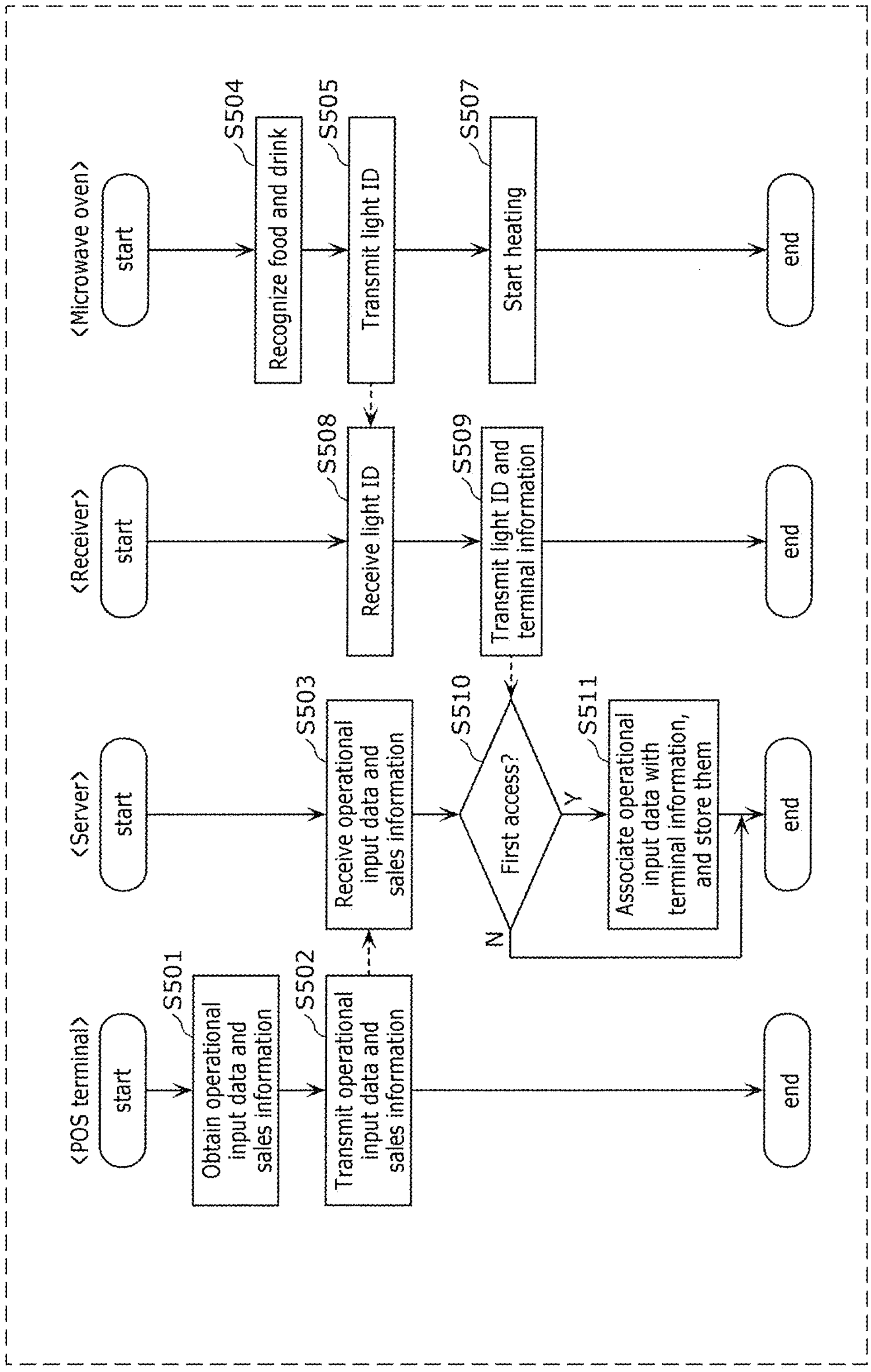
Figure 310:
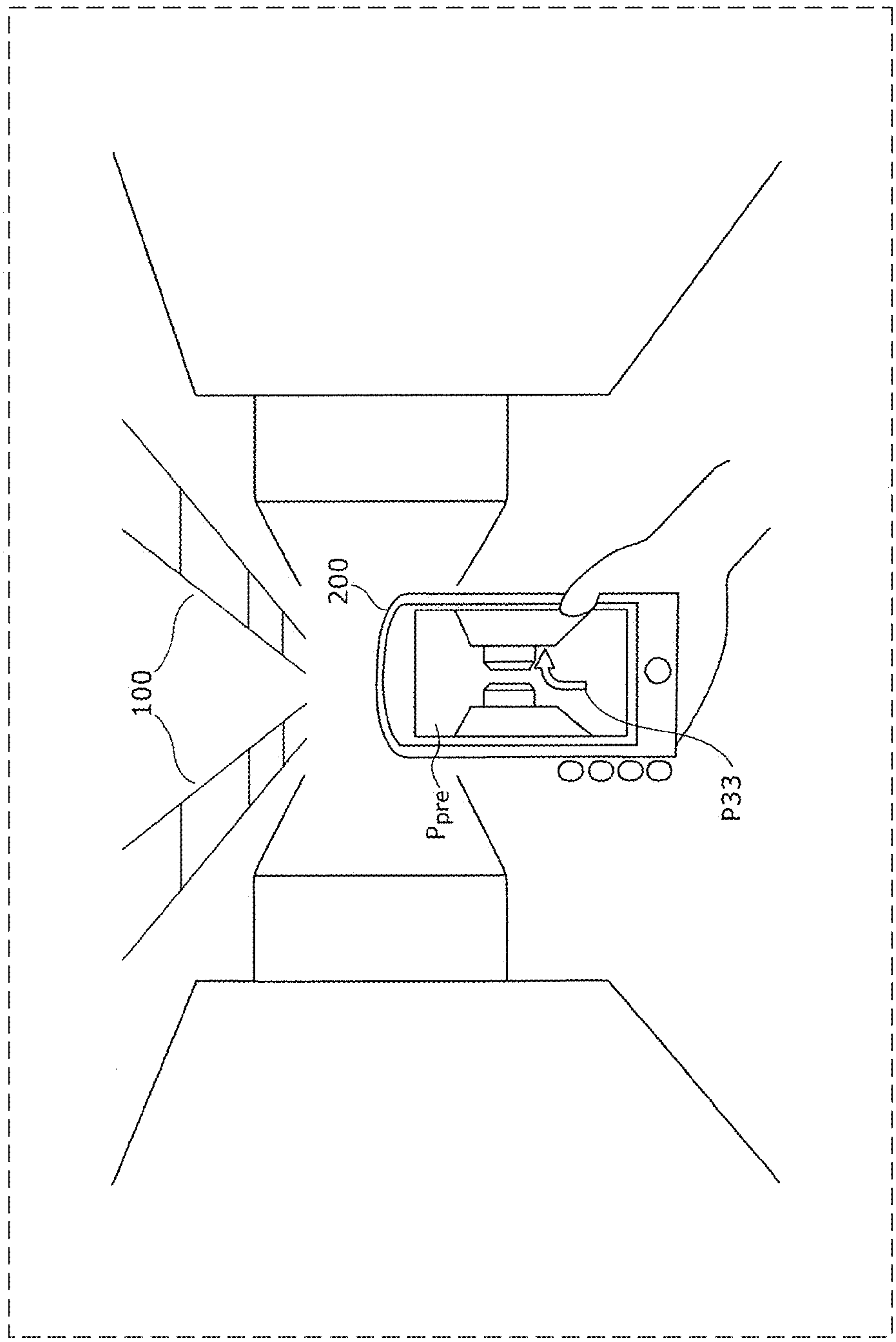
Figure 311:
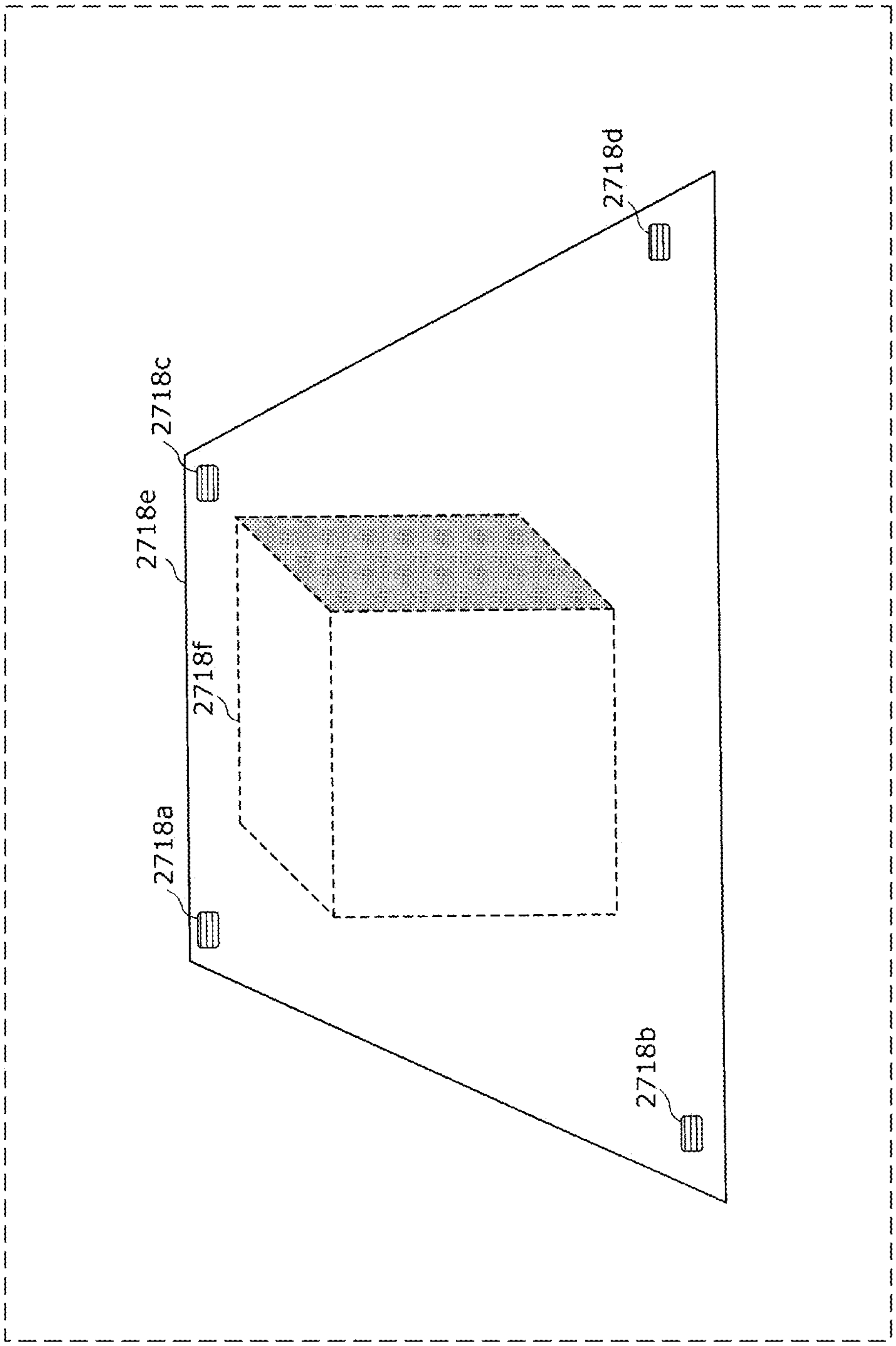

FIG. 118 is a flowchart illustrating processing operation of a receiver in Embodiment 14;

FIG. 119 is a diagram illustrating processing operation of a reception device (an imaging device) in Embodiment 15;

FIG. 120 is a diagram illustrating processing operation of a reception device (an imaging device) in Embodiment 15;

FIG. 121 is a diagram illustrating processing operation of a reception device (an imaging device) in Embodiment 15;

FIG. 122 is a diagram illustrating processing operation of a reception device (an imaging device) in Embodiment 15;

FIG. 123 is a diagram illustrating an example of an application in Embodiment 16;

FIG. 124 is a diagram illustrating an example of an application in Embodiment 16;

FIG. 125 is a diagram illustrating an example of a transmission signal and an example of an audio synchronization method in Embodiment 16;

FIG. 126 is a diagram illustrating an example of a transmission signal in Embodiment 16;

FIG. 127 is a diagram illustrating an example of a process flow of a receiver in Embodiment 16;

FIG. 128 is a diagram illustrating an example of a user interface of a receiver in Embodiment 16;

FIG. 129 is a diagram illustrating an example of a process flow of a receiver in Embodiment 16;

FIG. 130 is a diagram illustrating another example of a process flow of a receiver in Embodiment 16;

FIG. 131A is a diagram for describing a specific method for synchronous reproduction in Embodiment 16;

FIG. 131B is a block diagram illustrating a configuration of a reproduction apparatus (a receiver) which performs synchronous reproduction in Embodiment 16;

FIG. 131C is a flowchart illustrating processing operation of a reproduction apparatus (a receiver) which performs synchronous reproduction in Embodiment 16;

FIG. 132 is a diagram for describing advance preparation of synchronous reproduction in Embodiment 16;

FIG. 133 is a diagram illustrating an example of application of a receiver in Embodiment 16;

FIG. 134A is a front view of a receiver held by a holder in Embodiment 16;

FIG. 134B is a rear view of a receiver held by a holder in Embodiment 16;

FIG. 135 is a diagram for describing a use case of a receiver held by a holder in Embodiment 16;

FIG. 136 is a flowchart illustrating processing operation of a receiver held by a holder in Embodiment 16;

FIG. 137 is a diagram illustrating an example of an image displayed by a receiver in Embodiment 16;

FIG. 138 is a diagram illustrating another example of a holder in Embodiment 16;

FIG. 139A is a diagram illustrating an example of a visible light signal in Embodiment 17;

FIG. 139B is a diagram illustrating an example of a visible light signal in Embodiment 17;

FIG. 139C is a diagram illustrating an example of a visible light signal in Embodiment 17;

FIG. 139D is a diagram illustrating an example of a visible light signal in Embodiment 17;

FIG. 140 is a diagram illustrating a structure of a visible light signal in Embodiment 17;

FIG. 141 is a diagram illustrating an example of a bright line image obtained through imaging by a receiver in Embodiment 17;

FIG. 142 is a diagram illustrating another example of a bright line image obtained through imaging by a receiver in Embodiment 17;

FIG. 143 is a diagram illustrating another example of a bright line image obtained through imaging by a receiver in Embodiment 17;

FIG. 144 is a diagram for describing application of a receiver to a camera system which performs HDR compositing in Embodiment 17;

FIG. 145 is a diagram for describing processing operation of a visible light communication system in Embodiment 17;

FIG. 146A is a diagram illustrating an example of vehicle-to-vehicle communication using visible light in Embodiment 17;

FIG. 146B is a diagram illustrating another example of vehicle-to-vehicle communication using visible light in Embodiment 17;

FIG. 147 is a diagram illustrating an example of a method for determining positions of a plurality of LEDs in Embodiment 17;

FIG. 148 is a diagram illustrating an example of a bright line image obtained by capturing an image of a vehicle in Embodiment 17;

FIG. 149 is a diagram illustrating an example of application of a receiver and a transmitter in Embodiment 17. A rear view of a vehicle is given in FIG. 149;

FIG. 150 is a flowchart illustrating an example of processing operation of a receiver and a transmitter in Embodiment 17;

FIG. 151 is a diagram illustrating an example of application of a receiver and a transmitter in Embodiment 17;

FIG. 152 is a flowchart illustrating an example of processing operation of a receiver 7007*a* and a transmitter 7007*b* in Embodiment 17;

FIG. 153 is a diagram illustrating components of a visible light communication system applied to the interior of a train in Embodiment 17;

FIG. 154 is a diagram illustrating components of a visible light communication system applied to amusement parks and the like facilities in Embodiment 17;

FIG. 155 is a diagram illustrating an example of a visible light communication system including a play tool and a smartphone in Embodiment 17;

FIG. 156 is a diagram illustrating an example of a transmission signal in Embodiment 18;

FIG. 157 is a diagram illustrating an example of a transmission signal in Embodiment 18;

FIG. 158 is a diagram illustrating an example of a transmission signal in Embodiment 19;

FIG. 159 is a diagram illustrating an example of a transmission signal in Embodiment 19;

FIG. 160 is a diagram illustrating an example of a transmission signal in Embodiment 19;

FIG. 161 is a diagram illustrating an example of a transmission signal in Embodiment 19;

FIG. 162 is a diagram illustrating an example of a transmission signal in Embodiment 19;

FIG. 163 is a diagram illustrating an example of a transmission signal in Embodiment 19;

FIG. 164 is a diagram illustrating an example of a transmission and reception system in Embodiment 19;

FIG. 165 is a flowchart illustrating an example of processing of a transmission and reception system in Embodiment 19;

FIG. 166 is a flowchart illustrating operation of a server in Embodiment 19;

FIG. 167 is a flowchart illustrating an example of operation of a receiver in Embodiment 19;

FIG. 168 is a flowchart illustrating a method for calculating a status of progress in a simple mode in Embodiment 19;

FIG. 169 is a flowchart illustrating a method for calculating a status of progress in a maximum likelihood estimation mode in Embodiment 19;

FIG. 170 is a flowchart illustrating a display method in which a status of progress does not change downward in Embodiment 19;

FIG. 171 is a flowchart illustrating a method for displaying a status of progress when there is a plurality of packet lengths in Embodiment 19;

FIG. 172 is a diagram illustrating an example of an operating state of a receiver in Embodiment 19;

FIG. 173 is a diagram illustrating an example of a transmission signal in Embodiment 19;

FIG. 174 is a diagram illustrating an example of a transmission signal in Embodiment 19;

FIG. 175 is a diagram illustrating an example of a transmission signal in Embodiment 19;

FIG. 176 is a block diagram illustrating an example of a transmitter in Embodiment 19;

FIG. 177 is a diagram illustrating a timing chart of when an LED display in Embodiment 19 is driven by a light ID modulated signal according to the present disclosure;

FIG. 178 is a diagram illustrating a timing chart of when an LED display in Embodiment 19 is driven by a light ID modulated signal according to the present disclosure;

FIG. 179 is a diagram illustrating a timing chart of when an LED display in Embodiment 19 is driven by a light ID modulated signal according to the present disclosure;

FIG. 180A is a flowchart illustrating a transmission method according to an aspect of the present disclosure;

FIG. 180B is a block diagram illustrating a functional configuration of a transmitting apparatus according to an aspect of the present disclosure;

FIG. 181 is a diagram illustrating an example of a transmission signal in Embodiment 19;

FIG. 182 is a diagram illustrating an example of a transmission signal in Embodiment 19;

FIG. 183 is a diagram illustrating an example of a transmission signal in Embodiment 19;

FIG. 184 is a diagram illustrating an example of a transmission signal in Embodiment 19;

FIG. 185 is a diagram illustrating an example of a transmission signal in Embodiment 19;

FIG. 186 is a diagram illustrating an example of a transmission signal in Embodiment 19;

FIG. 187 is a diagram illustrating an example of a structure of a visible light signal in Embodiment 20;

FIG. 188 is a diagram illustrating an example of a detailed structure of a visible light signal in Embodiment 20;

FIG. 189A is a diagram illustrating another example of a visible light signal in Embodiment 20;

FIG. 189B is a diagram illustrating another example of a visible light signal in Embodiment 20;

FIG. 189C is a diagram illustrating a signal length of a visible light signal in Embodiment 20;

FIG. 190 is a diagram illustrating a comparison result of a luminance value between a visible light signal in Embodiment 20 and a visible light signal of the standard IEC;

FIG. 191 is a diagram illustrating a comparison result of a number of reception packets and reliability with respect to an angle of view between a visible light signal in Embodiment 20 and a visible light signal of the standard IEC;

FIG. 192 is a diagram illustrating a comparison result of a number of reception packets and reliability with respect to noise between a visible light signal in Embodiment 20 and a visible light signal of the standard IEC;

FIG. 193 is a diagram illustrating a comparison result of a number of reception packets and reliability with respect to a reception side clock error between a visible light signal in Embodiment 20 and a visible light signal of the standard IEC;

FIG. 194 is a diagram illustrating a structure of a signal to be transmitted in Embodiment 20;

FIG. 195A is a diagram illustrating a method for receiving a visible light signal in Embodiment 20;

FIG. 195B is a diagram illustrating rearrangement of a visible light signal in Embodiment 20;

FIG. 196 is a diagram illustrating another example of a visible light signal in Embodiment 20;

FIG. 197 is a diagram illustrating another example of a detailed structure of a visible light signal in Embodiment 20;

FIG. 198 is a diagram illustrating another example of a detailed structure of a visible light signal in Embodiment 20;

FIG. 199 is a diagram illustrating another example of a detailed structure of a visible light signal in Embodiment 20;

FIG. 200 is a diagram illustrating another example of a detailed structure of a visible light signal in Embodiment 20;

FIG. 201 is a diagram illustrating another example of a detailed structure of a visible light signal in Embodiment 20;

FIG. 202 is a diagram illustrating another example of a detailed structure of a visible light signal in Embodiment 20;

FIG. 203 is a diagram for describing a method for determining values of x1 to x4 of FIG. 197;

FIG. 204 is a diagram for describing a method for determining values of x1 to x4 of FIG. 197;

FIG. 205 is a diagram for describing a method for determining values of x1 to x4 of FIG. 197;

FIG. 206 is a diagram for describing a method for determining values of x1 to x4 of FIG. 197;

FIG. 207 is a diagram for describing a method for determining values of x1 to x4 of FIG. 197;

FIG. 208 is a diagram for describing a method for determining values of x1 to x4 of FIG. 197;

FIG. 209 is a diagram for describing a method for determining values of x1 to x4 of FIG. 197;

FIG. 210 is a diagram for describing a method for determining values of x1 to x4 of FIG. 197;

FIG. 211 is a diagram for describing a method for determining values of x1 to x4 of FIG. 197;

FIG. 212 is a diagram illustrating an example of a detailed structure of a visible light signal according to Variation 1 of Embodiment 20;

FIG. 213 is a diagram illustrating another example of a visible light signal according to Variation 1 of Embodiment 20;

FIG. 214 is a diagram illustrating still another example of a visible light signal according to Variation 1 of Embodiment 20;

FIG. 215 is a diagram illustrating an example of packet modulation according to Variation 1 of Embodiment 20;

FIG. 216 is a diagram illustrating processing for dividing source data into one packet according to Variation 1 of Embodiment 20;

FIG. 217 is a diagram illustrating processing for dividing source data into two packets according to Variation 1 of Embodiment 20;

FIG. 218 is a diagram illustrating processing for dividing source data into three packets according to Variation 1 of Embodiment 20;

FIG. 219 is a diagram illustrating another example of processing for dividing source data into three packets according to Variation 1 of Embodiment 20;

FIG. 220 is a diagram illustrating another example of processing for dividing source data into three packets according to Variation 1 of Embodiment 20;

FIG. 221 is a diagram illustrating processing for dividing source data into four packets according to Variation 1 of Embodiment 20;

FIG. 222 is a diagram illustrating processing for dividing source data into five packets according to Variation 1 of Embodiment 20;

FIG. 223 is a diagram illustrating processing for dividing source data into six, seven, or eight packets according to Variation 1 of Embodiment 20;

FIG. 224 is a diagram illustrating another example of processing for dividing source data into six, seven, or eight packets according to Variation 1 of Embodiment 20;

FIG. 225 is a diagram illustrating processing for dividing source data into nine packets according to Variation 1 of Embodiment 20;

FIG. 226 is a diagram illustrating processing for dividing source data into any number of 10 to 16 packets according to Variation 1 of Embodiment 20;

FIG. 227 is a diagram illustrating an example of a relationship among a number of divisions of source data, data size, and error correction code according to Variation 1 of Embodiment 20;

FIG. 228 is a diagram illustrating another example of a relationship among a number of divisions of source data, data size, and error correction code according to Variation 1 of Embodiment 20;

FIG. 229 is a diagram illustrating still another example of a relationship among a number of divisions of source data, data size, and error correction code according to Variation 1 of Embodiment 20;

FIG. 230A is a flowchart illustrating a method for generating a visible light signal in Embodiment 20;

FIG. 230B is a block diagram illustrating a configuration of a signal generating unit in Embodiment 20;

FIG. 231 is a diagram illustrating a method for receiving a high-frequency visible light signal in Embodiment 21;

FIG. 232A is a diagram illustrating another method for receiving a high-frequency visible light signal in Embodiment 21;

FIG. 232B is a diagram illustrating another method for receiving a high-frequency visible light signal in Embodiment 21;

FIG. 233 is a diagram illustrating a method for outputting a high-frequency signal in Embodiment 21;

FIG. 234 is a diagram for describing an autonomous aircraft in Embodiment 22;

FIG. 235 is a diagram illustrating an example in which a receiver in Embodiment 23 displays an AR image;

FIG. 236 is a diagram illustrating an example of a display system in Embodiment 23;

FIG. 237 is a diagram illustrating another example of a display system in Embodiment 23;

FIG. 238 is a diagram illustrating another example of a display system in Embodiment 23;

FIG. 239 is a flowchart illustrating an example of processing operation of a receiver in Embodiment 23;

FIG. 240 is a diagram illustrating another example in which a receiver in Embodiment 23 displays an AR image;

FIG. 241 is a diagram illustrating another example in which a receiver in Embodiment 23 displays an AR image;

FIG. 242 is a diagram illustrating another example in which a receiver in Embodiment 23 displays an AR image;

FIG. 243 is a diagram illustrating another example in which a receiver in Embodiment 23 displays an AR image;

FIG. 244 is a diagram illustrating another example in which a receiver in Embodiment 23 displays an AR image;

FIG. 245 is a diagram illustrating another example in which a receiver in Embodiment 23 displays an AR image;

FIG. 246 is a flowchart illustrating another example of processing operation of a receiver in Embodiment 23;

FIG. 247 is a diagram illustrating another example in which a receiver in Embodiment 23 displays an AR image;

FIG. 248 is a diagram illustrating a captured display image Ppre and an image for decoding Pdec obtained through imaging by a receiver in Embodiment 23;

FIG. 249 is a diagram illustrating an example of a captured display image Ppre displayed on a receiver in Embodiment 23;

FIG. 250 is a flowchart illustrating another example of processing operation of a receiver in Embodiment 23;

FIG. 251 is a diagram illustrating another example in which a receiver in Embodiment 23 displays an AR image;

FIG. 252 is a diagram illustrating another example in which a receiver in Embodiment 23 displays an AR image;

FIG. 253 is a diagram illustrating another example in which a receiver in Embodiment 23 displays an AR image;

FIG. 254 is a diagram illustrating another example in which a receiver in Embodiment 23 displays an AR image;

FIG. 255 is a diagram illustrating an example of recognition information in Embodiment 23;

FIG. 256 is a flowchart illustrating another example of processing operation of a receiver in Embodiment 23;

FIG. 257 is a diagram illustrating an example in which a receiver in Embodiment 23 identifies bright line pattern regions;

FIG. 258 is a diagram illustrating another example of a receiver in Embodiment 23;

FIG. 259 is a flowchart illustrating another example of processing operation of a receiver in Embodiment 23;

FIG. 260 is a diagram illustrating an example of a transmission system including a plurality of transmitters in Embodiment 23;

FIG. 261 is a diagram illustrating an example of a transmission system including a plurality of transmitters and a receiver in Embodiment 23;

FIG. 262A is a flowchart illustrating an example of processing operation of a receiver in Embodiment 23;

FIG. 262B is a flowchart illustrating an example of processing operation of a receiver in Embodiment 23;

FIG. 263A is a flowchart illustrating a display method in Embodiment 23;

FIG. 263B is a block diagram illustrating a configuration of a display device in Embodiment 23;

FIG. 264 is a diagram illustrating an example in which a receiver in Variation 1 of Embodiment 23 displays an AR image;

FIG. 265 is a diagram illustrating another example in which a receiver 200 in Variation 1 of Embodiment 23 displays an AR image;

FIG. 266 is a diagram illustrating another example in which a receiver 200 in Variation 1 of Embodiment 23 displays an AR image;

FIG. 267 is a diagram illustrating another example in which a receiver 200 in Variation 1 of Embodiment 23 displays an AR image;

FIG. 268 is a diagram illustrating another example of a receiver 200 in Variation 1 of Embodiment 23;

FIG. 269 is a diagram illustrating another example in which a receiver 200 in Variation 1 of Embodiment 23 displays an AR image;

FIG. 270 is a diagram illustrating another example in which a receiver 200 in Variation 1 of Embodiment 23 displays an AR image;

FIG. 271 is a flowchart illustrating an example of processing operation of a receiver 200 in Variation 1 of Embodiment 23;

FIG. 272 is a diagram illustrating an example of an assumed problem when a receiver in Embodiment 23 or Variation 1 of Embodiment 23 displays an AR image;

FIG. 273 is a diagram illustrating an example in which a receiver in Variation 2 of Embodiment 23 displays an AR image;

FIG. 274 is a flowchart illustrating an example of processing operation of a receiver in Variation 2 of Embodiment 23;

FIG. 275 is a diagram illustrating another example in which a receiver in Variation 2 of Embodiment 23 displays an AR image;

FIG. 276 is a flowchart illustrating another example of processing operation of a receiver in Variation 2 of Embodiment 23;

FIG. 277 is a diagram illustrating another example in which a receiver in Variation 2 of Embodiment 23 displays an AR image;

FIG. 278 is a diagram illustrating another example in which a receiver in Variation 2 of Embodiment 23 displays an AR image;

FIG. 279 is a diagram illustrating another example in which a receiver in Variation 2 of Embodiment 23 displays an AR image;

FIG. 280 is a diagram illustrating another example in which a receiver in Variation 2 of Embodiment 23 displays an AR image;

FIG. 281A is a flowchart illustrating a display method according to an aspect of the present disclosure;

FIG. 281B is a block diagram illustrating a configuration of a display device according to an aspect of the present disclosure;

FIG. 282 is a diagram illustrating an example of enlargement and movement of an AR image in Variation 3 of Embodiment 23;

FIG. 283 is a diagram illustrating an example of enlargement of an AR image in Variation 3 of Embodiment 23;

FIG. 284 is a flowchart illustrating an example of processing operation regarding enlargement and movement of an AR image by a receiver in Variation 3 of Embodiment 23;

FIG. 285 is a diagram illustrating an example of superimposition of an AR image in Variation 3 of Embodiment 23;

FIG. 286 is a diagram illustrating an example of superimposition of an AR image in Variation 3 of Embodiment 23;

FIG. 287 is a diagram illustrating an example of superimposition of an AR image in Variation 3 of Embodiment 23;

FIG. 288 is a diagram illustrating an example of superimposition of an AR image in Variation 3 of Embodiment 23;

FIG. 289A is a diagram illustrating an example of a captured display image obtained through imaging by a receiver in Variation 3 of Embodiment 23;

FIG. 289B is a diagram illustrating an example of a menu screen displayed on a display of a receiver in Variation 3 of Embodiment 23;

FIG. 290 is a flowchart illustrating an example of processing operation of a receiver and a server in Variation 3 of Embodiment 23;

FIG. 291 is a diagram for describing volume of sound reproduced by a receiver in Variation 3 of Embodiment 23;

FIG. 292 is a diagram illustrating a relationship between a distance from a receiver to a transmitter, and volume in Variation 3 of Embodiment 23;

FIG. 293 is a diagram illustrating an example of superimposition of an AR image by a receiver in Variation 3 of Embodiment 23;

FIG. 294 is a diagram illustrating an example of superimposition of an AR image by a receiver in Variation 3 of Embodiment 23;

FIG. 295 is a diagram for describing an example of how to calculate a line scanning time by a receiver in Variation 3 of Embodiment 23;

FIG. 296 is a diagram for describing an example of how to calculate a line scanning time by a receiver in Variation 3 of Embodiment 23;

FIG. 297 is a flowchart illustrating an example of how to calculate a line scanning time by a receiver in Variation 3 of Embodiment 23;

FIG. 298 is a diagram illustrating an example of superimposition of an AR image by a receiver in Variation 3 of Embodiment 23;

FIG. 299 is a diagram illustrating an example of superimposition of an AR image by a receiver in Variation 3 of Embodiment 23;

FIG. 300 is a diagram illustrating an example of superimposition of an AR image by a receiver in Variation 3 of Embodiment 23;

FIG. 301 is a diagram illustrating an example of an image for decoding obtained according to an orientation of a receiver in Variation 3 of Embodiment 23;

FIG. 302 is a diagram illustrating another example of an image for decoding obtained according to an orientation of a receiver in Variation 3 of Embodiment 23;

FIG. 303 is a flowchart illustrating an example of processing operation of a receiver in Variation 3 of Embodiment 23;

FIG. 304 is a diagram illustrating an example of switching processing of camera lenses by a receiver in Variation 3 of Embodiment 23;

FIG. 305 is a diagram illustrating an example of switching processing of cameras by a receiver in Variation 3 of Embodiment 23;

FIG. 306 is a flowchart illustrating an example of processing operation of a receiver and a server in Variation 3 of Embodiment 23;

FIG. 307 is a diagram illustrating an example of superimposition of an AR image by a receiver in Variation 3 of Embodiment 23;

FIG. 308 is a sequence diagram illustrating processing operation of a system including a receiver, a microwave oven, a relay server, and an electronic payment server in Variation 3 of Embodiment 23;

FIG. 309 is a sequence diagram illustrating processing operation of a system including a POS terminal, a server, a receiver 200, and a microwave oven in Variation 3 of Embodiment 23;

FIG. 310 is a diagram illustrating an example of indoor use in Variation 3 of Embodiment 23; and FIG. 311 is a diagram illustrating an example of display of an augmented reality object in Variation 3 of Embodiment 23.

DETAILED DESCRIPTION

A display method according to one aspect of the present disclosure is a display method for a display device to display an image. The display method includes: obtaining a captured display image and an image for decoding by an image sensor capturing a subject; decoding the image for decoding to obtain light identification information; transmitting the light identification information to a server; a plurality of sets of an augmented reality image, recognition information, and identification information being stored in the server, out of the plurality of sets, obtaining, from the server, the augmented reality image and the recognition information included in each of the sets including the identification information that agrees with the light identification information; out of the captured display image, recognizing a region corresponding to the recognition information as a target region; and displaying the captured display image with the augmented reality image superimposed on the target region.

With this method, since the augmented reality image is superimposed on the captured display image and displayed, an image valuable to a user can be displayed. Furthermore, the augmented reality image (that is, AR image) can be superimposed on the appropriate target region with a processing load being reduced.

That is, in general augmented reality, by comparing a captured display image with an enormous number of images to be recognized stored in advance, it is determined whether any image to be recognized is included in the captured display image. Then, when it is determined that an image to be recognized is included, an augmented reality image corresponding to the image to be recognized is superimposed on the captured display image. At this time, the augmented reality image is aligned based on the image to be recognized. Thus, general augmented reality has a problem that a large amount of calculations is required and a processing load is heavy because the captured display image is compared with an enormous number of images to be recognized and detecting a position of the image to be recognized in the captured display image is further needed in alignment.

However, in the display method according to one aspect of the present disclosure, as illustrated in FIG. 235 to FIG. 262B, FIG. 263A, and FIG. 263B, light identification information (that is, light ID) is obtained by decoding the image for decoding obtained by capturing the subject. That is, the light identification information transmitted from a transmitter, which is the subject, is received. Furthermore, the augmented reality image (that is, AR image) and the recognition information corresponding to this light identification information are obtained from a server. Therefore, the server does not need to compare the captured display image with an enormous number of images to be recognized. The server can select the augmented reality image associated with the light identification information in advance and transmit the augmented reality image to a display device. This allows the amount of calculations to be reduced and the processing load to be reduced significantly.

Moreover, in the display method according to one aspect of the present disclosure, the recognition information corresponding to the light identification information is obtained from the server. The recognition information is information for recognizing the target region that is a region on which the augmented reality image is to be superimposed in the captured display image. This recognition information may be, for example, information indicating that a white quadrangle is the target region. In this case, the target region can be recognized easily and the processing load can be further reduced. That is, the processing load can be further reduced according to details of the recognition information. Also, since the server can arbitrarily set the details of the recognition information according to the light identification information, a balance between the processing load and recognition precision can be maintained appropriately.

Also, the recognition information may include: reference information for specifying a reference region in the captured display image; and target information indicating a relative position of the target region with respect to the reference region. Recognizing the target region may include: specifying the reference region from the captured display image based on the reference information; and out of the captured display image, recognizing a region at the relative position based on a position of the reference region indicated by the target information as the target region.

With this configuration, as illustrated in FIG. 244 and FIG. 245, flexibility of the position of the target region to be recognized in the captured display image can be expanded.

Also, the reference information may indicate that the position of the reference region in the captured display image is identical, in the image for decoding, to a position of a bright line pattern region including a plurality of bright line patterns that appear by exposure of a plurality of exposure lines included in the image sensor.

With this configuration, as illustrated in FIG. 244 and FIG. 245, the target region can be recognized based on a region corresponding to the bright line pattern region in the captured display image.

Also, the reference information may indicate that the reference region in the captured display image is a region in which a display is shown in the captured display image. For example, the reference region may be an outer frame portion with predetermined color in an image displayed on the display.

With this configuration, as illustrated in FIG. 235, for example, when a station name sign is the display, the target region can be recognized based on the region in which the display is shown. Also, when a white or black outer frame is displayed on the display, the target region can be recognized by using a portion enclosed by the outer frame (that is, outer frame portion) as the reference region.

Also, displaying the captured display image may include displaying a first augmented reality image for a display period determined in advance while inhibiting display of a second augmented reality image different from the first augmented reality image that is the augmented reality image.

This prevents the first augmented reality image, while a user is looking at the once displayed first augmented reality image, from being immediately replaced with the second augmented reality image different from the first augmented reality image, as illustrated in FIG. 250.

Also, displaying the captured display image may include prohibiting decoding of a newly obtained image for decoding in the display period.

With this configuration, since decoding of the newly obtained image for decoding is useless processing when display of the second augmented reality image is inhibited as illustrated in FIG. 250, prohibiting the decoding can reduce power consumption.

Also, displaying the captured display image may further include: measuring an acceleration level of the display device with an acceleration sensor in the display period; determining whether the measured acceleration level is equal to or greater than a threshold; and when it is determined that the measured acceleration level is equal to or greater than the threshold, displaying the second augmented reality image instead of the first augmented reality image by canceling inhibition of display of the second augmented reality image.

With this configuration, as illustrated in FIG. 250, inhibition of display of the second augmented reality image is canceled when the acceleration level of the display device equal to or greater than the threshold is measured. Therefore, for example, when a user moves the display device greatly in order to aim the image sensor at another subject, the second augmented reality image can be displayed immediately.

Also, displaying the captured display image may further include: determining whether a face of a user is approaching the display device through imaging by a face camera included in the display device; and when it is determined that the face is approaching, displaying a first augmented reality image while inhibiting display of a second augmented reality image different from the first augmented reality image that is the augmented reality image. Alternatively, displaying the captured display image may further include: determining whether a face of a user is approaching the display device with an acceleration level of the display device measured by an acceleration sensor; and when it is determined that the face is approaching, displaying a first augmented reality image while inhibiting display of a second augmented reality image different from the first augmented reality image that is the augmented reality image.

This prevents the first augmented reality image, while the face of the user is approaching the display device in order to look at the first augmented reality image, from being replaced with the second augmented reality image different from the first augmented reality image, as illustrated in FIG. 250.

Also, obtaining the captured display image and the image for decoding may include obtaining the captured display image and the image for decoding by capturing a plurality of displays that display images as a plurality of the subjects, recognizing the target region may include recognizing, out of the captured display image, a region in which a transmission display is shown that is each of the plurality of displays transmitting the light identification information as the target region and, displaying the captured display image may include: superimposing, on the target region, a first subtitle corresponding to an image displayed on the transmission display as the augmented reality image; and further superimposing a second subtitle that is a subtitle obtained by enlarging the first subtitle on a region larger than the target region in the captured display image.

With this configuration, as illustrated in FIG. 254, since the first subtitle is superimposed on the image of the transmission display, a user is allowed to easily understand which display image the first subtitle corresponds to, out of the plurality of displays. Also, since the second subtitle obtained by enlarging the first subtitle is also displayed, even in the case where the first subtitle is small and hard to read, the subtitle can be made easy to read by displaying the second subtitle.

Also, displaying the captured display image may further include: determining whether sound information is included in information obtained from the server; and when it is determined that the sound information is included, outputting sound indicated by the sound information with priority over the first and second subtitles.

With this configuration, since the sound is output with priority, a burden for the user to read subtitles can be reduced.

Also, the display method may further include: obtaining, from a server, gesture information corresponding to the light identification information; determining whether movement of the subject indicated by the periodically obtained captured display image agrees with movement indicated by the gesture information obtained from the server; and when it is determined that these movements agree with each other, displaying the captured display image on which the augmented reality image is superimposed.

This enables, for example, as illustrated in FIG. 299 and FIG. 300, the augmented reality image to be displayed according to the movement of the subject such as a person, for example. That is, the augmented reality image can be displayed at appropriate timing.

Also, the subject may be a microwave oven including an illumination device. The illumination device may illuminate interior of the microwave oven and change in luminance to transmit the light identification information outside the microwave oven. Obtaining the captured display image and the image for decoding may include obtaining the captured display image and the image for decoding by capturing the microwave oven transmitting the light identification information. Recognizing the target region may include recognizing a window of the microwave oven shown in the captured display image as the target region. Displaying the captured display image may include displaying the captured display image on which the augmented reality image indicating state change of the interior is superimposed.

With this configuration, for example, as illustrated in FIG. 307, since the state change in the interior of the microwave oven is displayed as the augmented reality image, the state of the interior can be plainly informed to a user of the microwave oven.

Also, the subject may be an object lit up by a transmitter transmitting a signal by luminance change of light, and the augmented reality image may be video. Displaying the captured display image may include: displaying the video from any image of a plurality of images included in the video, the any image being from among an image including the object and a predetermined number of a plurality of images which are before and after an image including the object in display time. For example, the predetermined number may be 10 frames. Alternatively, the object may be a still image, and displaying the captured display image may include displaying the video from an image identical to the still image.

This enables, for example, as illustrated in FIG. 265, display of video in virtual reality such that the still image appears to start moving, and display of an image valuable to a user.

Also, the display method according to one aspect of the present disclosure includes: an imaging step of obtaining a captured image by capturing, as a subject with an imaging sensor, an object lit up by a transmitter that transmits a signal by luminance change of light; a decoding step of decoding the signal from the captured image; and a display step of reading video corresponding to the decoded signal from a memory, and superimposing the video on a target region corresponding to the subject in the captured image for display on a display. In the display step, the video is displayed from any image of a plurality of images included in the video, the any image being from among an image including the object and a predetermined number of a plurality of images which are before and after an image including the object in display time.

For example, the object may be a still image, and in the display step, the video may be displayed from an image identical to the still image. The imaging sensor and the captured image are, for example, the image sensor and the entire captured image in Embodiment 23, respectively. Also, the still image lit up may be a still image displayed on a display panel of an image display device, and may be an image such as a poster, a guide sign, or a signboard illuminated by light from the transmitter.

This enables, for example, as illustrated in FIG. 265, display of the video in virtual reality such that the still image appears to start moving, and display of an image valuable to a user.

The still image may include an outer frame of predetermined color. The display method may further include a recognition step of recognizing the target region from the captured image by the predetermined color. In the display step, the video may be resized so as to become identical to the recognized target region in size, and the resized video may be superimposed on the target region in the captured image and displayed on the display. For example, the outer frame of predetermined color is a white or black rectangular frame surrounding the still image, and is indicated by the recognition information in Embodiment 23. Then, the AR image in Embodiment 23 is resized and superimposed as video.

This enables display of the video more realistically such that the video appears to actually exist as the subject.

These general and specific aspects may be implemented using an apparatus, a system, a method, an integrated circuit, a computer program, or a computer-readable recording medium such as a CD-ROM, or any combination of apparatuses, systems, methods, integrated circuits, computer programs, or computer-readable recording media.

Embodiments will be described below in detail with reference to the drawings.

Each of the embodiments described below shows a general or specific example. The numerical values, shapes, materials, structural elements, the arrangement and connection of the structural elements, steps, the processing order of the steps etc. shown in the following embodiments are mere examples, and therefore do not limit the scope of the present disclosure. Therefore, among the structural elements in the following embodiments, structural elements not recited in any one of the independent claims representing the broadest concepts are described as arbitrary structural elements.

Embodiment 1

The following describes Embodiment 1.

(Observation of Luminance of Light Emitting Unit)

Figure 1:
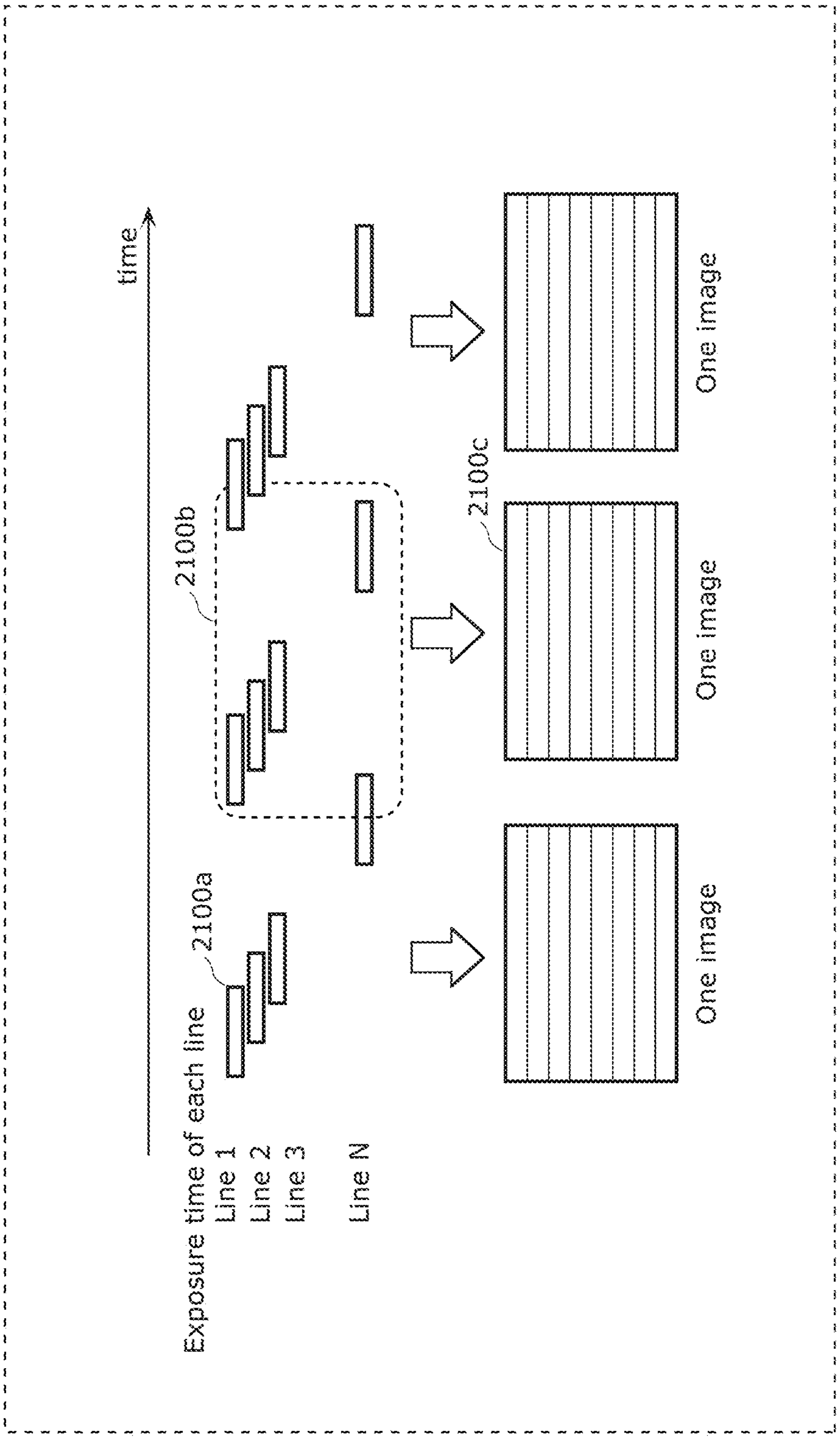
FIG. 1 is a diagram illustrating an example of an observation method of luminance of a light emitting unit in Embodiment 1.

The following proposes an imaging method in which, when capturing one image, all imaging elements are not exposed simultaneously but the times of starting and ending the exposure differ between the imaging elements. FIG. 1 illustrates an example of imaging where imaging elements arranged in a line are exposed simultaneously, with the exposure start time being shifted in order of lines. Here, the simultaneously exposed imaging elements are referred to as "exposure line", and the line of pixels in the image corresponding to the imaging elements is referred to as "bright line".

Figure 2:
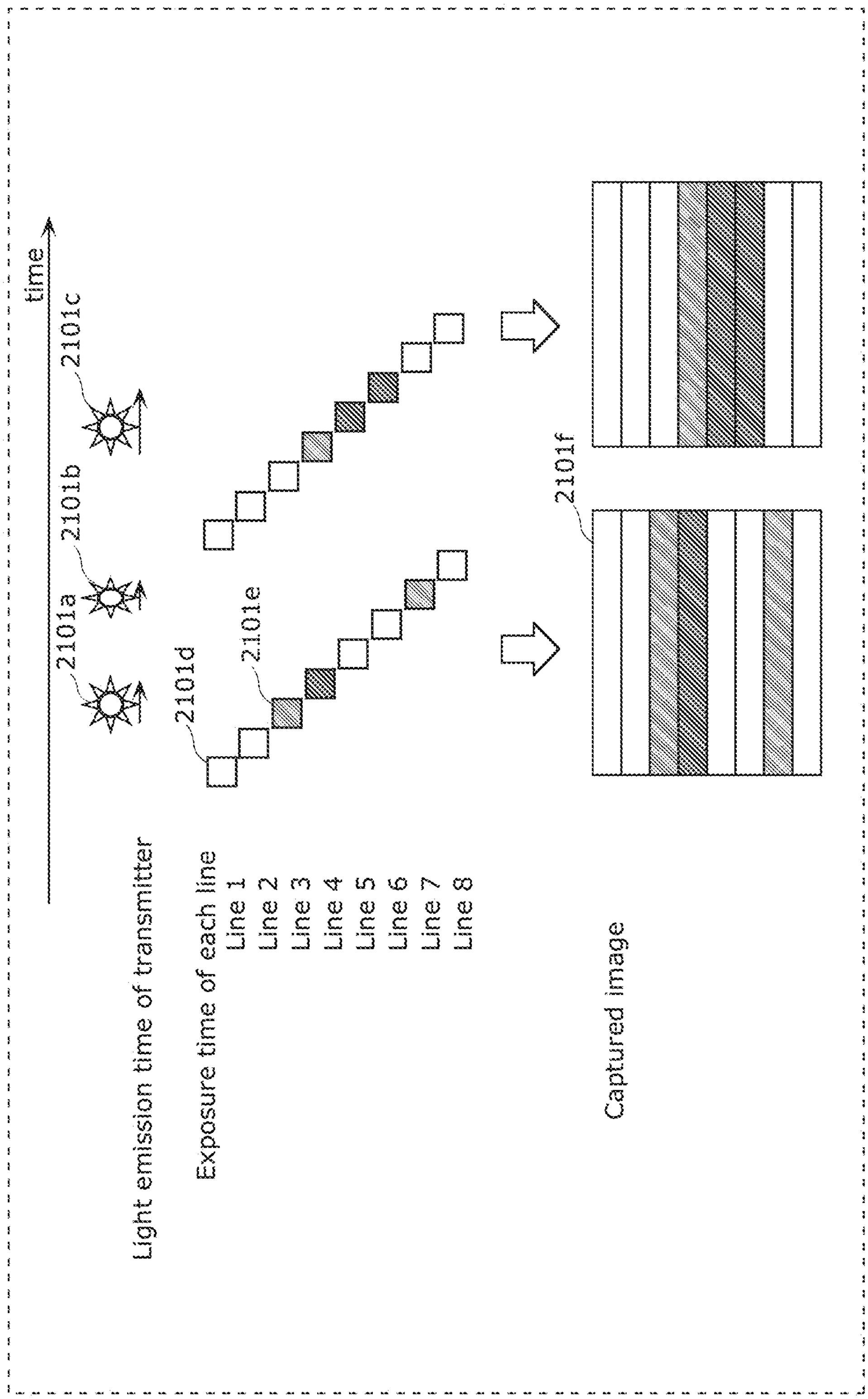
FIG. 2 is a diagram illustrating an example of an observation method of luminance of a light emitting unit in Embodiment 1.

In the case of capturing a blinking light source shown on the entire imaging elements using this imaging method, bright lines (lines of brightness in pixel value) along exposure lines appear in the captured image as illustrated in FIG. 2. By recognizing this bright line pattern, the luminance change of the light source at a speed higher than the imaging frame rate can be estimated. Hence, transmitting a signal as the luminance change of the light source enables communication at a speed not less than the imaging frame rate. In the case where the light source takes two luminance values to express a signal, the lower luminance value is referred to as "low" (LO), and the higher luminance value is referred to as "high" (HI). The low may be a state in which the light source emits no light, or a state in which the light source emits weaker light than in the high.

By this method, information transmission is performed at a speed higher than the imaging frame rate.

In the case where the number of exposure lines whose exposure times do not overlap each other is 20 in one captured image and the imaging frame rate is 30 fps, it is possible to recognize a luminance change in a period of 1.67 milliseconds. In the case where the number of exposure lines whose exposure times do not overlap each other is 1000, it is possible to recognize a luminance change in a period of 1/30000 second (about 33 microseconds). Note that the exposure time is set to less than 10 milliseconds, for example.

FIG. 2 illustrates a situation where, after the exposure of one exposure line ends, the exposure of the next exposure line starts.

In this situation, when transmitting information based on whether or not each exposure line receives at least a predetermined amount of light, information transmission at a speed of fl bits per second at the maximum can be realized where f is the number of frames per second (frame rate) and I is the number of exposure lines constituting one image.

Note that faster communication is possible in the case of performing time-difference exposure not on a line basis but on a pixel basis.

In such a case, when transmitting information based on whether or not each pixel receives at least a predetermined amount of light, the transmission speed is flm bits per second at the maximum, where m is the number of pixels per exposure line.

Figure 3:
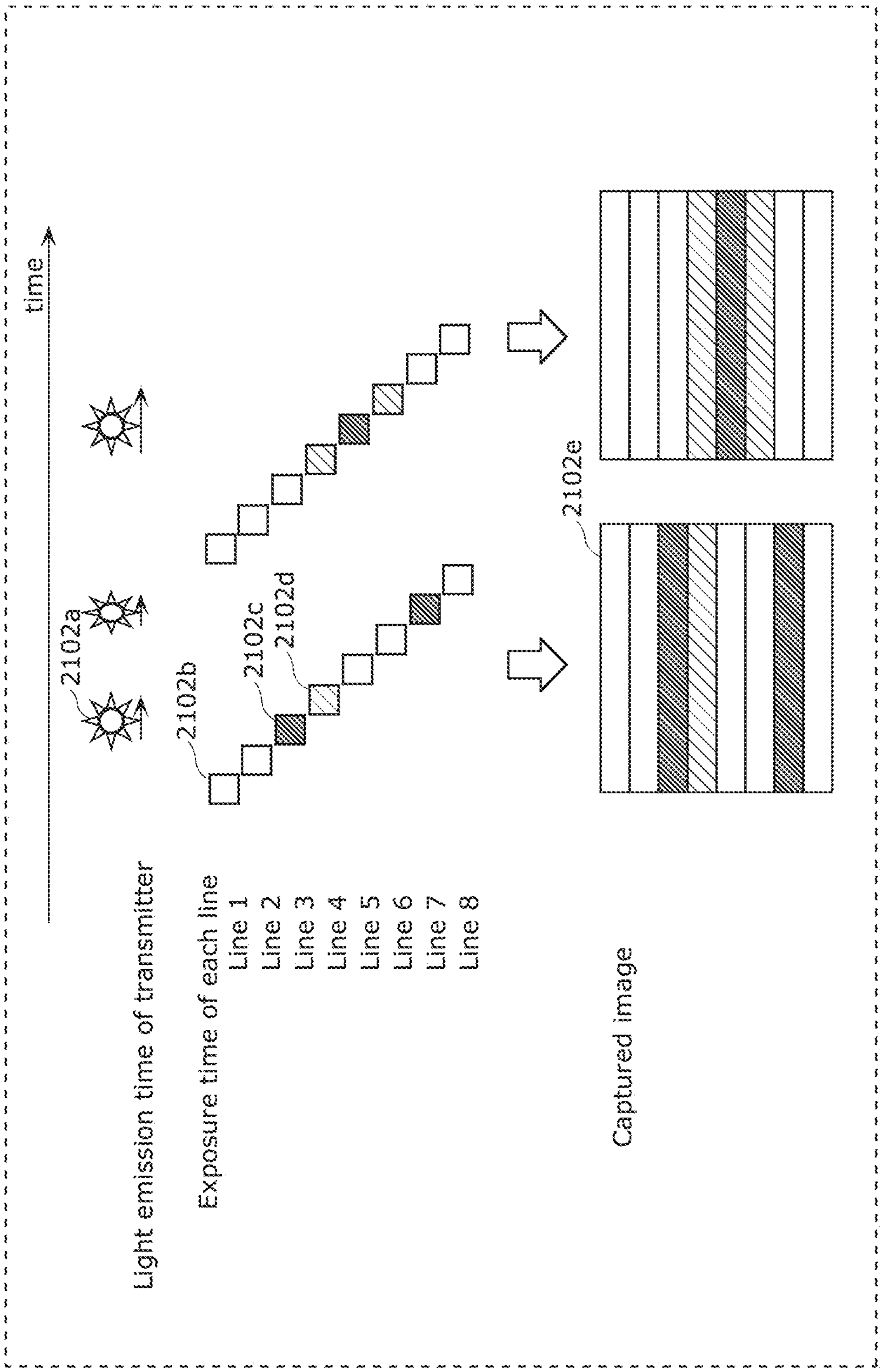
FIG. 3 is a diagram illustrating an example of an observation method of luminance of a light emitting unit in Embodiment 1.

If the exposure state of each exposure line caused by the light emission of the light emitting unit is recognizable in a plurality of levels as illustrated in FIG. 3, more information can be transmitted by controlling the light emission time of the light emitting unit in a shorter unit of time than the exposure time of each exposure line.

In the case where the exposure state is recognizable in Elv levels, information can be transmitted at a speed of flElv bits per second at the maximum.

Moreover, a fundamental period of transmission can be recognized by causing the light emitting unit to emit light with a timing slightly different from the timing of exposure of each exposure line.

Figure 4:
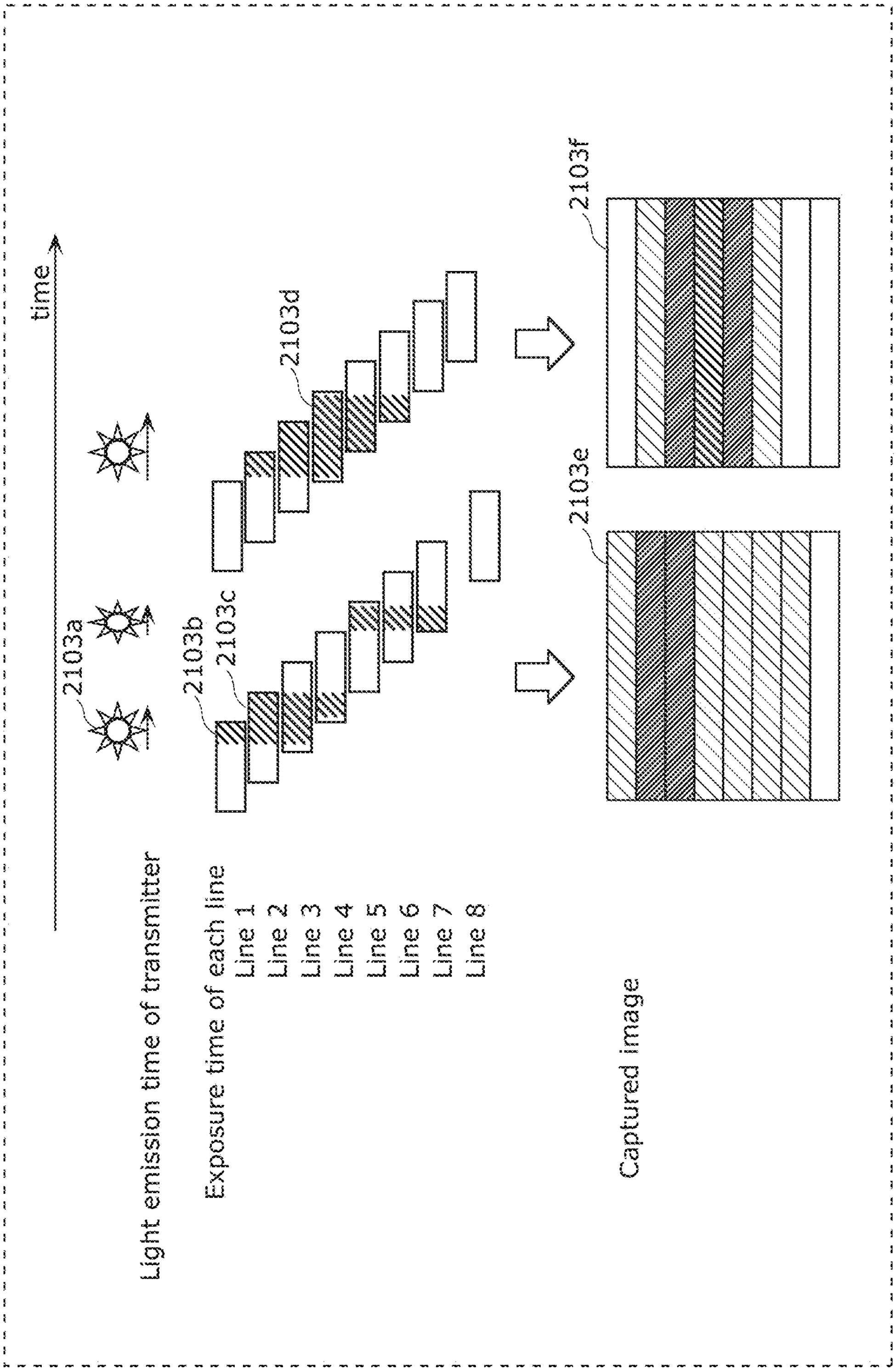
FIG. 4 is a diagram illustrating an example of an observation method of luminance of a light emitting unit in Embodiment 1.

FIG. 4 illustrates a situation where, before the exposure of one exposure line ends, the exposure of the next exposure line starts. That is, the exposure times of adjacent exposure lines partially overlap each other. This structure has the feature (1): the number of samples in a predetermined time can be increased as compared with the case where, after the exposure of one exposure line ends, the exposure of the next exposure line starts. The increase of the number of samples in the predetermined time leads to more appropriate detection of the light signal emitted from the light transmitter which is the subject. In other words, the error rate when detecting the light signal can be reduced. The structure also has the feature (2): the exposure time of each exposure line can be increased as compared with the case where, after the exposure of one exposure line ends, the exposure of the next exposure line starts. Accordingly, even in the case where the subject is dark, a brighter image can be obtained, i.e. the S/N ratio can be improved. Here, the structure in which the exposure times of adjacent exposure lines partially overlap each other does not need to be applied to all exposure lines, and part of the exposure lines may not have the structure of partially overlapping in exposure time. By keeping part of the exposure lines from partially overlapping in exposure time, the occurrence of an intermediate color caused by exposure time overlap is suppressed on the imaging screen, as a result of which bright lines can be detected more appropriately.

In this situation, the exposure time is calculated from the brightness of each exposure line, to recognize the light emission state of the light emitting unit.

Note that, in the case of determining the brightness of each exposure line in a binary fashion of whether or not the luminance is greater than or equal to a threshold, it is necessary for the light emitting unit to continue the state of emitting no light for at least the exposure time of each line, to enable the no light emission state to be recognized.

Figure 5A:
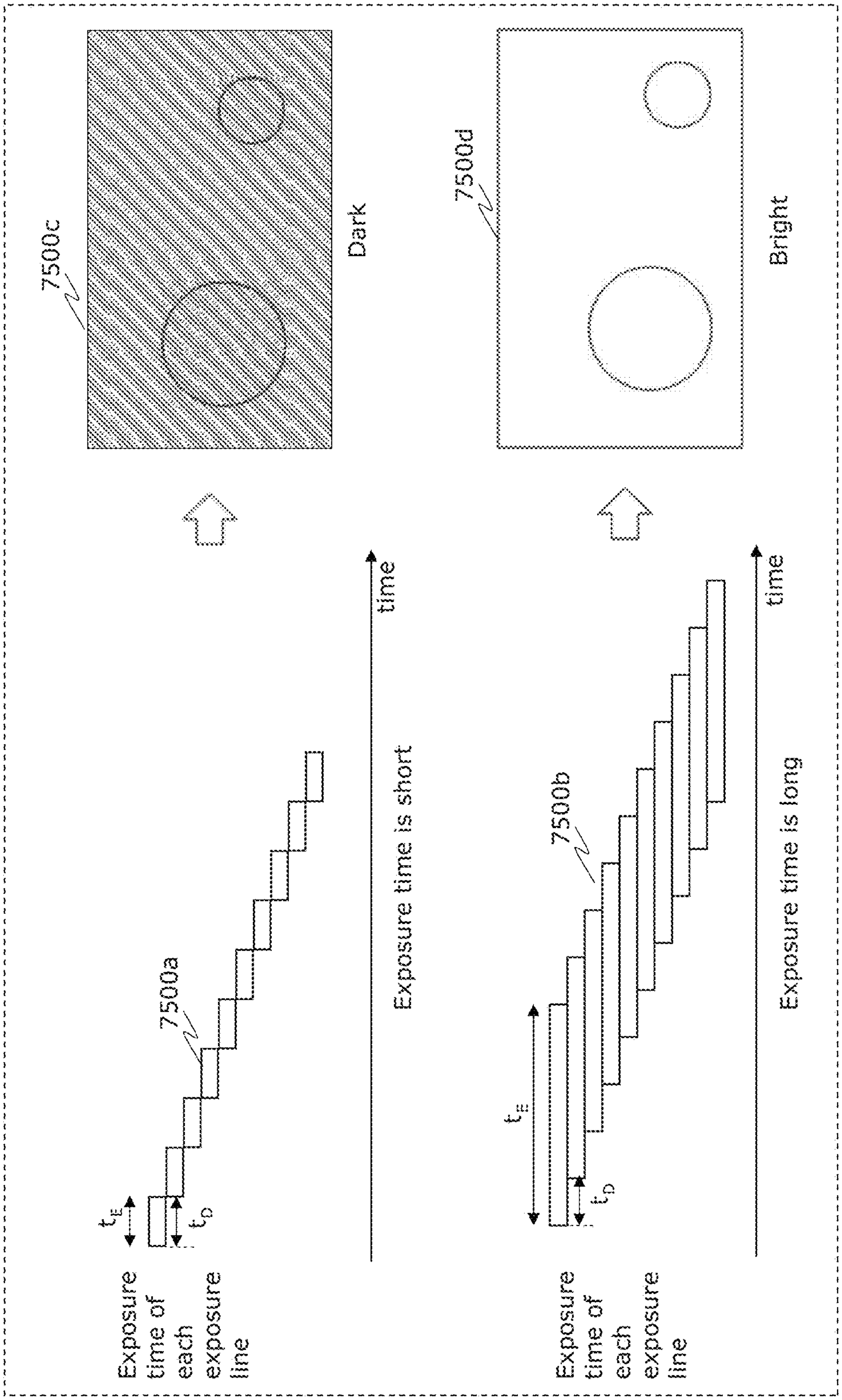
FIG. 5A is a diagram illustrating an example of an observation method of luminance of a light emitting unit in Embodiment 1.

FIG. 5A illustrates the influence of the difference in exposure time in the case where the exposure start time of each exposure line is the same. In 7500*a*, the exposure end time of one exposure line and the exposure start time of the next exposure line are the same. In 7500*b*, the exposure time is longer than that in 7500*a*. The structure in which the exposure times of adjacent exposure lines partially overlap each other as in 7500*b* allows a longer exposure time to be used. That is, more light enters the imaging element, so that a brighter image can be obtained. In addition, since the imaging sensitivity for capturing an image of the same brightness can be reduced, an image with less noise can be obtained. Communication errors are prevented in this way.

Figure 5B:
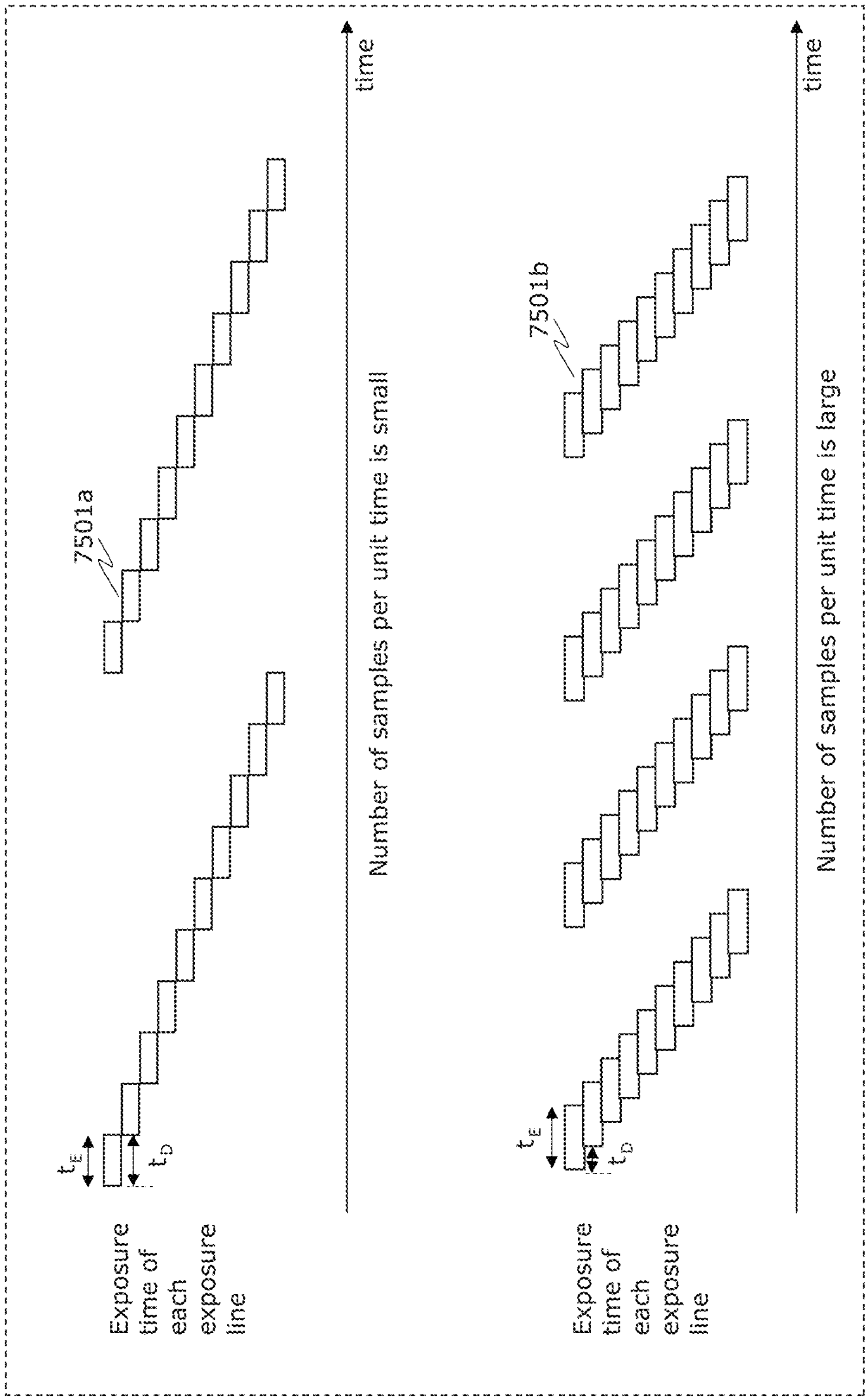
FIG. 5B is a diagram illustrating an example of an observation method of luminance of a light emitting unit in Embodiment 1.

FIG. 5B illustrates the influence of the difference in exposure start time of each exposure line in the case where the exposure time is the same. In 7501*a*, the exposure end time of one exposure line and the exposure start time of the next exposure line are the same. In 7501*b*, the exposure of one exposure line ends after the exposure of the next exposure line starts. The structure in which the exposure times of adjacent exposure lines partially overlap each other as in 7501*b* allows more lines to be exposed per unit time. This increases the resolution, so that more information can be obtained. Since the sample interval (i.e. the difference in exposure start time) is shorter, the luminance change of the light source can be estimated more accurately, contributing to a lower error rate. Moreover, the luminance change of the light source in a shorter time can be recognized. By exposure time overlap, light source blinking shorter than the exposure time can be recognized using the difference of the amount of exposure between adjacent exposure lines.

Moreover, in the case where the above-mentioned number of samples is small, that is, in the case where the sample interval (time difference $t_D$ illustrated in FIG. 5B) is long, the possibility that the light source luminance change cannot be accurately detected increases. In this case, the possibility can be suppressed by decreasing the exposure time. That is, the luminance change of the light source can be accurately detected. In addition, it is desirable that the exposure time satisfy exposure time>(sample interval−pulse width). The pulse width is a light pulse width in a period in which the light source luminance is High. This allows the luminance of High to be appropriately detected.

As described with reference to FIGS. 5A and 5B, in the structure in which each exposure line is sequentially exposed so that the exposure times of adjacent exposure lines partially overlap each other, the communication speed can be dramatically improved by using, for signal transmission, the bright line pattern generated by setting the exposure time shorter than in the normal imaging mode. Setting the exposure time in visible light communication to less than or equal to 1/480 second enables an appropriate bright line pattern to be generated. Here, it is necessary to set (exposure time)<1/8×f, where f is the frame frequency. Blanking during imaging is half of one frame at the maximum. That is, the blanking time is less than or equal to half of the imaging time. The actual imaging time is therefore ½f at the shortest. Besides, since 4-value information needs to be received within the time of ½f, it is necessary to at least set the exposure time to less than 1/(2f×4). Given that the normal frame rate is less than or equal to 60 frames per second, by setting the exposure time to less than or equal to 1/480 second, an appropriate bright line pattern is generated in the image data and thus fast signal transmission is achieved.

Figure 5C:
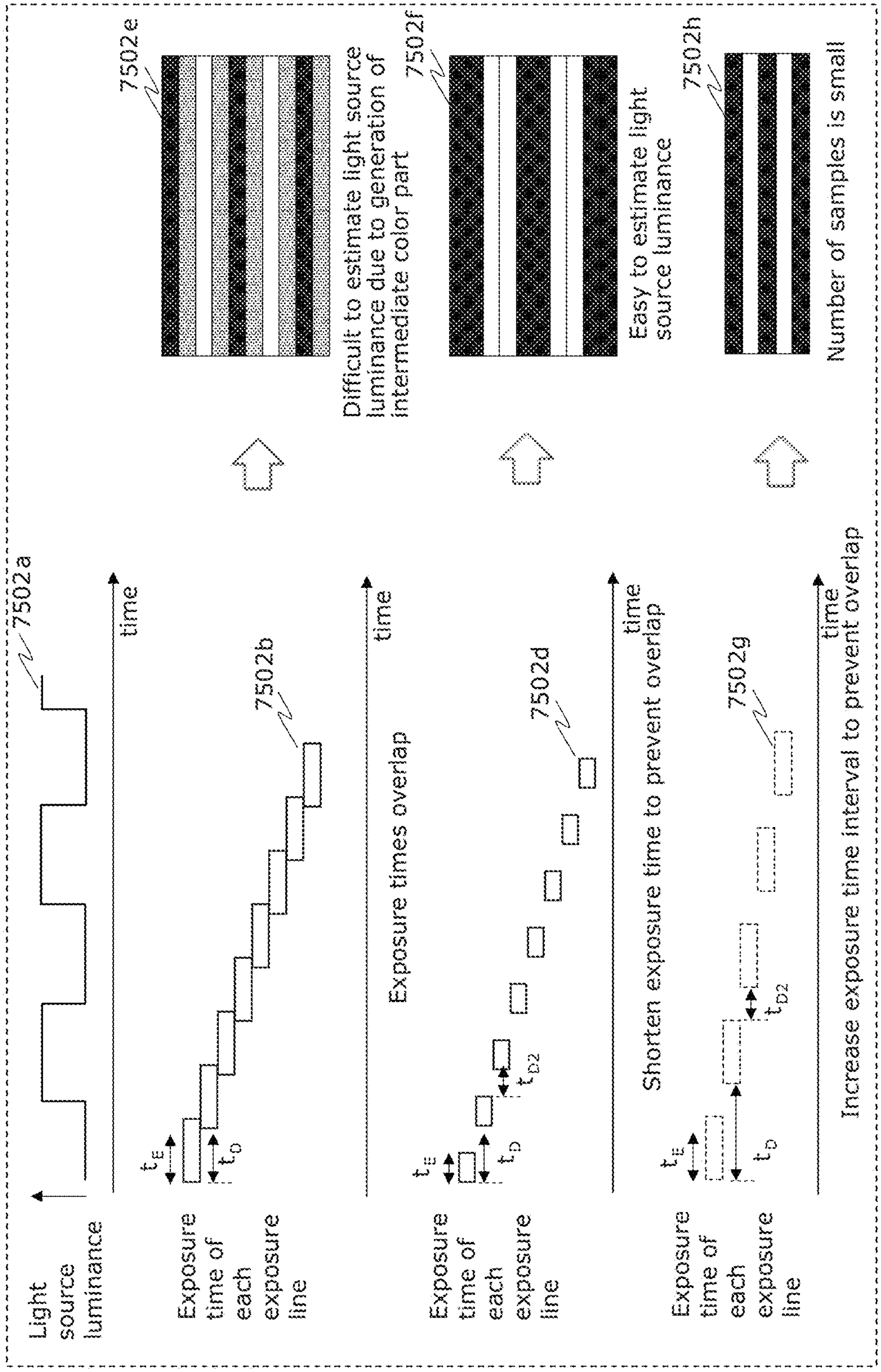
FIG. 5C is a diagram illustrating an example of an observation method of luminance of a light emitting unit in Embodiment 1.

FIG. 5C illustrates the advantage of using a short exposure time in the case where each exposure line does not overlap in exposure time. In the case where the exposure time is long, even when the light source changes in luminance in a binary fashion as in 7502*a*, an intermediate-color part tends to appear in the captured image as in 7502*e*, making it difficult to recognize the luminance change of the light source. By providing a predetermined non-exposure blank time (predetermined wait time) tD2 from when the exposure of one exposure line ends to when the exposure of the next exposure line starts as in 7502*d*, however, the luminance change of the light source can be recognized more easily. That is, a more appropriate bright line pattern can be detected as in 7502*f*. The provision of the predetermined non-exposure blank time is possible by setting a shorter exposure time tE than the time difference tD between the exposure start times of the exposure lines, as in 7502*d*. In the case where the exposure times of adjacent exposure lines partially overlap each other in the normal imaging mode, the exposure time is shortened from the normal imaging mode so as to provide the predetermined non-exposure blank time. In the case where the exposure end time of one exposure line and the exposure start time of the next exposure line are the same in the normal imaging mode, too, the exposure time is shortened so as to provide the predetermined non-exposure time. Alternatively, the predetermined non-exposure blank time (predetermined wait time) tD2 from when the exposure of one exposure line ends to when the exposure of the next exposure line starts may be provided by increasing the interval tD between the exposure start times of the exposure lines, as in 7502*g*. This structure allows a longer exposure time to be used, so that a brighter image can be captured. Moreover, a reduction in noise contributes to higher error tolerance. Meanwhile, this structure is disadvantageous in that the number of samples is small as in 7502*h*, because fewer exposure lines can be exposed in a predetermined time. Accordingly, it is desirable to use these structures depending on circumstances. For example, the estimation error of the luminance change of the light source can be reduced by using the former structure in the case where the imaging object is bright and using the latter structure in the case where the imaging object is dark.

Here, the structure in which the exposure times of adjacent exposure lines partially overlap each other does not need to be applied to all exposure lines, and part of the exposure lines may not have the structure of partially overlapping in exposure time. Moreover, the structure in which the predetermined non-exposure blank time (predetermined wait time) is provided from when the exposure of one exposure line ends to when the exposure of the next exposure line starts does not need to be applied to all exposure lines, and part of the exposure lines may have the structure of partially overlapping in exposure time. This makes it possible to take advantage of each of the structures. Furthermore, the same reading method or circuit may be used to read a signal in the normal imaging mode in which imaging is performed at the normal frame rate (30 fps, 60 fps) and the visible light communication mode in which imaging is performed with the exposure time less than or equal to 1/480 second for visible light communication. The use of the same reading method or circuit to read a signal eliminates the need to employ separate circuits for the normal imaging mode and the visible light communication mode. The circuit size can be reduced in this way.

Figure 5D:
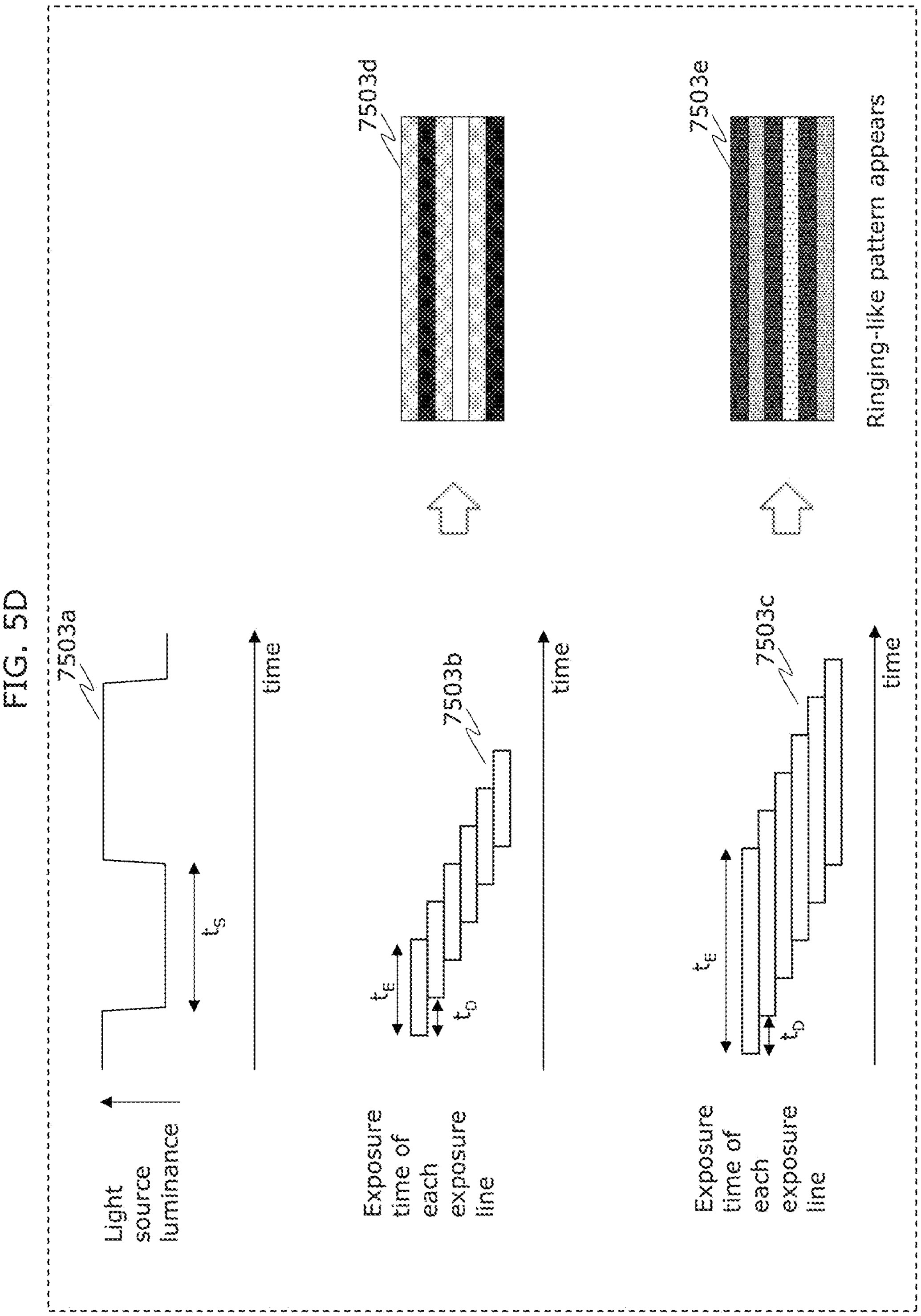
FIG. 5D is a diagram illustrating an example of an observation method of luminance of a light emitting unit in Embodiment 1.

FIG. 5D illustrates the relation between the minimum change time tS of light source luminance, the exposure time tE, the time difference tD between the exposure start times of the exposure lines, and the captured image. In the case where $tE+tD<tS$, imaging is always performed in a state where the light source does not change from the start to end of the exposure of at least one exposure line. As a result, an image with clear luminance is obtained as in 7503*d*, from which the luminance change of the light source is easily recognizable. In the case where $2tE>tS$, a bright line pattern different from the luminance change of the light source might be obtained, making it difficult to recognize the luminance change of the light source from the captured image.

Figure 5E:
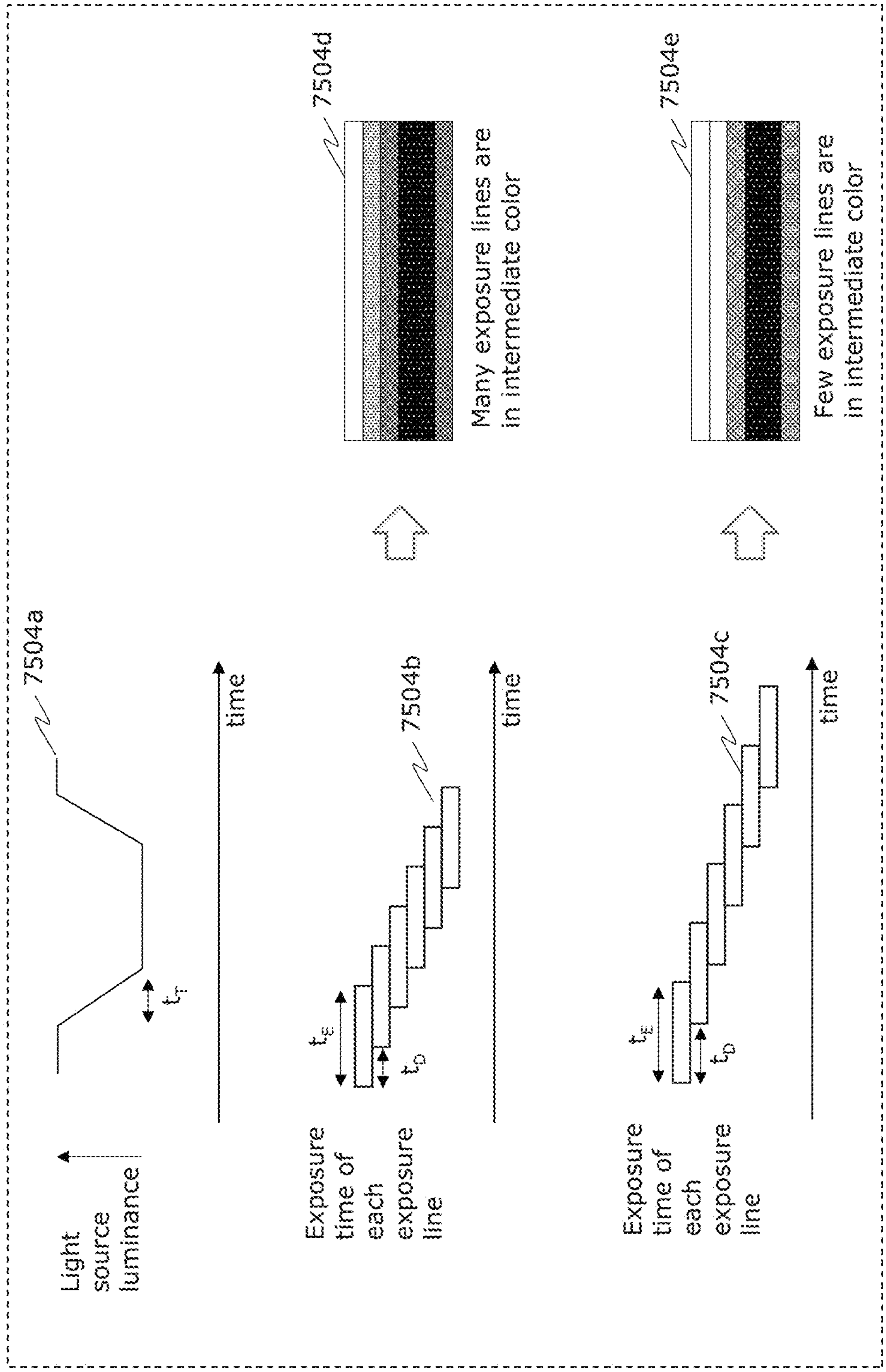
FIG. 5E is a diagram illustrating an example of an observation method of luminance of a light emitting unit in Embodiment 1.

FIG. 5E illustrates the relation between the transition time tT of light source luminance and the time difference tD between the exposure start times of the exposure lines. When tD is large as compared with tT, fewer exposure lines are in the intermediate color, which facilitates estimation of light source luminance. It is desirable that $tD>tT$, because the number of exposure lines in the intermediate color is two or less consecutively. Since tT is less than or equal to 1 microsecond in the case where the light source is an LED and about 5 microseconds in the case where the light source is an organic EL device, setting tD to greater than or equal to 5 microseconds facilitates estimation of light source luminance.

Figure 5F:
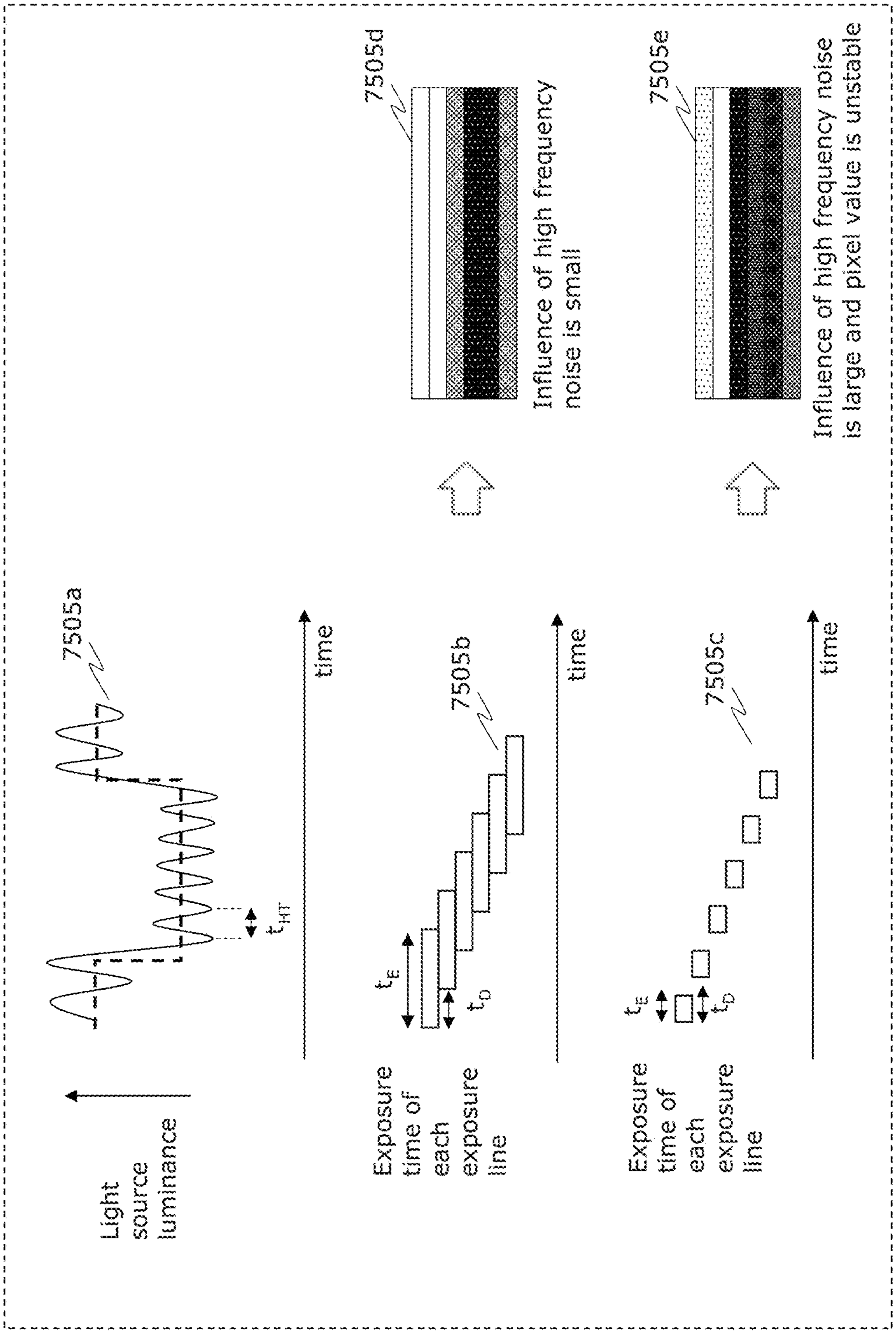
FIG. 5F is a diagram illustrating an example of an observation method of luminance of a light emitting unit in Embodiment 1.

FIG. 5F illustrates the relation between the high frequency noise tHT of light source luminance and the exposure time tE. When tE is large as compared with tHT, the captured image is less influenced by high frequency noise, which facilitates estimation of light source luminance. When tE is an integral multiple of tHT, there is no influence of high frequency noise, and estimation of light source luminance is easiest. For estimation of light source luminance, it is desirable that $tE>tHT$. High frequency noise is mainly caused by a switching power supply circuit. Since tHT is less than or equal to 20 microseconds in many switching power supplies for lightings, setting tE to greater than or equal to 20 microseconds facilitates estimation of light source luminance.

Figure 5G:
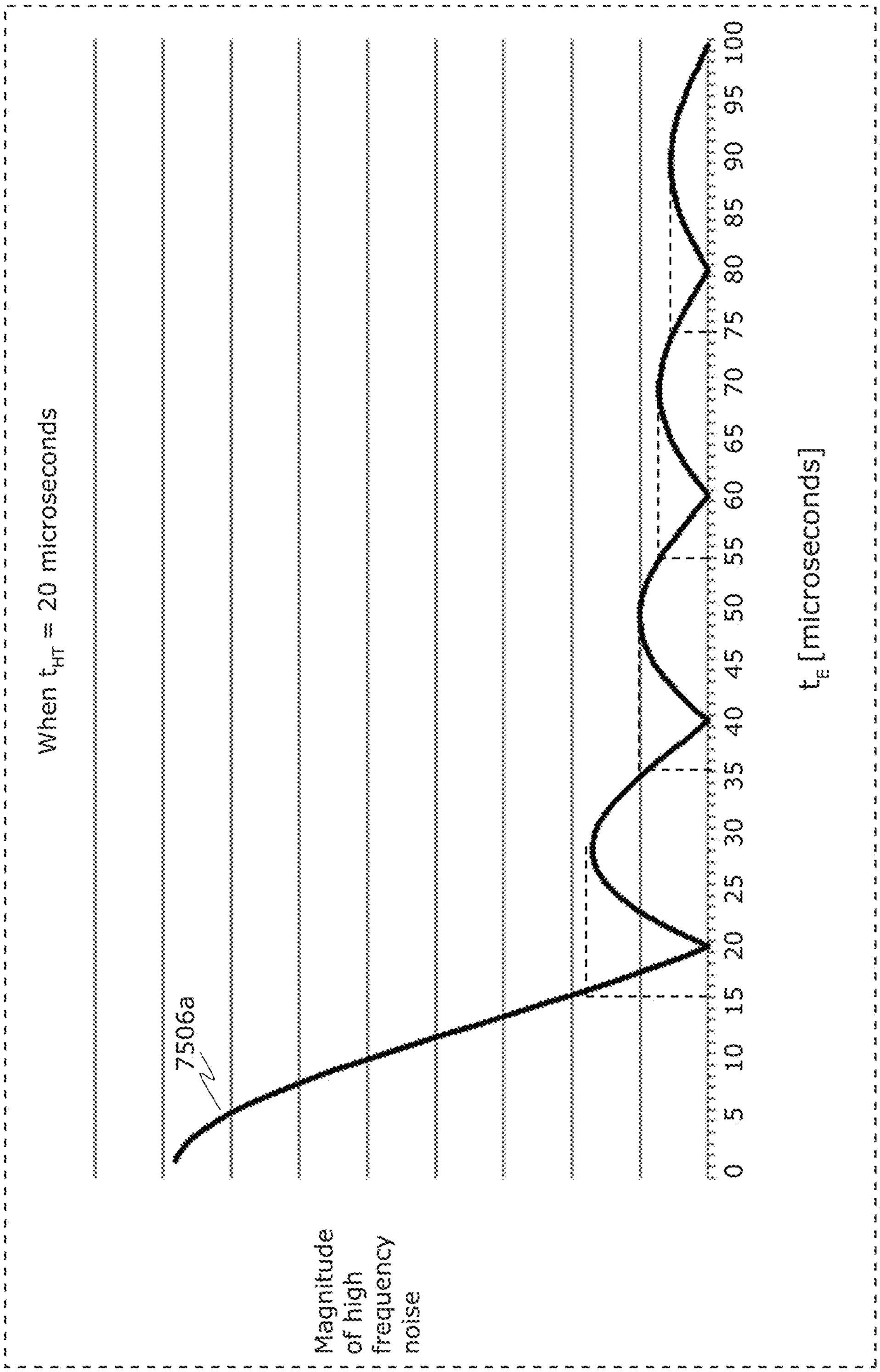
FIG. 5G is a diagram illustrating an example of an observation method of luminance of a light emitting unit in Embodiment 1.

FIG. 5G is a graph representing the relation between the exposure time tE and the magnitude of high frequency noise when tHT is 20 microseconds. Given that tHT varies depending on the light source, the graph demonstrates that it is efficient to set tE to greater than or equal to 15 microseconds, greater than or equal to 35 microseconds, greater than or equal to 54 microseconds, or greater than or equal to 74 microseconds, each of which is a value equal to the value when the amount of noise is at the maximum. Though tE is desirably larger in terms of high frequency noise reduction, there is also the above-mentioned property that, when tE is smaller, an intermediate-color part is less likely to occur and estimation of light source luminance is easier. Therefore, tE may be set to greater than or equal to 15 microseconds when the light source luminance change period is 15 to 35 microseconds, to greater than or equal to 35 microseconds when the light source luminance change period is 35 to 54 microseconds, to greater than or equal to 54 microseconds when the light source luminance change period is 54 to 74 microseconds, and to greater than or equal to 74 microseconds when the light source luminance change period is greater than or equal to 74 microseconds.

Figure 5H:
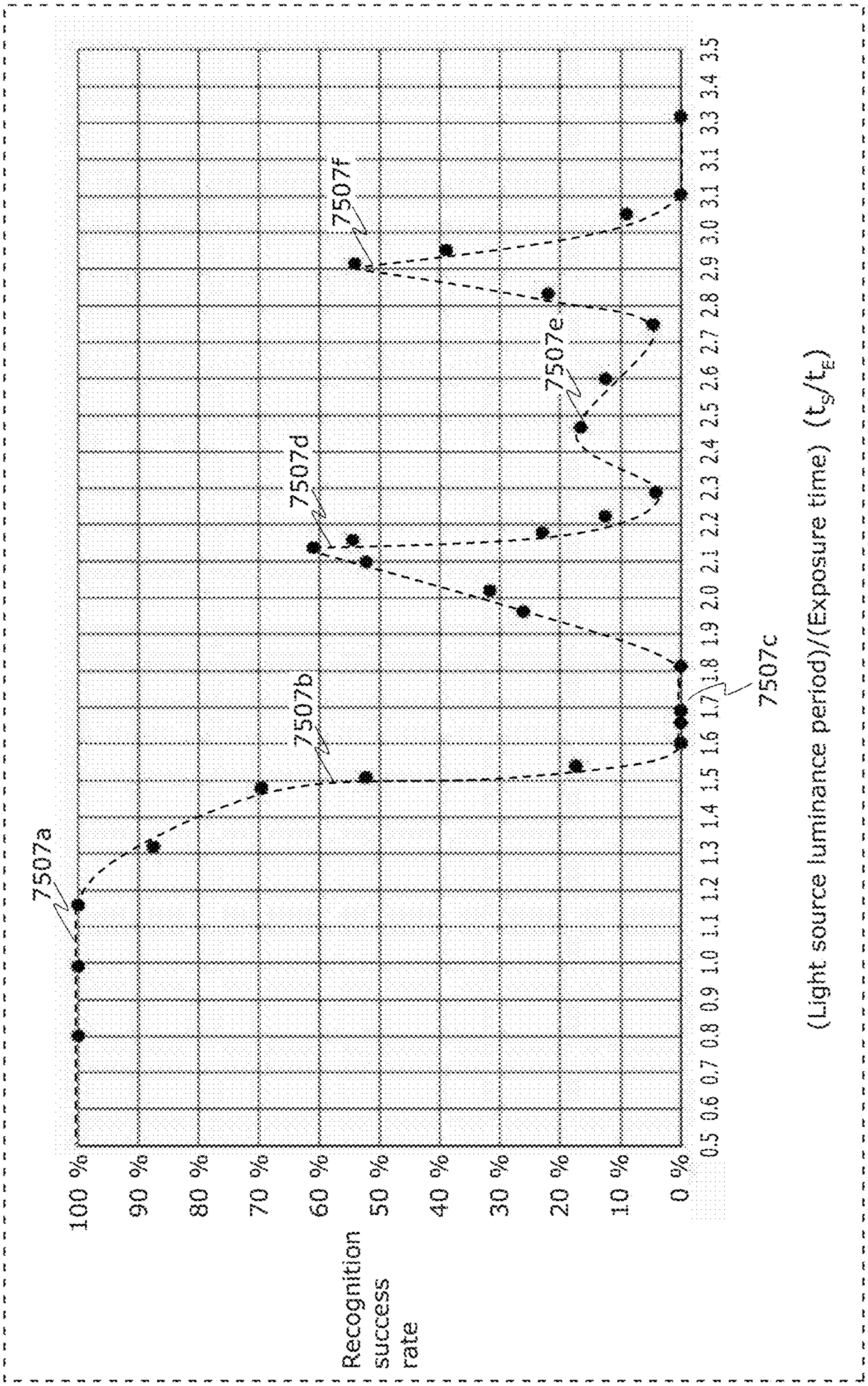
FIG. 5H is a diagram illustrating an example of an observation method of luminance of a light emitting unit in Embodiment 1.

FIG. 5H illustrates the relation between the exposure time tE and the recognition success rate. Since the exposure time tE is relative to the time during which the light source luminance is constant, the horizontal axis represents the value (relative exposure time) obtained by dividing the light source luminance change period tS by the exposure time tE. It can be understood from the graph that the recognition success rate of approximately 100% can be attained by setting the relative exposure time to less than or equal to 1.2. For example, the exposure time may be set to less than or equal to approximately 0.83 millisecond in the case where the transmission signal is 1 kHz. Likewise, the recognition success rate greater than or equal to 95% can be attained by setting the relative exposure time to less than or equal to 1.25, and the recognition success rate greater than or equal to 80% can be attained by setting the relative exposure time to less than or equal to 1.4. Moreover, since the recognition success rate sharply decreases when the relative exposure time is about 1.5 and becomes roughly 0% when the relative exposure time is 1.6, it is necessary to set the relative exposure time not to exceed 1.5. After the recognition rate becomes 0% at 7507*c*, it increases again at 7507*d*, 7507*e*, and 7507*f*. Accordingly, for example to capture a bright image with a longer exposure time, the exposure time may be set so that the relative exposure time is 1.9 to 2.2, 2.4 to 2.6, or 2.8 to 3.0. Such an exposure time may be used, for instance, as an intermediate mode.

Figure 6A:
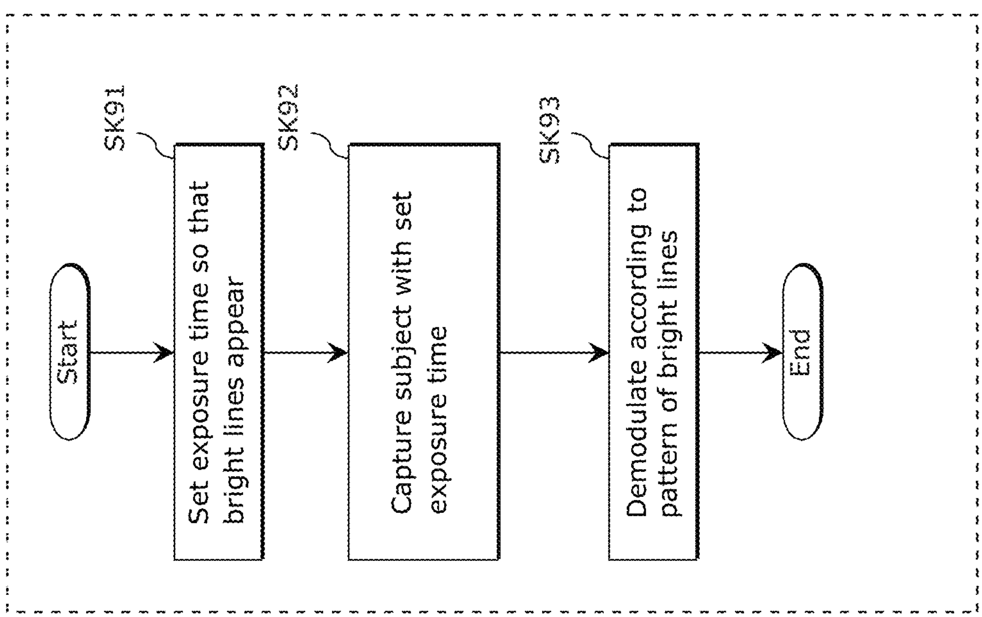
FIG. 6A is a flowchart of an information communication method in Embodiment 1.

FIG. 6A is a flowchart of an information communication method in this embodiment.

The information communication method in this embodiment is an information communication method of obtaining information from a subject, and includes Steps SK91 to SK93.

In detail, the information communication method includes: a first exposure time setting step SK91 of setting a first exposure time of an image sensor so that, in an image obtained by capturing the subject by the image sensor, a plurality of bright lines corresponding to a plurality of exposure lines included in the image sensor appear according to a change in luminance of the subject; a first image obtainment step SK92 of obtaining a bright line image including the plurality of bright lines, by capturing the subject changing in luminance by the image sensor with the set first exposure time; and an information obtainment step SK93 of obtaining the information by demodulating data specified by a pattern of the plurality of bright lines included in the obtained bright line image, wherein in the first image obtainment step SK92, exposure starts sequentially for the plurality of exposure lines each at a different time, and exposure of each of the plurality of exposure lines starts after a predetermined blank time elapses from when exposure of an adjacent exposure line adjacent to the exposure line ends.

Figure 6B:
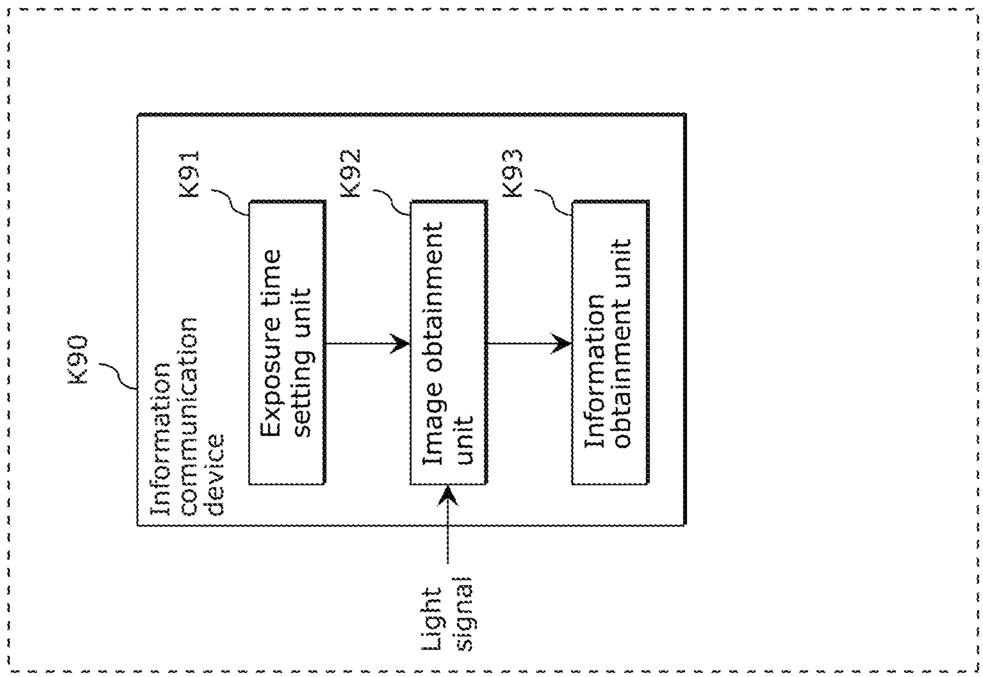
FIG. 6B is a block diagram of an information communication device in Embodiment 1.

FIG. 6B is a block diagram of an information communication device in this embodiment.

An information communication device K90 in this embodiment is an information communication device that obtains information from a subject, and includes structural elements K91 to K93.

In detail, the information communication device K90 includes: an exposure time setting unit K91 that sets an exposure time of an image sensor so that, in an image obtained by capturing the subject by the image sensor, a plurality of bright lines corresponding to a plurality of exposure lines included in the image sensor appear according to a change in luminance of the subject; an image obtainment unit K92 that includes the image sensor, and obtains a bright line image including the plurality of bright lines by capturing the subject changing in luminance with the set exposure time; and an information obtainment unit K93 that obtains the information by demodulating data specified by a pattern of the plurality of bright lines included in the obtained bright line image, wherein exposure starts sequentially for the plurality of exposure lines each at a different time, and exposure of each of the plurality of exposure lines starts after a predetermined blank time elapses from when exposure of an adjacent exposure line adjacent to the exposure line ends.

In the information communication method and the information communication device K90 illustrated in FIGS. 6A and 6B, the exposure of each of the plurality of exposure lines starts a predetermined blank time after the exposure of the adjacent exposure line adjacent to the exposure line ends, for instance as illustrated in FIG. 5C. This eases the recognition of the change in luminance of the subject. As a result, the information can be appropriately obtained from the subject.

It should be noted that in the above embodiment, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. For example, the program causes a computer to execute the information communication method illustrated in the flowchart of FIG. 6A.

Embodiment 2

This embodiment describes each example of application using a receiver such as a smartphone which is the information communication device K90 and a transmitter for transmitting information as a blink pattern of the light source such as an LED or an organic EL device in Embodiment 1 described above.

In the following description, the normal imaging mode or imaging in the normal imaging mode is referred to as "normal imaging", and the visible light communication mode or imaging in the visible light communication mode is referred to as "visible light imaging" (visible light communication). Imaging in the intermediate mode may be used instead of normal imaging and visible light imaging, and the intermediate image may be used instead of the below-mentioned synthetic image.

Figure 7:
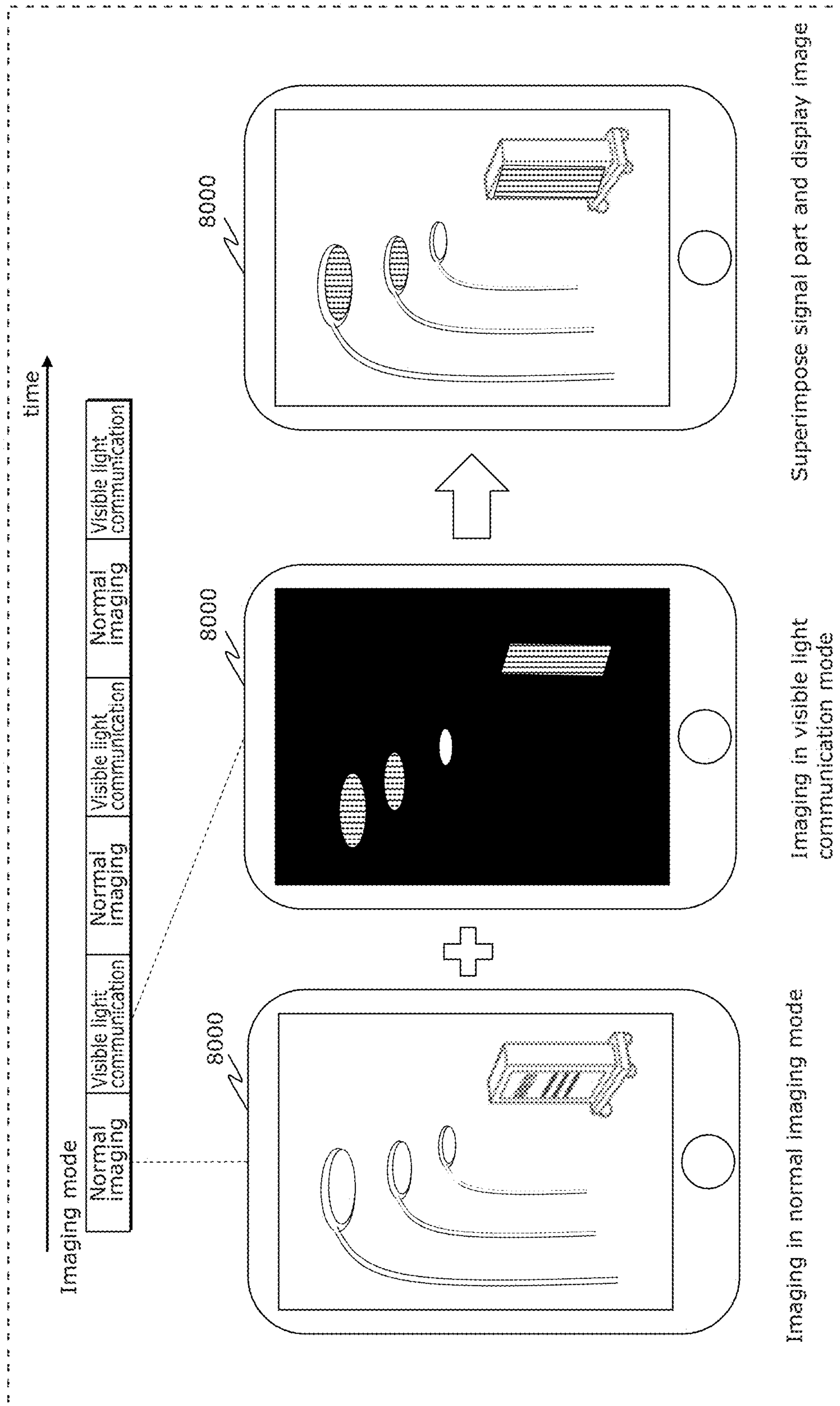
FIG. 7 is a diagram illustrating an example of imaging operation of a receiver in Embodiment 2.

FIG. 7 is a diagram illustrating an example of imaging operation of a receiver in this embodiment.

The receiver 8000 switches the imaging mode in such a manner as normal imaging, visible light communication, normal imaging, . . . . The receiver 8000 synthesizes the normal captured image and the visible light communication image to generate a synthetic image in which the bright line pattern, the subject, and its surroundings are clearly shown, and displays the synthetic image on the display. The synthetic image is an image generated by superimposing the bright line pattern of the visible light communication image on the signal transmission part of the normal captured image. The bright line pattern, the subject, and its surroundings shown in the synthetic image are clear, and have the level of clarity sufficiently recognizable by the user. Displaying such a synthetic image enables the user to more distinctly find out from which position the signal is being transmitted.

Figure 8:
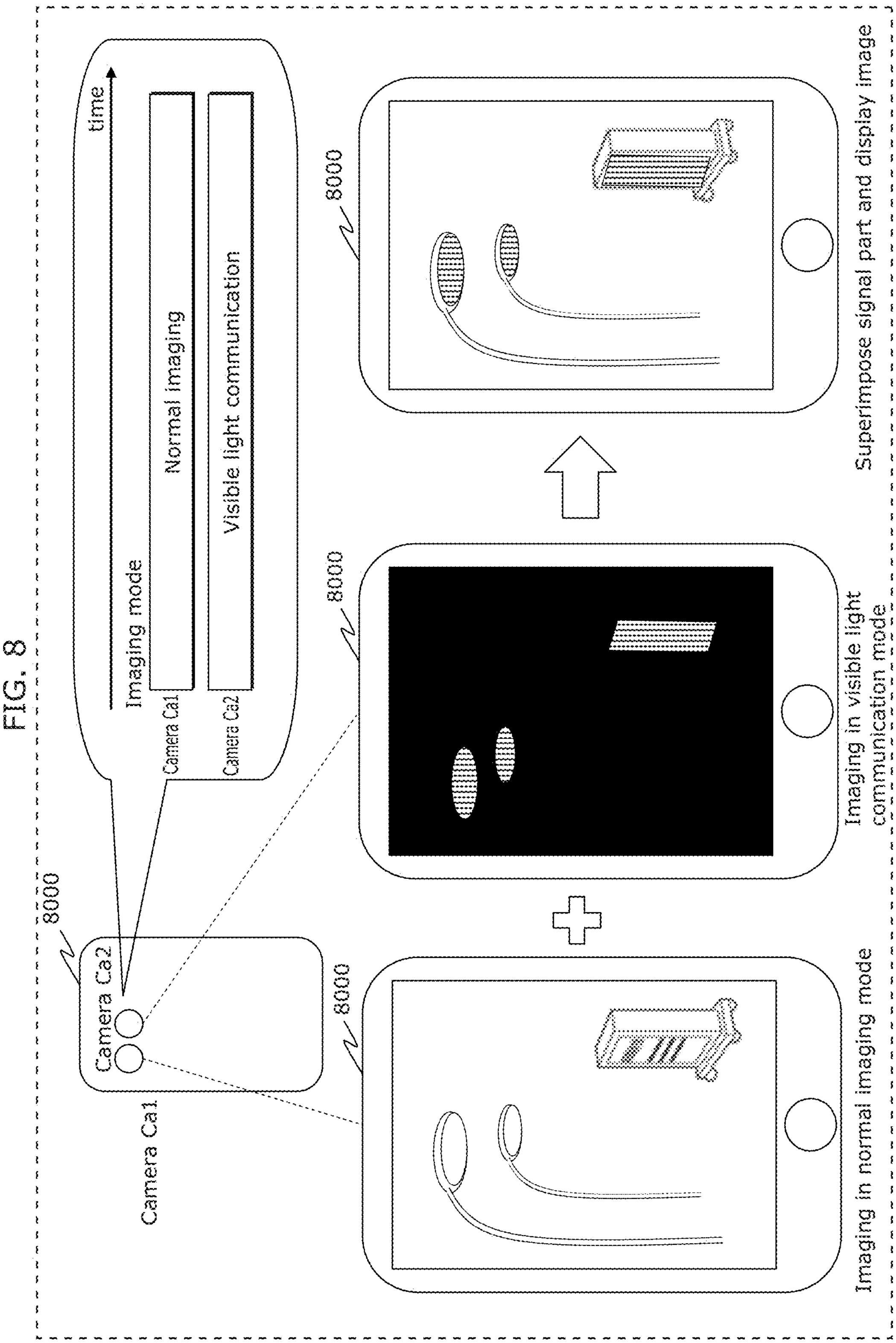
FIG. 8 is a diagram illustrating another example of imaging operation of a receiver in Embodiment 2.

FIG. 8 is a diagram illustrating another example of imaging operation of a receiver in this embodiment.

The receiver 8000 includes a camera Ca1 and a camera Ca2. In the receiver 8000, the camera Ca1 performs normal imaging, and the camera Ca2 performs visible light imaging. Thus, the camera Ca1 obtains the above-mentioned normal captured image, and the camera Ca2 obtains the above-mentioned visible light communication image. The receiver 8000 synthesizes the normal captured image and the visible light communication image to generate the above-mentioned synthetic image, and displays the synthetic image on the display.

Figure 9:
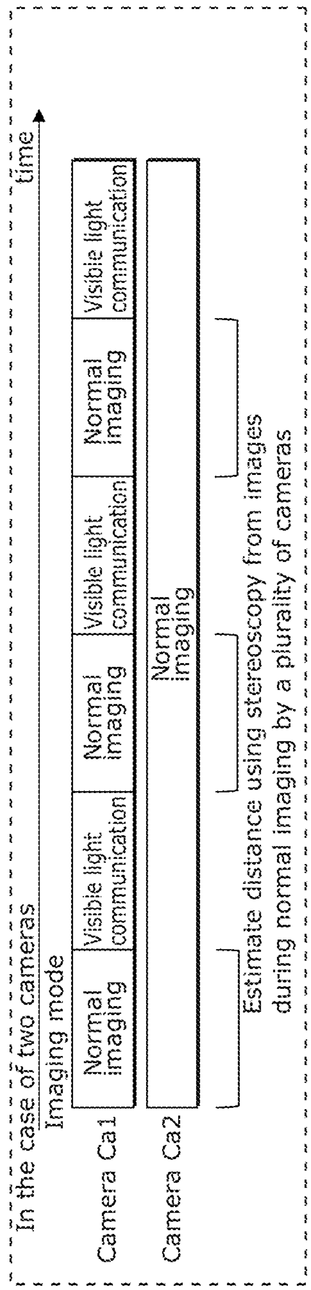
FIG. 9 is a diagram illustrating another example of imaging operation of a receiver in Embodiment 2.

FIG. 9 is a diagram illustrating another example of imaging operation of a receiver in this embodiment.

In the receiver 8000 including two cameras, the camera Ca1 switches the imaging mode in such a manner as normal imaging, visible light communication, normal imaging, . . . . Meanwhile, the camera Ca2 continuously performs normal imaging. When normal imaging is being performed by the cameras Ca1 and Ca2 simultaneously, the receiver 8000 estimates the distance (hereafter referred to as "subject distance") from the receiver 8000 to the subject based on the normal captured images obtained by these cameras, through the use of stereoscopy (triangulation principle). By using such estimated subject distance, the receiver 8000 can superimpose the bright line pattern of the visible light communication image on the normal captured image at the appropriate position. The appropriate synthetic image can be generated in this way.

Figure 10:
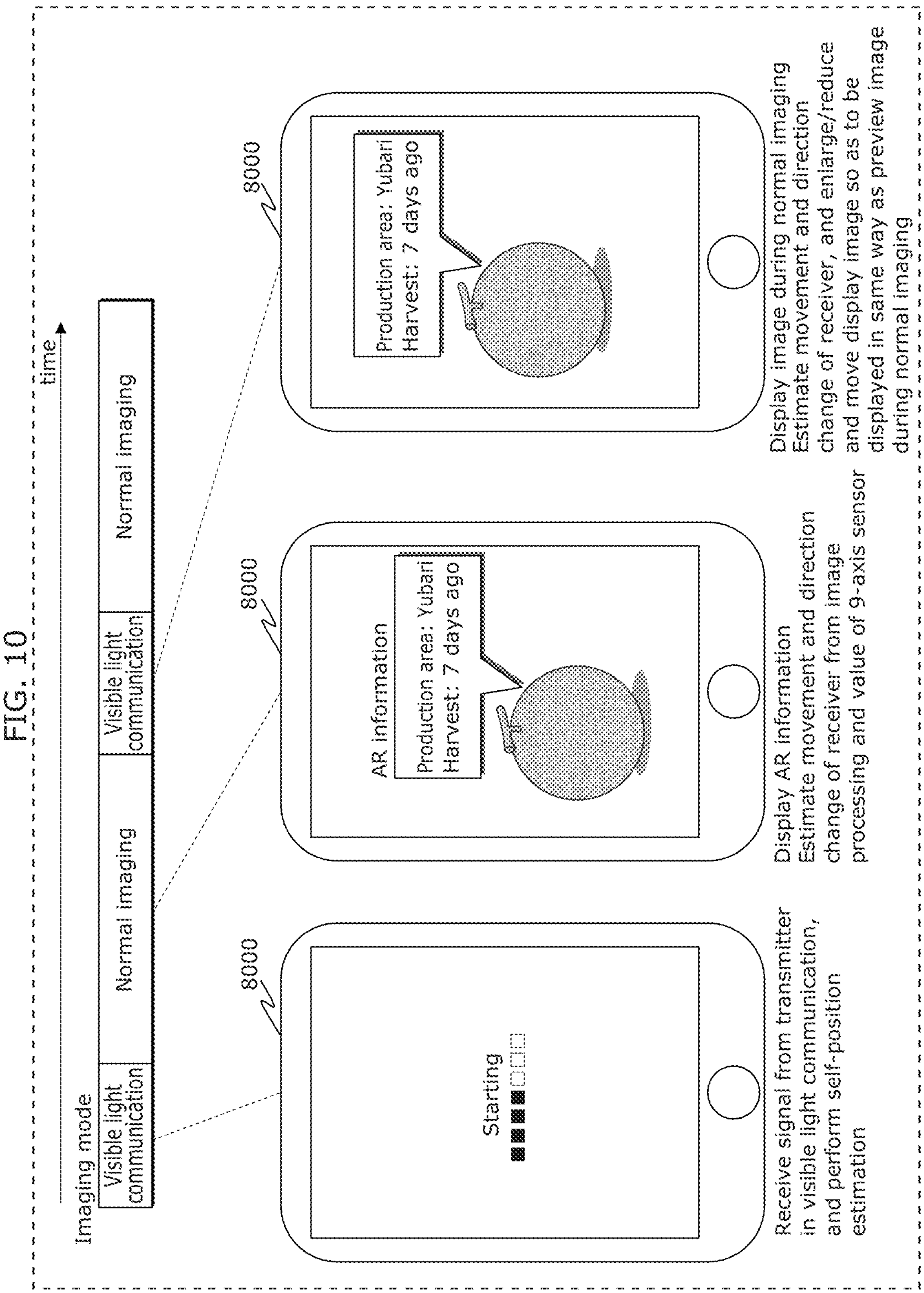
FIG. 10 is a diagram illustrating an example of display operation of a receiver in Embodiment 2.

FIG. 10 is a diagram illustrating an example of display operation of a receiver in this embodiment.

The receiver 8000 switches the imaging mode in such a manner as visible light communication, normal imaging, visible light communication, . . . , as mentioned above. Upon performing visible light communication first, the receiver 8000 starts an application program. The receiver 8000 then estimates its position based on the signal received by visible light communication. Next, when performing normal imaging, the receiver 8000 displays augmented reality (AR) information on the normal captured image obtained by normal imaging. The AR information is obtained based on, for example, the position estimated as mentioned above. The receiver 8000 also estimates the change in movement and direction of the receiver 8000 based on the detection result of the 9-axis sensor, the motion detection in the normal captured image, and the like, and moves the display position of the AR information according to the estimated change in movement and direction. This enables the AR information to follow the subject image in the normal captured image.

When switching the imaging mode from normal imaging to visible light communication, in visible light communication the receiver 8000 superimposes the AR information on the latest normal captured image obtained in immediately previous normal imaging. The receiver 8000 then displays the normal captured image on which the AR information is superimposed. The receiver 8000 also estimates the change in movement and direction of the receiver 8000 based on the detection result of the 9-axis sensor, and moves the AR information and the normal captured image according to the estimated change in movement and direction, in the same way as in normal imaging. This enables the AR information to follow the subject image in the normal captured image according to the movement of the receiver 8000 and the like in visible light communication, as in normal imaging. Moreover, the normal image can be enlarged or reduced according to the movement of the receiver 8000 and the like.

Figure 11:
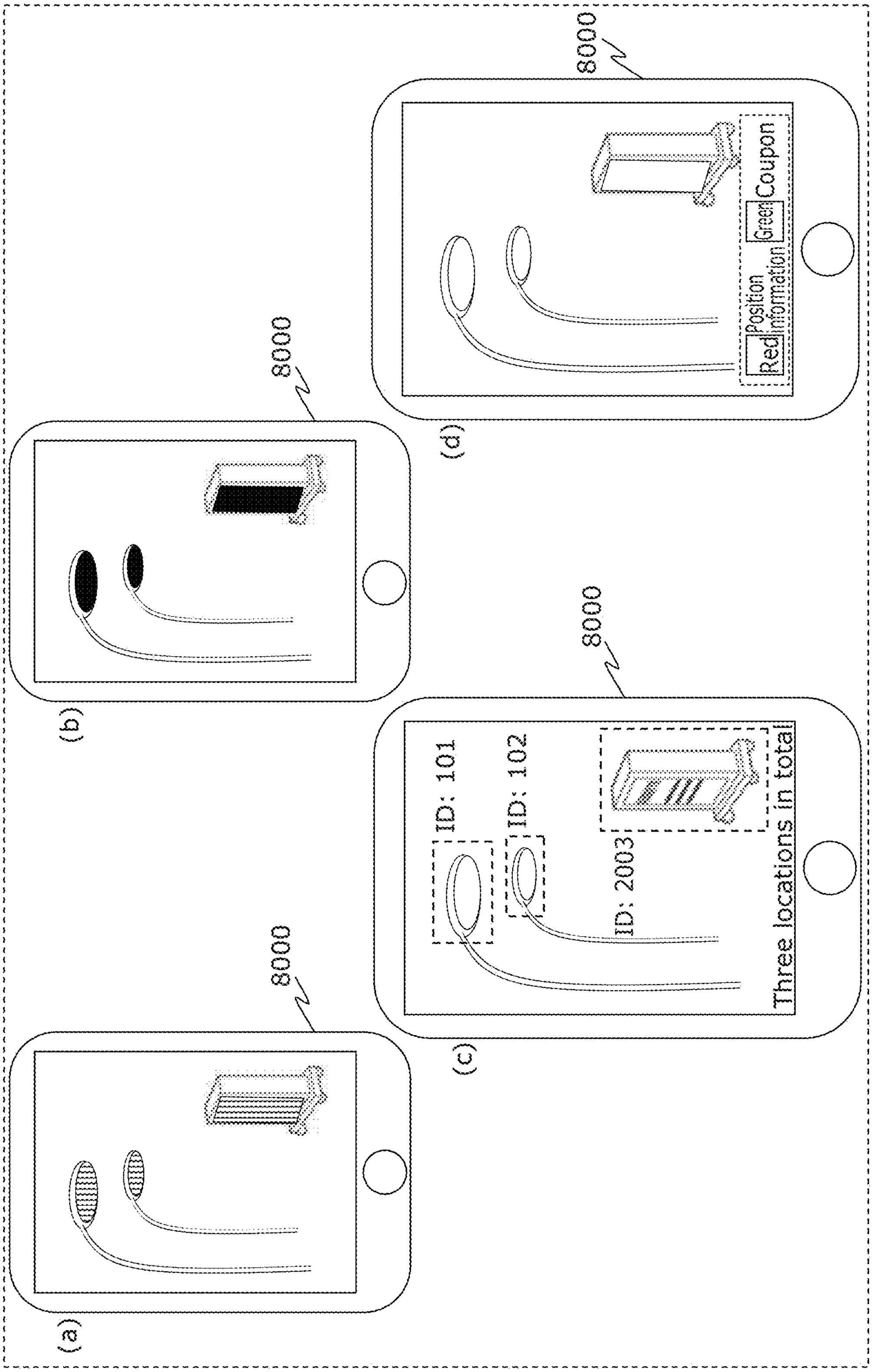
FIG. 11 is a diagram illustrating an example of display operation of a receiver in Embodiment 2.

FIG. 11 is a diagram illustrating an example of display operation of a receiver in this embodiment.

For example, the receiver 8000 may display the synthetic image in which the bright line pattern is shown, as illustrated in (a) in FIG. 11. As an alternative, the receiver 8000 may superimpose, instead of the bright line pattern, a signal specification object which is an image having a predetermined color for notifying signal transmission on the normal captured image to generate the synthetic image, and display the synthetic image, as illustrated in (b) in FIG. 11.

As another alternative, the receiver 8000 may display, as the synthetic image, the normal captured image in which the signal transmission part is indicated by a dotted frame and an identifier (e.g. ID: 101, ID: 102, etc.), as illustrated in (c) in FIG. 11. As another alternative, the receiver 8000 may superimpose, instead of the bright line pattern, a signal identification object which is an image having a predetermined color for notifying transmission of a specific type of signal on the normal captured image to generate the synthetic image, and display the synthetic image, as illustrated in (d) in FIG. 11. In this case, the color of the signal identification object differs depending on the type of signal output from the transmitter. For example, a red signal identification object is superimposed in the case where the signal output from the transmitter is position information, and a green signal identification object is superimposed in the case where the signal output from the transmitter is a coupon.

Figure 12:
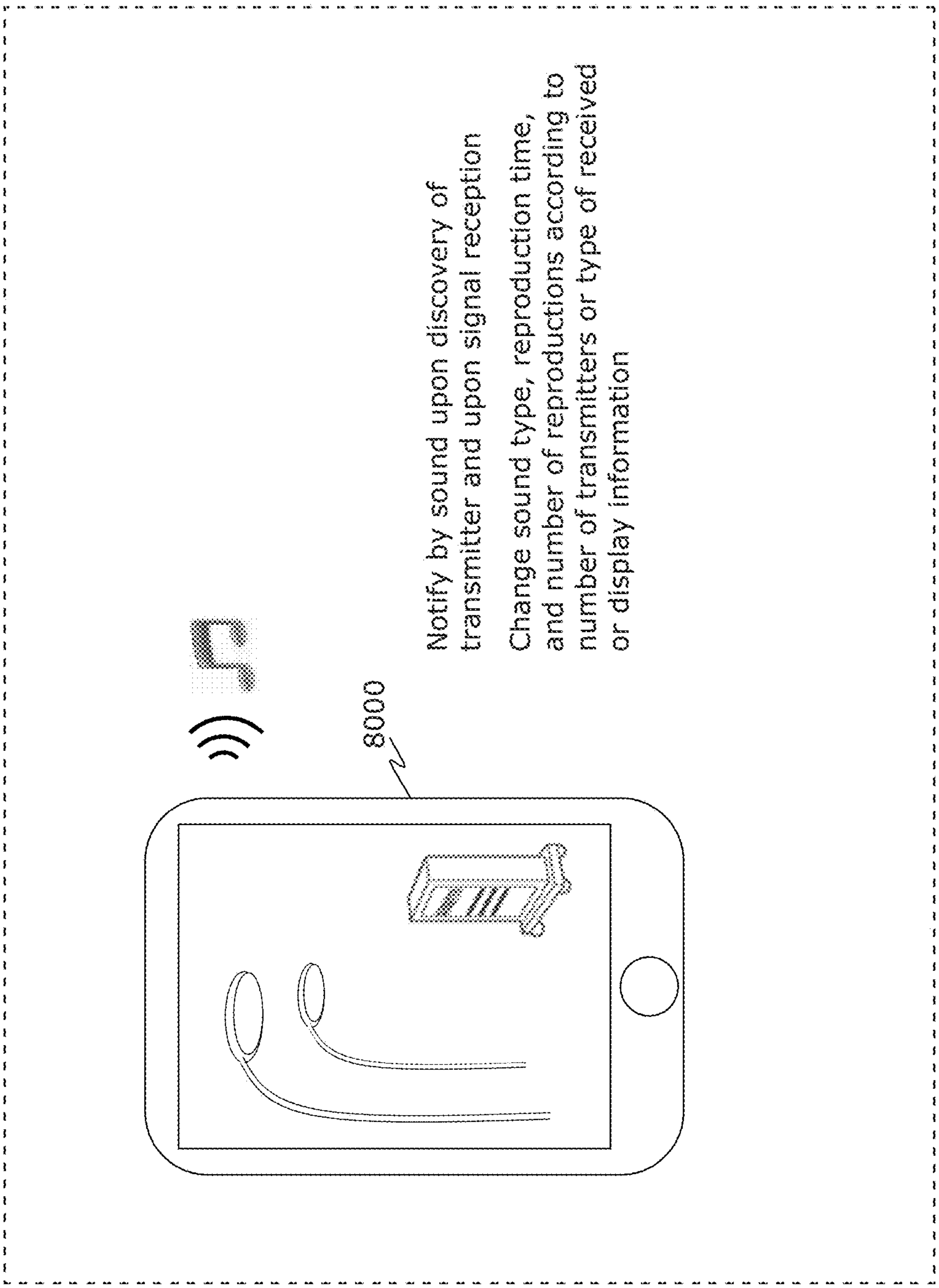
FIG. 12 is a diagram illustrating an example of operation of a receiver in Embodiment 2.

FIG. 12 is a diagram illustrating an example of operation of a receiver in this embodiment.

For example, in the case of receiving the signal by visible light communication, the receiver 8000 may output a sound for notifying the user that the transmitter has been discovered, while displaying the normal captured image. In this case, the receiver 8000 may change the type of output sound, the number of outputs, or the output time depending on the number of discovered transmitters, the type of received signal, the type of information specified by the signal, or the like.

Figure 13:
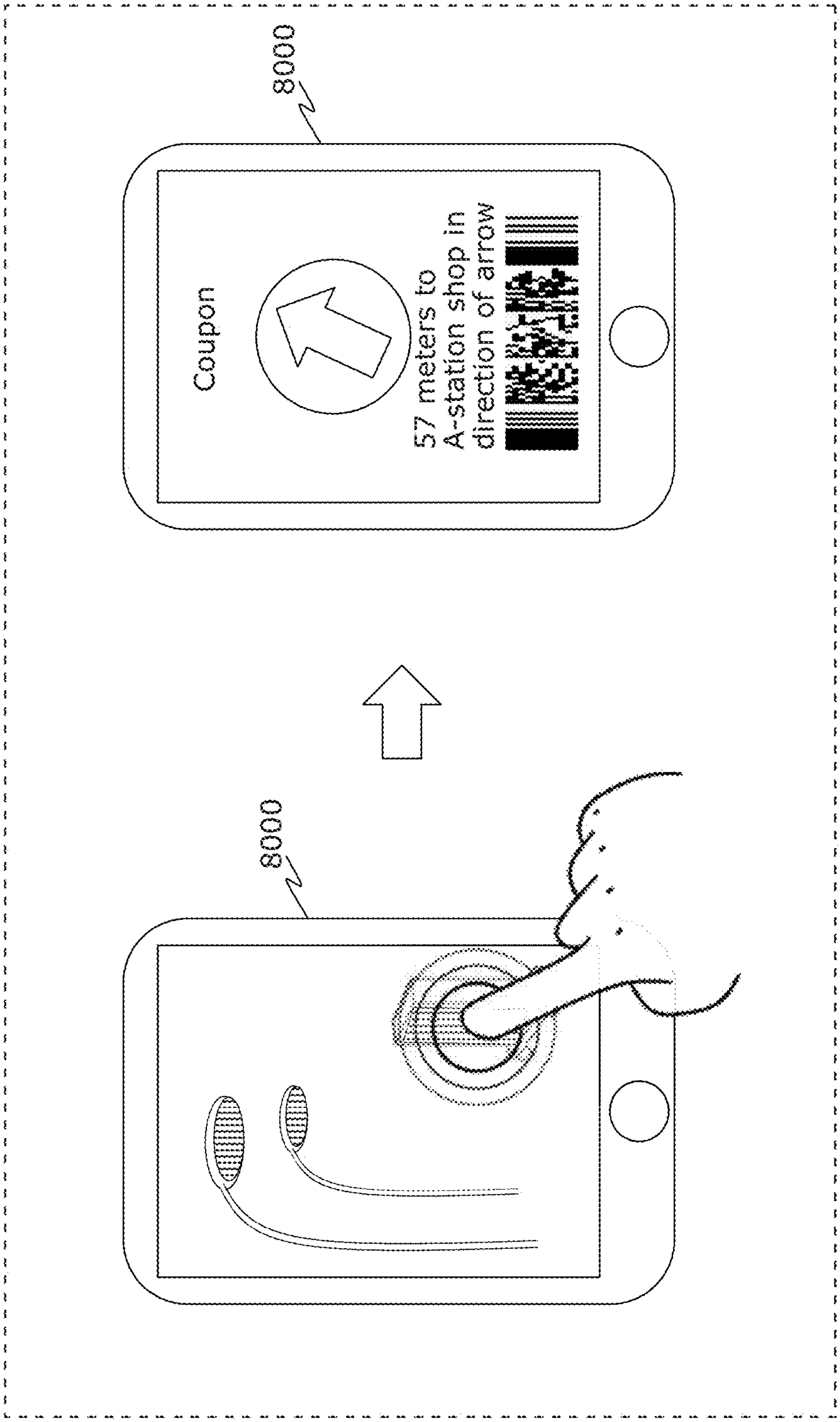
FIG. 13 is a diagram illustrating another example of operation of a receiver in Embodiment 2.

FIG. 13 is a diagram illustrating another example of operation of a receiver in this embodiment.

For example, when the user touches the bright line pattern shown in the synthetic image, the receiver 8000 generates an information notification image based on the signal transmitted from the subject corresponding to the touched bright line pattern, and displays the information notification image. The information notification image indicates, for example, a coupon or a location of a store. The bright line pattern may be the signal specification object, the signal identification object, or the dotted frame illustrated in FIG. 11. The same applies to the below-mentioned bright line pattern.

Figure 14:
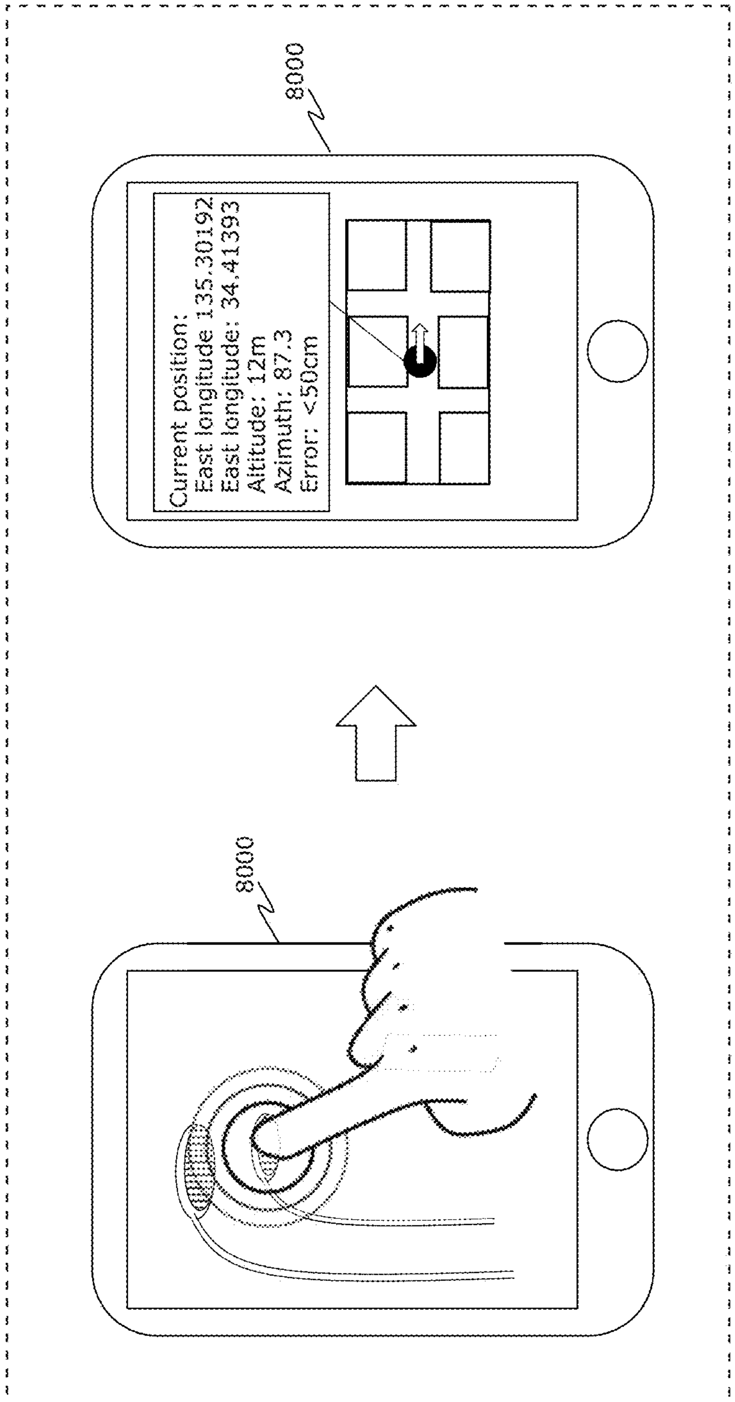
FIG. 14 is a diagram illustrating another example of operation of a receiver in Embodiment 2.

FIG. 14 is a diagram illustrating another example of operation of a receiver in this embodiment.

For example, when the user touches the bright line pattern shown in the synthetic image, the receiver 8000 generates an information notification image based on the signal transmitted from the subject corresponding to the touched bright line pattern, and displays the information notification image. The information notification image indicates, for example, the current position of the receiver 8000 by a map or the like.

Figure 15:
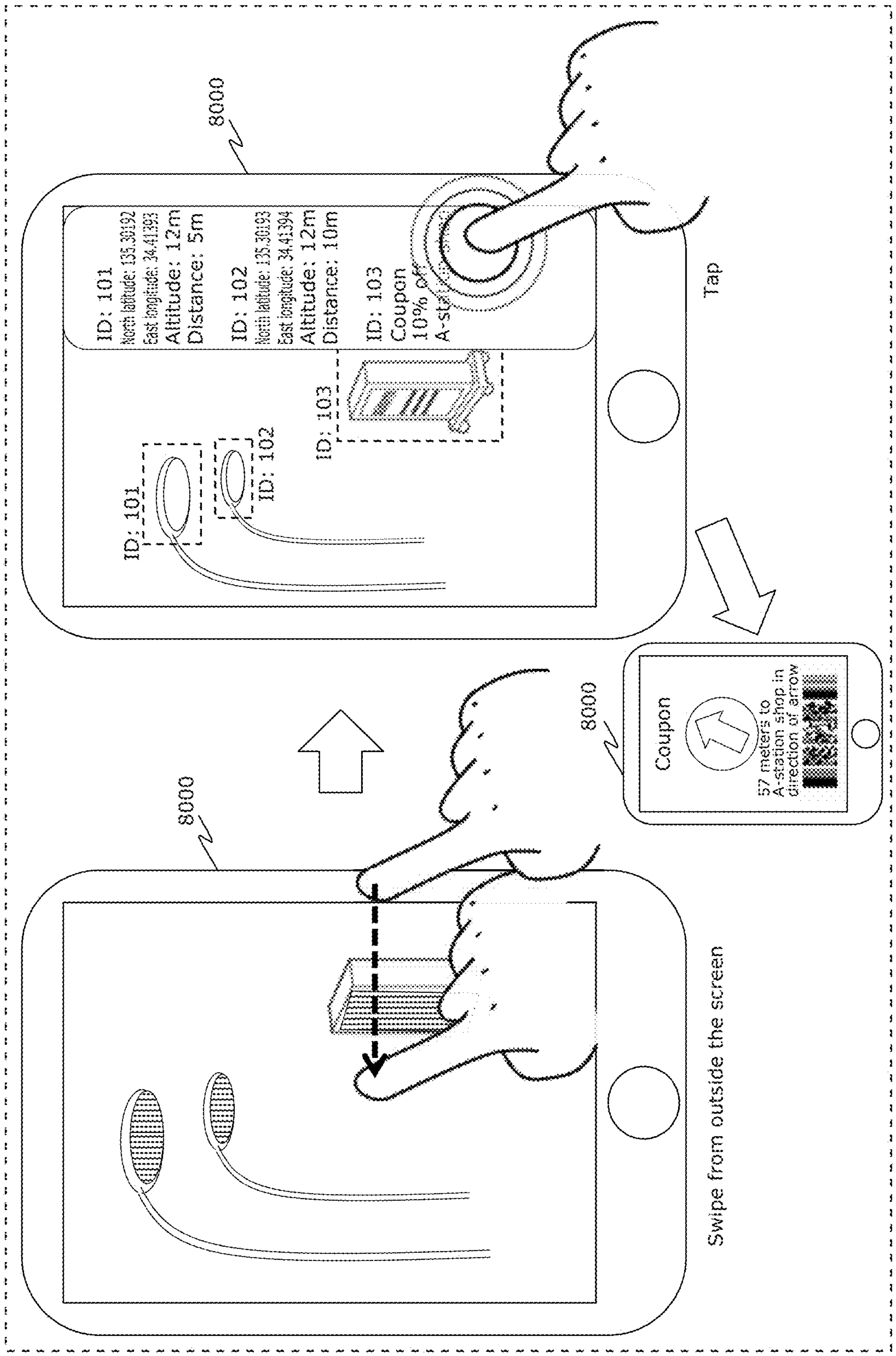
FIG. 15 is a diagram illustrating another example of operation of a receiver in Embodiment 2.

FIG. 15 is a diagram illustrating another example of operation of a receiver in this embodiment.

For example, when the user swipes on the receiver 8000 on which the synthetic image is displayed, the receiver 8000 displays the normal captured image including the dotted frame and the identifier like the normal captured image illustrated in (c) in FIG. 11, and also displays a list of information to follow the swipe operation. The list includes information specified by the signal transmitted from the part (transmitter) identified by each identifier. The swipe may be, for example, an operation of moving the user's finger from outside the display of the receiver 8000 on the right side into the display. The swipe may be an operation of moving the user's finger from the top, bottom, or left side of the display into the display.

When the user taps information included in the list, the receiver 8000 may display an information notification image (e.g. an image showing a coupon) indicating the information in more detail.

Figure 16:
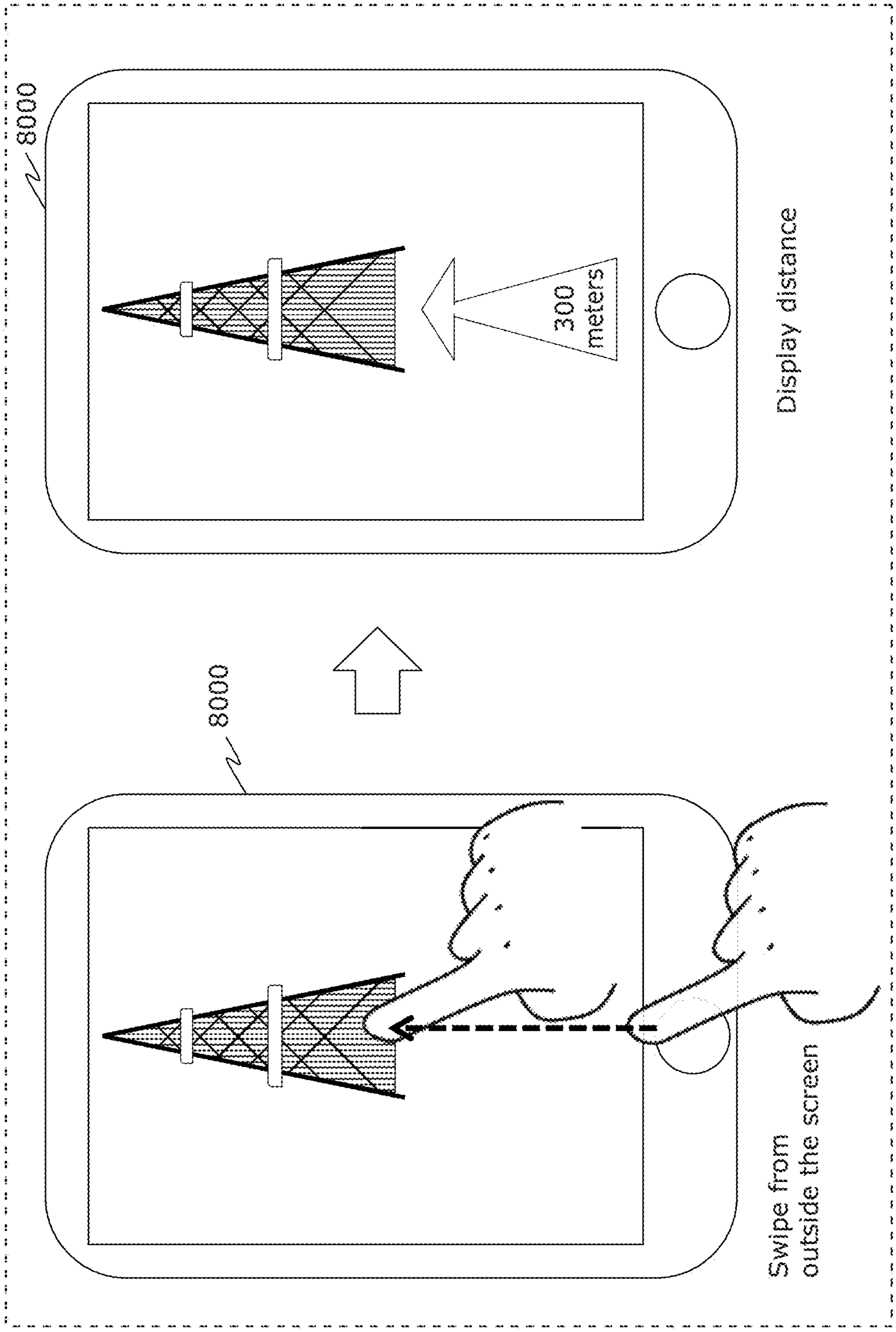
FIG. 16 is a diagram illustrating another example of operation of a receiver in Embodiment 2.

FIG. 16 is a diagram illustrating another example of operation of a receiver in this embodiment.

For example, when the user swipes on the receiver 8000 on which the synthetic image is displayed, the receiver 8000 superimposes an information notification image on the synthetic image, to follow the swipe operation. The information notification image indicates the subject distance with an arrow so as to be easily recognizable by the user. The swipe may be, for example, an operation of moving the user's finger from outside the display of the receiver 8000 on the bottom side into the display. The swipe may be an operation of moving the user's finger from the left, top, or right side of the display into the display.

Figure 17:
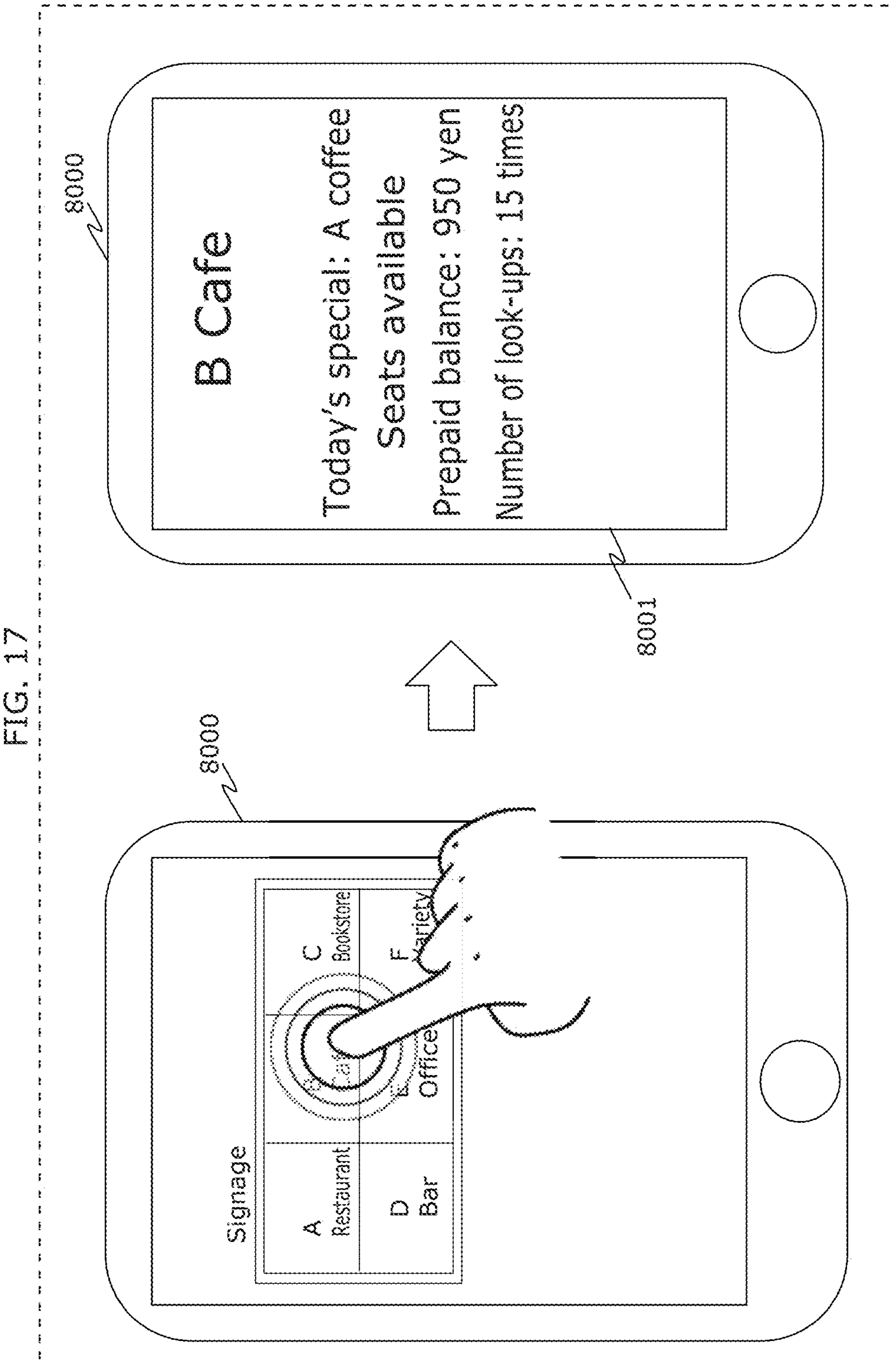
FIG. 17 is a diagram illustrating another example of operation of a receiver in Embodiment 2.

FIG. 17 is a diagram illustrating another example of operation of a receiver in this embodiment.

For example, the receiver 8000 captures, as a subject, a transmitter which is a signage showing a plurality of stores, and displays the normal captured image obtained as a result. When the user taps a signage image of one store included in the subject shown in the normal captured image, the receiver 8000 generates an information notification image based on the signal transmitted from the signage of the store, and displays an information notification image 8001. The information notification image 8001 is, for example, an image showing the availability of the store and the like.

Figure 18:
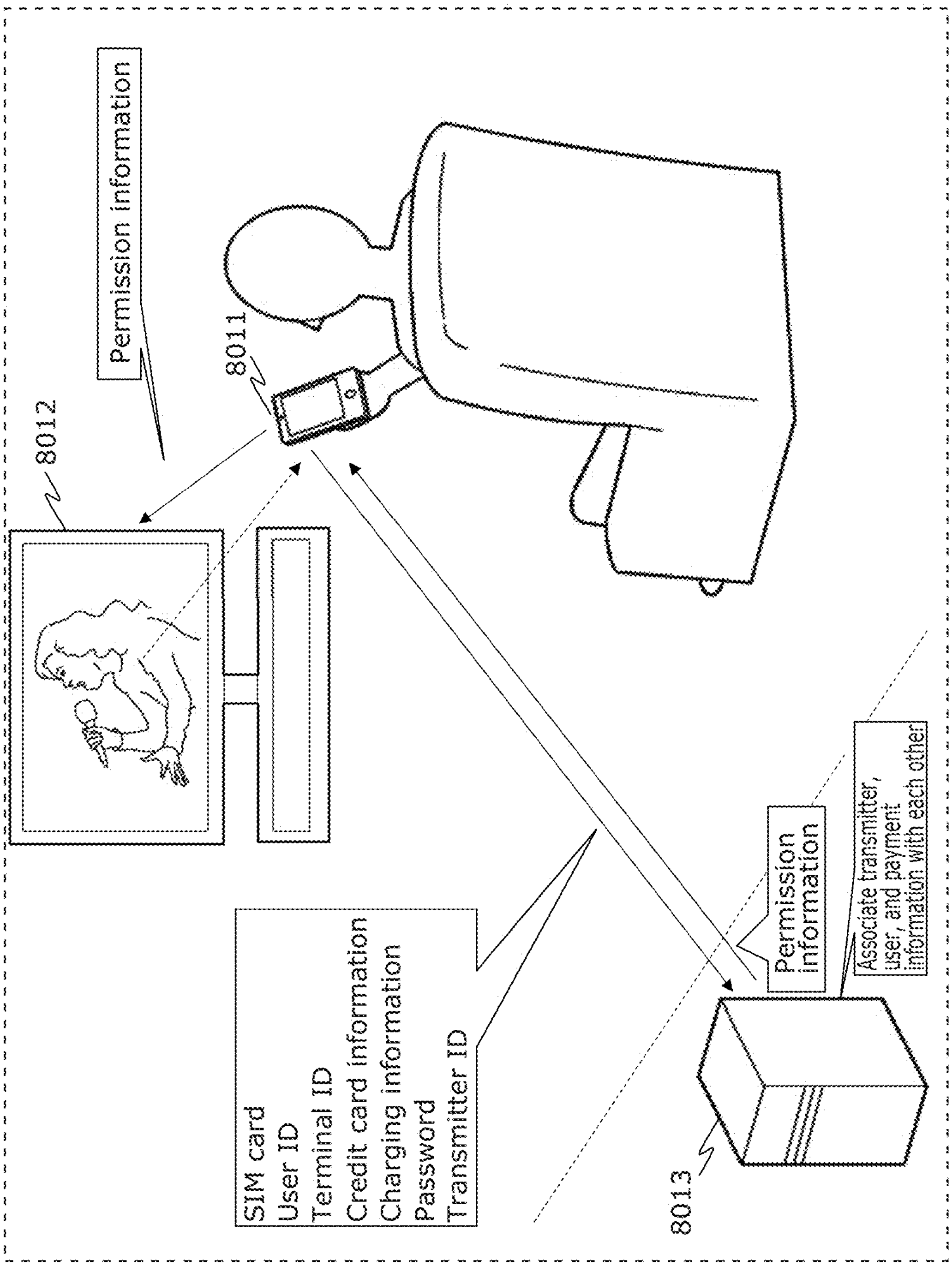
FIG. 18 is a diagram illustrating an example of operation of a receiver, a transmitter, and a server in Embodiment 2.

FIG. 18 is a diagram illustrating an example of operation of a receiver, a transmitter, and a server in this embodiment.

A transmitter 8012 as a television transmits a signal to a receiver 8011 by way of luminance change. The signal includes information prompting the user to buy content relating to a program being viewed. Having received the signal by visible light communication, the receiver 8011 displays an information notification image prompting the user to buy content, based on the signal. When the user performs an operation for buying the content, the receiver 8011 transmits at least one of information included in a subscriber identity module (SIM) card inserted in the receiver 8011, a user ID, a terminal ID, credit card information, charging information, a password, and a transmitter ID, to a server 8013. The server 8013 manages a user ID and payment information in association with each other, for each user. The server 8013 specifies a user ID based on the information transmitted from the receiver 8011, and checks payment information associated with the user ID. By this check, the server 8013 determines whether or not to permit the user to buy the content. In the case of determining to permit the user to buy the content, the server 8013 transmits permission information to the receiver 8011. Having received the permission information, the receiver 8011 transmits the permission information to the transmitter 8012. Having received the permission information, the transmitter 8012 obtains the content via a network as an example, and reproduces the content.

The transmitter 8012 may transmit information including the ID of the transmitter 8012 to the receiver 8011, by way of luminance change. In this case, the receiver 8011 transmits the information to the server 8013. Having obtained the information, the server 8013 can determine that, for example, the television program is being viewed on the transmitter 8012, and conduct television program rating research.

The receiver 8011 may include information of an operation (e.g. voting) performed by the user in the above-mentioned information and transmit the information to the server 8013, to allow the server 8013 to reflect the information on the television program. An audience participation program can be realized in this way. Besides, in the case of receiving a post from the user, the receiver 8011 may include the post in the above-mentioned information and transmit the information to the server 8013, to allow the server 8013 to reflect the post on the television program, a network message board, or the like.

Furthermore, by the transmitter 8012 transmitting the above-mentioned information, the server 8013 can charge for television program viewing by paid broadcasting or on-demand TV. The server 8013 can also cause the receiver 8011 to display an advertisement, or the transmitter 8012 to display detailed information of the displayed television program or an URL of a site showing the detailed information. The server 8013 may also obtain the number of times the advertisement is displayed on the receiver 8011, the price of a product bought from the advertisement, or the like, and charge the advertiser according to the number of times or the price. Such price-based charging is possible even in the case where the user seeing the advertisement does not buy the product immediately. When the server 8013 obtains information indicating the manufacturer of the transmitter 8012 from the transmitter 8012 via the receiver 8011, the server 8013 may provide a service (e.g. payment for selling the product) to the manufacturer indicated by the information.

Figure 19:
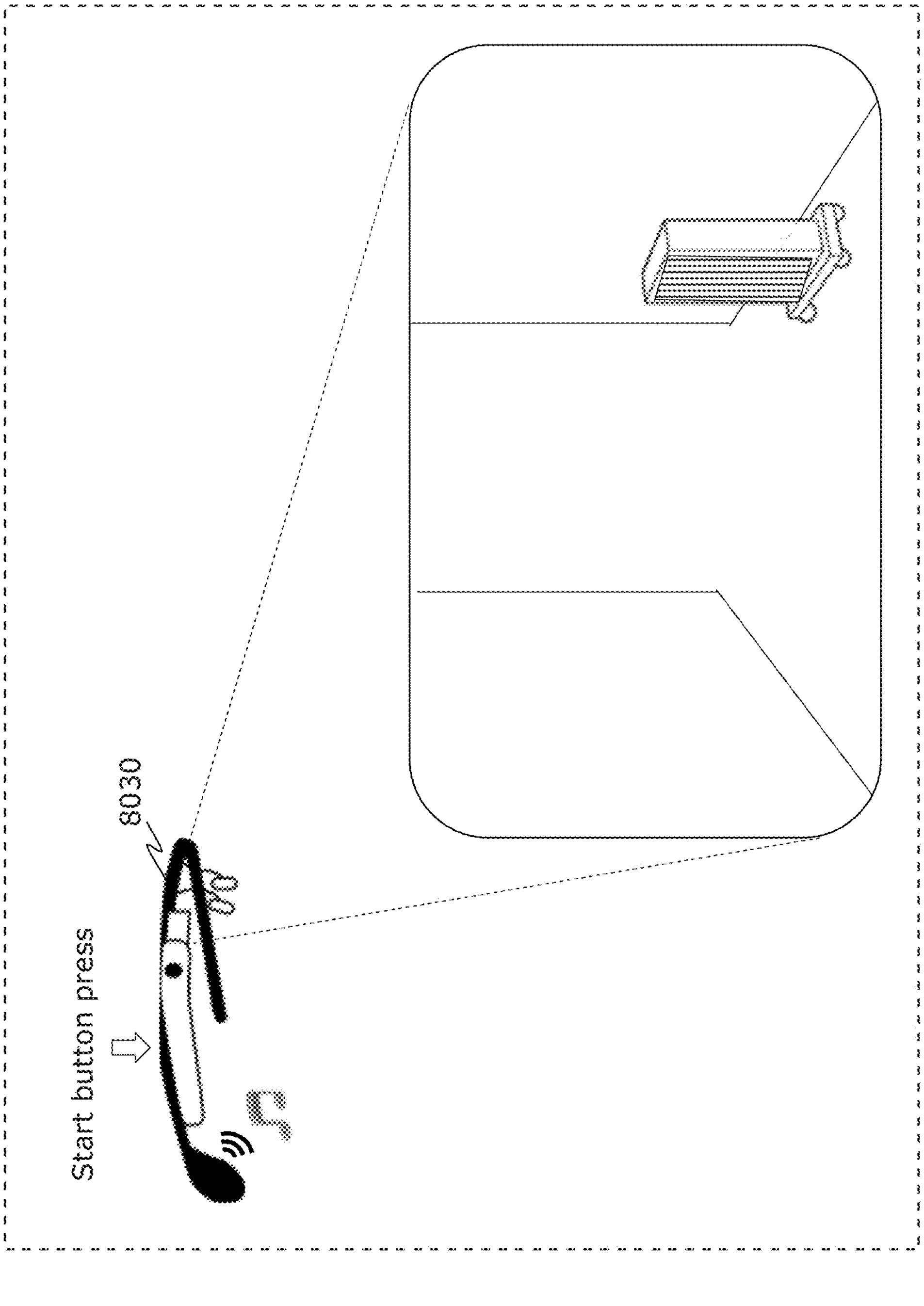
FIG. 19 is a diagram illustrating another example of operation of a receiver in Embodiment 2.

FIG. 19 is a diagram illustrating another example of operation of a receiver in this embodiment.

For example, a receiver 8030 is a head-mounted display including a camera. When a start button is pressed, the receiver 8030 starts imaging in the visible light communication mode, i.e. visible light communication. In the case of receiving a signal by visible light communication, the receiver 8030 notifies the user of information corresponding to the received signal. The notification is made, for example, by outputting a sound from a speaker included in the receiver 8030, or by displaying an image. Visible light communication may be started not only when the start button is pressed, but also when the receiver 8030 receives a sound instructing the start or when the receiver 8030 receives a signal instructing the start by wireless communication. Visible light communication may also be started when the change width of the value obtained by a 9-axis sensor included in the receiver 8030 exceeds a predetermined range or when a bright line pattern, even if only slightly, appears in the normal captured image.

Figure 20:
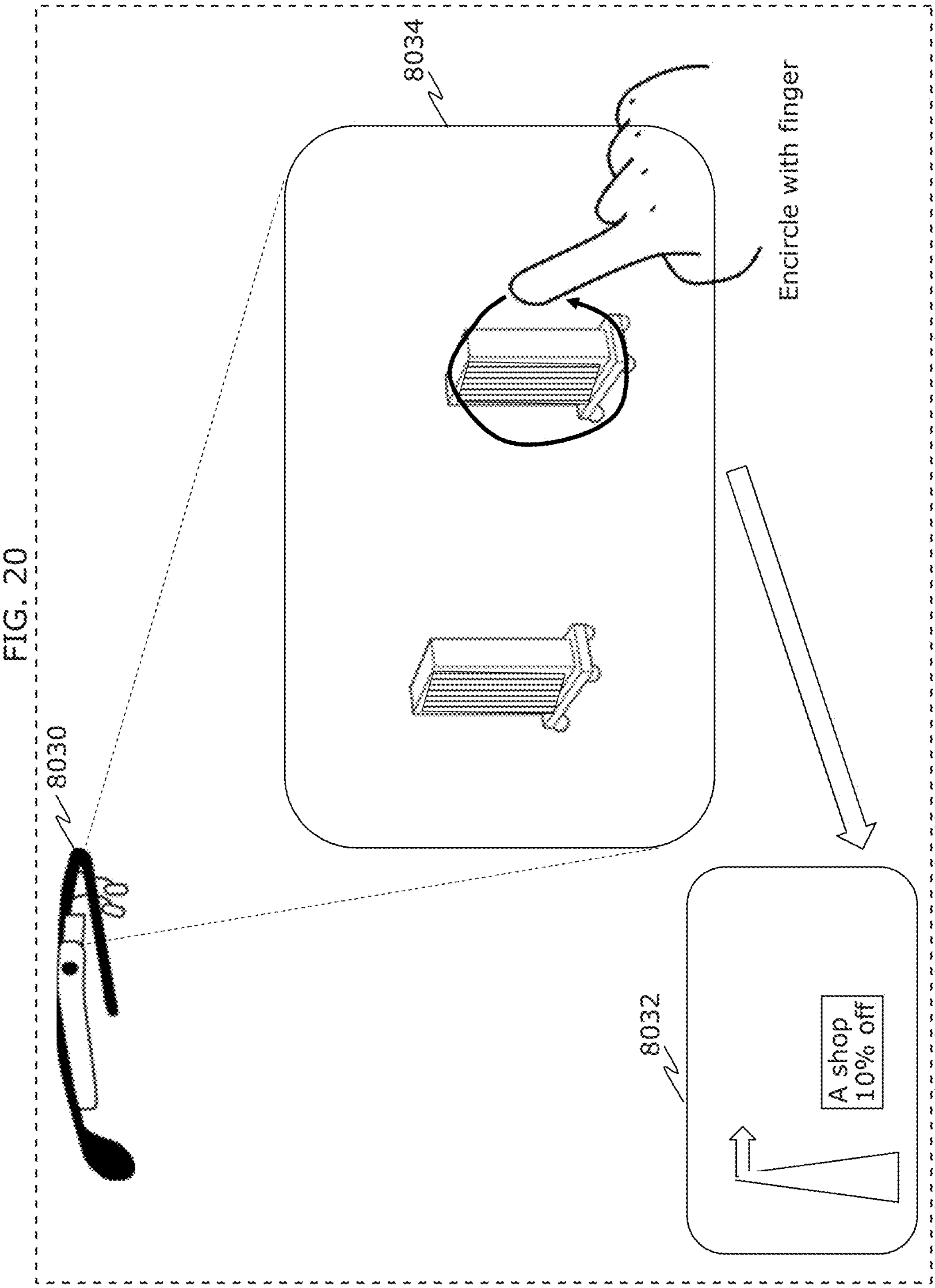
FIG. 20 is a diagram illustrating another example of operation of a receiver in Embodiment 2.

FIG. 20 is a diagram illustrating an example of initial setting of a receiver in this embodiment.

The receiver 8030 displays the synthetic image 8034 in the same way as above. The user performs an operation of moving his or her fingertip so as to encircle the bright line pattern in the synthetic image 8034. The receiver 8030 receives the operation, specifies the bright line pattern subjected to the operation, and displays an information notification image 8032 based on a signal transmitted from the part corresponding to the bright line pattern.

Figure 21:
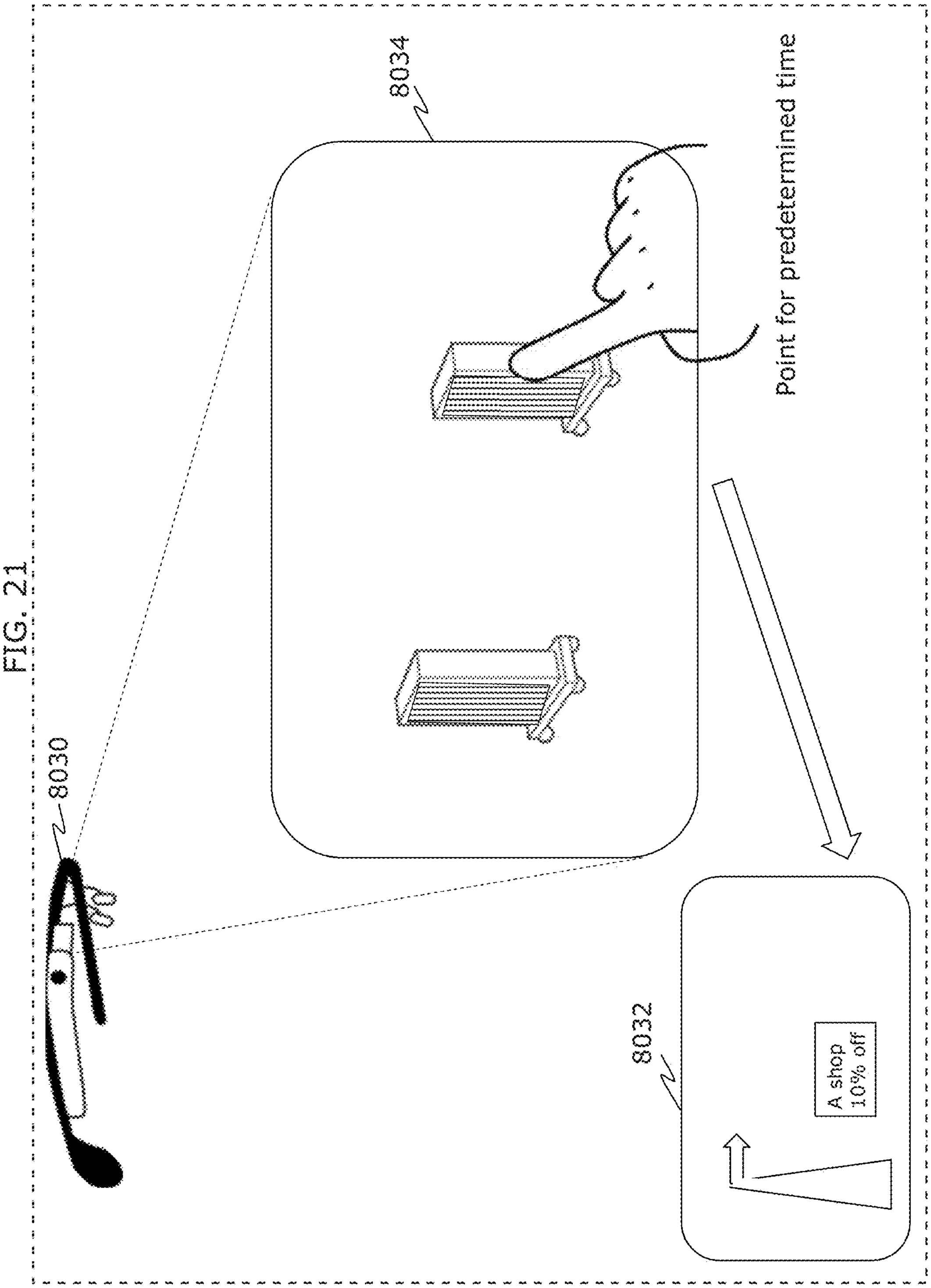
FIG. 21 is a diagram illustrating another example of operation of a receiver in Embodiment 2.

FIG. 21 is a diagram illustrating another example of operation of a receiver in this embodiment.

The receiver 8030 displays the synthetic image 8034 in the same way as above. The user performs an operation of placing his or her fingertip at the bright line pattern in the synthetic image 8034 for a predetermined time or more. The receiver 8030 receives the operation, specifies the bright line pattern subjected to the operation, and displays an information notification image 8032 based on a signal transmitted from the part corresponding to the bright line pattern.

Figure 22:
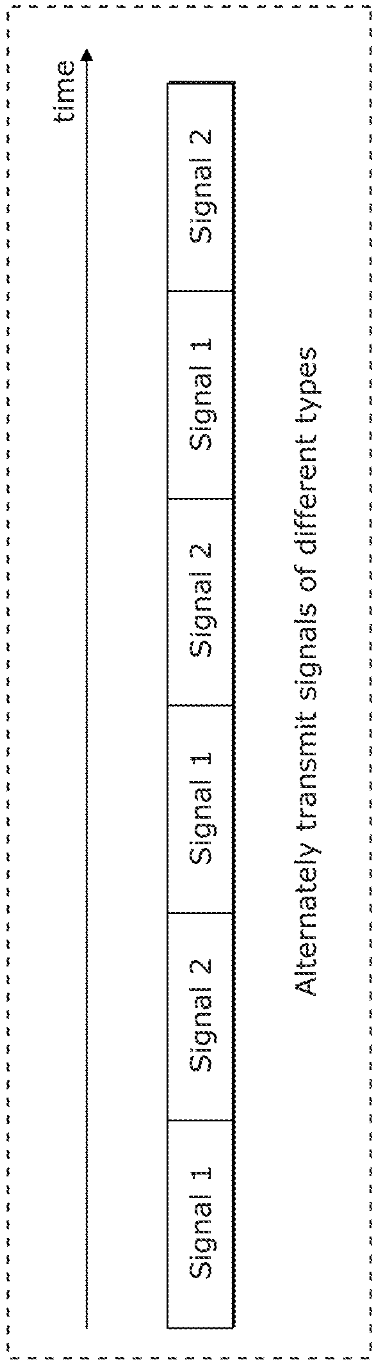
FIG. 22 is a diagram illustrating an example of operation of a transmitter in Embodiment 2.

FIG. 22 is a diagram illustrating an example of operation of a transmitter in this embodiment.

The transmitter alternately transmits signals 1 and 2, for example in a predetermined period. The transmission of the signal 1 and the transmission of the signal 2 are each carried out by way of luminance change such as blinking of visible light. A luminance change pattern for transmitting the signal 1 and a luminance change pattern for transmitting the signal 2 are different from each other.

Figure 23:
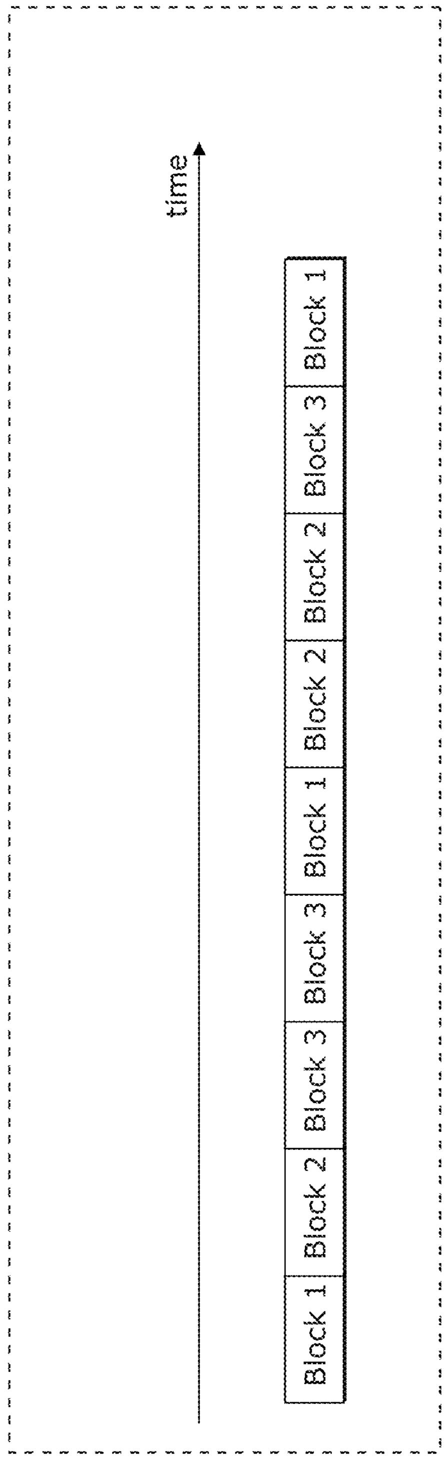
FIG. 23 is a diagram illustrating another example of operation of a transmitter in Embodiment 2.

FIG. 23 is a diagram illustrating another example of operation of a transmitter in this embodiment.

When repeatedly transmitting the signal sequence including the blocks 1, 2, and 3 as described above, the transmitter may change, for each signal sequence, the order of the blocks included in the signal sequence. For example, the blocks 1, 2, and 3 are included in this order in the first signal sequence, and the blocks 3, 1, and 2 are included in this order in the next signal sequence. A receiver that requires a periodic blanking interval can therefore avoid obtaining only the same block.

Figure 24:
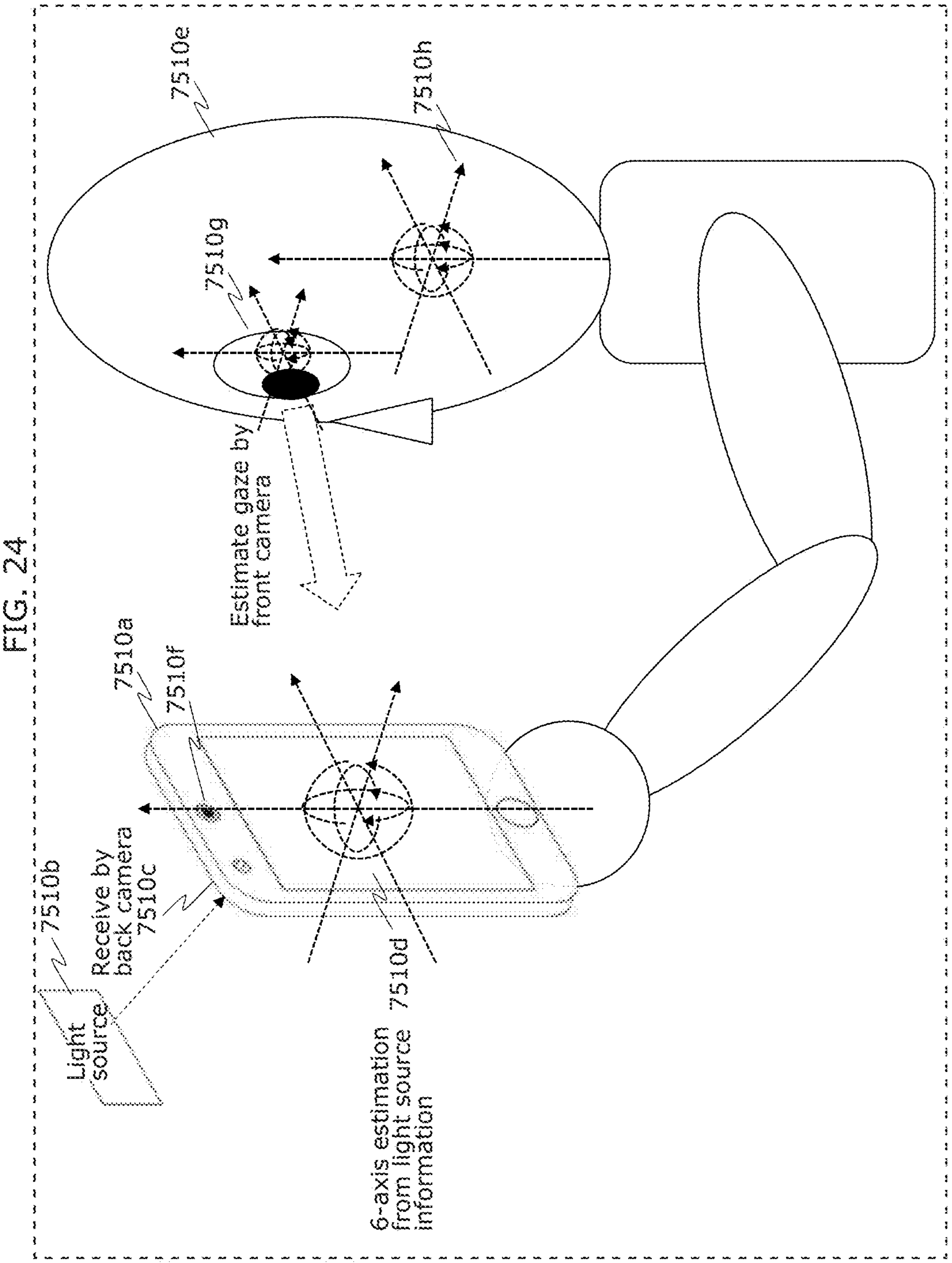
FIG. 24 is a diagram illustrating an example of application of a receiver in Embodiment 2.

FIG. 24 is a diagram illustrating an example of application of a receiver in this embodiment.

A receiver 7510*a* such as a smartphone captures a light source 7510*b* by a back camera (out camera) 7510*c* to receive a signal transmitted from the light source 7510*b*, and obtains the position and direction of the light source 7510*b* from the received signal. The receiver 7510*a* estimates the position and direction of the receiver 7510*a*, from the state of the light source 7510*b* in the captured image and the sensor value of the 9-axis sensor included in the receiver 7510*a*. The receiver 7510*a* captures a user 7510*e* by a front camera (face camera, in camera) 7510*f*, and estimates the position and direction of the head and the gaze direction (the position and direction of the eye) of the user 7510*e* by image processing. The receiver 7510*a* transmits the estimation result to the server. The receiver 7510*a* changes the behavior (display content or playback sound) according to the gaze direction of the user 7510*e*. The imaging by the back camera 7510*c* and the imaging by the front camera 7510*f* may be performed simultaneously or alternately.

Figure 25:
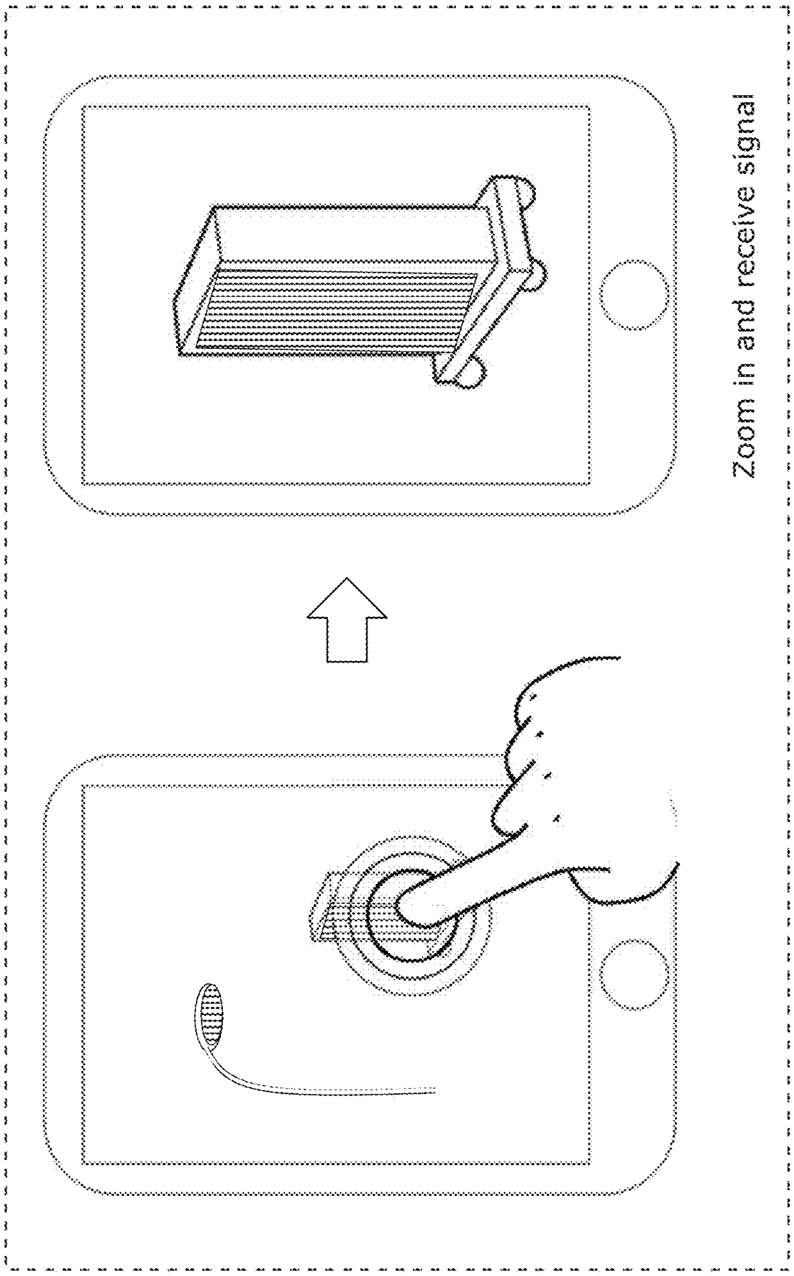
FIG. 25 is a diagram illustrating another example of operation of a receiver in Embodiment 2.

FIG. 25 is a diagram illustrating another example of operation of a receiver in this embodiment.

A receiver displays a bright line pattern using the above-mentioned synthetic image, intermediate image, or the like. Here, the receiver may be incapable of receiving a signal from a transmitter corresponding to the bright line pattern. When the user performs an operation (e.g. a tap) on the bright line pattern to select the bright line pattern, the receiver displays the synthetic image or intermediate image in which the bright line pattern is enlarged by optical zoom. Through such optical zoom, the receiver can appropriately receive the signal from the transmitter corresponding to the bright line pattern. That is, even when the captured image is too small to obtain the signal, the signal can be appropriately received by performing optical zoom. In the case where the displayed image is large enough to obtain the signal, too, faster reception is possible by optical zoom.

Summary of this Embodiment

An information communication method in this embodiment is an information communication method of obtaining information from a subject, the information communication method including: a first exposure time setting step of setting an exposure time of an image sensor so that, in an image obtained by capturing the subject by the image sensor, a bright line corresponding to an exposure line included in the image sensor appears according to a change in luminance of the subject; a bright line image obtainment step of obtaining a bright line image by capturing the subject that changes in luminance by the image sensor with the set exposure time, the bright line image being an image including the bright line; an image display step of displaying, based on the bright line image, a display image in which the subject and surroundings of the subject are shown, in a form that enables identification of a spatial position of a part where the bright line appears; and an information obtainment step of obtaining transmission information by demodulating data specified by a pattern of the bright line included in the obtained bright line image.

In this way, a synthetic image or an intermediate image illustrated in, for instance, FIGS. 7, 8, and 11 is displayed as the display image. In the display image in which the subject and the surroundings of the subject are shown, the spatial position of the part where the bright line appears is identified by a bright line pattern, a signal specification object, a signal identification object, a dotted frame, or the like. By looking at such a display image, the user can easily find the subject that is transmitting the signal through the change in luminance.

For example, the information communication method may further include: a second exposure time setting step of setting a longer exposure time than the exposure time; a normal image obtainment step of obtaining a normal captured image by capturing the subject and the surroundings of the subject by the image sensor with the longer exposure time; and a synthetic step of generating a synthetic image by specifying, based on the bright line image, the part where the bright line appears in the normal captured image, and superimposing a signal object on the normal captured image, the signal object being an image indicating the part, wherein in the image display step, the synthetic image is displayed as the display image.

In this way, the signal object is, for example, a bright line pattern, a signal specification object, a signal identification object, a dotted frame, or the like, and the synthetic image is displayed as the display image as illustrated in FIGS. 7, 8, and 11. Hence, the user can more easily find the subject that is transmitting the signal through the change in luminance.

For example, in the first exposure time setting step, the exposure time may be set to 1/3000 second, in the bright line image obtainment step, the bright line image in which the surroundings of the subject are shown may be obtained, and in the image display step, the bright line image may be displayed as the display image.

In this way, the bright line image is obtained and displayed as an intermediate image, for instance. This eliminates the need for a process of obtaining a normal captured image and a visible light communication image and synthesizing them, thus contributing to a simpler process.

For example, the image sensor may include a first image sensor and a second image sensor, in the normal image obtainment step, the normal captured image may be obtained by image capture by the first image sensor, and in the bright line image obtainment step, the bright line image may be obtained by image capture by the second image sensor simultaneously with the first image sensor.

In this way, the normal captured image and the visible light communication image which is the bright line image are obtained by the respective cameras, for instance as illustrated in FIG. 8. As compared with the case of obtaining the normal captured image and the visible light communication image by one camera, the images can be obtained promptly, contributing to a faster process.

For example, the information communication method may further include an information presenting step of presenting, in the case where the part where the bright line appears is designated in the display image by an operation by a user, presentation information based on the transmission information obtained from the pattern of the bright line in the designated part. Examples of the operation by the user include: a tap; a swipe; an operation of continuously placing the user's fingertip on the part for a predetermined time or more; an operation of continuously directing the user's gaze to the part for a predetermined time or more; an operation of moving a part of the user's body according to an arrow displayed in association with the part; an operation of placing a pen tip that changes in luminance on the part; and an operation of pointing to the part with a pointer displayed in the display image by touching a touch sensor.

In this way, the presentation information is displayed as an information notification image, for instance as illustrated in FIGS. 13 to 17, 20, and 21. Desired information can thus be presented to the user.

For example, the image sensor may be included in a head-mounted display, and in the image display step, the display image may be displayed by a projector included in the head-mounted display.

In this way, the information can be easily presented to the user, for instance as illustrated in FIGS. 19 to 21.

For example, an information communication method of obtaining information from a subject may include: a first exposure time setting step of setting an exposure time of an image sensor so that, in an image obtained by capturing the subject by the image sensor, a bright line corresponding to an exposure line included in the image sensor appears according to a change in luminance of the subject; a bright line image obtainment step of obtaining a bright line image by capturing the subject that changes in luminance by the image sensor with the set exposure time, the bright line image being an image including the bright line; and an information obtainment step of obtaining the information by demodulating data specified by a pattern of the bright line included in the obtained bright line image, wherein in the bright line image obtainment step, the bright line image including a plurality of parts where the bright line appears is obtained by capturing a plurality of subjects in a period during which the image sensor is being moved, and in the information obtainment step, a position of each of the plurality of subjects is obtained by demodulating, for each of the plurality of parts, the data specified by the pattern of the bright line in the part, and the information communication method may further include a position estimating step of estimating a position of the image sensor, based on the obtained position of each of the plurality of subjects and a moving state of the image sensor.

In this way, the position of the receiver including the image sensor can be accurately estimated based on the changes in luminance of the plurality of subjects such as lightings.

For example, an information communication method of obtaining information from a subject may include: a first exposure time setting step of setting an exposure time of an image sensor so that, in an image obtained by capturing the subject by the image sensor, a bright line corresponding to an exposure line included in the image sensor appears according to a change in luminance of the subject; a bright line image obtainment step of obtaining a bright line image by capturing the subject that changes in luminance by the image sensor with the set exposure time, the bright line image being an image including the bright line; an information obtainment step of obtaining the information by demodulating data specified by a pattern of the bright line included in the obtained bright line image; and an information presenting step of presenting the obtained information, wherein in the information presenting step, an image prompting to make a predetermined gesture is presented to a user of the image sensor as the information.

In this way, user authentication and the like can be conducted according to whether or not the user makes the gesture as prompted. This enhances convenience.

For example, an information communication method of obtaining information from a subject may include: an exposure time setting step of setting an exposure time of an image sensor so that, in an image obtained by capturing the subject by the image sensor, a bright line corresponding to an exposure line included in the image sensor appears according to a change in luminance of the subject; an image obtainment step of obtaining a bright line image by capturing the subject that changes in luminance by the image sensor with the set exposure time, the bright line image being an image including the bright line; and an information obtainment step of obtaining the information by demodulating data specified by a pattern of the bright line included in the obtained bright line image, wherein in the image obtainment step, the bright line image is obtained by capturing a plurality of subjects reflected on a reflection surface, and in the information obtainment step, the information is obtained by separating a bright line corresponding to each of the plurality of subjects from bright lines included in the bright line image according to a strength of the bright line and demodulating, for each of the plurality of subjects, the data specified by the pattern of the bright line corresponding to the subject.

In this way, even in the case where the plurality of subjects such as lightings each change in luminance, appropriate information can be obtained from each subject.

For example, an information communication method of obtaining information from a subject may include: an exposure time setting step of setting an exposure time of an image sensor so that, in an image obtained by capturing the subject by the image sensor, a bright line corresponding to an exposure line included in the image sensor appears according to a change in luminance of the subject; an image obtainment step of obtaining a bright line image by capturing the subject that changes in luminance by the image sensor with the set exposure time, the bright line image being an image including the bright line; and an information obtainment step of obtaining the information by demodulating data specified by a pattern of the bright line included in the obtained bright line image, wherein in the image obtainment step, the bright line image is obtained by capturing the subject reflected on a reflection surface, and the information communication method may further include a position estimating step of estimating a position of the subject based on a luminance distribution in the bright line image.

In this way, the appropriate position of the subject can be estimated based on the luminance distribution.

For example, an information communication method of transmitting a signal using a change in luminance may include: a first determining step of determining a first pattern of the change in luminance, by modulating a first signal to be transmitted; a second determining step of determining a second pattern of the change in luminance, by modulating a second signal to be transmitted; and a transmission step of transmitting the first signal and the second signal by a light emitter alternately changing in luminance according to the determined first pattern and changing in luminance according to the determined second pattern.

In this way, the first signal and the second signal can each be transmitted without a delay, for instance as illustrated in FIG. 22.

For example, in the transmission step, a buffer time may be provided when switching the change in luminance between the change in luminance according to the first pattern and the change in luminance according to the second pattern.

In this way, interference between the first signal and the second signal can be suppressed.

For example, an information communication method of transmitting a signal using a change in luminance may include: a determining step of determining a pattern of the change in luminance by modulating the signal to be transmitted; and a transmission step of transmitting the signal by a light emitter changing in luminance according to the determined pattern, wherein the signal is made up of a plurality of main blocks, each of the plurality of main blocks includes first data, a preamble for the first data, and a check signal for the first data, the first data is made up of a plurality of sub-blocks, and each of the plurality of sub-blocks includes second data, a preamble for the second data, and a check signal for the second data.

In this way, data can be appropriately obtained regardless of whether or not the receiver needs a blanking interval.

For example, an information communication method of transmitting a signal using a change in luminance may include: a determining step of determining, by each of a plurality of transmitters, a pattern of the change in luminance by modulating the signal to be transmitted; and a transmission step of transmitting, by each of the plurality of transmitters, the signal by a light emitter in the transmitter changing in luminance according to the determined pattern, wherein in the transmission step, the signal of a different frequency or protocol is transmitted.

In this way, interference between signals from the plurality of transmitters can be suppressed.

For example, an information communication method of transmitting a signal using a change in luminance may include: a determining step of determining, by each of a plurality of transmitters, a pattern of the change in luminance by modulating the signal to be transmitted; and a transmission step of transmitting, by each of the plurality of transmitters, the signal by a light emitter in the transmitter changing in luminance according to the determined pattern, wherein in the transmission step, one of the plurality of transmitters receives a signal transmitted from a remaining one of the plurality of transmitters, and transmits another signal in a form that does not interfere with the received signal.

In this way, interference between signals from the plurality of transmitters can be suppressed.

Embodiment 3

This embodiment describes each example of application using a receiver such as a smartphone and a transmitter for transmitting information as a blink pattern of an LED, an organic EL device, or the like in Embodiment 1 or 2 described above.

Figure 26:
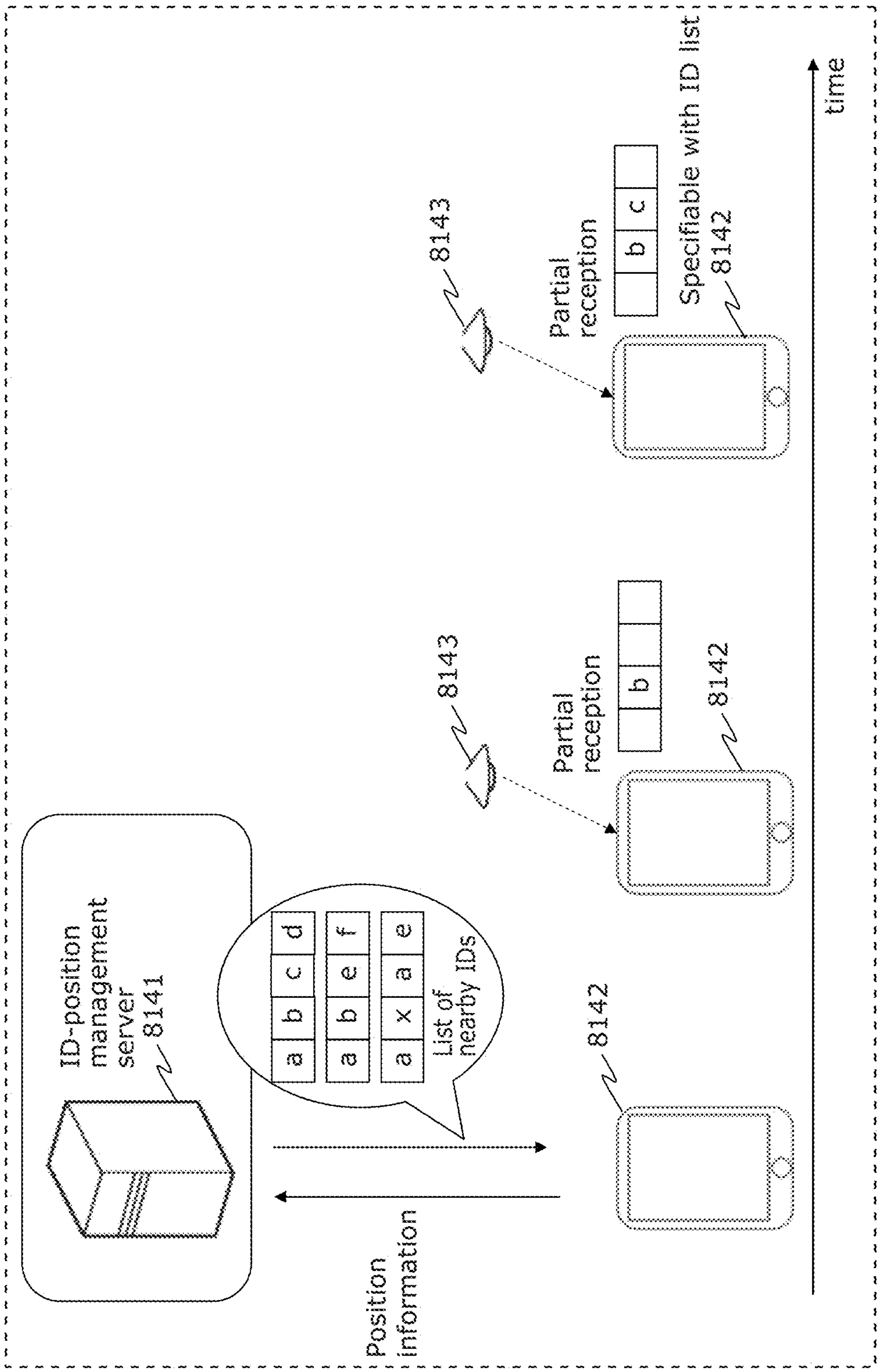
FIG. 26 is a diagram illustrating an example of processing operation of a receiver, a transmitter, and a server in Embodiment 3.

FIG. 26 is a diagram illustrating an example of processing operation of a receiver, a transmitter, and a server in Embodiment 3.

A receiver 8142 such as a smartphone obtains position information indicating the position of the receiver 8142, and transmits the position information to a server 8141. For example, the receiver 8142 obtains the position information when using a GPS or the like or receiving another signal. The server 8141 transmits an ID list associated with the position indicated by the position information, to the receiver 8142. The ID list includes each ID such as "abcd" and information associated with the ID.

The receiver 8142 receives a signal from a transmitter 8143 such as a lighting device. Here, the receiver 8142 may be able to receive only a part (e.g. "b") of an ID as the above-mentioned signal. In such a case, the receiver 8142 searches the ID list for the ID including the part. In the case where the unique ID is not found, the receiver 8142 further receives a signal including another part of the ID, from the transmitter 8143. The receiver 8142 thus obtains a larger part (e.g. "bc") of the ID. The receiver 8142 again searches the ID list for the ID including the part (e.g. "bc"). Through such search, the receiver 8142 can specify the whole ID even in the case where the ID can be obtained only partially. Note that, when receiving the signal from the transmitter 8143, the receiver 8142 receives not only the part of the ID but also a check portion such as a cyclic redundancy check (CRC).

Figure 27:
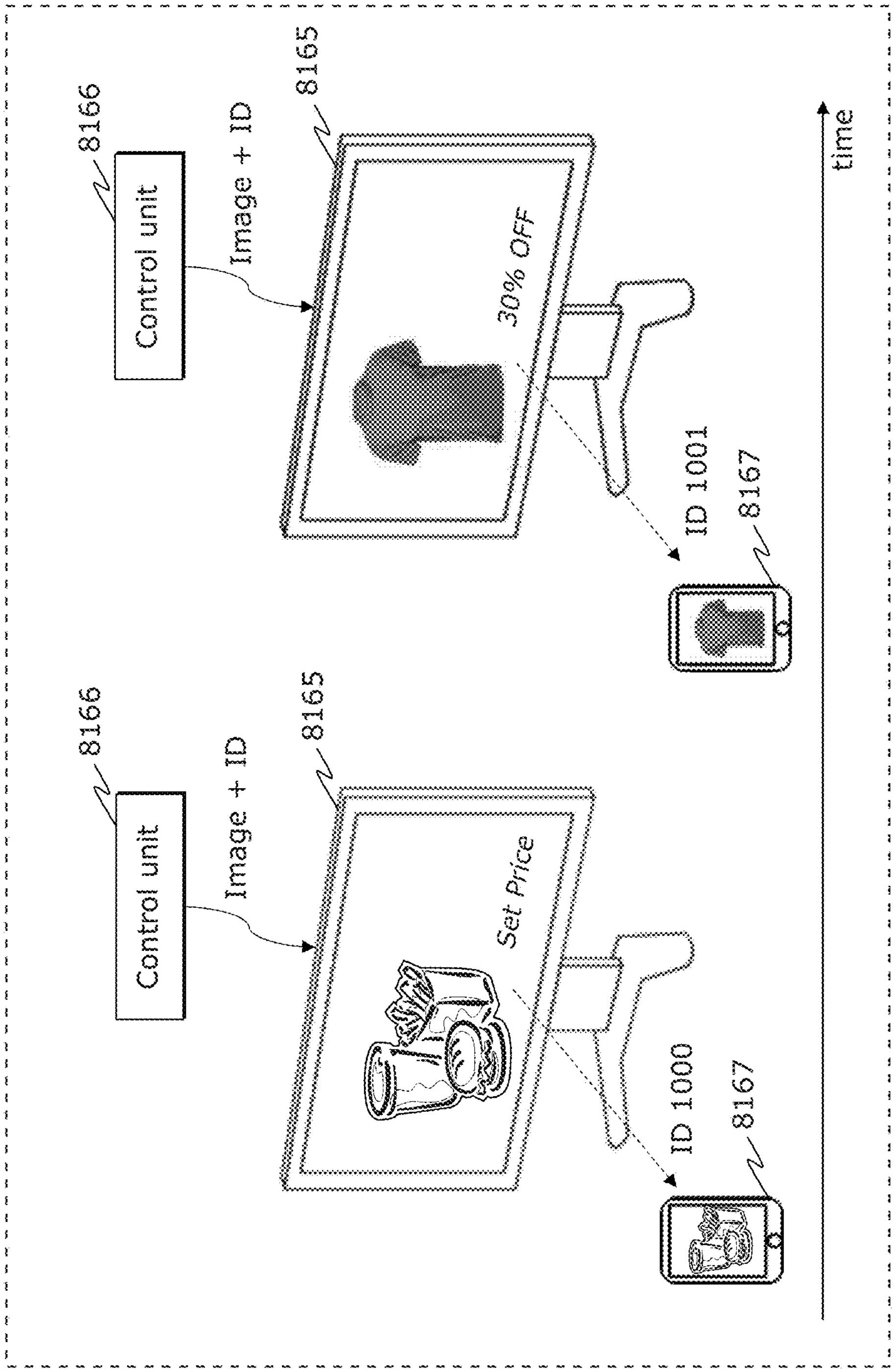
FIG. 27 is a diagram illustrating an example of operation of a transmitter and a receiver in Embodiment 3.

FIG. 27 is a diagram illustrating an example of operation of a transmitter and a receiver in Embodiment 3.

A transmitter 8165 such as a television obtains an image and an ID (ID 1000) associated with the image, from a controller 8166. The transmitter 8165 displays the image, and also transmits the ID (ID 1000) to a receiver 8167 by changing in luminance. The receiver 8167 captures the transmitter 8165 to receive the ID (ID 1000), and displays information associated with the ID (ID 1000). The controller 8166 then changes the image output to the transmitter 8165, to another image. The controller 8166 also changes the ID output to the transmitter 8165. That is, the controller 8166 outputs the other image and the other ID (ID 1001) associated with the other image, to the transmitter 8165. The transmitter 8165 displays the other image, and transmits the other ID (ID 1001) to the receiver 8167 by changing in luminance. The receiver 8167 captures the transmitter 8165 to receive the other ID (ID 1001), and displays information associated with the other ID (ID 1001).

Figure 28:
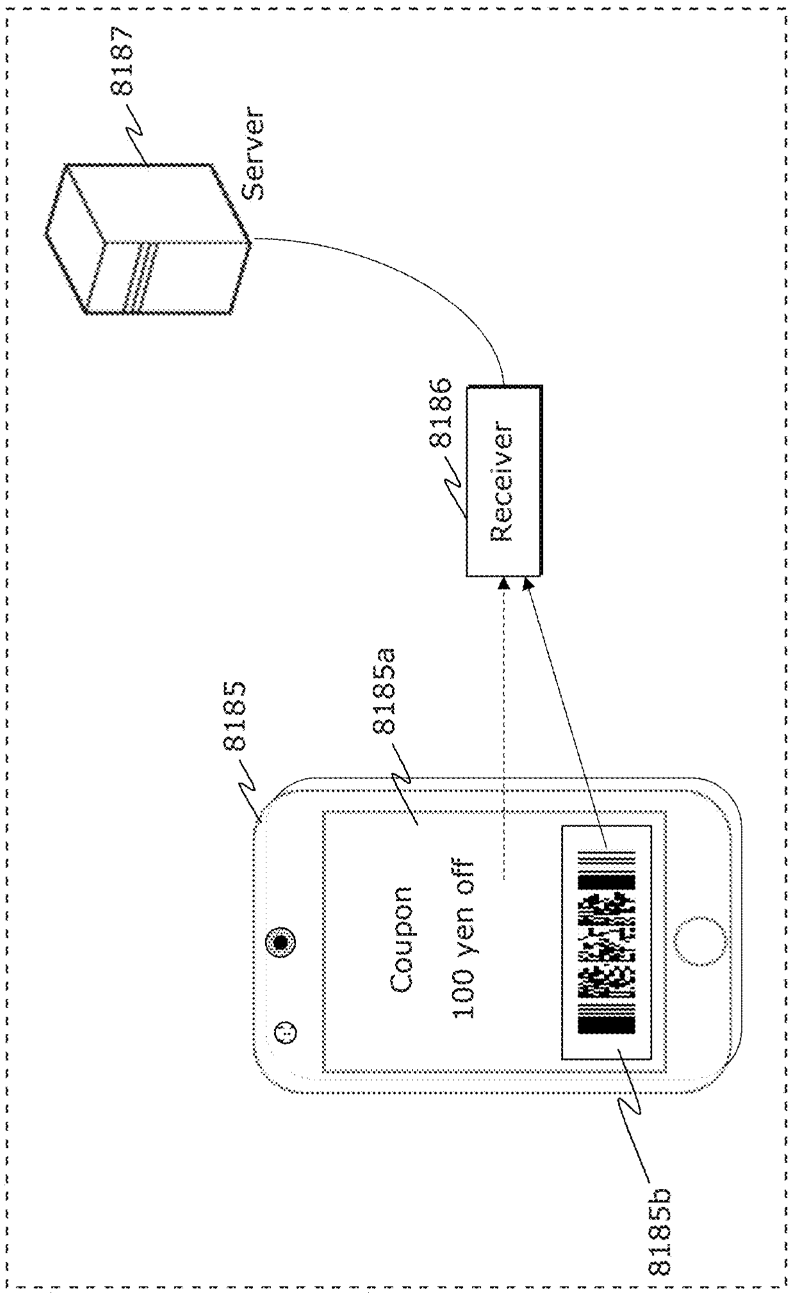
FIG. 28 is a diagram illustrating an example of operation of a transmitter, a receiver, and a server in Embodiment 3.

FIG. 28 is a diagram illustrating an example of operation of a transmitter, a receiver, and a server in Embodiment 3.

A transmitter 8185 such as a smartphone transmits information indicating "Coupon 100 yen off" as an example, by causing a part of a display 8185*a* except a barcode part 8185*b* to change in luminance, i.e. by visible light communication. The transmitter 8185 also causes the barcode part 8185*b* to display a barcode without changing in luminance. The barcode indicates the same information as the above-mentioned information transmitted by visible light communication. The transmitter 8185 further causes the part of the display 8185*a* except the barcode part 8185*b* to display the characters or pictures, e.g. the characters "Coupon 100 yen off", indicating the information transmitted by visible light communication. Displaying such characters or pictures allows the user of the transmitter 8185 to easily recognize what kind of information is being transmitted.

A receiver 8186 performs image capture to obtain the information transmitted by visible light communication and the information indicated by the barcode, and transmits these information to a server 8187. The server 8187 determines whether or not these information match or relate to each other. In the case of determining that these information match or relate to each other, the server 8187 executes a process according to these information. Alternatively, the server 8187 transmits the determination result to the receiver 8186 so that the receiver 8186 executes the process according to these information.

The transmitter 8185 may transmit a part of the information indicated by the barcode, by visible light communication. Moreover, the URL of the server 8187 may be indicated in the barcode. Furthermore, the transmitter 8185 may obtain an ID as a receiver, and transmit the ID to the server 8187 to thereby obtain information associated with the ID. The information associated with the ID is the same as the information transmitted by visible light communication or the information indicated by the barcode. The server 8187 may transmit an ID associated with information (visible light communication information or barcode information) transmitted from the transmitter 8185 via the receiver 8186, to the transmitter 8185.

Figure 29:
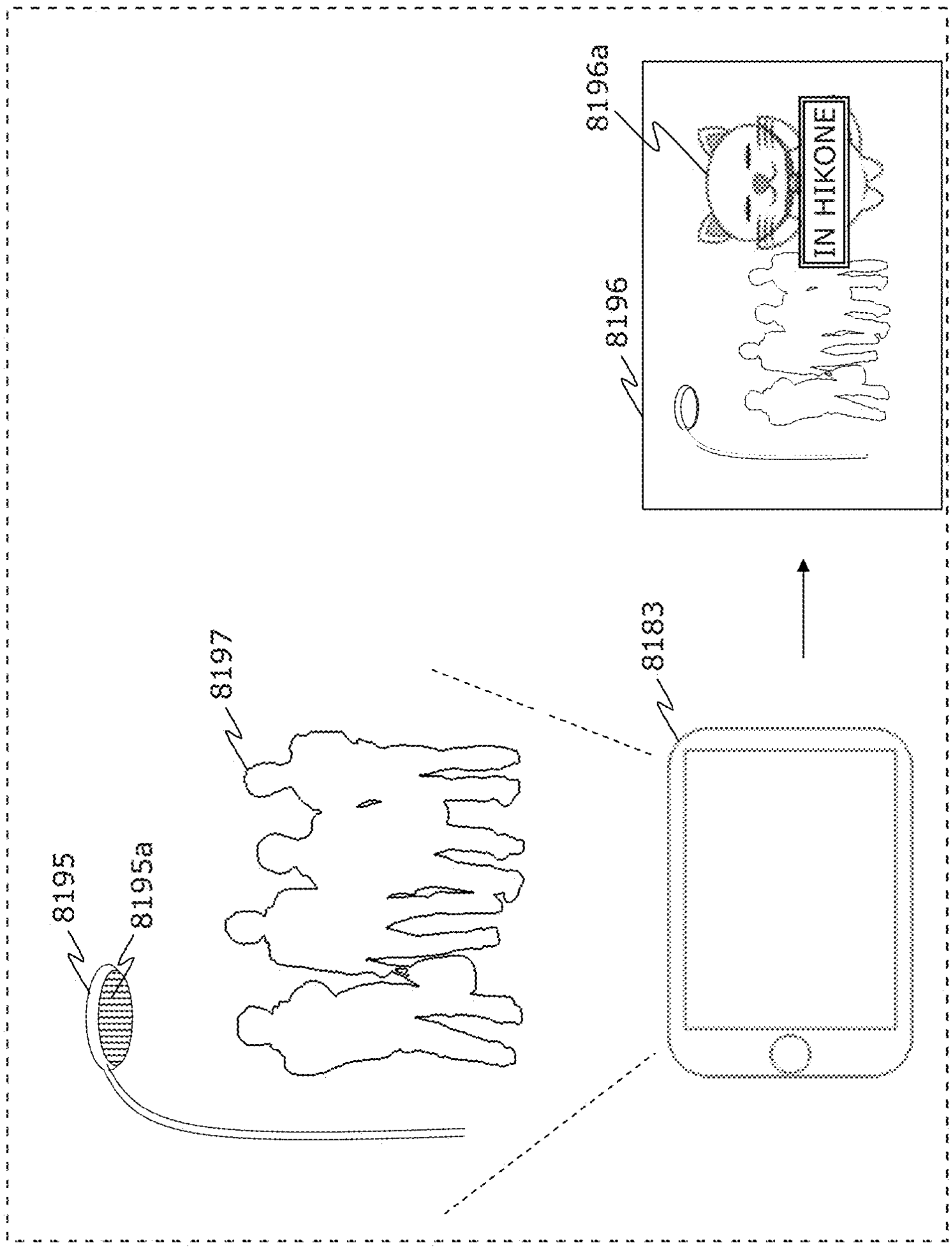
FIG. 29 is a diagram illustrating an example of operation of a transmitter and a receiver in Embodiment 3.

FIG. 29 is a diagram illustrating an example of operation of a transmitter and a receiver in Embodiment 3.

For example, the receiver 8183 captures a subject including a plurality of persons 8197 and a street lighting 8195. The street lighting 8195 includes a transmitter 8195*a* that transmits information by changing in luminance. By capturing the subject, the receiver 8183 obtains an image in which the image of the transmitter 8195*a* appears as the above-mentioned bright line pattern. The receiver 8183 obtains an AR object 8196*a* associated with an ID indicated by the bright line pattern, from a server or the like. The receiver 8183 superimposes the AR object 8196*a* on a normal captured image 8196 obtained by normal imaging, and displays the normal captured image 8196 on which the AR object 8196*a* is superimposed.

Summary of this Embodiment

An information communication method in this embodiment is an information communication method of transmitting a signal using a change in luminance, the information communication method including: a determining step of determining a pattern of the change in luminance by modulating the signal to be transmitted; and a transmission step of transmitting the signal by a light emitter changing in luminance according to the determined pattern, wherein the pattern of the change in luminance is a pattern in which one of two different luminance values occurs in each arbitrary position in a predetermined duration, and in the determining step, the pattern of the change in luminance is determined so that, for each of different signals to be transmitted, a luminance change position in the duration is different and an integral of luminance of the light emitter in the duration is a same value corresponding to preset brightness, the luminance change position being a position at which the luminance rises or a position at which the luminance falls.

In this way, the luminance change pattern is determined so that, for each of the different signals "00", "01", "10", and "11" to be transmitted, the position at which the luminance rises (luminance change position) is different and also the integral of luminance of the light emitter in the predetermined duration (unit duration) is the same value corresponding to the preset brightness (e.g. 99% or 1%). Thus, the brightness of the light emitter can be maintained constant for each signal to be transmitted, with it being possible to suppress flicker. In addition, a receiver that captures the light emitter can appropriately demodulate the luminance change pattern based on the luminance change position. Furthermore, since the luminance change pattern is a pattern in which one of two different luminance values (luminance H (High) or luminance L (Low)) occurs in each arbitrary position in the unit duration, the brightness of the light emitter can be changed continuously.

For example, the information communication method may include an image display step of sequentially displaying a plurality of images by switching between the plurality of images, wherein in the determining step, each time an image is displayed in the image display step, the pattern of the change in luminance for identification information corresponding to the displayed image is determined by modulating the identification information as the signal, and in the transmission step, each time the image is displayed in the image display step, the identification information corresponding to the displayed image is transmitted by the light emitter changing in luminance according to the pattern of the change in luminance determined for the identification information.

In this way, each time an image is displayed, the identification information corresponding to the displayed image is transmitted, for instance as illustrated in FIG. 27. Based on the displayed image, the user can easily select the identification information to be received by the receiver.

For example, in the transmission step, each time the image is displayed in the image display step, identification information corresponding to a previously displayed image may be further transmitted by the light emitter changing in luminance according to the pattern of the change in luminance determined for the identification information.

In this way, even in the case where, as a result of switching the displayed image, the receiver cannot receive the identification signal transmitted before the switching, the receiver can appropriately receive the identification information transmitted before the switching because the identification information corresponding to the previously displayed image is transmitted together with the identification information corresponding to the currently displayed image.

For example, in the determining step, each time the image is displayed in the image display step, the pattern of the change in luminance for the identification information corresponding to the displayed image and a time at which the image is displayed may be determined by modulating the identification information and the time as the signal, and in the transmission step, each time the image is displayed in the image display step, the identification information and the time corresponding to the displayed image may be transmitted by the light emitter changing in luminance according to the pattern of the change in luminance determined for the identification information and the time, and the identification information and a time corresponding to the previously displayed image may be further transmitted by the light emitter changing in luminance according to the pattern of the change in luminance determined for the identification information and the time.

In this way, each time an image is displayed, a plurality of sets of ID time information (information made up of identification information and a time) are transmitted. The receiver can easily select, from the received plurality of sets of ID time information, a previously transmitted identification signal which the receiver cannot be received, based on the time included in each set of ID time information.

For example, the light emitter may have a plurality of areas each of which emits light, and in the transmission step, in the case where light from adjacent areas of the plurality of areas interferes with each other and only one of the plurality of areas changes in luminance according to the determined pattern of the change in luminance, only an area located at an edge from among the plurality of areas may change in luminance according to the determined pattern of the change in luminance.

In this way, only the area (light emitting unit) located at the edge changes in luminance. The influence of light from another area on the luminance change can therefore be suppressed as compared with the case where only an area not located at the edge changes in luminance. As a result, the receiver can capture the luminance change pattern appropriately.

For example, in the transmission step, in the case where only two of the plurality of areas change in luminance according to the determined pattern of the change in luminance, the area located at the edge and an area adjacent to the area located at the edge from among the plurality of areas may change in luminance according to the determined pattern of the change in luminance.

In this way, the area (light emitting unit) located at the edge and the area (light emitting unit) adjacent to the area located at the edge change in luminance. The spatially continuous luminance change range has a wide area, as compared with the case where areas apart from each other change in luminance. As a result, the receiver can capture the luminance change pattern appropriately.

An information communication method in this embodiment is an information communication method of obtaining information from a subject, the information communication method including: a position information transmission step of transmitting position information indicating a position of an image sensor used to capture the subject; a list reception step of receiving an ID list that is associated with the position indicated by the position information and includes a plurality of sets of identification information; an exposure time setting step of setting an exposure time of the image sensor so that, in an image obtained by capturing the subject by the image sensor, a bright line corresponding to an exposure line included in the image sensor appears according to a change in luminance of the subject; an image obtainment step of obtaining a bright line image including the bright line, by capturing the subject that changes in luminance by the image sensor with the set exposure time; an information obtainment step of obtaining the information by demodulating data specified by a pattern of the bright line included in the obtained bright line image; and a search step of searching the ID list for identification information that includes the obtained information.

In this way, since the ID list is received beforehand, even when the obtained information "bc" is only a part of identification information, the appropriate identification information "abcd" can be specified based on the ID list, for instance as illustrated in FIG. 26.

For example, in the case where the identification information that includes the obtained information is not uniquely specified in the search step, the image obtainment step and the information obtainment step may be repeated to obtain new information, and the information communication method may further include a research step of searching the ID list for the identification information that includes the obtained information and the new information.

In this way, even in the case where the obtained information "b" is only a part of identification information and the identification information cannot be uniquely specified with this information alone, the new information "c" is obtained and so the appropriate identification information "abcd" can be specified based on the new information and the ID list, for instance as illustrated in FIG. 26.

An information communication method in this embodiment is an information communication method of obtaining information from a subject, the information communication method including: an exposure time setting step of setting an exposure time of an image sensor so that, in an image obtained by capturing the subject by the image sensor, a bright line corresponding to an exposure line included in the image sensor appears according to a change in luminance of the subject; an image obtainment step of obtaining a bright line image including the bright line, by capturing the subject that changes in luminance by the image sensor with the set exposure time; an information obtainment step of obtaining identification information by demodulating data specified by a pattern of the bright line included in the obtained bright line image; a transmission step of transmitting the obtained identification information and position information indicating a position of the image sensor; and an error reception step of receiving error notification information for notifying an error, in the case where the obtained identification information is not included in an ID list that is associated with the position indicated by the position information and includes a plurality of sets of identification information.

In this way, the error notification information is received in the case where the obtained identification information is not included in the ID list. Upon receiving the error notification information, the user of the receiver can easily recognize that information associated with the obtained identification information cannot be obtained.

Embodiment 4

This embodiment describes each example of application using a receiver such as a smartphone and a transmitter for transmitting information as a blink pattern of an LED, an organic EL device, or the like in Embodiments 1 to 4 described above.

Figure 30:
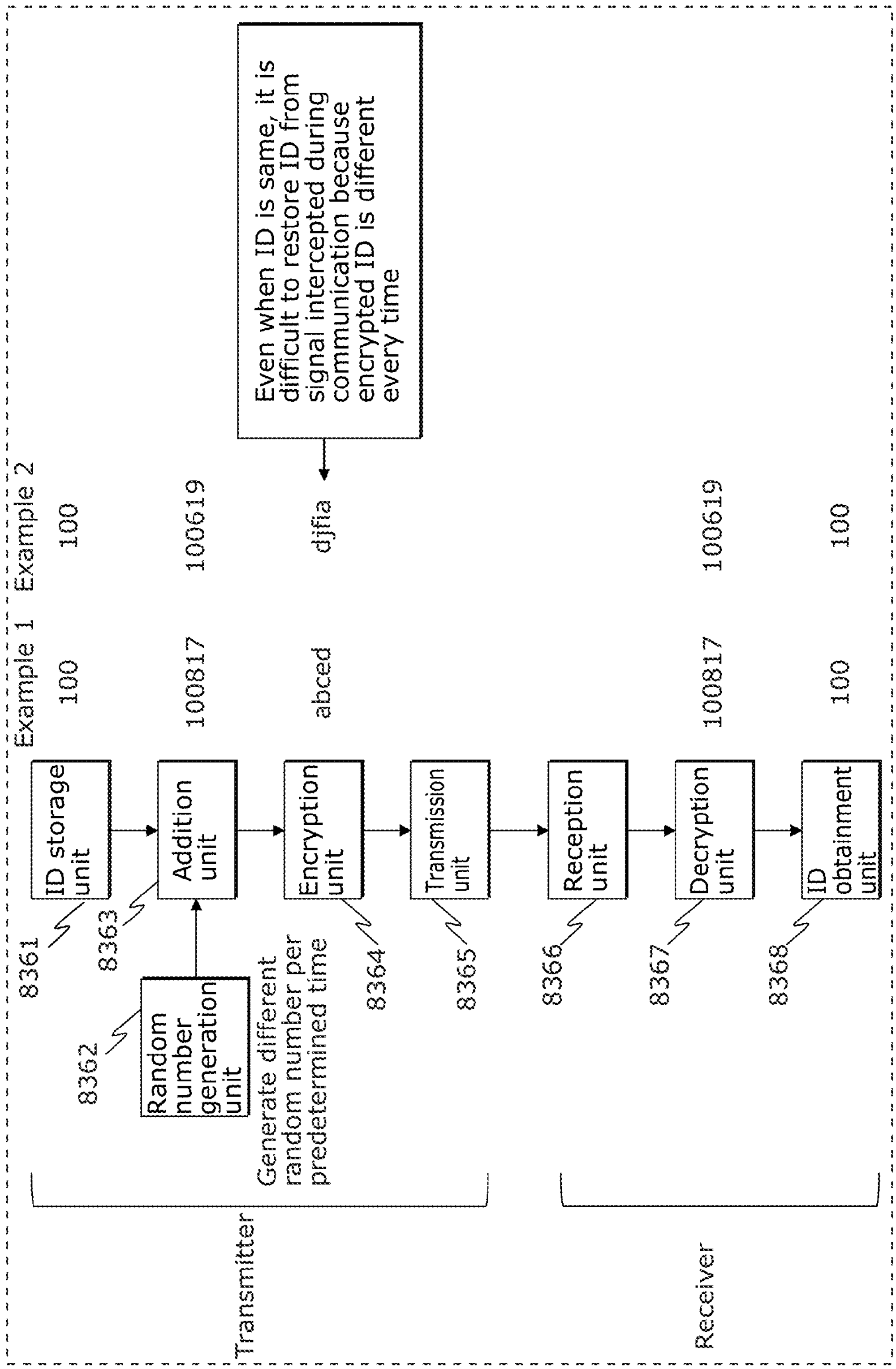
FIG. 30 is a diagram illustrating an example of operation of a transmitter and a receiver in Embodiment 4.

FIG. 30 is a diagram illustrating an example of operation of a transmitter and a receiver in Embodiment 4.

The transmitter includes an ID storage unit 8361, a random number generation unit 8362, an addition unit 8363, an encryption unit 8364, and a transmission unit 8365. The ID storage unit 8361 stores the ID of the transmitter. The random number generation unit 8362 generates a different random number at regular time intervals. The addition unit 8363 combines the ID stored in the ID storage unit 8361 with the latest random number generated by the random number generation unit 8362, and outputs the result as an edited ID. The encryption unit 8364 encrypts the edited ID to generate an encrypted edited ID. The transmission unit 8365 transmits the encrypted edited ID to the receiver by changing in luminance.

The receiver includes a reception unit 8366, a decryption unit 8367, and an ID obtainment unit 8368. The reception unit 8366 receives the encrypted edited ID from the transmitter, by capturing the transmitter (visible light imaging). The decryption unit 8367 decrypts the received encrypted edited ID to restore the edited ID. The ID obtainment unit 8368 extracts the ID from the edited ID, thus obtaining the ID.

For instance, the ID storage unit 8361 stores the ID "100", and the random number generation unit 8362 generates a new random number "817" (example 1). In this case, the addition unit 8363 combines the ID "100" with the random number "817" to generate the edited ID "100817", and outputs it. The encryption unit 8364 encrypts the edited ID "100817" to generate the encrypted edited ID "abced". The decryption unit 8367 in the receiver decrypts the encrypted edited ID "abced" to restore the edited ID "100817". The ID obtainment unit 8368 extracts the ID "100" from the restored edited ID "100817". In other words, the ID obtainment unit 8368 obtains the ID "100" by deleting the last three digits of the edited ID.

Next, the random number generation unit 8362 generates a new random number "619" (example 2). In this case, the addition unit 8363 combines the ID "100" with the random number "619" to generate the edited ID "100619", and outputs it. The encryption unit 8364 encrypts the edited ID "100619" to generate the encrypted edited ID "difia". The decryption unit 8367 in the receiver decrypts the encrypted edited ID "difia" to restore the edited ID "100619". The ID obtainment unit 8368 extracts the ID "100" from the restored edited ID "100619". In other words, the ID obtainment unit 8368 obtains the ID "100" by deleting the last three digits of the edited ID.

Thus, the transmitter does not simply encrypt the ID but encrypts its combination with the random number changed at regular time intervals, with it being possible to prevent the ID from being easily cracked from the signal transmitted from the transmission unit 8365. That is, in the case where the simply encrypted ID is transmitted from the transmitter to the receiver a plurality of times, even though the ID is encrypted, the signal transmitted from the transmitter to the receiver is the same if the ID is the same, so that there is a possibility of the ID being cracked. In the example illustrated in FIG. 30, however, the ID is combined with the random number changed at regular time intervals, and the ID combined with the random number is encrypted. Therefore, even in the case where the same ID is transmitted to the receiver a plurality of times, if the time of transmitting the ID is different, the signal transmitted from the transmitter to the receiver is different. This protects the ID from being cracked easily.

Note that the receiver illustrated in FIG. 30 may, upon obtaining the encrypted edited ID, transmit the encrypted edited ID to the server, and obtain the ID from the server.

(Station Guide)

Figure 31:
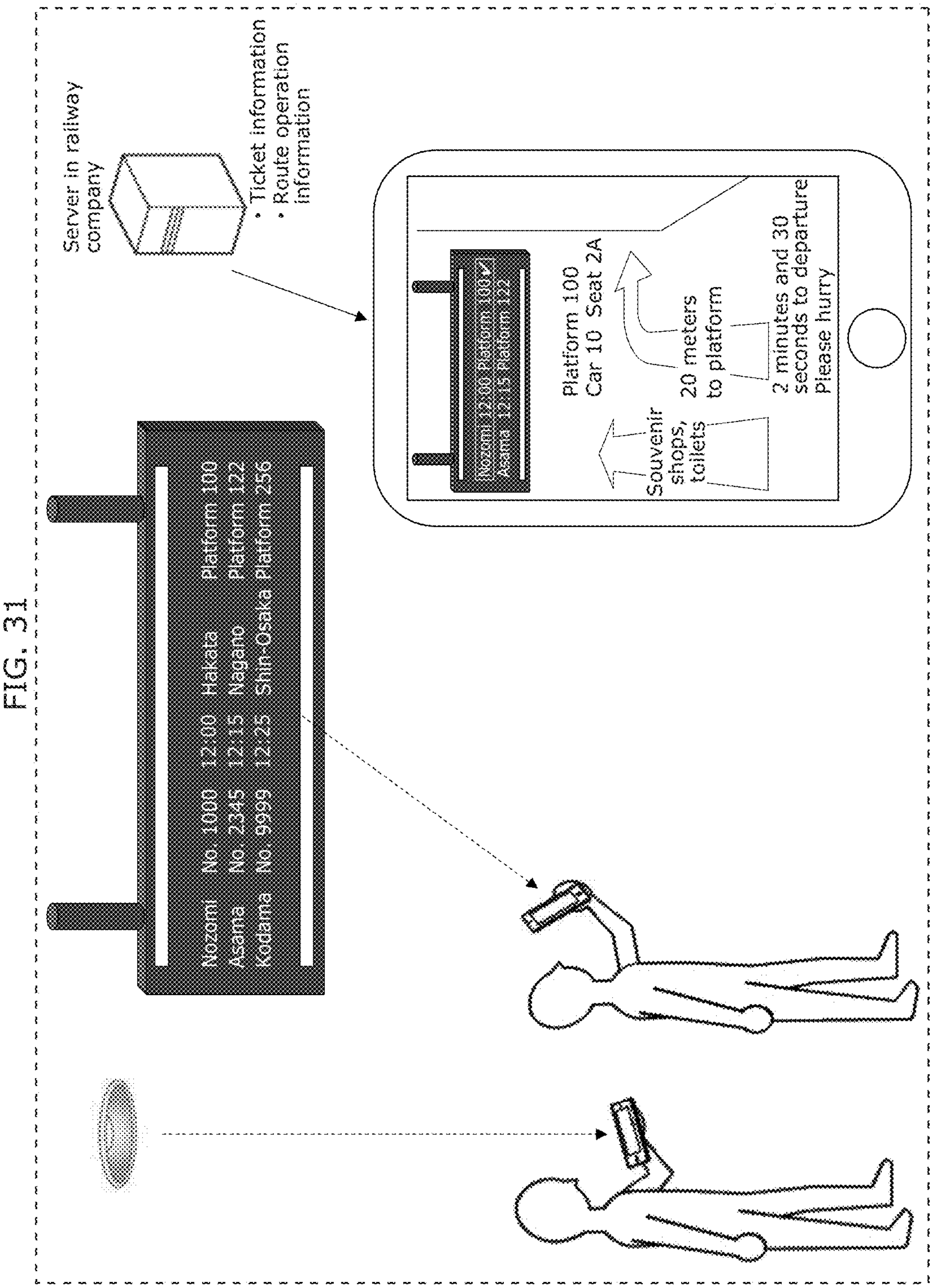
FIG. 31 is a diagram illustrating an example of operation of a transmitter and a receiver in Embodiment 4.

FIG. 31 is a diagram illustrating an example of use according to the present disclosure on a train platform. A user points a mobile terminal at an electronic display board or a lighting, and obtains information displayed on the electronic display board or train information or station information of a station where the electronic display board is installed, by visible light communication. Here, the information displayed on the electronic display board may be directly transmitted to the mobile terminal by visible light communication, or ID information corresponding to the electronic display board may be transmitted to the mobile terminal so that the mobile terminal inquires of a server using the obtained ID information to obtain the information displayed on the electronic display board. In the case where the ID information is transmitted from the mobile terminal, the server transmits the information displayed on the electronic display board to the mobile terminal, based on the ID information. Train ticket information stored in a memory of the mobile terminal is compared with the information displayed on the electronic display board and, in the case where ticket information corresponding to the ticket of the user is displayed on the electronic display board, an arrow indicating the way to the platform at which the train the user is going to ride arrives is displayed on a display of the mobile terminal. An exit or a path to a train car near a transfer route may be displayed when the user gets off a train. When a seat is reserved, a path to the seat may be displayed. When displaying the arrow, the same color as the train line in a map or train guide information may be used to display the arrow, to facilitate understanding. Reservation information (platform number, car number, departure time, seat number) of the user may be displayed together with the arrow. A recognition error can be prevented by also displaying the reservation information of the user. In the case where the ticket is stored in a server, the mobile terminal inquires of the server to obtain the ticket information and compares it with the information displayed on the electronic display board, or the server compares the ticket information with the information displayed on the electronic display board. Information relating to the ticket information can be obtained in this way. The intended train line may be estimated from a history of transfer search made by the user, to display the route. Not only the information displayed on the electronic display board but also the train information or station information of the station where the electronic display board is installed may be obtained and used for comparison. Information relating to the user in the electronic display board displayed on the display may be highlighted or modified. In the case where the train ride schedule of the user is unknown, a guide arrow to each train line platform may be displayed. When the station information is obtained, a guide arrow to souvenir shops and toilets may be displayed on the display. The behavior characteristics of the user may be managed in the server so that, in the case where the user frequently goes to souvenir shops or toilets in a train station, the guide arrow to souvenir shops and toilets is displayed on the display. By displaying the guide arrow to souvenir shops and toilets only to each user having the behavior characteristics of going to souvenir shops or toilets while not displaying the guide arrow to other users, it is possible to reduce processing. The guide arrow to souvenir shops and toilets may be displayed in a different color from the guide arrow to the platform. When displaying both arrows simultaneously, a recognition error can be prevented by displaying them in different colors. Though a train example is illustrated in FIG. 31, the same structure is applicable to display for planes, buses, and so on.

(Coupon Popup)

Figure 32:
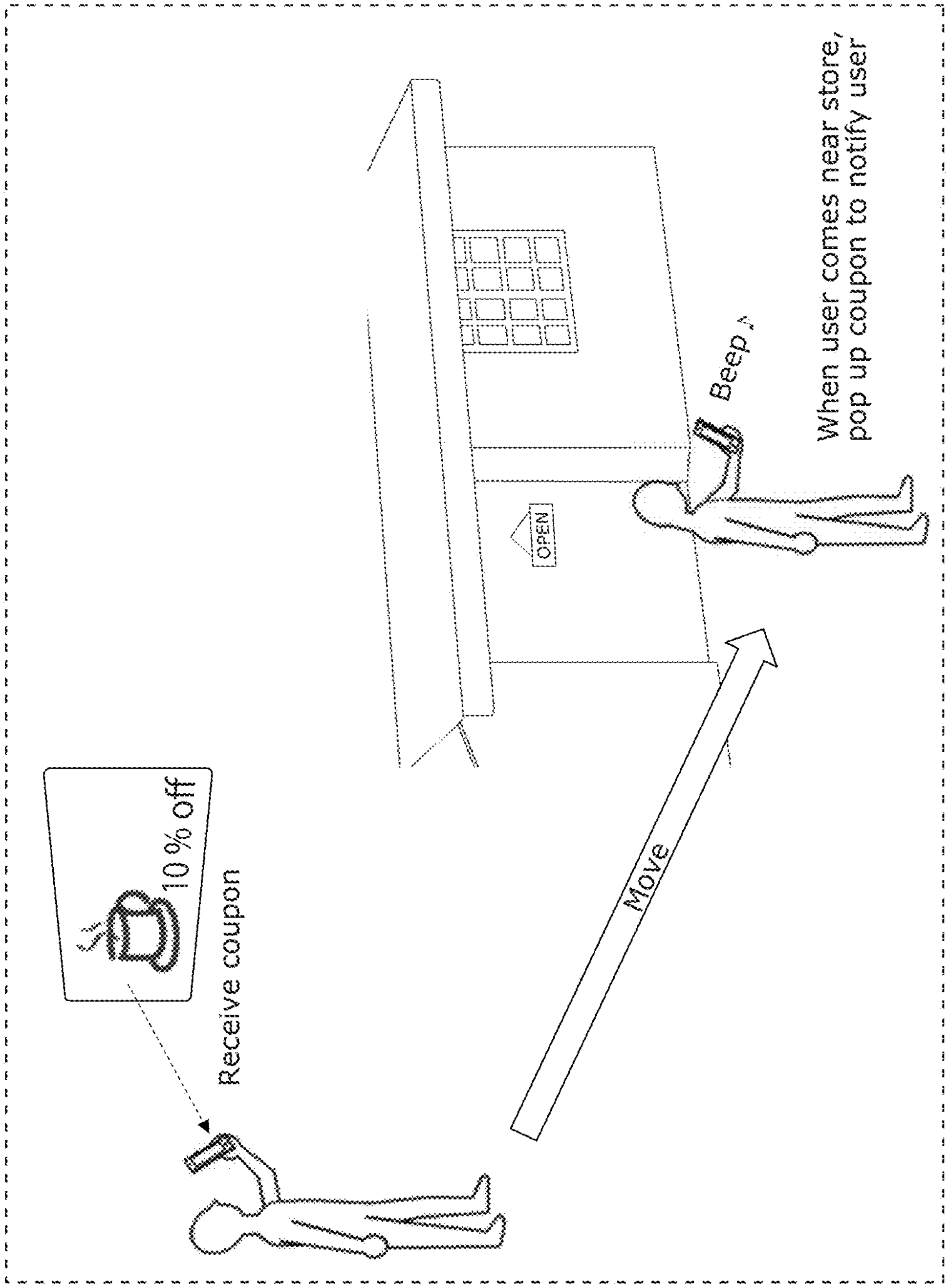
FIG. 32 is a diagram illustrating an example of operation of a transmitter and a receiver in Embodiment 4.

FIG. 32 is a diagram illustrating an example of displaying, on a display of a mobile terminal, coupon information obtained by visible light communication or a popup when a user comes close to a store. The user obtains the coupon information of the store from an electronic display board or the like by visible light communication, using his or her mobile terminal. After this, when the user enters a predetermined range from the store, the coupon information of the store or a popup is displayed. Whether or not the user enters the predetermined range from the store is determined using GPS information of the mobile terminal and store information included in the coupon information. The information is not limited to coupon information, and may be ticket information. Since the user is automatically alerted when coming close to a store where a coupon or a ticket can be used, the user can use the coupon or the ticket effectively.

(Start of Operation Application)

Figure 33:
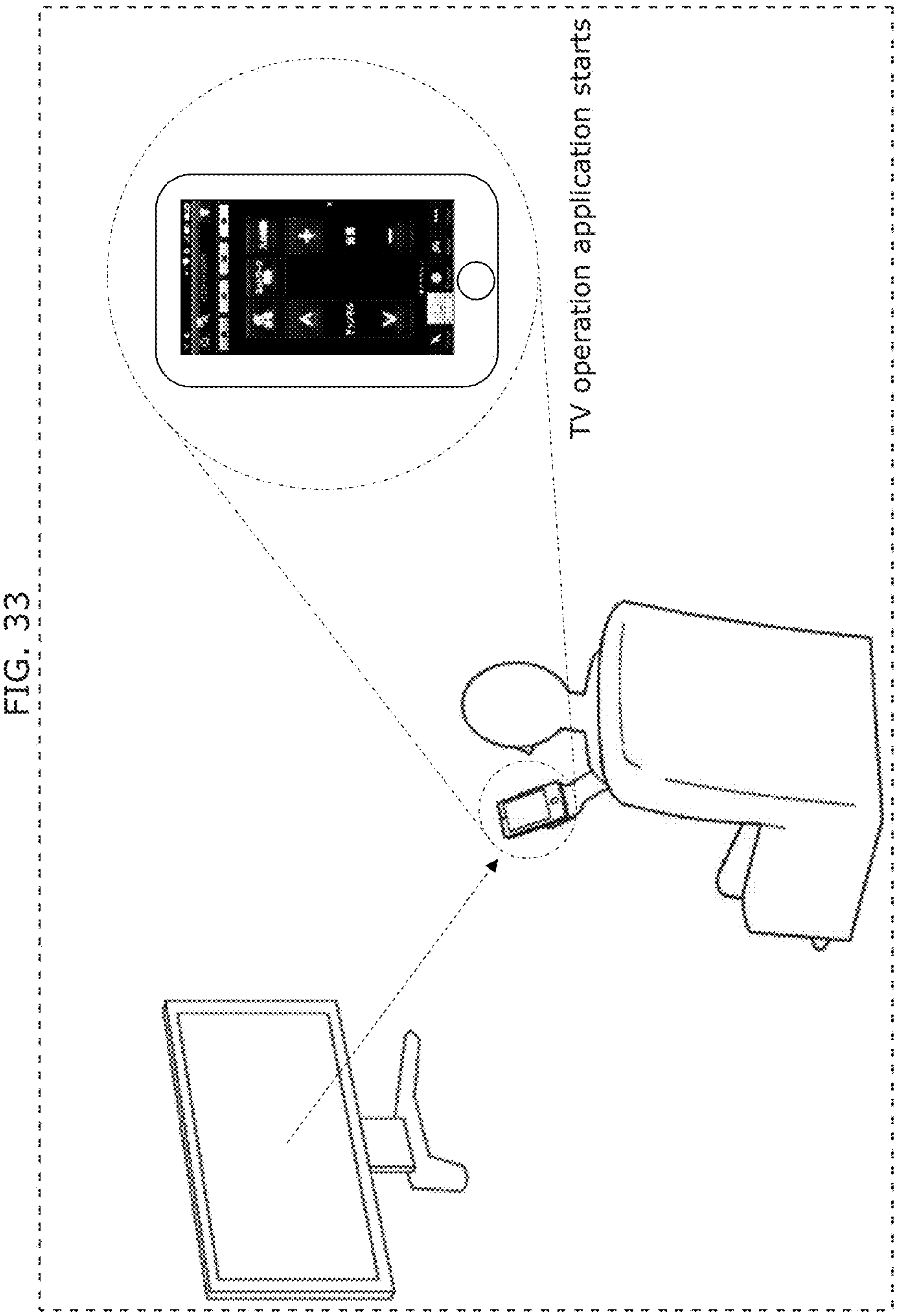
FIG. 33 is a diagram illustrating an example of operation of a transmitter and a receiver in Embodiment 4.

FIG. 33 is a diagram illustrating an example where a user obtains information from a home appliance by visible light communication using a mobile terminal. In the case where ID information or information related to the home appliance is obtained from the home appliance by visible light communication, an application for operating the home appliance starts automatically. FIG. 33 illustrates an example of using a TV. Thus, merely pointing the mobile terminal at the home appliance enables the application for operating the home appliance to start.

(Database)

FIG. 34 is a diagram illustrating an example of a structure of a database held in a server that manages an ID transmitted from a transmitter.

The database includes an ID-data table holding data provided in response to an inquiry using an ID as a key, and an access log table holding each record of inquiry using an ID as a key. The ID-data table includes an ID transmitted from a transmitter, data provided in response to an inquiry using the ID as a key, a data provision condition, the number of times access is made using the ID as a key, and the number of times the data is provided as a result of clearing the condition. Examples of the data provision condition include the date and time, the number of accesses, the number of successful accesses, terminal information of the inquirer (terminal model, application making inquiry, current position of terminal, etc.), and user information of the inquirer (age, sex, occupation, nationality, language, religion, etc.). By using the number of successful accesses as the condition, a method of providing such a service that "1 yen per access, though no data is returned after 100 yen as upper limit" is possible. When access is made using an ID as a key, the log table records the ID, the user ID of the requester, the time, other ancillary information, whether or not data is provided as a result of clearing the condition, and the provided data.

(Communication Protocol Different According to Zone)

Figure 35:
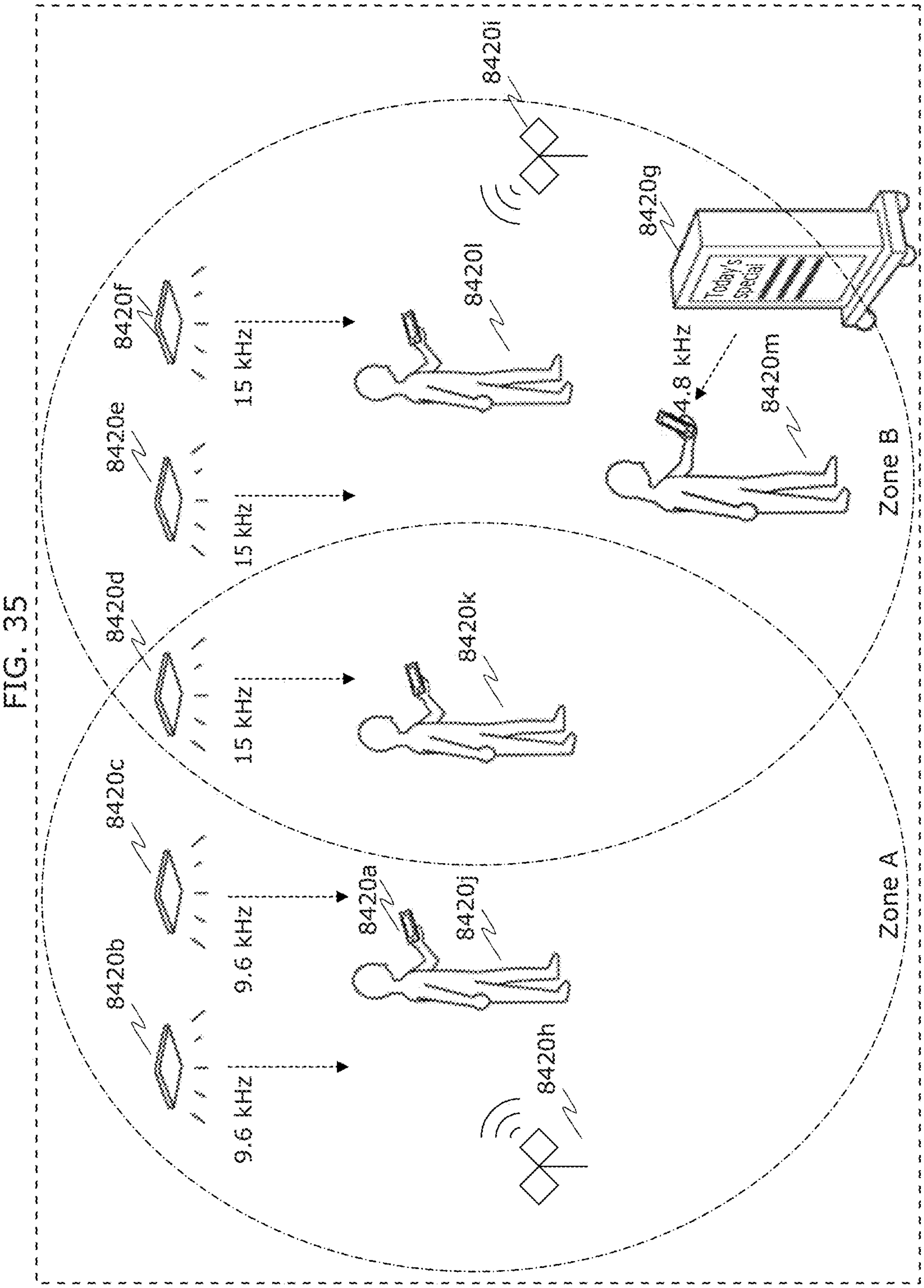
FIG. 35 is a diagram illustrating an example of operation of a transmitter and a receiver in Embodiment 4.

FIG. 35 is a diagram illustrating an example of operation of a transmitter and a receiver in Embodiment 4.

A receiver 8420*a* receives zone information form a base station 8420*h*, recognizes in which position the receiver 8420*a* is located, and selects a reception protocol. The base station 8420*h* is, for example, a mobile phone communication base station, a Wi-Fi access point, an IMES transmitter, a speaker, or a wireless transmitter (Bluetooth®, ZigBee, specified low power radio station, etc.). The receiver 8420*a* may specify the zone based on position information obtained from GPS or the like. As an example, it is assumed that communication is performed at a signal frequency of 9.6 kHz in zone A, and communication is performed at a signal frequency of 15 kHz by a ceiling light and at a signal frequency of 4.8 kHz by a signage in zone B. At a position 8420*j*, the receiver 8420*a* recognizes that the current position is zone A from information from the base station 8420*h*, and performs reception at the signal frequency of 9.6 kHz, thus receiving signals transmitted from transmitters 8420*b* and 8420*c*. At a position 8420*l*, the receiver 8420*a* recognizes that the current position is zone B from information from a base station 8420*i*, and also estimates that a signal from a ceiling light is to be received from the movement of directing the in camera upward. The receiver 8420*a* performs reception at the signal frequency of 15 kHz, thus receiving signals transmitted from transmitters 8420*e* and 8420*f*. At a position 8420*m*, the receiver 8420*a* recognizes that the current position is zone B from information from the base station 8420*i*, and also estimates that a signal transmitted from a signage is to be received from the movement of sticking out the out camera. The receiver 8420*a* performs reception at the signal frequency of 4.8 kHz, thus receiving a signal transmitted from a transmitter 8420*g*. At a position 8420*k*, the receiver 8420*a* receives signals from both of the base stations 8420*h* and 8420*i* and cannot determine whether the current position is zone A or zone B. The receiver 8420*a* accordingly performs reception at both 9.6 kHz and 15 kHz. The part of the protocol different according to zone is not limited to the frequency, and may be the transmission signal modulation scheme, the signal format, or the server inquired using an ID. The base station 8420*h* or 8420*i* may transmit the protocol in the zone to the receiver, or transmit only the ID indicating the zone to the receiver so that the receiver obtains protocol information from a server using the zone ID as a key.

Transmitters 8420*b* to 8420*f* each receive the zone ID or protocol information from the base station 8420*h* or 8420*i*, and determine the signal transmission protocol. The transmitter 8420*d* that can receive the signals from both the base stations 8420*h* and 8420*i* uses the protocol of the zone of the base station with a higher signal strength, or alternately use both protocols.

(Recognition of Zone and Service for each Zone)

Figure 36:
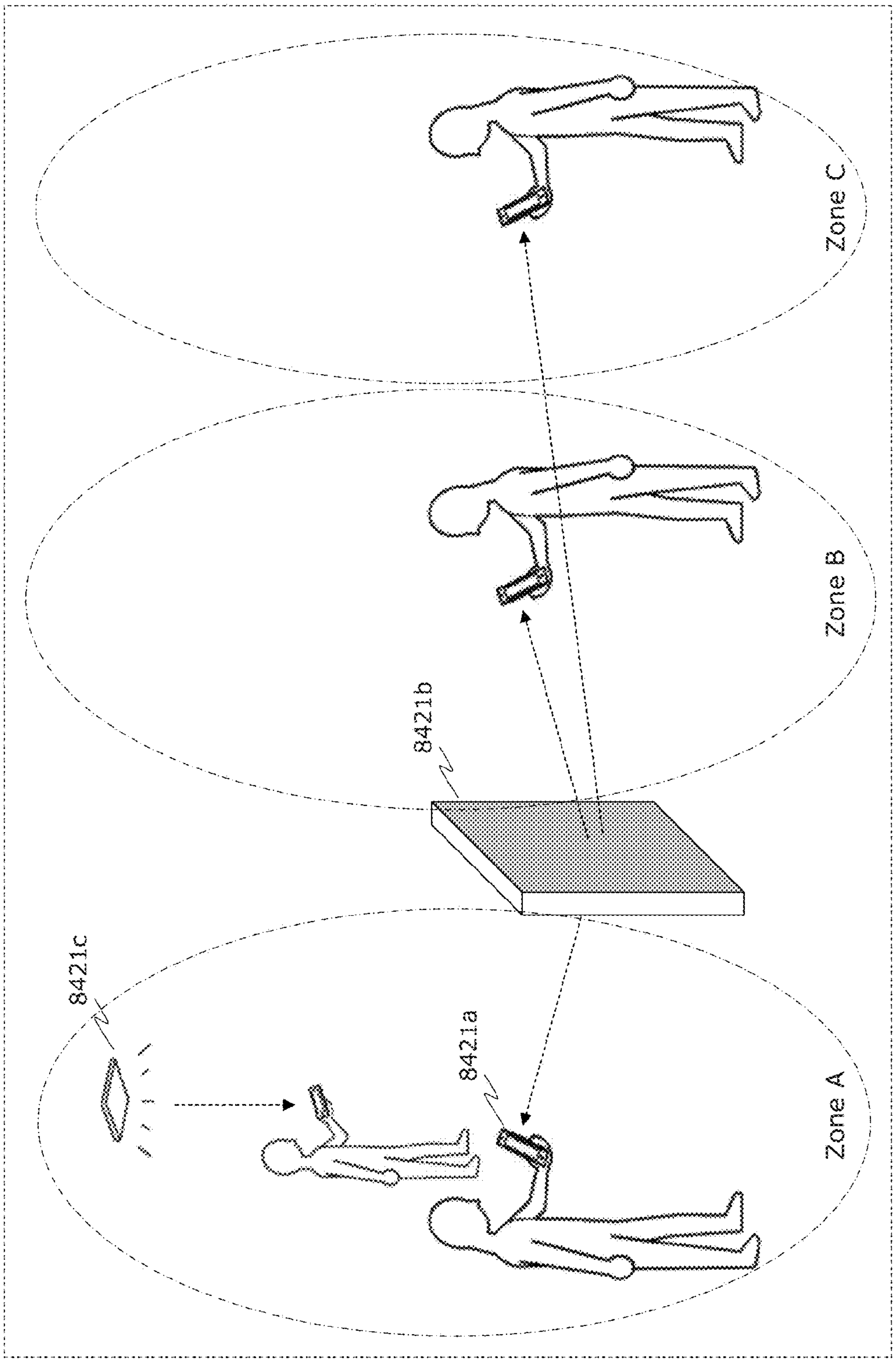
FIG. 36 is a diagram illustrating an example of operation of a transmitter and a receiver in Embodiment 4.

FIG. 36 is a diagram illustrating an example of operation of a transmitter and a receiver in Embodiment 4.

A receiver 8421*a* recognizes a zone to which the position of the receiver 8421*a* belongs, from a received signal. The receiver 8421*a* provides a service (coupon distribution, point assignment, route guidance, etc.) determined for each zone. As an example, the receiver 8421*a* receives a signal transmitted from the left of a transmitter 8421*b*, and recognizes that the receiver 8421*a* is located in zone A. Here, the transmitter 8421*b* may transmit a different signal depending on the transmission direction. Moreover, the transmitter 8421*b* may, through the use of a signal of the light emission pattern such as 2217*a*, transmit a signal so that a different signal is received depending on the distance to the receiver. The receiver 8421*a* may recognize the position relation with the transmitter 8421*b* from the direction and size in which the transmitter 8421*b* is captured, and recognize the zone in which the receiver 8421*a* is located.

Signals indicating the same zone may have a common part. For example, the first half of an ID indicating zone A, which is transmitted from each of the transmitters 8421*b* and 8421*c*, is common. This enables the receiver 8421*a* to recognize the zone where the receiver 8421*a* is located, merely by receiving the first half of the signal.

Summary of this Embodiment

An information communication method in this embodiment is an information communication method of transmitting a signal using a change in luminance, the information communication method including: a determining step of determining a plurality of patterns of the change in luminance, by modulating each of a plurality of signals to be transmitted; and a transmission step of transmitting, by each of a plurality of light emitters changing in luminance according to any one of the plurality of determined patterns of the change in luminance, a signal corresponding to the pattern, wherein in the transmission step, each of two or more light emitters of the plurality of light emitters changes in luminance at a different frequency so that light of one of two types of light different in luminance is output per a time unit determined for the light emitter beforehand and that the time unit determined for each of the two or more light emitters is different.

In this way, two or more light emitters (e.g. transmitters as lighting devices) each change in luminance at a different frequency. Therefore, a receiver that receives signals (e.g. light emitter IDs) from these light emitters can easily obtain the signals separately from each other.

For example, in the transmission step, each of the plurality of light emitters may change in luminance at any one of at least four types of frequencies, and the two or more light emitters of the plurality of transmitters may change in luminance at the same frequency. For example, in the transmission step, the plurality of light emitters each change in luminance so that a luminance change frequency is different between all light emitters which, in the case where the plurality of light emitters are projected on a light receiving surface of an image sensor for receiving the plurality of signals, are adjacent to each other on the light receiving surface.

In this way, as long as there are at least four types of frequencies used for luminance changes, even in the case where two or more light emitters change in luminance at the same frequency, i.e. in the case where the number of types of frequencies is smaller than the number of light emitters, it can be ensured that the luminance change frequency is different between all light emitters adjacent to each other on the light receiving surface of the image sensor based on the four color problem or the four color theorem. As a result, the receiver can easily obtain the signals transmitted from the plurality of light emitters, separately from each other.

For example, in the transmission step, each of the plurality of light emitters may transmit the signal, by changing in luminance at a frequency specified by a hash value of the signal.

In this way, each of the plurality of light emitters changes in luminance at the frequency specified by the hash value of the signal (e.g. light emitter ID). Accordingly, upon receiving the signal, the receiver can determine whether or not the frequency specified from the actual change in luminance and the frequency specified by the hash value match. That is, the receiver can determine whether or not the received signal (e.g. light emitter ID) has an error.

For example, the information communication method may further include: a frequency calculating step of calculating, from a signal to be transmitted which is stored in a signal storage unit, a frequency corresponding to the signal according to a predetermined function, as a first frequency; a frequency determining step of determining whether or not a second frequency stored in a frequency storage unit and the calculated first frequency match; and a frequency error reporting step of in the case of determining that the first frequency and the second frequency do not match, reporting an error, wherein in the case of determining that the first frequency and the second frequency match, in the determining step, a pattern of the change in luminance is determined by modulating the signal stored in the signal storage unit, and in the transmission step, the signal stored in the signal storage unit is transmitted by any one of the plurality of light emitters changing in luminance at the first frequency according to the determined pattern.

In this way, whether or not the frequency stored in the frequency storage unit and the frequency calculated from the signal stored in the signal storage unit (ID storage unit)

match is determined and, in the case of determining that the frequencies do not match, an error is reported. This eases abnormality detection on the signal transmission function of the light emitter.

For example, the information communication method may further include: a check value calculating step of calculating a first check value from a signal to be transmitted which is stored in a signal storage unit, according to a predetermined function; a check value determining step of determining whether or not a second check value stored in a check value storage unit and the calculated first check value match; and a check value error reporting step of, in the case of determining that the first check value and the second check value do not match, reporting an error, wherein in the case of determining that the first check value and the second check value match, in the determining step, a pattern of the change in luminance is determined by modulating the signal stored in the signal storage unit, and in the transmission step, the signal stored in the signal storage unit is transmitted by any one of the plurality of light emitters changing in luminance at the first frequency according to the determined pattern.

In this way, whether or not the check value stored in the check value storage unit and the check value calculated from the signal stored in the signal storage unit (ID storage unit) match is determined and, in the case of determining that the check values do not match, an error is reported. This eases abnormality detection on the signal transmission function of the light emitter.

An information communication method in this embodiment is an information communication method of obtaining information from a subject, the information communication method including: an exposure time setting step of setting an exposure time of an image sensor so that, in an image obtained by capturing the subject by the image sensor, a plurality of bright lines corresponding to a plurality of exposure lines included in the image sensor appear according to a change in luminance of the subject; an image obtainment step of obtaining a bright line image including the plurality of bright lines, by capturing the subject that changes in luminance by the image sensor with the set exposure time; an information obtainment step of obtaining the information by demodulating data specified by a pattern of the plurality of bright lines included in the obtained bright line image; and a frequency specifying step of specifying a luminance change frequency of the subject, based on the pattern of the plurality of bright lines included in the obtained bright line image. For example, in the frequency specifying step, a plurality of header patterns that are included in the pattern of the plurality of bright lines and are a plurality of patterns each determined beforehand to indicate a header are specified, and a frequency corresponding to the number of pixels between the plurality of header patterns is specified as the luminance change frequency of the subject.

In this way, the luminance change frequency of the subject is specified. In the case where a plurality of subjects that differ in luminance change frequency are captured, information from these subjects can be easily obtained separately from each other.

For example, in the image obtainment step, the bright line image including a plurality of patterns represented respectively by the plurality of bright lines may be obtained by capturing a plurality of subjects each of which changes in luminance, and in the information obtainment step, in the case where the plurality of patterns included in the obtained bright line image overlap each other in a part, the information may be obtained from each of the plurality of patterns by demodulating the data specified by a part of each of the plurality of patterns other than the part.

In this way, data is not demodulated from the overlapping part of the plurality of patterns (the plurality of bright line patterns). Obtainment of wrong information can thus be prevented.

For example, in the image obtainment step, a plurality of bright line images may be obtained by capturing the plurality of subjects a plurality of times at different timings from each other, in the frequency specifying step, for each bright line image, a frequency corresponding to each of the plurality of patterns included in the bright line image may be specified, and in the information obtainment step, the plurality of bright line images may be searched for a plurality of patterns for which the same frequency is specified, the plurality of patterns searched for may be combined, and the information may be obtained by demodulating the data specified by the combined plurality of patterns.

In this way, the plurality of bright line images are searched for the plurality of patterns (the plurality of bright line patterns) for which the same frequency is specified, the plurality of patterns searched for are combined, and the information is obtained from the combined plurality of patterns. Hence, even in the case where the plurality of subjects are moving, information from the plurality of subjects can be easily obtained separately from each other.

For example, the information communication method may further include: a transmission step of transmitting identification information of the subject included in the information obtained in the information obtainment step and specified frequency information indicating the frequency specified in the frequency specifying step, to a server in which a frequency is registered for each set of identification information; and a related information obtainment step of obtaining related information associated with the identification information and the frequency indicated by the specified frequency information, from the server.

In this way, the related information associated with the identification information (ID) obtained based on the luminance change of the subject (transmitter) and the frequency of the luminance change is obtained. By changing the luminance change frequency of the subject and updating the frequency registered in the server with the changed frequency, a receiver that has obtained the identification information before the change of the frequency is prevented from obtaining the related information from the server. That is, by changing the frequency registered in the server according to the change of the luminance change frequency of the subject, it is possible to prevent a situation where a receiver that has previously obtained the identification information of the subject can obtain the related information from the server for an indefinite period of time.

For example, the information communication method may further include: an identification information obtainment step of obtaining identification information of the subject, by extracting a part from the information obtained in the information obtainment step; and a set frequency specifying step of specifying a number indicated by the information other than the part of the information obtained in the information obtainment step, as a luminance change frequency set for the subject.

In this way, the identification information of the subject and the luminance change frequency set for the subject can be included independently of each other in the information obtained from the pattern of the plurality of bright lines. This contributes to a higher degree of freedom of the identification information and the set frequency.

Embodiment 5

This embodiment describes each example of application using a receiver such as a smartphone and a transmitter for transmitting information as a blink pattern of an LED or an organic EL device in each of the embodiments described above.

(Notification of Visible Light Communication to Humans)

Figure 37:
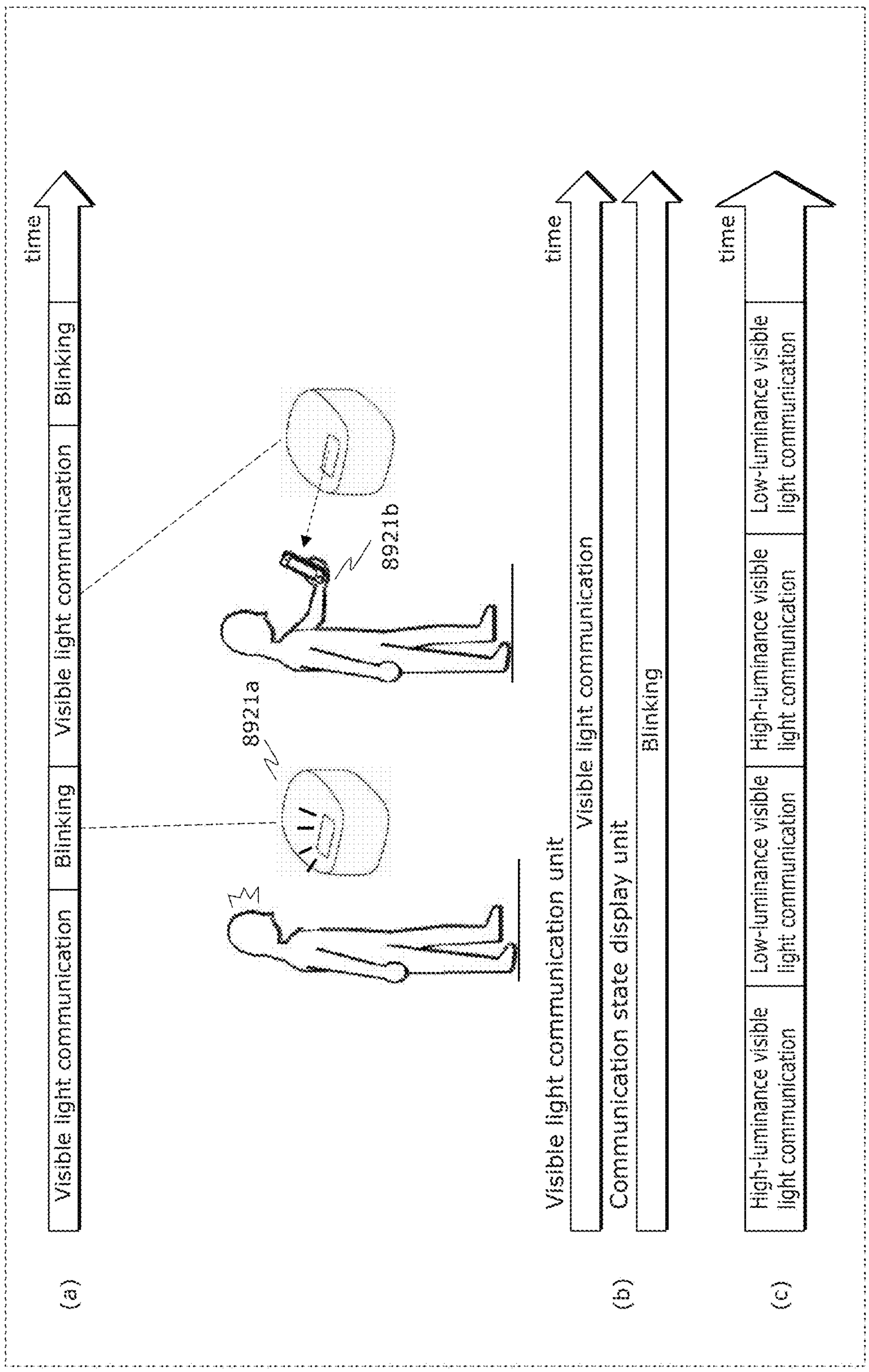
FIG. 37 is a diagram for describing notification of visible light communication to humans in Embodiment 5.

FIG. 37 is a diagram illustrating an example of operation of a transmitter in Embodiment 5.

A light emitting unit in a transmitter 8921*a* repeatedly performs blinking visually recognizable by humans and visible light communication, as illustrated in (a) in FIG. 37. Blinking visually recognizable by humans can notify humans that visible light communication is possible. Upon seeing that the transmitter 8921*a* is blinking, a user notices that visible light communication is possible. The user accordingly points a receiver 8921*b* at the transmitter 8921*a* to perform visible light communication, and conducts user registration of the transmitter 8921*a*.

Thus, the transmitter in this embodiment repeatedly alternates between a step of a light emitter transmitting a signal by changing in luminance and a step of the light emitter blinking so as to be visible to the human eye.

The transmitter may include a visible light communication unit and a blinking unit (communication state display unit) separately, as illustrated in (b) in FIG. 37.

The transmitter may operate as illustrated in (c) in FIG. 37, thereby making the light emitting unit appear blinking to humans while performing visible light communication. In detail, the transmitter repeatedly alternates between high-luminance visible light communication with brightness 75% and low-luminance visible light communication with brightness 1%. As an example, by operating as illustrated in (c) in FIG. 37 when an abnormal condition or the like occurs in the transmitter and the transmitter is transmitting a signal different from normal, the transmitter can alert the user without stopping visible light communication.

(Example of Application to Route Guidance)

Figure 38:
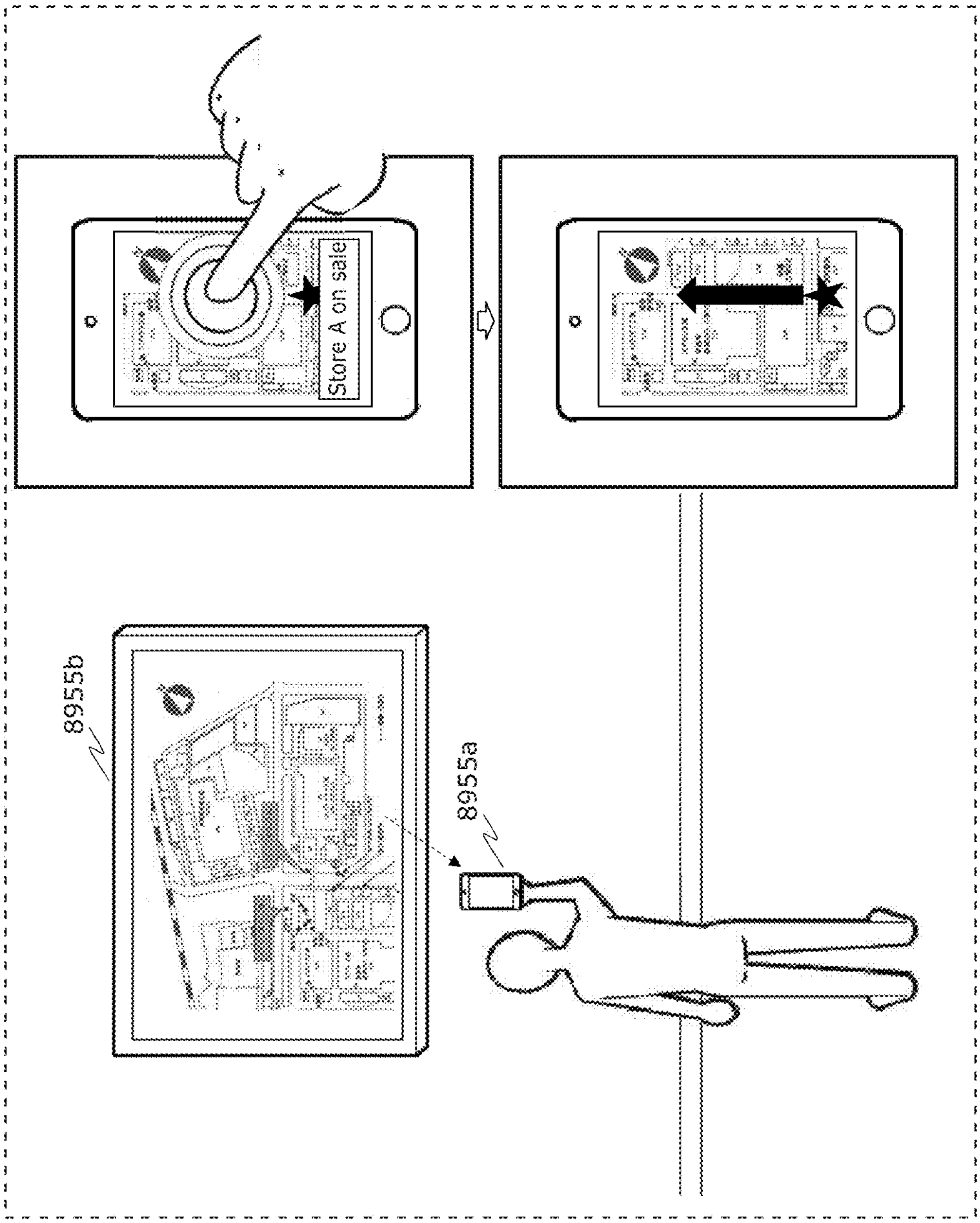
FIG. 38 is a diagram for describing an example of application to route guidance in Embodiment 5.

FIG. 38 is a diagram illustrating an example of application of a transmission and reception system in Embodiment 5.

A receiver 8955*a* receives a transmission ID of a transmitter 8955*b* such as a guide sign, obtains data of a map displayed on the guide sign from a server, and displays the map data. Here, the server may transmit an advertisement suitable for the user of the receiver 8955*a*, so that the receiver 8955*a* displays the advertisement information, too. The receiver 8955*a* displays the route from the current position to the location designated by the user.

(Example of Application to use Log Storage and Analysis)

Figure 39:
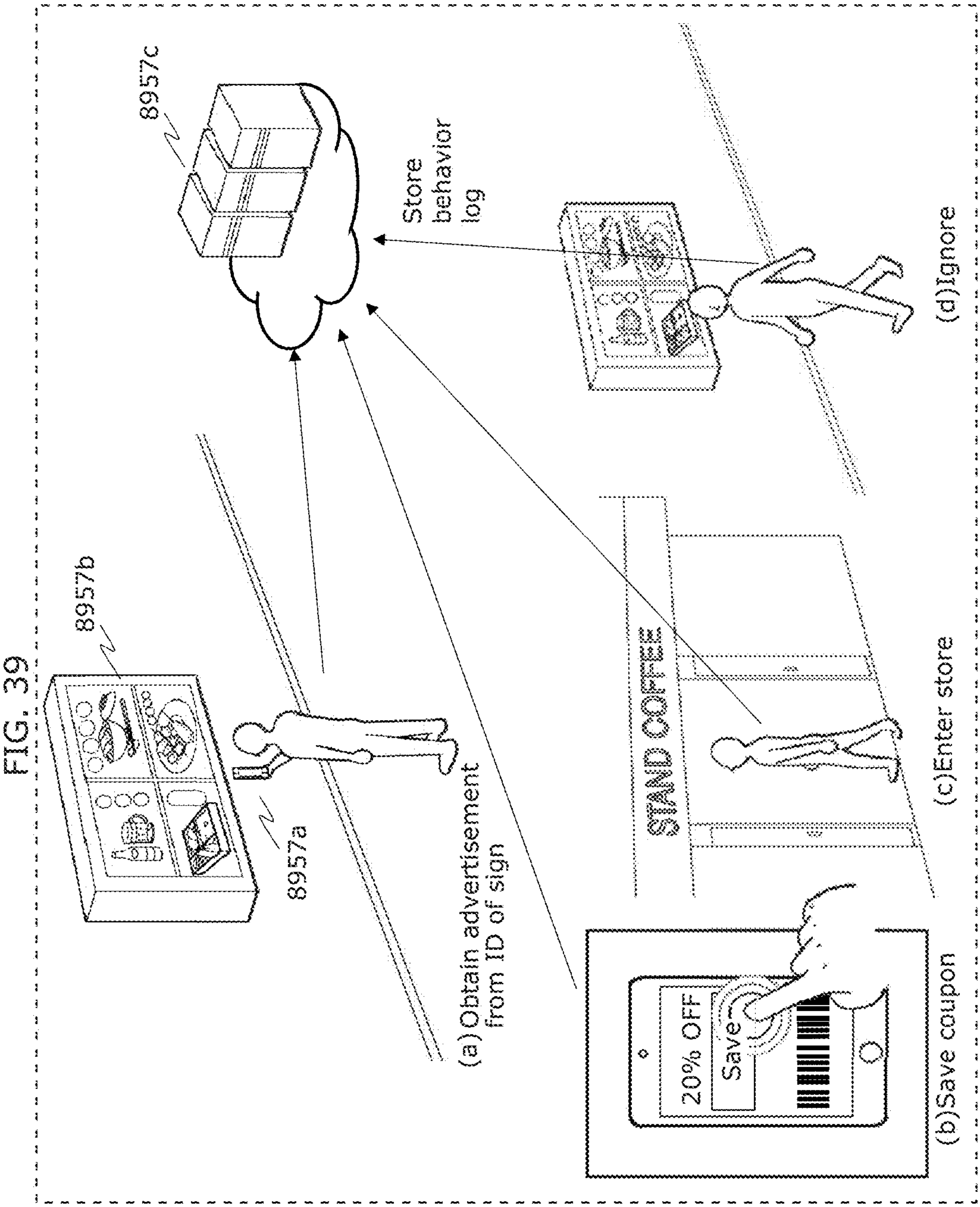
FIG. 39 is a diagram for describing an example of application to use log storage and analysis in Embodiment 5.

FIG. 39 is a diagram illustrating an example of application of a transmission and reception system in Embodiment 5.

A receiver 8957*a* receives an ID transmitted from a transmitter 8957*b* such as a sign, obtains coupon information from a server, and displays the coupon information. The receiver 8957*a* stores the subsequent behavior of the user such as saving the coupon, moving to a store displayed in the coupon, shopping in the store, or leaving without saving the coupon, in the server 8957*c*. In this way, the subsequent behavior of the user who has obtained information from the sign 8957*b* can be analyzed to estimate the advertisement value of the sign 8957*b*.

(Example of Application to Screen Sharing)

Figure 40:
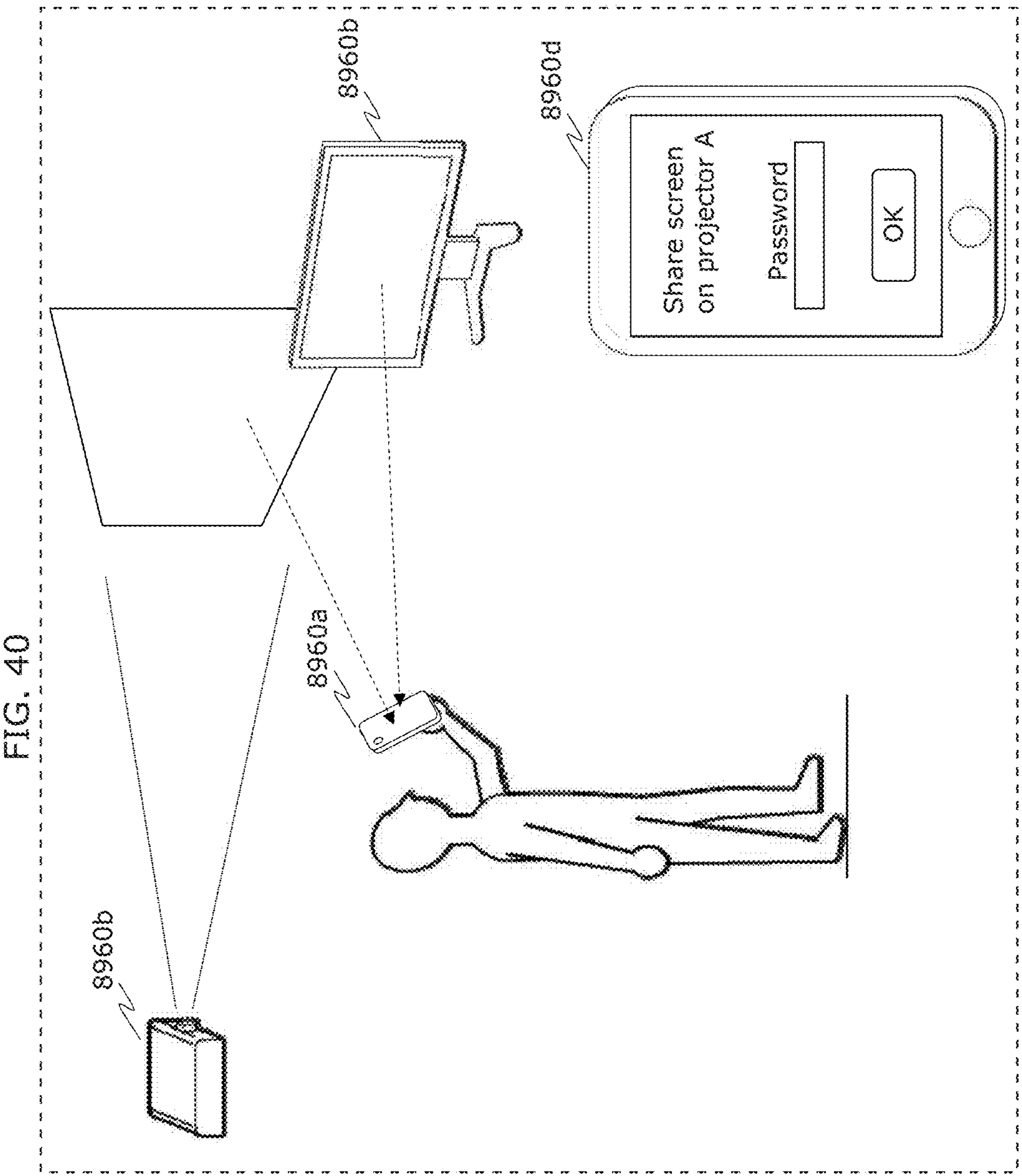
FIG. 40 is a diagram for describing an example of application to screen sharing in Embodiment 5.

FIG. 40 is a diagram illustrating an example of application of a transmission and reception system in Embodiment 5.

A transmitter 8960*b* such as a projector or a display transmits information (an SSID, a password for wireless connection, an IP address, a password for operating the transmitter) for wirelessly connecting to the transmitter 8960*b*, or transmits an ID which serves as a key for accessing such information. A receiver 8960*a* such as a smartphone, a tablet, a notebook computer, or a camera receives the signal transmitted from the transmitter 8960*b* to obtain the information, and establishes wireless connection with the transmitter 8960*b*. The wireless connection may be made via a router, or directly made by Wi-Fi Direct, Bluetooth®, Wireless Home Digital Interface, or the like. The receiver 8960*a* transmits a screen to be displayed by the transmitter 8960*b*. Thus, an image on the receiver can be easily displayed on the transmitter.

When connected with the receiver 8960*a*, the transmitter 8960*b* may notify the receiver 8960*a* that not only the information transmitted from the transmitter but also a password is needed for screen display, and refrain from displaying the transmitted screen if a correct password is not obtained. In this case, the receiver 8960*a* displays a password input screen 8960*d* or the like, and prompts the user to input the password.

Though the information communication method according to one or more aspects has been described by way of the embodiments above, the present disclosure is not limited to these embodiments. Modifications obtained by applying various changes conceivable by those skilled in the art to the embodiments and any combinations of structural elements in different embodiments are also included in the scope of one or more aspects without departing from the scope of the present disclosure.

Figure 41:
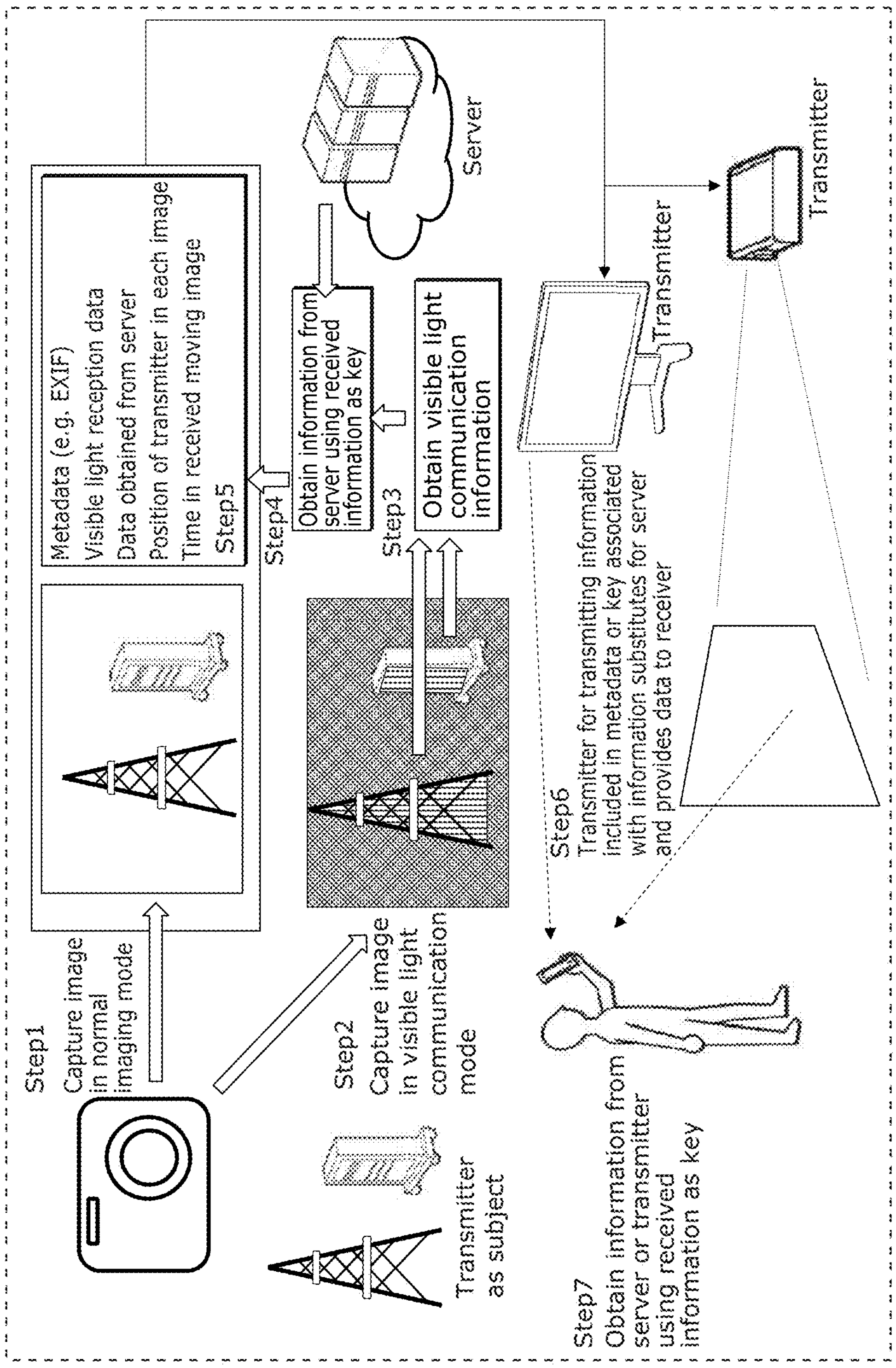
FIG. 41 is a diagram illustrating an example of application of an information communication method in Embodiment 5.

An information communication method according to an aspect of the present disclosure may also be applied as illustrated in FIG. 41.

FIG. 41 is a diagram illustrating an example of application of a transmission and reception system in Embodiment 5.

A camera serving as a receiver in the visible light communication captures an image in a normal imaging mode (Step 1). Through this imaging, the camera obtains an image file in a format such as an exchangeable image file format (EXIF). Next, the camera captures an image in a visible light communication imaging mode (Step 2). The camera obtains, based on a pattern of bright lines in an image obtained by this imaging, a signal (visible light communication information) transmitted from a subject serving as a transmitter by visible light communication (Step 3). Furthermore, the camera accesses a server by using the signal (reception information) as a key and obtains, from the server, information corresponding to the key (Step 4). The camera stores each of the following as metadata of the above image file: the signal transmitted from the subject by visible light communication (visible light reception data); the information obtained from the server; data indicating a position of the subject serving as the transmitter in the image represented by the image file; data indicating the time at which the signal transmitted by visible light communication is received (time in the moving image); and others. Note that in the case where a plurality of transmitters are shown as subjects in a captured image (an image file), the camera stores, for each of the transmitters, pieces of the metadata corresponding to the transmitter into the image file.

When displaying an image represented by the above-described image file, a display or projector serving as a transmitter in the visible light communication transmits, by visible light communication, a signal corresponding to the metadata included in the image file. For example, in the visible light communication, the display or the projector may transmit the metadata itself or transmit, as a key, the signal associated with the transmitter shown in the image.

The mobile terminal (the smartphone) serving as the receiver in the visible light communication captures an image of the display or the projector, thereby receiving a signal transmitted from the display or the projector by visible light communication. When the received signal is the above-described key, the mobile terminal uses the key to obtain, from the display, the projector, or the server, metadata of the transmitter associated with the key. When the received signal is a signal transmitted from a really existing transmitter by visible light communication (visible light reception data or visible light communication information), the mobile terminal obtains information corresponding to the visible light reception data or the visible light communication information from the display, the projector, or the server.

Summary of this Embodiment

An information communication method in this embodiment is an information communication method of obtaining information from a subject, the information communication method including: an exposure time setting step of setting a first exposure time of an image sensor so that, in an image obtained by capturing a first subject by the image sensor, a plurality of bright lines corresponding to exposure lines included in the image sensor appear according to a change in luminance of the first subject, the first subject being the subject; a first bright line image obtainment step of obtaining a first bright line image which is an image including the plurality of bright lines, by capturing the first subject changing in luminance by the image sensor with the set first exposure time; a first information obtainment step of obtaining first transmission information by demodulating data specified by a pattern of the plurality of bright lines included in the obtained first bright line image; and a door control step of causing an opening and closing drive device of a door to open the door, by transmitting a control signal after the first transmission information is obtained.

In this way, the receiver including the image sensor can be used as a door key, thus eliminating the need for a special electronic lock. This enables communication between various devices including a device with low computational performance.

For example, the information communication method may further include: a second bright line image obtainment step of obtaining a second bright line image which is an image including a plurality of bright lines, by capturing a second subject changing in luminance by the image sensor with the set first exposure time; a second information obtainment step of obtaining second transmission information by demodulating data specified by a pattern of the plurality of bright lines included in the obtained second bright line image; and an approaching determination step of determining whether or not a reception device including the image sensor is approaching the door, based on the obtained first transmission information and second transmission information, wherein in the door control step, the control signal is transmitted in the case of determining that the reception device is approaching the door.

In this way, the door can be opened at appropriate timing, i.e. only when the reception device (receiver) is approaching the door.

For example, the information communication method may further include: a second exposure time setting step of setting a second exposure time longer than the first exposure time; and a normal image obtainment step of obtaining a normal image in which a third subject is shown, by capturing the third subject by the image sensor with the set second exposure time, wherein in the normal image obtainment step, electric charge reading is performed on each of a plurality of exposure lines in an area including optical black in the image sensor, after a predetermined time elapses from when electric charge reading is performed on an exposure line adjacent to the exposure line, and in the obtaining of a first bright line image, electric charge reading is performed on each of a plurality of exposure lines in an area other than the optical black in the image sensor, after a time longer than the predetermined time elapses from when electric charge reading is performed on an exposure line adjacent to the exposure line, the optical black not being used in electric charge reading.

In this way, electric charge reading (exposure) is not performed on the optical black when obtaining the first bright line image, so that the time for electric charge reading (exposure) on an effective pixel area, which is an area in the image sensor other than the optical black, can be increased. As a result, the time for signal reception in the effective pixel area can be increased, with it being possible to obtain more signals.

For example, the information communication method may further include: a length determining step of determining whether or not a length of the pattern of the plurality of bright lines included in the first bright line image is less than a predetermined length, the length being perpendicular to each of the plurality of bright lines; a frame rate changing step of changing a frame rate of the image sensor to a second frame rate lower than a first frame rate used when obtaining the first bright line image, in the case of determining that the length of the pattern is less than the predetermined length; a third bright line image obtainment step of obtaining a third bright line image which is an image including a plurality of bright lines, by capturing the first subject changing in luminance by the image sensor with the set first exposure time at the second frame rate; and a third information obtainment step of obtaining the first transmission information by demodulating data specified by a pattern of the plurality of bright lines included in the obtained third bright line image.

In this way, in the case where the signal length indicated by the bright line pattern (bright line area) included in the first bright line image is less than, for example, one block of the transmission signal, the frame rate is decreased and the bright line image is obtained again as the third bright line image. Since the length of the bright line pattern included in the third bright line image is longer, one block of the transmission signal is successfully obtained.

For example, the information communication method may further include an aspect ratio setting step of setting an aspect ratio of an image obtained by the image sensor, wherein the first bright line image obtainment step includes: a clipping determination step of determining whether or not an edge of the image perpendicular to the exposure lines is clipped in the set aspect ratio; an aspect ratio changing step of changing the aspect ratio set in the aspect ratio setting step to a non-clipping aspect ratio in which the edge is not clipped, in the case of determining that the edge is clipped; and an obtainment step of obtaining the first bright line image in the non-clipping aspect ratio, by capturing the first subject changing in luminance by the image sensor.

In this way, in the case where the aspect ratio of the effective pixel area in the image sensor is 4:3 but the aspect ratio of the image is set to 16:9 and horizontal bright lines appear, i.e. the exposure lines extend along the horizontal direction, it is determined that top and bottom edges of the image are clipped, i.e. edges of the first bright line image is lost. In such a case, the aspect ratio of the image is changed to an aspect ratio that involves no clipping, for example, 4:3. This prevents edges of the first bright line image from being lost, as a result of which a lot of information can be obtained from the first bright line image.

For example, the information communication method may further include: a compression step of compressing the first bright line image in a direction parallel to each of the plurality of bright lines included in the first bright line image, to generate a compressed image; and a compressed image transmission step of transmitting the compressed image.

In this way, the first bright line image can be appropriately compressed without losing information indicated by the plurality of bright lines.

For example, the information communication method may further include: a gesture determination step of determining whether or not a reception device including the image sensor is moved in a predetermined manner; and an activation step of activating the image sensor, in the case of determining that the reception device is moved in the predetermined manner.

In this way, the image sensor can be easily activated only when needed. This contributes to improved power consumption efficiency.

Embodiment 6

This embodiment describes each example of application using a receiver such as a smartphone and a transmitter for transmitting information as a blink pattern of an LED or an organic EL device in each of the embodiments described above.

Figure 42:
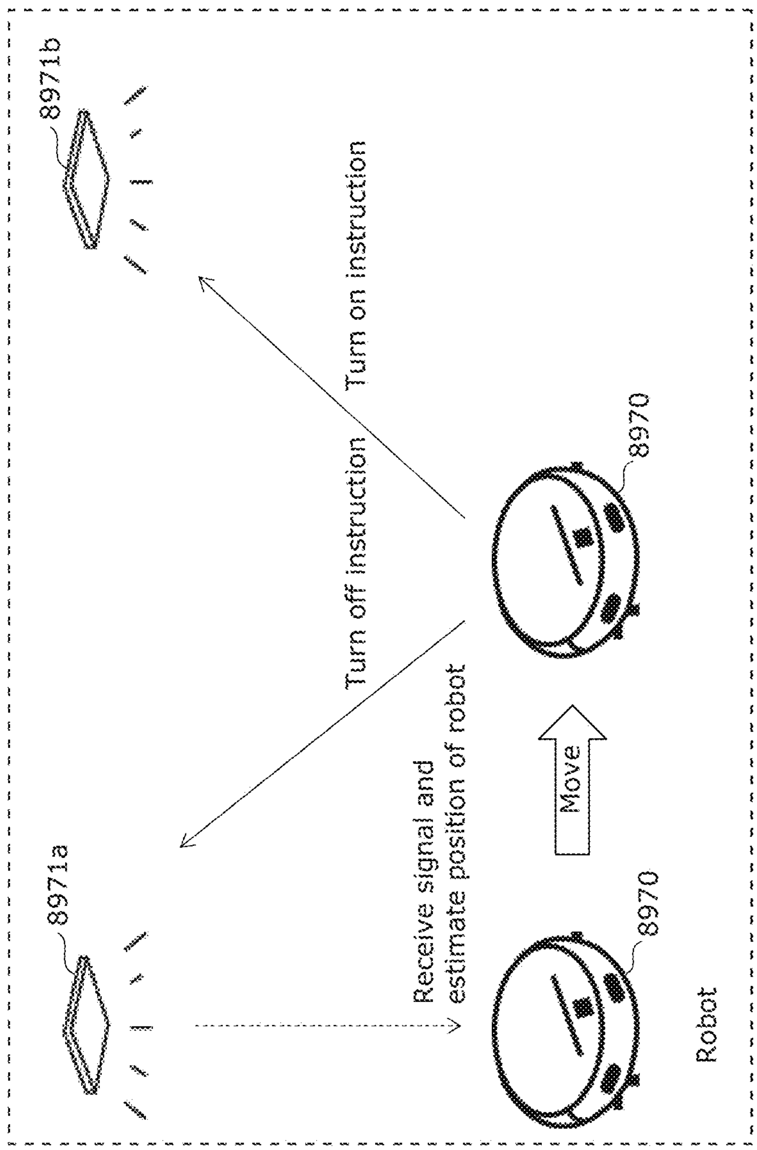
FIG. 42 is a diagram illustrating an example of application of a transmitter and a receiver in Embodiment 6.

FIG. 42 is a diagram illustrating an example of application of a transmitter and a receiver in Embodiment 6.

A robot 8970 has a function as, for example, a self-propelled vacuum cleaner and a function as a receiver in each of the above embodiments. Lighting devices 8971_a_ and 8971_b_ each have a function as a transmitter in each of the above embodiments.

For instance, the robot 8970 cleans a room and also captures the lighting device 8971_a_ illuminating the interior of the room, while moving in the room. The lighting device 8971_a_ transmits the ID of the lighting device 8971_a_ by changing in luminance. The robot 8970 accordingly receives the ID from the lighting device 8971_a_, and estimates the position (self-position) of the robot 8970 based on the ID, as in each of the above embodiments. That is, the robot 8970 estimates the position of the robot 970 while moving, based on the result of detection by a 9-axis sensor, the relative position of the lighting device 8971_a_ shown in the captured image, and the absolute position of the lighting device 8971_a_ specified by the ID.

When the robot 8970 moves away from the lighting device 8971_a_, the robot 8970 transmits a signal (turn off instruction) instructing to turn off, to the lighting device 8971_a_. For example, when the robot 8970 moves away from the lighting device 8971_a_ by a predetermined distance, the robot 8970 transmits the turn off instruction. Alternatively, when the lighting device 8971_a_ is no longer shown in the captured image or when another lighting device is shown in the image, the robot 8970 transmits the turn off instruction to the lighting device 8971_a_. Upon receiving the turn off instruction from the robot 8970, the lighting device 8971_a_ turns off according to the turn off instruction.

The robot 8970 then detects that the robot 8970 approaches the lighting device 8971_b_ based on the estimated position of the robot 8970, while moving and cleaning the room. In detail, the robot 8970 holds information indicating the position of the lighting device 8971_b_ and, when the distance between the position of the robot 8970 and the position of the lighting device 8971_b_ is less than or equal to a predetermined distance, detects that the robot 8970 approaches the lighting device 8971_b_. The robot 8970 transmits a signal (turn on instruction) instructing to turn on, to the lighting device 8971_b_. Upon receiving the turn on instruction, the lighting device 8971_b_ turns on according to the turn on instruction.

In this way, the robot 8970 can easily perform cleaning while moving, by making only its surroundings illuminated.

Figure 43:
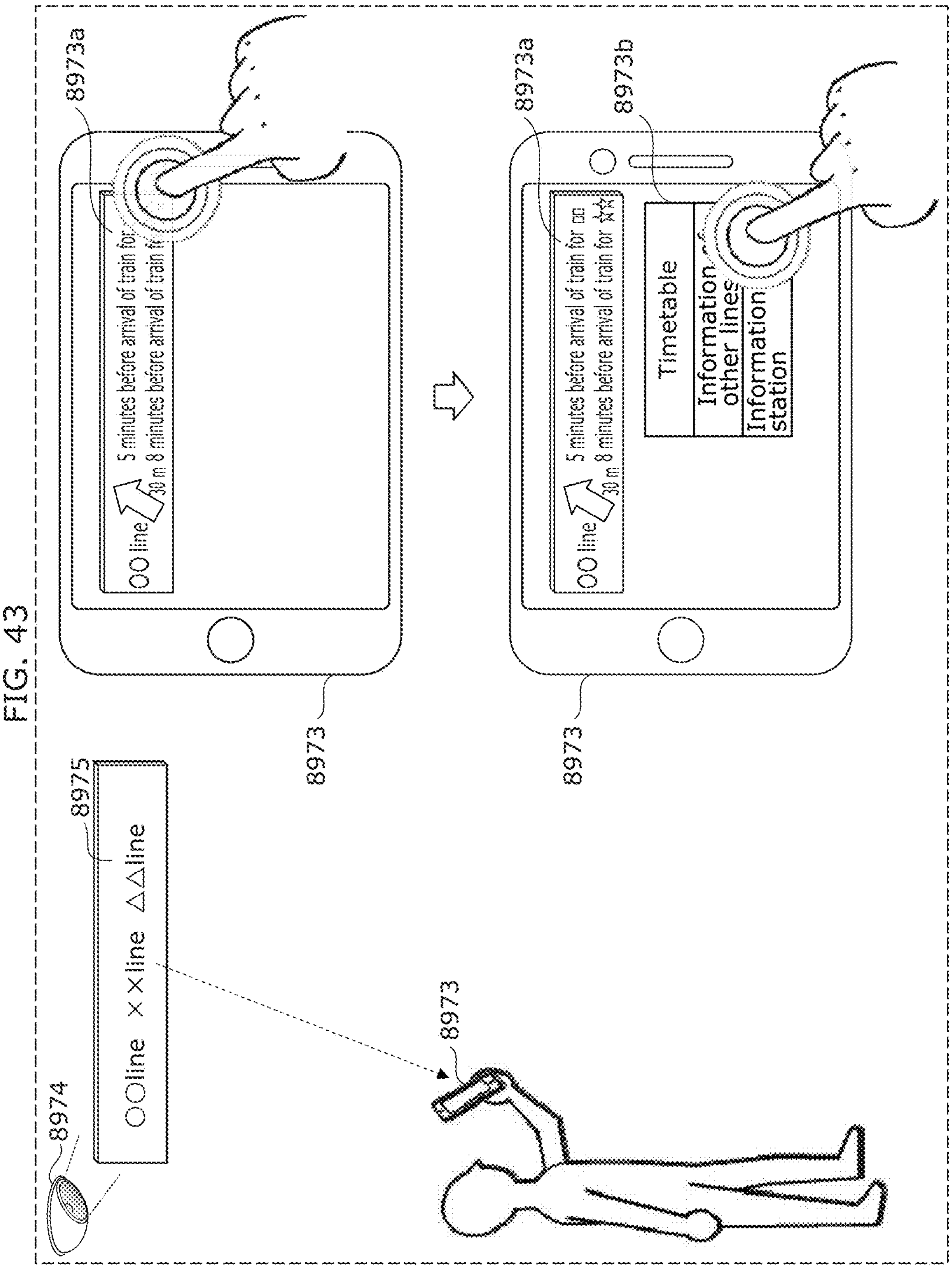
FIG. 43 is a diagram illustrating an example of application of a transmitter and a receiver in Embodiment 6.

FIG. 43 is a diagram illustrating an example of application of a transmitter and a receiver in Embodiment 6.

A lighting device 8974 has a function as a transmitter in each of the above embodiments. The lighting device 8974 illuminates, for example, a line guide sign 8975 in a train station, while changing in luminance. A receiver 8973 pointed at the line guide sign 8975 by the user captures the line guide sign 8975. The receiver 8973 thus obtains the ID of the line guide sign 8975, and obtains information associated with the ID, i.e. detailed information of each line shown in the line guide sign 8975. The receiver 8973 displays a guide image 8973_a_ indicating the detailed information. For example, the guide image 8973_a_ indicates the distance to the line shown in the line guide sign 8975, the direction to the line, and the time of arrival of the next train on the line.

When the user touches the guide image 8973_a_, the receiver 8973 displays a supplementary guide image 8973_b_. For instance, the supplementary guide image 8973_b_ is an image for displaying any of a train timetable, information about lines other than the line shown by the guide image 8973_a_, and detailed information of the station, according to selection by the user.

Embodiment 7

This embodiment describes each example of application using a receiver such as a smartphone and a transmitter for transmitting information as a blink pattern of an LED or an organic EL device in each of the embodiments described above.

(Signal Reception from a Plurality of Directions by a Plurality of Light Receivers)

Figure 44:
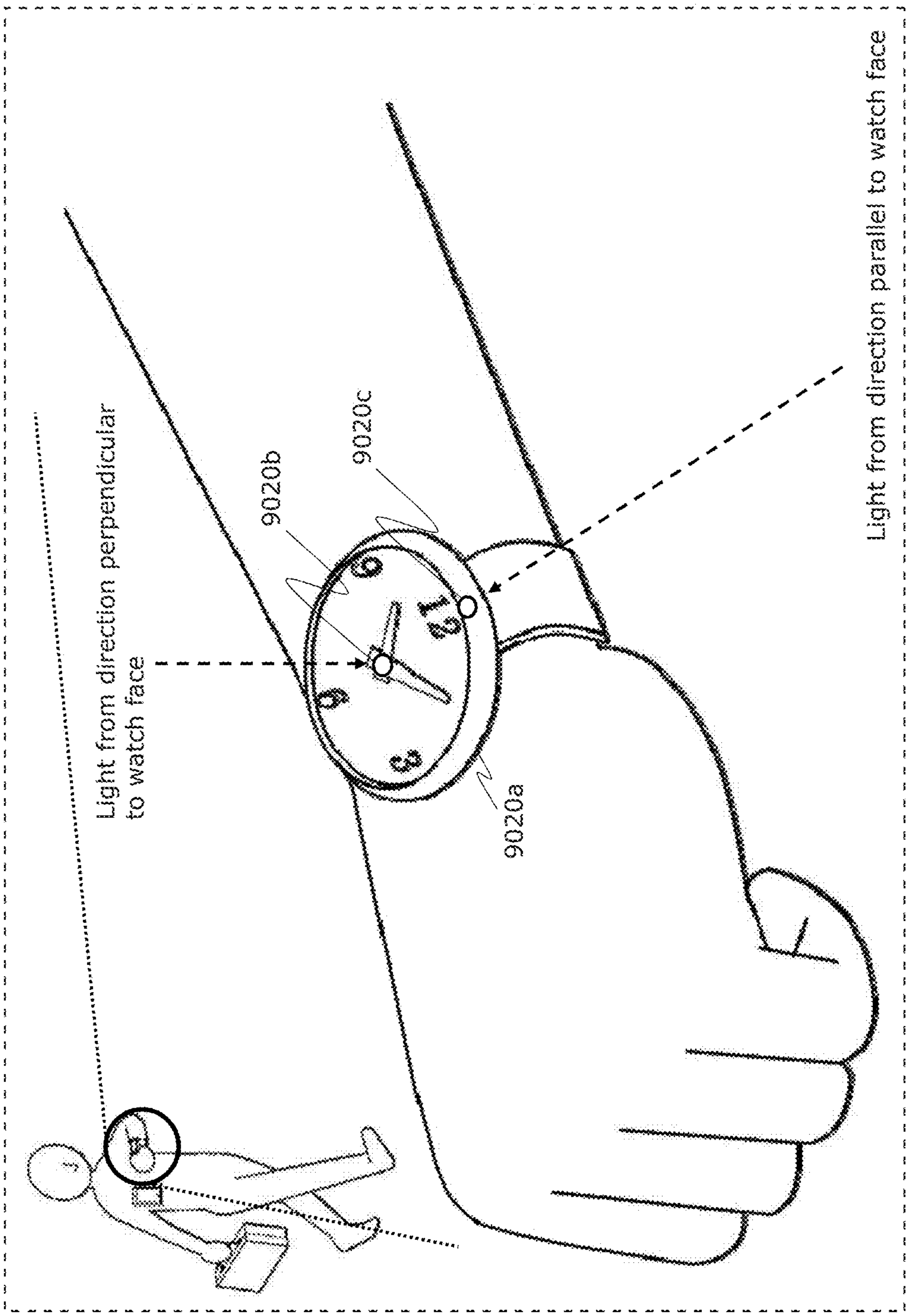
FIG. 44 is a diagram illustrating an example of a receiver in Embodiment 7.

FIG. 44 is a diagram illustrating an example of a receiver in Embodiment 7.

A receiver 9020_a_ such as a wristwatch includes a plurality of light receiving units. For example, the receiver 9020_a_ includes, as illustrated in FIG. 44, a light receiving unit 9020_b_ on the upper end of a rotation shaft that supports the minute hand and the hour hand of the wristwatch, and a light receiving unit 9020_c_ near the character indicating the 12 o'clock on the periphery of the wristwatch. The light receiving unit 9020_b_ receives light directed to thereto along the direction of the above-mentioned rotation shaft, and the light receiving unit 9020_c_ receives light directed thereto along a direction connecting the rotation shaft and the character indicating the 12 o'clock. Thus, the light receiving unit 9020_b_ can receive light from above when the user holds the receiver 9020*a* in front of his or her chest as when checking the time. As a result, the receiver 9020*a* is capable of receiving a signal from a ceiling light. The light receiving unit 9020*c* can receive light from front when the user holds the receiver 9020*a* in front of his or her chest as when checking the time. As a result, the receiver 9020*a* can receive a signal from a signage or the like in front of the user.

When these light receiving units 9020*b* and 9020*c* have directivity, the signal can be received without interference even in the case where a plurality of transmitters are located nearby.

(Route Guidance by Wristwatch-Type Display)

Figure 45:
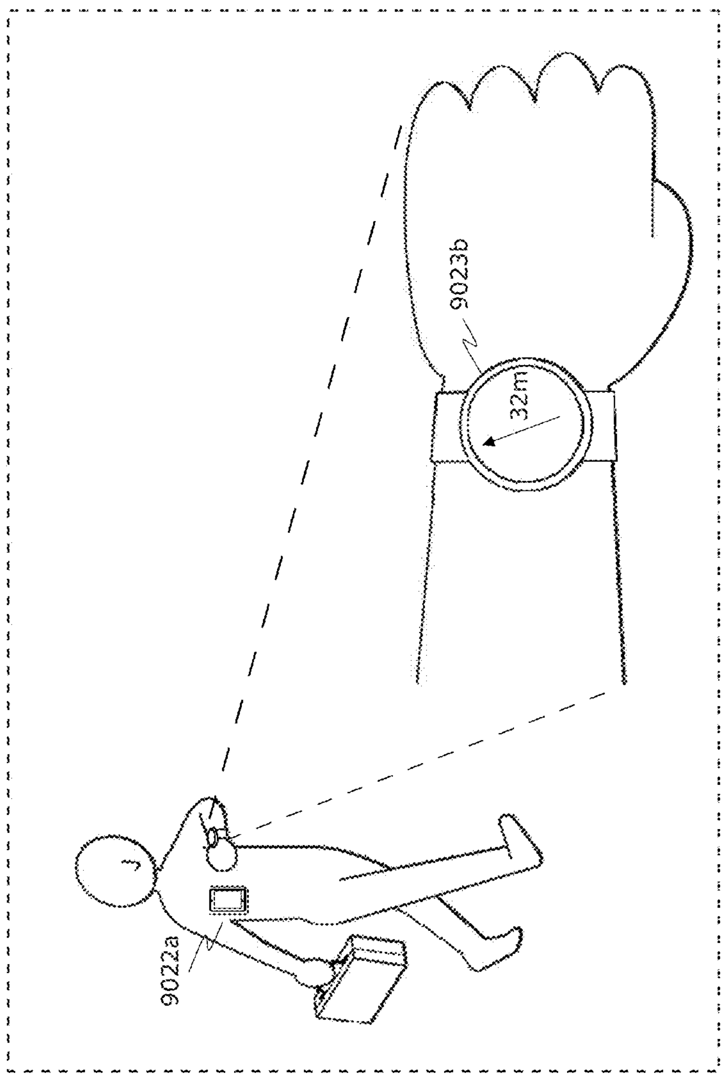
FIG. 45 is a diagram illustrating an example of a reception system in Embodiment 7.

FIG. 45 is a diagram illustrating an example of a reception system in Embodiment 7.

A receiver 9023*b* such as a wristwatch is connected to a smartphone 9022*a* via wireless communication such as Bluetooth®. The receiver 9023*b* has a watch face composed of a display such as a liquid crystal display, and is capable of displaying information other than the time. The smartphone 9022*a* recognizes the current position from a signal received by the receiver 9023*b*, and displays the route and distance to the destination on the display surface of the receiver 9023*b*.

Figure 46:
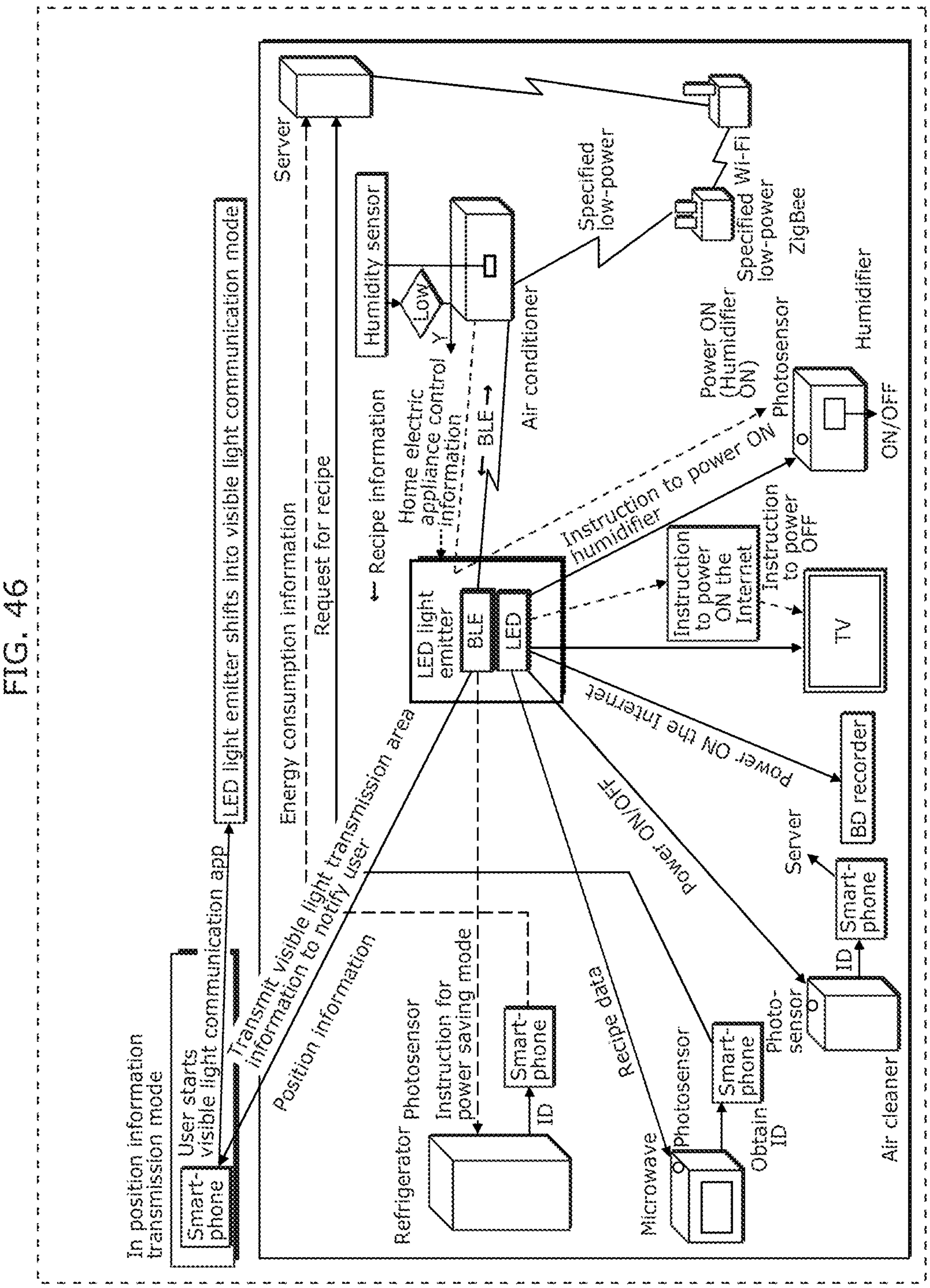
FIG. 46 is a diagram illustrating an example of a signal transmission and reception system in Embodiment 7.

FIG. 46 is a diagram illustrating an example of a signal transmission and reception system in Embodiment 7.

The signal transmission and reception system includes a smartphone which is a multifunctional mobile phone, an LED light emitter which is a lighting device, a home appliance such as a refrigerator, and a server. The LED light emitter performs communication using BTLE (Bluetooth® Low Energy) and also performs visible light communication using a light emitting diode (LED). For example, the LED light emitter controls a refrigerator or communicates with an air conditioner by BTLE. In addition, the LED light emitter controls a power supply of a microwave, an air cleaner, or a television (TV) by visible light communication.

For example, the television includes a solar power device and uses this solar power device as a photosensor. Specifically, when the LED light emitter transmits a signal using a change in luminance, the television detects the change in luminance of the LED light emitter by referring to a change in power generated by the solar power device. The television then demodulates the signal represented by the detected change in luminance, thereby obtaining the signal transmitted from the LED light emitter. When the signal is an instruction to power ON, the television switches a main power thereof to ON, and when the signal is an instruction to power OFF, the television switches the main power thereof to OFF.

The server is capable of communicating with an air conditioner via a router and a specified low-power radio station (specified low-power). Furthermore, the server is capable of communicating with the LED light emitter because the air conditioner is capable of communicating with the LED light emitter via BTLE. Therefore, the server is capable of switching the power supply of the TV between ON and OFF via the LED light emitter. The smartphone is capable of controlling the power supply of the TV via the server by communicating with the server via wireless fidelity (Wi-Fi), for example.

As illustrated in FIG. 46, the information communication method according to this embodiment includes: a wireless communication step of transmitting the control signal (the transmission data string or the user command) from the mobile terminal (the smartphone) to the lighting device (the light emitter) through the wireless communication (such as BTLE or Wi-Fi) different from the visible light communication; a visible light communication step of performing the visible light communication by the lighting device changing in luminance according to the control signal; and an execution step of detecting a change in luminance of the lighting device, demodulating the signal specified by the detected change in luminance to obtain the control signal, and performing the processing according to the control signal, by the control target device (such as a microwave). By doing so, even the mobile terminal that is not capable of changing in luminance for visible light communication is capable of causing the lighting device to change in luminance instead of the mobile terminal and is thereby capable of appropriately controlling the control target device. Note that the mobile terminal may be a wristwatch instead of a smartphone.

(Reception in which Interference is Eliminated)

Figure 47:
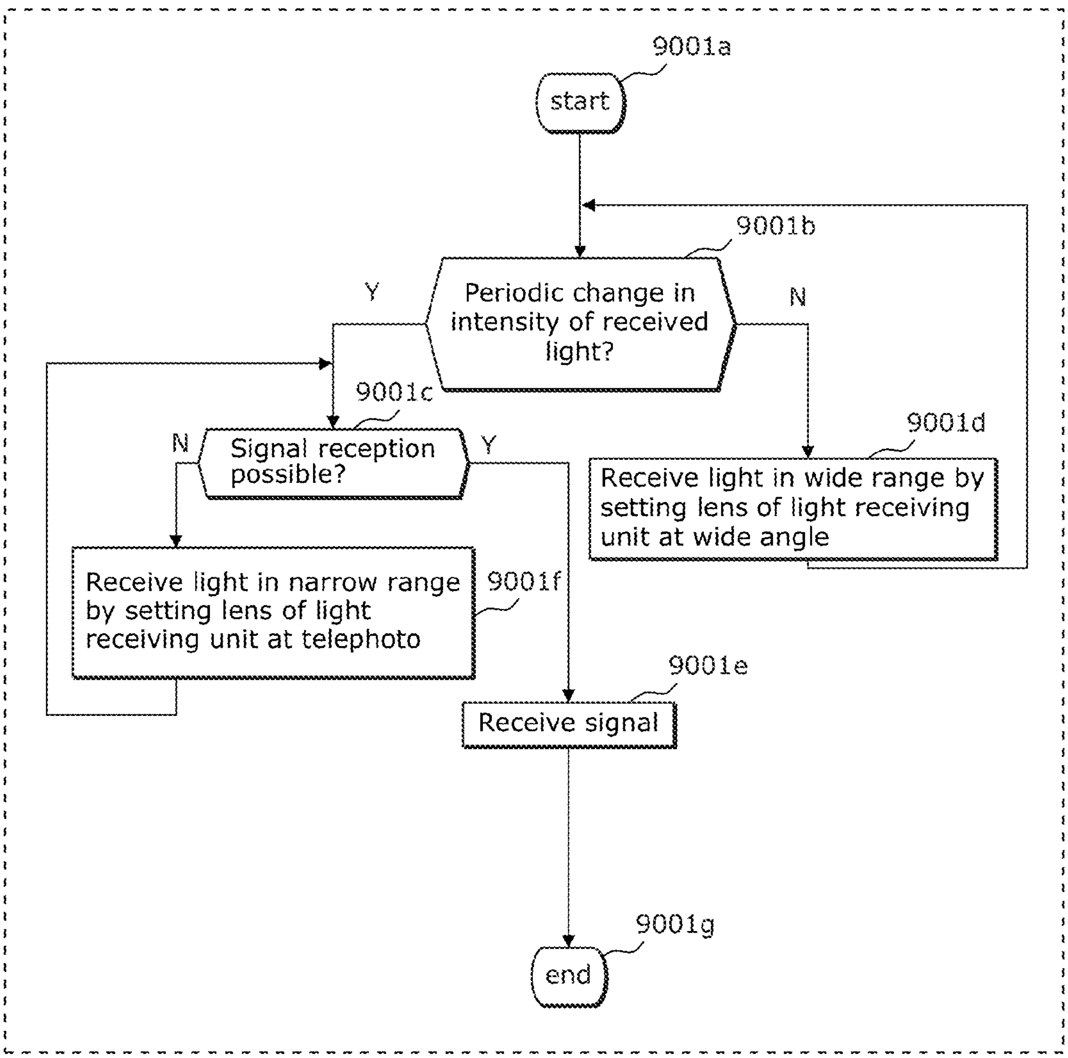
FIG. 47 is a flowchart illustrating a reception method in which interference is eliminated in Embodiment 7.

FIG. 47 is a flowchart illustrating a reception method in which interference is eliminated in Embodiment 7.

In Step 9001*a*, the process starts. In Step 9001*b*, the receiver determines whether or not there is a periodic change in the intensity of received light. In the case of Yes, the process proceeds to Step 9001*c*. In the case of No, the process proceeds to Step 9001*d*, and the receiver receives light in a wide range by setting the lens of the light receiving unit at wide angle. The process then returns to Step 9001*b*. In Step 9001*c*, the receiver determines whether or not signal reception is possible. In the case of Yes, the process proceeds to Step 9001*e*, and the receiver receives a signal. In Step 9001*g*, the process ends. In the case of No, the process proceeds to Step 9001*f*, and the receiver receives light in a narrow range by setting the lens of the light receiving unit at telephoto. The process then returns to Step 9001*c*.

With this method, a signal from a transmitter in a wide direction can be received while eliminating signal interference from a plurality of transmitters.

(Transmitter Direction Estimation)

Figure 48:
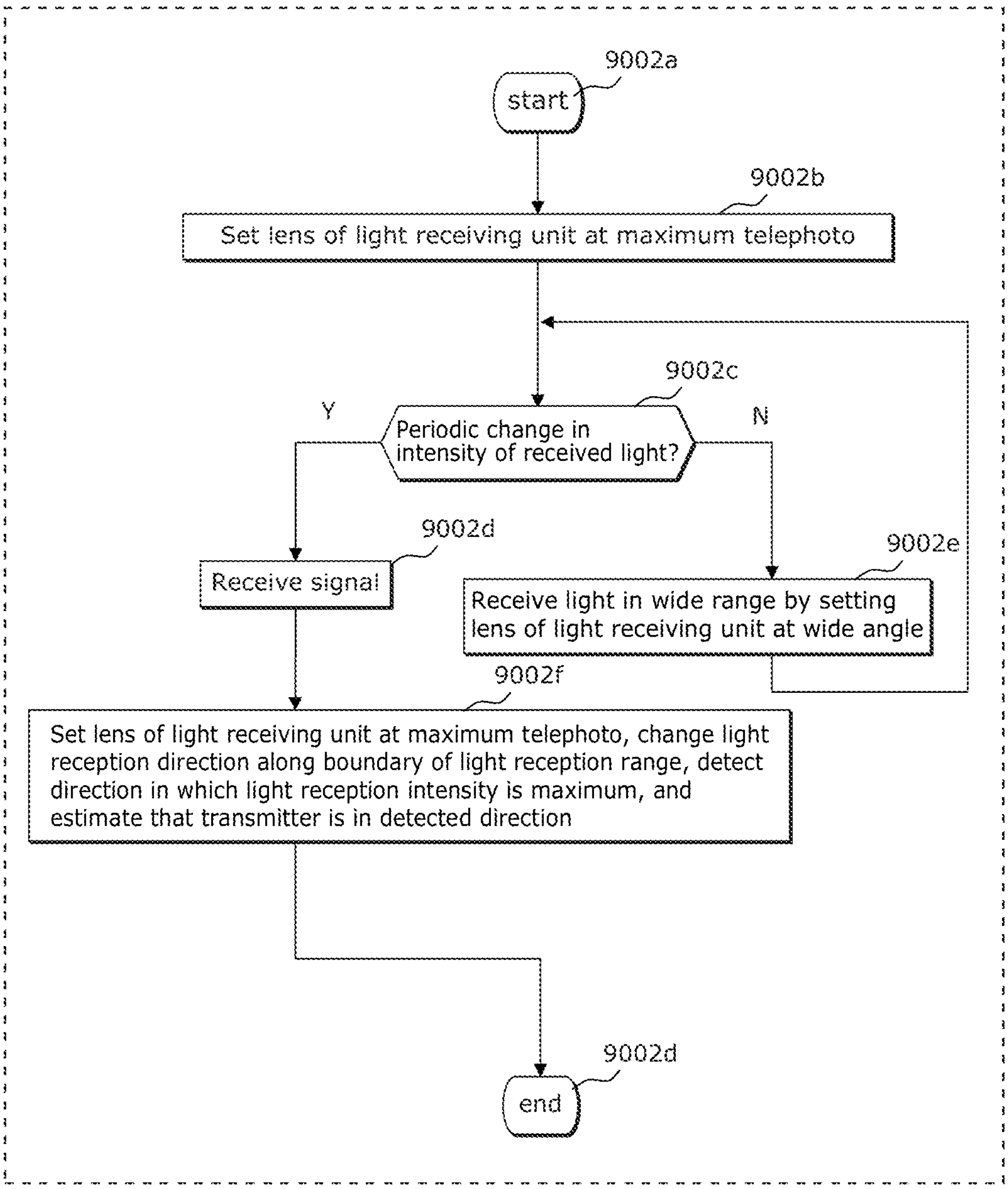
FIG. 48 is a flowchart illustrating a transmitter direction estimation method in Embodiment 7.

FIG. 48 is a flowchart illustrating a transmitter direction estimation method in Embodiment 7.

In Step 9002*a*, the process starts. In Step 9002*b*, the receiver sets the lens of the light receiving unit at maximum telephoto. In Step 9002*c*, the receiver determines whether or not there is a periodic change in the intensity of received light. In the case of Yes, the process proceeds to Step 9002*d*. In the case of No, the process proceeds to Step 9002*e*, and the receiver receives light in a wide range by setting the lens of the light receiving unit at wide angle. The process then returns to Step 9002*c*. In Step 9002*d*, the receiver receives a signal. In Step 9002*f*, the receiver sets the lens of the light receiving unit at maximum telephoto, changes the light reception direction along the boundary of the light reception range, detects the direction in which the light reception intensity is maximum, and estimates that the transmitter is in the detected direction. In Step 9002*d*, the process ends.

With this method, the direction in which the transmitter is present can be estimated. Here, the lens may be initially set at maximum wide angle, and gradually changed to telephoto.

(Reception Start)

Figure 49:
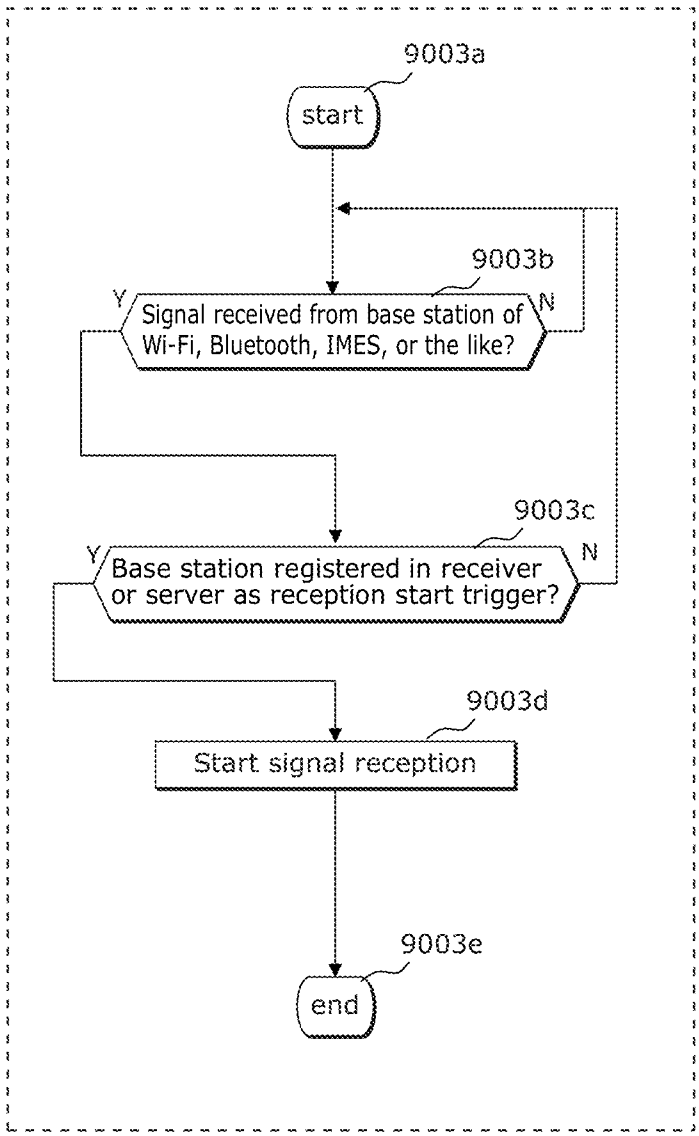
FIG. 49 is a flowchart illustrating a reception start method in Embodiment 7.

FIG. 49 is a flowchart illustrating a reception start method in Embodiment 7.

In Step 9003*a*, the process starts. In Step 9003*b*, the receiver determines whether or not a signal is received from a base station of Wi-Fi, Bluetooth®, IMES, or the like. In the case of Yes, the process proceeds to Step 9003*c*. In the case of No, the process returns to Step 9003*b*. In Step 9003*c*, the receiver determines whether or not the base station is registered in the receiver or the server as a reception start trigger. In the case of Yes, the process proceeds to Step 9003*d*, and the receiver starts signal reception. In Step 9003*e*, the process ends. In the case of No, the process returns to Step 9003*b*.

With this method, reception can be started without the user performing a reception start operation. Moreover, power can be saved as compared with the case of constantly performing reception.

(Generation of ID Additionally using Information of Another Medium)

Figure 50:
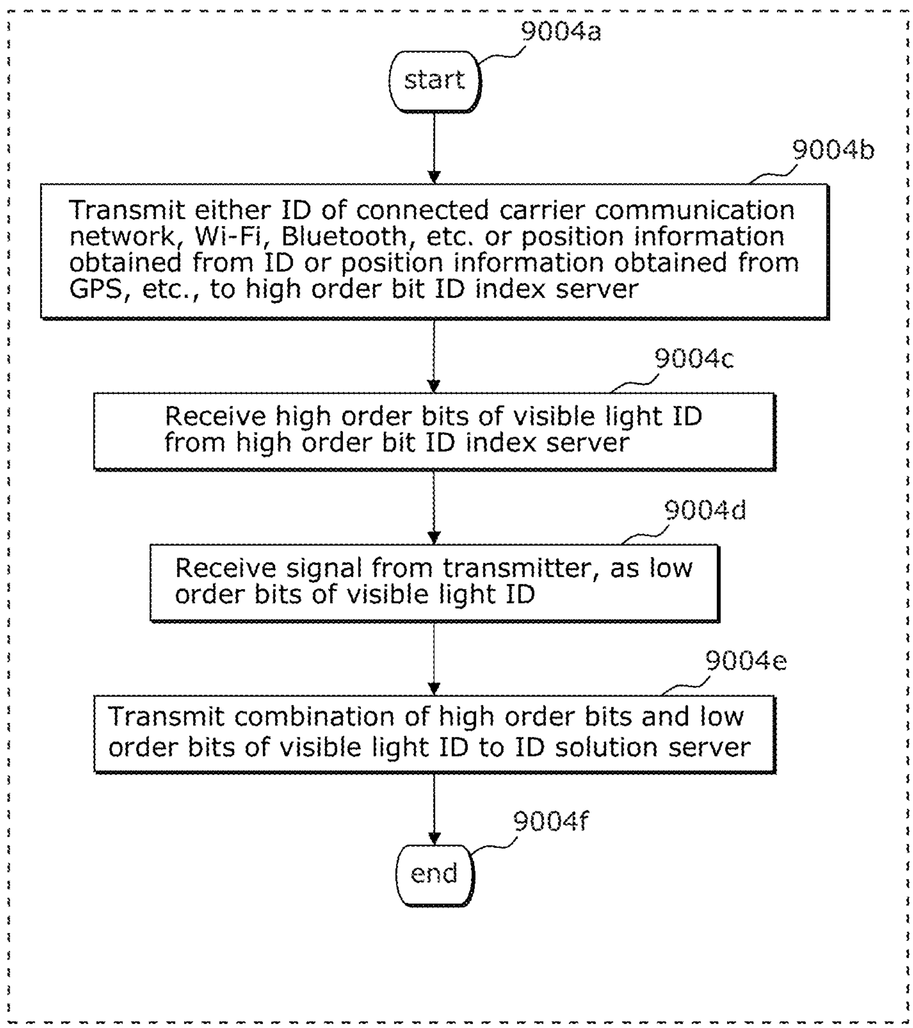
FIG. 50 is a flowchart illustrating a method for generating an ID additionally using information of another medium in Embodiment 7.

FIG. 50 is a flowchart illustrating a method of generating an ID additionally using information of another medium in Embodiment 7.

In Step 9004*a*, the process starts. In Step 9004*b*, the receiver transmits either an ID of a connected carrier communication network, Wi-Fi, Bluetooth®, etc. or position information obtained from the ID or position information obtained from GPS, etc., to a high order bit ID index server. In Step 9004*c*, the receiver receives the high order bits of a visible light ID from the high order bit ID index server. In Step 9004*d*, the receiver receives a signal from a transmitter, as the low order bits of the visible light ID. In Step 9004*e*, the receiver transmits the combination of the high order bits and the low order bits of the visible light ID, to an ID solution server. In Step 9004*f*, the process ends.

With this method, the high order bits commonly used in the neighborhood of the receiver can be obtained. This contributes to a smaller amount of data transmitted from the transmitter, and faster reception by the receiver.

Here, the transmitter may transmit both the high order bits and the low order bits. In such a case, a receiver employing this method can synthesize the ID upon receiving the low order bits, whereas a receiver not employing this method obtains the ID by receiving the whole ID from the transmitter.

(Reception Scheme Selection by Frequency Separation)

Figure 51:
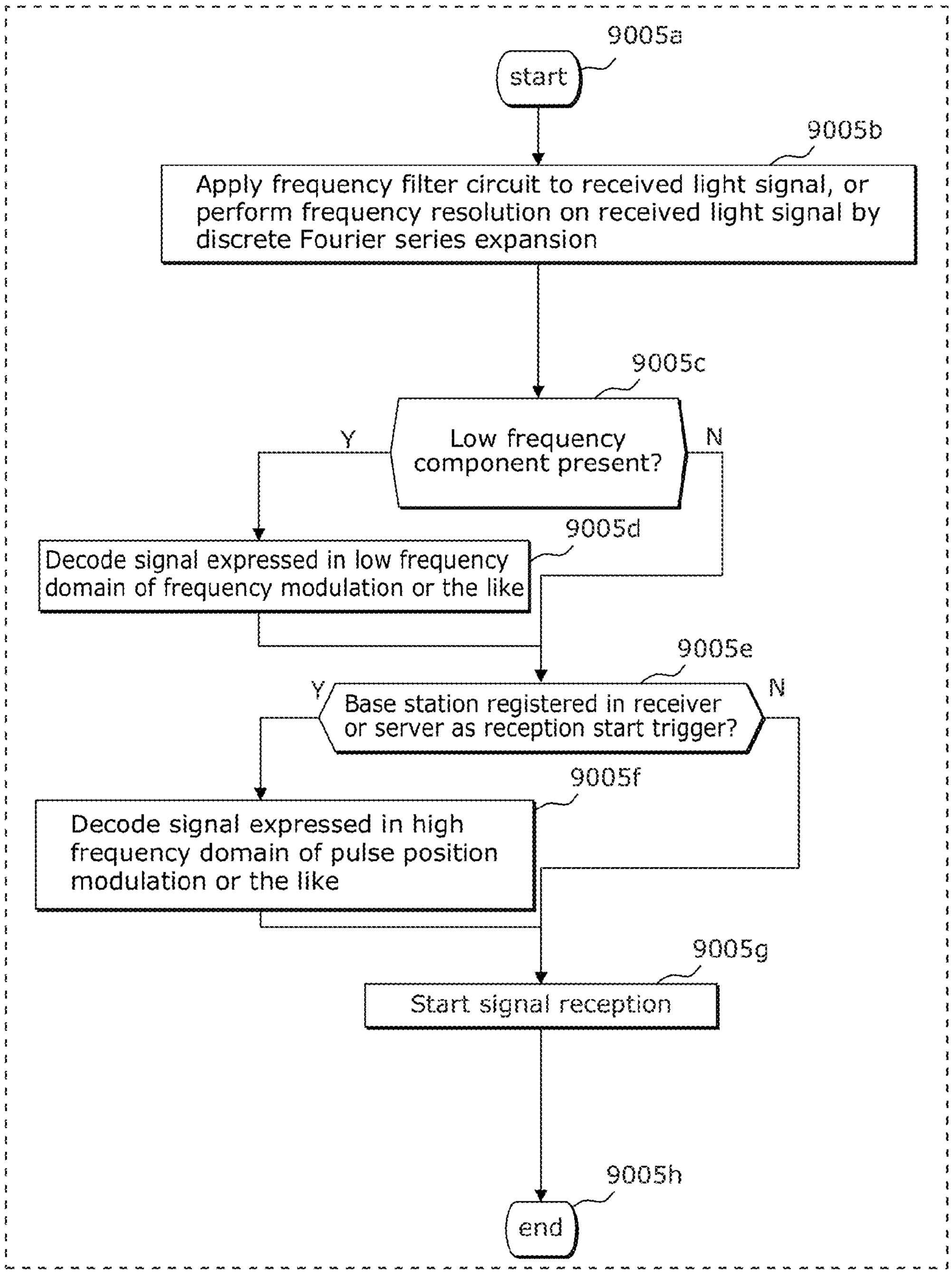
FIG. 51 is a flowchart illustrating a reception scheme selection method by frequency separation in Embodiment 7.

FIG. 51 is a flowchart illustrating a reception scheme selection method by frequency separation in Embodiment 7.

In Step 9005*a*, the process starts. In Step 9005*b*, the receiver applies a frequency filter circuit to a received light signal, or performs frequency resolution on the received light signal by discrete Fourier series expansion. In Step 9005*c*, the receiver determines whether or not a low frequency component is present. In the case of Yes, the process proceeds to Step 9005*d*, and the receiver decodes the signal expressed in a low frequency domain of frequency modulation or the like. The process then proceeds to Step 9005*e*. In the case of No, the process proceeds to Step 9005*e*. In Step 9005*e*, the receiver determines whether or not the base station is registered in the receiver or the server as a reception start trigger. In the case of Yes, the process proceeds to Step 9005*f*, and the receiver decodes the signal expressed in a high frequency domain of pulse position modulation or the like. The process then proceeds to Step 9005*g*. In the case of No, the process proceeds to Step 9005*g*. In Step 9005*g*, the receiver starts signal reception. In Step 9005*h*, the process ends.

With this method, signals modulated by a plurality of modulation schemes can be received.

(Signal Reception in the Case of Long Exposure Time)

Figure 52:
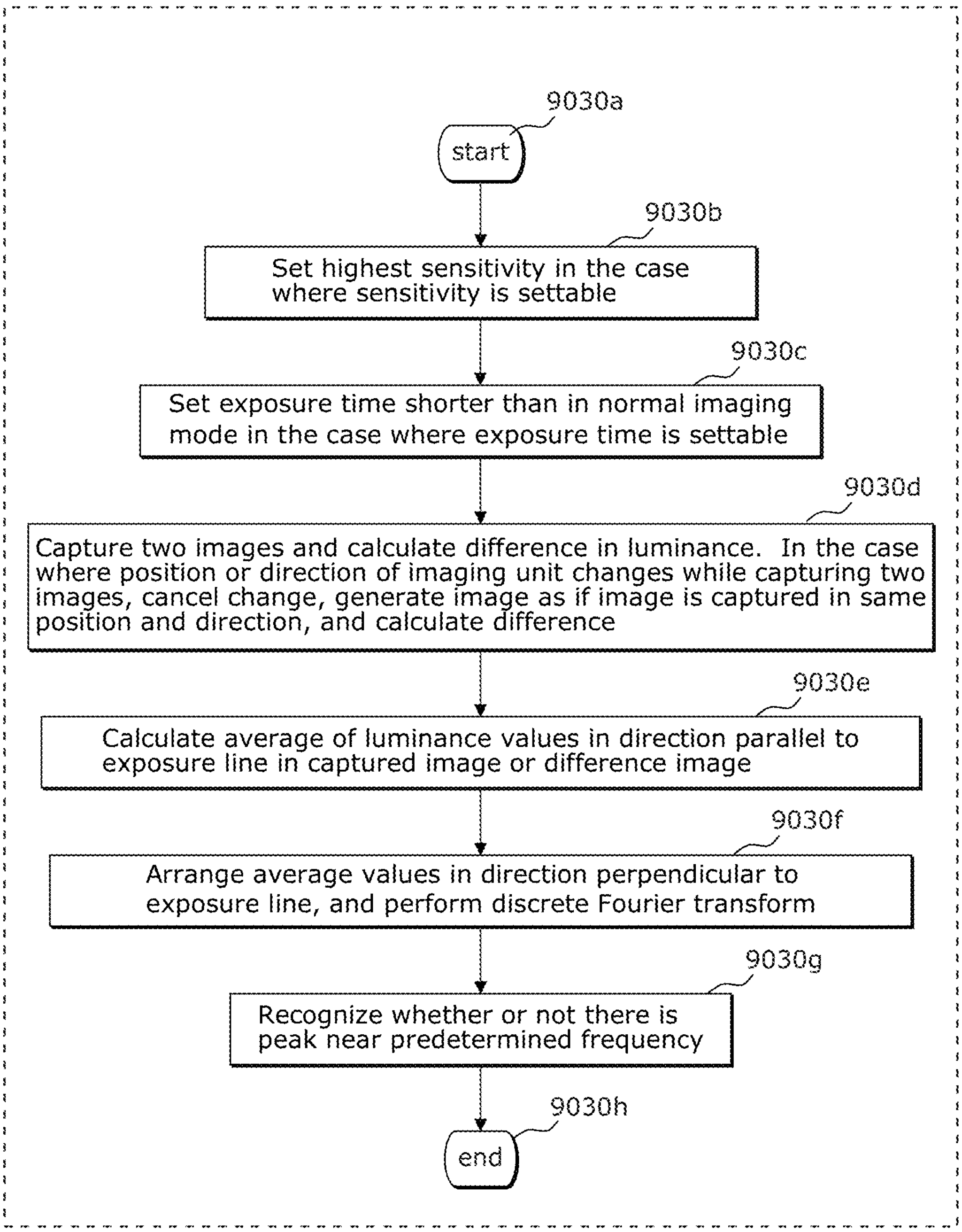
FIG. 52 is a flowchart illustrating a signal reception method in the case of a long exposure time in Embodiment 7.

FIG. 52 is a flowchart illustrating a signal reception method in the case of a long exposure time in Embodiment 7.

In Step 9030*a*, the process starts. In Step 9030*b*, in the case where the sensitivity is settable, the receiver sets the highest sensitivity. In Step 9030*c*, in the case where the exposure time is settable, the receiver sets the exposure time shorter than in the normal imaging mode. In Step 9030*d*, the receiver captures two images, and calculates the difference in luminance. In the case where the position or direction of the imaging unit changes while capturing two images, the receiver cancels the change, generates an image as if the image is captured in the same position and direction, and calculates the difference. In Step 9030*e*, the receiver calculates the average of luminance values in the direction parallel to the exposure lines in the captured image or the difference image. In Step 9030*f*, the receiver arranges the calculated average values in the direction perpendicular to the exposure lines, and performs discrete Fourier transform. In Step 9030*g*, the receiver recognizes whether or not there is a peak near a predetermined frequency. In Step 9030*h*, the process ends.

With this method, signal reception is possible even in the case where the exposure time is long, such as when the exposure time cannot be set or when a normal image is captured simultaneously.

In the case where the exposure time is automatically set, when the camera is pointed at a transmitter as a lighting, the exposure time is set to about 1/60 second to 1/480 second by an automatic exposure compensation function. If the exposure time cannot be set, signal reception is performed under this condition. In an experiment, when a lighting blinks periodically, stripes are visible in the direction perpendicular to the exposure lines if the period of one cycle is greater than or equal to about 1/16 of the exposure time, so that the blink period can be recognized by image processing. Since the part in which the lighting is shown is too high in luminance and the stripes are hard to be recognized, the signal period may be calculated from the part where light is reflected.

In the case of using a scheme, such as frequency shift keying or frequency multiplex modulation, that periodically turns on and off the light emitting unit, flicker is less visible to humans even with the same modulation frequency and also flicker is less likely to appear in video captured by a video camera, than in the case of using pulse position modulation. Hence, a low frequency can be used as the modulation frequency. Since the temporal resolution of human vision is about 60 Hz, a frequency not less than this frequency can be used as the modulation frequency.

When the modulation frequency is an integer multiple of the imaging frame rate of the receiver, bright lines do not appear in the difference image between pixels at the same position in two images and so reception is difficult, because imaging is performed when the light pattern of the transmitter is in the same phase. Since the imaging frame rate of the receiver is typically 30 fps, setting the modulation frequency to other than an integer multiple of 30 Hz eases reception. Moreover, given that there are various imaging frame rates of receivers, two relatively prime modulation frequencies may be assigned to the same signal so that the transmitter transmits the signal alternately using the two modulation frequencies. By receiving at least one signal, the receiver can easily reconstruct the signal.

Figure 53:
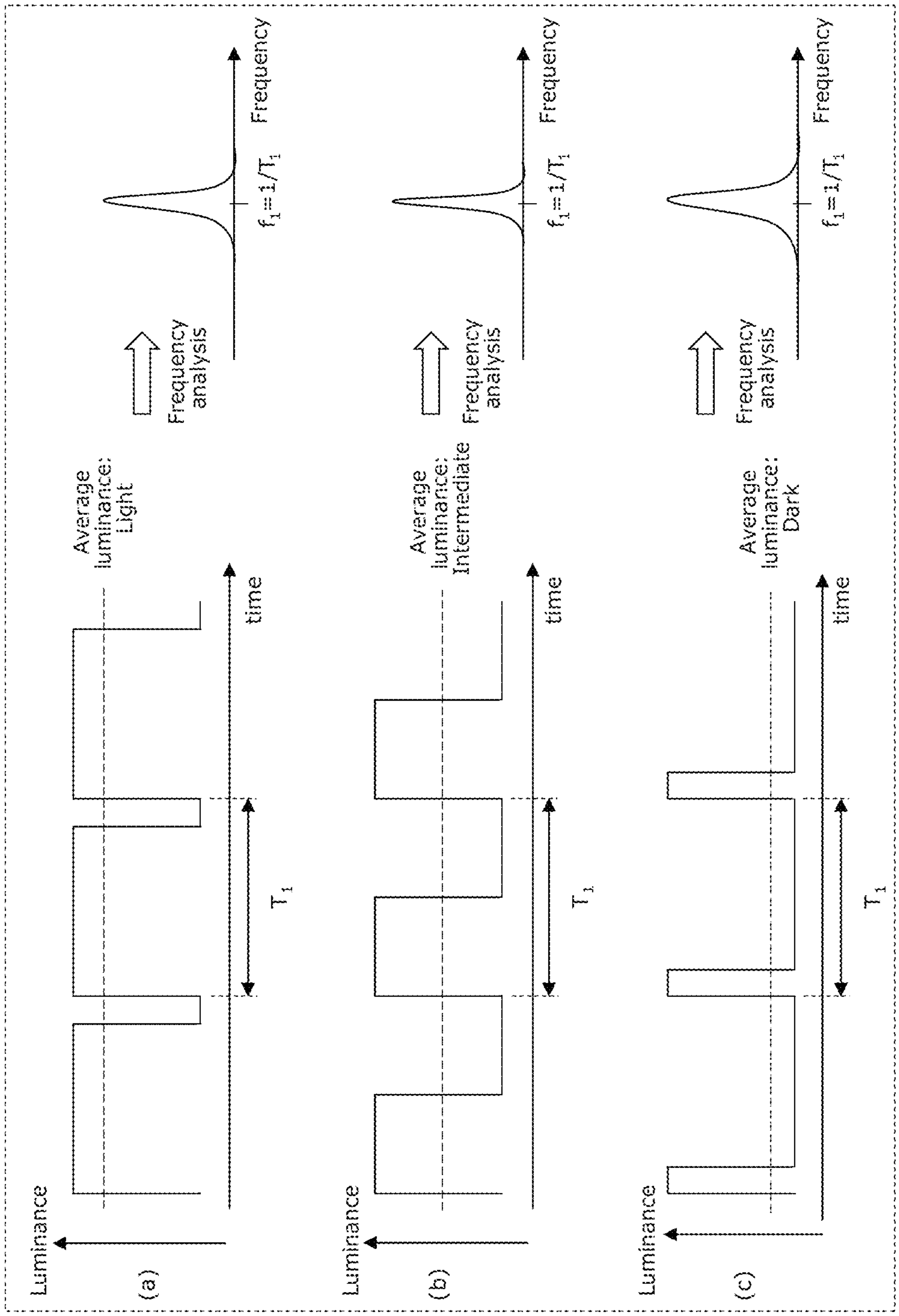
FIG. 53 is a diagram illustrating an example of a transmitter light adjustment (brightness adjustment) method in Embodiment 7.

FIG. 53 is a diagram illustrating an example of a transmitter light adjustment (brightness adjustment) method.

The ratio between a high luminance section and a low luminance section is adjusted to change the average luminance. Thus, brightness adjustment is possible. Here, when the period T1 in which the luminance changes between HIGH and LOW is maintained constant, the frequency peak can be maintained constant. For example, in each of (a), (b), and (c) in FIG. 53, the time of brighter lighting than the average luminance is set short to adjust the transmitter to emit darker light, and the time of brighter lighting than the average luminance is set long to adjust the transmitter to emit brighter light, while time T1 between a first change in luminance at which the luminance becomes higher than the average luminance and a second change in luminance is maintained constant. In FIG. 53, the light in (b) and (c) is adjusted to be darker than that in (a), and the light in (c) is adjusted to be darkest. With this, light adjustment can be performed while signals having the same meaning are transmitted.

It may be that the average luminance is changed by changing luminance in the high luminance section, luminance in the low luminance section, or luminance values in the both sections.

Figure 54:
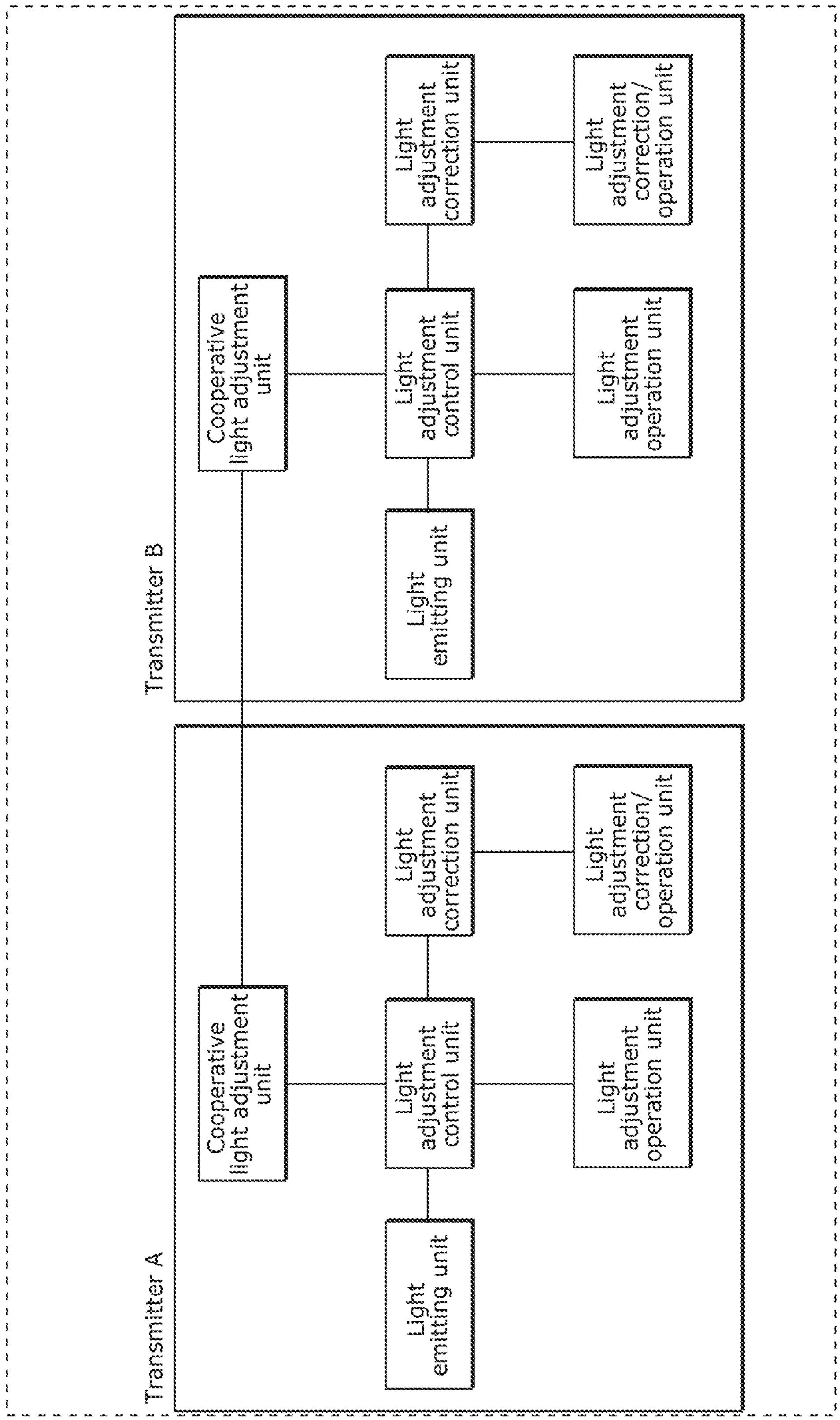
FIG. 54 is a diagram illustrating an example of a method for performing a transmitter light adjustment function in Embodiment 7.

FIG. 54 is a diagram illustrating an exemplary method of performing a transmitter light adjustment function.

Since there is a limitation in component precision, the brightness of one transmitter will be slightly different from that of another even with the same setting of light adjustment. In the case where transmitters are arranged side by side, a difference in brightness between adjacent ones of the transmitters produces an unnatural impression. Hence, a user adjusts the brightness of the transmitters by operating a light adjustment correction/operation unit. A light adjustment correction unit holds a correction value. A light adjustment control unit controls the brightness of the light emitting unit according to the correction value. When the light adjustment level is changed by a user operating a light adjustment operation unit, the light adjustment control unit controls the brightness of the light emitting unit based on a light adjustment setting value after the change and the correction value held in the light adjustment correction unit. The light adjustment control unit transfers the light adjustment setting value to another transmitter through a cooperative light adjustment unit. When the light adjustment setting value is transferred from another transmitter through the cooperative light adjustment unit, the light adjustment control unit controls the brightness of the light emitting unit based on the light adjustment setting value and the correction value held in the light adjustment correction unit.

The control method of controlling an information communication device that transmits a signal by causing a light emitter to change in luminance according to an embodiment of the present disclosure may cause a computer of the information communication device to execute: a determining step of determining, by modulating a signal to be transmitted that includes a plurality of different signals, a luminance change pattern corresponding to a different frequency for each of the different signals; and a transmission step of transmitting the signal to be transmitted, by causing the light emitter to change in luminance to include, in a time corresponding to a single frequency, only a luminance change pattern determined by modulating a single signal.

For example, when luminance change patterns determined by modulating more than one signal are included in the time corresponding to a single frequency, the waveform of changes in luminance with time will be complicated, making it difficult to appropriately receive signals. However, when only a luminance change pattern determined by modulating a single signal is included in the time corresponding to a single frequency, it is possible to more appropriately receive signals upon reception.

According to one embodiment of the present disclosure, the number of transmissions may be determined in the determining step so as to make a total number of times one of the plurality of different signals is transmitted different from a total number of times a remaining one of the plurality of different signals is transmitted within a predetermined time.

When the number of times one signal is transmitted is different from the number of times another signal is transmitted, it is possible to prevent flicker at the time of transmission.

According to one embodiment of the present disclosure, in the determining step, a total number of times a signal corresponding to a high frequency is transmitted may be set greater than a total number of times another signal is transmitted within a predetermined time.

At the time of frequency conversion at a receiver, a signal corresponding to a high frequency results in low luminance, but an increase in the number of transmissions makes it possible to increase a luminance value at the time of frequency conversion.

According to one embodiment of the present disclosure, changes in luminance with time in the luminance change pattern have a waveform of any of a square wave, a triangular wave, and a sawtooth wave.

With a square wave or the like, it is possible to more appropriately receive signals.

According to one embodiment of the present disclosure, when an average luminance of the light emitter is set to have a large value, a length of time for which luminance of the light emitter is greater than a predetermined value during the time corresponding to the single frequency may be set to be longer than when the average luminance of the light emitter is set to have a small value.

By adjusting the length of time for which the luminance of the light emitter is greater than the predetermined value during the time corresponding to a single frequency, it is possible to adjust the average luminance of the light emitter while transmitting signals. For example, when the light emitter is used as a lighting, signals can be transmitted while the overall brightness is decreased or increased.

Using an application programming interface (API) (indicating a unit for using OS functions) on which the exposure time is set, the receiver can set the exposure time to a predetermined value and stably receive the visible light signal. Furthermore, using the API on which sensitivity is set, the receiver can set sensitivity to a predetermined value, and even when the brightness of a transmission signal is low or high, can stably receive the visible light signal.

Embodiment 8

This embodiment describes each example of application using a receiver such as a smartphone and a transmitter for transmitting information as a blink pattern of an LED or an organic EL device in each of the embodiments described above.

EX zoom is described below.

Figure 55:
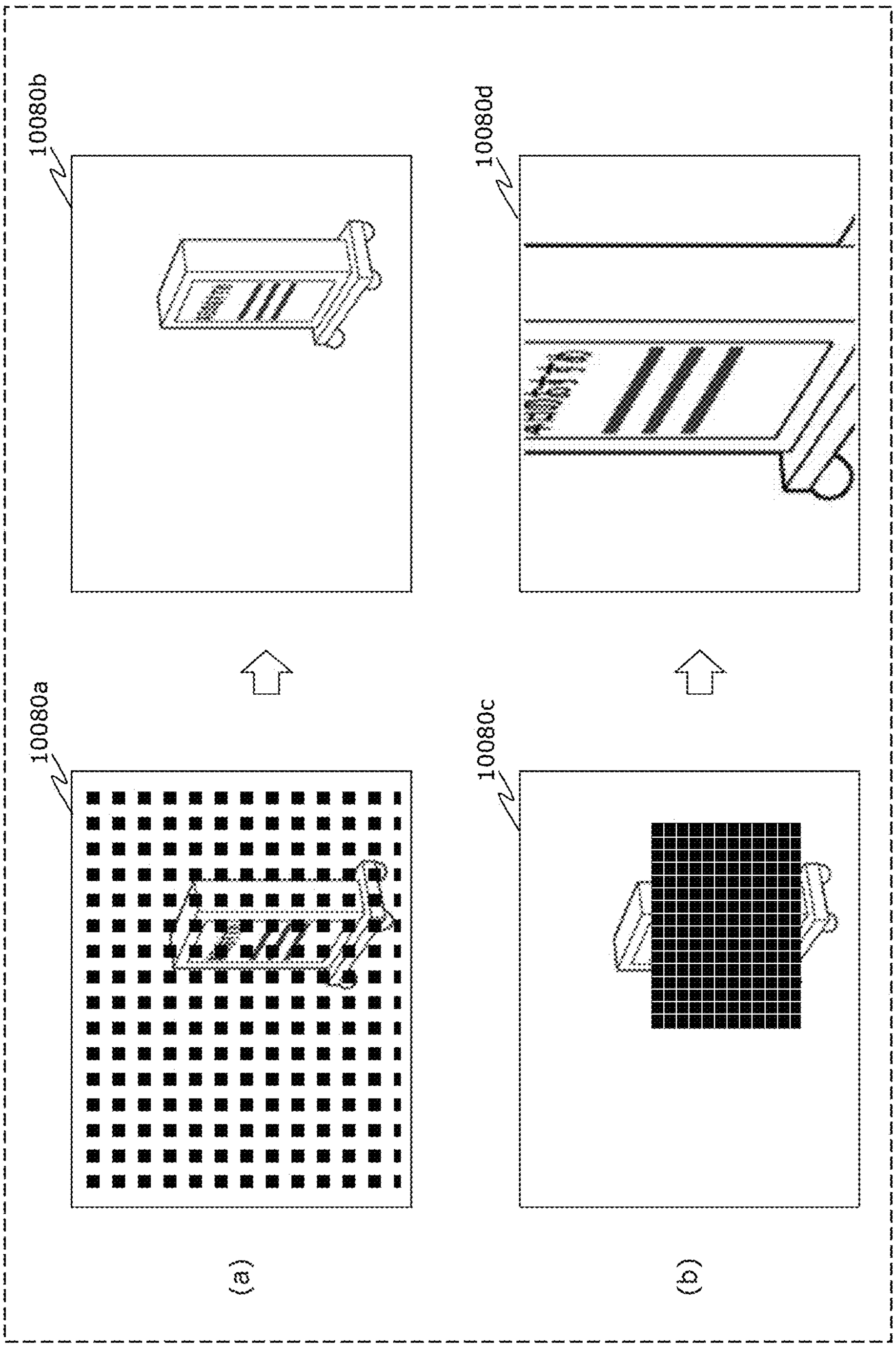
FIG. 55 is a diagram for describing EX zoom.

FIG. 55 is a diagram for describing EX zoom.

The zoom, that is, the way to obtain a magnified image, includes optical zoom which adjusts the focal length of a lens to change the size of an image formed on an imaging element, digital zoom which interpolates an image formed on an imaging element through digital processing to obtain a magnified image, and EX zoom which changes imaging elements that are used for imaging, to obtain a magnified image. The EX zoom is applicable when the number of imaging elements included in an image sensor is great relative to a resolution of a captured image.

For example, an image sensor **10080*a* illustrated in FIG. 55** includes 32 by 24 imaging elements arranged in matrix.

Specifically, 32 imaging elements in width by 24 imaging elements in height are arranged. When this image sensor 10080*a* captures an image having a resolution of 16 pixels in width and 12 pixels in height, out of the 32 by 24 imaging elements included in the image sensor 10080*a*, only 16 by 12 imaging elements evenly dispersed as a whole in the image sensor 10080*a* (e.g. the imaging elements of the image sensor 1080*a* indicated by black squares in (a) in FIG. 55) are used for imaging as illustrated in (a) in FIG. 55. In other words, only odd-numbered or even-numbered imaging elements in each of the heightwise and widthwise arrangements of imaging elements is used to capture an image. By doing so, an image 10080*b* having a desired resolution is obtained. Note that although a subject appears on the image sensor 1008*a* in FIG. 55, this is for facilitating the understanding of a relationship between each of the imaging elements and a captured image.

When capturing an image of a wide range to search for a transmitter or to receive information from many transmitters, a receiver including the above image sensor 10080*a* captures an image using only a part of the imaging elements evenly dispersed as a whole in the image sensor 10080*a*.

When using the EX zoom, the receiver captures an image by only a part of the imaging elements that is locally dense in the image sensor 10080*a* (e.g. the 16 by 12 image sensors indicated by black squares in the image sensor 1080*a* in (b) in FIG. 55) as illustrated in (b) in FIG. 55. By doing so, an image 10080*d* is obtained which is a zoomed-in image of a part of the image 10080*b* that corresponds to that part of the imaging elements. With such EX zoom, a magnified image of a transmitter is captured, which makes it possible to receive visible light signals for a long time, as well as to increase the reception speed and to receive a visible light signal from far way.

In the digital zoom, it is not possible to increase the number of exposure lines that receive visible light signals, and the length of time for which the visible light signals are received does not increase; therefore, it is preferable to use other kinds of zoom as much as possible. The optical zoom requires time for physical movement of a lens, an image sensor, or the like; in this regard, the EX zoom requires only a digital setting change and is therefore advantageous in that it takes a short time to zoom. From this perspective, the order of priority of the zooms is as follows: (1) the EX zoom; (2) the optical zoom; and (3) the digital zoom. The receiver may use one or more of these zooms selected according to the above order of priority and the need of zoom magnification. Note that the imaging elements that are not used in the imaging methods represented in (a) and (b) in FIG. 55 may be used to reduce image noise.

Embodiment 9

This embodiment describes each example of application using a receiver such as a smartphone and a transmitter for transmitting information as a blink pattern of an LED or an organic EL device in each of the embodiments described above.

In this embodiment, the exposure time is set for each exposure line or each imaging element.

Figure 56:
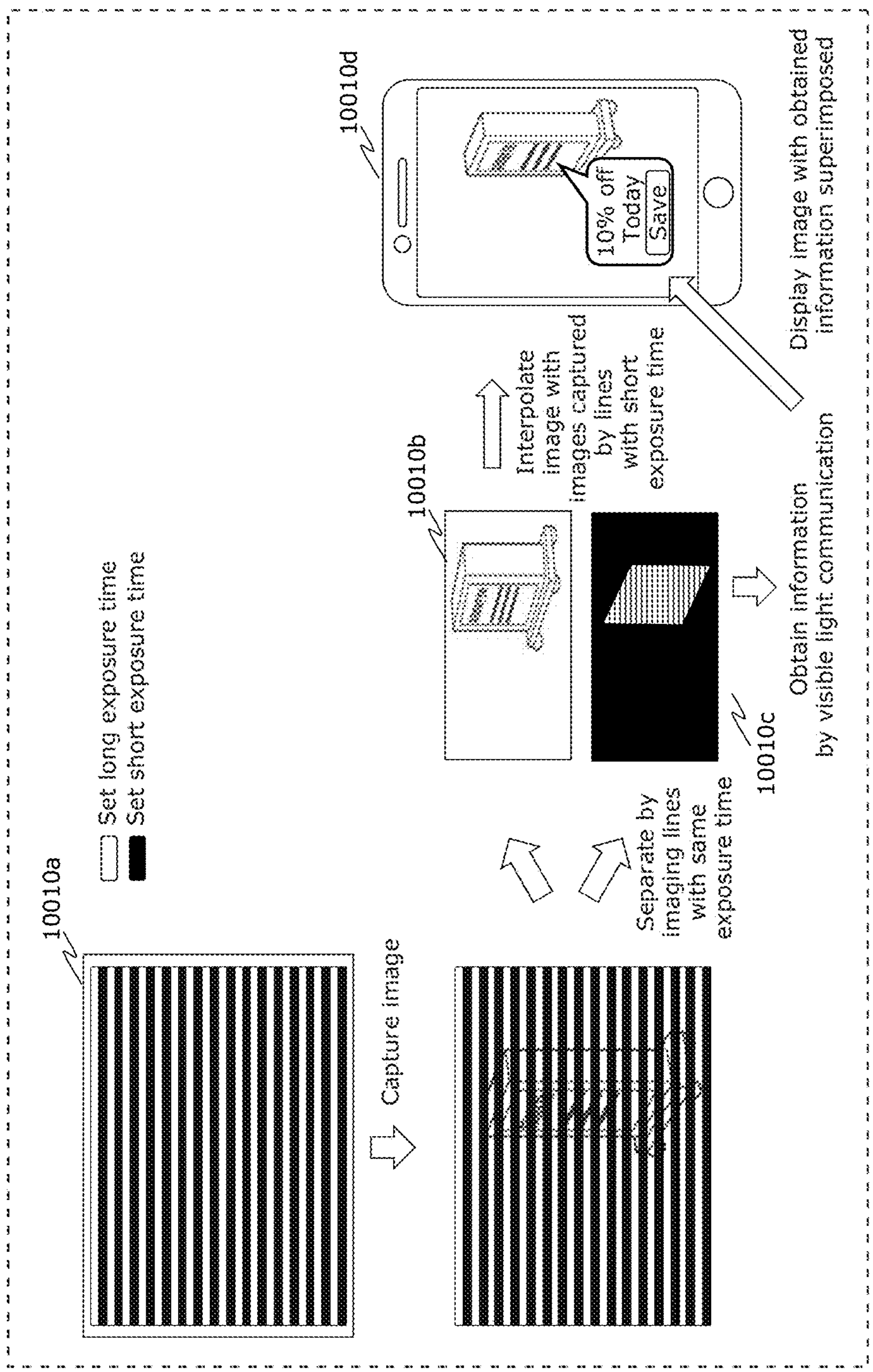
FIG. 56 is a diagram illustrating an example of a signal reception method in Embodiment 9.
Figure 57:
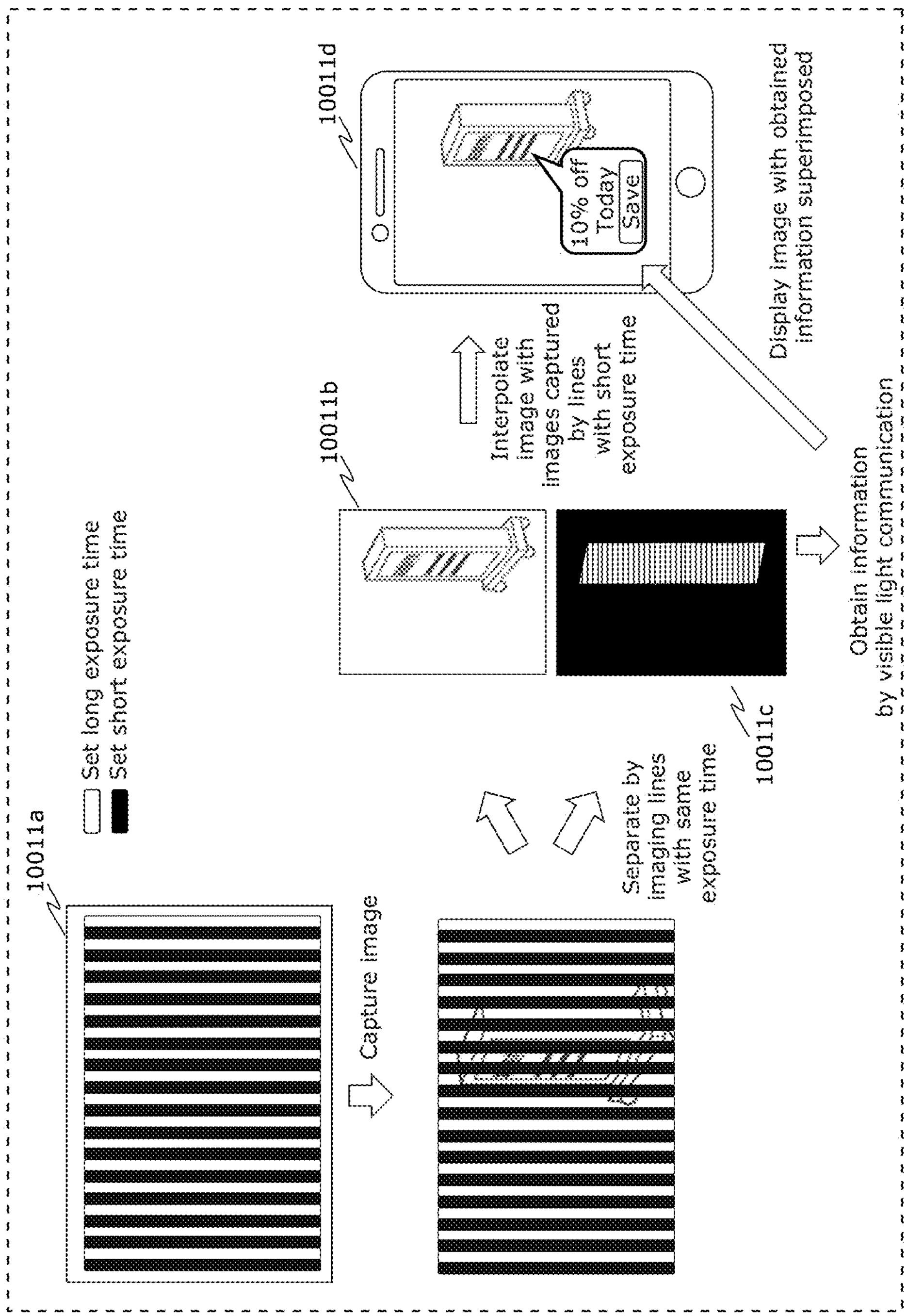
FIG. 57 is a diagram illustrating an example of a signal reception method in Embodiment 9.
Figure 58:
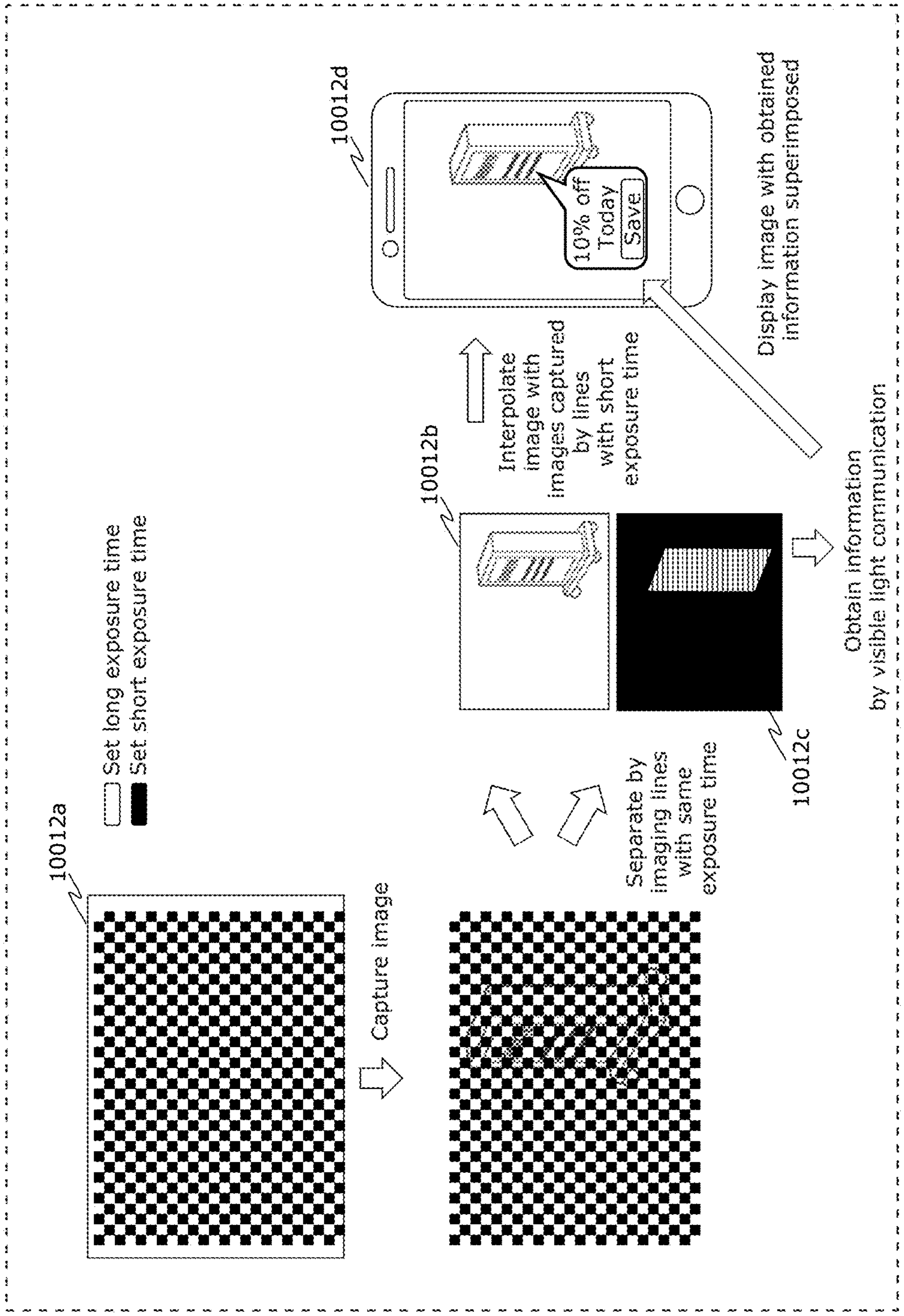
FIG. 58 is a diagram illustrating an example of a signal reception method in Embodiment 9.

FIGS. 56, 57, and 58 are diagrams illustrating an example of a signal reception method in Embodiment 9.

As illustrated in FIG. 56, the exposure time is set for each exposure line in an image sensor 10010*a* which is an imaging unit included in a receiver. Specifically, a long exposure time for normal imaging is set for a predetermined exposure line (white exposure lines in FIG. 56) and a short exposure time for visible light imaging is set for another exposure line (black exposure lines in FIG. 56). For example, a long exposure time and a short exposure line are alternately set for exposure lines arranged in the vertical direction. By doing so, normal imaging and visible light imaging (visible light communication) can be performed almost simultaneously upon capturing an image of a transmitter that transmits a visible light signal by changing in luminance. Note that out of the two exposure times, different exposure times may be alternately set on a per line basis, or a different exposure time may be set for each set of several lines or each of an upper part and a lower part of the image sensor 10010*a*. With the use of two exposure times in this way, combining data of images captured with the exposure lines for which the same exposure time is set results in each of a normal captured image 10010*b* and a visible light captured image 10010*c* which is a bright line image having a pattern of a plurality of bright lines. Since the normal captured image 10010*b* lacks an image portion not captured with the long exposure time (that is, an image corresponding to the exposure lines for which the short exposure time is set), the normal captured image 10010*b* is interpolated for the image portion so that a preview image 10010*d* can be displayed. Here, information obtained by visible light communication can be superimposed on the preview image 10010*d*. This information is information associated with the visible light signal, obtained by decoding the pattern of the plurality of the bright lines included in the visible light captured image 10010*c*. Note that it is possible that the receiver stores, as a captured image, the normal captured image 10010*b* or an interpolated image of the normal captured image 10010*b*, and adds to the stored captured image the received visible light signal or the information associated with the visible light signal as additional information.

As illustrated in FIG. 57, an image sensor 10011*a* may be used instead of the image sensor 10010*a*. In the image sensor 1011*a*, the exposure time is set for each column of a plurality of imaging elements arranged in the direction perpendicular to the exposure lines (the column is hereinafter referred to as a vertical line) rather than for each exposure line. Specifically, a long exposure time for normal imaging is set for a predetermined vertical line (white vertical lines in FIG. 57) and a short exposure time for visible light imaging is set for another vertical line (black vertical lines in FIG. 57). In this case, in the image sensor 10011*a*, the exposure of each of the exposure lines starts at a different point in time as in the image sensor 10010*a*, but the exposure time of each imaging element included in each of the exposure lines is different. Through imaging by this image sensor 10011*a*, the receiver obtains a normal captured image 10011*b* and a visible light captured image 10011*c*. Furthermore, the receiver generates and displays a preview image 10011*d* based on this normal captured image 10011*b* and information associated with the visible light signal obtained from the visible light captured image 10011*c*.

This image sensor 10011*a* is capable of using all the exposure lines for visible light imaging unlike the image sensor 10010*a*. Consequently, the visible light captured image 10011*c* obtained by the image sensor 10011*a* includes a larger number of bright lines than in the visible light captured image 10010*c*, and therefore allows the visible light signal to be received with increased accuracy.

As illustrated in FIG. 58, an image sensor 10012*a* may be used instead of the image sensor 10010*a*. In the image sensor 10012*a*, the exposure time is set for each imaging element in such a way that the same exposure time is not set for imaging elements next to each other in the horizontal direction and the vertical direction. In other words, the exposure time is set for each imaging element in such a way that a plurality of imaging elements for which a long exposure time is set and a plurality of imaging elements for which a short exposure time is set are distributed in a grid or a checkered pattern. Also in this case, the exposure of each of the exposure lines starts at a different point in time as in the image sensor 10010*a*, but the exposure time of each imaging element included in each of the exposure lines is different. Through imaging by this image sensor 10012*a*, the receiver obtains a normal captured image 10012*b* and a visible light captured image 10012*c*. Furthermore, the receiver generates and displays a preview image 10012*d* based on this normal captured image 10012*b* and information associated with the visible light signal obtained from the visible light captured image 10012*c*.

The normal captured image 10012*b* obtained by the image sensor 10012*a* has data of the plurality of the imaging elements arranged in a grid or evenly arranged, and therefore interpolation and resizing thereof can be more accurate than those of the normal captured image 10010*b* and the normal captured image 10011*b*. The visible light captured image 10012*c* is generated by imaging that uses all the exposure lines of the image sensor 10012*a*. Thus, this image sensor 10012*a* is capable of using all the exposure lines for visible light imaging unlike the image sensor 10010*a*. Consequently, as with the visible light captured image 10011*c*, the visible light captured image 10012*c* obtained by the image sensor 10012*a* includes a larger number of bright lines than in the visible light captured image 10010*c*, and therefore allows the visible light signal to be received with increased accuracy.

Interlaced display of the preview image is described below.

Figure 59:
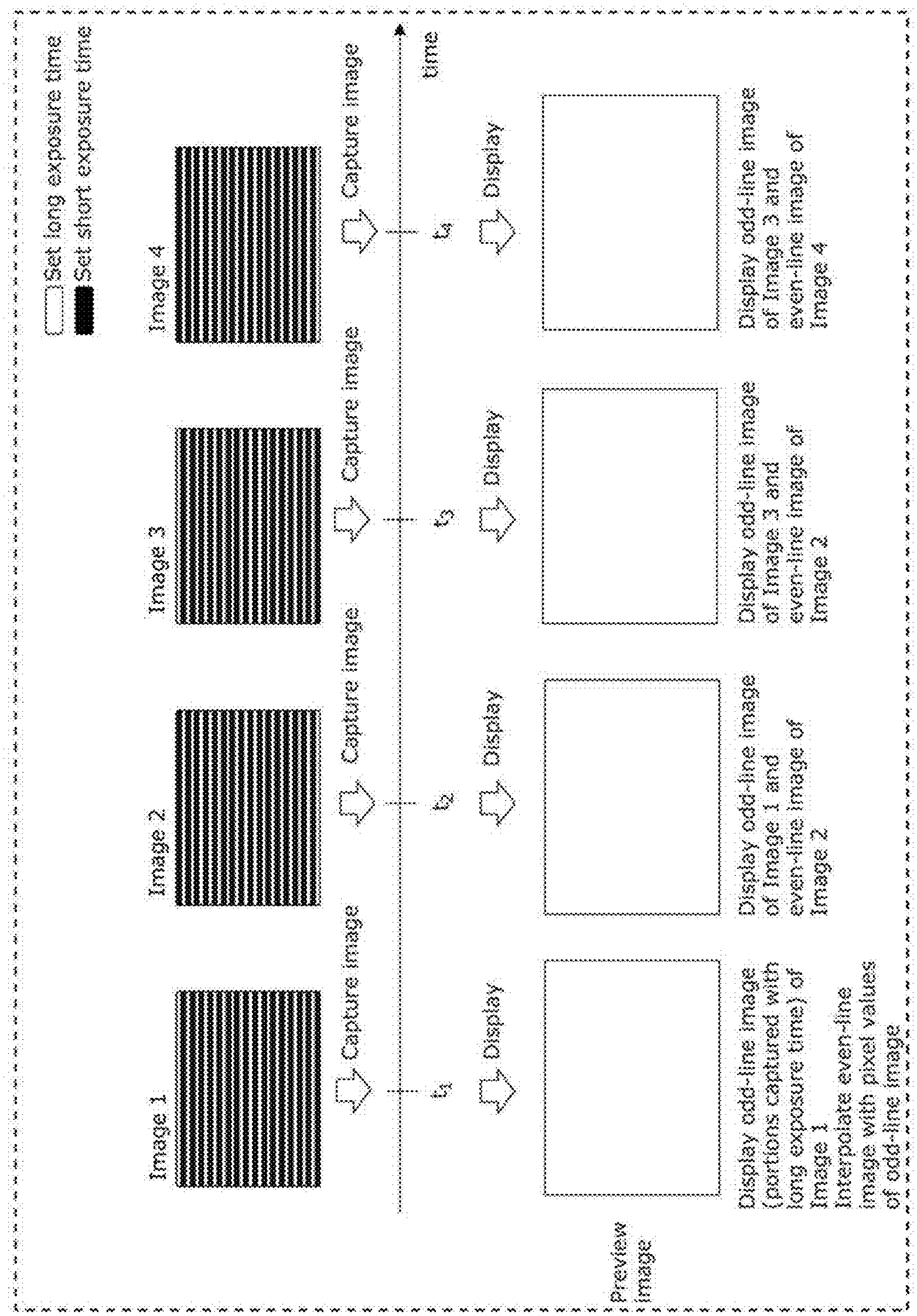
FIG. 59 is a diagram illustrating an example of a screen display method used by a receiver in Embodiment 9.

FIG. 59 is a diagram illustrating an example of a screen display method used by a receiver in Embodiment 9.

The receiver including the above-described image sensor 10010*a* illustrated in FIG. 56 switches, at predetermined intervals, between an exposure time that is set in an odd-numbered exposure line (hereinafter referred to as an odd line) and an exposure line that is set in an even-numbered exposure line (hereinafter referred to as an even line). For example, as illustrated in FIG. 59, at time t1, the receiver sets a long exposure time for each imaging element in the odd lines, and sets a short exposure time for each imaging element in the even lines, and an image is captured with these set exposure times. At time t2, the receiver sets a short exposure time for each imaging element in the odd lines, and sets a long exposure time for each imaging element in the even lines, and an image is captured with these set exposure times. At time t3, the receiver captures an image with the same exposure times set as those set at time t1. At time t4, the receiver captures an image with the same exposure times set as those set at time t2.

At time t1, the receiver obtains Image 1 which includes captured images obtained from the plurality of the odd lines (hereinafter referred to as odd-line images) and captured images obtained from the plurality of the even lines (hereinafter referred to as even-line images). At this time, the exposure time for each of the even lines is short, resulting in the subject failing to appear clear in each of the even-line images. Therefore, the receiver generates interpolated line images by interpolating even-line images with pixel values. The receiver then displays a preview image including the interpolated line images instead of the even-line images. Thus, the odd-line images and the interpolated line images are alternately arranged in the preview image.

At time t2, the receiver obtains Image 2 which includes captured odd-line images and even-line images. At this time, the exposure time for each of the odd lines is short, resulting in the subject failing to appear clear in each of the odd-line images. Therefore, the receiver displays a preview image including the odd-line images of the Image 1 instead of the odd-line images of the Image 2. Thus, the odd-line images of the Image 1 and the even-line images of the Image 2 are alternately arranged in the preview image.

At time t3, the receiver obtains Image 3 which includes captured odd-line images and even-line images. At this time, the exposure time for each of the even lines is short, resulting in the subject failing to appear clear in each of the even-line images, as in the case of time t1. Therefore, the receiver displays a preview image including the even-line images of the Image 2 instead of the even-line images of the Image 3. Thus, the even-line images of the Image 2 and the odd-line images of the Image 3 are alternately arranged in the preview image. At time t4, the receiver obtains Image 4 which includes captured odd-line images and even-line images. At this time, the exposure time for each of the odd lines is short, resulting in the subject failing to appear clear in each of the odd-line images, as in the case of time t2. Therefore, the receiver displays a preview image including the odd-line images of the Image 3 instead of the odd-line images of the Image 4. Thus, the odd-line images of the Image 3 and the even-line images of the Image 4 are alternately arranged in the preview image.

In this way, the receiver displays the image including the even-line images and the odd-line images obtained at different times, that is, displays what is called an interlaced image.

The receiver is capable of displaying a high-definition preview image while performing visible light imaging. Note that the imaging elements for which the same exposure time is set may be imaging elements arranged along a direction horizontal to the exposure line as in the image sensor 10010*a*, or imaging elements arranged along a direction perpendicular to the exposure line as in the image sensor 10011*a*, or imaging elements arranged in a checkered pattern as in the image sensor 10012*a*. The receiver may store the preview image as captured image data.

Next, a spatial ratio between normal imaging and visible light imaging is described.

Figure 60:
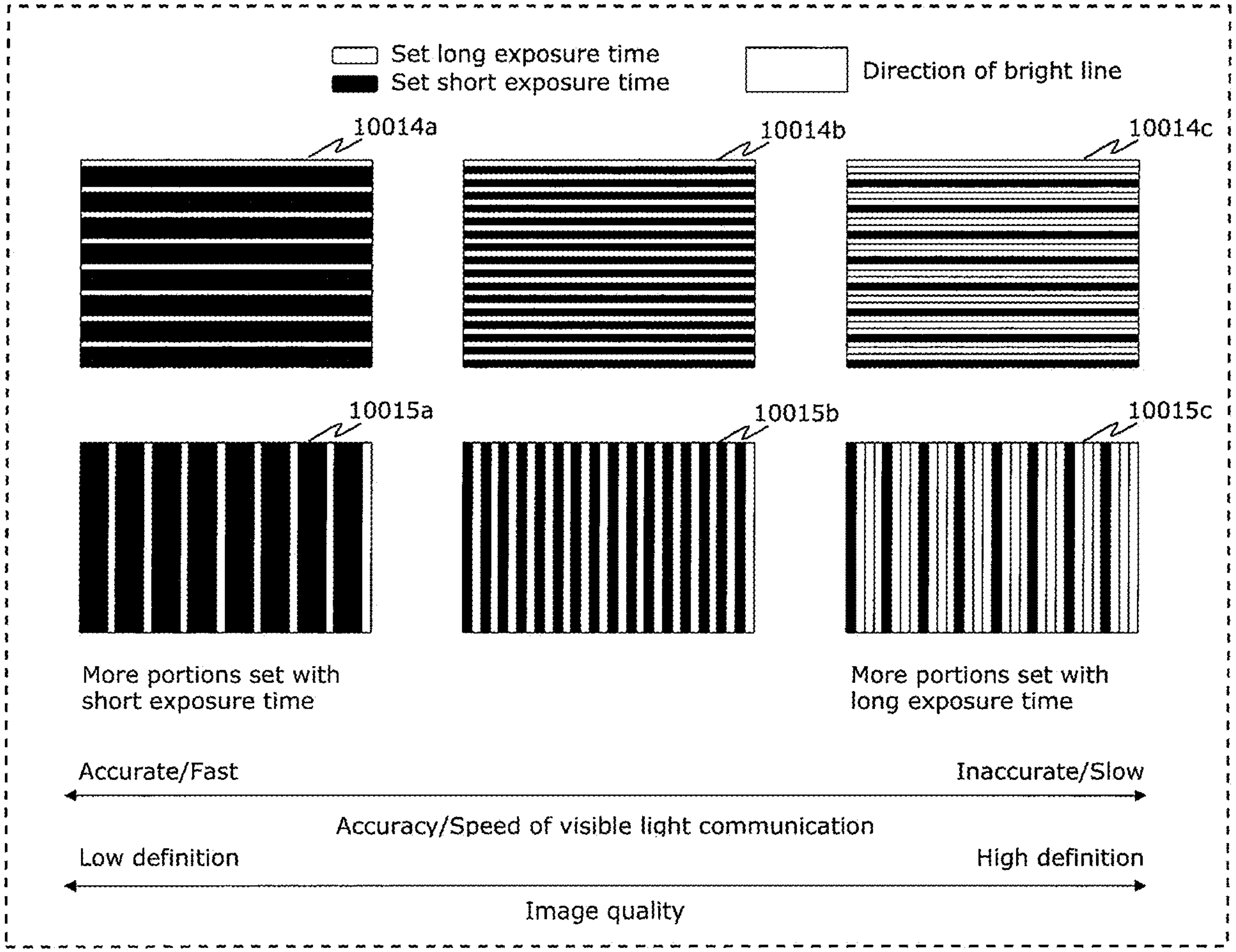
FIG. 60 is a diagram illustrating an example of a signal reception method in Embodiment 9.

FIG. 60 is a diagram illustrating an example of a signal reception method in Embodiment 9.

In an image sensor 10014*b* included in the receiver, a long exposure time or a short exposure time is set for each exposure line as in the above-described image sensor 10010*a*. In this image sensor 10014*b*, the ratio between the number of imaging elements for which the long exposure time is set and the number of imaging elements for which the short exposure time is set is one to one. This ratio is a ratio between normal imaging and visible light imaging and hereinafter referred to as a spatial ratio.

In this embodiment, however, this spatial ratio does not need to be one to one. For example, the receiver may include an image sensor 10014*a*. In this image sensor 10014*a*, the number of imaging elements for which a short exposure time is set is greater than the number of imaging elements for which a long exposure time is set, that is, the spatial ratio is one to N (N>1). Alternatively, the receiver may include an image sensor 10014*c*. In this image sensor 10014*c*, the number of imaging elements for which a short exposure time is set is less than the number of imaging elements for which a long exposure time is set, that is, the spatial ratio is N (N>1) to one. It may also be that the exposure time is set for each vertical line described above, and thus the receiver includes, instead of the image sensors 10014*a* to 10014*c*, any one of image sensors 10015*a* to 10015*c* having spatial ratios one to N, one to one, and N to one, respectively.

These image sensors 10014*a* and 10015*a* are capable of receiving the visible light signal with increased accuracy or speed because they include a large number of imaging elements for which the short exposure time is set. These image sensors 10014*c* and 10015*c* are capable of displaying a high-definition preview image because they include a large number of imaging elements for which the long exposure time is set.

Furthermore, using the image sensors 10014*a*, 10014*c*, 10015*a*, and 10015*c*, the receiver may display an interlaced image as illustrated in FIG. 59.

Next, a temporal ratio between normal imaging and visible light imaging is described.

Figure 61:
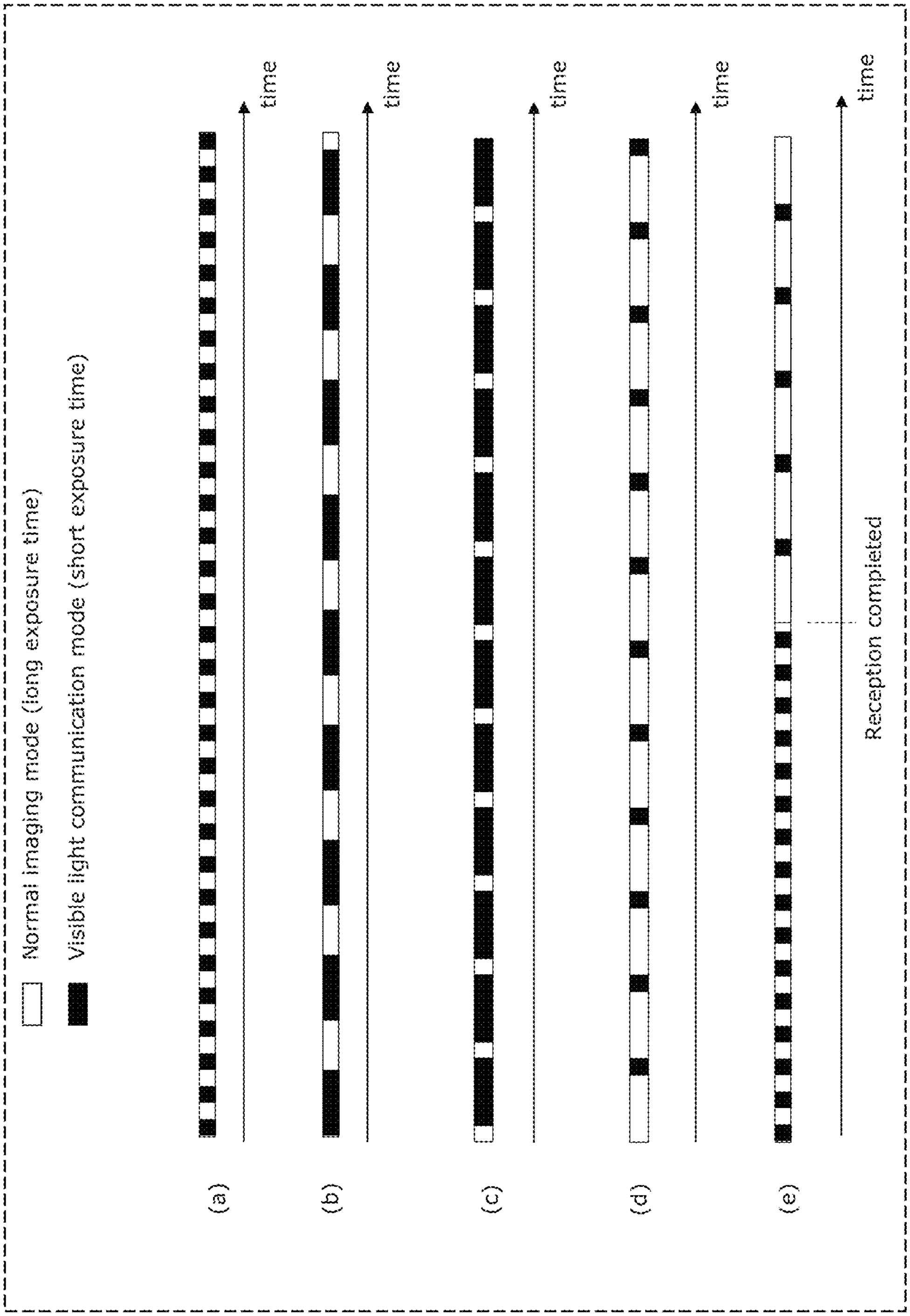
FIG. 61 is a diagram illustrating an example of a signal reception method in Embodiment 9.

FIG. 61 is a diagram illustrating an example of a signal reception method in Embodiment 9.

The receiver may switch the imaging mode between a normal imaging mode and a visible light imaging mode for each frame as illustrated in (a) in FIG. 61. The normal imaging mode is an image mode in which a long exposure time for normal imaging is set for all the imaging elements of the image sensor in the receiver. The visible light imaging mode is an image mode in which a short exposure time for visible light imaging is set for all the imaging elements of the image sensor in the receiver. Such switching between the long and short exposure times makes it possible to display a preview image using an image captured with the long exposure time while receiving a visible light signal using an image captured with the short exposure time.

Note that in the case of determining a long exposure time by the automatic exposure, the receiver may ignore an image captured with a short exposure time so as to perform the automatic exposure based on only brightness of an image captured with a long exposure time. By doing so, it is possible to determine an appropriate long exposure time.

Alternatively, the receiver may switch the imaging mode between the normal imaging mode and the visible light imaging mode for each set of frames as illustrated in (b) in FIG. 61. If it takes time to switch the exposure time or if it takes time for the exposure time to stabilize, changing the exposure time for each set of frames as in (b) in FIG. 61 enables the visible light imaging (reception of a visible light signal) and the normal imaging at the same time. The number of times the exposure time is switched is reduced as the number of frames included in the set increases, and thus it is possible to reduce power consumption and heat generation in the receiver.

The ratio between the number of frames continuously generated by imaging in the normal imaging mode using a long exposure time and the number of frames continuously generated by imaging in the visible light imaging mode using a short exposure time (hereinafter referred to as a temporal ratio) does not need to be one to one. That is, although the temporal ratio is one to one in the case illustrated in (a) and (b) of FIG. 61, this temporal ratio does not need to be one to one.

For example, the receiver can make the number of frames in the visible light imaging mode greater than the number of frames in the normal imaging mode as illustrated in (c) in FIG. 61. By doing so, it is possible to receive the visible light signal with increased speed. When the frame rate of the preview image is greater than or equal to a predetermined rate, a difference in the preview image depending on the frame rate is not visible to human eyes. When the imaging frame rate is sufficiently high, for example, when this frame rate is 120 fps, the receiver sets the visible light imaging mode for three consecutive frames and sets the normal imaging mode for one following frame. By doing so, it is possible to receive the visible light signal with high speed while displaying the preview image at 30 fps which is a frame rate sufficiently higher than the above predetermined rate. Furthermore, the number of switching operations is small, and thus it is possible to obtain the effects described with reference to (b) in FIG. 61.

Alternatively, the receiver can make the number of frames in the normal imaging mode greater than the number of frames in the visible light imaging mode as illustrated in (d) in FIG. 61. When the number of frames in the normal imaging mode, that is, the number of frames captured with the long exposure time, is set large as just mentioned, a smooth preview image can be displayed. In this case, there is a power saving effect because of a reduced number of times the processing of receiving a visible light signal is performed. Furthermore, the number of switching operations is small, and thus it is possible to obtain the effects described with reference to (b) in FIG. 61.

It may also be possible that, as illustrated in (e) in FIG. 61, the receiver first switches the imaging mode for each frame as in the case illustrated in (a) in FIG. 61 and next, upon completing receiving the visible light signal, increases the number of frames in the normal imaging mode as in the case illustrated in (d) in FIG. 61. By doing so, it is possible to continue searching for a new visible light signal while displaying a smooth preview image after completion of the reception of the visible light signal. Furthermore, since the number of switching operations is small, it is possible to obtain the effects described with reference to (b) in FIG. 61.

Figure 62:
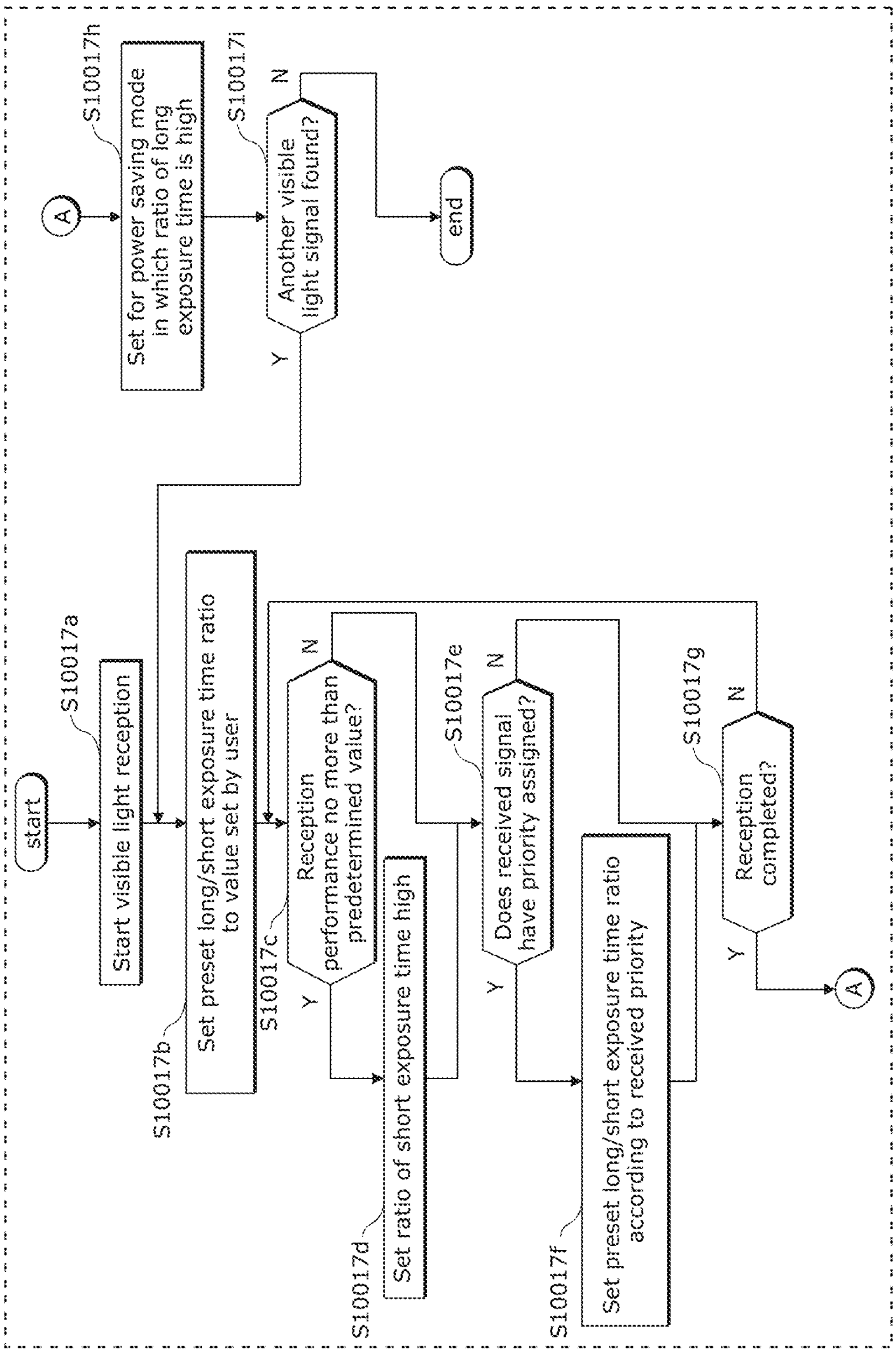
FIG. 62 is a flowchart illustrating an example of a signal reception method in Embodiment 9.

FIG. 62 is a flowchart illustrating an example of a signal reception method in Embodiment 9.

The receiver starts visible light reception which is processing of receiving a visible light signal (Step S10017*a*) and sets a preset long/short exposure time ratio to a value specified by a user (Step S10017*b*). The preset long/short exposure time ratio is at least one of the above spatial ratio and temporal ratio. A user may specify only the spatial ratio, only the temporal ratio, or values of both the spatial ratio and the temporal ratio. Alternatively, the receiver may automatically set the preset long/short exposure time ratio without depending on a ratio specified by a user.

Next, the receiver determines whether or not the reception performance is no more than a predetermined value (Step S10017*c*). When determining that the reception performance is no more than the predetermined value (Y in Step S10017*c*), the receiver sets the ratio of the short exposure time high (Step S10017*d*). By doing so, it is possible to increase the reception performance. Note that the ratio of the short exposure time is, when the spatial ratio is used, a ratio of the number of imaging elements for which the short exposure time is set to the number of imaging elements for which the long exposure time is set, and is, when the temporal ratio is used, a ratio of the number of frames continuously generated in the visible light imaging mode to the number of frames continuously generated in the normal imaging mode.

Next, the receiver receives at least part of the visible light signal and determines whether or not at least part of the visible light signal received (hereinafter referred to as a received signal) has a priority assigned (Step S10017*e*). The received signal that has a priority assigned contains an identifier indicating a priority. When determining that the received signal has a priority assigned (Step S10017e: Y), the receiver sets the preset long/short exposure time ratio according to the priority (Step S10017f). Specifically, the receiver sets the ratio of the short exposure time high when the priority is high. For example, an emergency light as a transmitter transmits an identifier indicating a high priority by changing in luminance. In this case, the receiver can increase the ratio of the short exposure time to increase the reception speed and thereby promptly display an escape route and the like.

Next, the receiver determines whether or not the reception of all the visible light signals has been completed (Step S10017g). When determining that the reception has not been completed (Step S10017g: N), the receiver repeats the processes following Step S10017c. In contrast, when determining that the reception has been completed (Step S10017g: Y), the receiver sets the ratio of the long exposure time high and effects a transition to a power saving mode (Step S10017h). Note that the ratio of the long exposure time is, when the spatial ratio is used, a ratio of the number of imaging elements for which the long exposure time is set to the number of imaging elements for which the short exposure time is set, and is, when the temporal ratio is used, a ratio of the number of frames continuously generated in the normal imaging mode to the number of frames continuously generated in the visible light imaging mode. This makes it possible to display a smooth preview image without performing unnecessary visible light reception.

Next, the receiver determines whether or not another visible light signal has been found (Step S10017i). When another visible light signal has been found (Step S10017i: Y), the receiver repeats the processes following Step S10017b.

Next, simultaneous operation of visible light imaging and normal imaging is described.

Figure 63:
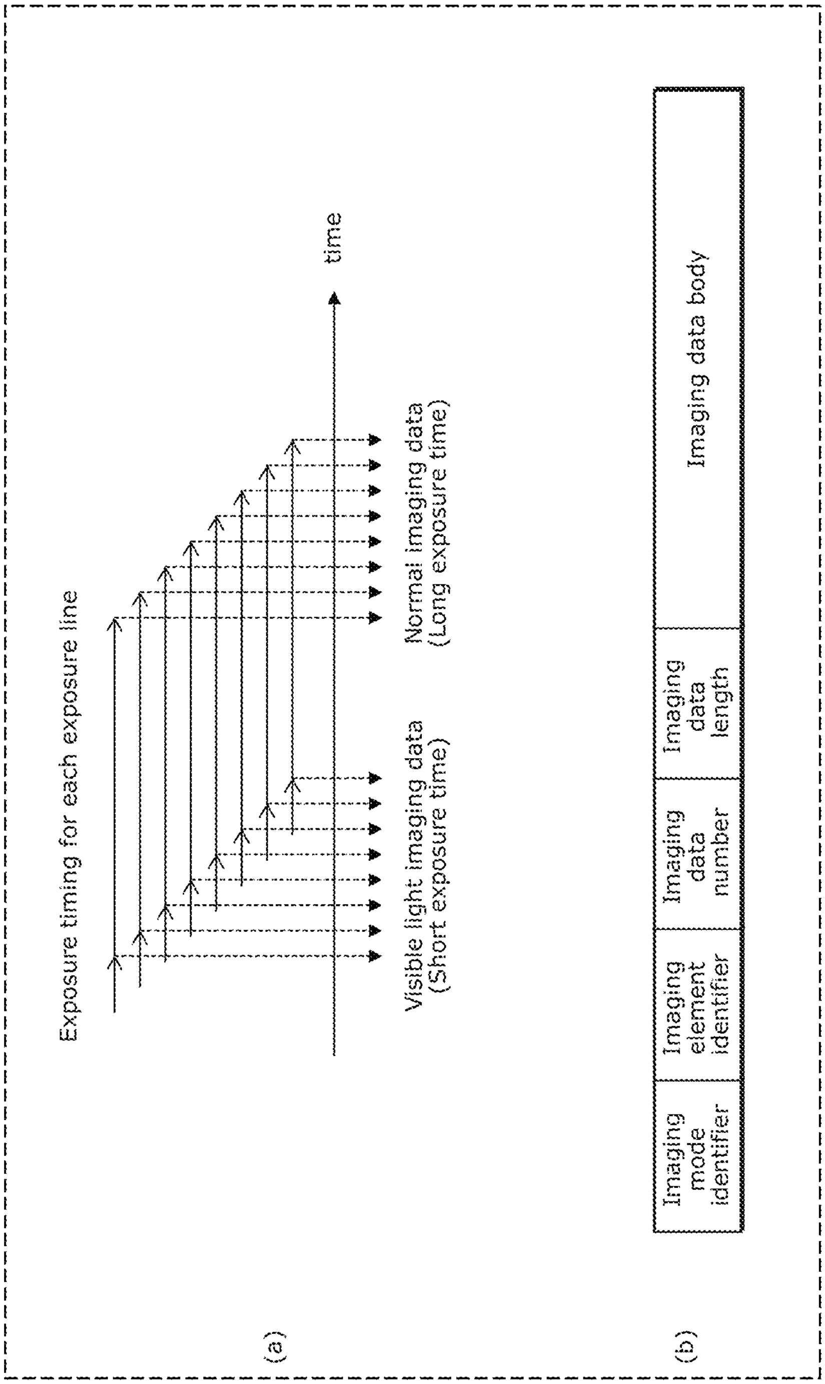
FIG. 63 is a diagram illustrating an example of a signal reception method in Embodiment 9.

FIG. 63 is a diagram illustrating an example of a signal reception method in Embodiment 9.

The receiver may set two or more exposure times in the image sensor. Specifically, as illustrated in (a) in FIG. 63, each of the exposure lines included in the image sensor is exposed continuously for the longest exposure time of the two or more set exposure times. For each exposure line, the receiver reads out captured image data obtained by exposure of the exposure line, at a point in time when each of the above-described two or more set exposure times ends. The receiver does not reset the read captured image data until the longest exposure time ends. Therefore, the receiver records cumulative values of the read captured image data, so that the receiver will be able to obtain captured image data corresponding to a plurality of exposure times by exposure of the longest exposure time only. Note that it is optional whether the image sensor records cumulative values of captured image data. When the image sensor does not record cumulative values of captured image data, a structural element of the receiver that reads out data from the image sensor performs cumulative calculation, that is, records cumulative values of captured image data.

For example, when two exposure times are set, the receiver reads out visible light imaging data generated by exposure for a short exposure time that includes a visible light signal, and subsequently reads out normal imaging data generated by exposure for a long exposure time as illustrated in (a) in FIG. 63.

By doing so, visible light imaging which is imaging for receiving a visible light signal and normal imaging can be performed at the same time, that is, it is possible to perform the normal imaging while receiving the visible light signal. Furthermore, the use of data across exposure times allows a signal of no less than the frequency indicated by the sampling theorem to be recognized, making it possible to receive a high frequency signal, a high-density modulated signal, or the like.

When outputting captured image data, the receiver outputs a data sequence that contains the captured image data as an imaging data body as illustrated in (b) in FIG. 63. Specifically, the receiver generates the above data sequence by adding additional information to the imaging data body and outputs the generated data sequence. The additional information contains: an imaging mode identifier indicating an imaging mode (the visible light imaging or the normal imaging); an imaging element identifier for identifying an imaging element or an exposure line included in the imaging element; an imaging data number indicating a place of the exposure time of the captured image data in the order of the exposure times; and an imaging data length indicating a size of the imaging data body. In the method of reading out captured image data described with reference to (a) in FIG. 63, the captured image data is not necessarily output in the order of the exposure lines. Therefore, the additional information illustrated in (b) in FIG. 63 is added so that which exposure line the captured image data is based on can be identified.

Figure 64:
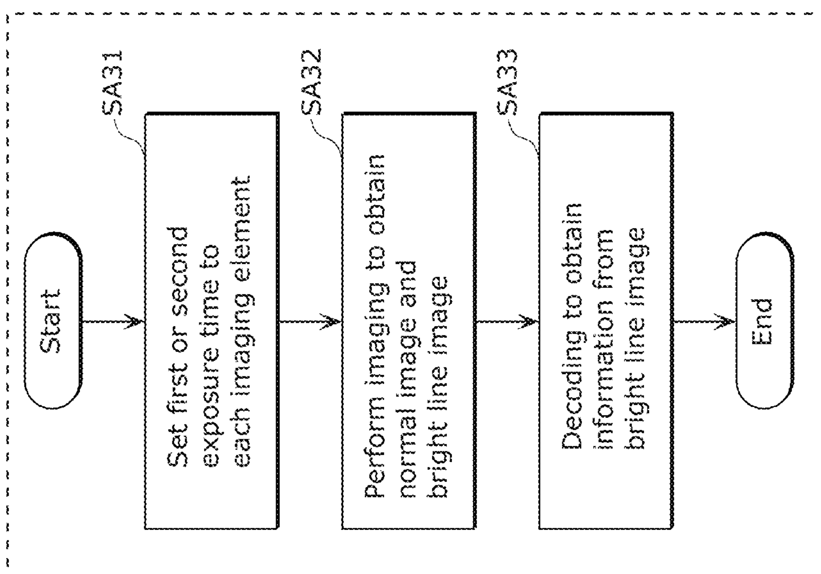
FIG. 64 is a flowchart illustrating processing of a reception program in Embodiment 9.

FIG. 64 is a flowchart illustrating processing of a reception program in Embodiment 9.

This reception program is a program for causing a computer included in a receiver to execute the processing illustrated in FIGS. 56 to 63, for example.

In other words, this reception program is a reception program for receiving information from a light emitter changing in luminance. In detail, this reception program causes a computer to execute Step SA31, Step SA32, and Step SA33. In Step SA31, a first exposure time is set for a plurality of imaging elements which are a part of K imaging elements (where K is an integer of 4 or more) included in an image sensor, and a second exposure time shorter than the first exposure time is set for a plurality of imaging elements which are a remainder of the K imaging elements. In Step SA32, the image sensor captures a subject, i.e., a light emitter changing in luminance, with the set first exposure time and the set second exposure time, to obtain a normal image according to output from the plurality of the imaging elements for which the first exposure time is set, and obtain a bright line image according to output from the plurality of the imaging elements for which the second exposure time is set. The bright light image includes a plurality of bright lines each of which corresponds to a different one of a plurality of exposure lines included in the image sensor. In Step SA33, a pattern of the plurality of the bright lines included in the obtained bright line image is decoded to obtain information.

With this, imaging is performed by the plurality of the imaging elements for which the first exposure time is set and the plurality of the imaging elements for which the second exposure time is set, with the result that a normal image and a bright line image can be obtained in a single imaging operation by the image sensor. That is, it is possible to capture a normal image and obtain information by visible light communication at the same time.

Furthermore, in the exposure time setting step SA31, a first exposure time is set for a plurality of imaging element lines which are a part of L imaging element lines (where L is an integer of 4 or more) included in the image sensor, and the second exposure time is set for a plurality of imaging element lines which are a remainder of the L imaging element lines. Each of the L imaging element lines includes a plurality of imaging elements included in the image sensor and arranged in a line.

With this, it is possible to set an exposure time for each imaging element line, which is a large unit, without individually setting an exposure time for each imaging element, which is a small unit, so that the processing load can be reduced.

For example, each of the L imaging element lines is an exposure line included in the image sensor as illustrated in FIG. 56. Alternatively, each of the L imaging element lines includes a plurality of imaging elements included in the image sensor and arranged along a direction perpendicular to the plurality of the exposure lines as illustrated in FIG. 57.

It may be that in the exposure time setting step SA31, one of the first exposure time and the second exposure time is set for each of odd-numbered imaging element lines of the L imaging element lines included in the image sensor, to set the same exposure time for each of the odd-numbered imaging element lines, and a remaining one of the first exposure time and the second exposure time is set for each of even-numbered imaging element lines of the L imaging element lines, to set the same exposure time for each of the even-numbered imaging element lines, as illustrated in FIG. 59. In the case where the exposure time setting step SA31, the image obtainment step SA32, and the information obtainment step SA33 are repeated, in the current round of the exposure time setting step SA31, an exposure time for each of the odd-numbered imaging element lines is set to an exposure time set for each of the even-numbered imaging element lines in an immediately previous round of the exposure time setting step SA31, and an exposure time for each of the even-numbered imaging element lines is set to an exposure time set for each of the odd-numbered imaging element lines in the immediately previous round of the exposure time setting step S31.

With this, at every operation to obtain a normal image, the plurality of the imaging element lines that are to be used in the obtainment can be switched between the odd-numbered imaging element lines and the even-numbered imaging element lines. As a result, each of the sequentially obtained normal images can be displayed in an interlaced format. Furthermore, by interpolating two continuously obtained normal images with each other, it is possible to generate a new normal image that includes an image obtained by the odd-numbered imaging element lines and an image obtained by the even-numbered imaging element lines.

It may be that in the exposure time setting step SA31, a preset mode is switched between a normal imaging priority mode and a visible light imaging priority mode, and when the preset mode is switched to the normal imaging priority mode, the total number of the imaging elements for which the first exposure time is set is greater than the total number of the imaging elements for which the second exposure time is set, and when the preset mode is switched to the visible light imaging priority mode, the total number of the imaging elements for which the first exposure time is set is less than the total number of the imaging elements for which the second exposure time is set, as illustrated in FIG. 60.

With this, when the preset mode is switched to the normal imaging priority mode, the quality of the normal image can be improved, and when the preset mode is switched to the visible light imaging priority mode, the reception efficiency for information from the light emitter can be improved.

It may be that in the exposure time setting step SA31, an exposure time is set for each imaging element included in the image sensor, to distribute, in a checkered pattern, the plurality of the imaging elements for which the first exposure time is set and the plurality of the imaging elements for which the second exposure time is set, as illustrated in FIG. 58.

This results in uniform distribution of the plurality of the imaging elements for which the first exposure time is set and the plurality of the imaging elements for which the second exposure time is set, so that it is possible to obtain the normal image and the bright line image, the quality of which is not unbalanced between the horizontal direction and the vertical direction.

Figure 65:
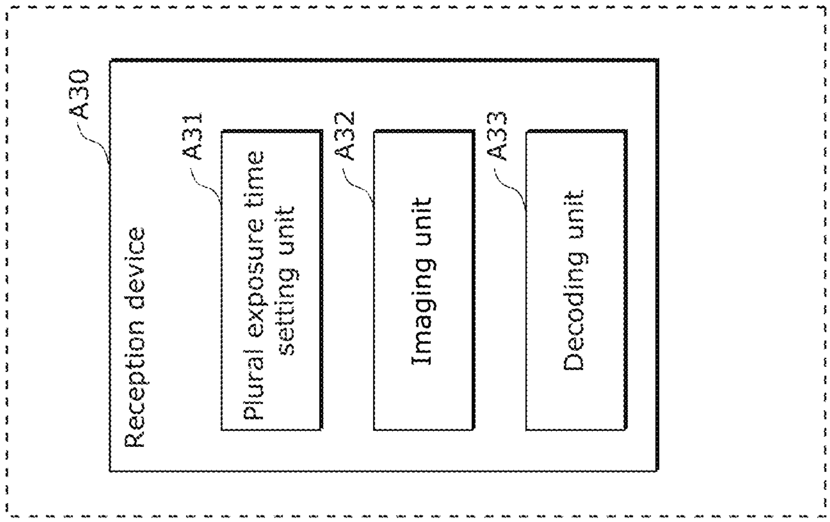
FIG. 65 is a block diagram of a reception device in Embodiment 9.

FIG. 65 is a block diagram of a reception device in Embodiment 9.

This reception device A30 is the above-described receiver that performs the processing illustrated in FIGS. 56 to 63, for example.

In detail, this reception device A30 is a reception device that receives information from a light emitter changing in luminance, and includes a plural exposure time setting unit A31, an imaging unit A32, and a decoding unit A33. The plural exposure time setting unit A31 sets a first exposure time for a plurality of imaging elements which are a part of K imaging elements (where K is an integer of 4 or more) included in an image sensor, and sets a second exposure time shorter than the first exposure time for a plurality of imaging elements which are a remainder of the K imaging elements. The imaging unit A32 causes the image sensor to capture a subject, i.e., a light emitter changing in luminance, with the set first exposure time and the set second exposure time, to obtain a normal image according to output from the plurality of the imaging elements for which the first exposure time is set, and obtain a bright line image according to output from the plurality of the imaging elements for which the second exposure time is set. The bright line image includes a plurality of bright lines each of which corresponds to a different one of a plurality of exposure lines included in the image sensor. The decoding unit A33 obtains information by decoding a pattern of the plurality of the bright lines included in the obtained bright line image. This reception device A30 can produce the same advantageous effects as the above-described reception program.

Next, displaying of content related to a received visible light signal is described.

Figure 66:
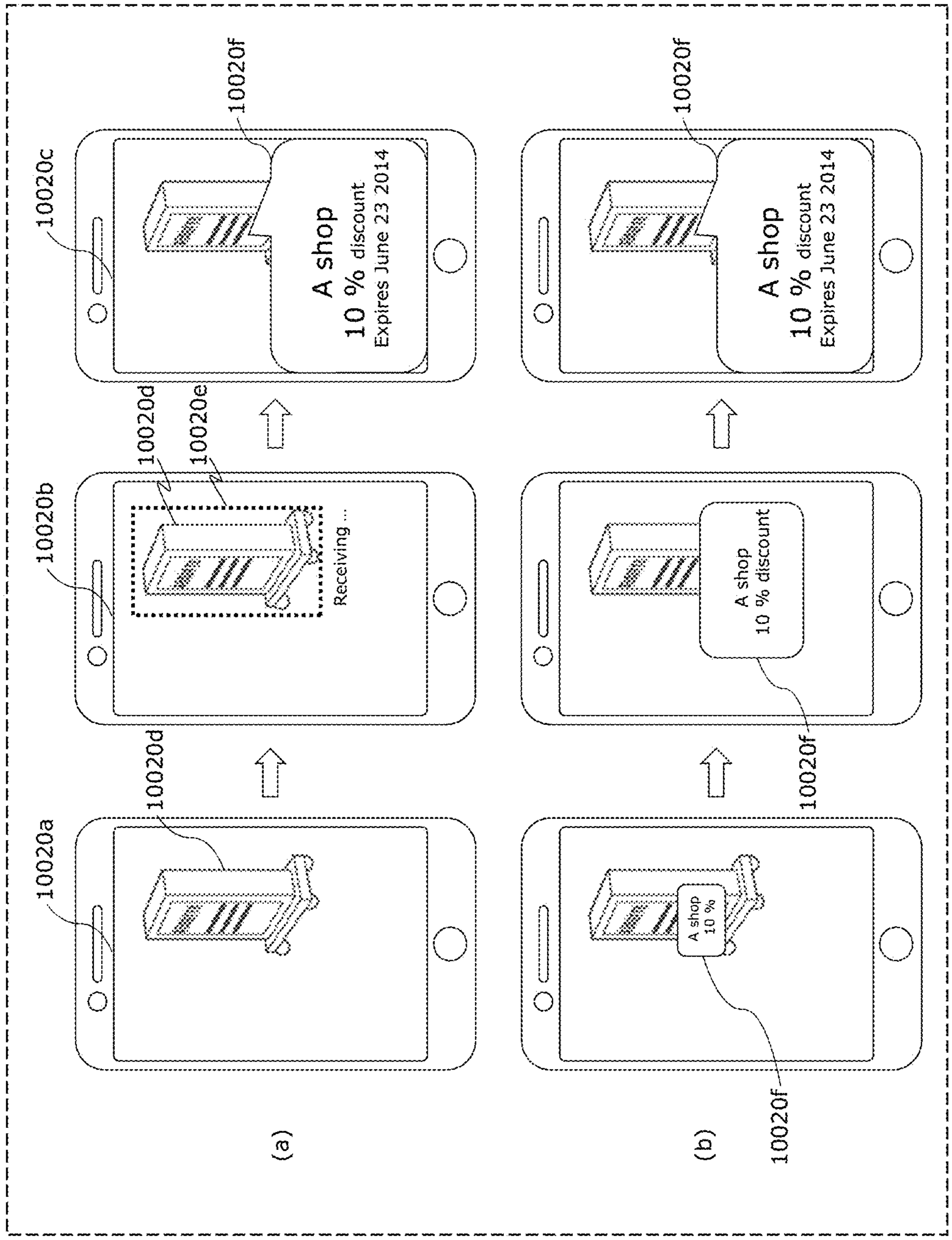
FIG. 66 is a diagram illustrating an example of what is displayed on a receiver when a visible light signal is received.
Figure 67:
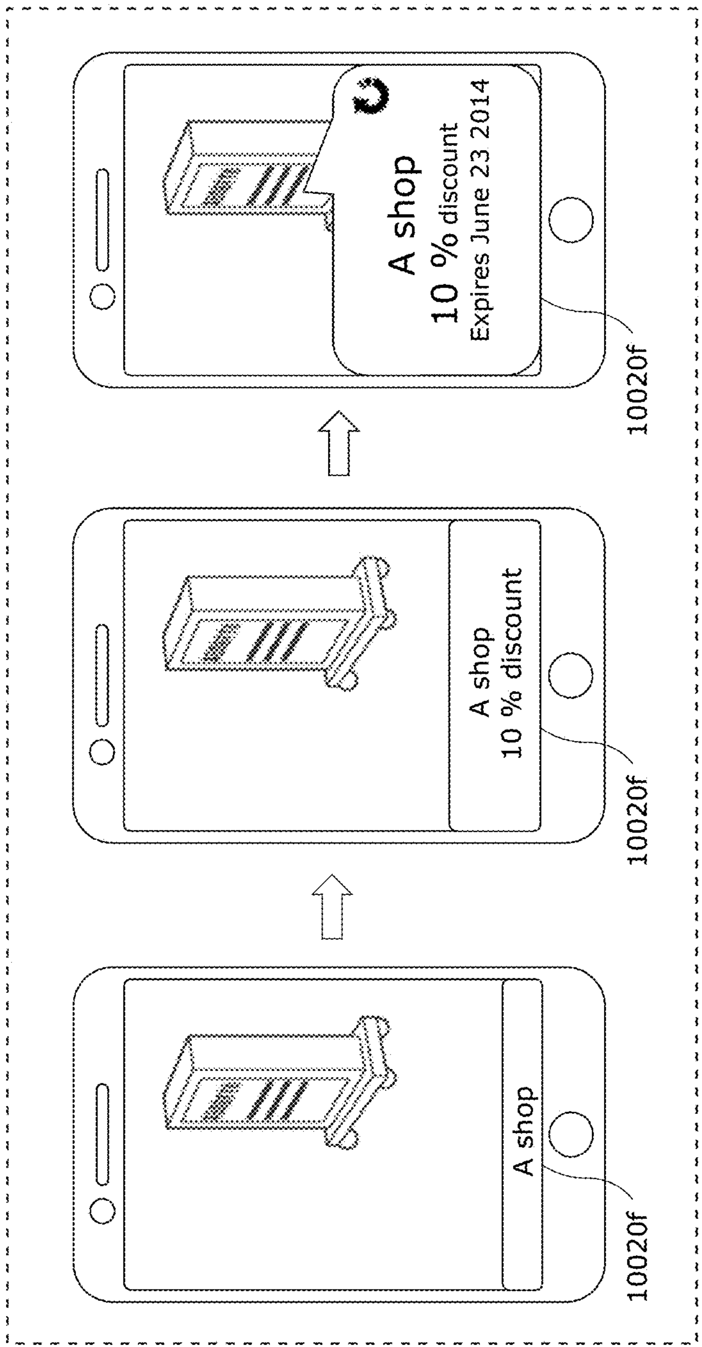
FIG. 67 is a diagram illustrating an example of what is displayed on a receiver when a visible light signal is received.

FIGS. 66 and 67 are diagrams illustrating an example of what is displayed on a receiver when a visible light signal is received.

The receiver captures an image of a transmitter 10020*d* and then displays an image 10020*a* including the image of the transmitter 10020*d* as illustrated in (a) in FIG. 66. Furthermore, the receiver generates an image 10020*b* by superimposing an object 10020*e* on the image 10020*a* and displays the image 10020*b*. The object 10020*e* is an image indicating a location of the transmitter 10020*d* and that a visible light signal is being received from the transmitter 10020*d*. The object 10020*e* may be an image that is different depending on the reception status for the visible light signal (such as a state in which a visible light signal is being received or the transmitter is being searched for, an extent of reception progress, a reception speed, or an error rate). For example, the receiver changes a color, a line thickness, a line type (single line, double line, dotted line, etc.), or a dotted-line interval of the object 1020*e*. This allows a user to recognize the reception status. Next, the receiver generates an image 10020*c* by superimposing on the image 10020*a* an obtained data image 10020*f* which represents content of obtained data, and displays the image 10020*c*. The obtained data is the received visible light signal or data associated with an ID indicated by the received visible light signal.

Upon displaying this obtained data image 10020*f*, the receiver displays the obtained data image 10020*f* in a speech balloon extending from the transmitter 10020*d* as illustrated in (a) in FIG. 66, or displays the obtained data image 10020*f* near the transmitter 10020*d*. Alternatively, the receiver may display the obtained data image 10020*f* in such a way that the obtained data image 10020*f* can be displayed gradually closer to the transmitter 10020*d* as illustrated in (b) of FIG. 66. This allows a user to recognize which transmitter transmitted the visible light signal on which the obtained data image 10020*f* is based. Alternatively, the receiver may display the obtained data image 10020*f* as illustrated in FIG. 67 in such a way that the obtained data image 10020*f* gradually comes in from an edge of a display of the receiver. This allows a user to easily recognize that the visible light signal was obtained at that time.

Next, augmented reality (AR) is described.

Figure 68:
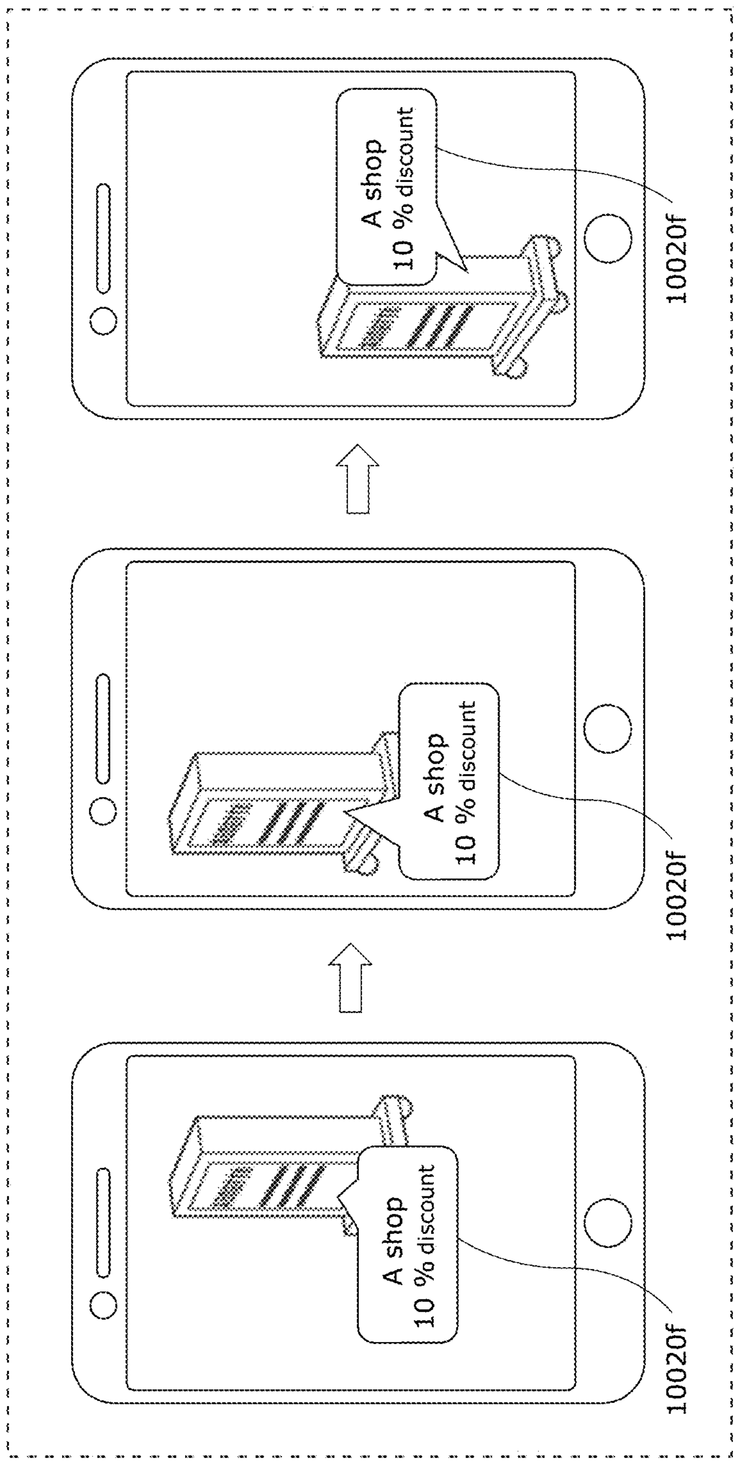
FIG. 68 is a diagram illustrating a display example of obtained data image.

FIG. 68 is a diagram illustrating a display example of the obtained data image 10020*f*.

When the image of the transmitter moves on the display, the receiver moves the obtained data image 10020*f* according to the movement of the image of the transmitter. This allows a user to recognize that the obtained data image 10020*f* is associated with the transmitter. The receiver may alternatively display the obtained data image 10020*f* in association with something different from the image of the transmitter. With this, data can be displayed in AR.

Next, storing and discarding the obtained data is described.

Figure 69:
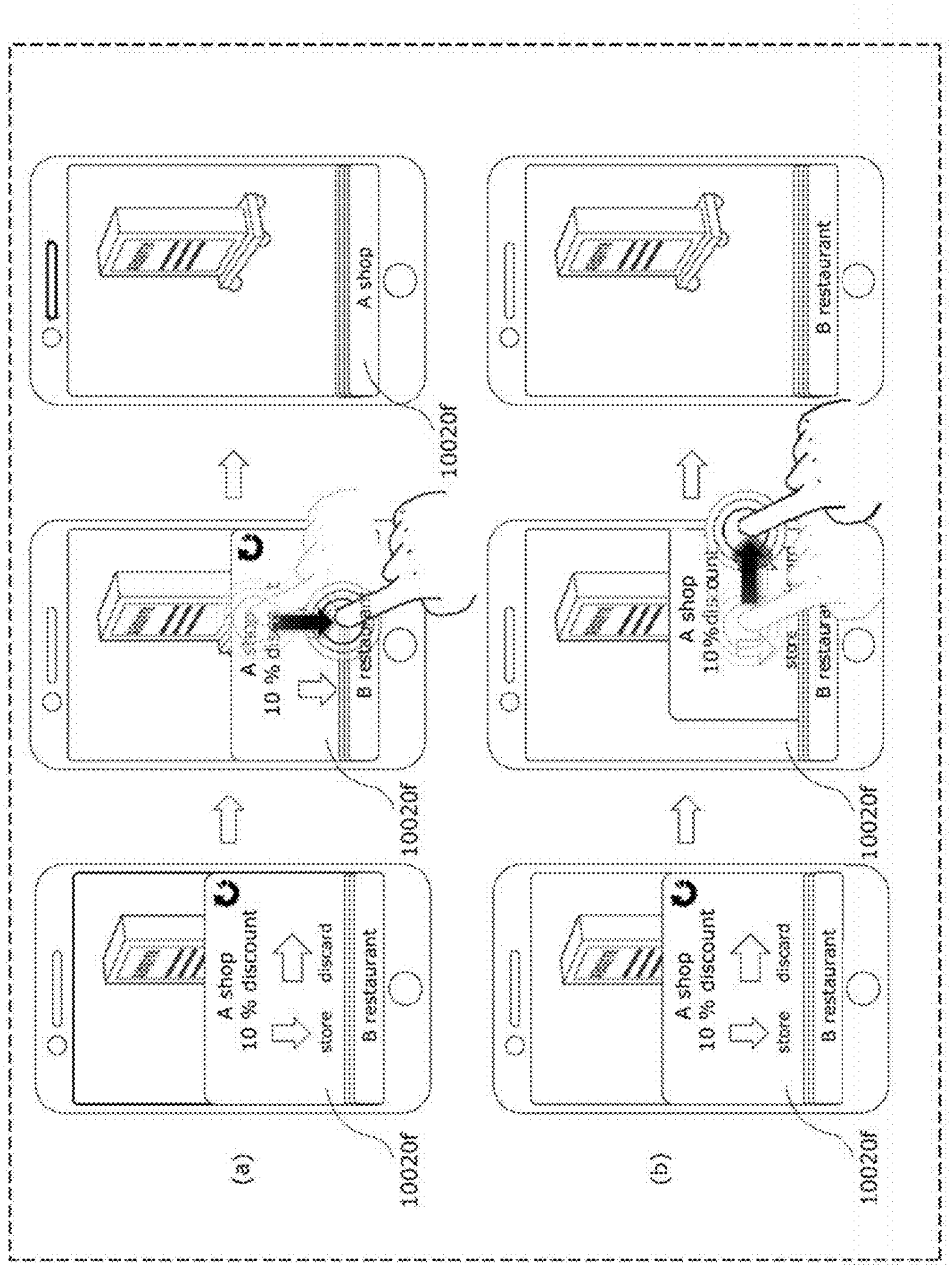
FIG. 69 is a diagram illustrating an operation example for storing or discarding obtained data.

FIG. 69 is a diagram illustrating an operation example for storing or discarding obtained data.

For example, when a user swipes the obtained data image 10020*f* down as illustrated in (a) in FIG. 69, the receiver stores obtained data represented by the obtained data image 10020*f*. The receiver positions the obtained data image 10020*f* representing the obtained data stored, at an end of arrangement of the obtained data image representing one or more pieces of other obtained data already stored. This allows a user to recognize that the obtained data represented by the obtained data image 10020*f* is the obtained data stored last. For example, the receiver positions the obtained data image 10020*f* in front of any other one of obtained data images as illustrated in (a) in FIG. 69.

When a user swipes the obtained data image 10020*f* to the right as illustrated in (b) in FIG. 69, the receiver discards obtained data represented by the obtained data image 10020*f*. Alternatively, it may be that when a user moves the receiver so that the image of the transmitter goes out of the frame of the display, the receiver discards obtained data represented by the obtained data image 10020*f*. Here, all the upward, downward, leftward, and rightward swipes produce the same or similar effect as that described above. The receiver may display a swipe direction for storing or discarding. This allows a user to recognize that data can be stored or discarded with such operation.

Next, browsing of obtained data is described.

Figure 70:
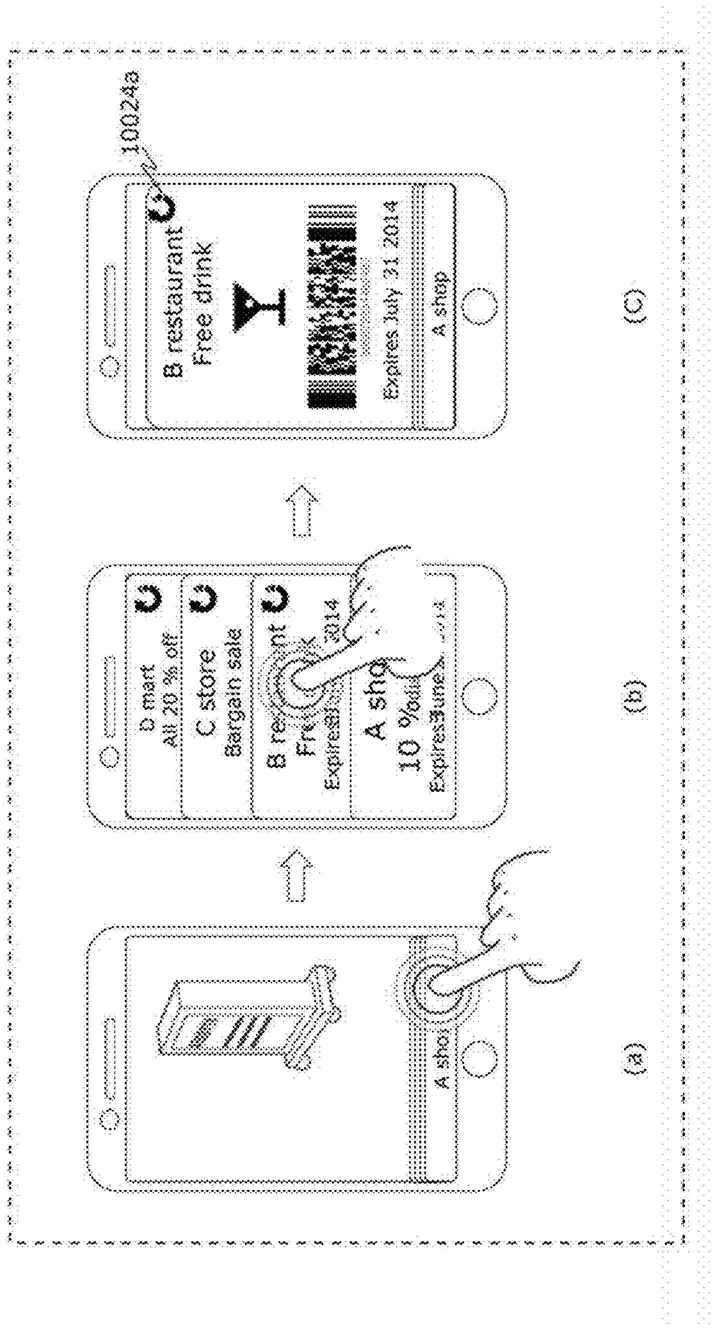
FIG. 70 is a diagram illustrating an example of what is displayed when obtained data is browsed.

FIG. 70 is a diagram illustrating an example of what is displayed when obtained data is browsed.

In the receiver, obtained data images of a plurality of pieces of obtained data stored are displayed on top of each other, appearing small, in a bottom area of the display as illustrated in (a) in FIG. 70. When a user taps a part of the obtained data images displayed in this state, the receiver displays an expanded view of each of the obtained data images as illustrated in (b) in FIG. 70. Thus, it is possible to display an expanded view of each obtained data only when it is necessary to browse the obtained data, and efficiently use the display to display other content when it is not necessary to browse the obtained data.

When a user taps the obtained data image that is desired to be displayed in a state illustrated in (b) in FIG. 70, a further expanded view of the obtained data image tapped is displayed as illustrated in (c) in FIG. 70 so that a large amount of information is displayed out of the obtained data image. Furthermore, when a user taps a back-side display button 10024*a*, the receiver displays the back side of the obtained data image, displaying other data related to the obtained data.

Next, turning off of an image stabilization function upon self-position estimation is described.

By disabling (turning off) the image stabilization function or converting a captured image according to an image stabilization direction and an image stabilization amount, the receiver is capable of obtaining an accurate imaging direction and accurately performing self-position estimation. The captured image is an image captured by an imaging unit of the receiver. Self-position estimation means that the receiver estimates its position. Specifically, in the self-position estimation, the receiver identifies a position of a transmitter based on a received visible light signal and identifies a relative positional relationship between the receiver and the transmitter based on the size, position, shape, or the like of the transmitter appearing in a captured image. The receiver then estimates a position of the receiver based on the position of the transmitter and the relative positional relationship between the receiver and the transmitter.

The transmitter moves out of the frame due to even a little shake of the receiver at the time of partial read-out illustrated in, for example, FIG. 56, in which an image is captured only with the use of a part of the exposure lines, that is, when imaging illustrated in, for example, FIG. 56, is performed. In such a case, the receiver enables the image stabilization function and thereby can continue signal reception.

Next, self-position estimation using an asymmetrically shaped light emitting unit is described.

Figure 71:
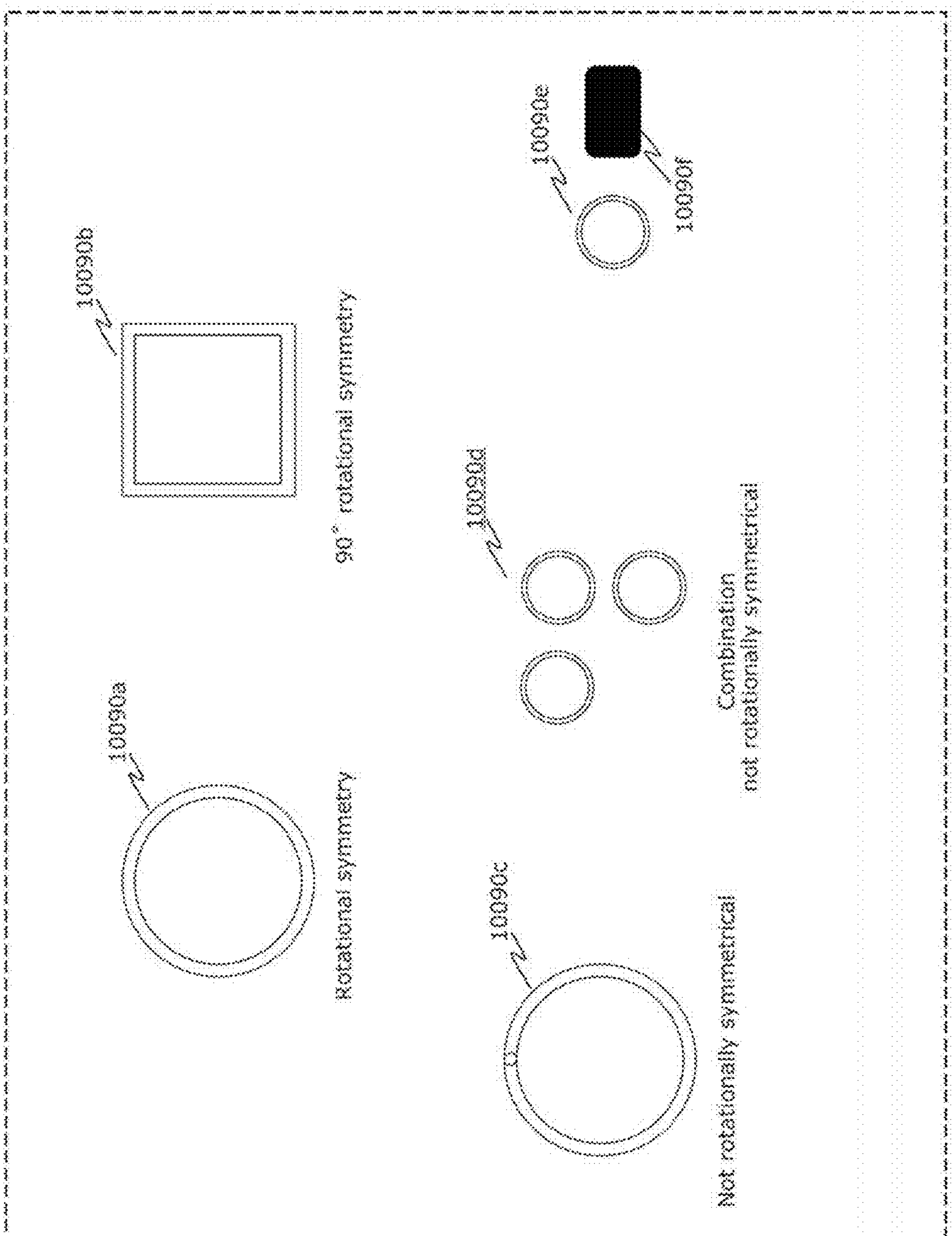
FIG. 71 is a diagram illustrating an example of a transmitter in Embodiment 9.

FIG. 71 is a diagram illustrating an example of a transmitter in Embodiment 9.

The above-described transmitter includes a light emitting unit and causes the light emitting unit to change in luminance to transmit a visible light signal. In the above-described self-position estimation, the receiver determines, as a relative positional relationship between the receiver and the transmitter, a relative angle between the receiver and the transmitter based on the shape of the transmitter (specifically, the light emitting unit) in a captured image. Here, in the case where the transmitter includes a light emitting unit 10090*a* having a rotationally symmetrical shape as illustrated in, for example, FIG. 71 the determination of a relative angle between the transmitter and the receiver based on the shape of the transmitter in a captured image as described above cannot be accurate. Thus, it is desirable that the transmitter include a light emitting unit having a non-rotationally symmetrical shape. This allows the receiver to accurately determine the above-described relative angle. This is because a bearing sensor for obtaining an angle has a wide margin of error in measurement; therefore, the use of the relative angle determined in the above-described method allows the receiver to perform accurate self-position estimation.

The transmitter may include a light emitting unit 10090*b*, the shape of which is not a perfect rotation symmetry as illustrated in FIG. 71. The shape of this light emitting unit 10090*b* is symmetrical at 90 degree rotation, but not perfect rotational symmetry. In this case, the receiver determines a rough angle using the bearing sensor and can further use the shape of the transmitter in a captured image to uniquely limit the relative angle between the receiver and the transmitter, and thus it is possible to perform accurate self-position estimation.

The transmitter may include a light emitting unit 10090*c* illustrated in FIG. 71. The shape of this light emitting unit 10090*c* is basically rotational symmetry. However, with a light guide plate or the like placed in a part of the light emitting unit 10090*c*, the light emitting unit 10090*c* is formed into a non-rotationally symmetrical shape.

The transmitter may include a light emitting unit 10090*d* illustrated in FIG. 71. This light emitting unit 10090*d* includes lightings each having a rotationally symmetrical shape. These lightings are arranged in combination to form the light emitting unit 10090*d*, and the whole shape thereof is not rotationally symmetrical. Therefore, the receiver is capable of performing accurate self-position estimation by capturing an image of the transmitter. It is not necessary that all the lightings included in the light emitting unit 10090*d* are each a lighting for visible light communication which changes in luminance for transmitting a visible light signal; it may be that only a part of the lightings is the lighting for visible light communication.

The transmitter may include a light emitting unit 10090*e* and an object 10090*f* illustrated in FIG. 71. The object 10090*f* is an object configured such that its positional relationship with the light emitting unit 10090*e* does not change (e.g. a fire alarm or a pipe). The shape of the combination of the light emitting unit 10090*e* and the object 10090*f* is not rotationally symmetrical. Therefore, the receiver is capable of performing self-position estimation with accuracy by capturing images of the light emitting unit 10090*e* and the object 10090*f*.

Next, time-series processing of the self-position estimation is described.

Every time the receiver captures an image, the receiver can perform the self-position estimation based on the position and the shape of the transmitter in the captured image. As a result, the receiver can estimate a direction and a distance in which the receiver moved while capturing images. Furthermore, the receiver can perform triangulation using frames or images to perform more accurate self-position estimation. By combining the results of estimation using images or the results of estimation using different combinations of images, the receiver is capable of performing the self-position estimation with higher accuracy. At this time, the results of estimation based on the most recently captured images are combined with a high priority, making it possible to perform the self-position estimation with higher accuracy.

Next, skipping read-out of optical black is described.

Figure 72:
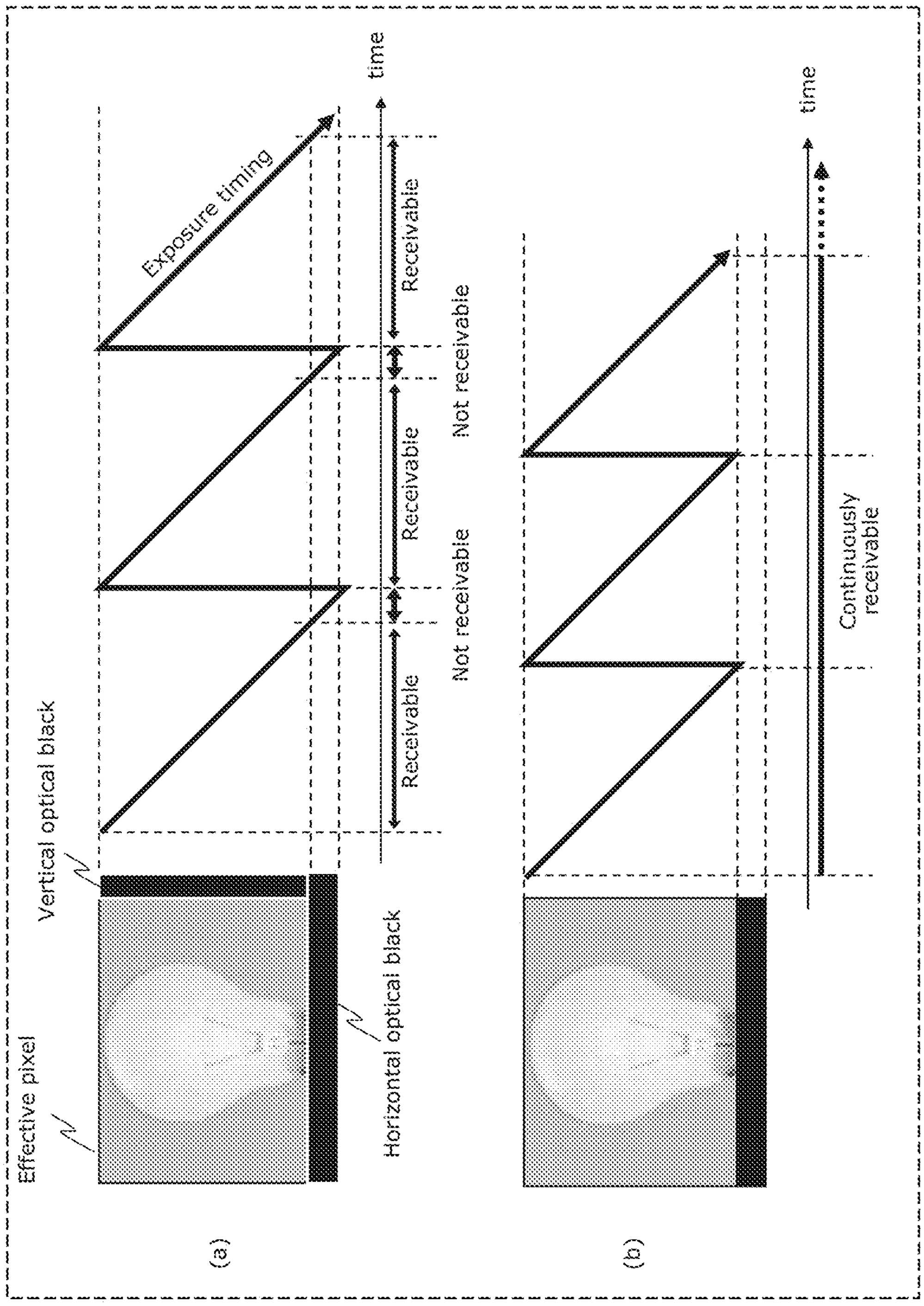
FIG. 72 is a diagram illustrating an example of a reception method in Embodiment 9.

FIG. 72 is a diagram illustrating an example of a reception method in Embodiment 9. In the graph illustrated in FIG. 72, the horizontal axis represents time, and the vertical axis represents a position of each exposure line in the image sensor. A solid arrow in this graph indicates a point in time when exposure of each exposure line in the image sensor starts (an exposure timing).

The receiver reads out a signal of horizontal optical black as illustrated in (a) in FIG. 72 at the time of normal imaging, but can skip reading out a signal of horizontal optical black as illustrated in (b) of FIG. 72. By doing so, it is possible to continuously receive visible light signals.

The horizontal optical black is optical black that extends in the horizontal direction with respect to the exposure line. Vertical optical black is part of the optical black that is other than the horizontal optical black.

The receiver adjusts the black level based on a signal read out from the optical black and therefore, at a start of visible light imaging, can adjust the black level using the optical black as does at the time of normal imaging. Continuous signal reception and black level adjustment are possible when the receiver is designed to adjust the black level using only the vertical optical black if the vertical optical black is usable. The receiver may adjust the black level using the horizontal optical black at predetermined time intervals during continuous visible light imaging. In the case of alternately performing the normal imaging and the visible light imaging, the receiver skips reading out a signal of horizontal optical black when continuously performing the visible light imaging, and reads out a signal of horizontal optical black at a time other than that. The receiver then adjusts the black level based on the read-out signals and thus can adjust the black level while continuously receiving visible light signals. The receiver may adjust the black level assuming that the darkest part of a visible light captured image is black.

Thus, it is possible to continuously receive visible light signals when the optical black from which signals are read out is the vertical optical black only. Furthermore, with a mode for skipping reading out a signal of the horizontal optical black, it is possible to adjust the black level at the time of normal imaging and perform continuous communication according to the need at the time of visible light imaging. Moreover, by skipping reading out a signal of the horizontal optical black, the difference in timing of starting exposure between the exposure lines increases, with the result that a visible light signal can be received even from a transmitter that appears small in the captured image.

Next, an identifier indicating a type of the transmitter is described.

The transmitter may transmit a visible light signal after adding to the visible light signal a transmitter identifier indicating the type of the transmitter. In this case, the receiver is capable of performing a reception operation according to the type of the transmitter at the point in time when the receiver receives the transmitter identifier. For example, when the transmitter identifier indicates a digital signage, the transmitter transmits, as a visible light signal, a content ID indicating which content is currently displayed, in addition to a transmitter ID for individual identification of the transmitter. Based on the transmitter identifier, the receiver can handle these IDs separately to display information associated with the content currently displayed by the transmitter. Furthermore, for example, when the transmitter identifier indicates a digital signage, an emergency light, or the like, the receiver captures an image with increased sensitivity so that reception errors can be reduced.

Embodiment 10

This embodiment describes each example of application using a receiver such as a smartphone and a transmitter for transmitting information as a blink pattern of an LED or an organic EL device in each of the embodiments described above.

A reception method in which data parts having the same addresses are compared is described below.

Figure 73:
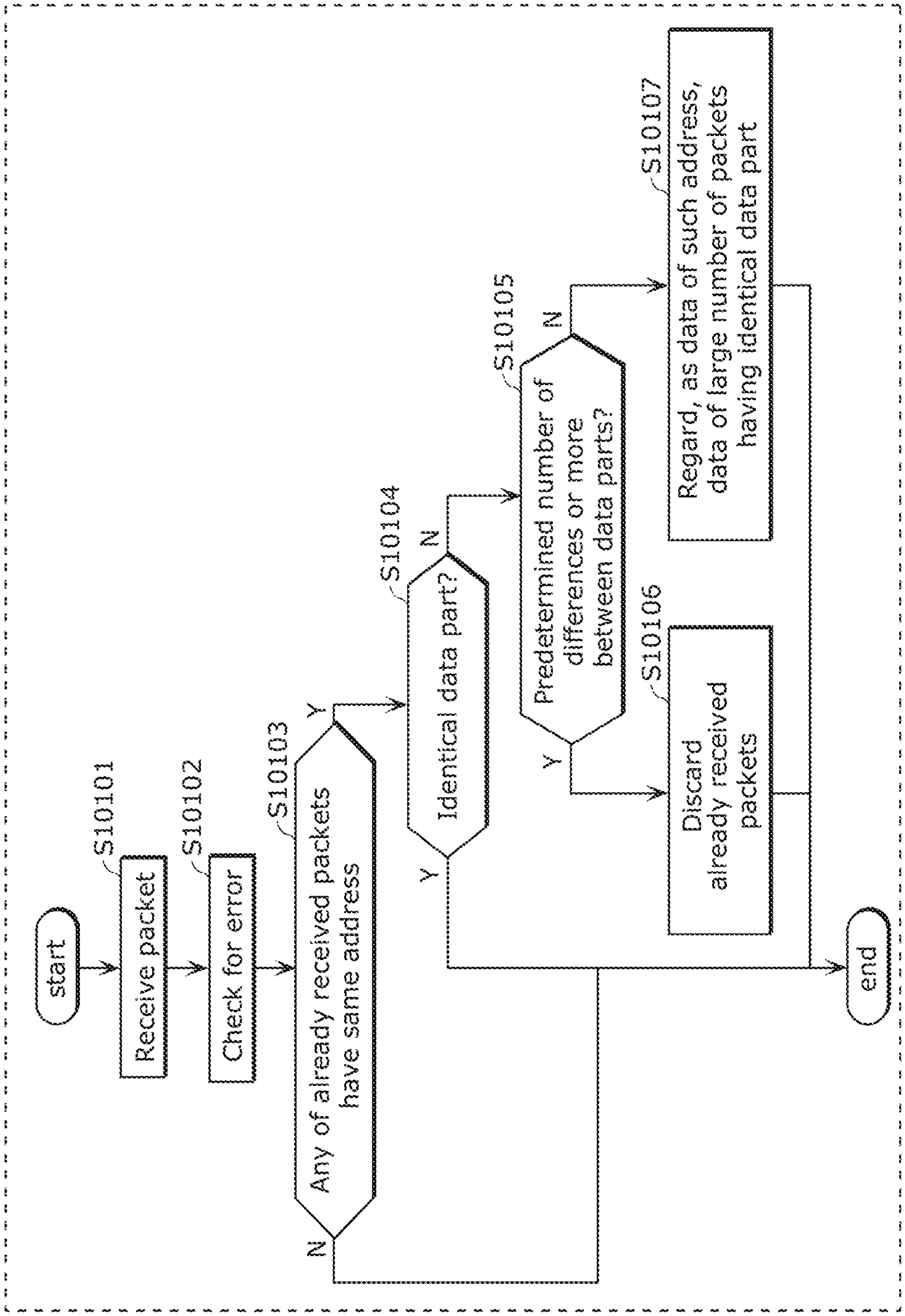
FIG. 73 is a flowchart illustrating an example of a reception method in Embodiment 10.

FIG. 73 is a flowchart illustrating an example of a reception method in this embodiment.

The receiver receives a packet (Step S10101) and performs error correction (Step S10102). The receiver then determines whether or not a packet having the same address as the address of the received packet has already been received (Step S10103). When determining that a packet having the same address has been received (Step S10103: Y), the receiver compares data in these packets. The receiver determines whether or not the data parts are identical (Step S10104). When determining that the data parts are not identical (Step S10104: N), the receiver further determines whether or not the number of differences between the data parts is a predetermined number or more, specifically, whether or not the number of different bits or the number of slots indicating different luminance states is a predetermined number or more (Step S10105). When determining that the number of differences is the predetermined number or more (Step S10105: N), the receiver discards the already received packet (Step S10106). By doing so, when a packet from another transmitter starts being received, interference with the packet received from a previous transmitter can be avoided. In contrast, when determining that the number of differences is not the predetermined number or more (Step S10105: N), the receiver regards, as data of the address, data of the data part of packets having an identical data part, the number of which is largest (Step S10107). Alternatively, the receiver regards identical bits, the number of which is largest, as a value of a bit of the address. Still alternatively, the receiver demodulates data of the address, regarding an identical luminance state, the number of which is largest, as a luminance state of a slot of the address.

Thus, in this embodiment, the receiver first obtains a first packet including the data part and the address part from a pattern of a plurality of bright lines. Next, the receiver determines whether or not at least one packet already obtained before the first packet includes at least one second packet which is a packet including the same address part as the address part of the first packet. Next, when the receiver determines that at least one such second packet is included, the receiver determines whether or not all the data parts in at least one such second packet and the first packet are the same. When the receiver determines that all the data parts are not the same, the receiver determines, for each of at least one such second packet, whether or not the number of parts, among parts included in the data part of the second packet, which are different from parts included in the data part of the first packet, is a predetermined number or more. Here, when at least one such second packet includes the second packet in which the number of different parts is determined as the predetermined number or more, the receiver discards at least one such second packet. When at least one such second packet does not include the second packet in which the number of different parts is determined as the predetermined number or more, the receiver identifies, among the first packet and at least one such second packet, a plurality of packets in which the number of packets having the same data parts is highest. The receiver then obtains at least a part of the visible light identifier (ID) by decoding the data part included in each of the plurality of packets as the data part corresponding to the address part included in the first packet.

With this, even when a plurality of packets having the same address part are received and the data parts in the packets are different, an appropriate data part can be decoded, and thus at least a part of the visible light identifier can be properly obtained. This means that a plurality of packets transmitted from the same transmitter and having the same address part basically have the same data part. However, there are cases where the receiver receives a plurality of packets which have mutually different data parts even with the same address part, when the receiver switches the transmitter serving as a transmission source of packets from one to another. In such a case, in this embodiment, the already received packet (the second packet) is discarded as in Step S10106 in FIG. 73, allowing the data part of the latest packet (the first packet) to be decoded as a proper data part corresponding to the address part therein. Furthermore, even when no such switch of transmitters as mentioned above occurs, there are cases where the data parts in the plurality of packets having the same address part are slightly different, depending on the visible light signal transmitting and receiving status. In such cases, in this embodiment, what is called a decision by the majority as in Step S10107 in FIG. 73 makes it possible to decode a proper data part.

A reception method of demodulating data of the data part based on a plurality of packets is described.

Figure 74:
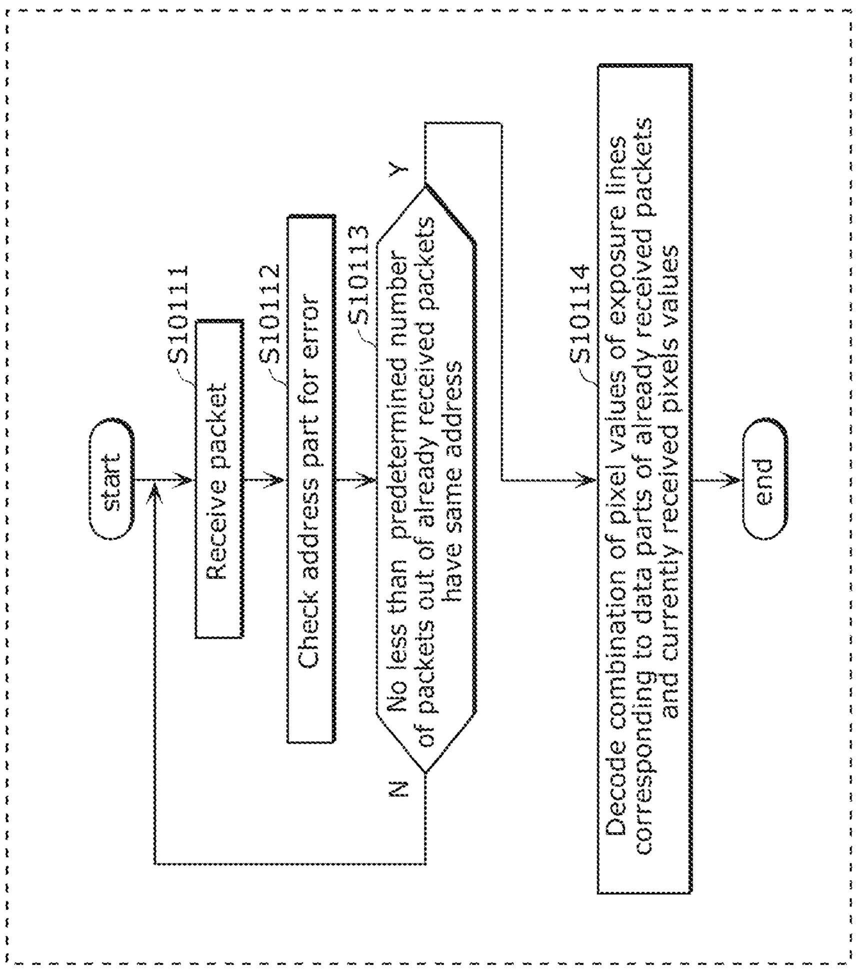
FIG. 74 is a flowchart illustrating an example of a reception method in Embodiment 10.

FIG. 74 is a flowchart illustrating an example of a reception method in this embodiment.

First, the receiver receives a packet (Step S10111) and performs error correction on the address part (Step S10112). Here, the receiver does not demodulate the data part and retains pixel values in the captured image as they are. The receiver then determines whether or not no less than a predetermined number of packets out of the already received packets have the same address (Step S10113). When determining that no less than the predetermined number of packets have the same address (Step S10113: Y), the receiver performs a demodulation process on a combination of pixel values corresponding to the data parts in the packets having the same address (Step S10114).

Thus, in the reception method in this embodiment, a first packet including the data part and the address part is obtained from a pattern of a plurality of bright lines. It is then determined whether or not at least one packet already obtained before the first packet includes no less than a predetermined number of second packets which are each a packet including the same address part as the address part of the first packet. When it is determined that no less than the predetermined number of second packets is included, pixel values of a partial region of a bright line image corresponding to the data parts in no less than the predetermined number of second packets and pixel values of a partial region of a bright line image corresponding to the data part of the first packet are combined. That is, the pixel values are added. A combined pixel value is calculated through this addition, and at least a part of a visible light identifier (ID) is obtained by decoding the data part including the combined pixel value.

Since the packets have been received at different points in time, each of the pixel values for the data parts reflects luminance of the transmitter that is at a slightly different point in time. Therefore, the part subject to the above-described demodulation process will contain a larger amount of data (a larger number of samples) than the data part of a single packet. This makes it possible to demodulate the data part with higher accuracy. Furthermore, the increase in the number of samples makes it possible to demodulate a signal modulated with a higher modulation frequency.

The data part and the error correction code part for the data part are modulated with a higher frequency than the header unit, the address part, and the error correction code part for the address part. In the above-described demodulation method, data following the data part can be demodulated even when the data has been modulated with a high modulation frequency. With this configuration, it is possible to shorten the time for the whole packet to be transmitted, and it is possible to receive a visible light signal with higher speed from far away and from a smaller light source.

Next, a reception method of receiving data of a variable length address is described.

Figure 75:
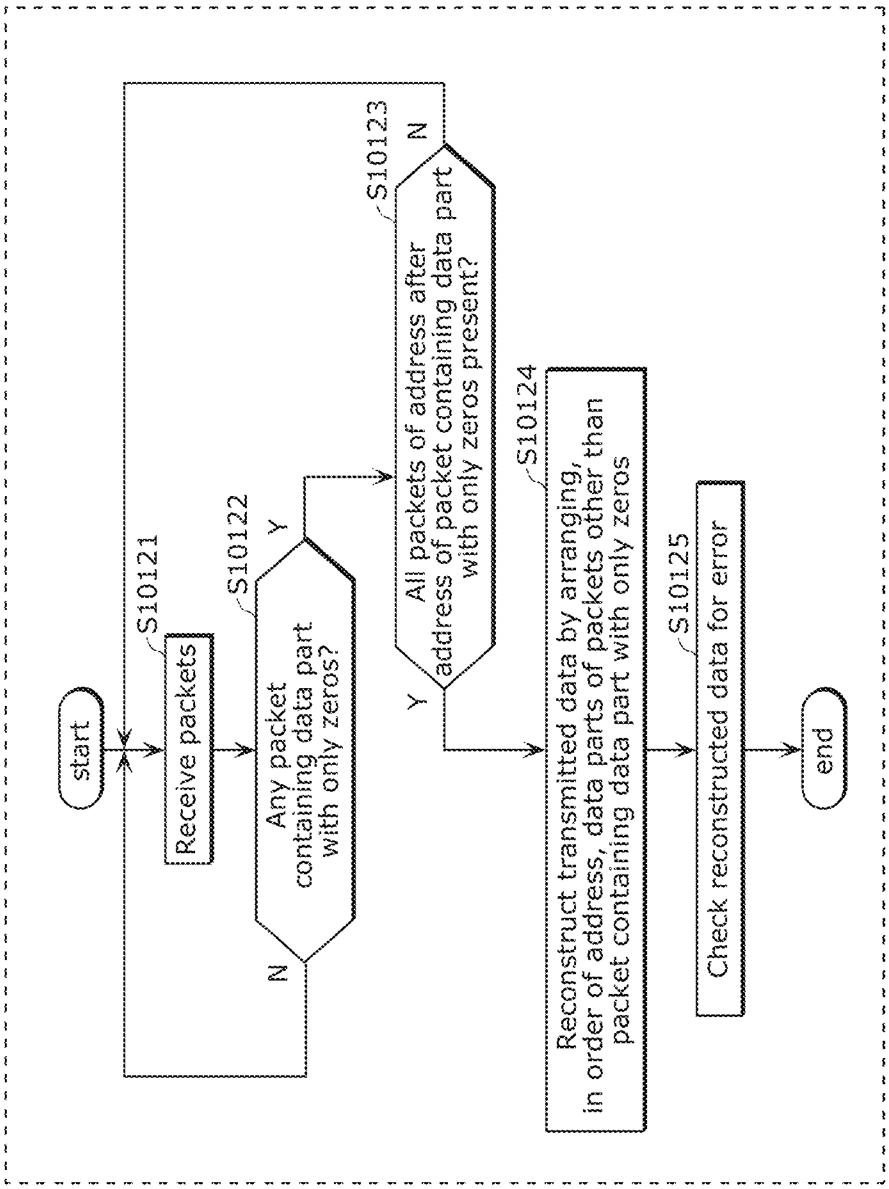
FIG. 75 is a flowchart illustrating an example of a reception method in Embodiment 10.

FIG. 75 is a flowchart illustrating an example of a reception method in this embodiment.

The receiver receives packets (Step S10121), and determines whether or not a packet including the data part in which all the bits are zero (hereinafter referred to as a 0-end packet) has been received (Step S10122). When determining that the packet has been received, that is, when determining that a 0-end packet is present (Step S10122: Y), the receiver determines whether or not all the packets having addresses following the address of the 0-end packet are present, that is, have been received (Step S10123). Note that the address of a packet to be transmitted later among packets generated by dividing data to be transmitted is assigned a larger value. When determining that all the packets have been received (Step S10123: Y), the receiver determines that the address of the 0-end packet is the last address of the packets to be transmitted from the transmitter. The receiver then reconstructs data by combining data of all the packets having the addresses up to the 0-end packet (Step S10124). In addition, the receiver checks the reconstructed data for an error (Step S10125). By doing so, even when it is not known how many parts the data to be transmitted has been divided into, that is, when the address has a variable length rather than a fixed length, data having a variable-length address can be transmitted and received, meaning that it is possible to efficiently transmit and receive more IDs than with data having a fixed-length address.

Thus, in this embodiment, the receiver obtains a plurality of packets each including the data part and the address part from a pattern of a plurality of bright lines. The receiver then determines whether or not the obtained packets include a 0-end packet which is a packet including the data part in which all the bits are 0. When determining that the 0-end packet is included, the receiver determines whether or not the packets include all N associated packets (where N is an integer of 1 or more) which are each a packet including the address part associated with the address part of the 0-end packet. Next, when determining that all the N associated packets are included, the receiver obtains a visible light identifier (ID) by arranging and decoding the data parts in the N associated packets. Here, the address part associated with the address part of the 0-end packet is an address part representing an address greater than or equal to 0 and smaller than the address represented by the address part of the 0-end packet.

Next, a reception method using an exposure time longer than a period of a modulation frequency is described.

Figure 76:
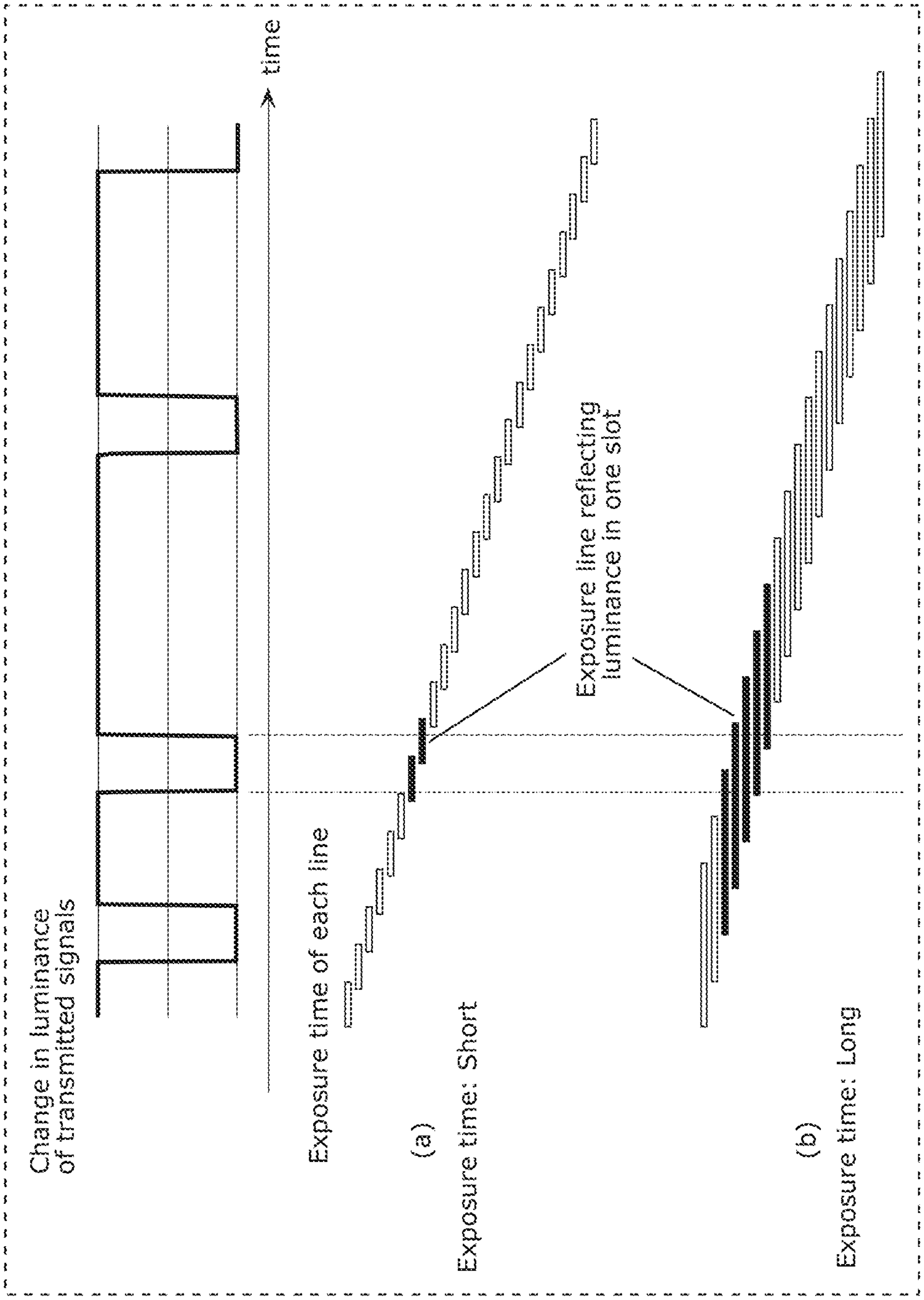
FIG. 76 is a diagram for describing a reception method in which a receiver in Embodiment 10 uses an exposure time longer than a period of a modulation frequency (a modulation period)
Figure 77:
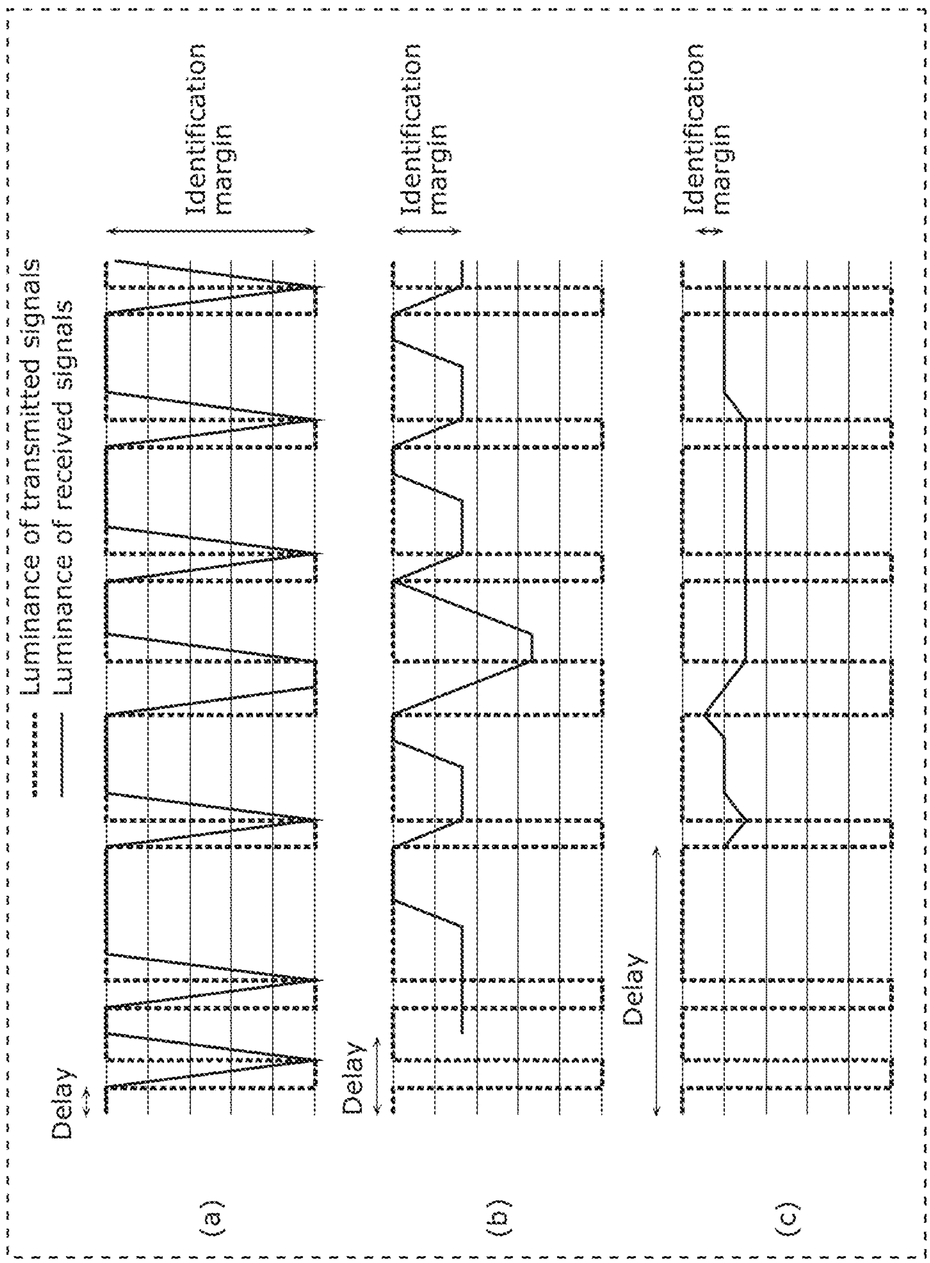
FIG. 77 is a diagram for describing a reception method in which a receiver in Embodiment 10 uses an exposure time longer than a period of a modulation frequency (a modulation period)

FIGS. 76 and 77 are each a diagram for describing a reception method in which a receiver in this embodiment uses an exposure time longer than a period of a modulation frequency (a modulation period).

For example, as illustrated in (a) in FIG. 76, there is a case where the visible light signal cannot be properly received when the exposure time is set to time equal to a modulation period. Note that the modulation period is a length of time for one slot described above. Specifically, in such a case, the number of exposure lines that reflect a luminance state in a particular slot (black exposure lines in FIG. 76) is small. As a result, when there happens to be much noise in pixel values of these exposure lines, it is difficult to estimate luminance of the transmitter.

In contrast, the visible light signal can be properly received when the exposure time is set to time longer than the modulation period as illustrated in (b) in FIG. 76, for example. Specifically, in such a case, the number of exposure lines that reflect luminance in a particular slot is large, and therefore it is possible to estimate luminance of the transmitter based on pixel values of a large number of exposure lines, resulting in high resistance to noise.

However, when the exposure time is too long, the visible light signal cannot be properly received.

For example, as illustrated in (a) in FIG. 77, when the exposure time is equal to the modulation period, a luminance change (that is, a change in pixel value of each exposure line) received by the receiver follows a luminance change used in the transmission. However, as illustrated in (b) in FIG. 77, when the exposure time is three times as long as the modulation period, a luminance change received by the receiver cannot fully follow a luminance change used in the transmission. Furthermore, as illustrated in (c) in FIG. 77, when the exposure time is 10 times as long as the modulation period, a luminance change received by the receiver cannot at all follow a luminance change used in the transmission. To sum up, when the exposure time is longer, luminance can be estimated based on a larger number of exposure lines and therefore noise resistance increases, but a longer exposure time causes a reduction in identification margin or a reduction in the noise resistance due to the reduced identification margin. Considering the balance between these effects, the exposure time is set to time that is approximately two to five times as long as the modulation period, so that the highest noise resistance can be obtained.

Next, the number of packets after division is described.

Figure 78:
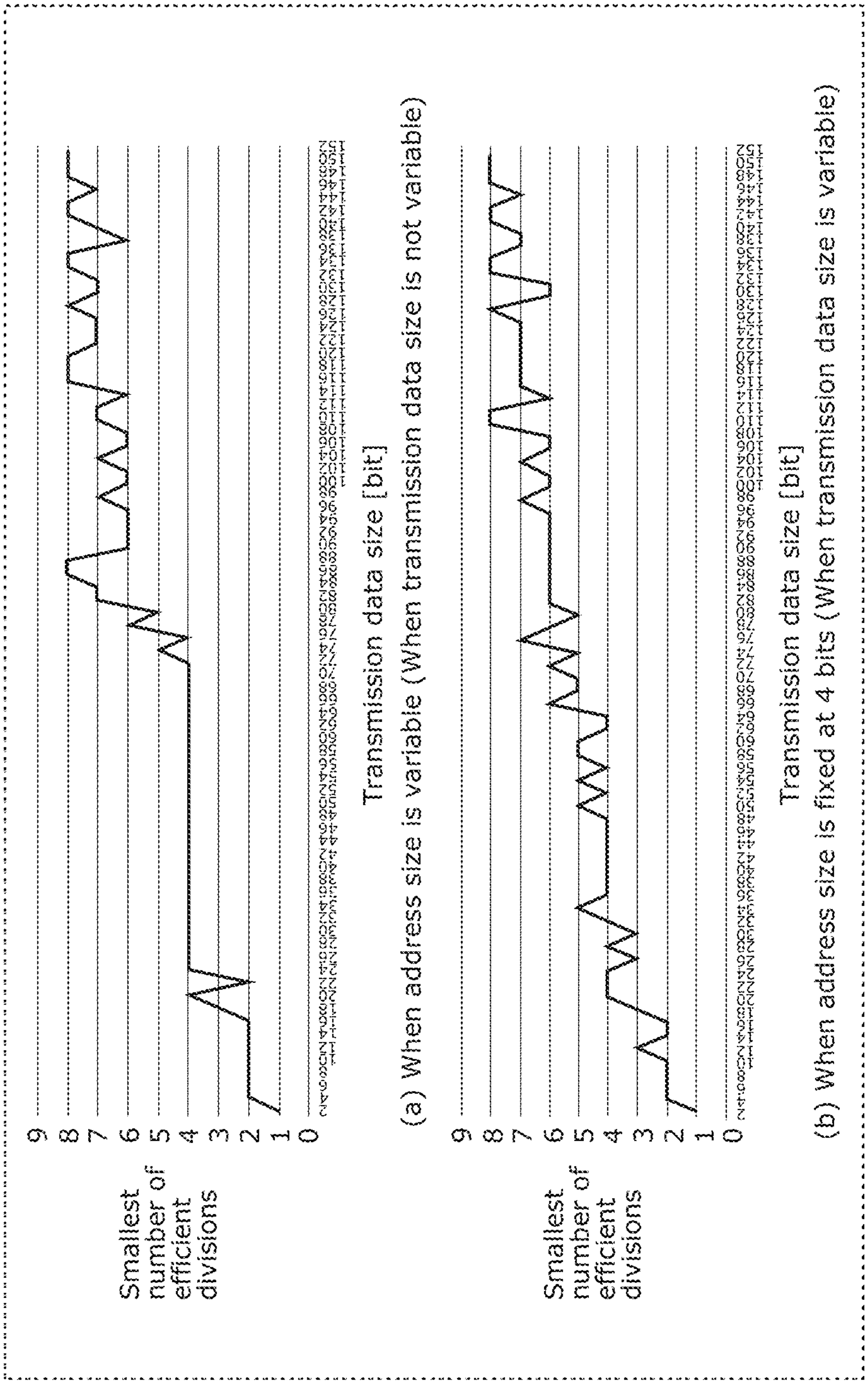
FIG. 78 is a diagram indicating an efficient number of divisions relative to a size of transmission data in Embodiment 10.

FIG. 78 is a diagram indicating an efficient number of divisions relative to a size of transmission data.

When the transmitter transmits data by changing in luminance, the data size of one packet will be large if all pieces of data to be transmitted (transmission data) are included in the packet. However, when the transmission data is divided into data parts and each of these data parts is included in a packet, the data size of the packet is small. The receiver receives this packet by imaging. As the data size of the packet increases, the receiver has more difficulty in receiving the packet in a single imaging operation, and needs to repeat the imaging operation.

Therefore, it is desirable that as the data size of the transmission data increases, the transmitter increase the number of divisions in the transmission data as illustrated in (a) and (b) in FIG. 78. However, when the number of divisions is too large, the transmission data cannot be reconstructed unless all the data parts are received, resulting in lower reception efficiency.

Therefore, as illustrated in (a) in FIG. 78, when the data size of the address (address size) is variable and the data size of the transmission data is 2 to 16 bits, 16 to 24 bits, 24 to 64 bits, 66 to 78 bits, 78 bits to 128 bits, and 128 bits or more, the transmission data is divided into 1 to 2, 2 to 4, 4, 4 to 6, 6 to 8, and 7 or more data parts, respectively, so that the transmission data can be efficiently transmitted in the form of visible light signals. As illustrated in (b) in FIG. 78, when the data size of the address (address size) is fixed to 4 bits and the data size of the transmission data is 2 to 8 bits, 8 to 16 bits, 16 to 30 bits, 30 to 64 bits, 66 to 80 bits, 80 to 96 bits, 96 to 132 bits, and 132 bits or more, the transmission data is divided into 1 to 2, 2 to 3, 2 to 4, 4 to 5, 4 to 7, 6, 6 to 8, and 7 or more data parts, respectively, so that the transmission data can be efficiently transmitted in the form of visible light signals.

The transmitter sequentially changes in luminance based on packets containing respective ones of the data parts. For example, according to the sequence of the addresses of packets, the transmitter changes in luminance based on the packets. Furthermore, the transmitter may change in luminance again based on data parts of the packets according to a sequence different from the sequence of the addresses. This allows the receiver to reliably receive each of the data parts.

Next, a method of setting a notification operation by the receiver is described.

Figure 79A:
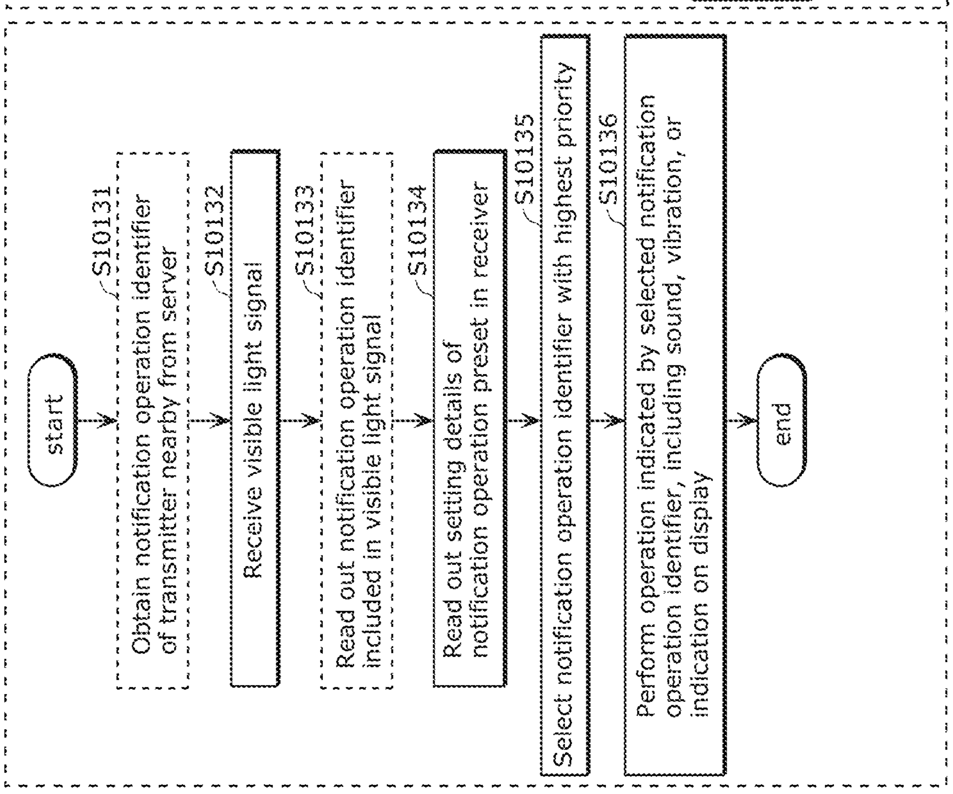
FIG. 79A is a diagram illustrating an example of a setting method in Embodiment 10.

FIG. 79A is a diagram illustrating an example of a setting method in this embodiment.

First, the receiver obtains, from a server near the receiver, a notification operation identifier for identifying a notification operation and a priority of the notification operation identifier (specifically, an identifier indicating the priority) (Step S10131). The notification operation is an operation of the receiver to notify a user using the receiver that packets containing data parts have been received, when the packets have been transmitted by way of luminance change and then received by the receiver. For example, this operation is making sound, vibration, indication on a display, or the like.

Next, the receiver receives packetized visible light signals, that is, packets containing respective data parts (Step S10132). The receiver obtains a notification operation identifier and a priority of the notification operation identifier (specifically, an identifier indicating the priority) which are included in the visible light signals (Step S10133).

Furthermore, the receiver reads out setting details of a current notification operation of the receiver, that is, a notification operation identifier preset in the receiver and a priority of the notification operation identifier (specifically, an identifier indicating the priority) (Step S10134). Note that the notification operation identifier preset in the receiver is one set by an operation by a user, for example.

The receiver then selects an identifier having the highest priority from among the preset notification operation identifier and the notification operation identifiers respectively obtained in Step S10131 and Step S10133 (Step S10135). Next, the receiver sets the selected notification operation identifier in the receiver itself to operate as indicated by the selected notification operation identifier, notifying a user of the reception of the visible light signals (Step S10136).

Note that the receiver may skip one of Step S10131 and Step S10133 and select a notification operation identifier with a higher priority from among two notification operation identifiers.

Note that a high priority may be assigned to a notification operation identifier transmitted from a server installed in a theater, a museum, or the like, or a notification operation identifier included in the visible light signal transmitted inside these facilities. With this, it can be made possible that sound for receipt notification is not played inside the facilities regardless of settings set by a user. In other facilities, a low priority is assigned to the notification operation identifier so that the receiver can operate according to settings set by a user to notify a user of signal reception.

Figure 79B:
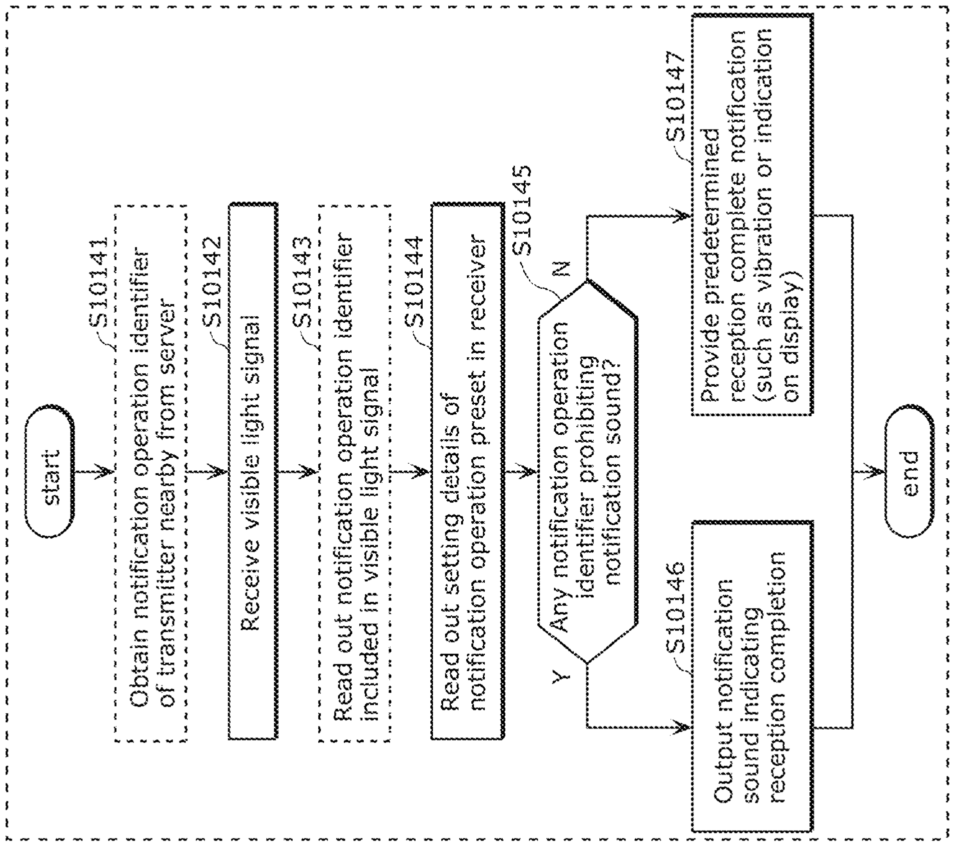
FIG. 79B is a diagram illustrating another example of a setting method in Embodiment 10.

FIG. 79B is a diagram illustrating an example of a setting method in this embodiment.

First, the receiver obtains, from a server near the receiver, a notification operation identifier for identifying a notification operation and a priority of the notification operation identifier (specifically, an identifier indicating the priority) (Step S10141). Next, the receiver receives packetized visible light signals, that is, packets containing respective data parts (Step S10142). The receiver obtains a notification operation identifier and a priority of the notification operation identifier (specifically, an identifier indicating the priority) which are included in the visible light signals (Step S10143).

Furthermore, the receiver reads out setting details of a current notification operation of the receiver, that is, a notification operation identifier preset in the receiver and a priority of the notification operation identifier (specifically, an identifier indicating the priority) (Step S10144).

The receiver then determines whether or not an operation notification identifier indicating an operation that prohibits notification sound reproduction is included in the preset notification operation identifier and the notification operation identifiers respectively obtained in Step S10141 and Step S10143 (Step S10145). When determining that the operation notification identifier is included (Step S10145: Y), the receiver outputs a notification sound for notifying a user of completion of the reception (Step S10146). In contrast, when determining that the operation notification identifier is not included (Step S10145: N), the receiver notifies a user of completion of the reception by vibration, for example (Step S10147).

Note that the receiver may skip one of Step S10141 and Step S10143 and determine whether or not an operation notifying identifier indicating an operation that prohibits notification sound reproduction is included in two notification operation identifiers.

Furthermore, the receiver may perform self-position estimation based on a captured image and notify a user of the reception by an operation associated with the estimated position or facilities located at the estimated position.

Figure 80:
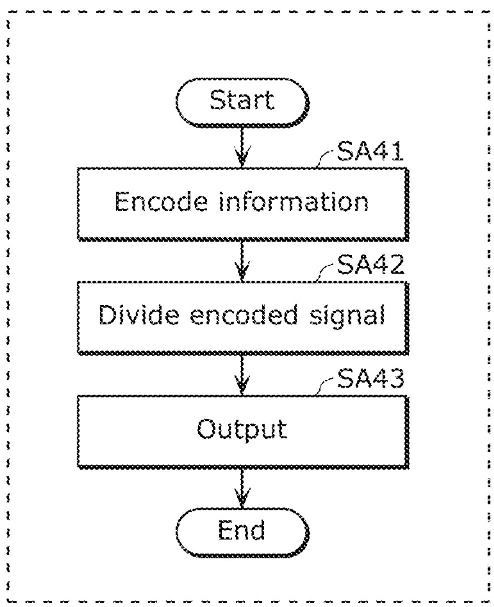
FIG. 80 is a flowchart illustrating processing of an image processing program in Embodiment 10.

FIG. 80 is a flowchart illustrating processing of an image processing program in Embodiment 10.

This information processing program is a program for causing the light emitter of the above-described transmitter to change in luminance according to the number of divisions illustrated in FIG. 78.

In other words, this information processing program is an information processing program that causes a computer to process information to be transmitted, in order for the information to be transmitted by way of luminance change. In detail, this information processing program causes a computer to execute: an encoding step SA41 of encoding the information to generate an encoded signal; a dividing step SA42 of dividing the encoded signal into four signal parts when a total number of bits in the encoded signal is in a range of 24 bits to 64 bits; and an output step SA43 of sequentially outputting the four signal parts. Note that each of these signal parts is output in the form of the packet. Furthermore, this information processing program may cause a computer to identify the number of bits in the encoded signal and determine the number of signal parts based on the identified number of bits. In this case, the information processing program causes the computer to divide the encoded signal into the determined number of signal parts.

Thus, when the number of bits in the encoded signal is in the range of 24 bits to 64 bits, the encoded signal is divided into four signal parts, and the four signal parts are output. As a result, the light emitter changes in luminance according to the outputted four signal parts, and these four signal parts are transmitted in the form of visible light signals and received by the receiver. As the number of bits in an output signal increases, the level of difficulty for the receiver to properly receive the signal by imaging increases, meaning that the reception efficiency is reduced. Therefore, it is desirable that the signal have a small number of bits, that is, a signal be divided into small signals. However, when a signal is too finely divided into many small signals, the receiver cannot receive the original signal unless it receives all the small signals individually, meaning that the reception efficiency is reduced. Therefore, when the number of bits in the encoded signal is in the range of 24 bits to 64 bits, the encoded signal is divided into four signal parts and the four signal parts are sequentially output as described above. By doing so, the encoded signal representing the information to be transmitted can be transmitted in the form of a visible light signal with the best reception efficiency. As a result, it is possible to enable communication between various devices.

In the output step SA43, it may be that the four signal parts are output in a first sequence and then, the four signal parts are output in a second sequence different from the first sequence.

By doing so, since these four signals parts are repeatedly output in different sequences, these four signal parts can be received with still higher efficiency when each of the output signals is transmitted to the receiver in the form of a visible light signal. In other words, if the four signal parts are repeatedly output in the same sequence, there are cases where the receiver fails to receive the same signal part, but it is possible to reduce these cases by changing the output sequence.

Furthermore, the four signal parts may be each assigned with a notification operation identifier and output in the output step SA43 as indicated in FIGS. 79A and 79B. The notification operation identifier is an identifier for identifying an operation of the receiver by which a user using the receiver is notified that the four signal parts have been received when the four signal parts have been transmitted by way of luminance change and received by the receiver.

With this, in the case where the notification operation identifier is transmitted in the form of a visible light signal and received by the receiver, the receiver can notify a user of the reception of the four signal parts according to an operation identified by the notification operation identifier. This means that a transmitter that transmits information to be transmitted can set a notification operation to be performed by a receiver.

Furthermore, the four signal parts may be each assigned with a priority identifier for identifying a priority of the notification operation identifier and output in the output step SA43 as indicated in FIGS. 79A and 79B.

With this, in the case where the priority identifier and the notification operation identifier are transmitted in the form of visible light signals and received by the receiver, the receiver can handle the notification operation identifier according to the priority identified by the priority identifier. This means that when the receiver obtained another notification operation identifier, the receiver can select, based on the priority, one of the notification operation identified by the notification operation identifier transmitted in the form of the visible light signal and the notification operation identified by the other notification operation identifier.

An image processing program according to an aspect of the present disclosure is an image processing program that causes a computer to process information to be transmitted, in order for the information to be transmitted by way of luminance change, and causes the computer to execute: an encoding step of encoding the information to generate an encoded signal; a dividing step of dividing the encoded signal into four signal parts when a total number of bits in the encoded signal is in a range of 24 bits to 64 bits; and an output step of sequentially outputting the four signal parts.

Thus, as illustrated in FIG. 77 to FIG. 80, when the number of bits in the encoded signal is in the range of 24 bits to 64 bits, the encoded signal is divided into four signal parts, and the four signal parts are output. As a result, the light emitter changes in luminance according to the outputted four signal parts, and these four signal parts are transmitted in the form of visible light signals and received by the receiver. As the number of bits in an output signal increases, the level of difficulty for the receiver to properly receive the signal by imaging increases, meaning that the reception efficiency is reduced. Therefore, it is desirable that the signal have a small number of bits, that is, a signal be divided into small signals. However, when a signal is too finely divided into many small signals, the receiver cannot receive the original signal unless it receives all the small signals individually, meaning that the reception efficiency is reduced. Therefore, when the number of bits in the encoded signal is in the range of 24 bits to 64 bits, the encoded signal is divided into four signal parts and the four signal parts are sequentially output as described above. By doing so, the encoded signal representing the information to be transmitted can be transmitted in the form of a visible light signal with the best reception efficiency. As a result, it is possible to enable communication between various devices.

Furthermore, in the output step, the four signal parts may be output in a first sequence and then, the four signal parts may be output in a second sequence different from the first sequence.

By doing so, since these four signals parts are repeatedly output in different sequences, these four signal parts can be received with still higher efficiency when each of the output signals is transmitted to the receiver in the form of a visible light signal. In other words, if the four signal parts are repeatedly output in the same sequence, there are cases where the receiver fails to receive the same signal part, but it is possible to reduce these cases by changing the output sequence.

Furthermore, in the output step, the four signal parts may further be each assigned with a notification operation identifier and output, and the notification operation identifier may be an identifier for identifying an operation of the receiver by which a user using the receiver is notified that the four signal parts have been received when the four signal parts have been transmitted by way of luminance change and received by the receiver.

With this, in the case where the notification operation identifier is transmitted in the form of a visible light signal and received by the receiver, the receiver can notify a user of the reception of the four signal parts according to an operation identified by the notification operation identifier. This means that a transmitter that transmits information to be transmitted can set a notification operation to be performed by a receiver.

Furthermore, in the output step, the four signal parts may further be each assigned with a priority identifier for identifying a priority of the notification operation identifier and output.

With this, in the case where the priority identifier and the notification operation identifier are transmitted in the form of visible light signals and received by the receiver, the receiver can handle the notification operation identifier according to the priority identified by the priority identifier. This means that when the receiver obtained another notification operation identifier, the receiver can select, based on the priority, one of the notification operation identified by the notification operation identifier transmitted in the form of the visible light signal and the notification operation identified by the other notification operation identifier.

Next, registration of a network connection of an electronic device is described.

Figure 81:
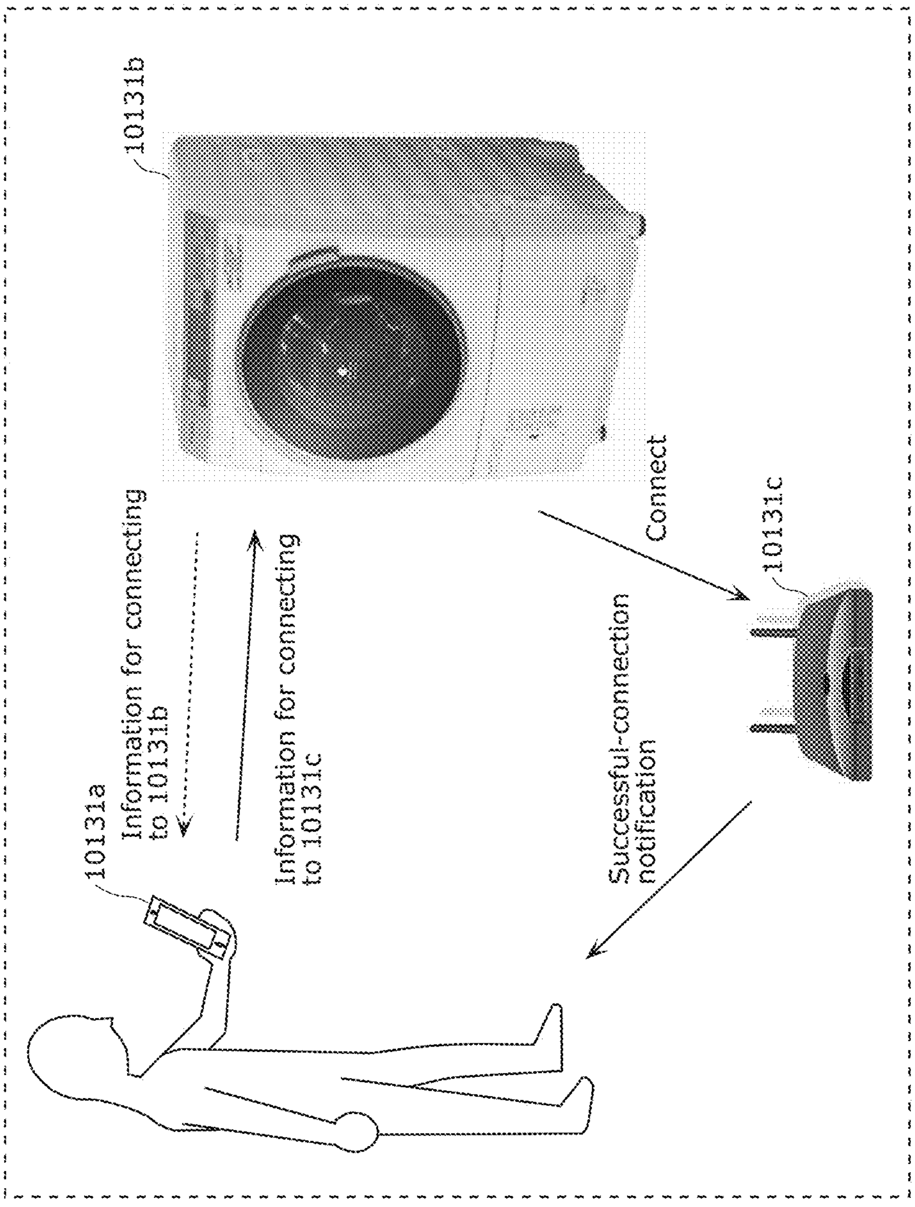
FIG. 81 is a diagram for describing an example of application of a transmission and reception system in Embodiment 10.

FIG. 81 is a diagram for describing an example of application of a transmission and reception system in this embodiment.

This transmission and reception system includes: a transmitter 10131*b* configured as an electronic device such as a washing machine, for example; a receiver 10131*a* configured as a smartphone, for example, and a communication device 10131*c* configured as an access point or a router.

Figure 82:
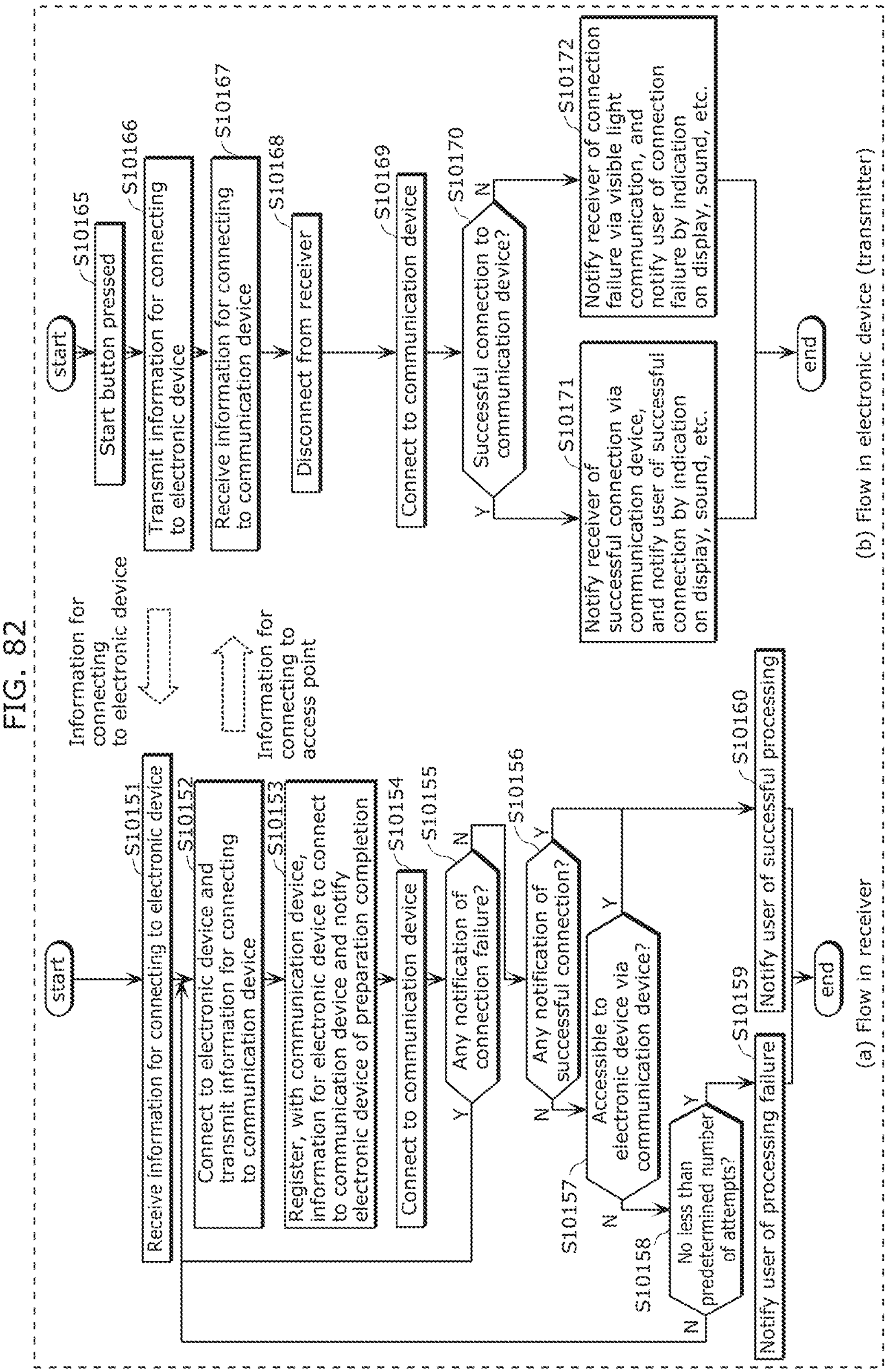
FIG. 82 is a flowchart illustrating processing operation of a transmission and reception system in Embodiment 10.

FIG. 82 is a flowchart illustrating processing operation of a transmission and reception system in this embodiment.

When a start button is pressed (Step S10165), the transmitter 10131*b* transmits, via Wi-Fi, Bluetooth®, Ethernet®, or the like, information for connecting to the transmitter itself, such as SSID, password, IP address, MAC address, or decryption key (Step S10166), and then waits for connection. The transmitter 10131*b* may directly transmit these pieces of information, or may indirectly transmit these pieces of information. In the case of indirectly transmitting these pieces of information, the transmitter 10131*b* transmits ID associated with these pieces of information. When the receiver 10131*a* receives the ID, the receiver 10131*a* then downloads, from a server or the like, information associated with the ID, for example.

The receiver 10131*a* receives the information (Step S10151), connects to the transmitter 10131*b*, and transmits to the transmitter 10131*b* information for connecting to the communication device 10131*c* configured as an access point or a router (such as SSID, password, IP address, MAC address, or decryption key) (Step S10152). The receiver 10131*a* registers, with the communication device 10131*c*, information for the transmitter 10131*b* to connect to the communication device 10131*c* (such as MAC address, IP address, or decryption key), to have the communication device 10131*c* wait for connection. Furthermore, the receiver 10131*a* notifies the transmitter 10131*b* that preparation for connection from the transmitter 10131*b* to the communication device 10131*c* has been completed (Step S10153).

The transmitter 10131*b* disconnects from the receiver 10131*a* (Step S10168) and connects to the communication device 10131*c* (Step S10169). When the connection is successful (Step S10170: Y), the transmitter 10131*b* notifies the receiver 10131*a* that the connection is successful, via the communication device 10131*c*, and notifies a user that the connection is successful, by an indication on the display, an LED state, sound, or the like (Step S10171). When the connection fails (Step S10170: N), the transmitter 10131*b* notifies the receiver 10131*a* that the connection fails, via the visible light communication, and notifies a user that the connection fails, using the same means as in the case where the connection is successful (Step S10172). Note that the visible light communication may be used to notify that the connection is successful.

The receiver 10131*a* connects to the communication device 10131*c* (Step S10154), and when the notifications to the effect that the connection is successful and that the connection fails (Step S10155: N and Step S10156: N) are absent, the receiver 10131*a* checks whether or not the transmitter 10131*b* is accessible via the communication device 10131*c* (Step S10157). When the transmitter 10131*b* is not accessible (Step S10157: N), the receiver 10131*a* determines whether or not no less than a predetermined number of attempts to connect to the transmitter 10131*b* using the information received from the transmitter 10131*b* have been made (Step S10158). When determining that the number of attempts is less than the predetermined number (Step S10158: N), the receiver 10131*a* repeats the processes following Step S10152. In contrast, when the number of attempts is no less than the predetermined number (Step S10158: Y), the receiver 10131*a* notifies a user that the processing fails (Step S10159). When determining in Step S10156 that the notification to the effect that the connection is successful is present (Step S10156: Y), the receiver 10131*a* notifies a user that the processing is successful (Step S10160). Specifically, using an indication on the display, sound, or the like, the receiver 10131*a* notifies a user whether or not the connection from the transmitter 10131*b* to the communication device 10131*c* has been successful. By doing so, it is possible to connect the transmitter 10131*b* to the communication device 10131*c* without requiring for cumbersome input from a user.

Next, registration of a network connection of an electronic device (in the case of connection via another electronic device) is described.

Figure 83:
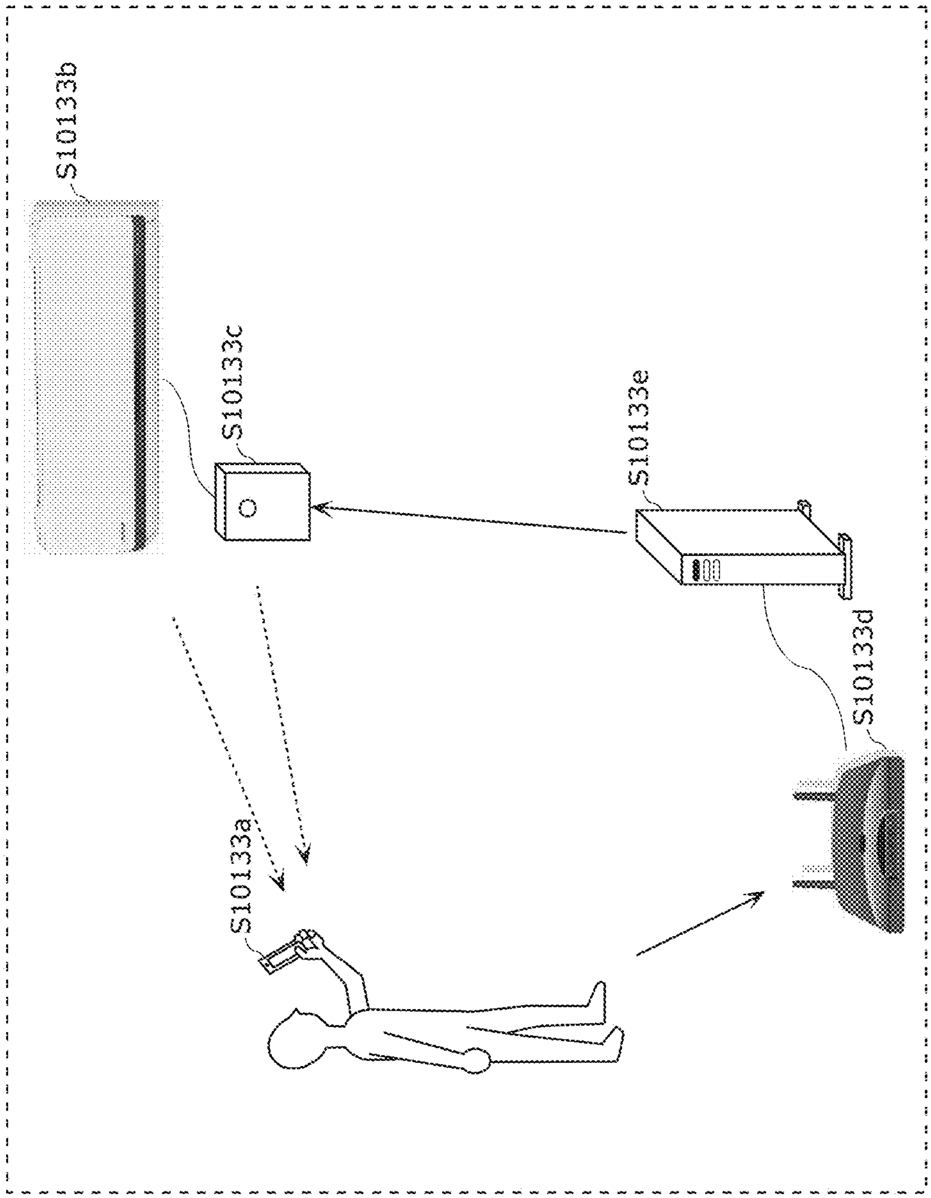
FIG. 83 is a diagram for describing an example of application of a transmission and reception system in Embodiment 10.

FIG. 83 is a diagram for describing an example of application of a transmission and reception system in this embodiment.

This transmission and reception system includes: an air conditioner 10133*b*; a transmitter 10133*c* configured as an electronic device such as a wireless adaptor or the like connected to the air conditioner 10133*b*; a receiver 10133*a* configured as a smartphone, for example; a communication device 10133*d* configured as an access point or a router; and another electronic device 10133*e* configured as a wireless adaptor, a wireless access point, a router, or the like, for example.

Figure 84:
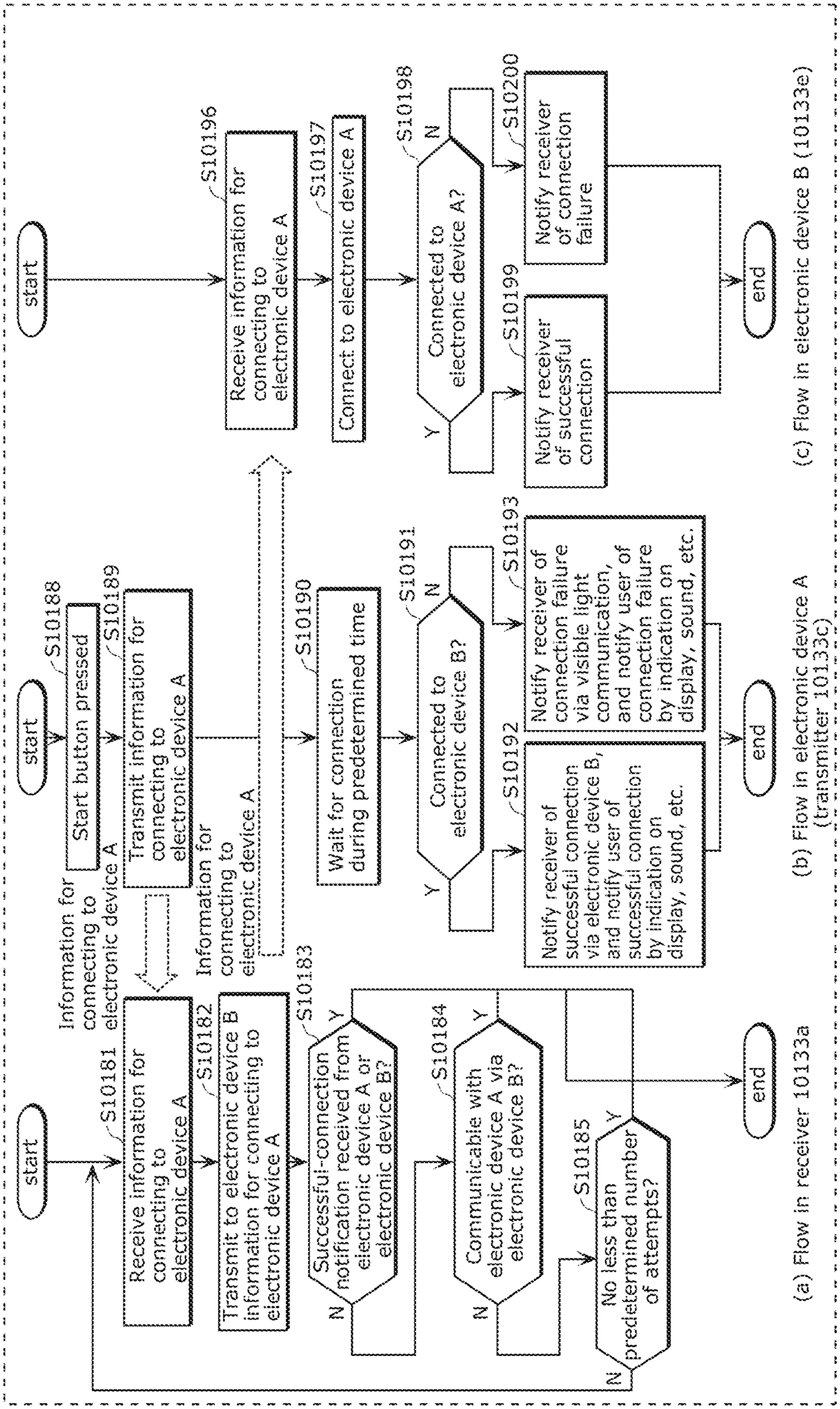
FIG. 84 is a flowchart illustrating processing operation of a transmission and reception system in Embodiment 10.

FIG. 84 is a flowchart illustrating processing operation of a transmission and reception system in this embodiment. Hereinafter, the air conditioner 10133*b* or the transmitter 10133*c* is referred to as an electronic device A, and the electronic device 10133*e* is referred to as an electronic device B.

First, when a start button is pressed (Step S10188), the electronic device A transmits information for connecting to the electronic device A itself (such as individual ID, password, IP address, MAC address, or decryption key) (Step S10189), and then waits for connection (Step S10190). The electronic device A may directly transmit these pieces of information, or may indirectly transmit these pieces of information, in the same manner as described above.

The receiver 10133*a* receives the information from the electronic device A (Step S10181) and transmits the information to the electronic device B (Step S10182). When the electronic device B receives the information (Step S10196), the electronic device B connects to the electronic device A according to the received information (Step S10197). The electronic device B determines whether or not connection to the electronic device A has been established (Step S10198), and notifies the receiver 10133*a* of the result (Step S10199 or Step S101200).

When the connection to the electronic device B is established within a predetermine time (Step S10191: Y), the electronic device A notifies the receiver 10133*a* that the connection is successful, via the electronic device B (Step S10192), and when the connection fails (Step S10191: N), the electronic device A notifies the receiver 10133*a* that the connection fails, via the visible light communication (Step S10193). Furthermore, using an indication on the display, a light emitting state, sound, or the like, the electronic device A notifies a user whether or not the connection is successful. By doing so, it is possible to connect the electronic device A (the transmitter 10133*c*) to the electronic device B (the electronic device 10133*e*) without requiring for cumbersome input from a user. Note that the air conditioner 10133*b* and the transmitter 10133*c* illustrated in FIG. 83 may be integrated together and likewise, the communication device 10133*d* and the electronic device 10133*e* illustrated in FIG. 283 may be integrated together.

Next, transmission of proper imaging information is described.

Figure 85:
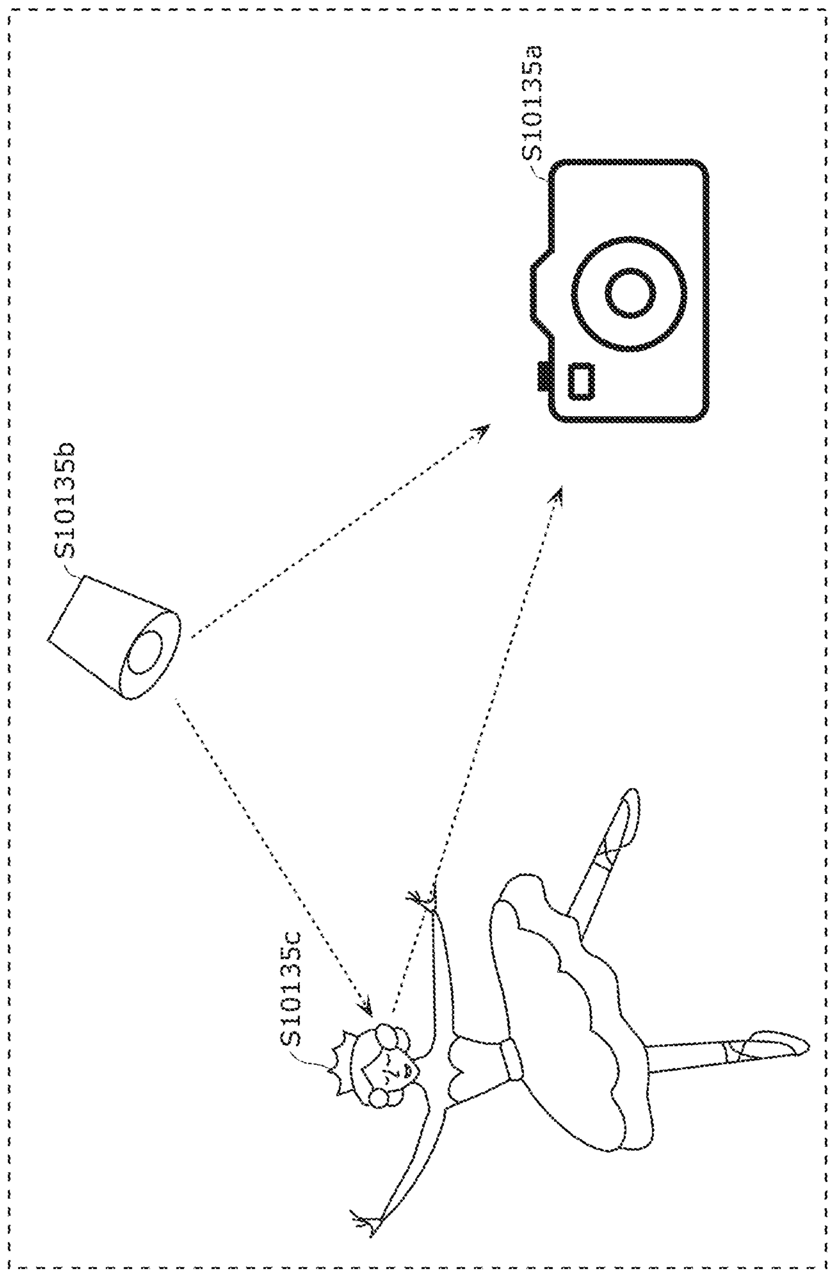
FIG. 85 is a diagram for describing an example of application of a transmission and reception system in Embodiment 10.

FIG. 85 is a diagram for describing an example of application of a transmission and reception system in this embodiment.

This transmission and reception system includes: a receiver 10135*a* configured as a digital still camera or a digital video camera, for example; and a transmitter 10135*b* configured as a lighting, for example.

Figure 86:
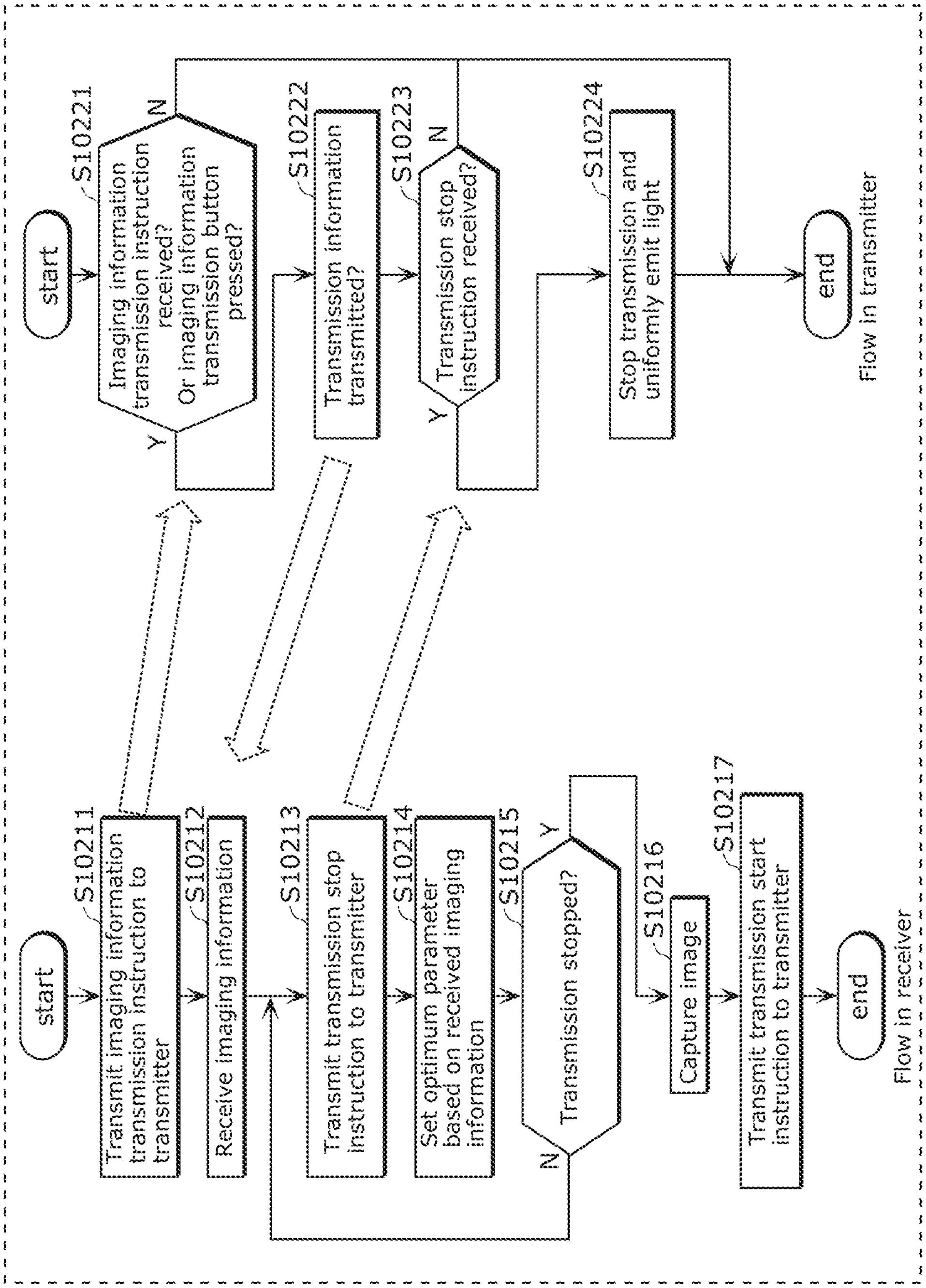
FIG. 86 is a flowchart illustrating processing operation of a transmission and reception system in Embodiment 10.

FIG. 86 is a flowchart illustrating processing operation of a transmission and reception system in this embodiment.

First, the receiver 10135*a* transmits an imaging information transmission instruction to the transmitter 10135*b* (Step S10211). Next, when the transmitter 10135*b* receives the imaging information transmission instruction, when an imaging information transmission button is pressed, when an imaging information transmission switch is ON, or when a power source is turned ON (Step S10221: Y), the transmitter 10135*b* transmits imaging information (Step S10222). The imaging information transmission instruction is an instruction to transmit imaging information. The imaging information indicates a color temperature, a spectrum distribution, illuminance, or luminous intensity distribution of a lighting, for example. The transmitter 10135*b* may directly transmit the imaging information, or may indirectly transmit the imaging information. In the case of indirectly transmitting the imaging information, the transmitter 10135*b* transmits ID associated with the imaging information. When the receiver 10135*a* receives the ID, the receiver 10135*a* then downloads, from a server or the like, the imaging information associated with the ID, for example. At this time, the transmitter 10135*b* may transmit a method for transmitting a transmission stop instruction to the transmitter 10135*b* itself (e.g. a frequency of radio waves, infrared rays, or sound waves for transmitting a transmission stop instruction, or SSID, password, or IP address for connecting to the transmitter 10135*b* itself).

When the receiver 10135*a* receives the imaging information (Step S10212), the receiver 10135*a* transmits the transmission stop instruction to the transmitter 10135*b* (Step S10213). When the transmitter 10135*b* receives the transmission stop instruction from the receiver 10135*a* (Step S10223), the transmitter 10135*b* stops transmitting the imaging information and uniformly emits light (Step S10224).

Furthermore, the receiver 10135*a* sets an imaging parameter according to the imaging information received in Step S10212 (Step S10214) or notifies a user of the imaging information. The imaging parameter is, for example, white balance, an exposure time, a focal length, sensitivity, or a scene mode. With this, it is possible to capture an image with optimum settings according to a lighting. Next, after the transmitter 10135*b* stops transmitting the imaging information (Step S10215: Y), the receiver 10135*a* captures an image (Step S10216). Thus, it is possible to capture an image while a subject does not change in brightness for signal transmission. Note that after Step S10216, the receiver 10135*a* may transmit to the transmitter 10135*b* a transmission start instruction to request to start transmission of the imaging information (Step S10217).

Next, an indication of a state of charge is described.

Figure 87:
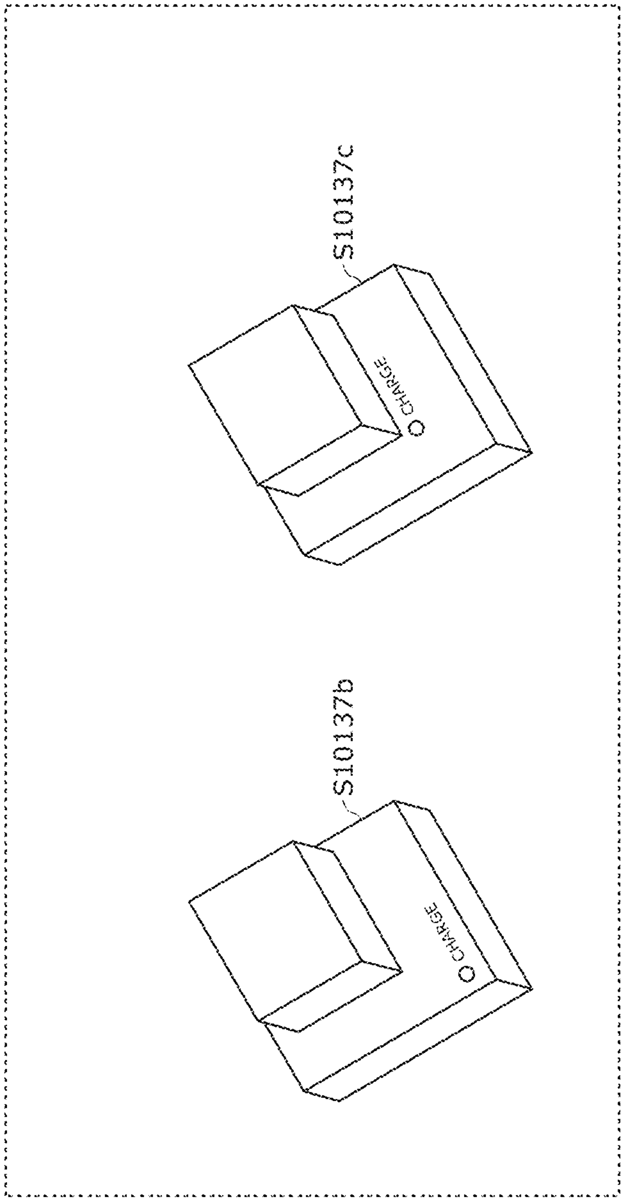
FIG. 87 is a diagram for describing an example of application of a transmitter in Embodiment 10.

FIG. 87 is a diagram for describing an example of application of a transmitter in this embodiment.

For example, a transmitter 10137*b* configured as a charger includes a light emitting unit, and transmits from the light emitting unit a visible light signal indicating a state of charge of a battery. With this, a costly display device is not needed to allow a user to be notified of a state of charge of the battery. When a small LED is used as the light emitting unit, the visible light signal cannot be received unless an image of the LED is captured from a nearby position. In the case of a transmitter 10137*c* which has a protrusion near the LED, the protrusion becomes an obstacle for closeup of the LED. Therefore, it is easier to receive a visible light signal from the transmitter 10137*b* having no protrusion near the LED than a visible light signal from the transmitter 10137*c*.

Embodiment 11

This embodiment describes each example of application using a receiver such as a smartphone and a transmitter for transmitting information as a blink pattern of an LED or an organic EL in each of the embodiments described above.

First, transmission in a demo mode and upon malfunction is described.

Figure 88:
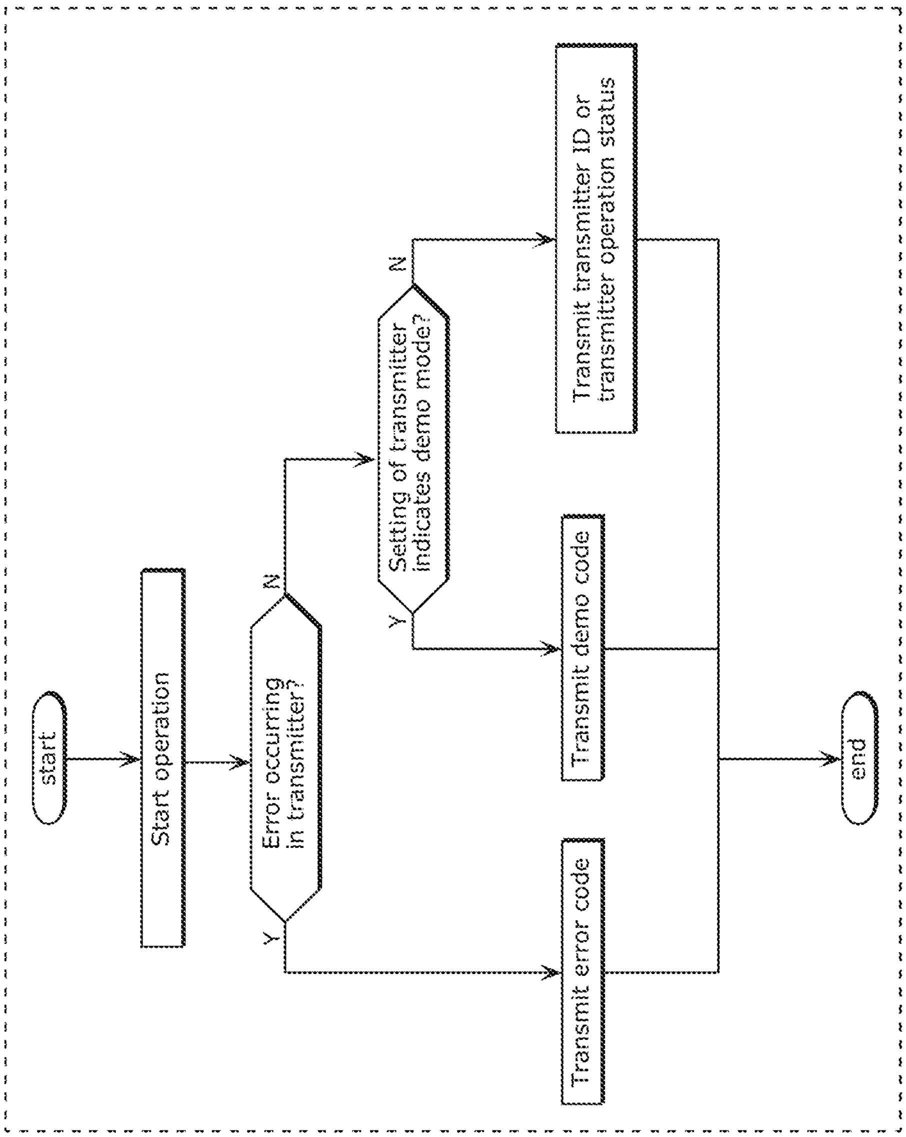
FIG. 88 is a diagram for describing an example of application of a transmission and reception system in Embodiment 11.

FIG. 88 is a diagram for describing an example of operation of a transmitter in this embodiment.

When an error occurs, the transmitter transmits a signal indicating that an error has occurred or a signal corresponding to an error code so that the receiver can be notified that an error has occurred or of details of an error. The receiver takes an appropriate measure according to details of an error so that the error can be corrected or the details of the error can be properly reported to a service center.

In the demo mode, the transmitter transmits a demo code. With this, during a demonstration of a transmitter as a product in a store, for example, a customer can receive a demo code and obtain a product description associated with the demo code. Whether or not the transmitter is in the demo mode can be determined based on the fact that the transmitter is set to the demo mode, that a CAS card for the store is inserted, that no CAS card is inserted, or that no recording medium is inserted.

Next, signal transmission from a remote controller is described.

Figure 89:
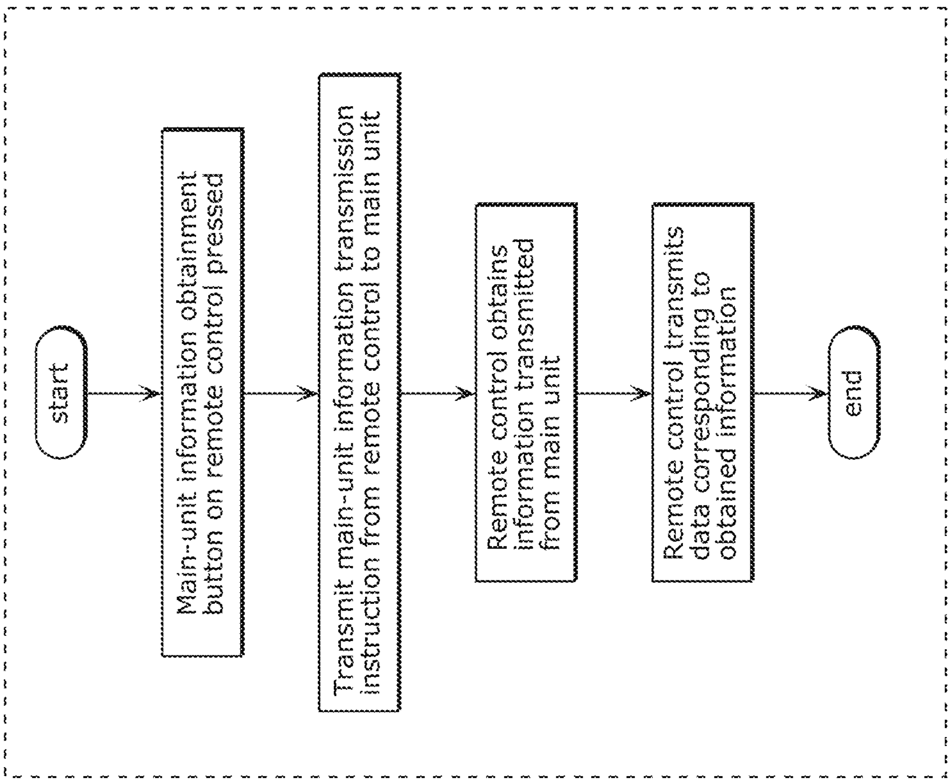
FIG. 89 is a diagram for describing an example of application of a transmission and reception system in Embodiment 11.

FIG. 89 is a diagram for describing an example of operation of a transmitter in this embodiment.

For example, when a transmitter configured as a remote controller of an air conditioner receives main-unit information, the transmitter transmits the main-unit information so that the receiver can receive from the nearby transmitter the information on the distant main unit. The receiver can receive information from a main unit located at a site where the visible light communication is unavailable, for example, across a network.

Next, a process of transmitting information only when the transmitter is in a bright place is described.

Figure 90:
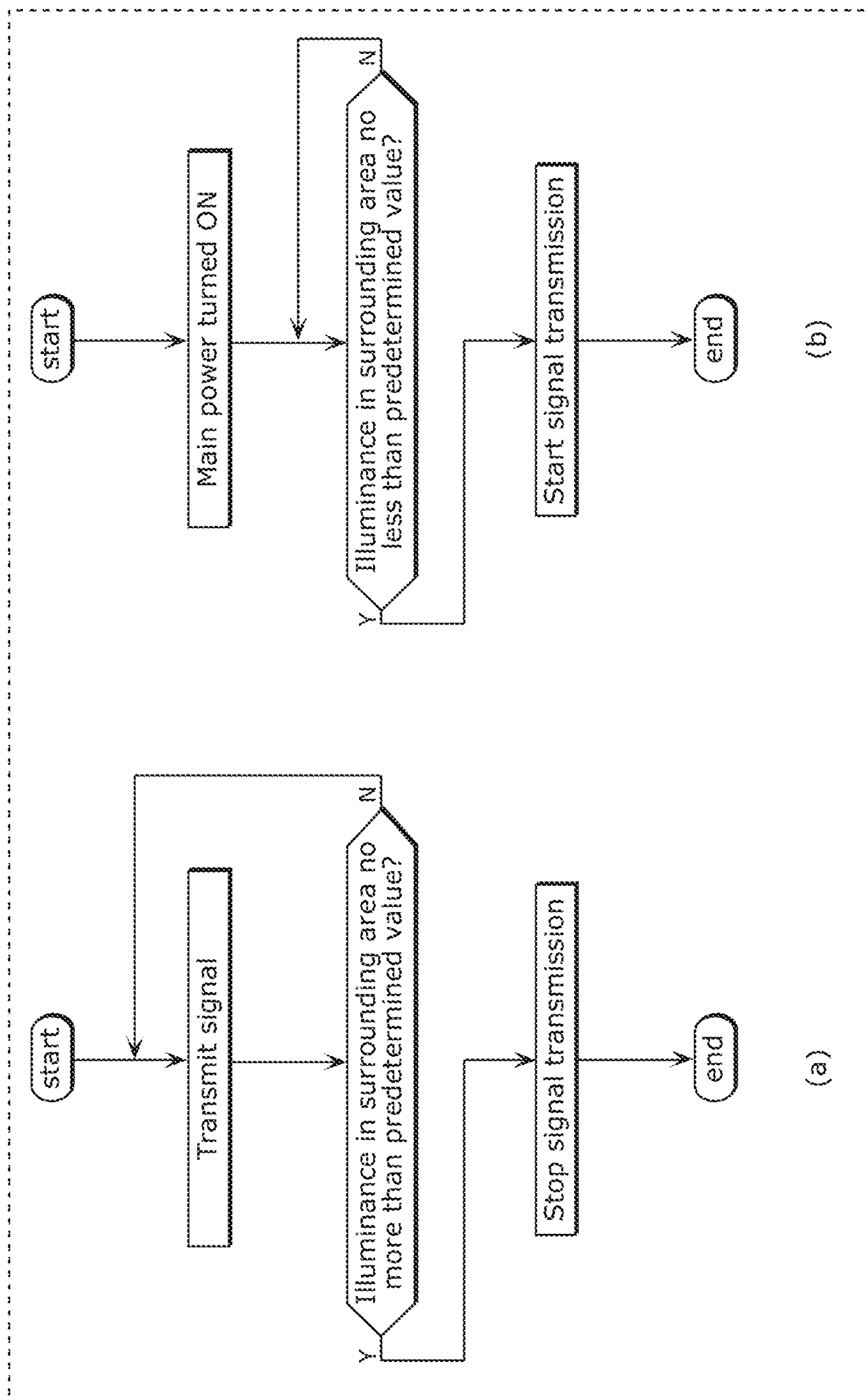
FIG. 90 is a diagram for describing an example of application of a transmission and reception system in Embodiment 11.

FIG. 90 is a diagram for describing an example of operation of a transmitter in this embodiment.

The transmitter transmits information when the brightness in its surrounding area is no less than a predetermined level, and stops transmitting information when the brightness falls below the predetermined level. By doing so, for example, a transmitter configured as an advertisement on a train can automatically stop its operation when the car enters a train depot. Thus, it is possible to reduce battery power consumption.

Next, content distribution according to an indication on the transmitter (changes in association and scheduling) is described.

Figure 91:
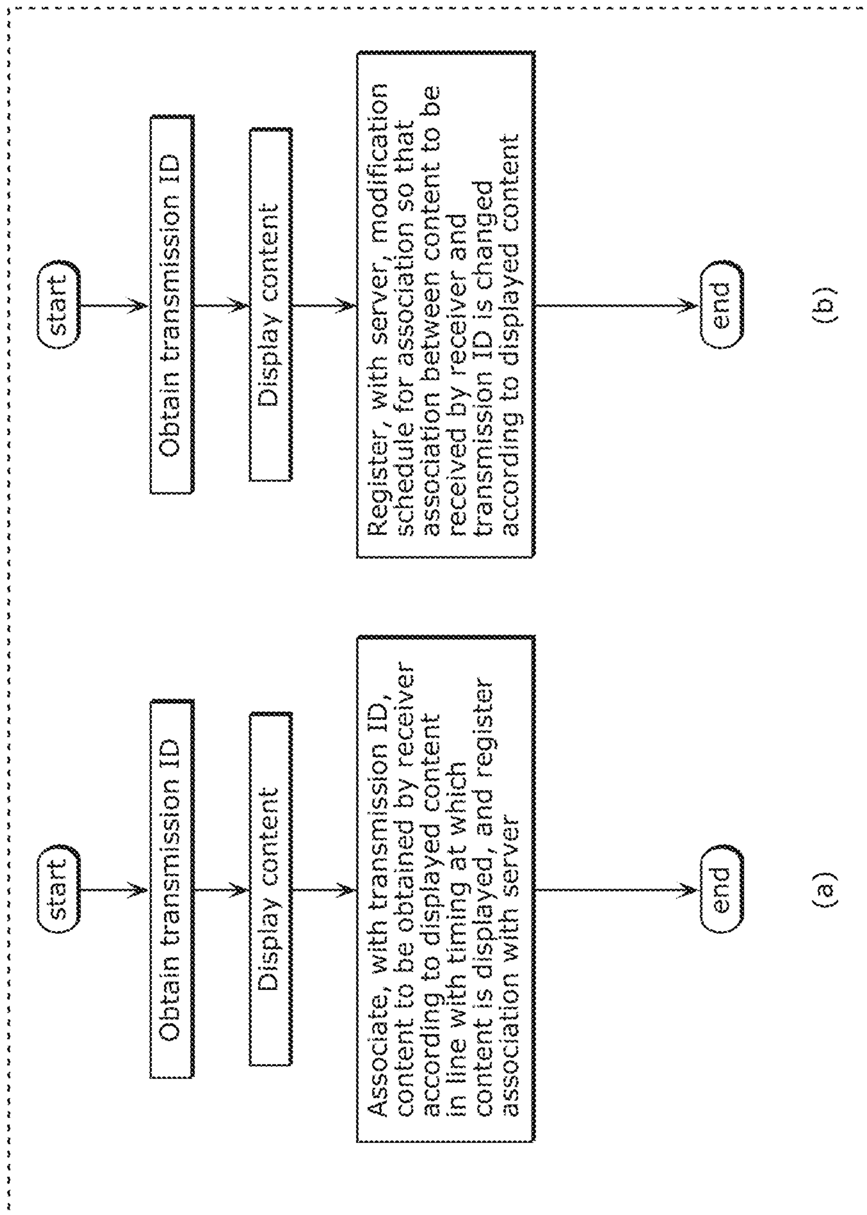
FIG. 91 is a diagram for describing an example of application of a transmission and reception system in Embodiment 11.

FIG. 91 is a diagram for describing an example of operation of a transmitter in this embodiment.

The transmitter associates, with a transmission ID, content to be obtained by the receiver in line with the timing at which the content is displayed. Every time the content to be displayed is changed, a change in the association is registered with the server.

When the timing at which the content to be displayed is displayed is known, the transmitter sets the server so that other content is transmitted to the receiver according to the timing of a change in the content to be displayed. When the server receives from the receiver a request for content associated with the transmission ID, the server transmits to the receiver corresponding content according to the set schedule.

By doing so, for example, when content displayed by a transmitter configured as a digital signage changes one after another, the receiver can obtain content that corresponds to the content displayed by the transmitter.

Next, content distribution corresponding to what is displayed by the transmitter (synchronization using a time point) is described.

Figure 92:
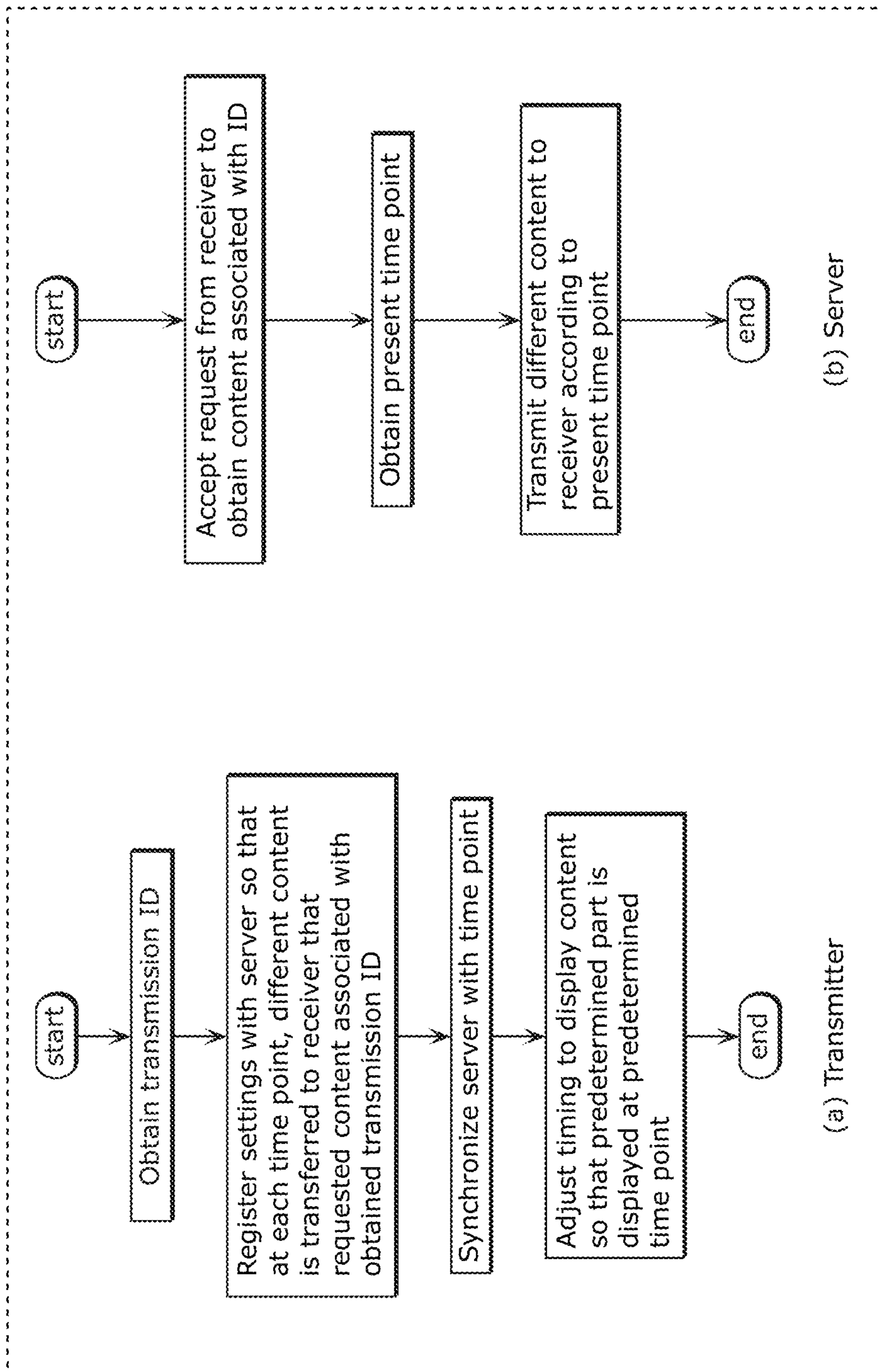
FIG. 92 is a diagram for describing an example of application of a transmission and reception system in Embodiment 11.

FIG. 92 is a diagram for describing an example of operation of a transmitter in this embodiment.

The server holds previously registered settings to transfer different content at each time point in response to a request for content associated with a predetermined ID.

The transmitter synchronizes the server with a time point, and adjusts timing to display content so that a predetermined part is displayed at a predetermined time point.

By doing so, for example, when content displayed by a transmitter configured as a digital signage changes one after another, the receiver can obtain content that corresponds to the content displayed by the transmitter.

Next, content distribution corresponding to what is displayed by the transmitter (transmission of a display time point) is described.

Figure 93:
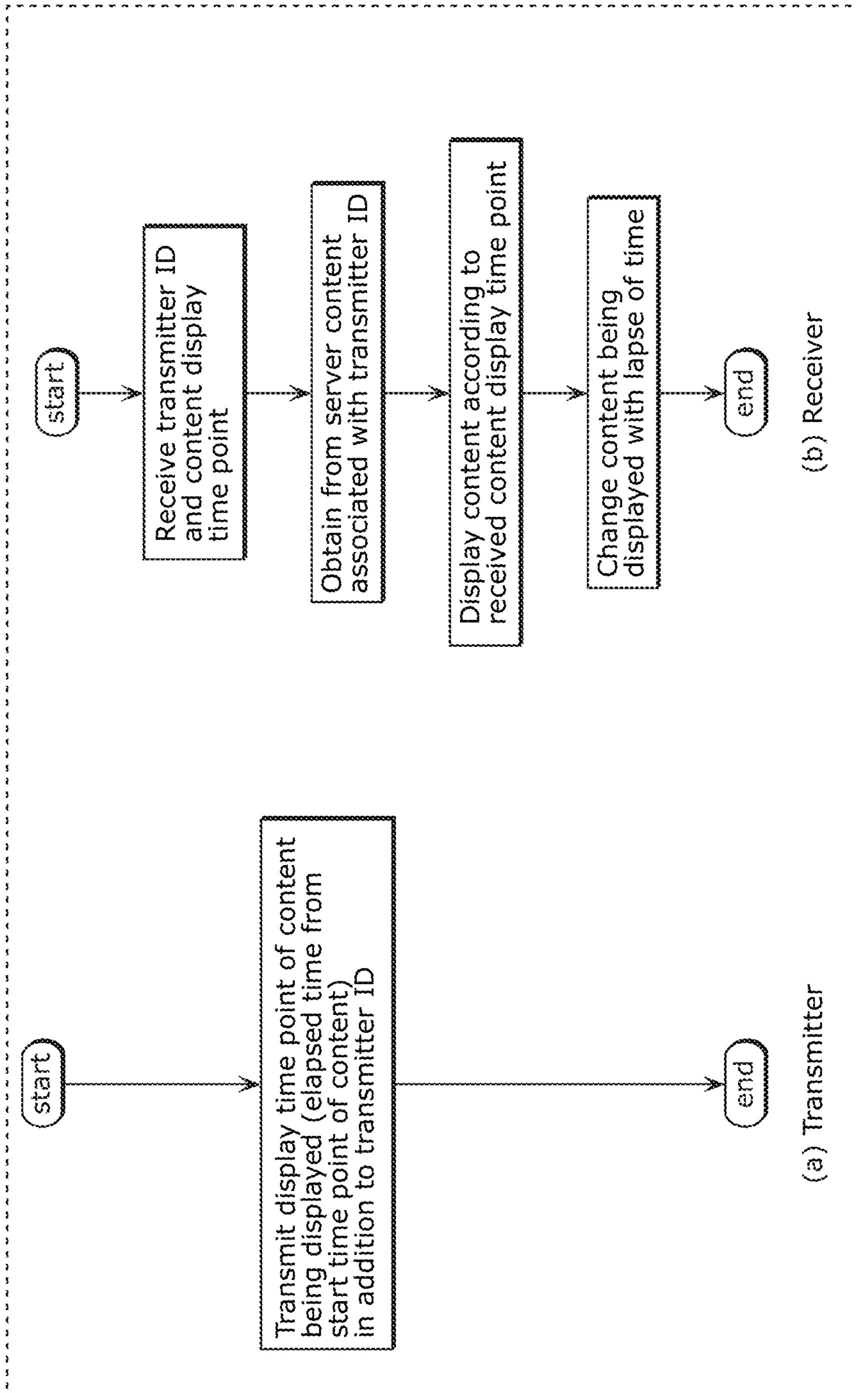
FIG. 93 is a diagram for describing an example of application of a transmission and reception system in Embodiment 11.

FIG. 93 is a diagram for describing an example of operation of a transmitter and a receiver in this embodiment.

The transmitter transmits, in addition to the ID of the transmitter, a display time point of content being displayed. The display time point of content is information with which the content currently being displayed can be identified, and can be represented by an elapsed time from a start time point of the content, for example.

The receiver obtains from the server content associated with the received ID and displays the content according to the received display time point. By doing so, for example, when content displayed by a transmitter configured as a digital signage changes one after another, the receiver can obtain content that corresponds to the content displayed by the transmitter.

Furthermore, the receiver displays content while changing the content with time. By doing so, even when content being displayed by the transmitter changes, there is no need to renew signal reception to display content corresponding to displayed content.

Next, data upload according to a grant status of a user is described.

Figure 94:
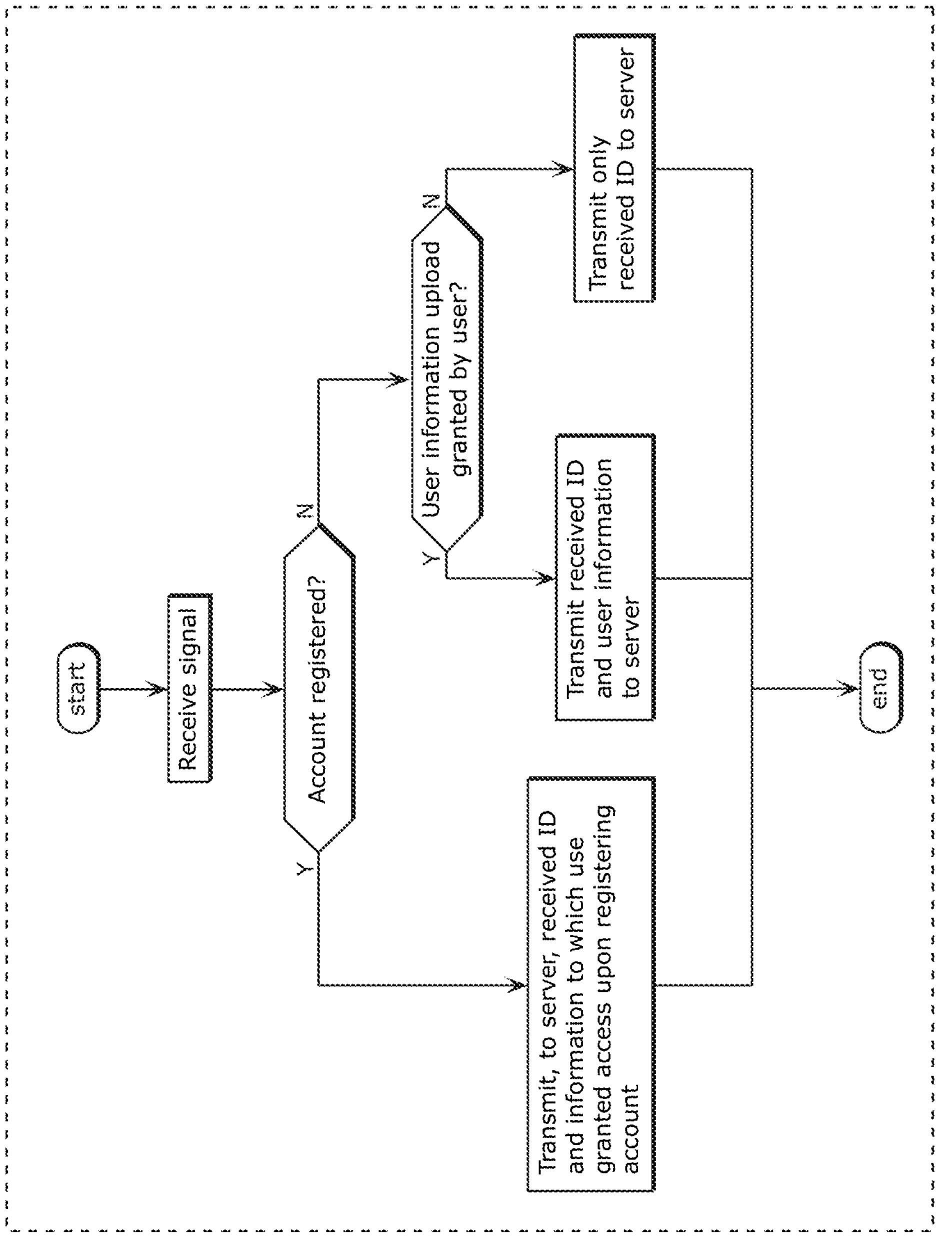
FIG. 94 is a diagram for describing an example of application of a transmission and reception system in Embodiment 11.

FIG. 94 is a diagram for describing an example of operation of a receiver in this embodiment.

In the case where a user has a registered account, the receiver transmits to the server the received ID and information to which the user granted access upon registering the account or other occasions (such as position, telephone number, ID, installed applications, etc. of the receiver, or age, sex, occupation, preferences, etc. of the user).

In the case where a user has no registered account, the above information is transmitted likewise to the server when the user has granted uploading of the above information, and when the user has not granted uploading of the above information, only the received ID is transmitted to the server.

With this, a user can receive content suitable to a reception situation or own personality, and as a result of obtaining information on a user, the server can make use of the information in data analysis.

Next, running of an application for reproducing content is described.

Figure 95:
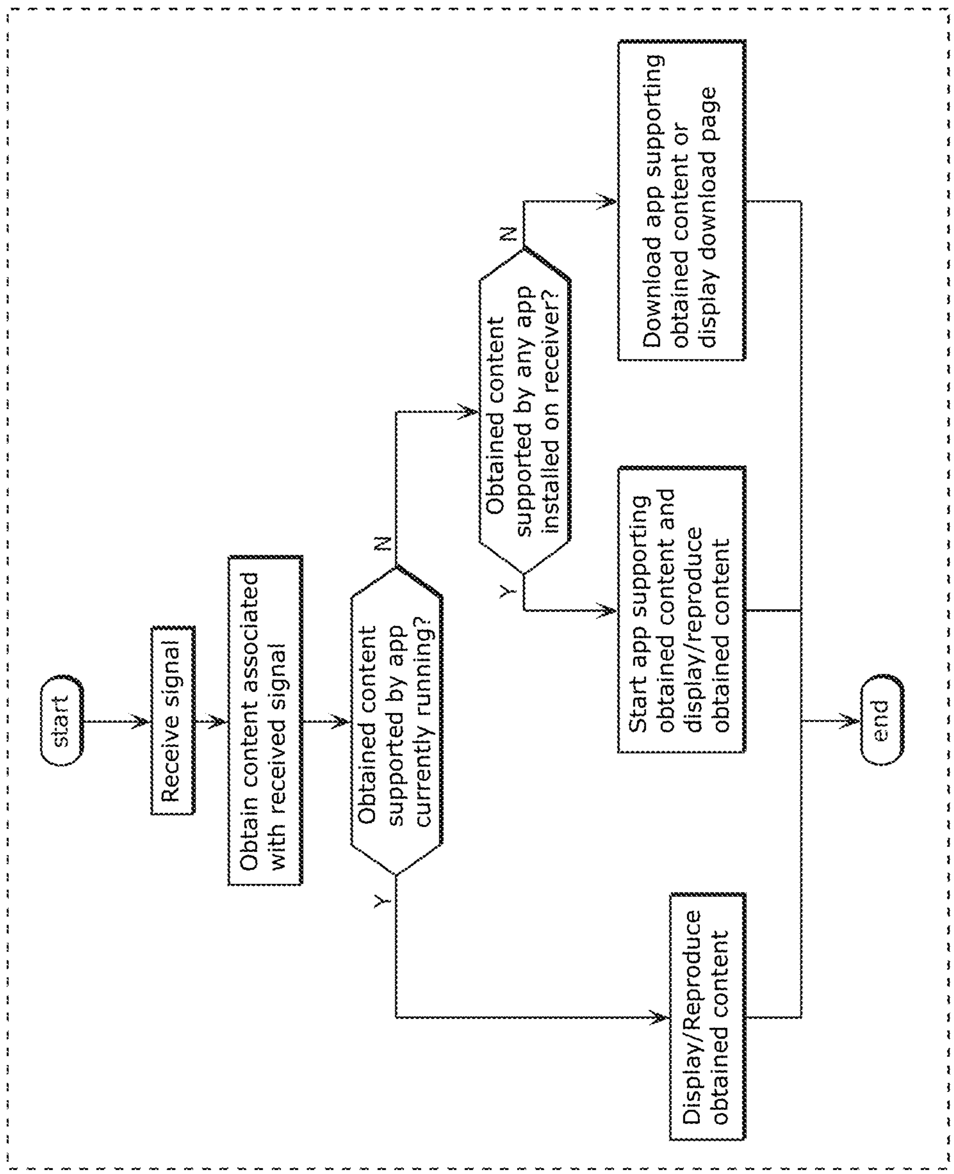
FIG. 95 is a diagram for describing an example of application of a transmission and reception system in Embodiment 11.

FIG. 95 is a diagram for describing an example of operation of a receiver in this embodiment.

The receiver obtains from the server content associated with the received ID. When an application currently running supports the obtained content (the application can displays or reproduces the obtained content), the obtained content is displayed or reproduced using the application currently running. When the application does not support the obtained content, whether or not any of the applications installed on the receiver supports the obtained content is checked, and when an application supporting the obtained content has been installed, the application is started to display and reproduce the obtained content. When all the applications installed do not support the obtained content, an application supporting the obtained content is automatically installed, or an indication or a download page is displayed to prompt a user to install an application supporting the obtained content, for example, and after the application is installed, the obtained content is displayed and reproduced.

By doing so, the obtained content can be appropriately supported (displayed, reproduced, etc.).

Next, running of a designated application is described.

Figure 96:
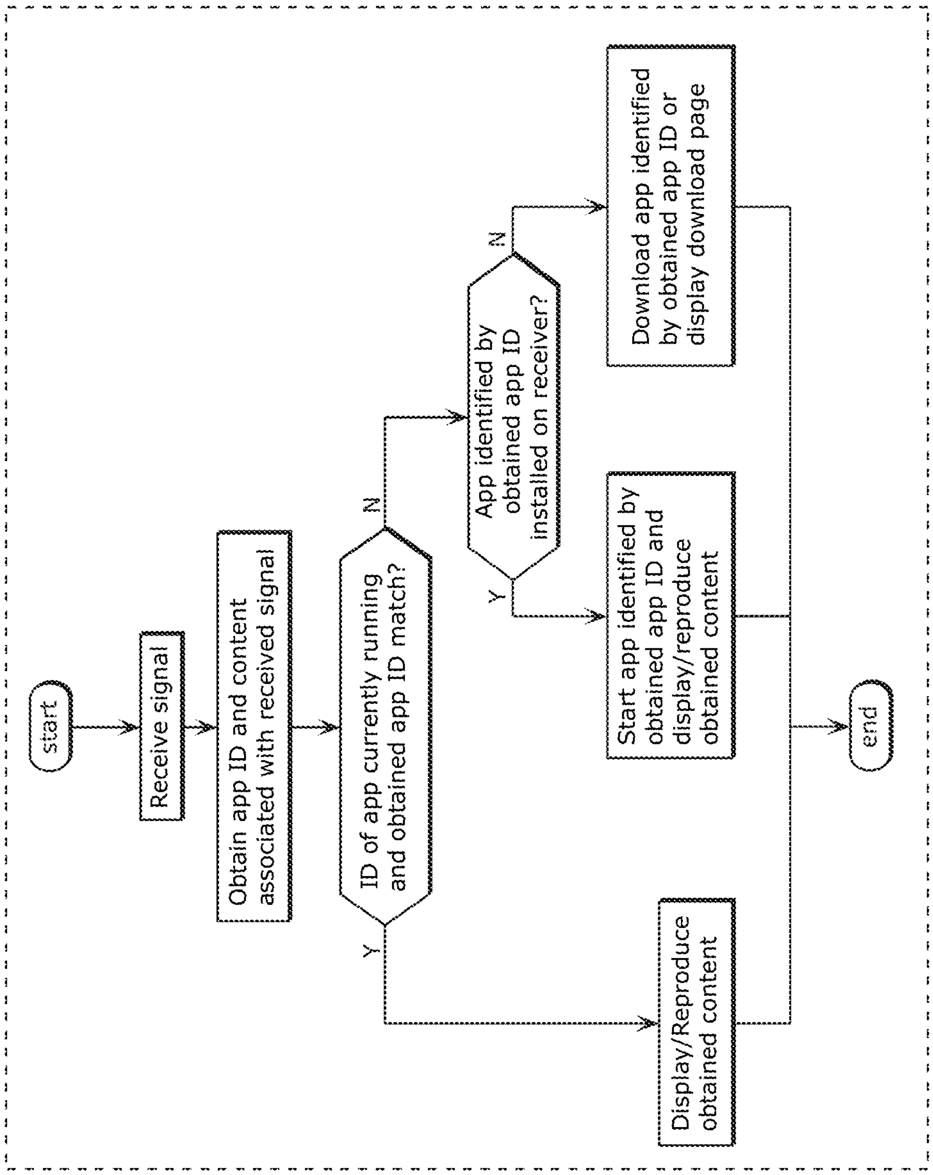
FIG. 96 is a diagram for describing an example of application of a transmission and reception system in Embodiment 11.

FIG. 96 is a diagram for describing an example of operation of a receiver in this embodiment.

The receiver obtains, from the server, content associated with the received ID and information designating an application to be started (an application ID). When the application currently running is a designated application, the obtained content is displayed and reproduced. When a designated application has been installed on the receiver, the designated application is started to display and reproduce the obtained content. When the designated application has not been installed, the designated application is automatically installed, or an indication or a download page is displayed to prompt a user to install the designated application, for example, and after the designated application is installed, the obtained content is displayed and reproduced.

The receiver may be designed to obtain only the application ID from the server and start the designated application.

The receiver may be configured with designated settings. The receiver may be designed to start the designated application when a designated parameter is set.

Next, selecting between streaming reception and normal reception is described.

Figure 97:
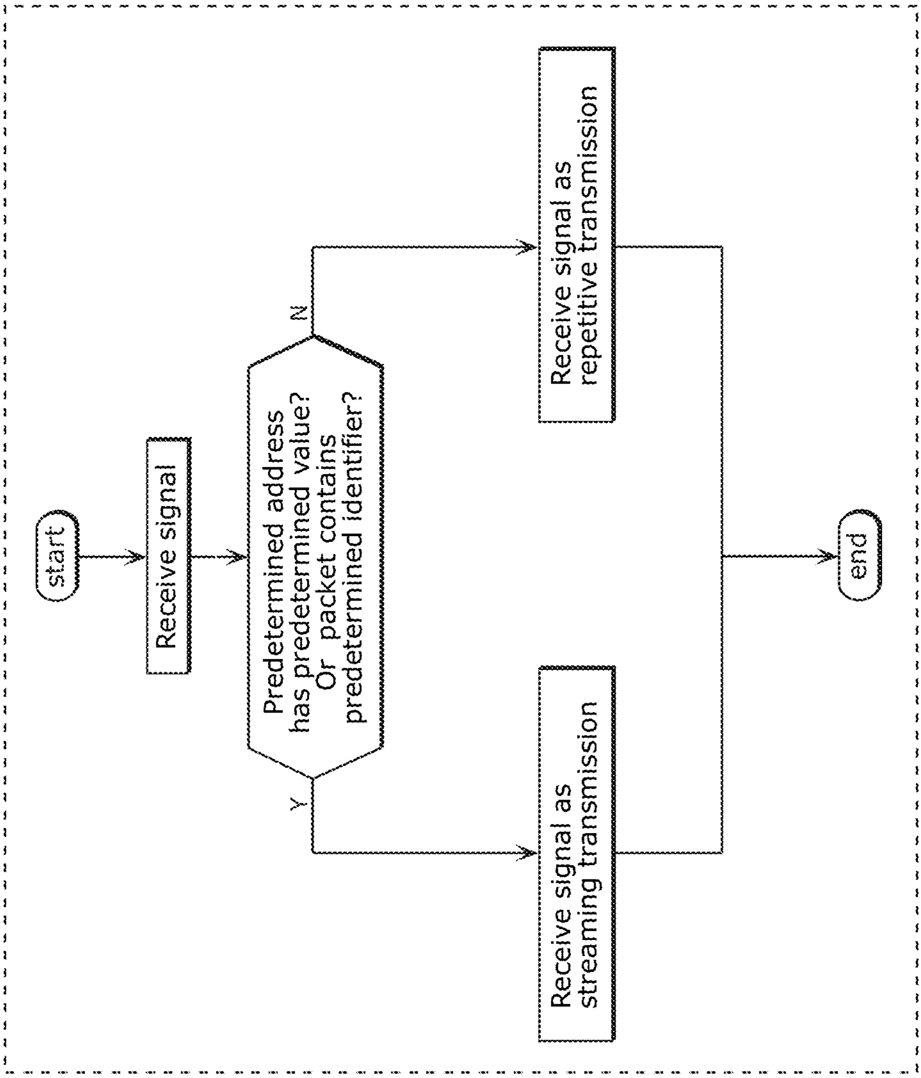
FIG. 97 is a diagram for describing an example of application of a transmission and reception system in Embodiment 11.

FIG. 97 is a diagram for describing an example of operation of a receiver in this embodiment.

When a predetermined address of the received data has a predetermined value or when the received data contains a predetermined identifier, the receiver determines that signal transmission is streaming distribution, and receives signals by a streaming data reception method. Otherwise, a normal reception method is used to receive the signals.

By doing so, signals can be received regardless of which method, streaming distribution or normal distribution, is used to transmit the signals.

Next, private data is described.

Figure 98:
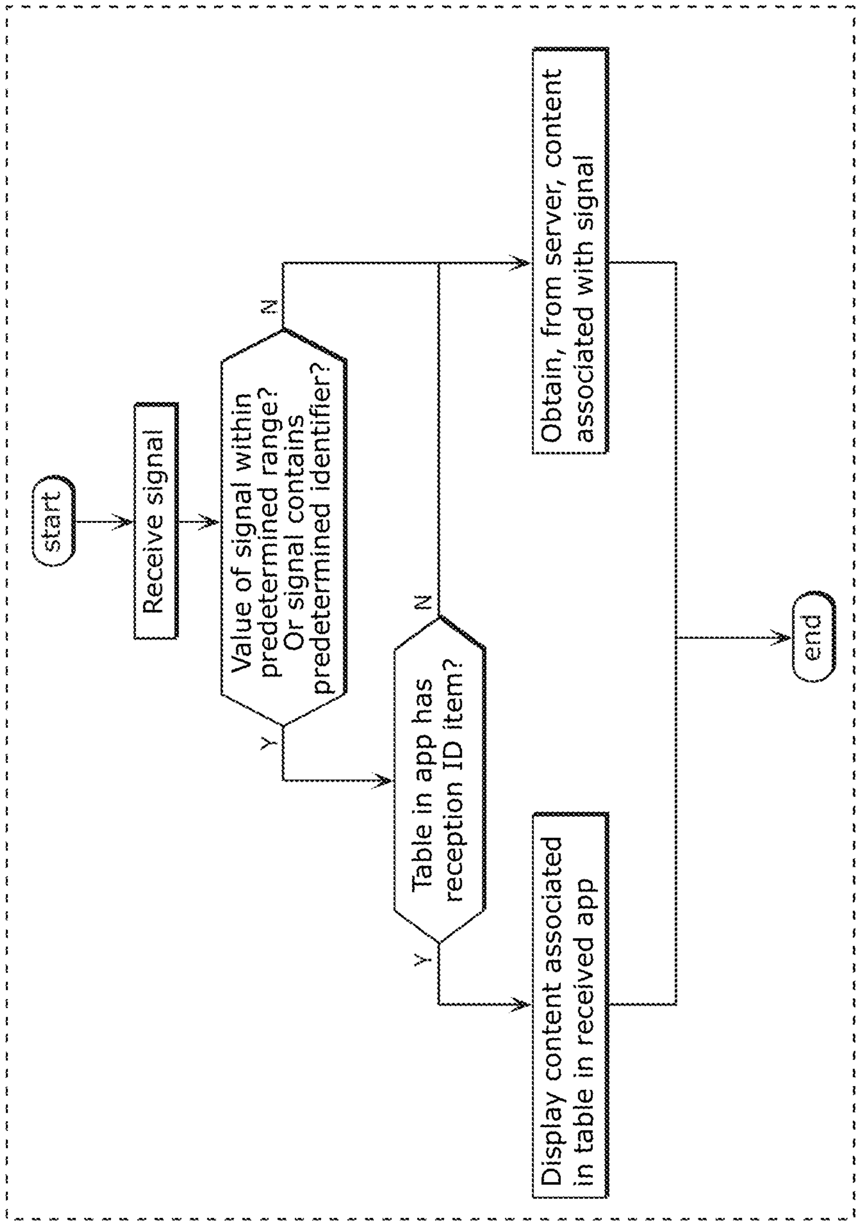
FIG. 98 is a diagram for describing an example of application of a transmission and reception system in Embodiment 11.

FIG. 98 is a diagram for describing an example of operation of a receiver in this embodiment.

When the value of the received ID is within a predetermined range or when the received ID contains a predetermined identifier, the receiver refers to a table in an application and when the table has the reception ID, content indicated in the table is obtained. Otherwise, content identified by the reception ID is obtained from the server.

By doing so, it is possible to receive content without registration with the server. Furthermore, response can be quick because no communication is performed with the server.

Next, setting of an exposure time according to a frequency is described.

Figure 99:
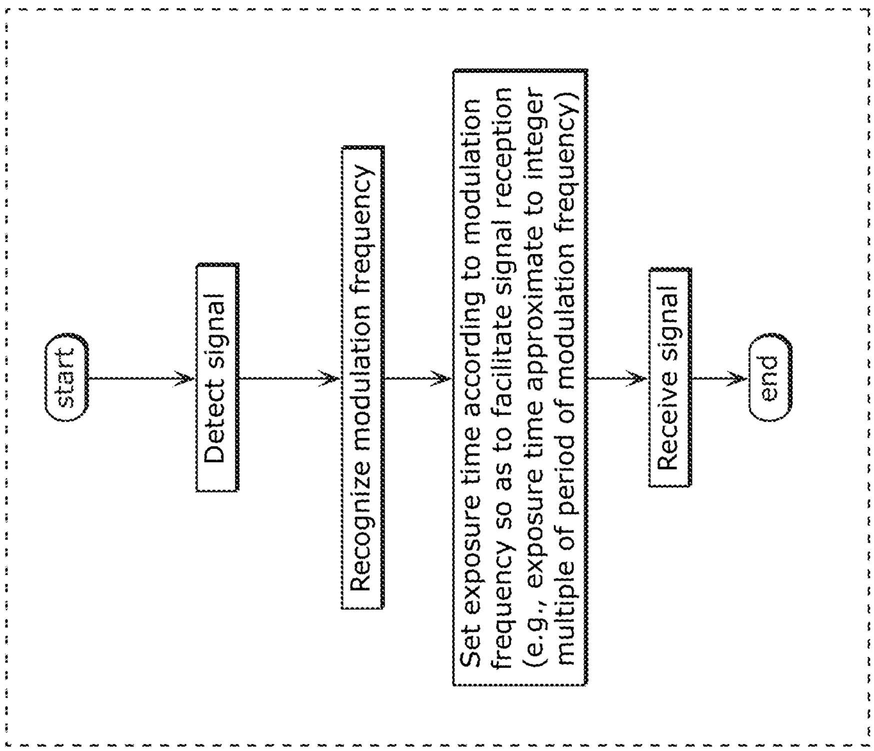
FIG. 99 is a diagram for describing an example of application of a transmission and reception system in Embodiment 11.

FIG. 99 is a diagram for describing an example of operation of a receiver in this embodiment.

The receiver detects a signal and recognizes a modulation frequency of the signal. The receiver sets an exposure time according to a period of the modulation frequency (a modulation period). For example, the exposure time is set to a value substantially equal to the modulation frequency so that signals can be more easily received. When the exposure time is set to an integer multiple of the modulation frequency or an approximate value (roughly plus/minus 30%) thereof, for example, convolutional decoding can facilitate reception of signals.

Next, setting of an optimum parameter in the transmitter is described.

Figure 100:
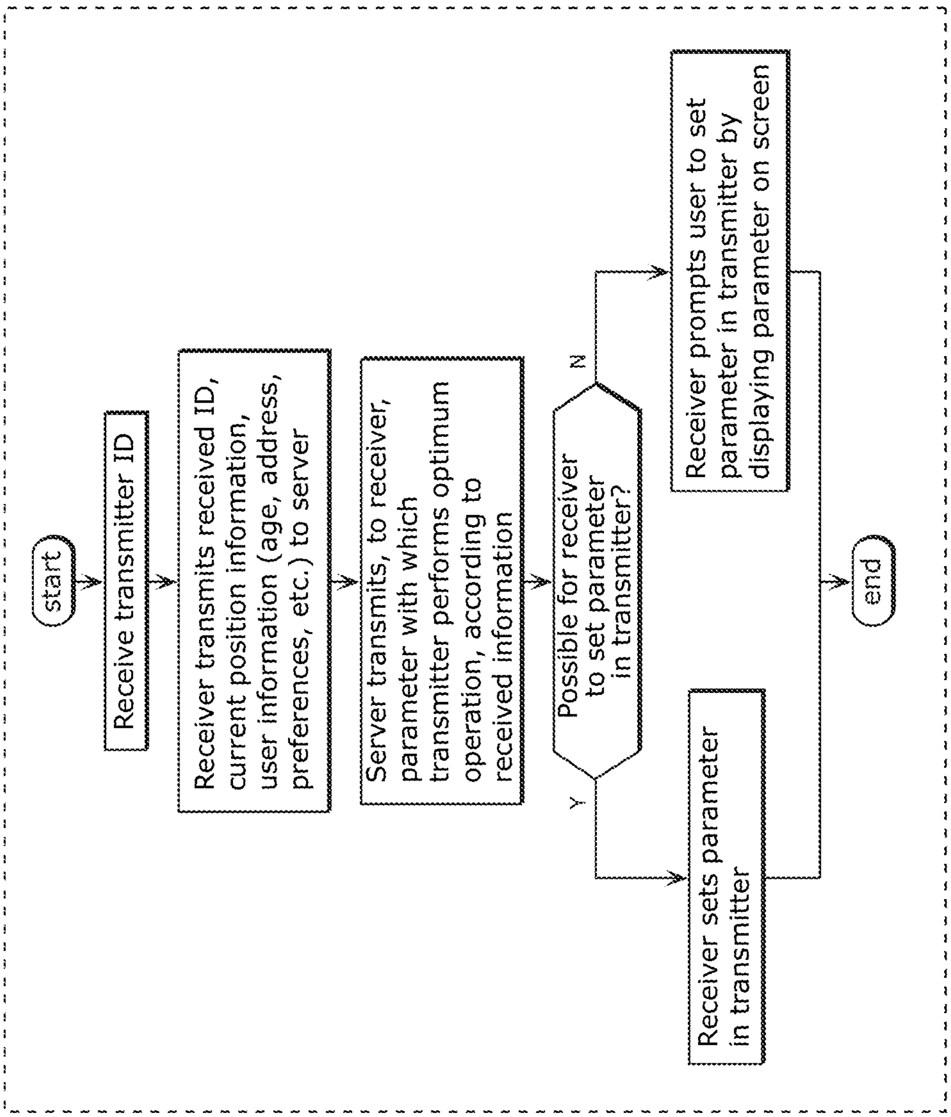
FIG. 100 is a diagram for describing an example of application of a transmission and reception system in Embodiment 11.

FIG. 100 is a diagram for describing an example of operation of a receiver in this embodiment.

The receiver transmits, to the server, data received from the transmitter, and current position information, information related to a user (address, sex, age, preferences, etc.), and the like. The server transmits to the receiver a parameter for the optimum operation of the transmitter according to the received information. The receiver sets the received parameter in the transmitter when possible. When not possible, the parameter is displayed to prompt a user to set the parameter in the transmitter.

With this, it is possible to operate a washing machine in a manner optimized according to the nature of water in a district where the transmitter is used, or to operate a rice cooker in such a way that rice is cooked in an optimal way for the kind of rice used by a user, for example.

Next, an identifier indicating a data structure is described.

Figure 101:
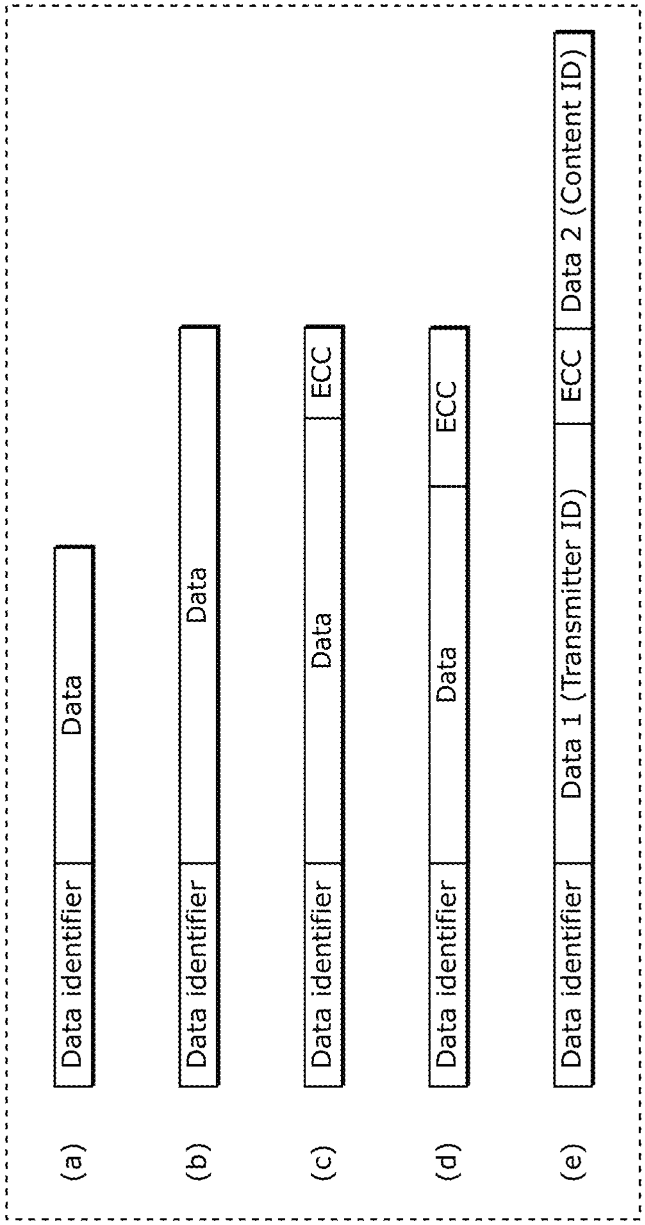
FIG. 101 is a diagram for describing an example of application of a transmission and reception system in Embodiment 11.

FIG. 101 is a diagram for describing an example of a structure of transmission data in this embodiment.

Information to be transmitted contains an identifier, the value of which shows to the receiver a structure of a part following the identifier. For example, it is possible to identify a length of data, kind and length of an error correction code, a dividing point of data, and the like.

This allows the transmitter to change the kind and length of data body, the error correction code, and the like according to characteristics of the transmitter, a communication path, and the like. Furthermore, the transmitter can transmit a content ID in addition to an ID of the transmitter, to allow the receiver to obtain an ID corresponding to the content ID.

Embodiment 12

This embodiment describes each example of application using a receiver such as a smartphone and a transmitter for transmitting information as a blink pattern of an LED or an organic EL device in each of the embodiments described above.

Figure 102:
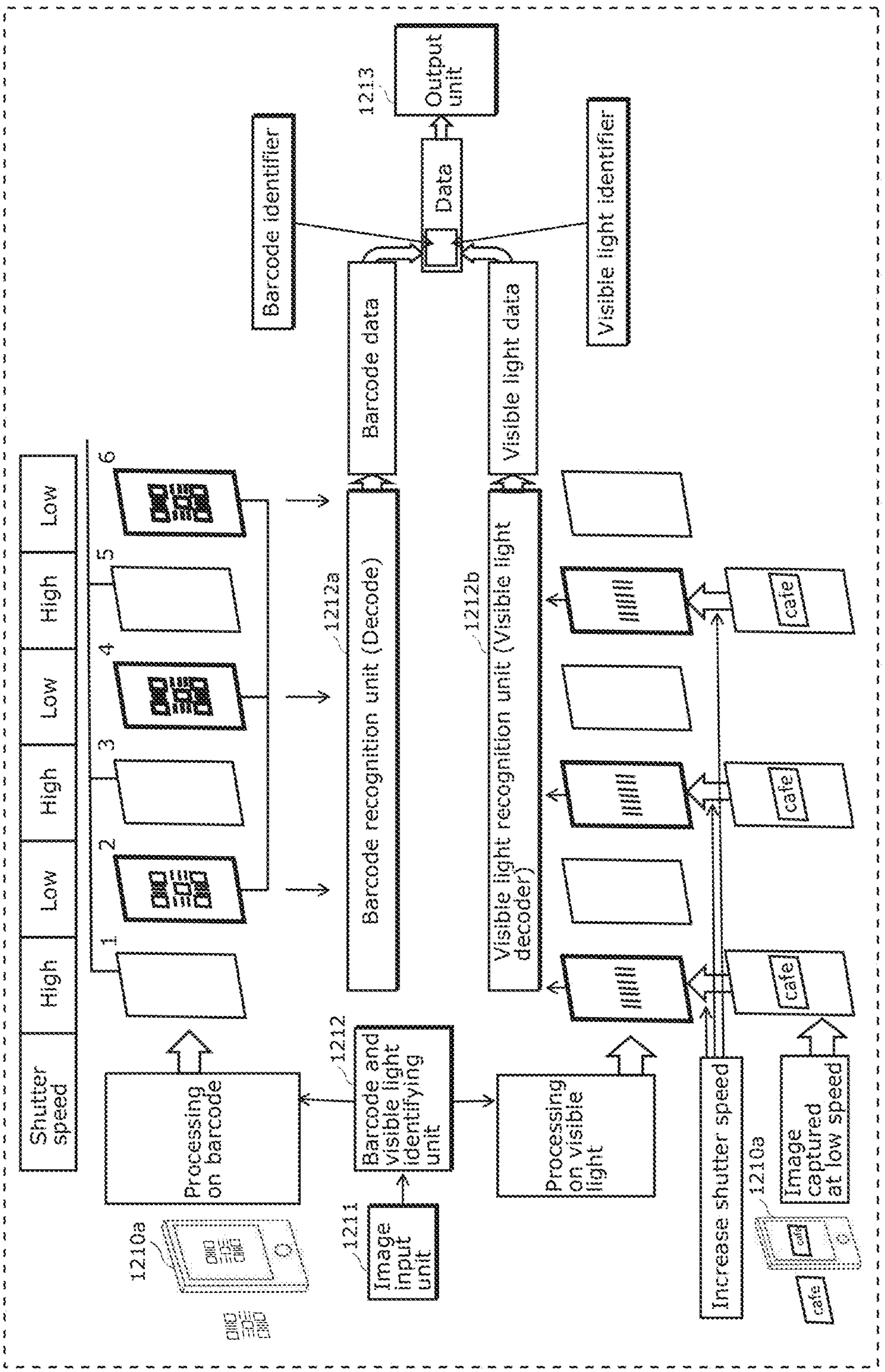
FIG. 102 is a diagram for describing operation of a receiver in Embodiment 12.

FIG. 102 is a diagram for describing operation of a receiver in this embodiment.

A receiver 1210*a* in this embodiment switches the shutter speed between high and low speeds, for example, on the frame basis, upon continuous imaging with the image sensor. Furthermore, on the basis of a frame obtained by such imaging, the receiver 1210*a* switches processing on the frame between a barcode recognition process and a visible light recognition process. Here, the barcode recognition process is a process of decoding a barcode appearing in a frame obtained at a low shutter speed. The visible light recognition process is a process of decoding the above-described pattern of bright lines appearing on a frame obtained at a high shutter speed.

This receiver 1210*a* includes an image input unit 1211, a barcode and visible light identifying unit 1212, a barcode recognition unit 1212*a*, a visible light recognition unit 1212*b*, and an output unit 1213.

The image input unit 1211 includes an image sensor and switches a shutter speed for imaging with the image sensor. This means that the image input unit 1211 sets the shutter speed to a low speed and a high speed alternately, for example, on the frame basis. More specifically, the image input unit 1211 switches the shutter speed to a high speed for an odd-numbered frame, and switches the shutter speed to a low speed for an even-numbered frame. Imaging at a low shutter speed is imaging in the above-described normal imaging mode, and imaging at a high shutter speed is imaging in the above-described visible light communication mode. Specifically, when the shutter speed is a low speed, the exposure time of each exposure line included in the image sensor is long, and a normal captured image in which a subject is shown is obtained as a frame. When the shutter speed is a high speed, the exposure time of each exposure line included in the image sensor is short, and a visible light communication image in which the above-described bright lines are shown is obtained as a frame.

The barcode and visible light identifying unit 1212 determines whether or not a barcode appears, or a bright line appears, in an image obtained by the image input unit 1211, and switches processing on the image accordingly. For example, when a barcode appears in a frame obtained by imaging at a low shutter speed, the barcode and visible light identifying unit 1212 causes the barcode recognition unit 1212*a* to perform the processing on the image. When a bright line appears in a frame obtained by imaging at a high shutter speed, the barcode and visible light identifying unit 1212 causes the visible light recognition unit 1212*b* to perform the processing on the image.

The barcode recognition unit 1212*a* decodes a barcode appearing in a frame obtained by imaging at a low shutter speed. The barcode recognition unit 1212*a* obtains data of the barcode (for example, a barcode identifier) as a result of such decoding, and outputs the barcode identifier to the output unit 1213. Note that the barcode may be a one-dimensional code or may be a two-dimensional code (for example, QR Code®).

The visible light recognition unit 1212*b* decodes a pattern of bright lines appearing in a frame obtained by imaging at a high shutter speed. The visible light recognition unit 1212*b* obtains data of visible light (for example, a visible light identifier) as a result of such decoding, and outputs the visible light identifier to the output unit 1213. Note that the data of visible light is the above-described visible light signal.

The output unit 1213 displays only frames obtained by imaging at a low shutter speed. Therefore, when the subject imaged with the image input unit 1211 is a barcode, the output unit 1213 displays the barcode. When the subject imaged with the image input unit 1211 is a digital signage or the like which transmits a visible light signal, the output unit 1213 displays an image of the digital signage without displaying a pattern of bright lines. Subsequently, when the output unit 1213 obtains a barcode identifier, the output unit 1213 obtains, from a server, for example, information associated with the barcode identifier, and displays the information. When the output unit 1213 obtains a visible light identifier, the output unit 1213 obtains, from a server, for example, information associated with the visible light identifier, and displays the information.

Stated differently, the receiver 1210*a* which is a terminal device includes an image sensor, and performs continuous imaging with the image sensor while a shutter speed of the image sensor is alternately switched between a first speed and a second speed higher than the first speed. (a) When a subject imaged with the image sensor is a barcode, the receiver 1210*a* obtains an image in which the barcode appears, as a result of imaging performed when the shutter speed is the first speed, and obtains a barcode identifier by decoding the barcode appearing in the image. (b) When a subject imaged with the image sensor is a light source (for example, a digital signage), the receiver 1210*a* obtains a bright line image which is an image including bright lines corresponding to a plurality of exposure lines included in the image sensor, as a result of imaging performed when the shutter speed is the second speed. The receiver 1210*a* then obtains, as a visible light identifier, a visible light signal by decoding the pattern of bright lines included in the obtained bright line image. Furthermore, this receiver 1210*a* displays an image obtained through imaging performed when the shutter speed is the first speed.

The receiver 1210*a* in this embodiment is capable of both decoding a barcode and receiving a visible light signal by switching between and performing the barcode recognition process and the visible light recognition process. Furthermore, such switching allows for a reduction in power consumption.

The receiver in this embodiment may perform an image recognition process, instead of the barcode recognition process, and the visible light process simultaneously.

Figure 103A:
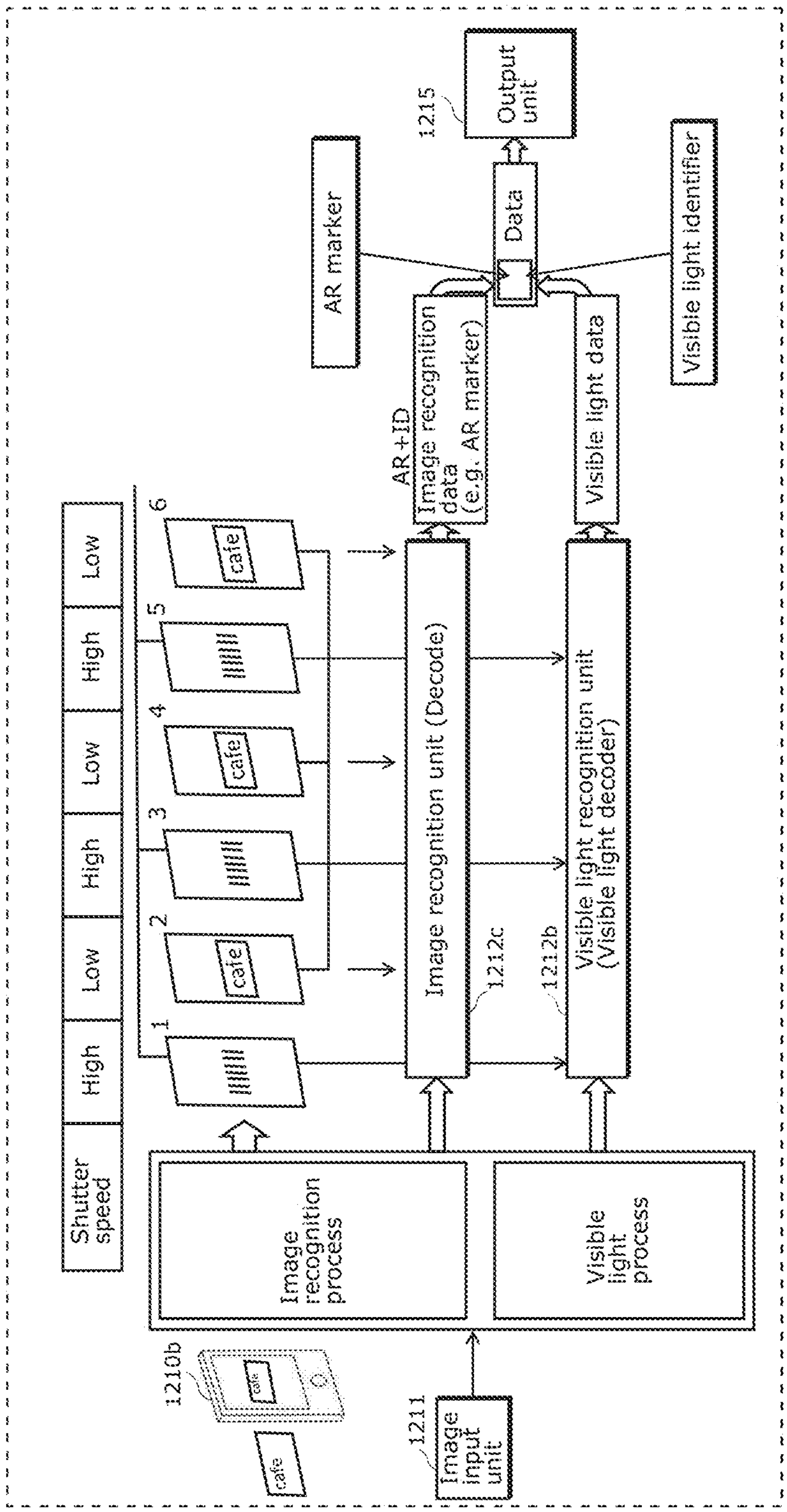
FIG. 103A is a diagram for describing another operation of a receiver in Embodiment 12.

FIG. 103A is a diagram for describing another operation of a receiver in this embodiment.

A receiver 1210*b* in this embodiment switches the shutter speed between high and low speeds, for example, on the frame basis, upon continuous imaging with the image sensor. Furthermore, the receiver 1210*b* performs an image recognition process and the above-described visible light recognition process simultaneously on an image (frame) obtained by such imaging. The image recognition process is a process of recognizing a subject appearing in a frame obtained at a low shutter speed.

The receiver 1210*b* includes an image input unit 1211, an image recognition unit 1212*c*, a visible light recognition unit 1212*b*, and an output unit 1215.

The image input unit 1211 includes an image sensor and switches a shutter speed for imaging with the image sensor. This means that the image input unit 1211 sets the shutter speed to a low speed and a high speed alternately, for example, on the frame basis. More specifically, the image input unit 1211 switches the shutter speed to a high speed for an odd-numbered frame, and switches the shutter speed to a low speed for an even-numbered frame. Imaging at a low shutter speed is imaging in the above-described normal imaging mode, and imaging at a high shutter speed is imaging in the above-described visible light communication mode. Specifically, when the shutter speed is a low speed, the exposure time of each exposure line included in the image sensor is long, and a normal captured image in which a subject is shown is obtained as a frame. When the shutter speed is a high speed, the exposure time of each exposure line included in the image sensor is short, and a visible light communication image in which the above-described bright lines are shown is obtained as a frame.

The image recognition unit 1212*c* recognizes a subject appearing in a frame obtained by imaging at a low shutter speed, and identifies a position of the subject in the frame. As a result of the recognition, the image recognition unit 1212*c* determines whether or not the subject is a target of augmented reality (AR) (hereinafter referred to as an AR target). When determining that the subject is an AR target, the image recognition unit 1212*c* generates image recognition data which is data for displaying information related to the subject (for example, a position of the subject, an AR marker thereof, etc.), and outputs the AR marker to the output unit 1215.

The output unit 1215 displays only frames obtained by imaging at a low shutter speed, as with the above-described output unit 1213. Therefore, when the subject imaged by the image input unit 1211 is a digital signage or the like which transmits a visible light signal, the output unit 1213 displays an image of the digital signage without displaying a pattern of bright lines. Furthermore, when the output unit 1215 obtains the image recognition data from the image recognition unit 1212*c*, the output unit 1215 refers to a position of the subject in a frame represented by the image recognition data, and superimposes on the frame an indicator in the form of a white frame enclosing the subject, based on the position referred to.

Figure 103B:
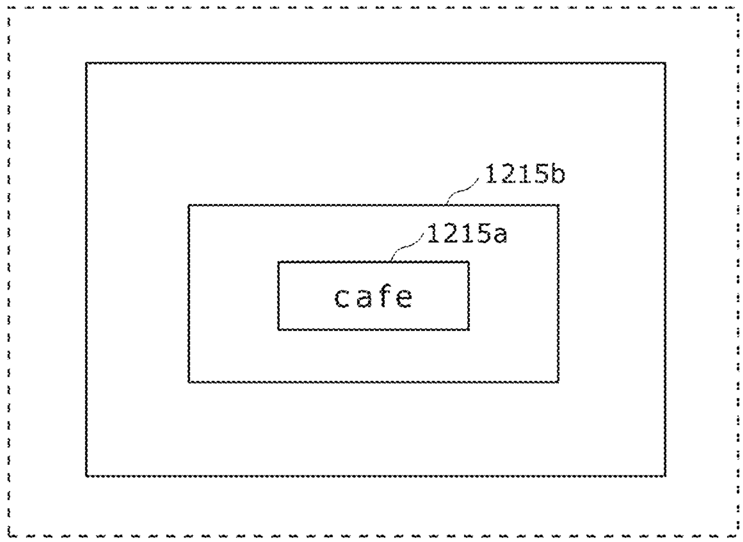
FIG. 103B is a diagram illustrating an example of an indicator displayed by an output unit 1215 in Embodiment 12.

FIG. 103B is a diagram illustrating an example of an indicator displayed by the output unit 1215.

The output unit 1215 superimposes, on the frame, an indicator 1215*b* in the form of a white frame enclosing a subject image 1215*a* formed as a digital signage, for example. In other words, the output unit 1215 displays the indicator 1215*b* indicating the subject recognized in the image recognition process. Furthermore, when the output unit 1215 obtains the visible light identifier from the visible light recognition unit 1212*b*, the output unit 1215 changes the color of the indicator 1215*b* from white to red, for example.

Figure 103C:
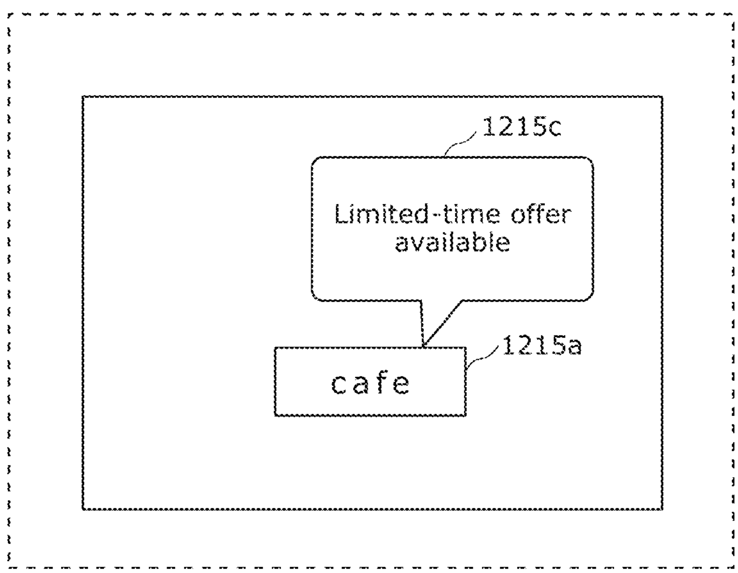
FIG. 103C is a diagram illustrating an AR display example in Embodiment 12.

FIG. 103C is a diagram illustrating an AR display example.

The output unit 1215 further obtains, as related information, information related to the subject and associated with the visible light identifier, for example, from a server or the like. The output unit 1215 adds the related information to an AR marker 1215*c* represented by the image recognition data, and displays the AR marker 1215*c* with the related information added thereto, in association with the subject image 1215*a* in the frame.

The receiver 1210*b* in this embodiment is capable of realizing AR which uses visible light communication, by performing the image recognition process and the visible light recognition process simultaneously. Note that the receiver 1210*a* illustrated in FIG. 103A may display the indicator 1215*b* illustrated in FIG. 103B, as with the receiver

1210*b*. In this case, when a barcode is recognized in a frame obtained by imaging at a low shutter speed, the receiver 1210*a* displays the indicator 1215*b* in the form of a white frame enclosing the barcode. When the barcode is decoded, the receiver 1210*a* changes the color of the indicator 1215*b* from white to red. Likewise, when a pattern of bright lines is recognized in a frame obtained by imaging at a high shutter speed, the receiver 1210*a* identifies a portion of a low-speed frame which corresponds to a portion where the pattern of bright lines is located. For example, when a digital signage transmits a visible light signal, an image of the digital signage in the low-speed frame is identified. Note that the low-speed frame is a frame obtained by imaging at a low shutter speed. The receiver 1210*a* superimposes, on the low-speed frame, the indicator 1215*b* in the form of a white frame enclosing the identified portion in the low-speed frame (for example, the above-described image of the digital signage), and displays the resultant image. When the pattern of bright lines is decoded, the receiver 1210*a* changes the color of the indicator 1215*b* from white to red.

Figure 104A:
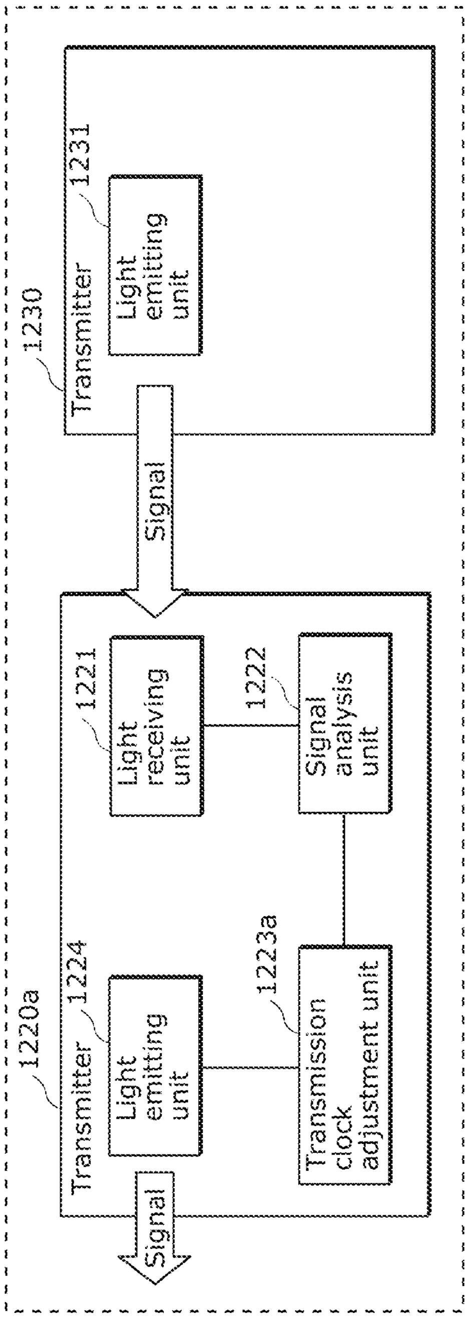
FIG. 104A is a diagram for describing an example of a transmitter in Embodiment 12.

FIG. 104A is a diagram for describing an example of a receiver in this embodiment.

A transmitter 1220*a* in this embodiment transmits a visible light signal in synchronization with a transmitter 1230. Specifically, at the timing of transmission of a visible light signal by the transmitter 1230, the transmitter 1220*a* transmits the same visible light signal. Note that the transmitter 1230 includes a light emitting unit 1231 and transmits a visible light signal by the light emitting unit 1231 changing in luminance.

This transmitter 1220*a* includes a light receiving unit 1221, a signal analysis unit 1222, a transmission clock adjustment unit 1223*a*, and a light emitting unit 1224. The light emitting unit 1224 transmits, by changing in luminance, the same visible light signal as the visible light signal which the transmitter 1230 transmits. The light receiving unit 1221 receives a visible light signal from the transmitter 1230 by receiving visible light from the transmitter 1230. The signal analysis unit 1222 analyzes the visible light signal received by the light receiving unit 1221, and transmits the analysis result to the transmission clock adjustment unit 1223*a*. On the basis of the analysis result, the transmission clock adjustment unit 1223*a* adjusts the timing of transmission of a visible light signal from the light emitting unit 1224. Specifically, the transmission clock adjustment unit 1223*a* adjusts timing of luminance change of the light emitting unit 1224 so that the timing of transmission of a visible light signal from the light emitting unit 1231 of the transmitter 1230 and the timing of transmission of a visible light signal from the light emitting unit 1224 match each other.

With this, the waveform of a visible light signal transmitted by the transmitter 1220*a* and the waveform of a visible light signal transmitted by the transmitter 1230 can be the same in terms of timing.

Figure 104B:
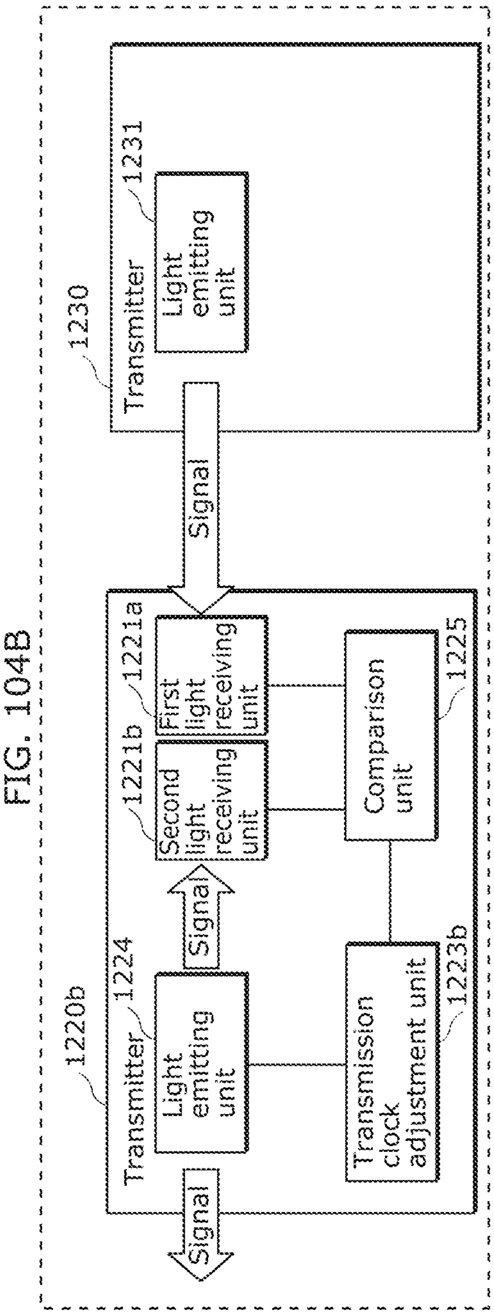
FIG. 104B is a diagram for describing another example of a transmitter in Embodiment 12.

FIG. 104B is a diagram for describing another example of a transmitter in this embodiment.

As with the transmitter 1220*a*, a transmitter 1220*b* in this embodiment transmits a visible light signal in synchronization with the transmitter 1230. Specifically, at the timing of transmission of a visible light signal by the transmitter 1230, the transmitter 1200*b* transmits the same visible light signal.

This transmitter 1220*b* includes a first light receiving unit 1221*a*, a second light receiving unit 1221*b*, a comparison unit 1225, a transmission clock adjustment unit 1223*b*, and the light emitting unit 1224.

As with the light receiving unit 1221, the first light receiving unit 1221*a* receives a visible light signal from the transmitter 1230 by receiving visible light from the transmitter 1230. The second light receiving unit 1221*b* receives visible light from the light emitting unit 1224. The comparison unit 1225 compares a first timing in which the visible light is received by the first light receiving unit 1221*a* and a second timing in which the visible light is received by the second light receiving unit 1221*b*. The comparison unit 1225 then outputs a difference between the first timing and the second timing (that is, delay time) to the transmission clock adjustment unit 1223*b*. The transmission clock adjustment unit 1223*b* adjusts the timing of transmission of a visible light signal from the light emitting unit 1224 so that the delay time is reduced.

With this, the waveform of a visible light signal transmitted by the transmitter 1220*b* and the waveform of a visible light signal transmitted by the transmitter 1230 can be more exactly the same in terms of timing.

Note that two transmitters transmit the same visible light signals in the examples illustrated in FIG. 104A and FIG. 104B, but may transmit different visible light signals. This means that when two transmitters transmit the same visible light signals, the transmitters transmit them in synchronization as described above. When two transmitters transmit different visible light signals, only one of the two transmitters transmits a visible light signal, and the other transmitter remains ON or OFF while the one transmitter transmits a visible light signal. The one transmitter is thereafter turned ON or OFF, and only the other transmitter transmits a visible light signal while the one transmitter remains ON or OFF. Note that two transmitters may transmit mutually different visible light signals simultaneously.

Figure 105A:
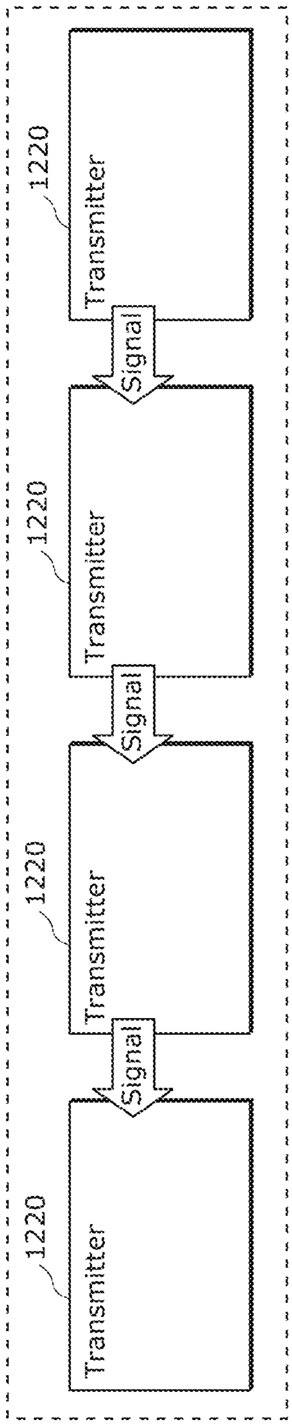
FIG. 105A is a diagram for describing an example of synchronous transmission from a plurality of transmitters in Embodiment 12.

FIG. 105A is a diagram for describing an example of synchronous transmission from a plurality of transmitters in this embodiment.

A plurality of transmitters 1220 in this embodiment are, for example, arranged in a row as illustrated in FIG. 105A. Note that these transmitters 1220 have the same configuration as the transmitter 1220*a* illustrated in FIG. 104A or the transmitter 1220*b* illustrated in FIG. 104B. Each of the transmitters 1220 transmits a visible light signal in synchronization with one of adjacent transmitters 1220 on both sides.

This allows many transmitters to transmit visible light signals in synchronization.

Figure 105B:
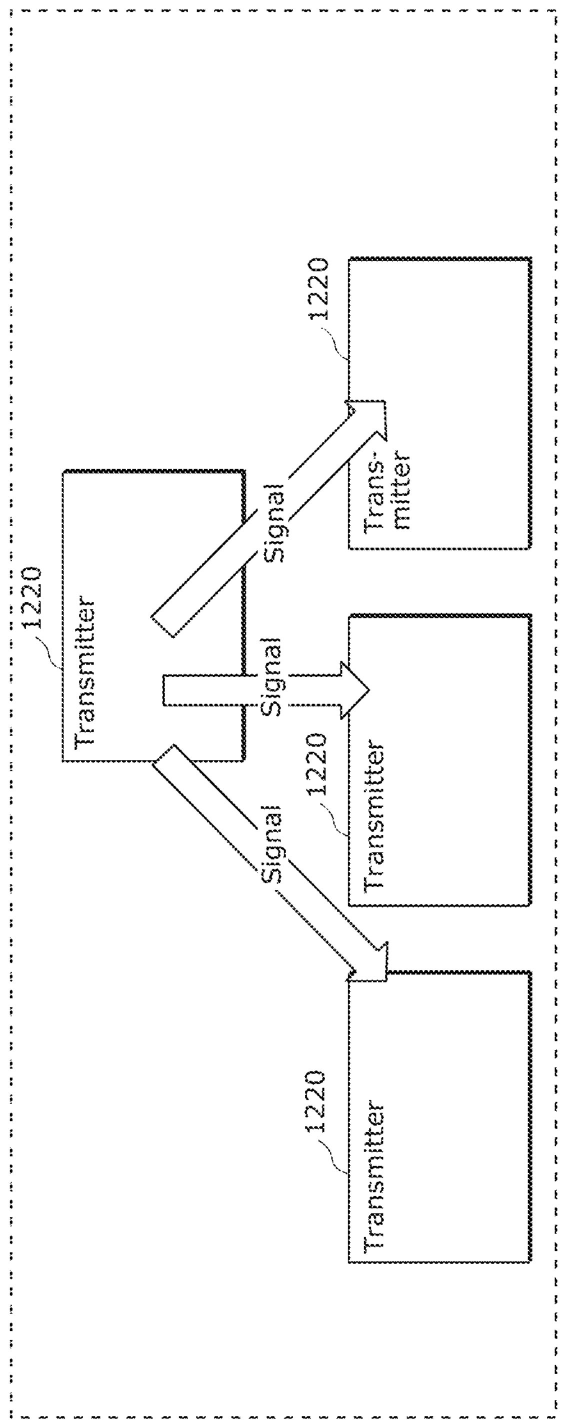
FIG. 105B is a diagram for describing another example of synchronous transmission from a plurality of transmitters in Embodiment 12.

FIG. 105B is a diagram for describing an example of synchronous transmission from a plurality of transmitters in this embodiment.

Among the plurality of transmitters 1220 in this embodiment, one transmitter 1220 serves as a basis for synchronization of visible light signals, and the other transmitters 1220 transmit visible light signals in line with this basis.

This allows many transmitters to transmit visible light signals in more accurate synchronization.

Figure 106:
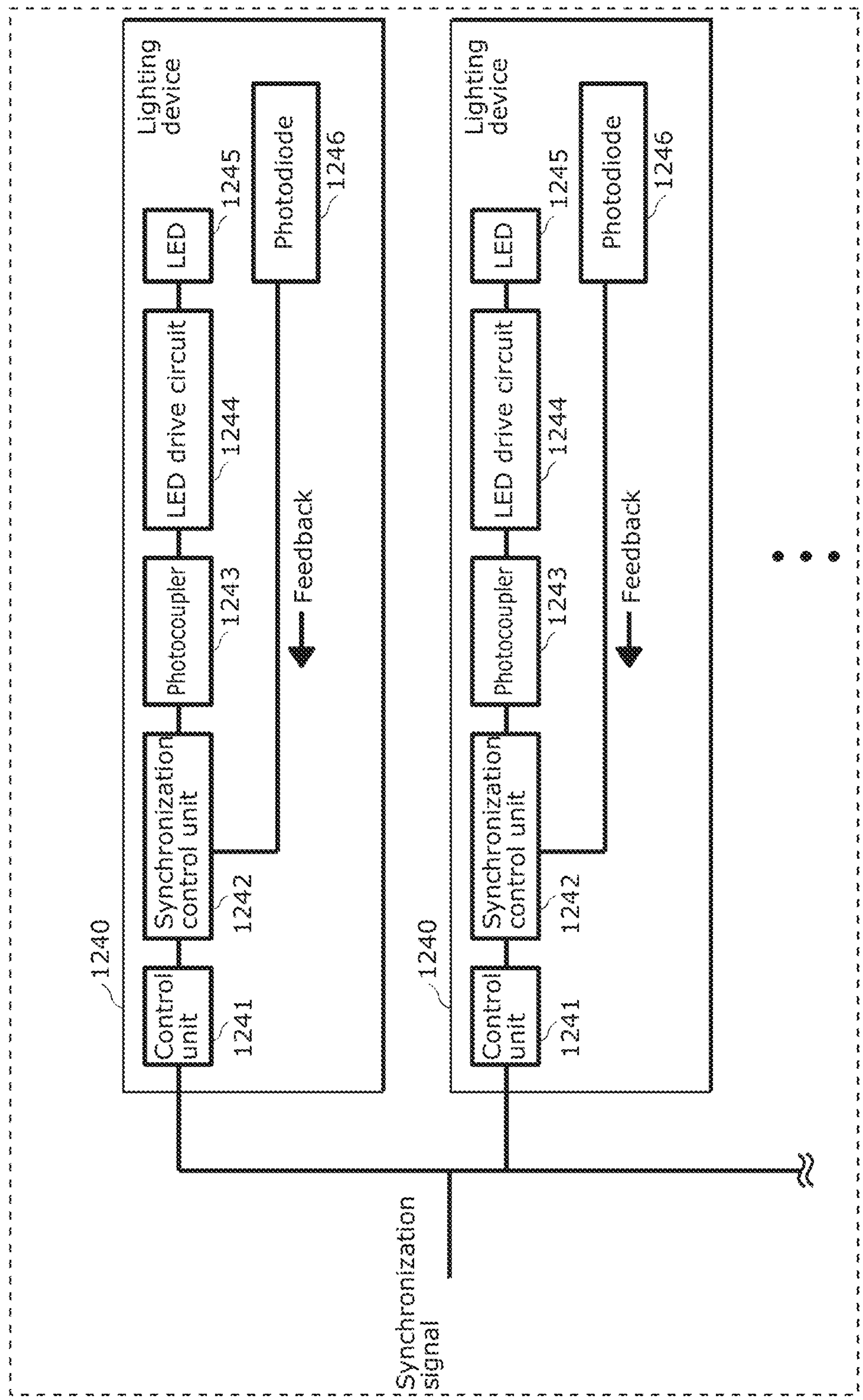
FIG. 106 is a diagram for describing another example of synchronous transmission from a plurality of transmitters in Embodiment 12.

FIG. 106 is a diagram for describing another example of synchronous transmission from a plurality of transmitters in this embodiment.

Each of the transmitters 1240 in this embodiment receives a synchronization signal and transmits a visible light signal according to the synchronization signal. Thus, visible light signals are transmitted from the transmitters 1240 in synchronization.

Specifically, each of the transmitters 1240 includes a control unit 1241, a synchronization control unit 1242, a photocoupler 1243, an LED drive circuit 1244, an LED 1245, and a photodiode 1246.

The control unit 1241 receives a synchronization signal and outputs the synchronization signal to the synchronization control unit 1242.

The LED 1245 is a light source which outputs visible light and blinks (that is, changes in luminance) under the control of the LED drive circuit 1244. Thus, a visible light signal is transmitted from the LED 1245 to the outside of the transmitter 1240.

The photocoupler 1243 transfers signals between the synchronization control unit 1242 and the LED drive circuit 1244 while providing electrical insulation therebetween. Specifically, the photocoupler 1243 transfers to the LED drive circuit 1244 the later-described transmission start signal transmitted from the synchronization control unit 1242.

When the LED drive circuit 1244 receives a transmission start signal from the synchronization control unit 1242 via the photocoupler 1243, the LED drive circuit 1244 causes the LED 1245 to transmit a visible light signal at the timing of reception of the transmission start signal.

The photodiode 1246 detects visible light output from the LED 1245, and outputs to the synchronization control unit 1242 a detection signal indicating that visible light has been detected.

When the synchronization control unit 1242 receives a synchronization signal from the control unit 1241, the synchronization control unit 1242 transmits a transmission start signal to the LED drive circuit 1244 via the photocoupler 1243. Transmission of this transmission start signal triggers the start of transmission of the visible light signal. When the synchronization control unit 1242 receives the detection signal transmitted from the photodiode 1246 as a result of the transmission of the visible light signal, the synchronization control unit 1242 calculates delay time which is a difference between the timing of reception of the detection signal and the timing of reception of the synchronization signal from the control unit 1241. When the synchronization control unit 1242 receives the next synchronization signal from the control unit 1241, the synchronization control unit 1242 adjusts the timing of transmitting the next transmission start signal based on the calculated delay time. Specifically, the synchronization control unit 1242 adjusts the timing of transmitting the next transmission start signal so that the delay time for the next synchronization signal becomes preset delay time which has been predetermined. Thus, the synchronization control unit 1242 transmits the next transmission start signal at the adjusted timing.

Figure 107:
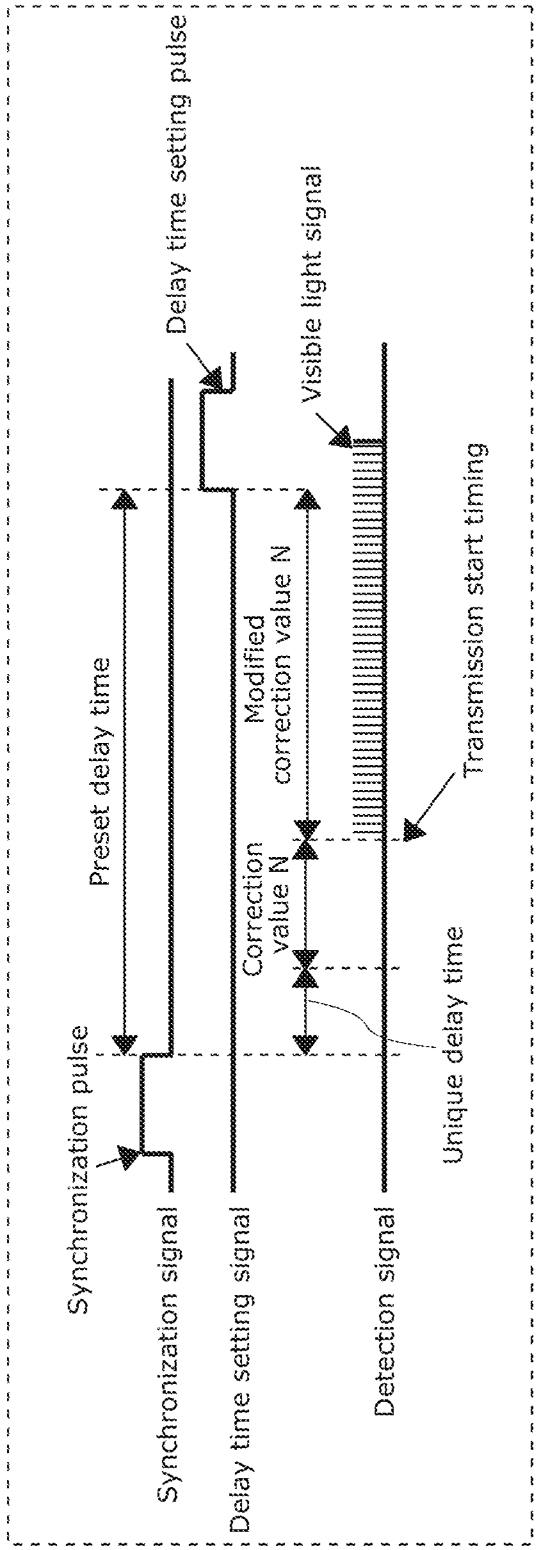

FIG. 107 is a diagram for describing signal processing of the transmitter 1240.

When the synchronization control unit 1242 receives a synchronization signal, the synchronization control unit 1242 generates a delay time setting signal which has a delay time setting pulse at a predetermined timing. Note that the specific meaning of receiving a synchronization signal is receiving a synchronization pulse. More specifically, the synchronization control unit 1242 generates the delay time setting signal so that a rising edge of the delay time setting pulse is observed at a point in time when the above-described preset delay time has elapsed since a falling edge of the synchronization pulse.

The synchronization control unit 1242 then transmits the transmission start signal to the LED drive circuit 1244 via the photocoupler 1243 at the timing delayed by a previously obtained correction value N from the falling edge of the synchronization pulse. As a result, the LED drive circuit 1244 transmits the visible light signal from the LED 1245. In this case, the synchronization control unit 1242 receives the detection signal from the photodiode 1246 at the timing delayed by a sum of unique delay time and the correction value N from the falling edge of the synchronization pulse. This means that transmission of the visible light signal starts at this timing. This timing is hereinafter referred to as a transmission start timing. Note that the above-described unique delay time is delay time attributed to the photocoupler 1243 or the like circuit, and this delay time is inevitable even when the synchronization control unit 1242 transmits the transmission start signal immediately after receiving the synchronization signal.

The synchronization control unit 1242 identifies, as a modified correction value N, a difference in time between the transmission start timing and a rising edge in the delay time setting pulse. The synchronization control unit 1242 calculates a correction value (N+1) according to correction value (N+1)=correction value N+ modified correction value N, and holds the calculation result. With this, when the synchronization control unit 1242 receives the next synchronization signal (synchronization pulse), the synchronization control unit 1242 transmits the transmission start signal to the LED drive circuit 1244 at the timing delayed by the correction value (N+1) from a falling edge of the synchronization pulse. Note that the modified correction value N can be not only a positive value but also a negative value.

Thus, since each of the transmitters 1240 receives the synchronization signal (the synchronization pulse) and then transmits the visible light signal after the preset delay time elapses, the visible light signals can be transmitted in accurate synchronization. Specifically, even when there is a variation in the unique delay time for the transmitters 1240 which is attributed to the photocoupler 1243 and the like circuit, transmission of visible light signals from the transmitters 1240 can be accurately synchronized without being affected by the variation.

Note that the LED drive circuit consumes high power and is electrically insulated using the photocoupler or the like from the control circuit which handles the synchronization signals. Therefore, when such a photocoupler is used, the above-mentioned variation in the unique delay time makes it difficult to synchronize transmission of visible light signals from transmitters. However, in the transmitters 1240 in this embodiment, the photodiode 1246 detects a timing of light emission of the LED 1245, and the synchronization control unit 1242 detects delay time based on the synchronization signal and makes adjustments so that the delay time becomes the preset delay time (the above-described preset delay time). With this, even when there is an individual-based variation in the photocouplers provided in the transmitters configured as LED lightings, for example, it is possible to transmit visible light signals (for example, visible light IDs) from the LED lightings in highly accurate synchronization.

Note that the LED lighting may be ON or may be OFF in periods other than a visible light signal transmission period. In the case where the LED lighting is ON in periods other than the visible light signal transmission period, the first falling edge of the visible light signal is detected. In the case where the LED lighting is OFF in periods other than the visible light signal transmission period, the first rising edge of the visible light signal is detected.

Note that every time the transmitter 1240 receives the synchronization signal, the transmitter 1240 transmits the visible light signal in the above-described example, but may transmit the visible light signal even when the transmitter 1240 does not receive the synchronization signal. This means that after the transmitter 1240 transmits the visible light signal following the reception of the synchronization signal once, the transmitter 1240 may sequentially transmit visible light signals even without having received synchronization signals. Specifically, the transmitter 1240 may perform sequential transmission, specifically, two to a few thousand time transmission, of a visible light signal, following one-time synchronization signal reception. The transmitter 1240 may transmit a visible light signal according to the synchronization signal once in every 100 milliseconds or once in every few seconds.

When the transmission of a visible light signal according to a synchronization signal is repeated, there is a possibility that the continuity of light emission by the LED 1245 is lost due to the above-described preset delay time. In other words, there may be a slightly long blanking interval. As a result, there is a possibility that blinking of the LED 1245 is visually recognized by humans, that is, what is called flicker may occur. Therefore, the cycle of transmission of the visible light signal by the transmitter 1240 according to the synchronization signal may be 60 Hz or more. With this, blinking is fast and less easily visually recognized by humans. As a result, it is possible to reduce the occurrence of flicker. Alternatively, the transmitter 1240 may transmit a visible light signal according to a synchronization signal in a sufficiently long cycle, for example, once in every few minutes. Although this allows humans to visually recognize blinking, it is possible to prevent blinking from being repeatedly visually recognized in sequence, reducing discomfort brought by flicker to humans.

(Preprocessing for Reception Method)

Figure 108:
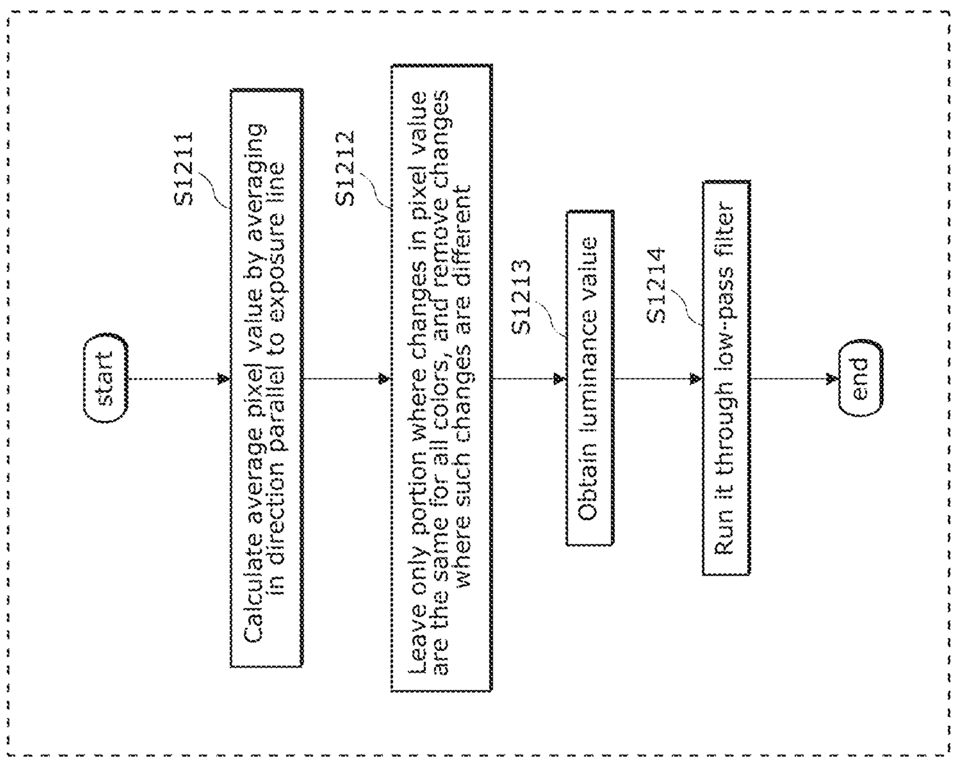
Figure 109:
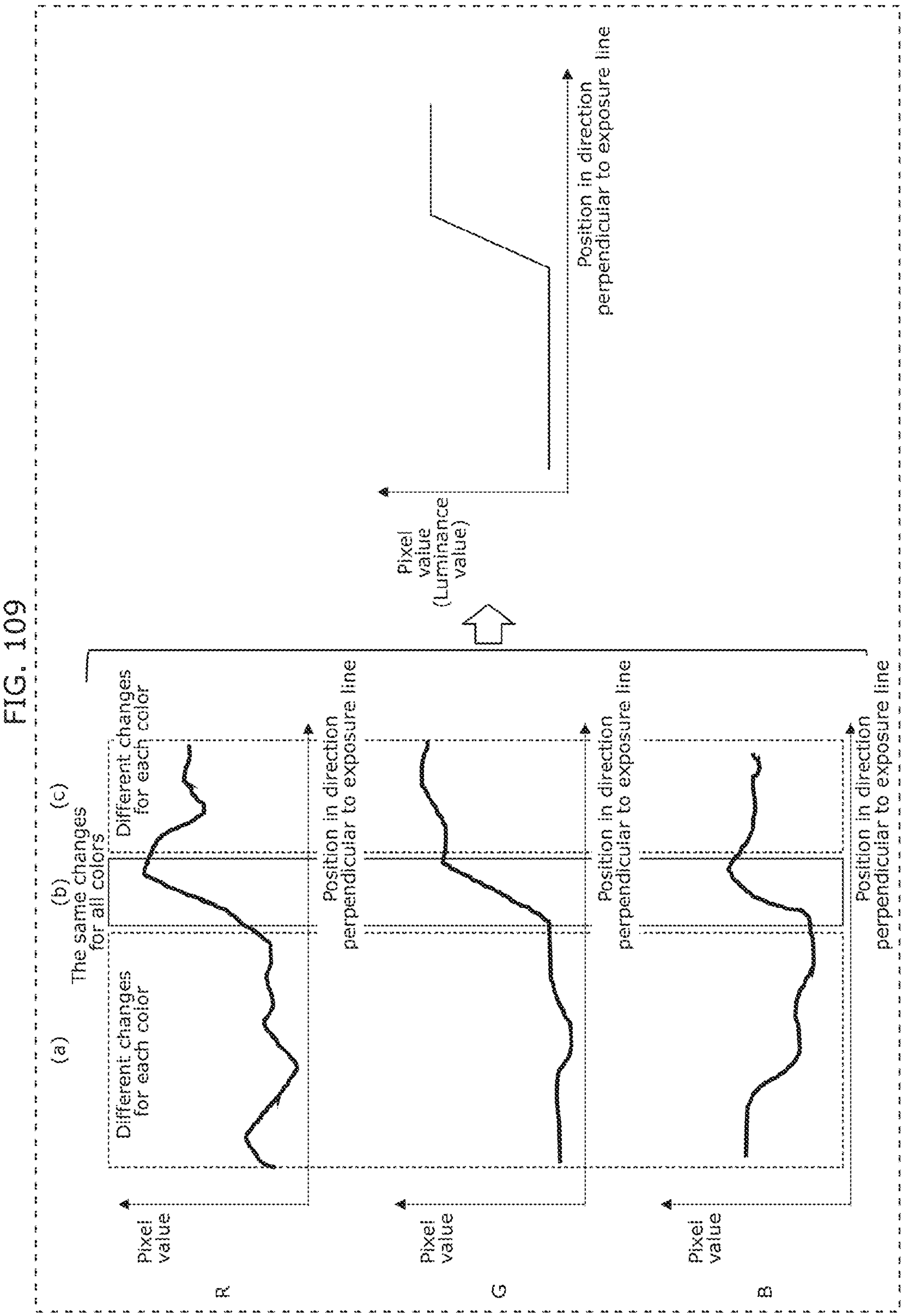

FIG. 108 is a flowchart illustrating an example of a reception method in this embodiment. FIG. 109 is a diagram for describing an example of a reception method in this embodiment.

First, the receiver calculates an average value of respective pixel values of the plurality of pixels aligned parallel to the exposure lines (Step S1211). Averaging the pixel values of N pixels based on the central limit theorem results in the expected value of the amount of noise being N to the negative one-half power, which leads to an improvement of the SN ratio.

Next, the receiver leaves only the portion where changes in the pixel values are the same in the perpendicular direction for all the colors, and removes changes in the pixel values where such changes are different (Step S1212). In the case where a transmission signal (visible light signal) is represented by luminance of the light emitting unit included in the transmitter, the luminance of a backlight in a lighting or a display which is the transmitter changes. In this case, the pixel values change in the same direction for all the colors as in (b) of FIG. 109. In the portions of (a) and (c) of FIG. 109, the pixels values change differently for each color. Since the pixel values in these portions fluctuate due to reception noise or a picture on the display or in a signage, the SN ratio can be improved by removing such fluctuation.

Next, the receiver obtains a luminance value (Step S1213). Since the luminance is less susceptible to color changes, it is possible to remove the influence of a picture on the display or in a signage and improve the SN ratio.

Next, the receiver runs the luminance value through a low-pass filter (Step S1214). In the reception method in this embodiment, a moving average filter based on the length of exposure time is used, with the result that in the high-frequency domain, almost no signals are included; noise is dominant. Therefore, the SN ratio can be improved with the use of the low-pass filter which cuts off high frequency components. Since the amount of signal components is large at the frequencies lower than and equal to the reciprocal of exposure time, it is possible to increase the effect of improving the SN ratio by cutting off signals with frequencies higher than and equal to the reciprocal. If frequency components contained in a signal are limited, the SN ratio can be improved by cutting off components with frequencies higher than the limit of frequencies of the frequency components. A filter which excludes frequency fluctuating components (such as a Butterworth filter) is suitable for the low-pass filter.

(Reception Method using Convolutional Maximum likelihood Decoding)

Figure 110:
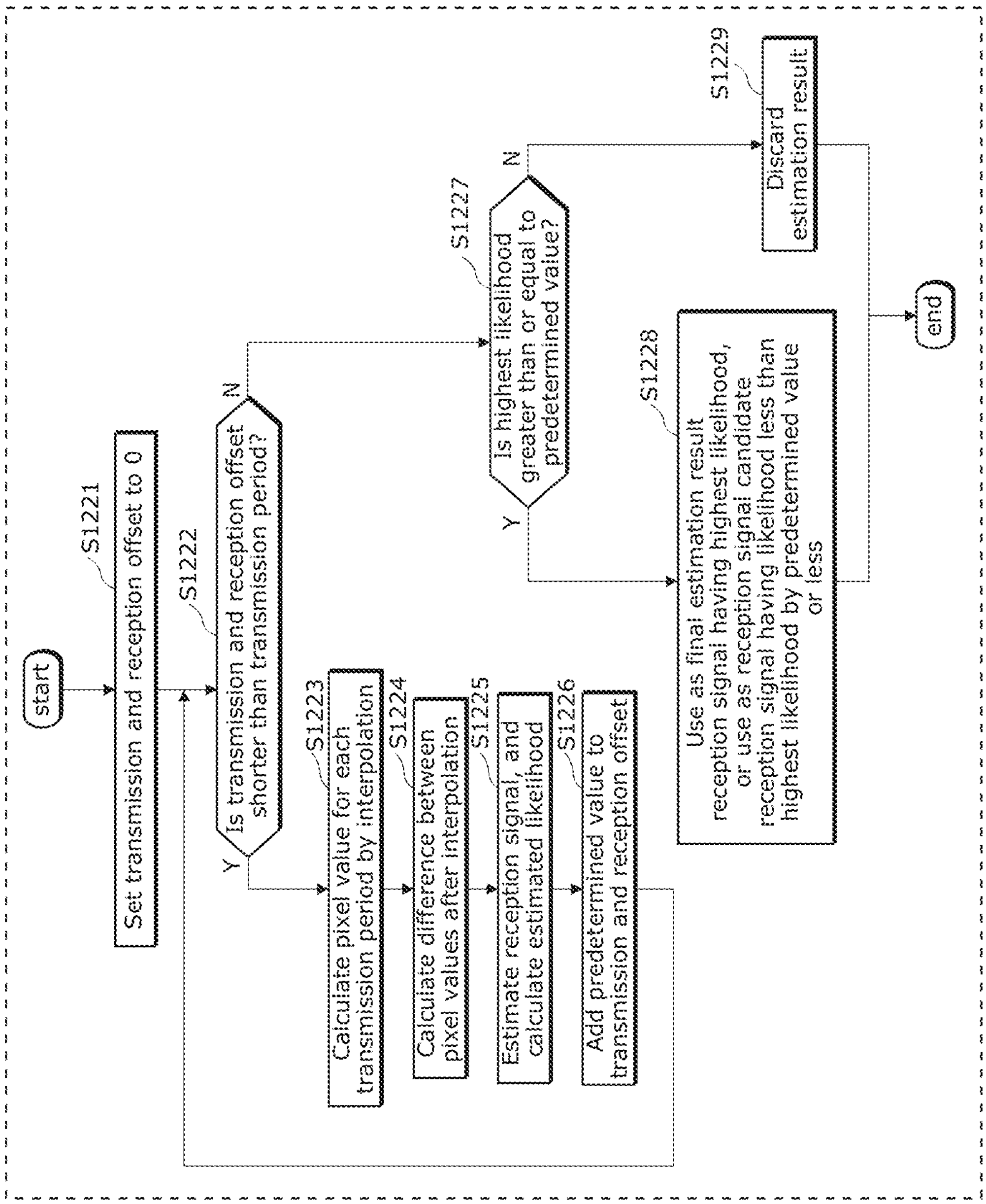

FIG. 110 is a flowchart illustrating another example of a reception method in this embodiment. Hereinafter, a reception method used when the exposure time is longer than the transmission period is described with reference to this figure.

Signals can be received most accurately when the exposure time is an integer multiple of the transmission period. Even when the exposure time is not an integer multiple of the transmission period, signals can be received as long as the exposure time is in the range of about (N±0.33) times (N is an integer) the transmission period.

First, the receiver sets the transmission and reception offset to 0 (Step S1221). The transmission and reception offset is a value for use in modifying a difference between the transmission timing and the reception timing. This difference is unknown, and therefore the receiver changes a candidate value for the transmission and reception offset little by little and adopts, as the transmission and reception offset, a value that agrees most.

Next, the receiver determines whether or not the transmission and reception offset is shorter than the transmission period (Step S1222). Here, since the reception period and the transmission period are not synchronized, the obtained reception value is not always in line with the transmission period. Therefore, when the receiver determines in Step S1222 that the transmission and reception offset is shorter than the transmission period (Step S1222: Y), the receiver calculates, for each transmission period, a reception value (for example, a pixel value) that is in line with the transmission period, by interpolation using a nearby reception value (Step S1223). Linear interpolation, the nearest value, spline interpolation, or the like can be used as the interpolation method. Next, the receiver calculates a difference between the reception values calculated for the respective transmission periods (Step S1224).

The receiver adds a predetermined value to the transmission and reception offset (Step S1226) and repeatedly performs the processing in Step S1222 and the following steps. When the receiver determines in Step S1222 that the transmission and reception offset is not shorter than the transmission period (Step S1222: N), the receiver identifies the highest likelihood among the likelihoods of the reception signals calculated for the respective transmission and reception offsets. The receiver then determines whether or not the highest likelihood is greater than or equal to a predetermined value (Step S1227). When the receiver determines that the highest likelihood is greater than or equal to the predetermined value (Step S1227: Y), the receiver uses, as a final estimation result, a reception signal having the highest likelihood. Alternatively, the receiver uses, as a reception signal candidate, a reception signal having a likelihood less than the highest likelihood by a predetermined value or less (Step S1228). When the receiver determines in Step S1227 that the highest likelihood is less than the predetermined value (Step S1227: N), the receiver discards the estimation result (Step S1229).

When there is too much noise, the reception signal often cannot be properly estimated, and the likelihood is low at the same time. Therefore, the reliability of reception signals can be enhanced by discarding the estimation result when the likelihood is low. The maximum likelihood decoding has a problem that even when an input image does not contain an effective signal, an effective signal is output as an estimation result. However, also in this case, the likelihood is low, and therefore this problem can be avoided by discarding the estimation result when the likelihood is low.

Embodiment 13

In this embodiment, how to send a protocol of the visible light communication is described.

(Multi-Level Amplitude Pulse Signal)

Figure 111:
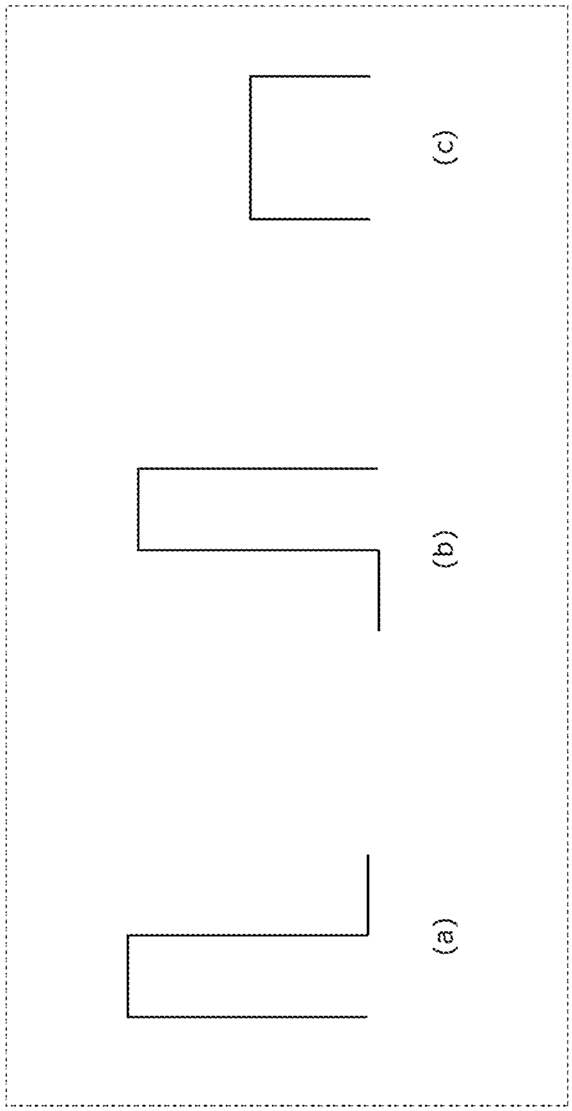
Figure 112:
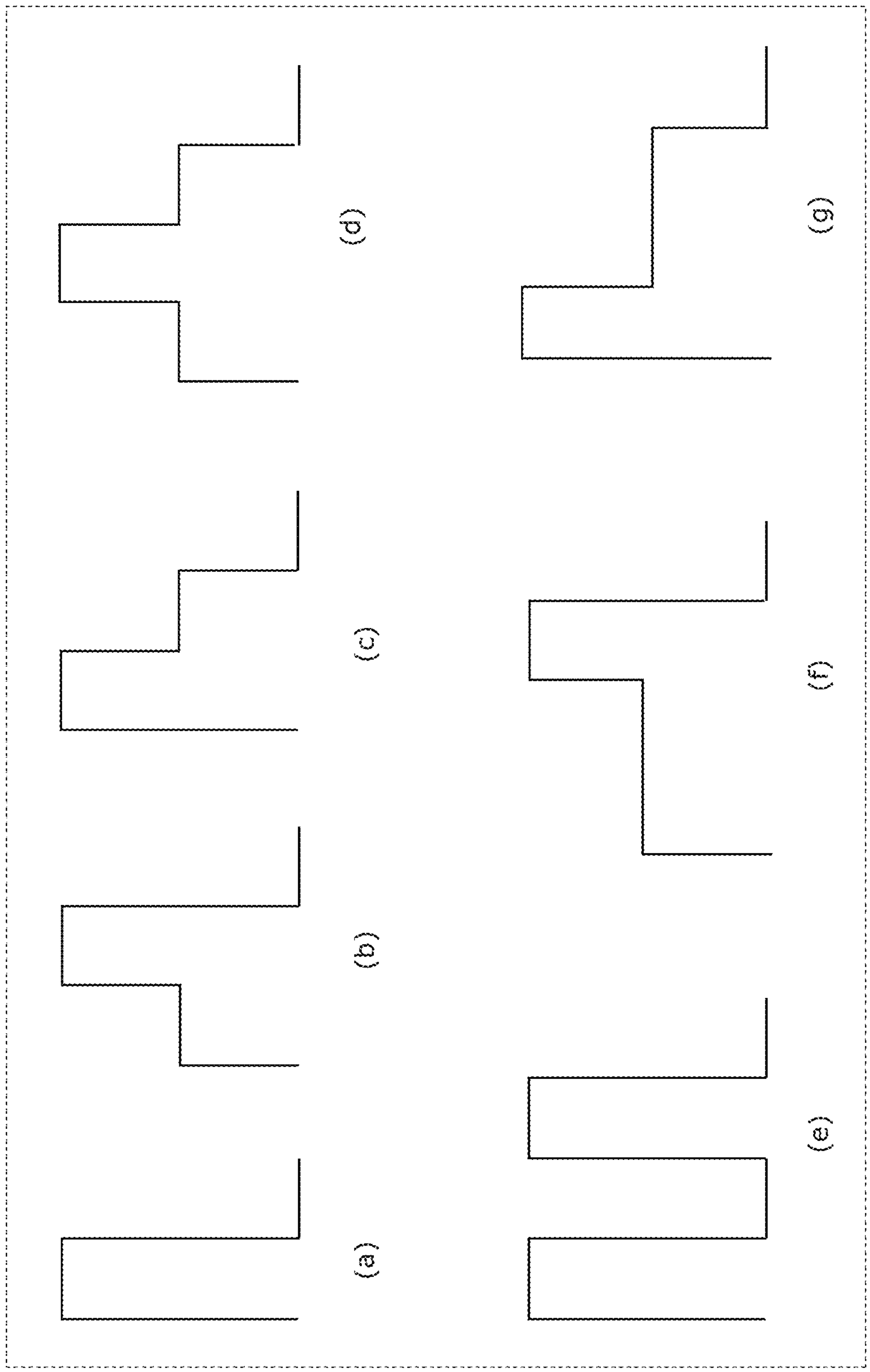
Figure 113:
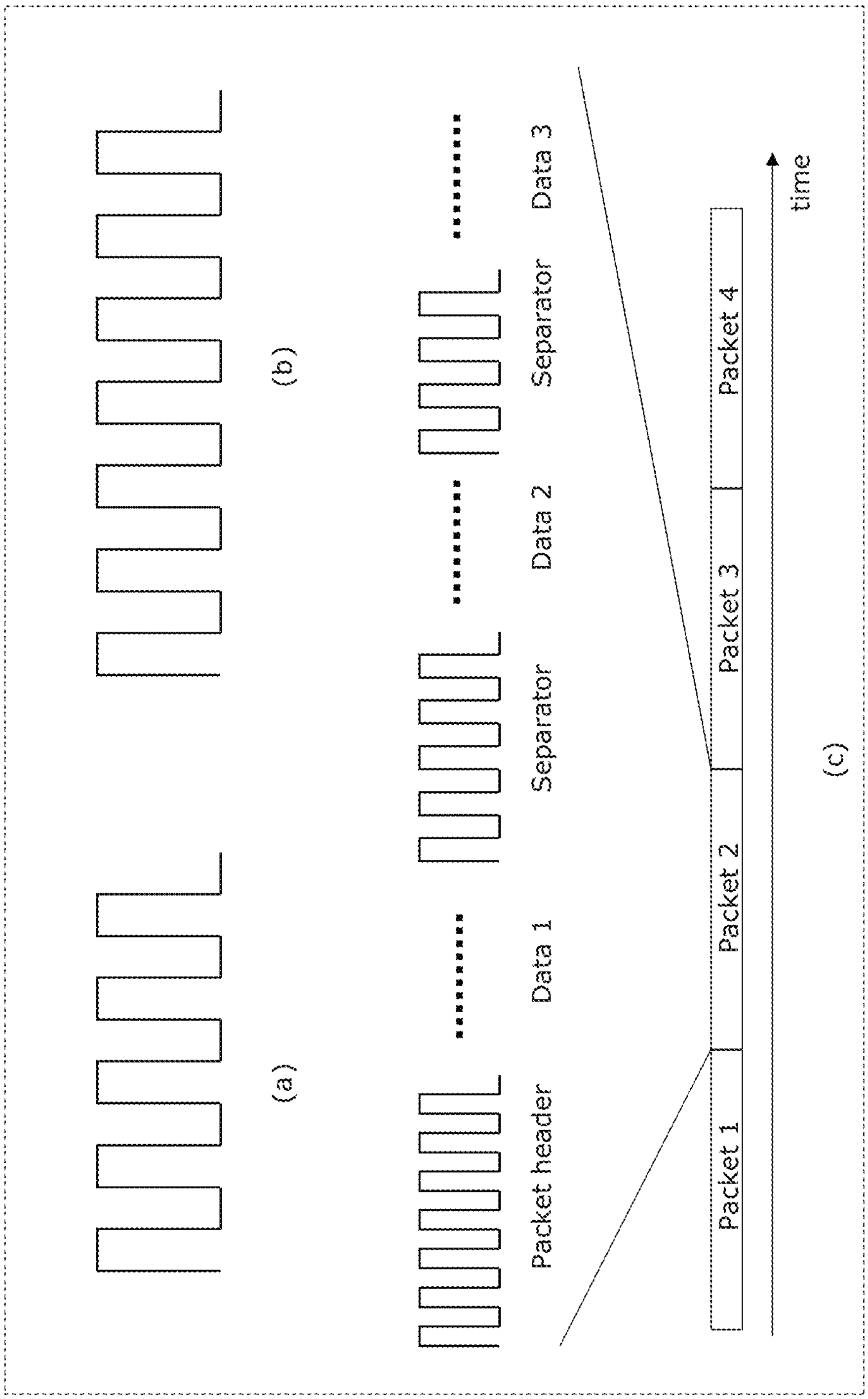

FIG. 111, FIG. 112, and FIG. 113 are diagrams each illustrating an example of a transmission signal in this embodiment.

Pulse amplitude is given a meaning, and thus it is possible to represent a larger amount of information per unit time. For example, amplitude is classified into three levels, which allows three values to be represented in 2-slot transmission time with the average luminance maintained at 50% as in FIG. 111. However, when (c) of FIG. 111 continues in transmission, it is hard to notice the presence of the signal because the luminance does not change. In addition, three values are a little hard to handle in digital processing.

In view of this, four symbols of (a) to (d) of FIG. 112 are used to allow four values to be represented in average 3-slot transmission time with the average luminance maintained at 50%. Although the transmission time differs depending on the symbol, the last state of a symbol is set to a low-luminance state so that the end of the symbol can be recognized. The same effect can be obtained also when the high-luminance state and the low-luminance state are interchanged. It is not appropriate to use (e) of FIG. 112 because this is indistinguishable from the case where the signal in (a) of FIG. 112 is transmitted twice. In the case of (f) and (g) of FIG. 112, it is a little hard to recognize such signals because intermediate luminance continues, but such signals are usable.

Assume that patterns in (a) and (b) of FIG. 113 are used as a header. Spectral analysis shows that a particular frequency component is strong in these patterns. Therefore, when these patterns are used as a header, the spectral analysis enables signal detection.

As in (c) of FIG. 113, a transmission packet is configured using the patterns illustrated in (a) and (b) of FIG. 113. The pattern of a specific length is provided as the header of the entire packet, and the pattern of a different length is used as a separator, which allows data to be partitioned. Furthermore, signal detection can be facilitated when this pattern is included at a midway position of the signal. With this, even when the length of one packet is longer than the length of time that an image of one frame is captured, the receiver can combine and decode data items. This also makes it possible to provide a variable-length packet by adjusting the number of separators. The length of the pattern of a packet header may represent the length of the entire packet. In addition, the separator may be used as the packet header, and the length of the separator may represent the address of data, allowing the receiver to combine partial data items that have been received.

The transmitter repeatedly transmits a packet configured as just described. Packets 1 to 4 in (c) of FIG. 113 may have the same content, or may be different data items which are combined at the receiver side.

Embodiment 14

This embodiment describes each example of application using a receiver such as a smartphone and a transmitter for transmitting information as a blink pattern of an LED or an organic EL device in each of the embodiments described above.

Figure 114A:
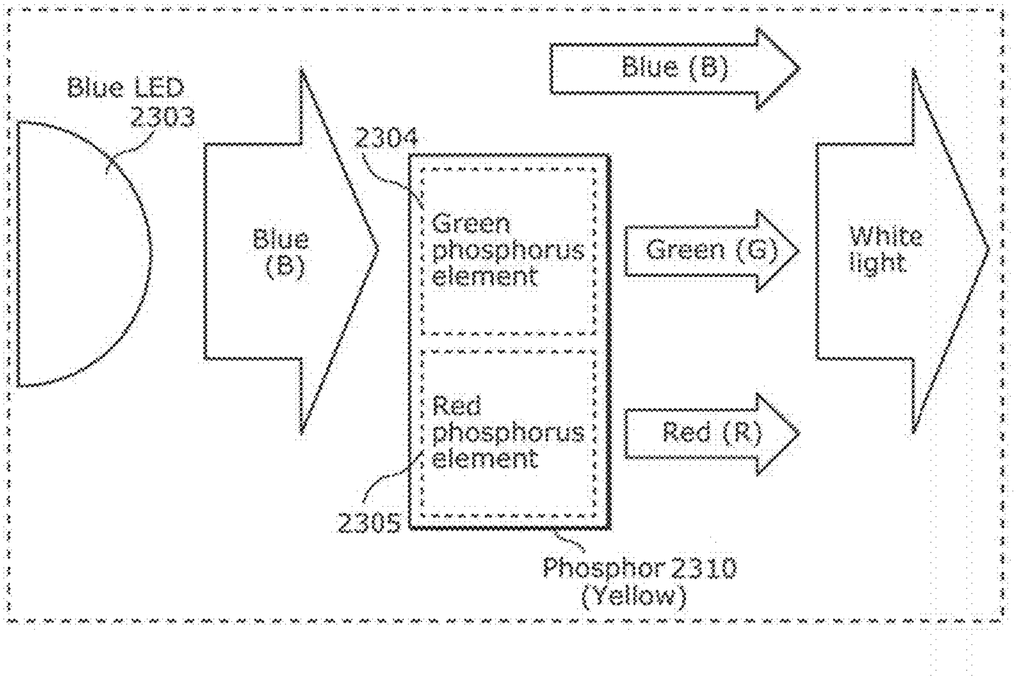

FIG. 114A is a diagram for describing a transmitter in this embodiment.

A transmitter in this embodiment is configured as a backlight of a liquid crystal display, for example, and includes a blue LED 2303 and a phosphor 2310 including a green phosphorus element 2304 and a red phosphorus element 2305.

The blue LED 2303 emits blue (B) light. When the phosphor 2310 receives as excitation light the blue light emitted by the blue LED 2303, the phosphor 2310 produces yellow (Y) luminescence. That is, the phosphor 2310 emits yellow light. In detail, since the phosphor 2310 includes the green phosphorus element 2304 and the red phosphorus element 2305, the phosphor 2130 emits yellow light by the luminescence of these phosphorus elements. When the green phosphorus element 2304 out of these two phosphorus elements receives as excitation light the blue light emitted by the blue LED 2303, the green phosphorus element 2304 produces green luminescence. That is, the green phosphorus element 2304 emits green (G) light. When the red phosphorus element 2305 out of these two phosphorus elements receives as excitation light the blue light emitted by the blue LED 2303, the red phosphorus element 2305 produces red luminescence. That is, the red phosphorus element 2305 emits red (R) light. Thus, each light of RGB or Y (RG) B is emitted, with the result that the transmitter outputs white light as a backlight.

This transmitter transmits a visible light signal of white light by changing luminance of the blue LED 2303 as in each of the above embodiments. At this time, the luminance of the white light is changed to output a visible light signal having a predetermined carrier frequency.

A barcode reader emits red laser light to a barcode and reads a barcode based on a change in the luminance of the red laser light reflected off the barcode. There is a case where a frequency of this red laser light used to read the barcode is equal or approximate to a carrier frequency of a visible light signal outputted from a typical transmitter that has been in practical use today. In this case, an attempt by the barcode reader to read the barcode irradiated with white light, i.e., a visible light signal transmitted from the typical transmitter, may fail due to a change in the luminance of red light included in the white light. In short, an error occurs in reading a barcode due to interference between the carrier frequency of a visible light signal (in particular, red light) and the frequency used to read the barcode.

In order to prevent this, in this embodiment, the red phosphorus element 2305 includes a phosphorus material having higher persistence than the green phosphorus element 2304. This means that in this embodiment, the red phosphorus element 2305 changes in luminance at a sufficiently lower frequency than a luminance change frequency of the blue LED 2303 and the green phosphorus element 2304. In other words, the red phosphorus element 2305 reduces the luminance change frequency of a red component included in the visible light signal.

Figure 114B:
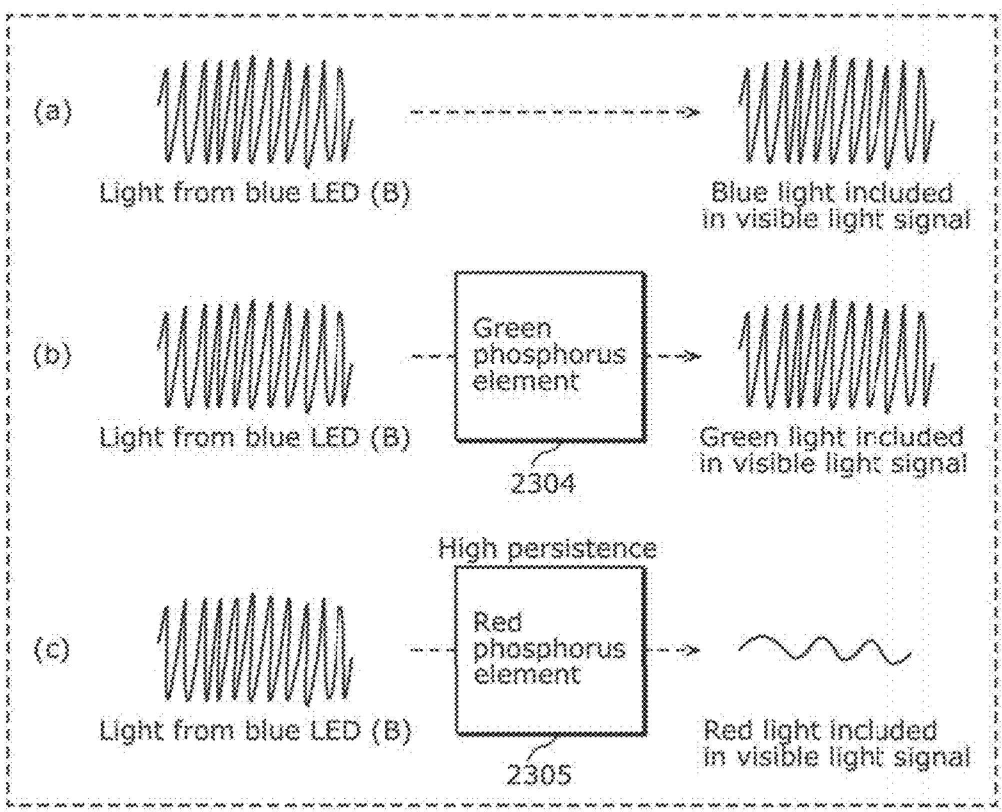

FIG. 114B is a diagram illustrating a change in luminance of each of R, G, and B.

Blue light being outputted from the blue LED 2303 is included in the visible light signal as illustrated in (a) in FIG. 114B. The green phosphorus element 2304 receives the blue light from the blue LED 2303 and produces green luminescence as illustrated in (b) in FIG. 114B. This green phosphorus element 2304 has low persistence. Therefore, when the blue LED 2303 changes in luminance, the green phosphorus element 2304 emits green light that changes in luminance at substantially the same frequency as the luminance change frequency of the blue LED 2303 (that is, the carrier frequency of the visible light signal).

The red phosphorus element 2305 receives the blue light from the blue LED 2303 and produces red luminescence as illustrated in (c) in FIG. 114B. This red phosphorus element 2305 has high persistence. Therefore, when the blue LED 2303 changes in luminance, the red phosphorus element 2305 emits red light that changes in luminance at a lower frequency than the luminance change frequency of the blue LED 2303 (that is, the carrier frequency of the visible light signal).

Figure 115:
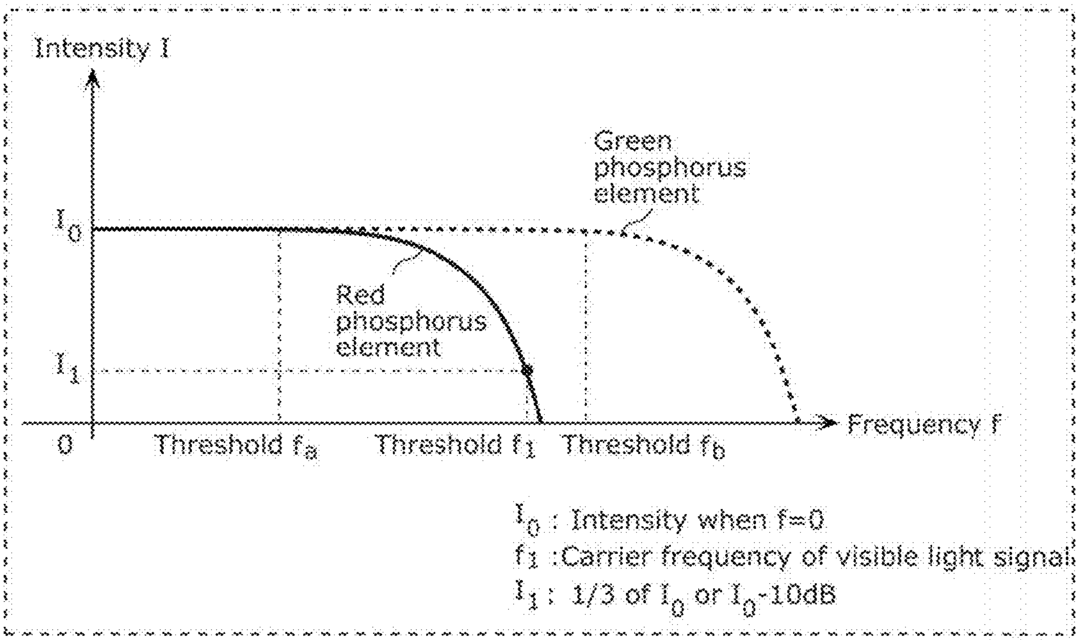

FIG. 115 is a diagram illustrating persistence properties of the green phosphorus element 2304 and the red phosphorus element 2305 in this embodiment.

When the blue LED 2303 is ON without changing in luminance, for example, the green phosphorus element 2304 emits green light having intensity $I=I_0$ without changing in luminance (i.e. light having a luminance change frequency f=0). Furthermore, even when the blue LED 2303 changes in luminance at a low frequency, the green phosphorus element 2304 emits green light that has intensity $I=I_0$ and changes in luminance at frequency f that is substantially the same as the low frequency. In contrast, when the blue LED 2303 changes in luminance at a high frequency, the intensity I of the green light, emitted from the green phosphorus element 2304, that changes in luminance at the frequency f that is substantially the same as the high frequency, is lower than intensity $I_0$ due to influence of an afterglow of the green phosphorus element 2304. As a result, the intensity I of green light emitted from the green phosphorus element 2304 continues to be equal to $I_0$ ($I=I_0$) when the frequency f of luminance change of the light is less than a threshold $f_b$, and is gradually lowered when the frequency f increases over the threshold $f_b$ as indicated by a dotted line in FIG. 115.

Furthermore, in this embodiment, persistence of the red phosphorus element 2305 is higher than persistence of the green phosphorus element 2304. Therefore, the intensity I of red light emitted from the red phosphorus element 2305 continues to be equal to $I_0$ ($I=I_0$) when the frequency f of luminance change of the light is less than a threshold $f_a$ lower than the above threshold $f_b$, and is gradually lowered when the frequency f increases over the threshold $f_b$ as indicated by a solid line in FIG. 115. In other words, the red light emitted from the red phosphorus element 2305 is not seen in a high frequency region, but is seen only in a low frequency region, of a frequency band of the green light emitted from the green phosphorus element 2304.

More specifically, the red phosphorus element 2305 in this embodiment includes a phosphorus material with which the red light emitted at the frequency f that is the same as the carrier frequency $f_1$ of the visible light signal has intensity $I=I_1$. The carrier frequency $f_1$ is a carrier frequency of luminance change of the blue light LED 2303 included in the transmitter. The above intensity $I_1$ is one third intensity of the intensity $I_0$ or ($I_0$-10 dB) intensity. For example, the carrier frequency $f_1$ is 10 kHz or in the range of 5 kHz to 100 kHz.

In detail, the transmitter in this embodiment is a transmitter that transmits a visible light signal, and includes: a blue LED that emits, as light included in the visible light signal, blue light changing in luminance; a green phosphorus element that receives the blue light and emits green light as light included in the visible light signal; and a red phosphorus element that receives the blue light and emits red light as light included in the visible light signal. Persistence of the red phosphorus element is higher than persistence of the green phosphorus element. Each of the green phosphorus element and the red phosphorus element may be included in a single phosphor that receives the blue light and emits yellow light as light included in the visible light signal. Alternatively, it may be that the green phosphorus element is included in a green phosphor and the red phosphorus element is included in a red phosphor that is separate from the green phosphor.

This allows the red light to change in luminance at a lower frequency than a frequency of luminance change of the blue light and the green light because the red phosphorus element has higher persistence. Therefore, even when the frequency of luminance change of the blue light and the green light included in the visible light signal of the white light is equal or approximate to the frequency of red laser light used to read a barcode, the frequency of the red light included in the visible light signal of the white light can be significantly different from the frequency used to read a barcode. As a result, it is possible to reduce the occurrences of errors in reading a barcode.

The red phosphorus element may emit red light that changes in luminance at a lower frequency than a luminance change frequency of the light emitted from the blue LED.

Furthermore, the red phosphorus element may include: a red phosphorus material that receives blue light and emits red light; and a low-pass filter that transmits only light within a predetermined frequency band. For example, the low-pass filter transmits, out of the blue light emitted from the blue LED, only light within a low-frequency band so that the red phosphorus material is irradiated with the light. Note that the red phosphorus material may have the same persistence properties as the green phosphorus element. Alternatively, the low-pass filter transmits only light within a low-frequency band out of the red light emitted from the red phosphorus material as a result of the red phosphorus material being irradiated with the blue light emitted from the blue LED. Even when the low-pass filter is used, it is possible to reduce the occurrences of errors in reading a barcode as in the above-mentioned case.

Furthermore, the red phosphor element may be made of a phosphor material having a predetermined persistence property. For example, the predetermined persistence property is such that, assume that (a) $I_0$ is intensity of the red light emitted from the red phosphorus element when a frequency f of luminance change of the red light is 0 and (b) $f_1$ is a carrier frequency of luminance change of the light emitted from the blue LED, the intensity of the red light is not greater than one third of $I_0$ or ($I_0$-10 dB) when the frequency f of the red light is equal to ($f=f_1$).

With this, the frequency of the red light included in the visible light signal can be reliably significantly different from the frequency used to read a barcode. As a result, it is possible to reliably reduce the occurrences of errors in reading a barcode.

Furthermore, the carrier frequency $f_1$ may be approximately 10 kHz.

With this, since the carrier frequency actually used to transmit the visible light signal today is 9.6 kHz, it is possible to effectively reduce the occurrences of errors in reading a barcode during such actual transmission of the visible light signal.

Furthermore, the carrier frequency $f_1$ may be approximately 5 kHz to 100 kHz.

With the advancement of an image sensor (an imaging element) of the receiver that receives the visible light signal, a carrier frequency of 20 kHz, 40 kHz, 80 kHz, 100 kHz, or the like is expected to be used in future visible light communication. Therefore, as a result of setting the above carrier frequency $f_1$ to approximately 5 kHz to 100 kHz, it is possible to effectively reduce the occurrences of errors in reading a barcode even in future visible light communication.

Note that in this embodiment, the above advantageous effects can be produced regardless of whether the green phosphorus element and the red phosphorus element are included in a single phosphor or these two phosphor elements are respectively included in separate phosphors. This means that even when a single phosphor is used, respective persistence properties, that is, frequency characteristics, of red light and green light emitted from the phosphor are different from each other. Therefore, the above advantageous effects can be produced even with the use of a single phosphor in which the persistence property or frequency characteristic of red light is lower than the persistence property or frequency characteristic of green light. Note that lower persistence property or frequency characteristic means higher persistence or lower light intensity in a high-frequency band, and higher persistence property or frequency characteristic means lower persistence or higher light intensity in a high-frequency band.

Although the occurrences of errors in reading a barcode are reduced by reducing the luminance change frequency of the red component included in the visible light signal in the example illustrated in FIGS. 114A to 115, the occurrences of errors in reading a barcode may be reduced by increasing the carrier frequency of the visible light signal.

Figure 116:
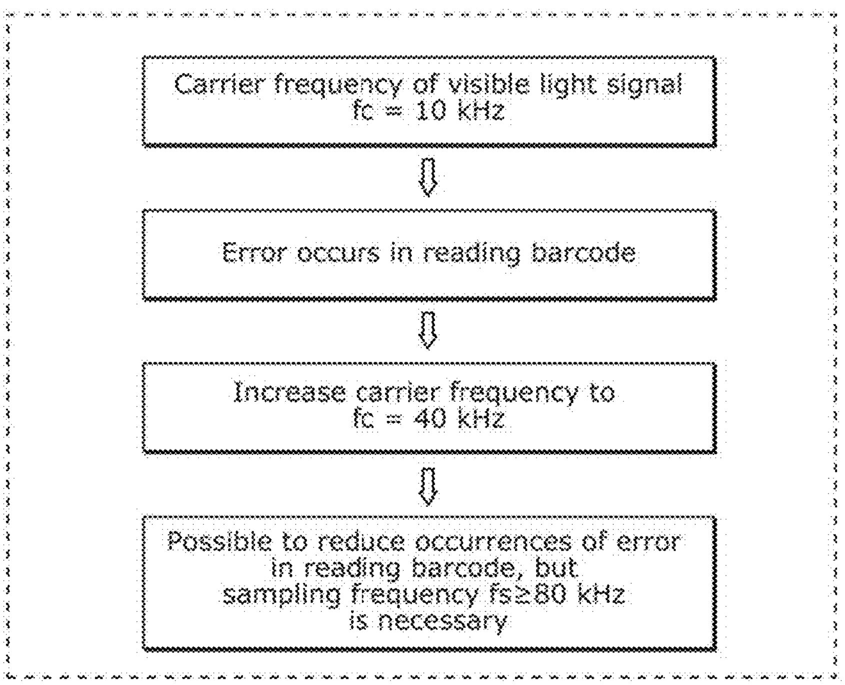

FIG. 116 is a diagram for explaining a new problem that will occur in an attempt to reduce errors in reading a barcode.

As illustrated in FIG. 116, when the carrier frequency $f_c$ of the visible light signal is about 10 kHz, the frequency of red laser light used to read a barcode is also about 10 kHz to 20 kHz, with the result that these frequencies are interfered with each other, causing an error in reading the barcode.

Therefore, the carrier frequency $f_c$ of the visible light signal is increased from about 10 kHz to, for example, 40 kHz so that the occurrences of errors in reading a barcode can be reduced.

However, when the carrier frequency $f_c$ of the visible light signal is about 40 kHz, a sampling frequency $f_s$ for the receiver to sample the visible light signal by capturing an image needs to be 80 kHz or more.

In other words, since the sampling frequency $f_s$ required by the receiver is high, an increase in the processing load on the receiver occurs as a new problem. Therefore, in order to solve this new problem, the receiver in this embodiment performs downsampling.

Figure 117:
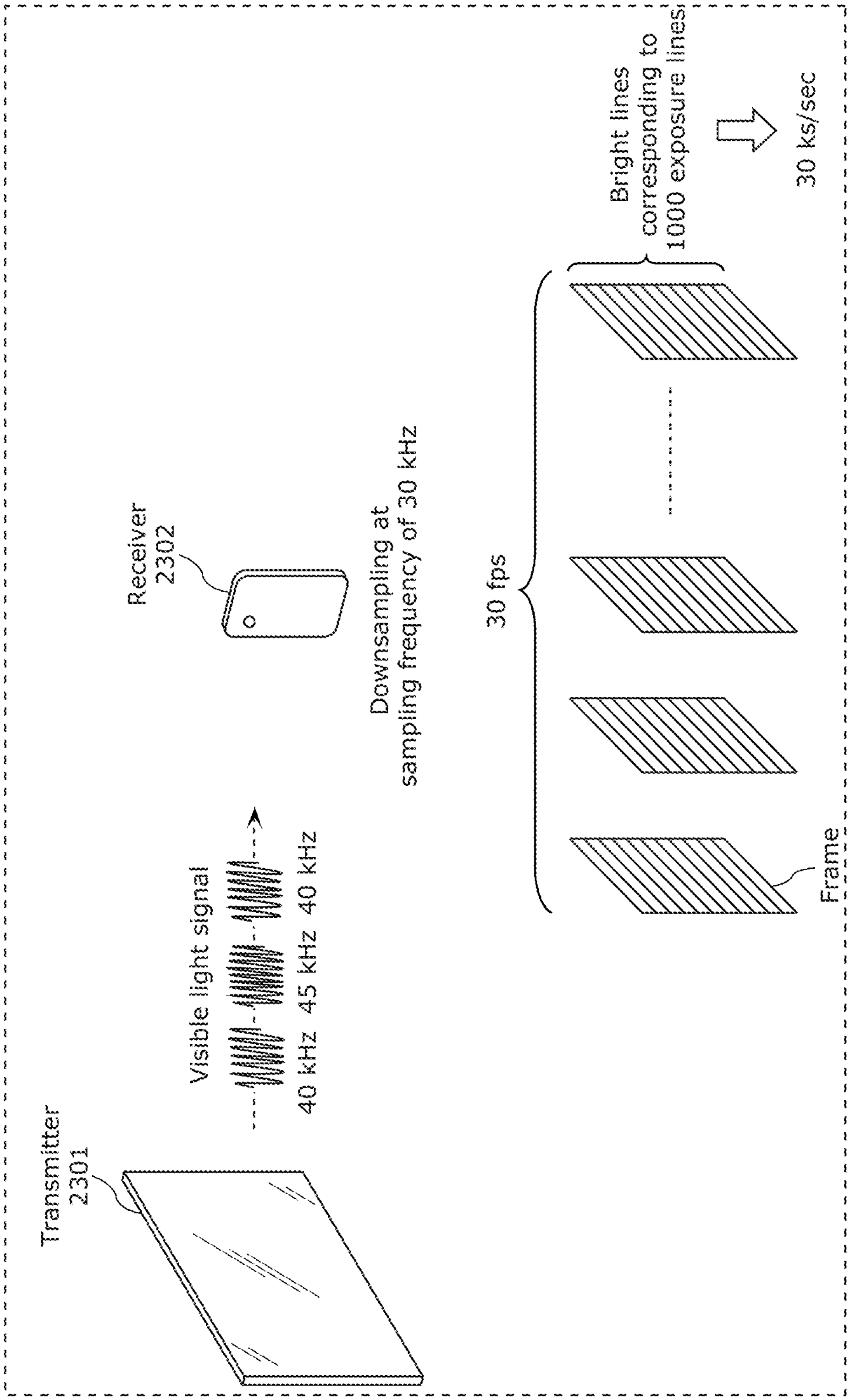

FIG. 117 is a diagram for describing downsampling performed by the receiver in this embodiment.

A transmitter 2301 in this embodiment is configured as a liquid crystal display, a digital signage, or a lighting device, for example. The transmitter 2301 outputs a visible light signal, the frequency of which has been modulated. At this time, the transmitter 2301 switches the carrier frequency $f_c$ of the visible light signal between 40 kHz and 45 kHz, for example.

A receiver 2302 in this embodiment captures images of the transmitter 2301 at a frame rate of 30 fps, for example. At this time, the receiver 2302 captures the images with a short exposure time so that a bright line appears in each of the captured images (specifically, frames), as with the receiver in each of the above embodiments. An image sensor used in the imaging by the receiver 2302 includes 1,000 exposure lines, for example. Therefore, upon capturing one frame, each of the 1,000 exposure lines starts exposure at different timings to sample a visible light signal. As a result, the sampling is performed 30,000 times (30 fps×1,000 lines) per second (30 ks/sec). In other words, the sampling frequency $f_s$ of the visible light signal is 30 kHz.

According to a general sampling theorem, only the visible light signals having a carrier frequency of 15 kHz or less can be demodulated at the sampling frequency $f_s$ of 30 kHz.

However, the receiver 2302 in this embodiment performs downsampling of the visible light signals having a carrier frequency $f_c$ of 40 kHz or 45 kHz at the sampling frequency $f_s$ of 30 kHz. This downsampling causes aliasing on the frames. The receiver 2302 in this embodiment observes and analyzes the aliasing to estimate the carrier frequency $f_c$ of the visible light signal.

FIG. 118 is a flowchart illustrating processing operation of the receiver 2302 in this embodiment.

First, the receiver 2302 captures an image of a subject and performs downsampling of the visible light signal of a carrier frequency $f_c$ of 40 kHz or 45 kHz at a sampling frequency $f_s$ of 30 kHz (Step S2310).

Next, the receiver 2302 observes and analyzes aliasing on a resultant frame caused by the downsampling (Step S2311). By doing so, the receiver 2302 identifies a frequency of the aliasing as, for example, 5.1 kHz or 5.5 kHz.

The receiver 2302 then estimates the carrier frequency $f_c$ of the visible light signal based on the identified frequency of the aliasing (Step S2311). That is, the receiver 2302 restores the original frequency based on the aliasing. Here, the receiver 2302 estimates the carrier frequency $f_c$ of the visible light signal as, for example, 40 kHz or 45 kHz.

Thus, the receiver 2302 in this embodiment can appropriately receive the visible light signal having a high carrier frequency by performing downsampling and restoring the frequency based on aliasing. For example, the receiver 2302 can receive the visible light signal of a carrier frequency of 30 kHz to 60 kHz even when the sampling frequency $f_s$ is 30 kHz. Therefore, it is possible to increase the carrier frequency of the visible light signal from a frequency actually used today (about 10 kHz) to between 30 kHz and 60 kHz. As a result, the carrier frequency of the visible light signal and the frequency used to read a barcode (10 kHz to 20 kHz) can be significantly different from each other so that interference between these frequencies can be reduced. As a result, it is possible to reduce the occurrences of errors in reading a barcode.

A reception method in this embodiment is a reception method of obtaining information from a subject, the reception method including: an exposure time setting step of setting an exposure time of an image sensor so that, in a frame obtained by capturing the subject by the image sensor, a plurality of bright lines corresponding to a plurality of exposure lines included in the image sensor appear according to a change in luminance of the subject; a capturing step of capturing the subject changing in luminance, by the image sensor at a predetermined frame rate and with the set exposure time by repeating starting exposure sequentially for the plurality of the exposure lines in the image sensor each at a different time; and an information obtainment step of obtaining the information by demodulating, for each frame obtained by the capturing, data specified by a pattern of the plurality of the bright lines included in the frame. In the capturing step, sequential starts of exposure for the plurality of exposure lines each at a different time are repeated to perform, on the visible light signal transmitted from the subject changing in luminance, downsampling at a sampling frequency lower than a carrier frequency of the visible light signal. In the information obtainment step, for each frame obtained by the capturing, a frequency of aliasing specified by a pattern of the plurality of bright lines included in the frame is identified, a frequency of the visible light signal is estimated based on the identified frequency of the aliasing, and the estimated frequency of the visible light signal is demodulated to obtain the information.

With this reception method, it is possible to appropriately receive the visible light signal having a high carrier frequency by performing downsampling and restoring the frequency based on aliasing.

The downsampling may be performed on the visible light signal having a carrier frequency higher than 30 kHz. This makes it possible to avoid interference between the carrier frequency of the visible light signal and the frequency used to read a barcode (10 kHz to 20 kHz) so that the occurrences of errors in reading a barcode can be effectively reduced.

Embodiment 15

FIG. 119 is a diagram illustrating processing operation of a reception device (an imaging device). Specifically, FIG. 119 is a diagram for describing an example of a process of switching between a normal imaging mode and a macro imaging mode in the case of reception in visible light communication.

A reception device 1610 receives visible light emitted by a transmission device including a plurality of light sources (four light sources in FIG. 119).

First, when shifted to a mode for visible light communication, the reception device 1610 starts an imaging unit in the normal imaging mode (S1601). Note that when shifted to the mode for visible light communication, the reception device 1610 displays, on a screen, a box 1611 for capturing images of the light sources.

After a predetermined time, the reception device 1610 switches an imaging mode of the imaging unit to the macro imaging mode (S1602). Note that the timing of switching from Step S1601 to Step S1602 may be, instead of when a predetermined time has elapsed after Step S1601, when the reception device 1610 determines that images of the light sources have been captured in such a way that they are included within the box 1611. Such switching to the macro imaging mode allows a user to include the light sources into the box 1611 in a clear image in the normal imaging mode before shifted to the macro imaging mode in which the image is blurred, and thus it is possible to easily include the light sources into the box 1611.

Next, the reception device 1610 determines whether or not a signal from the light source has been received (S1603). When it is determined that a signal from the light source has been received (S1603: Yes), the processing returns to Step S1601 in the normal imaging mode, and when it is determined that a signal from the light sources has not been received (S1603: No), the macro imaging mode in Step 1602 continues. Note that when Yes in Step S1603, a process based on the received signal (e.g. a process of displaying an image represented by the received signal) may be performed.

With this reception device 1610, a user can switch from the normal imaging mode to the macro imaging mode by touching, with a finger, a display unit of a smartphone where light sources 1611 appear, to capture an image of the light sources that appear blurred. Thus, an image captured in the macro imaging mode includes a larger number of bright regions than an image captured in the normal imaging mode. In particular, light beams from two adjacent light sources among the plurality of the light source cannot be received as continuous signals because striped images are separate from each other as illustrated in the left view in (a) in FIG. 119. However, this problem can be solved when the light beams from the two light sources overlap each other, allowing the light beams to be handled upon demodulation as continuously received signals that are to be continuous striped images as illustrated in the right view in (a) in FIG. 119. Since a long code can be received at a time, this produces an advantageous effect of shortening response time. As illustrated in (b) in FIG. 119, an image is captured with a normal shutter and a normal focal point first, resulting in a normal image which is clear. However, when the light sources are separate from each other like characters, even an increase in shutter speed cannot result in continuous data, leading to a demodulation failure. Next, the shutter speed is increased, and a driver for lens focus is set to close-up (macro), with the result that the four light sources are blurred and expanded to be connected to each other so that the data can be received. Thereafter, the focus is set back to the original one, and the shutter speed is set back to normal, to capture a clear image. Clear images are recorded in a memory and are displayed on the display unit as illustrated in (c). This produces an advantageous effect in that only clear images are displayed on the display unit. As compared to an image captured in the normal imaging mode, an image captured in the macro imaging mode includes a larger number of regions brighter than predetermined brightness. Thus, in the macro imaging mode, it is possible to increase the number of exposure lines that can generate bright lines for the subject.

FIG. 120 is a diagram illustrating processing operation of a reception device (an imaging device). Specifically, FIG. 120 is a diagram for describing another example of the process of switching between the normal imaging mode and the macro imaging mode in the case of reception in the visible light communication.

A reception device 1620 receives visible light emitted by a transmission device including a plurality of light sources (four light sources in FIG. 120).

First, when shifted to a mode for visible light communication, the reception device 1620 starts an imaging unit in the normal imaging mode and captures an image 1623 of a wider range than an image 1622 displayed on a screen of the reception device 1620. Image data and orientation information are held in a memory (S1611). The image data represent the image 1623 captured. The orientation information indicates an orientation of the reception device 1620 detected by a gyroscope, a geomagnetic sensor, and an accelerometer included in the reception device 1620 when the image 1623 is captured. The image 1623 captured is an image, the range of which is greater by a predetermined width in the vertical direction or the horizontal direction with reference to the image 1622 displayed on the screen of the reception device 1620. When shifted to the mode for visible light communication, the reception device 1620 displays, on the screen, a box 1621 for capturing images of the light sources.

After a predetermined time, the reception device 1620 switches an imaging mode of the imaging unit to the macro imaging mode (S1612). Note that the timing of switching from Step S1611 to Step S1612 may be, instead of when a predetermined time has elapsed after Step S1611, when the image 1623 is captured and it is determined that image data representing the image 1623 captured has been held in the memory. At this time, the reception device 1620 displays, out of the image 1623, an image 1624 having a size corresponding to the size of the screen of the reception device 1620 based on the image data held in the memory.

Note that the image 1624 displayed on the reception device 1620 at this time is a part of the image 1623 that corresponds to a region predicted to be currently captured by the reception device 1620, based on a difference between an orientation of the reception device 1620 represented by the orientation information obtained in Step S1611 (a position indicated by a white broken line) and a current orientation of the reception device 1620. In short, the image 1624 is an image that is a part of the image 1623 and is of a region corresponding to an imaging target of an image 1625 actually captured in the macro imaging mode. Specifically, in Step S1612, an orientation (an imaging direction) changed from that in Step S1611 is obtained, an imaging target predicted to be currently captured is identified based on the obtained current orientation (imaging direction), the image 1624 that corresponds to the current orientation (imaging direction) is identified based on the image 1623 captured in advance, and a process of displaying the image 1624 is performed. Therefore, when the reception device 1620 moves in a direction of a void arrow from the position indicated by the white broken line as illustrated in the image 1623 in FIG. 120, the reception device 1620 can determine, according to an amount of the movement, a region of the image 1623 that is to be clipped out as the image 1624, and display the image 1624 that is a determined region of the image 1623.

By doing so, even when capturing an image in the macro imaging mode, the reception device 1620 can display, without displaying the image 1625 captured in the macro imaging mode, the image 1624 clipped out of a clearer image, i.e., the image 1623 captured in the normal imaging mode, according to a current orientation of the reception device 1620. In a method in the present disclosure in which, using a blurred image, continuous pieces of visible light information are obtained from a plurality of light sources distant from each other, and at the same time, a stored normal image is displayed on the display unit, the following problem is expected to occur: when a user captures an image using a smartphone, a hand shake may result in an actually captured image and a still image displayed from the memory being different in direction, making it impossible for the user to adjust the direction toward target light sources. In this case, data from the light sources cannot be received. Therefore, a measure is necessary. With an improved technique in the present disclosure, even when a hand shake occurs, an oscillation detection unit such as an image oscillation detection unit or an oscillation gyroscope detects the hand shake, and a target image in a still image is shifted in a predetermined direction so that a user can view a difference from a direction of the camera. This display allows a user to direct the camera to the target light sources, making it possible to capture an optically connected image of separated light sources while displaying a normal image, and thus it is possible to continuously receive signals. With this, signals from separated light sources can be received while a normal image is displayed. In this case, it is easy to adjust an orientation of the reception device 1620 in such a way that images of the plurality of light sources can be included in the box 1621. Note that defocusing means light source dispersion, causing a reduction in luminance to an equivalent degree, and therefore, sensitivity of a camera such as ISO is increased to produce an advantageous effect in that visible light data can be more reliably received.

Next, the reception device 1620 determines whether or not a signal from the light sources has been received (S1613). When it is determined that a signal from the light sources has been received (S1613: Yes), the processing returns to Step S1611 in the normal imaging mode, and when it is determined that a signal from the light sources has not been received (S1613: No), the macro imaging mode in Step 1612 continues. Note that when Yes in Step S1613, a process based on the received signal (e.g. a process of displaying an image represented by the received signal) may be performed.

As in the case of the reception device 1610, this reception device 1620 can also capture an image including a brighter region in the macro imaging mode. Thus, in the macro imaging mode, it is possible to increase the number of exposure lines that can generate bright lines for the subject.

FIG. 121 is a diagram illustrating processing operation of a reception device (an imaging device).

A transmission device 1630 is, for example, a display device such as a television and transmits different transmission IDs at predetermined time intervals Δ1630 by visible light communication. Specifically, transmission IDs, i.e., ID1631, ID1632, ID1633, and ID1634, associated with data corresponding to respective images 1631, 1632, 1633, and 1634 to be displayed at time points t1631, t1632, t1633, and t1634 are transmitted. In short, the transmission device 1630 transmits the ID1631 to ID1634 one after another at the predetermined time intervals Δt1630.

Based on the transmission IDs received by the visible light communication, a reception device 1640 requests a server 1650 for data associated with each of the transmission IDs, receives the data from the server, and displays images corresponding to the data. Specifically, images 1641, 1642, 1643, and 1644 corresponding to the ID1631, ID1632, ID1633, and ID1634, respectively, are displayed at the time points t1631, t1632, t1633, and t1634.

When the reception device 1640 obtains the ID 1631 received at the time point t1631, the reception device 1640 may obtain, from the server 1650, ID information indicating transmission IDs scheduled to be transmitted from the transmission device 1630 at the following time points t1632 to t1634. In this case, the use of the obtained ID information allows the reception device 1640 to be saved from receiving a transmission ID from the transmission device 1630 each time, that is, to request the server 1650 for the data associated with the ID1632 to ID1634 for time points t1632 to t1634, and display the received data at the time points t1632 to t1634.

Furthermore, it may be that when the reception device 1640 requests the data corresponding to the ID1631 at the time point t1631 even if the reception device 1640 does not obtain from the server 1650 information indicating transmission IDs scheduled to be transmitted from the transmission device 1630 at the following time points t1632 to t1634, the reception device 1640 receives from the server 1650 the data associated with the transmission IDs corresponding to the following time points t1632 to t1634 and displays the received data at the time points t1632 to t1634. To put it differently, in the case where the server 1650 receives from the reception device 1640 a request for the data associated with the ID1631 transmitted at the time point t1631, the server 1650 transmits, even without requests from the reception device 1640 for the data associated with the transmission IDs corresponding to the following time points t1632 to t1634, the data to the reception device 1640 at the time points t1632 to t1634. This means that in this case, the server 1650 holds association information indicating association between the time points t1631 to 1634 and the data associated with the transmission IDs corresponding to the time points t1631 to 1634, and transmits, at a predetermined time, predetermined data associated with the predetermined time point, based on the association information.

Thus, once the reception device 1640 successfully obtains the transmission ID1631 at the time point t1631 by visible light communication, the reception device 1640 can receive, at the following time points t1632 to t1634, the data corresponding to the time points t1632 to t1634 from the server 1650 even without performing visible light communication. Therefore, a user no longer needs to keep directing the reception device 1640 to the transmission device 1630 to obtain a transmission ID by visible light communication, and thus the data obtained from the server 1650 can be easily displayed on the reception device 1640. In this case, when the reception device 1640 obtains data corresponding to an ID from the server each time, response time will be long due to time delay from the server. Therefore, in order to accelerate the response, data corresponding to an ID is obtained from the server or the like and stored into a storage unit of the receiver in advance so that the data corresponding to the ID in the storage unit is displayed. This can shorten the response time. In this way, when a transmission signal from a visible light transmitter contains time information on output of a next ID, the receiver does not have to continuously receive visible light signals because a transmission time of the next ID can be known at the time, which produces an advantageous effect in that there is no need to keep directing the reception device to the light source. An advantageous effect of this way is that when visible light is received, it is only necessary to synchronize time information (clock) in the transmitter with time information (clock) in the receiver, meaning that after the synchronization, images synchronized with the transmitter can be continuously displayed even when no data is received from the transmitter.

Furthermore, in the above-described example, the reception device 1640 displays the images 1641, 1642, 1643, and 1644 corresponding to respective transmission IDs, i.e. the ID1631, ID1632, ID1633, and ID1634, at the respective time points t1631, t1632, t1633, and t1634. Here, the reception device 1640 may present information other than images at the respective time points as illustrated in FIG. 122. Specifically, at the time point t1631, the reception device 1640 displays the image 1641 corresponding to the ID1631 and moreover outputs sound or audio corresponding to the ID1631. At this time, the reception device 1640 may further display, for example, a purchase website for a product appearing in the image. Such sound output and displaying of a purchase website are performed likewise at each of the time points other than the time point t1631, i.e., the time points t1632, t1633, and t1634.

Next, in the case of a smartphone including two cameras, left and right cameras, for stereoscopic imaging as illustrated in (b) in FIG. 119, the left-eye camera displays an image of normal quality with a normal shutter speed and a normal focal point, and at the same time, the right-eye camera uses a higher shutter speed and/or a closer focal point or a macro imaging mode, as compared to the left-eye camera, to obtain striped bright lines according to the present disclosure and demodulates data. This has an advantageous effect in that an image of normal quality is displayed on the display unit while the right-eye camera can receive light communication data from a plurality of separate light sources that are distant from each other.

Embodiment 16

Here, an example of application of audio synchronous reproduction is described below.

FIG. 123 is a diagram illustrating an example of an application in Embodiment 16.

A receiver 1800*a* such as a smartphone receives a signal (a visible light signal) transmitted from a transmitter 1800*b* such as a street digital signage. This means that the receiver 1800*a* receives a timing of image reproduction performed by the transmitter 1800*b*. The receiver 1800*a* reproduces audio at the same timing as the image reproduction. In other words, in order that an image and audio reproduced by the transmitter 1800*b* are synchronized, the receiver 1800*a* performs synchronous reproduction of the audio. Note that the receiver 1800*a* may reproduce, together with the audio, the same image as the image reproduced by the transmitter 1800*b* (the reproduced image), or a related image that is related to the reproduced image. Furthermore, the receiver 1800*a* may cause a device connected to the receiver 1800*a* to reproduce audio, etc. Furthermore, after receiving a visible light signal, the receiver 1800*a* may download, from the server, content such as the audio or related image associated with the visible light signal. The receiver 1800*a* performs synchronous reproduction after the downloading.

This allows a user to hear audio that is in line with what is displayed by the transmitter 1800*b*, even when audio from the transmitter 1800*b* is inaudible or when audio is not reproduced from the transmitter 1800*b* because audio reproduction on the street is prohibited. Furthermore, audio in line with what is displayed can be heard even in such a distance that time is needed for audio to reach.

Here, multilingualization of audio synchronous reproduction is described below.

FIG. 124 is a diagram illustrating an example of an application in Embodiment 16.

Each of the receiver 1800*a* and a receiver 1800*c* obtains, from the server, audio that is in the language preset in the receiver itself and corresponds, for example, to images, such as a movie, displayed on the transmitter 1800*d*, and reproduces the audio. Specifically, the transmitter 1800*d* transmits, to the receiver, a visible light signal indicating an ID for identifying an image that is being displayed. The receiver receives the visible light signal and then transmits, to the server, a request signal including the ID indicated by the visible light signal and a language preset in the receiver itself. The receiver obtains audio corresponding to the request signal from the server, and reproduces the audio. This allows a user to enjoy a piece of work displayed on the transmitter 1800*d*, in the language preset by the user themselves.

Here, an audio synchronization method is described below.

FIG. 125 and FIG. 126 are diagrams illustrating an example of a transmission signal and an example of an audio synchronization method in Embodiment 16.

Mutually different data items (for example, data 1 to data 6 in FIG. 125) are associated with time points which are at a regular interval of predetermined time (N seconds). These data items may be an ID for identifying time, or may be time, or may be audio data (for example, data of 64 Kbps), for example. The following description is based on the premise that the data is an ID. Mutually different IDs may be ones accompanied by different additional information parts.

It is desirable that packets including IDs be different. Therefore, IDs are desirably not continuous. Alternatively, in packetizing IDs, it is desirable to adopt a packetizing method in which non-continuous parts are included in one packet. An error correction signal tends to have a different pattern even with continuous IDs, and therefore, error correction signals may be dispersed and included in plural packets, instead of being collectively included in one packet.

The transmitter 1800*d* transmits an ID at a point of time at which an image that is being displayed is reproduced, for example. The receiver is capable of recognizing a reproduction time point (a synchronization time point) of an image displayed on the transmitter 1800*d*, by detecting a timing at which the ID is changed.

In the case of (a), a point of time at which the ID changes from ID:1 to ID:2 is received, with the result that a synchronization time point can be accurately recognized.

When the duration N in which an ID is transmitted is long, such an occasion is rare, and there is a case where an ID is received as in (b). Even in this case, a synchronization time point can be recognized in the following method.

(b1) Assume a midpoint of a reception section in which the ID changes, to be an ID change point. Furthermore, a time point after an integer multiple of the duration N elapses from the ID change point estimated in the past is also estimated as an ID change point, and a midpoint of plural ID change points is estimated as a more accurate ID change point. It is possible to estimate an accurate ID change point gradually by such an algorithm of estimation.

(b2) In addition to the above condition, assume that no ID change point is included in the reception section in which the ID does not change and at a time point after an integer multiple of the duration N elapses from the reception section, gradually reducing sections in which there is a possibility that the ID change point is included, so that an accurate ID change point can be estimated.

When N is set to 0.5 seconds or less, the synchronization can be accurate.

When N is set to 2 seconds or less, the synchronization can be performed without a user feeling a delay.

When N is set to 10 seconds or less, the synchronization can be performed while ID waste is reduced.

FIG. 126 is a diagram illustrating an example of a transmission signal in Embodiment 16.

In FIG. 126, the synchronization is performed using a time packet so that the ID waste can be avoided. The time packet is a packet that holds a point of time at which the signal is transmitted. When a long time section needs to be expressed, the time packet is divided to include a time packet 1 representing a finely divided time section and a time packet 2 representing a roughly divided time section. For example, the time packet 2 indicates the hour and the minute of a time point, and the time packet 1 indicates only the second of the time point. A packet indicating a time point may be divided into three or more time packets. Since a roughly divided time section is not so necessary, a finely divided time packet is transmitted more than a roughly divided time packet, allowing the receiver to recognize a synchronization time point quickly and accurately.

This means that in this embodiment, the visible light signal indicates the time point at which the visible light signal is transmitted from the transmitter 1800*d*, by including second information (the time packet 2) indicating the hour and the minute of the time point, and first information (the time packet 1) indicating the second of the time point. The receiver 1800*a* then receives the second information, and receives the first information a greater number of times than a total number of times the second information is received.

Here, synchronization time point adjustment is described below.

FIG. 127 is a diagram illustrating an example of a process flow of the receiver 1800*a* in Embodiment 16.

After a signal is transmitted, a certain amount of time is needed before audio or video is reproduced as a result of processing on the signal in the receiver 1800*a*. Therefore, this processing time is taken into consideration in performing a process of reproducing audio or video so that synchronous reproduction can be accurately performed.

First, processing delay time is selected in the receiver 1800*a* (Step S1801). This may have been held in a processing program or may be selected by a user. When a user makes correction, more accurate synchronization for each receiver can be realized. This processing delay time can be changed for each model of receiver or according to the temperature or CPU usage rate of the receiver so that synchronization is more accurately performed.

The receiver 1800*a* determines whether or not any time packet has been received or whether or not any ID associated for audio synchronization has been received (Step S1802). When the receiver 1800*a* determines that any of these has been received (Step S1802: Y), the receiver 1800*a* further determines whether or not there is any backlogged image (Step S1804). When the receiver 1800*a* determines that there is a backlogged image (Step S1804: Y), the receiver 1800*a* discards the backlogged image, or postpones processing on the backlogged image and starts a reception process from the latest obtained image (Step S1805). With this, unexpected delay due to a backlog can be avoided.

The receiver 1800*a* performs measurement to find out a position of the visible light signal (specifically, a bright line) in an image (Step S1806). More specifically, in relation to the first exposure line in the image sensor, a position where the signal appears in a direction perpendicular to the exposure lines is found by measurement, to calculate a difference in time between a point of time at which image obtainment starts and a point of time at which the signal is received (intra-image delay time).

The receiver 1800*a* is capable of accurately performing synchronous reproduction by reproducing audio or video belonging to a time point determined by adding processing delay time and intra-image delay time to the recognized synchronization time point (Step S1807).

When the receiver 1800*a* determines in Step S1802 that the time packet or audio synchronous ID has not been received, the receiver 1800*a* receives a signal from a captured image (Step S1803).

FIG. 128 is a diagram illustrating an example of a user interface of the receiver 1800*a* in Embodiment 16.

As illustrated in (a) of FIG. 128, a user can adjust the above-described processing delay time by pressing any of buttons Bt1 to Bt4 displayed on the receiver 1800*a*. Furthermore, the processing delay time may be set with a swipe gesture as in (b) of FIG. 128. With this, the synchronous reproduction can be more accurately performed based on user's sensory feeling.

Next, reproduction by earphone limitation is described below.

FIG. 129 is a diagram illustrating an example of a process flow of the receiver 1800*a* in Embodiment 16.

The reproduction by earphone limitation in this process flow makes it possible to reproduce audio without causing trouble to others in surrounding areas.

The receiver 1800*a* checks whether or not the setting for earphone limitation is ON (Step S1811). In the case where the setting for earphone limitation is ON, the receiver 1800*a* has been set to the earphone limitation, for example. Alternatively, the received signal (visible light signal) includes the setting for earphone limitation. Yet another case is that information indicating that earphone limitation is ON is recorded in the server or the receiver 1800*a* in association with the received signal.

When the receiver 1800*a* confirms that the earphone limitation is ON (Step S1811: Y), the receiver 1800*a* determines whether or not an earphone is connected to the receiver 1800*a* (Step S1813).

When the receiver 1800*a* confirms that the earphone limitation is OFF (Step S1811: N) or determines that an earphone is connected (Step S1813: Y), the receiver 1800*a* reproduces audio (Step S1812). Upon reproducing audio, the receiver 1800*a* adjusts a volume of the audio so that the volume is within a preset range. This preset range is set in the same manner as with the setting for earphone limitation.

When the receiver 1800*a* determines that no earphone is connected (Step S1813: N), the receiver 1800*a* issues notification prompting a user to connect an earphone (Step S1814). This notification is issued in the form of, for example, an indication on the display, audio output, or vibration.

Furthermore, when a setting which prohibits forced audio playback has not been made, the receiver 1800*a* prepares an interface for forced playback, and determines whether or not a user has made an input for forced playback (Step S1815). Here, when the receiver 1800*a* determines that a user has made an input for forced playback (Step S1815: Y), the receiver 1800*a* reproduces audio even when no earphone is connected (Step S1812).

When the receiver 1800*a* determines that a user has not made an input for forced playback (Step S1815: N), the receiver 1800*a* holds previously received audio data and an analyzed synchronization time point, so as to perform synchronous audio reproduction immediately after an earphone is connected thereto.

FIG. 130 is a diagram illustrating another example of a process flow of the receiver 1800*a* in Embodiment 16.

The receiver 1800*a* first receives an ID from the transmitter 1800*d* (Step S1821). Specifically, the receiver 1800*a* receives a visible light signal indicating an ID of the transmitter 1800*d* or an ID of content that is being displayed on the transmitter 1800*d*.

Next, the receiver 1800*a* downloads, from the server, information (content) associated with the received ID (Step S1822). Alternatively, the receiver 1800*a* reads the information from a data holding unit included in the receiver 1800*a*. Hereinafter, this information is referred to as related information.

Next, the receiver 1800*a* determines whether or not a synchronous reproduction flag included in the related information represents ON (Step S1823). When the receiver 1800*a* determines that the synchronous reproduction flag does not represent ON (Step S1823: N), the receiver 1800*a* outputs content indicated in the related information (Step S1824). Specifically, when the content is an image, the receiver 1800*a* displays the image, and when the content is audio, the receiver 1800*a* outputs the audio.

When the receiver 1800*a* determines that the synchronous reproduction flag represents ON (Step S1823: Y), the receiver 1800*a* further determines whether a clock setting mode included in the related information has been set to a transmitter-based mode or an absolute-time mode (Step S1825). When the receiver 1800*a* determines that the clock setting mode has been set to the absolute-time mode, the receiver 1800*a* determines whether or not the last clock setting has been performed within a predetermined time before the current time point (Step S1826). This clock setting is a process of obtaining clock information by a predetermined method and setting time of a clock included in the receiver 1800*a* to the absolute time of a reference clock using the clock information. The predetermined method is, for example, a method using global positioning system (GPS) radio waves or network time protocol (NTP) radio waves. Note that the above-mentioned current time point may be a point of time at which a terminal device, that is, the receiver 1800*a*, received a visible light signal.

When the receiver 1800*a* determines that the last clock setting has been performed within the predetermined time (Step S1826: Y), the receiver 1800*a* outputs the related information based on time of the clock of the receiver 1800*a*, thereby synchronizing content to be displayed on the transmitter 1800*d* with the related information (Step S1827). When content indicated in the related information is, for example, moving images, the receiver 1800*a* displays the moving images in such a way that they are in synchronization with content that is displayed on the transmitter 1800*d*. When content indicated in the related information is, for example, audio, the receiver 1800*a* outputs the audio in such a way that it is in synchronization with content that is displayed on the transmitter 1800*d*. For example, when the related information indicates audio, the related information includes frames that constitute the audio, and each of these frames is assigned with a time stamp. The receiver 1800*a* outputs audio in synchronization with content from the transmitter 1800*d* by reproducing a frame assigned with a time stamp corresponding to time of the own clock.

When the receiver 1800*a* determines that the last clock setting has not been performed within the predetermined time (Step S1826: N), the receiver 1800*a* attempts to obtain clock information by a predetermined method, and determines whether or not the clock information has been successfully obtained (Step S1828). When the receiver 1800*a* determines that the clock information has been successfully obtained (Step S1828: Y), the receiver 1800*a* updates time of the clock of the receiver 1800*a* using the clock information (Step S1829). The receiver 1800*a* then performs the above-described process in Step S1827.

Furthermore, when the receiver 1800*a* determines in Step S1825 that the clock setting mode is the transmitter-based mode or when the receiver 1800*a* determines in Step S1828 that the clock information has not been successfully obtained (Step S1828: N), the receiver 1800*a* obtains clock information from the transmitter 1800*d* (Step S1830). Specifically, the receiver 1800*a* obtains a synchronization signal, that is, clock information, from the transmitter 1800*d* by visible light communication. For example, the synchronization signal is the time packet 1 and the time packet 2 illustrated in FIG. 126. Alternatively, the receiver 1800*a* receives clock information from the transmitter 1800*d* via radio waves of Bluetooth®, Wi-Fi, or the like. The receiver 1800*a* then performs the above-described processes in Step S1829 and Step S1827.

In this embodiment, as in Step S1829 and Step S1830, when a point of time at which the process for synchronizing the clock of the terminal device, i.e., the receiver 1800*a*, with the reference clock (the clock setting) is performed using GPS radio waves or NTP radio waves is at least a predetermined time before a point of time at which the terminal device receives a visible light signal, the clock of the terminal device is synchronized with the clock of the transmitter using a time point indicated in the visible light signal transmitted from the transmitter 1800*d*. With this, the terminal device is capable of reproducing content (video or audio) at a timing of synchronization with transmitter-side content that is reproduced on the transmitter 1800*d*.

FIG. 131A is a diagram for describing a specific method of synchronous reproduction in Embodiment 16. As a method of the synchronous reproduction, there are methods a to e illustrated in FIG. 131A.

(Method A)

In the method a, the transmitter 1800*d* outputs a visible light signal indicating a content ID and an ongoing content reproduction time point, by changing luminance of the display as in the case of the above embodiments. The ongoing content reproduction time point is a reproduction time point for data that is part of the content and is being reproduced by the transmitter 1800*d* when the content ID is transmitted from the transmitter 1800*d*. When the content is video, the data is a picture, a sequence, or the like included in the video. When the content is audio, the data is a frame or the like included in the audio. The reproduction time point indicates, for example, time of reproduction from the beginning of the content as a time point. When the content is video, the reproduction time point is included in the content as a presentation time stamp (PTS). This means that content includes, for each data included in the content, a reproduction time point (a display time point) of the data.

The receiver 1800*a* receives the visible light signal by capturing an image of the transmitter 1800*d* as in the case of the above embodiments. The receiver 1800*a* then transmits to a server 1800*f* a request signal including the content ID indicated in the visible light signal. The server 1800*f* receives the request signal and transmits, to the receiver 1800*a*, content that is associated with the content ID included in the request signal.

The receiver 1800*a* receives the content and reproduces the content from a point of time of (the ongoing content reproduction time point+ elapsed time since ID reception). The elapsed time since ID reception is time elapsed since the content ID is received by the receiver 1800*a*.

(Method B)

In the method b, the transmitter 1800*d* outputs a visible light signal indicating a content ID and an ongoing content reproduction time point, by changing luminance of the display as in the case of the above embodiments. The receiver 1800*a* receives the visible light signal by capturing an image of the transmitter 1800*d* as in the case of the above embodiments. The receiver 1800*a* then transmits to the server 1800*f* a request signal including the content ID and the ongoing content reproduction time point indicated in the visible light signal. The server 1800*f* receives the request signal and transmits, to the receiver 1800*a*, only partial content belonging to a time point on and after the ongoing content reproduction time point, among content that is associated with the content ID included in the request signal.

The receiver 1800*a* receives the partial content and reproduces the partial content from a point of time of (elapsed time since ID reception).

(Method C)

In the method c, the transmitter 1800*d* outputs a visible light signal indicating a transmitter ID and an ongoing content reproduction time point, by changing luminance of the display as in the case of the above embodiments. The transmitter ID is information for identifying a transmitter.

The receiver 1800*a* receives the visible light signal by capturing an image of the transmitter 1800*d* as in the case of the above embodiments. The receiver 1800*a* then transmits to the server 1800*f* a request signal including the transmitter ID indicated in the visible light signal.

The server 1800*f* holds, for each transmitter ID, a reproduction schedule which is a time table of content to be reproduced by a transmitter having the transmitter ID. Furthermore, the server 1800*f* includes a clock. The server 1800*f* receives the request signal and refers to the reproduction schedule to identify, as content that is being reproduced, content that is associated with the transmitter ID included in the request signal and time of the clock of the server 1800*f* (a server time point). The server 1800*f* then transmits the content to the receiver 1800*a*.

The receiver 1800*a* receives the content and reproduces the content from a point of time of (the ongoing content reproduction time point+elapsed time since ID reception).

(Method D)

In the method d, the transmitter 1800*d* outputs a visible light signal indicating a transmitter ID and a transmitter time point, by changing luminance of the display as in the case of the above embodiments. The transmitter time point is time indicated by the clock included in the transmitter 1800*d*.

The receiver 1800*a* receives the visible light signal by capturing an image of the transmitter 1800*d* as in the case of the above embodiments. The receiver 1800*a* then transmits to the server 1800*f* a request signal including the transmitter ID and the transmitter time point indicated in the visible light signal.

The server 1800*f* holds the above-described reproduction schedule. The server 1800*f* receives the request signal and refers to the reproduction schedule to identify, as content that is being reproduced, content that is associated with the transmitter ID and the transmitter time point included in the request signal. Furthermore, the server 1800*f* identifies an ongoing content reproduction time point based on the transmitter time point. Specifically, the server 1800*f* finds a reproduction start time point of the identified content from the reproduction schedule, and identifies, as an ongoing content reproduction time point, time between the transmitter time point and the reproduction start time point. The server 1800*f* then transmits the content and the ongoing content reproduction time point to the receiver 1800*a*.

The receiver 1800*a* receives the content and the ongoing content reproduction time point, and reproduces the content from a point of time of (the ongoing content reproduction time point+ elapsed time since ID reception).

Thus, in this embodiment, the visible light signal indicates a time point at which the visible light signal is transmitted from the transmitter 1800*d*. Therefore, the terminal device, i.e., the receiver 1800*a*, is capable of receiving content associated with a time point at which the visible light signal is transmitted from the transmitter 1800*d* (the transmitter time point). For example, when the transmitter time point is 5:43, content that is reproduced at 5:43 can be received.

Furthermore, in this embodiment, the server 1800*f* has a plurality of content items associated with respective time points. However, there is a case where the content associated with the time point indicated in the visible light signal is not present in the server 1800*f*. In this case, the terminal device, i.e., the receiver 1800*a*, may receive, among the plurality of content items, content associated with a time point that is closest to the time point indicated in the visible light signal and after the time point indicated in the visible light signal. This makes it possible to receive appropriate content among the plurality of content items in the server 1800*f* even when content associated with a time point indicated in the visible light signal is not present in the server 1800*f*.

Furthermore, a reproduction method in this embodiment includes: a signal reception step of receiving a visible light signal by a sensor of a receiver 1800*a* (the terminal device) from the transmitter 1800*d* which transmits the visible light signal by a light source changing in luminance; a transmission step of transmitting a request signal for requesting content associated with the visible light signal, from the receiver 1800*a* to the server 1800*f*; a content reception step of receiving, by the receiver 1800*a*, the content from the server 1800*f*; and a reproduction step of reproducing the content. The visible light signal indicates a transmitter ID and a transmitter time point. The transmitter ID is ID information. The transmitter time point is time indicated by the clock of the transmitter 1800*d* and is a point of time at which the visible light signal is transmitted from the transmitter 1800*d*. In the content reception step, the receiver 1800*a* receives content associated with the transmitter ID and the transmitter time point indicated in the visible light signal. This allows the receiver 1800*a* to reproduce appropriate content for the transmitter ID and the transmitter time point.

(Method E)

In the method e, the transmitter 1800*d* outputs a visible light signal indicating a transmitter ID, by changing luminance of the display as in the case of the above embodiments.

The receiver 1800*a* receives the visible light signal by capturing an image of the transmitter 1800*d* as in the case of the above embodiments. The receiver 1800*a* then transmits to the server 1800*f* a request signal including the transmitter ID indicated in the visible light signal.

The server 1800*f* holds the above-described reproduction schedule, and further includes a clock. The server 1800*f* receives the request signal and refers to the reproduction schedule to identify, as content that is being reproduced, content that is associated with the transmitter ID included in the request signal and a server time point. Note that the server time point is time indicated by the clock of the server 1800*f*. Furthermore, the server 1800*f* finds a reproduction start time point of the identified content from the reproduction schedule as well. The server 1800*f* then transmits the content and the content reproduction start time point to the receiver 1800*a*.

The receiver 1800*a* receives the content and the content reproduction start time point, and reproduces the content from a point of time of (a receiver time point—the content reproduction start time point). Note that the receiver time point is time indicated by a clock included in the receiver 1800*a*.

Thus, a reproduction method in this embodiment includes: a signal reception step of receiving a visible light signal by a sensor of the receiver 1800*a* (the terminal device) from the transmitter 1800*d* which transmits the visible light signal by a light source changing in luminance; a transmission step of transmitting a request signal for requesting content associated with the visible light signal, from the receiver 1800*a* to the server 1800*f*; a content reception step of receiving, by the receiver 1800*a*, content including time points and data to be reproduced at the time points, from the server 1800*f*; and a reproduction step of reproducing data included in the content and corresponding to time of a clock included in the receiver 1800*a*. Therefore, the receiver 1800*a* avoids reproducing data included in the content, at an incorrect point of time, and is capable of appropriately reproducing the data at a correct point of time indicated in the content. Furthermore, when content related to the above content (the transmitter-side content) is also reproduced on the transmitter 1800*d*, the receiver 1800*a* is capable of appropriately reproducing the content in synchronization with the transmitter-side content.

Note that even in the above methods c to e, the server 1800*f* may transmit, among the content, only partial content belonging to a time point on and after the ongoing content reproduction time point to the receiver 1800*a* as in method b.

Furthermore, in the above methods a to e, the receiver 1800*a* transmits the request signal to the server 1800*f* and receives necessary data from the server 1800*f*, but may skip such transmission and reception by holding the data in the server 1800*f* in advance.

FIG. 131B is a block diagram illustrating a configuration of a reproduction apparatus which performs synchronous reproduction in the above-described method e.

A reproduction apparatus B10 is the receiver 1800*a* or the terminal device which performs synchronous reproduction in the above-described method e, and includes a sensor B11, a request signal transmitting unit B12, a content receiving unit B13, a clock B14, and a reproduction unit B15.

The sensor B11 is, for example, an image sensor, and receives a visible light signal from the transmitter 1800*d* which transmits the visible light signal by the light source changing in luminance. The request signal transmitting unit B12 transmits to the server 1800*f* a request signal for requesting content associated with the visible light signal. The content receiving unit B13 receives from the server 1800*f* content including time points and data to be reproduced at the time points. The reproduction unit B15 reproduces data included in the content and corresponding to time of the clock B14.

FIG. 131C is flowchart illustrating processing operation of the terminal device which performs synchronous reproduction in the above-described method e.

The reproduction apparatus B10 is the receiver 1800*a* or the terminal device which performs synchronous reproduction in the above-described method e, and performs processes in Step SB11 to Step SB15.

In Step SB11, a visible light signal is received from the transmitter 1800*d* which transmits the visible light signal by the light source changing in luminance. In Step SB12, a request signal for requesting content associated with the visible light signal is transmitted to the server 1800*f*. In Step SB13, content including time points and data to be reproduced at the time points is received from the server 1800*f*. In Step SB15, data included in the content and corresponding to time of the clock B14 is reproduced.

Thus, in the reproduction apparatus B10 and the reproduction method in this embodiment, data in the content is not reproduced at an incorrect time point and is able to be appropriately reproduced at a correct time point indicated in the content.

Note that in this embodiment, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. A software which implements the reproduction apparatus B10, etc., in this embodiment is a program which causes a computer to execute steps included in the flowchart illustrated in FIG. 131C.

FIG. 132 is a diagram for describing advance preparation of synchronous reproduction in Embodiment 16.

The receiver 1800*a* performs, in order for synchronous reproduction, clock setting for setting a clock included in the receiver 1800*a* to time of the reference clock. The receiver 1800*a* performs the following processes (1) to (5) for this clock setting.

(1) The receiver 1800*a* receives a signal. This signal may be a visible light signal transmitted by the display of the transmitter 1800*d* changing in luminance or may be a radio signal from a wireless device via Wi-Fi or Bluetooth®. Alternatively, instead of receiving such a signal, the receiver 1800*a* obtains position information indicating a position of the receiver 1800*a*, for example, by GPS or the like. Using the position information, the receiver 1800*a* then recognizes that the receiver 1800*a* entered a predetermined place or building.

(2) When the receiver 1800*a* receives the above signal or recognizes that the receiver 1800*a* entered the predetermined place, the receiver 1800*a* transmits to the server (visible light ID solution server) 1800*f* a request signal for requesting data related to the received signal, place or the like (related information).

(3) The server 1800*f* transmits to the receiver 1800*a* the above-described data and a clock setting request for causing the receiver 1800*a* to perform the clock setting.

(4) The receiver 1800*a* receives the data and the clock setting request and transmits the clock setting request to a GPS time server, an NTP server, or a base station of a telecommunication corporation (carrier).

(5) The above server or base station receives the clock setting request and transmits to the receiver 1800*a* clock data (clock information) indicating a current time point (time of the reference clock or absolute time). The receiver 1800*a* performs the clock setting by setting time of a clock included in the receiver 1800*a* itself to the current time point indicated in the clock data.

Thus, in this embodiment, the clock included in the receiver 1800*a* (the terminal device) is synchronized with the reference clock by global positioning system (GPS) radio waves or network time protocol (NTP) radio waves. Therefore, the receiver 1800*a* is capable of reproducing, at an appropriate time point according to the reference clock, data corresponding to the time point.

FIG. 133 is a diagram illustrating an example of application of the receiver 1800*a* in Embodiment 16.

The receiver 1800*a* is configured as a smartphone as described above, and is used, for example, by being held by a holder 1810 formed of a translucent material such as resin or glass. This holder 1810 includes a back board 1810*a* and an engagement portion 1810*b* standing on the back board 1810*a*. The receiver 1800*a* is inserted into a gap between the back board 1810*a* and the engagement portion 1810*b* in such a way as to be placed along the back board 1810*a*.

FIG. 134A is a front view of the receiver 1800*a* held by the holder 1810 in Embodiment 16.

The receiver 1800*a* is inserted as described above and held by the holder 1810. At this time, the engagement portion 1810*b* engages with a lower portion of the receiver 1800*a*, and the lower portion is sandwiched between the engagement portion 1810*b* and the back board 1810*a*. The back surface of the receiver 1800*a* faces the back board 1810*a*, and a display 1801 of the receiver 1800*a* is exposed.

FIG. 134B is a rear view of the receiver 1800*a* held by the holder 1810 in Embodiment 16.

The back board 1810*a* has a through-hole 1811, and a variable filter 1812 is attached to the back board 1810*a*, at a position close to the through-hole 1811. A camera 1802 of the receiver 1800*a* which is being held by the holder 1810 is exposed on the back board 1810*a* through the through-hole 1811. A flash light 1803 of the receiver 1800*a* faces the variable filter 1812.

The variable filter 1812 is, for example, in the shape of a disc, and includes three color filters (a red filter, a yellow filter, and a green filter) each having the shape of a circular sector of the same size. The variable filter 1812 is attached to the back board 1810*a* in such a way as to be rotatable about the center of the variable filter 1812. The red filter is a translucent filter of a red color, the yellow filter is a translucent filter of a yellow color, and the green filter is a translucent filter of a green color.

Therefore, the variable filter 1812 is rotated, for example, until the red filter is at a position facing the flash light 1803*a*. In this case, light radiated from the flash light 1803*a* passes through the red filter, thereby being spread as red light inside the holder 1810. As a result, roughly the entire holder 1810 glows red.

Likewise, the variable filter 1812 is rotated, for example, until the yellow filter is at a position facing the flash light 1803*a*. In this case, light radiated from the flash light 1803*a* passes through the yellow filter, thereby being spread as yellow light inside the holder 1810. As a result, roughly the entire holder 1810 glows yellow.

Likewise, the variable filter 1812 is rotated, for example, until the green filter is at a position facing the flash light 1803*a*. In this case, light radiated from the flash light 1803*a* passes through the green filter, thereby being spread as green light inside the holder 1810. As a result, roughly the entire holder 1810 glows green.

This means that the holder 1810 lights up in red, yellow, or green just like a penlight.

FIG. 135 is a diagram for describing a use case of the receiver 1800*a* held by the holder 1810 in Embodiment 16.

For example, the receiver 1800*a* held by the holder 1810, namely, a holder-attached receiver, can be used in amusement parks and so on. Specifically, a plurality of holder-attached receivers directed to a float moving in an amusement park blink to music from the float in synchronization. This means that the float is configured as the transmitter in the above embodiments and transmits a visible light signal by the light source attached to the float changing in luminance. For example, the float transmits a visible light signal indicating the ID of the float. The holder-attached receiver then receives the visible light signal, that is, the ID, by capturing an image by the camera 1802 of the receiver 1800*a* as in the case of the above embodiments. The receiver 1800*a* which received the ID obtains, for example, from the server, a program associated with the ID. This program includes an instruction to turn ON the flash light 1803 of the receiver 1800*a* at predetermined time points. These predetermined time points are set according to music from the float (so as to be in synchronization therewith). The receiver 1800*a* then causes the flash light 1803*a* to blink according to the program.

With this, the holder 1810 for each receiver 1800*a* which received the ID repeatedly lights up at the same timing according to music from the float having the ID.

Each receiver 1800*a* causes the flash light 1803 to blink according to a preset color filter (hereinafter referred to as a preset filter). The preset filter is a color filter that faces the flash light 1803 of the receiver 1800*a*. Furthermore, each receiver 1800*a* recognizes the current preset filter based on an input by a user. Alternatively, each receiver 1800*a* recognizes the current preset filter based on, for example, the color of an image captured by the camera 1802.

Specifically, at a predetermined time point, only the holders 1810 for the receivers 1800*a* which have recognized that the preset filter is a red filter among the receivers 1800*a* which received the ID light up at the same time. At the next time point, only the holders 1810 for the receivers 1800*a* which have recognized that the preset filter is a green filter light up at the same time. Further, at the next time point, only the holders 1810 for the receivers 1800*a* which have recognized that the preset filter is a yellow filter light up at the same time.

Thus, the receiver 1800*a* held by the holder 1810 causes the flash light 1803, that is, the holder 1810, to blink in synchronization with music from the float and the receiver 1800*a* held by another holder 1810, as in the above-described case of synchronous reproduction illustrated in FIG. 123 to FIG. 129.

FIG. 136 is a flowchart illustrating processing operation of the receiver 1800*a* held by the holder 1810 in Embodiment 16.

The receiver 1800*a* receives an ID of a float indicated by a visible light signal from the float (Step S1831). Next, the receiver 1800*a* obtains a program associated with the ID from the server (Step S1832). Next, the receiver 1800*a* causes the flash light 1803 to be turned ON at predetermined time points according to the preset filter by executing the program (Step S1833).

At this time, the receiver 1800*a* may display, on the display 1801, an image according to the received ID or the obtained program.

FIG. 137 is a diagram illustrating an example of an image displayed by the receiver 1800*a* in Embodiment 16.

The receiver 1800*a* receives an ID, for example, from a Santa Clause float, and displays an image of Santa Clause as illustrated in (a) of FIG. 137. Furthermore, the receiver 1800*a* may change the color of the background of the image of Santa Clause to the color of the preset filter at the same time when the flash light 1803 is turned ON as illustrated in (b) of FIG. 137. For example, in the case where the color of the preset filter is red, when the flash light 1803 is turned ON, the holder 1810 glows red and at the same time, an image of Santa Clause with a red background is displayed on the display 1801. In short, blinking of the holder 1810 and what is displayed on the display 1801 are synchronized.

FIG. 138 is a diagram illustrating another example of a holder in Embodiment 16.

A holder 1820 is configured in the same manner as the above-described holder 1810 except for the absence of the through-hole 1811 and the variable filter 1812. The holder 1820 holds the receiver 1800*a* with a back board 1820*a* facing the display 1801 of the receiver 1800*a*. In this case, the receiver 1800*a* causes the display 1801 to emit light instead of the flash light 1803. With this, light from the display 1801 spreads across roughly the entire holder 1820. Therefore, when the receiver 1800*a* causes the display 1801 to emit red light according to the above-described program, the holder 1820 glows red. Likewise, when the receiver 1800*a* causes the display 1801 to emit yellow light according to the above-described program, the holder 1820 glows yellow. When the receiver 1800*a* causes the display 1801 to emit green light according to the above-described program, the holder 1820 glows green. With the use of the holder 1820 such as that just described, it is possible to omit the settings for the variable filter 1812.

Embodiment 17

(Visible Light Signal)

FIG. 139A to FIG. 139D are diagrams each illustrating an example of a visible light signal in Embodiment 17.

The transmitter generates a 4PPM visible light signal and changes in luminance according to this visible light signal, for example, as illustrated in FIG. 139A as in the above-described case. Specifically, the transmitter allocates four slots to one signal unit and generates a visible light signal including a plurality of signal units. The signal unit indicates High (H) or Low (L) in each slot. The transmitter then emits bright light in the H slot and emits dark light or is turned OFF in the L slot. For example, one slot is a period of 1/9,600 seconds.

Furthermore, the transmitter may generate a visible light signal in which the number of slots allocated to one signal unit is variable as illustrated in FIG. 139B, for example. In this case, the signal unit includes a signal indicating H in one or more continuous slots and a signal indicating L in one slot subsequent to the H signal. The number of H slots is variable, and therefore a total number of slots in the signal unit is variable. For example, as illustrated in FIG. 139B, the transmitter generates a visible light signal including a 3-slot signal unit, a 4-slot signal unit, and a 6-slot signal unit in this order. The transmitter then emits bright light in the H slot and emits dark light or is turned OFF in the L slot in this case as well.

The transmitter may allocate an arbitrary period (signal unit period) to one signal unit without allocating a plurality of slots to one signal unit as illustrated in FIG. 139C, for example. This signal unit period includes an H period and an L period subsequent to the H period. The H period is adjusted according to a signal which has not yet been modulated. The L period is fixed and may be a period corresponding to the above slot. The H period and the L period are each a period of 100 μs or more, for example. For example, as illustrated in FIG. 139C, the transmitter transmits a visible light signal including a signal unit having a signal unit period of 210 μs, a signal unit having a signal unit period of 220 μs, and a signal unit having a signal unit period of 230 μs. The transmitter then emits bright light in the H period and emits dark light or is turned OFF in the L period in this case as well.

The transmitter may generate, as a visible light signal, a signal indicating L and H alternately as illustrated in FIG. 139D, for example. In this case, each of the L period and the H period in the visible light signal is adjusted according to a signal which has not yet been modulated. For example, as illustrated in FIG. 139D, the transmitter transmits a visible light signal indicating H in a 100-μs period, then L in a 120-μs period, then H in a 110-μs period, and then L in a 200-μs period. The transmitter then emits bright light in the H period and emits dark light or is turned OFF in the L period in this case as well.

FIG. 140 is a diagram illustrating a structure of a visible light signal in Embodiment 17.

The visible light signal includes, for example, a signal 1, a brightness adjustment signal corresponding to the signal 1, a signal 2, and a brightness adjustment signal corresponding to the signal 2. The transmitter generates the signal 1 and the signal 2 by modulating the signal which has not yet been modulated, and generates the brightness adjustment signals corresponding to these signals, thereby generating the above-described visible light signal.

The brightness adjustment signal corresponding to the signal 1 is a signal which compensates for brightness increased or decreased due to a change in luminance according to the signal 1. The brightness adjustment signal corresponding to the signal 2 is a signal which compensates for brightness increased or decreased due to a change in luminance according to the signal 2. A change in luminance according to the signal 1 and the brightness adjustment signal corresponding to the signal 1 represents brightness B1, and a change in luminance according to the signal 2 and the brightness adjustment signal corresponding to the signal 2 represents brightness B2. The transmitter in this embodiment generates the brightness adjustment signal corresponding to each of the signal 1 and the signal 2 as a part of the visible light signal in such a way that the brightness B1 and the brightness B2 are equal. With this, brightness is kept at a constant level so that flicker can be reduced.

When generating the above-described signal 1, the transmitter generates a signal 1 including data 1, a preamble (header) subsequent to the data 1, and data 1 subsequent to the preamble. The preamble is a signal corresponding to the data 1 located before and after the preamble. For example, this preamble is a signal serving as an identifier for reading the data 1. Thus, since the signal 1 includes two data items 1 and the preamble located between the two data items, the receiver is capable of properly demodulating the data 1 (that is, the signal 1) even when the receiver starts reading the visible light signal at the midway point in the first data item 1.

(Bright Line Image)

FIG. 141 is a diagram illustrating an example of a bright line image obtained through imaging by a receiver in Embodiment 17.

As described above, the receiver captures an image of a transmitter changing in luminance, to obtain a bright line image including, as a bright line pattern, a visible light signal transmitted from the transmitter. The visible light signal is received by the receiver through such imaging.

For example, the receiver captures an image at time t1 using N exposure lines included in the image sensor, obtaining a bright line image including a region a and a region bin each of which a bright line pattern appears as illustrated in FIG. 141. Each of the region a and the region b is where the bright line pattern appears because a subject, i.e., the transmitter, changes in luminance.

The receiver demodulates the visible light signal based on the bright line patterns in the region a and in the region b. However, when the receiver determines that the demodulated visible light signal alone is not sufficient, the receiver captures an image at time t2 using only M (M<N) continuous exposure lines corresponding to the region a among the N exposure lines. By doing so, the receiver obtains a bright line image including only the region a among the region a and the region b. The receiver repeatedly performs such imaging also at time t3 to time t5. As a result, it is possible to receive the visible light signal having a sufficient data amount from the subject corresponding to the region a at high speed. Furthermore, the receiver captures an image at time t6 using only L (L<N) continuous exposure lines corresponding to the region b among the N exposure lines. By doing so, the receiver obtains a bright line image including only the region b among the region a and the region b. The receiver repeatedly performs such imaging also at time t7 to time t9. As a result, it is possible to receive the visible light signal having a sufficient data amount from the subject corresponding to the region b at high speed.

Furthermore, the receiver may obtain a bright line image including only the region a by performing, at time t10 and time t11, the same or like imaging operation as that performed at time t2 to time t5. Furthermore, the receiver may obtain a bright line image including only the region b by performing, at time t12 and time t13, the same or like imaging operation as that performed at time t6 to time t9.

In the above-described example, when the receiver determines that the visible light signal is not sufficient, the receiver continuously captures the blight line image including only the region a at times t2 to t5, but this continuous imaging may be performed when a bright line appears in an image captured at time t1. Likewise, when the receiver determines that the visible light signal is not sufficient, the receiver continuously captures the blight line image including only the region b at time t6 to time t9, but this continuous imaging may be performed when a bright line appears in an image captured at time t1. The receiver may alternately obtain a bright line image including only the region a and obtain a bright line image including only the region b.

Note that the M continuous exposure lines corresponding to the above region a are exposure lines which contribute to generation of the region a, and the L continuous exposure lines corresponding to the above region b are exposure lines which contribute to generation of the region b.

FIG. 142 is a diagram illustrating another example of a bright line image obtained through imaging by a receiver in Embodiment 17.

For example, the receiver captures an image at time t1 using N exposure lines included in the image sensor, obtaining a bright line image including a region a and a region b in each of which a bright line pattern appears as illustrated in FIG. 142. Each of the region a and the region b is where the bright line pattern appears because a subject, i.e., the transmitter, changes in luminance. There is an overlap between the region a and the region b along the bright line or the exposure line (hereinafter referred to as an overlap region).

When the receiver determines that the visible light signal demodulated from the bright line patterns in the region a and the region b is not sufficient, the receiver captures an image at time t2 using only P (P<N) continuous exposure lines corresponding to the overlap region among the N exposure lines. By doing so, the receiver obtains a bright line image including only the overlap region between the region a and the region b. The receiver repeatedly performs such imaging also at time t3 and time t4. As a result, it is possible to receive the visible light signals having sufficient data amounts from the subjects corresponding to the region a and the region b at approximately the same time and at high speed.

FIG. 143 is a diagram illustrating another example of a bright line image obtained through imaging by a receiver in Embodiment 17.

For example, the receiver captures an image at time t1 using N exposure lines included in the image sensor, obtaining a bright line image including a region made up of an area a where an unclear bright line pattern appears and an area b where a clear bright line pattern appears as illustrated in FIG. 143. This region is, as in the above-described case, where the bright line pattern appears because a subject, i.e., the transmitter, changes in luminance.

In this case, when the receiver determines that the visible light signal demodulated from the bright line pattern in the above-described region is not sufficient, the receiver captures an image at time t2 using only Q (Q<N) continuous exposure lines corresponding to the area b among the N exposure lines. By doing so, the receiver obtains a bright line image including only the area b out of the above-described region. The receiver repeatedly performs such imaging also at time t3 and time t4. As a result, it is possible to receive the visible light signal having a sufficient data amount from the subject corresponding to the above-described region at high speed.

Furthermore, after continuously capturing the bright line image including only the area b, the receiver may further continuously captures a bright line image including only the area a.

When a bright line image includes a plurality of regions (or areas) where a bright line pattern appears as described above, the receiver assigns the regions with numbers in sequence and captures bright line images including only the regions according to the sequence. In this case, the sequence may be determined according to the magnitude of a signal (the size of the region or area) or may be determined according to the clarity level of a bright line. Alternatively, the sequence may be determined according to the color of light from the subjects corresponding to the regions. For example, the first continuous imaging may be performed for the region corresponding to red light, and the next continuous imaging may be performed for the region corresponding to white light. Alternatively, it may also be possible to perform only continuous imaging for the region corresponding to red light.

(HDR Compositing)

FIG. 144 is a diagram for describing application of a receiver to a camera system which performs HDR compositing in Embodiment 17.

A camera system is mounted on a vehicle, for example, in order to prevent collision. This camera system performs high dynamic range (HDR) compositing using an image captured with a camera. This HDR compositing results in an image having a wide luminance dynamic range. The camera system recognizes surrounding vehicles, obstacles, humans or the like based on this image having a wide dynamic range.

For example, the setting mode of the camera system includes a normal setting mode and a communication setting mode. When the setting mode is the normal setting mode, the camera system captures four images at time t1 to time t4 at the same shutter speed of 1/100 seconds and with mutually different sensitivity levels, for example, as illustrated in FIG. 144. The camera system performs the HDR compositing using these four captured images.

When the setting mode is the communication setting mode, the camera system captures three images at time t5 to time t7 at the same shutter speed of 1/100 seconds and with mutually different sensitivity levels, for example, as illustrated in FIG. 144. Furthermore, the camera system captures an image at time t8 at a shutter speed of 1/10,000 seconds and with the highest sensitivity (for example, ISO=1,600). The camera system performs the HDR compositing using the first three images among these four captured images. Furthermore, the camera system receives a visible light signal from the last image among the above-described four captured images, and demodulates a bright line pattern appearing in the last image.

Furthermore, when the setting mode is the communication setting mode, the camera system is not required to perform the HDR compositing. For example, as illustrated in FIG. 144, the camera system captures an image at time t9 at a shutter speed of 1/100 seconds and with low sensitivity (for example, ISO=200). Furthermore, the camera system captures three images at time t10 to time t12 at a shutter speed of 1/10,000 seconds and with mutually different sensitivity levels. The camera system recognizes surrounding vehicles, obstacles, humans, or the like based on the first image among these four captured images. Furthermore, the camera system receives a visible light signal from the last three images among the above-described four captured images, and demodulates a bright line pattern appearing in the last three images.

Note that the images are captured at time t10 to time t12 with mutually different sensitivity levels in the example illustrated in FIG. 144, but may be captured with the same sensitivity.

A camera system such as that described above is capable of performing the HDR compositing and also is capable of receiving the visible light signal.

(Security)

FIG. 145 is a diagram for describing processing operation of a visible light communication system in Embodiment 17.

This visible light communication system includes, for example, a transmitter disposed at a cash register, a smartphone serving as a receiver, and a server. Note that communication between the smartphone and the server and communication between the transmitter and the server are each performed via a secure communication link. Communication between the transmitter and the smartphone is performed by visible light communication. The visible light communication system in this embodiment ensures security by determining whether or not the visible light signal from the transmitter has been properly received by the smartphone.

Specifically, the transmitter transmits a visible light signal indicating, for example, a value "100" to the smartphone by changing in luminance at time t1. At time t2, the smartphone receives the visible light signal and transmits a radio signal indicating the value "100" to the server. At time t3, the server receives the radio signal from the smartphone. At this time, the server performs a process for determining whether or not the value "100" indicated in the radio signal is a value of the visible light signal received by the smartphone from the transmitter. Specifically, the server transmits a radio signal indicating, for example, a value "200" to the transmitter. The transmitter receives the radio signal, and transmits a visible light signal indicating the value "200" to the smartphone by changing in luminance at time t4. At time t5, the smartphone receives the visible light signal and transmits a radio signal indicating the value "200" to the server. At time t6, the server receives the radio signal from the smartphone. The server determines whether or not the value indicated in this received radio signal is the same as the value indicated in the radio signal transmitted at time t3. When the values are the same, the server determines that the value "100" indicated in the visible light signal received at time t3 is a value of the visible light signal transmitted from the transmitter and received by the smartphone. When the values are not the same, the server determines that it is doubtful that the value "100" indicated in the visible light signal received at time t3 is a value of the visible light signal transmitted from the transmitter and received by the smartphone.

By doing so, the server is capable of determining whether or not the smartphone has certainly received the visible light signal from the transmitter. This means that when the smartphone has not received the visible light signal from the transmitter, signal transmission to the server as if the smartphone has received the visible light signal can be prevented.

Note that the communication between the smartphone, the server, and the transmitter is performed using the radio signal in the above-described example, but may be performed using an optical signal other than the visible light signal or using an electrical signal. The visible light signal transmitted from the transmitter to the smartphone indicates, for example, a value of a charged amount, a value of a coupon, a value of a monster, or a value of bingo.

(Vehicle Relationship)

FIG. 146A is a diagram illustrating an example of vehicle-to-vehicle communication using visible light in Embodiment 17.

For example, the leading vehicle recognizes using a sensor (such as a camera) mounted thereon that an accident occurred in a direction of travel. When the leading vehicle recognizes an accident as just described, the leading vehicle transmits a visible light signal by changing luminance of a taillight. For example, the leading vehicle transmits to a rear vehicle a visible light signal that encourages the rear vehicle to slow down. The rear vehicle receives the visible light signal by capturing an image with a camera mounted thereon, and slows down according to the visible light signal and transmits a visible light signal that encourages another rear vehicle to slow down.

Thus, the visible light signal that encourages a vehicle to slow down is transmitted in sequence from the leading vehicle to a plurality of vehicles which travel in line, and a vehicle that received the visible light signal slows down. Transmission of the visible light signal to the vehicles is so fast that these vehicles can slow down almost at the same time. Therefore, congestion due to accidents can be eased.

FIG. 146B is a diagram illustrating another example of vehicle-to-vehicle communication using visible light in Embodiment 17.

For example, a front vehicle may change luminance of a taillight thereof to transmit a visible light signal indicating a message (for example, "thanks") for the rear vehicle. This message is generated by user inputs to a smartphone, for example. The smartphone then transmits a signal indicating the message to the above front vehicle. As a result, the front vehicle is capable of transmitting the visible light signal indicating the message to the rear vehicle.

FIG. 147 is a diagram illustrating an example of a method of determining positions of a plurality of LEDs in Embodiment 17.

For example, a headlight of a vehicle includes a plurality of light emitting diodes (LEDs). The transmitter of this vehicle changes luminance of each of the LEDs of the headlight separately, thereby transmitting a visible light signal from each of the LEDs. The receiver of another vehicle receives these visible light signals from the plurality of LEDs by capturing an image of the vehicle having the headlight.

At this time, in order to recognize which LED transmitted the visible light signal that has been received, the receiver determines a position of each of the LEDs based on the captured image. Specifically, using an accelerometer installed on the same vehicle to which the receiver is fitted, the receiver determines a position of each of the LEDs on the basis of a gravity direction indicated by the accelerometer (a downward arrow in FIG. 147, for example).

Note that the LED is cited as an example of a light emitter which changes in luminance in the above-described example, but may be other light emitter than the LED.

FIG. 148 is a diagram illustrating an example of a bright line image obtained by capturing an image of a vehicle in Embodiment 17.

For example, the receiver mounted on a travelling vehicle obtains the bright line image illustrated in FIG. 148, by capturing an image of a vehicle behind the travelling vehicle (the rear vehicle). The transmitter mounted on the rear vehicle transmits a visible light signal to a front vehicle by changing luminance of two headlights of the vehicle. The front vehicle has a camera installed in a rear part, a side mirror, or the like for capturing an image of an area behind the vehicle. The receiver obtains the bright line image by capturing an image of a subject, that is, the rear vehicle, with the camera, and demodulates a bright line pattern (the visible light signal) included in the bright line image. Thus, the visible light signal transmitted from the transmitter of the rear vehicle is received by the receiver of the front vehicle.

At this time, on the basis of each of visible light signals transmitted from two headlights and demodulated, the receiver obtains an ID of the vehicle having the headlights, a speed of the vehicle, and a type of the vehicle. When IDs of two visible light signals are the same, the receiver determines that these two visible light signals are signals transmitted from the same vehicle. The receiver then identifies a length between the two headlights of the vehicle (a headlight-to-headlight distance) based on the type of the vehicle. Furthermore, the receiver measures a distance L1 between two regions included in the bright line image and where the bright line patterns appear. The receiver then calculates a distance between the vehicle on which the receiver is mounted and the rear vehicle (an inter-vehicle distance) by triangulation using the distance L1 and the headlight-to-headlight distance. The receiver determines a risk of collision based on the inter-vehicle distance and the speed of the vehicle obtained from the visible light signal, and provides a driver of the vehicle with a warning according to the result of the determination. With this, collision of vehicles can be avoided.

Note that the receiver identifies a headlight-to-headlight distance based on the vehicle type included in the visible light signal in the above-described example, but may identify a headlight-to-headlight distance based on information other than the vehicle type. Furthermore, when the receiver determines that there is a risk of collision, the receiver provides a warning in the above-described case, but may output to the vehicle a control signal for causing the vehicle to perform an operation of avoiding the risk. For example, the control signal is a signal for accelerating the vehicle or a signal for causing the vehicle to change lanes.

The camera captures an image of the rear vehicle in the above-described case, but may capture an image of an oncoming vehicle. When the receiver determines based on an image captured with the camera that it is foggy around the receiver (that is, the vehicle including the receiver), the receiver may be set to a mode of receiving a visible light signal such as that described above. With this, even when it is foggy around the receiver of the vehicle, the receiver is capable of identifying a position and a speed of an oncoming vehicle by receiving a visible light signal transmitted from a headlight of the oncoming vehicle.

FIG. 149 is a diagram illustrating an example of application of the receiver and the transmitter in Embodiment 17. A rear view of a vehicle is given in FIG. 149.

A transmitter (vehicle) 7006*a* having, for instance, two car taillights (light emitting units or lights) transmits identification information (ID) of the transmitter 7006*a* to a receiver such as a smartphone. Having received the ID, the receiver obtains information associated with the ID from a server. Examples of the information include the ID of the vehicle or the transmitter, the distance between the light emitting units, the size of the light emitting units, the size of the vehicle, the shape of the vehicle, the weight of the vehicle, the number of the vehicle, the traffic ahead, and information indicating the presence/absence of danger. The receiver may obtain these information directly from the transmitter 7006*a*.

FIG. 150 is a flowchart illustrating an example of processing operation of the receiver and the transmitter 7006*a* in Embodiment 17.

The ID of the transmitter 7006*a* and the information to be provided to the receiver receiving the ID are stored in the server in association with each other (Step 7106*a*). The information to be provided to the receiver may include information such as the size of the light emitting unit as the transmitter 7006*a*, the distance between the light emitting units, the shape and weight of the object including the transmitter 7006*a*, the identification number such as a vehicle identification number, the state of an area not easily observable from the receiver, and the presence/absence of danger.

The transmitter 7006*a* transmits the ID (Step 7106*b*). The transmission information may include the URL of the server and the information to be stored in the server.

The receiver receives the transmitted information such as the ID (Step 7106*c*). The receiver obtains the information associated with the received ID from the server (Step 7106*d*). The receiver displays the received information and the information obtained from the server (Step 7106*e*).

The receiver calculates the distance between the receiver and the light emitting unit by triangulation, from the information of the size of the light emitting unit and the apparent size of the captured light emitting unit or from the information of the distance between the light emitting units and the distance between the captured light emitting units (Step 71060. The receiver issues a warning of danger or the like, based on the information such as the state of an area not easily observable from the receiver and the presence/absence of danger (Step 7106*g*).

FIG. 151 is a diagram illustrating an example of application of the receiver and the transmitter in Embodiment 17.

A transmitter (vehicle) 7007*b* having, for instance, two car taillights (light emitting units or lights) transmits information of the transmitter 7007*b* to a receiver 7007*a* such as a transmitter-receiver in a parking lot. The information of the transmitter 7007*b* indicates the identification information (ID) of the transmitter 7007*b*, the number of the vehicle, the size of the vehicle, the shape of the vehicle, or the weight of the vehicle. Having received the information, the receiver 7007*a* transmits information of whether or not parking is permitted, charging information, or a parking position. The receiver 7007*a* may receive the ID, and obtain information other than the ID from the server.

FIG. 152 is a flowchart illustrating an example of processing operation of the receiver 7007*a* and the transmitter 7007*b* in Embodiment 17. Since the transmitter 7007*b* performs not only transmission but also reception, the transmitter 7007*b* includes an in-vehicle transmitter and an in-vehicle receiver.

The ID of the transmitter 7007*b* and the information to be provided to the receiver 7007*a* receiving the ID are stored in the server (parking lot management server) in association with each other (Step 7107*a*). The information to be provided to the receiver 7007*a* may include information such as the shape and weight of the object including the transmitter 7007*b*, the identification number such as a vehicle identification number, the identification number of the user of the transmitter 7007*b*, and payment information.

The transmitter 7007*b* (in-vehicle transmitter) transmits the ID (Step 7107*b*). The transmission information may include the URL of the server and the information to be stored in the server. The receiver 7007*a* (transmitter-receiver) in the parking lot transmits the received information to the server for managing the parking lot (parking lot management server) (Step 7107*c*). The parking lot management server obtains the information associated with the ID of the transmitter 7007*b*, using the ID as a key (Step 7107*d*). The parking lot management server checks the availability of the parking lot (Step 7107*e*).

The receiver 7007*a* (transmitter-receiver) in the parking lot transmits information of whether or not parking is permitted, parking position information, or the address of the server holding these information (Step 7107*f*). Alternatively, the parking lot management server transmits these information to another server. The transmitter (in-vehicle receiver) 7007*b* receives the transmitted information (Step 7107*g*). Alternatively, the in-vehicle system obtains these information from another server.

The parking lot management server controls the parking lot to facilitate parking (Step 7107*h*). For example, the parking lot management server controls a multi-level parking lot. The transmitter-receiver in the parking lot transmits the ID (Step 7107*i*). The in-vehicle receiver (transmitter 7007*b*) inquires of the parking lot management server based on the user information of the in-vehicle receiver and the received ID (Step 7107*j*).

The parking lot management server charges for parking according to parking time and the like (Step 7107*k*). The parking lot management server controls the parking lot to facilitate access to the parked vehicle (Step 7107*m*). For example, the parking lot management server controls a multi-level parking lot. The in-vehicle receiver (transmitter 7007*b*) displays the map to the parking position, and navigates from the current position (Step 7107*n*).

(Interior of Train)

FIG. 153 is a diagram illustrating components of a visible light communication system applied to the interior of a train in Embodiment 17.

The visible light communication system includes, for example, a plurality of lighting devices 1905 disposed inside a train, a smartphone 1906 held by a user, a server 1904, and a camera 1903 disposed inside the train.

Each of the lighting devices 1905 is configured as the above-described transmitter, and not only radiates light, but also transmits a visible light signal by changing in luminance. This visible light signal indicates an ID of the lighting device 1905 which transmits the visible light signal.

The smartphone 1906 is configured as the above-described receiver, and receives the visible light signal transmitted from the lighting device 1905, by capturing an image of the lighting device 1905. For example, when a user is involved in troubles inside a train (such as molestation or fights), the user operates the smartphone 1906 so that the smartphone 1906 receives the visible light signal. When the smartphone 1906 receives a visible light signal, the smartphone 1906 notifies the server 1904 of an ID indicated in the visible light signal.

The server 1904 is notified of the ID, and identifies the camera 1903 which has a range of imaging that is a range of illumination by the lighting device 1905 identified by the ID. The server 1904 then causes the identified camera 1903 to capture an image of a range illuminated by the lighting device 1905.

The camera 1903 captures an image according to an instruction issued by the server 1904, and transmits the captured image to the server 1904.

By doing so, it is possible to obtain an image showing a situation where a trouble occurs in the train. This image can be used as an evidence of the trouble.

Furthermore, an image captured with the camera 1903 may be transmitted from the server 1904 to the smartphone 1906 by a user operation on the smartphone 1906.

Moreover, the smartphone 1906 may display an imaging button on a screen and when a user touches the imaging button, transmit a signal prompting an imaging operation to the server 1904. This allows a user to determine a timing of an imaging operation.

FIG. 154 is a diagram illustrating components of a visible light communication system applied to amusement parks and the like facilities in Embodiment 17.

The visible light communication system includes, for example, a plurality of cameras 1903 disposed in a facility and an accessory 1907 worn by a person.

The accessory 1907 is, for example, a headband with a ribbon to which a plurality of LEDs are attached. This accessory 1907 is configured as the above-described transmitter, and transmits a visible light signal by changing luminance of the LEDs.

Each of the cameras 1903 is configured as the above-described receiver, and has a visible light communication mode and a normal imaging mode. Furthermore, these cameras 1903 are disposed at mutually different positions in a path inside the facility.

Specifically, when an image of the accessory 1907 as a subject is captured with the camera 1903 in the visible light communication mode, the camera 1903 receives a visible light signal from the accessory 1907. When the camera 1903 receives the visible light signal, the camera 1903 switches the preset mode from the visible light communication mode to the normal imaging mode. As a result, the camera 1903 captures an image of a person wearing the accessory 1907 as a subject.

Therefore, when a person wearing the accessory 1907 walks in the path inside the facility, the cameras 1903 close to the person capture images of the person one after another. Thus, it is possible to automatically obtain and store images which show the person enjoying time in the facility.

Note that instead of capturing an image in the normal imaging mode immediately after receiving the visible light signal, the camera 1903 may capture an image in the normal imaging mode, for example, when the camera 1903 is given an imaging start instruction from the smartphone. This allows a user to operate the camera 1903 so that an image of the user is captured with the camera 1903 at a timing when the user touches an imaging start button displayed on the screen of the smartphone.

FIG. 155 is a diagram illustrating an example of a visible light communication system including a play tool and a smartphone in Embodiment 17.

A play tool 1901 is, for example, configured as the above-described transmitter including a plurality of LEDs. Specifically, the play tool 1901 transmits a visible light signal by changing luminance of the LEDs.

A smartphone 1902 receives the visible light signal from the play tool 1901 by capturing an image of the play tool 1901. As illustrated in (a) of FIG. 155, when the smartphone 1902 receives the visible light signal for the first time, the smartphone 1902 downloads, from the server or the like, for example, video 1 associated with the first transmission of the visible light signal. When the smartphone 1902 receives the visible light signal for the second time, the smartphone 1902 downloads, from the server or the like, for example, video 2 associated with the second transmission of the visible light signal as illustrated in (b) of FIG. 155.

This means that when the smartphone 1902 receives the same visible light signal, the smartphone 1902 switches video which is reproduced according to the number of times the smartphone 1902 has received the visible light signal. The number of times the smartphone 1902 has received the visible light single may be counted by the smartphone 1902 or may be counted by the server. Even when the smartphone 1902 has received the same visible light signal more than one time, the smartphone 1902 does not continuously reproduce the same video. The smartphone 1902 may decrease the probability of occurrence of video already reproduced and preferentially download and reproduce video with high probability of occurrence among a plurality of video items associated with the same visible light signal.

The smartphone 1902 may receive a visible light signal transmitted from a touch screen placed in an information office of a facility including a plurality of shops, and display an image according to the visible light signal. For example, when a default image representing an overview of the facility is displayed, the touch screen transmits a visible light signal indicating the overview of the facility by changing in luminance. Therefore, when the smartphone receives the visible light signal by capturing an image of the touch screen on which the default image is displayed, the smartphone can display on the display thereof an image showing the overview of the facility. In this case, when a user provides an input to the touch screen, the touch screen displays a shop image indicating information on a specified shop, for example. At this time, the touch screen transmits a visible light signal indicating the information on the specified shop. Therefore, the smartphone receives the visible light signal by capturing an image of the touch screen displaying the shop image, and thus can display the shop image indicating the information on the specified shop. Thus, the smartphone is capable of displaying an image in synchronization with the touch screen.

Summary of Above Embodiment

A reproduction method according to an aspect of the present disclosure includes: a signal reception step of receiving a visible light signal by a sensor of a terminal device from a transmitter which transmits the visible light signal by a light source changing in luminance; a transmission step of transmitting a request signal for requesting content associated with the visible light signal, from the terminal device to a server; a content reception step of receiving, by the terminal device, content including time points and data to be reproduced at the time points, from the server; and a reproduction step of reproducing data included in the content and corresponding to time of a clock included in the terminal device.

With this, as illustrated in FIG. 131C, content including time points and data to be reproduced at the time points is received by a terminal device, and data corresponding to time of a clock included in the terminal device is reproduced. Therefore, the terminal device avoids reproducing data included in the content, at an incorrect point of time, and is capable of appropriately reproducing the data at a correct point of time indicated in the content. Specifically, as in the method e in FIG. 131A, the terminal device, i.e., the receiver, reproduces the content from a point of time of (the receiver time point—the content reproduction start time point). The above-mentioned data corresponding to time of the clock included in the terminal device is data included in the content and which is at a point of time of (the receiver time point—the content reproduction start time point). Furthermore, when content related to the above content (the transmitter-side content) is also reproduced on the transmitter, the terminal device is capable of appropriately reproducing the content in synchronization with the transmitter-side content. Note that the content is audio or an image.

Furthermore, the clock included in the terminal device may be synchronized with a reference clock by global positioning system (GPS) radio waves or network time protocol (NTP) radio waves.

In this case, since the clock of the terminal device (the receiver) is synchronized with the reference clock, at an appropriate time point according to the reference clock, data corresponding to the time point can be reproduced as illustrated in FIG. 130 and FIG. 132.

Furthermore, the visible light signal may indicate a time point at which the visible light signal is transmitted from the transmitter.

With this, the terminal device (the receiver) is capable of receiving content associated with a time point at which the visible light signal is transmitted from the transmitter (the transmitter time point) as indicated in the method d in FIG. 131A. For example, when the transmitter time point is 5:43, content that is reproduced at 5:43 can be received.

Furthermore, in the above reproduction method, when the process for synchronizing the clock of the terminal device with the reference clock is performed using the GPS radio waves or the NTP radio waves is at least a predetermined time before a point of time at which the terminal device receives the visible light signal, the clock of the terminal device may be synchronized with a clock of the transmitter using a time point indicated in the visible light signal transmitted from the transmitter.

For example, when the predetermined time has elapsed after the process for synchronizing the clock of the terminal device with the reference clock, there are cases where the synchronization is not appropriately maintained. In this case, there is a risk that the terminal device cannot reproduce content at a point of time which is in synchronization with the transmitter-side content reproduced by the transmitter. Thus, in the reproduction method according to an aspect of the present disclosure described above, when the predetermined time has elapsed, the clock of the terminal device (the receiver) and the clock of the transmitter are synchronized with each other as in Step S1829 and Step S1830 of FIG. 130. Consequently, the terminal device is capable of reproducing content at a point of time which is in synchronization with the transmitter-side content reproduced by the transmitter.

Furthermore, the server may hold a plurality of content items associated with time points, and in the content reception step, when content associated with the time point indicated in the visible light signal is not present in the server, among the plurality of content items, content associated with a time point that is closest to the time point indicated in the visible light signal and after the time point indicated in the visible light signal may be received.

With this, as illustrated in the method d in FIG. 131A, it is possible to receive appropriate content among the plurality of content items in the server even when the server does not have content associated with a time point indicated in the visible light signal.

Furthermore, the reproduction method may include: a signal reception step of receiving a visible light signal by a sensor of a terminal device from a transmitter which transmits the visible light signal by a light source changing in luminance; a transmission step of transmitting a request signal for requesting content associated with the visible light signal, from the terminal device to a server; a content reception step of receiving, by the terminal device, content from the server; and a reproduction step of reproducing the content, and the visible light signal may indicate ID information and a time point at which the visible light signal is transmitted from the transmitter, and in the content reception step, the content that is associated with the ID information and the time point indicated in the visible light signal may be received.

With this, as in the method d in FIG. 131A, among the plurality of content items associated with the ID information (the transmitter ID), content associated with a time point at which the visible light signal is transmitted from the transmitter (the transmitter time point) is received and reproduced. Thus, it is possible to reproduce appropriate content for the transmitter ID and the transmitter time point.

Furthermore, the visible light signal may indicate the time point at which the visible light signal is transmitted from the transmitter, by including second information indicating an hour and a minute of the time point and first information indicating a second of the time point, and the signal reception step may include receiving the second information and receiving the first information a greater number of times than a total number of times the second information is received.

With this, for example, when a time point at which each packet included in the visible light signal is transmitted is sent to the terminal device at a second rate, it is possible to reduce the burden of transmitting, every time one second passes, a packet indicating a current time point represented using all the hour, the minute, and the second. Specifically, as illustrated in FIG. 126, when the hour and the minute of a time point at which a packet is transmitted have not been updated from the hour and the minute indicated in the previously transmitted packet, it is sufficient that only the first information which is a packet indicating only the second (the time packet 1) is transmitted. Therefore, when an amount of the second information to be transmitted by the transmitter, which is a packet indicating the hour and the minute (the time packet 2), is set to less than an amount of the first information to be transmitted by the transmitter, which is a packet indicating the second (the time packet 1), it is possible to avoid transmission of a packet including redundant content.

Furthermore, the sensor of the terminal device may be an image sensor, in the signal reception step, continuous imaging with the image sensor may be performed while a shutter speed of the image sensor is alternately switched between a first speed and a second speed higher than the first speed, (a) when a subject imaged with the image sensor is a barcode, an image in which the barcode appears may be obtained through imaging performed when the shutter speed is the first speed, and a barcode identifier may be obtained by decoding the barcode appearing in the image, and (b) when a subject imaged with the image sensor is the light source, a bright line image which is an image including bright lines corresponding to a plurality of exposure lines included in the image sensor may be obtained through imaging performed when the shutter speed is the second speed, and the visible light signal may be obtained as a visible light identifier by decoding a plurality of patterns of the bright lines included in the obtained bright line image, and the reproduction method may further include displaying an image obtained through imaging performed when the shutter speed is the first speed.

Thus, as illustrated in FIG. 102, it is possible to appropriately obtain, from any of a barcode and a visible light signal, an identifier adapted therefor, and it is also possible to display an image in which the barcode or light source serving as a subject appears.

Furthermore, in the obtaining of the visible light identifier, a first packet including a data part and an address part may be obtained from the plurality of patterns of the bright lines, whether or not at least one packet already obtained before the first packet includes at least a predetermined number of second packets each including the same address part as the address part of the first packet may be determined, and when it is determined that at least the predetermined number of the second packets are included, a combined pixel value may be calculated by combining a pixel value of a partial region of the bright line image that corresponds to a data part of each of at least the predetermined number of the second packets and a pixel value of a partial region of the bright line image that corresponds to the data part of the first packet, and at least a part of the visible light identifier may be obtained by decoding the data part including the combined pixel value.

With this, as illustrated in FIG. 74, even when the data parts of a plurality of packets including the same address part are slightly different, pixel values of the data parts are combined to enable appropriate data parts to be decoded, and thus it is possible to properly obtain at least a part of the visible light identifier.

Furthermore, the first packet may further include a first error correction code for the data part and a second error correction code for the address part, and in the signal reception step, the address part and the second error correction code transmitted from the transmitter by changing in luminance according to a second frequency may be received, and the data part and the first error correction code transmitted from the transmitter by changing in luminance according to a first frequency higher than the second frequency may be received.

With this, erroneous reception of the address part can be reduced, and the data part having a large data amount can be promptly obtained.

Furthermore, in the obtaining of the visible light identifier, a first packet including a data part and an address part may be obtained from the plurality of patterns of the bright lines, whether or not at least one packet already obtained before the first packet includes at least one second packet which is a packet including the same address part as the address part of the first packet may be determined, when it is determined that the at least one second packet is included, whether or not all the data parts of the at least one second packet and the first packet are the same may be determined, when it is determined that not all the data parts are the same, it may be determined for each of the at least one second packet whether or not a total number of parts, among parts included in the data part of the second packet, which are different from parts included in the data part of the first packet, is a predetermined number or more, when the at least one second packet includes the second packet in which the total number of different parts is determined as the predetermined number or more, the at least one second packet may be discarded, and when the at least one second packet does not include the second packet in which the total number of different parts is determined as the predetermined number or more, a plurality of packets in which a total number of packets having the same data part is highest may be identified among the first packet and the at least one second packet, and at least a part of the visible light identifier may be obtained by decoding a data part included in each of the plurality of packets as a data part corresponding to the address part included in the first packet.

With this, as illustrated in FIG. 73, even when a plurality of packets having the same address part are received and the data parts in the packets are different, an appropriate data part can be decoded, and thus at least a part of the visible light identifier can be properly obtained. This means that a plurality of packets transmitted from the same transmitter and having the same address part basically have the same data part. However, there are cases where the terminal device receives a plurality of packets which have the same address part but have mutually different data parts, when the terminal device switches the transmitter serving as a transmission source of packets from one to another. In such a case, in the reproduction method according to an aspect of the present disclosure described above, the already received packet (the second packet) is discarded as in Step S10106 of FIG. 73, allowing the data part of the latest packet (the first packet) to be decoded as a proper data part corresponding to the address part therein. Furthermore, even when no such switch of transmitters as mentioned above occurs, there are cases where the data parts of the plurality of packets having the same address part are slightly different, depending on the visible light signal transmitting and receiving status. In such cases, in the reproduction method according to an aspect of the present disclosure described above, what is called a decision by the majority as in Step S10107 of FIG. 73 makes it possible to decode a proper data part.

Furthermore, in the obtaining of the visible light identifier, a plurality of packets each including a data part and an address part may be obtained from the plurality of patterns of the bright lines, and whether or not the obtained packets include a 0-end packet which is a packet including the data part in which all bits are zero may be determined, and when it is determined that the 0-end packet is included, whether or not the plurality of packets include all N associated packets (where N is an integer of 1 or more) which are each a packet including an address part associated with an address part of the 0-end packet may be determined, and when it is determined that all the N associated packets are included, the visible light identifier may be obtained by arranging and decoding data parts of the N associated packets. For example, the address part associated with the address part of the 0-end packet is an address part representing an address greater than or equal to 0 and smaller than an address represented by the address part of the 0-end packet.

Specifically, as illustrated in FIG. 75, whether or not all the packets having addresses following the address of the 0-end packet are present as the associated packets is determined, and when it is determined that all the packets are present, data parts of the associated packets are decoded. With this, even when the terminal device does not previously have information on how many associated packets are necessary for obtaining the visible light identifier and furthermore, does not previously have the addresses of these associated packets, the terminal device is capable of easily obtaining such information at the time of obtaining the 0-end packet. As a result, the terminal device is capable of obtaining an appropriate visible light identifier by arranging and decoding the data parts of the N associated packets.

Embodiment 18

A protocol adapted for variable length and variable number of divisions is described.

FIG. 156 is a diagram illustrating an example of a transmission signal in this embodiment.

A transmission packet is made up of a preamble, TYPE, a payload, and a check part. Packets may be continuously transmitted or may be intermittently transmitted. With a period in which no packet is transmitted, it is possible to change the state of liquid crystals when the backlight is turned off, to improve the sense of dynamic resolution of the liquid crystal display. When the packets are transmitted at random intervals, signal interference can be avoided.

For the preamble, a pattern that does not appear in the 4PPM is used. The reception process can be facilitated with the use of a short basic pattern.

The kind of the preamble is used to represent the number of divisions in data so that the number of divisions in data can be made variable without unnecessarily using a transmission slot.

When the payload length varies according to the value of the TYPE, it is possible to make the transmission data variable. In the TYPE, the payload length may be represented, or the data length before division may be represented. When a value of the TYPE represents an address of a packet, the receiver can correctly arrange received packets. Furthermore, the payload length (the data length) that is represented by a value of the TYPE may vary according to the kind of the preamble, the number of divisions, or the like.

When the length of the check part varies according to the payload length, efficient error correction (detection) is possible. When the shortest length of the check part is set to two bits, efficient conversion to the 4PPM is possible. Furthermore, when the kind of the error correction (detection) code varies according to the payload length, error correction (detection) can be efficiently performed. The length of the check part and the kind of the error correction (detection) code may vary according to the kind of the preamble or the value of the TYPE.

Some of different combinations of the payload and the number of divisions lead to the same data length. In such a case, each combination even with the same data value is given a different meaning so that more values can be represented.

A high-speed transmission and luminance modulation protocols are described.

FIG. 157 is a diagram illustrating an example of a transmission signal in this embodiment.

A transmission packet is made up of a preamble part, a body part, and a luminance adjustment part. The body includes an address part, a data part, and an error correction (detection) code part. When intermittent transmission is permitted, the same advantageous effects as described above can be obtained.

Embodiment 19

(Frame Configuration in Single Frame Transmission)

FIG. 158 is a diagram illustrating an example of a transmission signal in this embodiment.

The transmission frame includes a preamble (PRE), a frame length (FLEN), an ID type (IDTYPE), content (ID/DATA), and a check code (CRC), and the transmission frame may include a content type (CONTENTTYPE). A number of bits of each region is an example.

The content having a variable length can be transmitted by designating the length of ID/DATA using FLEN.

The CRC is a check code for correcting or detecting an error in other parts than the PRE. The CRC length varies according to the length of a part to be checked so that the check ability can be kept at a certain level or higher. Furthermore, the use of a different check code according to each length of a part to be checked allows an improvement in the check ability per CRC length.

(Frame Configuration in Multiple Frame Transmission)

FIG. 159 is a diagram illustrating an example of a transmission signal in this embodiment.

A transmission frame includes a preamble (PRE), an address (ADDR), and a part of divided data (DATAPART), and may also include the number of divisions (PARTNUM) and an address flag (ADDRFRAG). The bit number of each area is an example.

Content is divided into a plurality of parts before being transmitted, which enables long-distance communication.

When content is equally divided into parts of the same size, the maximum frame length is reduced, and communication is stabilized.

If content cannot be equally divided, the content is divided in such a way that one part is smaller in size than the other parts, allowing data of a moderate size to be transmitted.

When the content is divided into parts having different sizes and a combination of division sizes is given a meaning, a larger amount of information can be transmitted. One data item, for example, 32-bit data, can be treated as different data items between when 8-bit data is transmitted four times, when 16-bit data is transmitted twice, and when 15-bit data is transmitted once and 17-bit data is transmitted once; thus, a larger amount of information can be represented.

With PARTNUM representing the number of divisions, the receiver can be promptly informed of the number of divisions and can accurately display a progress of the reception.

With the settings that the address is not the last address when the ADDRFRAG is 0 and the address is the last address when the ADDRFRAG is 1, the area representing the number of divisions is no longer needed, and the information can be transmitted in a shorter period of time.

The CRC is, as described above, a check code for correcting or detecting an error in other parts than the PRE. Through this check, interference can be detected when transmission frames from a plurality of transmission sources are received. When the CRC length is an integer multiple of the DATAPART length, interference can be detected most efficiently.

At the end of the divided frame (the frame illustrated in (a), (b), or (c) of FIG. 159), a check code for checking other parts than the PRE of the frame may be added.

The IDTYPE illustrated in (d) of FIG. 159 may have a fixed length such as 4 bits or 5 bits as in (a) to (d) of FIG. 158, or the IDTYPE length may be variable according to the ID/DATA length. With this configuration, the same advantageous effects as described above can be obtained.

(Selection of ID/DATA Length)

FIG. 160 is a diagram illustrating an example of a transmission signal in this embodiment.

In the cases of (a) to (d) of FIG. 158, ucode can be represented when data has 128 bits with the settings according to tables (a) and (b) illustrated in FIG. 160.

(CRC Length and Generator Polynomial)

FIG. 161 is a diagram illustrating an example of a transmission signal in this embodiment.

The CRC length is set in this way to keep the checking ability regardless of the length of a subject to be checked.

The generator polynomial is an example, and other generator polynomial may be used. Furthermore, a check code other than the CRC may also be used. With this, the checking ability can be improved.

(Selection of DATAPART Length and Selection of Last Address According to type of Preamble)

FIG. 162 is a diagram illustrating an example of a transmission signal in this embodiment.

When the DATAPART length is indicated with reference to the type of the preamble, the area representing the DATAPART length is no longer needed, and the information can be transmitted in a shorter period of time. Furthermore, when whether or not the address is the last address is indicated, the area representing the number of divisions is no longer needed, and the information can be transmitted in a shorter period of time. Furthermore, in the case of (b) of FIG. 162, the DATAPART length is unknown when the address is the last address, and therefore a reception process can be performed assuming that the DATAPART length is estimated to be the same as the DATAPART length of a frame which is received immediately before or after reception of the current frame and has an address which is not the last address so that the signal is properly received.

The address length may be different according to the type of the preamble. With this, the number of combinations of lengths of transmission information can be increased, and the information can be transmitted in a shorter period of time, for example.

In the case of (c) of FIG. 162, the preamble defines the number of divisions, and an area representing the DATAPART length is added.

(Selection of Address)

FIG. 163 is a diagram illustrating an example of a transmission signal in this embodiment.

A value of the ADDR indicates the address of the frame, with the result that the receiver can reconstruct properly transmitted information.

A value of PARTNUM indicates the number of divisions, with the result that the receiver can be informed of the number of divisions without fail at the time of receiving the first frame and can accurately display a progress of the reception.

(Prevention of Interference by Difference in Number of Divisions)

FIG. 164 and FIG. 165 are a diagram and a flowchart illustrating an example of a transmission and reception system in this embodiment.

When the transmission information is equally divided and transmitted, since signals from a transmitter A and a transmitter B in FIG. 164 have different preambles, the receiver can reconstruct the transmission information without mixing up transmission sources even when these signals are received at the same time.

When the transmitters A and B include a number-of-divisions setting unit, a user can prevent interference by setting the number of divisions of transmitters placed close to each other to different values.

The receiver registers the number of divisions of the received signal with the server so that the server can be informed of the number of divisions set to the transmitter, and other receiver can obtain the information from the server to accurately display a progress of the reception.

The receiver obtains, from the server or the storage unit of the receiver, information on whether or not a signal from a nearby or corresponding transmitter is an equally-divided signal. When the obtained information is equally-divided information, only a signal from a frame having the same DATAPART length is reconstructed. When the obtained information is not equally divided information or when a situation in which not all addresses in the frames having the same DATAPART length are present continues for a predetermined length of time or more, a signal obtained by combining frames having different DATAPART lengths is decoded.

(Prevention of Interference by Difference in Number of Divisions)

FIG. 166 is a flowchart illustrating operation of a server in this embodiment.

The server receives, from the receiver, ID and division formation (which is information on a combination of DATAPART lengths of the received signal) received by the receiver. When the ID is subject to extension according to the division formation, a value obtained by digitalizing a pattern of the division formation is defined as an auxiliary ID, and associated information using, as a key, an extended ID obtained by combining the ID and the auxiliary ID is sent to the receiver.

When the ID is not subject to the extension according to the division formation, whether or not the storage unit holds division formation associated with the ID is checked, and whether or not the division formation held in the storage unit is the same as the received division formation is checked. When the division formation held in the storage unit is different from the received division formation, a re-check instruction is transmitted to the receiver. With this, erroneous information due to a reception error in the receiver can be prevented from being presented.

When the same division formation with the same ID is received within a predetermined length of time after the re-check instruction is transmitted, it is determined that the division formation has been changed, and the division formation associated with the ID is updated. Thus, it is possible to adapt to the case where the division formation has been changed as described in the explanation with reference to FIG. 164.

When the division formation has not been stored, when the received division formation and the held division formation match, or when the division formation is updated, the associated information using the ID as a key is sent to the receiver, and the division formation is stored into the storage unit in association with the ID.

(Indication of Status of Reception Progress)

FIG. 167 to FIG. 172 are flowcharts each illustrating an example of operation of a receiver in this embodiment.

The receiver obtains, from the server or the storage area of the receiver, the variety and ratio of the number of divisions of a transmitter corresponding to the receiver or a transmitter around the receiver. Furthermore, when partial division data is already received, the variety and ratio of the number of divisions of the transmitter which has transmitted information matching the partial division data are obtained.

The receiver receives a divided frame.

When the last address has already been received, when the variety of the obtained number of divisions is only one, or when the variety of the number of divisions corresponding to a running reception app is only one, the number of divisions is already known, and therefore, the status of progress is displayed based on this number of divisions.

Otherwise, the receiver calculates and displays a status of progress in a simple mode when there are a few available processing resources or an energy-saving mode is ON. In contrast, when there are many available processing resources or the energy-saving mode is OFF, the receiver calculates and displays a status of progress in a maximum likelihood estimation mode.

FIG. 168 is a flowchart illustrating a method of calculating a status of progress in a simple mode.

First, the receiver obtains a standard number of divisions Ns from the server. Alternatively, the receiver reads the standard number of divisions Ns from a data holding unit included therein. Note that the standard number of divisions is (a) a mode or an expected value of the number of transmitters that transmit data divided by such number of divisions, (b) the number of divisions determined for each packet length, (c) the number of divisions determined for each application, or (d) the number of divisions determined for each identifiable range where the receiver is present.

Next, the receiver determines whether or not a packet indicating that the last address is included has already been received. When the receiver determines that the packet has been received, the address of the last packet is denoted as N. In contrast, when the receiver determines that the packet has not been received, a number obtained by adding 1 or a number of 2 or more to the received maximum address Amax is denoted as Ne. Here, the receiver determines whether or not Ne>Ns is satisfied. When the receiver determines that Ne>Ns is satisfied, the receiver assumes N=Ne. In contrast, when the receiver determines that Ne>Ns is not satisfied, the receiver assumes N=Ns.

Assuming that the number of divisions in the signal that is being received is N, the receiver then calculates a ratio of the number of the received packets to packets required to receive the entire signal.

In such a simple mode, the status of progress can be calculated by a simpler calculation than in the maximum likelihood estimation mode. Thus, the simple mode is advantageous in terms of processing time or energy consumption.

FIG. 169 is a flowchart illustrating a method of calculating a status of progress in a maximum likelihood estimation mode.

First, the receiver obtains a previous distribution of the number of divisions from the server. Alternatively, the receiver reads the previous distribution from the data holding unit included therein. Note that the previous distribution is (a) determined as a distribution of the number of transmitters that transmit data divided by the number of divisions, (b) determined for each packet length, (c) determined for each application, or (d) determined for each identifiable range where the receiver is present.

Next, the receiver receives a packet x and calculates a probability P(x|y) of receiving the packet x when the number of divisions is y. The receiver then determines a probability p(y|x) of the number of divisions of a transmission signal being y when the packet x is received, according to P(x|y)×P(y)÷A (where A is a multiplier for normalization). Furthermore, the receiver assumes P(y)=P(y|x).

Here, the receiver determines whether or not a number-of-divisions estimation mode is a maximum likelihood mode or a likelihood average mode. When the number-of-divisions estimation mode is the maximum likelihood mode, the receiver calculates a ratio of the number of packets that have been received, assuming that y maximizing P(y) is the number of divisions. When the number-of-divisions estimation mode is the likelihood average mode, the receiver calculates a ratio of the number of packets that have been received, assuming that a sum of y×P(y) is the number of divisions.

In the maximum likelihood estimation mode such as that just described, a more accurate degree of progress can be calculated than in the simple mode.

Furthermore, when the number-of-divisions estimation mode is the maximum likelihood mode, a likelihood of the last address being at a position of each number is calculated using the address that have so far been received, and the number having the highest likelihood is estimated as the number of divisions. With this, a progress of reception is displayed. In this display method, a status of progress closest to the actual status of progress can be displayed.

FIG. 170 is a flowchart illustrating a display method in which a status of progress does not change downward.

First, the receiver calculates a ratio of the number of packets that have been received to packets required to receive the entire signal. The receiver then determines whether or not the calculated ratio is smaller than a ratio that is being displayed. When the receiver determines that the calculated ratio is smaller than the ratio that is being displayed, the receiver further determines whether or not the ratio that is being displayed is a calculation result obtained no less than a predetermined time before. When the receiver determines that the ratio that is being displayed is a calculation result obtained no less than the predetermined time before, the receiver displays the calculated ratio. When the receiver determines that the ratio that is being displayed is not a calculation result obtained no less than the predetermined time before, the receiver continues to display the ratio that is being displayed.

Furthermore, the receiver determines that the calculated ratio is greater than or equal to the ratio that is being displayed, the receiver denotes, as Ne, the number obtained by adding 1 or the number of 2 or more to a received maximum address Amax. The receiver then displays the calculated ratio.

When the last packet is received, for example, a calculation result of the status of progress smaller than a previous result thereof, that is, a downward change in status of progress (degree of progress) which is displayed, is unnatural. In this regard, such an unnatural result can be prevented from being displayed in the above-described display method.

FIG. 171 is a flowchart illustrating a method of displaying a status of progress when there is a plurality of packet lengths.

First, the receiver calculates, for each packet length, a ratio P of the number of packets that have been received. At this time, the receiver determines which of the modes including a maximum mode, an entirety display mode, and a latest mode, the display mode is. When the receiver determines that the display mode is the maximum mode, the receiver displays the highest ratio out of the ratios P for the plurality of packet lengths. When the receiver determines that the display mode is the entirety display mode, the receiver displays all the ratios P. When the display mode is the latest mode, the receiver displays the ratio P for the packet length of the last received packet.

In FIG. 172, (a) is a status of progress calculated in the simple mode, (b) is a status of progress calculated in the maximum likelihood mode, and (c) is a status of progress calculated using the smallest one of the obtained numbers of divisions as the number of divisions. Since the status of progress changes upward in the ascending order of (a), (b), and (c), it is possible to display all the statuses at the same time by displaying (a), (b), and (c) in layers as in the illustration.

(Light Emission Control using Common Switch and Pixel Switch)

In the transmitting method in this embodiment, a visible light signal (which is also referred to as a visible light communication signal) is transmitted by each LED included in an LED display for displaying an image, changing in luminance according to switching of a common switch and a pixel switch, for example.

The LED display is configured as a large display installed in open space, for example. Furthermore, the LED display includes a plurality of LEDs arranged in a matrix, and displays an image by causing these LEDs to blink according to an image signal. The LED display includes a plurality of common lines (COM lines) and a plurality of pixel lines (SEG lines). Each of the common lines includes a plurality of LEDs horizontally arranged in line, and each of the pixel lines includes a plurality of LEDs vertically arranged in line. Each of the common lines is connected to common switches corresponding to the common line. The common switches are transistors, for example. Each of the pixel lines is connected to pixel switches corresponding to the pixel line. The pixel switches corresponding to the plurality of pixel lines are included in an LED driver circuit (a constant current circuit), for example. Note that the LED driver circuit is configured as a pixel switch control unit that switches the plurality of pixel switches.

More specifically, one of an anode and a cathode of each LED included in the common line is connected to a terminal, such as a connector, of the transistor corresponding to that common line. The other of the anode and the cathode of each LED included in the pixel line is connected to a terminal (a pixel switch) of the above LED driver circuit which corresponds to that pixel line.

When the LED display displays an image, a common switch control unit which controls the plurality of common switches turns ON the common switches in a time-division manner. For example, the common switch control unit keeps only a first common switch ON among the plurality of common switches during a first period, and keeps only a second common switch ON among the plurality of common switches during a second period following the first period. The LED driver circuit turns each pixel switch ON according to an image signal during a period in which any of the common switches is ON. With this, only for the period in which the common switch is ON and the pixel switch is ON, an LED corresponding to that common switch and that pixel switch is ON. Luminance of pixels in an image is represented using this ON period. This means that the luminance of pixels in an image is under the PWM control.

In the transmitting method in this embodiment, the visible light signal is transmitted using the LED display, the common switches, the pixel switches, the common switch control unit, and the pixel switch control unit such as those described above. A transmitting apparatus (referred to also as a transmitter) in this embodiment that transmits the visible light signal in the transmitting method includes the common switch control unit and the pixel switch control unit.

FIG. 173 is a diagram illustrating an example of a transmission signal in this embodiment.

The transmitter transmits each symbol included in the visible light signal, according to a predetermined symbol period. For example, when the transmitter transmits a symbol "00" in the 4PPM, the common switches are switched according to the symbol (a luminance change pattern of "00") in the symbol period made up of four slots. The transmitter then switches the pixel switches according to average luminance indicated by an image signal or the like.

More specifically, when the average luminance in the symbol period is set to 75% ((a) in FIG. 173), the transmitter keeps the common switch OFF for the period of a first slot and keeps the common switch ON for the period of a second slot to a fourth slot. Furthermore, the transmitter keeps the pixel switch OFF for the period of the first slot, and keeps the pixel switch ON for the period of the second slot to the fourth slot. With this, only for the period in which the common switch is ON and the pixel switch is ON, an LED corresponding to that common switch and that pixel switch is ON. In other words, the LED changes in luminance by being turned ON with luminance of LO (Low), HI (High), HI, and HI in the four slots. As a result, the symbol "00" is transmitted.

When the average luminance in the symbol period is set to 25% ((e) in FIG. 173), the transmitter keeps the common switch OFF for the period of the first slot and keeps the common switch ON for the period of the second slot to the fourth slot. Furthermore, the transmitter keeps the pixel switch OFF for the period of the first slot, the third slot, and the fourth slot, and keeps the pixel switch ON for the period of the second slot. With this, only for the period in which the common switch is ON and the pixel switch is ON, an LED corresponding to that common switch and that pixel switch is ON. In other words, the LED changes in luminance by being turned ON with luminance of LO (Low), HI (High), LO, and LO in the four slots. As a result, the symbol "00" is transmitted. Note that the transmitter in this embodiment transmits a visible light signal similar to the above-described V4PPM (variable 4PPM) signal, meaning that the same symbol can be transmitted with variable average luminance. Specifically, when the same symbol (for example, "00") is transmitted with average luminance at mutually different levels, the transmitter sets the luminance rising position (timing) unique to the symbol, to a fixed position, regardless of the average luminance, as illustrated in (a) to (e) of FIG. 173. With this, the receiver is capable of receiving the visible light signal without caring about the luminance.

Note that the common switches are switched by the above-described common switch control unit, and the pixel switches are switched by the above-described pixel switch control unit.

Thus, the transmitting method in this embodiment is a transmitting method of transmitting a visible light signal by way of luminance change, and includes a determining step, a common switch control step, and a first pixel switch control step. In the determining step, a luminance change pattern is determined by modulating the visible light signal. In the common switch control step, a common switch for turning ON, in common, a plurality of light sources (LEDs) which are included in a light source group (the common line) of a display and are each used for representing a pixel in an image is switched according to the luminance change pattern. In the first pixel switch control step, a first pixel switch for turning ON a first light source among the plurality of light sources included in the light source group is turned ON, to cause the first light source to be ON only for a period in which the common switch is ON and the first pixel switch is ON, to transmit the visible light signal.

With this, a visible light signal can be properly transmitted from a display including a plurality of LEDs or the like as the light sources. Therefore, this enables communication between various devices including devices other than lightings. Furthermore, when the display is a display for displaying images under control of the common switch and the first pixel switch, the visible light signal can be transmitted using that common switch and that first pixel switch. Therefore, it is possible to easily transmit the visible light signal without a significant change in the structure for displaying images on the display.

Furthermore, the timing of controlling the pixel switch is adjusted to match the transmission symbol (one 4PPM), that is, is controlled as in FIG. 173 so that the visible light signal can be transmitted from the LED display without flicker. An image signal usually changes in a period of 1/30 seconds or 1/60 seconds, but the image signal can be changed according to the symbol transmission period (the symbol period) to reach the goal without changes to the circuit.

Thus, in the above determining step of the transmitting method in this embodiment, the luminance change pattern is determined for each symbol period. Furthermore, in the above first pixel switch control step, the pixel switch is switched in synchronization with the symbol period. With this, even when the symbol period is 1/2400 seconds, for example, the visible light signal can be properly transmitted according to the symbol period.

When the signal (symbol) is "10" and the average luminance is around 50%, the luminance change pattern is similar to that of 0101 and there are two luminance rising edge positions. In this case, the latest one of the luminance rising positions is prioritized so that the receiver can properly receive the signal. This means that the latest one of the luminance rising edge positions is the timing at which a luminance rising edge unique to the symbol "10" is obtained.

As the average luminance increases, a signal more similar to the signal modulated in the 4PPM can be output. Therefore, when the luminance of the entire screen or areas sharing a power line is low, the amount of current is reduced to lower the instantaneous value of the luminance so that the length of the HI section can be increased and errors can be reduced. In this case, although the maximum luminance of the screen is lowered, a switch for enabling this function is turned ON, for example, when high luminance is not necessary, such as for outdoor use, or when the visible light communication is given priority, with the result that a balance between the communication quality and the image quality can be set to the optimum.

Furthermore, in the above first pixel switch control step of the transmitting method in this embodiment, when the image is displayed on the display (the LED display), the first pixel switch is switched to increase a lighting period, which is for representing a pixel value of a pixel in the image and corresponds to the first light source, by a length of time equivalent to a period in which the first light source is OFF for transmission of the visible light signal. Specifically, in the transmitting method in this embodiment, the visible light signal is transmitted when an image is being displayed on the LED display. Accordingly, there are cases where in the period in which the LED is to be ON to represent a pixel value (specifically, a luminance value) indicated in the image signal, the LED is OFF for transmission of the visible light signal. In such a case, in the transmitting method in this embodiment, the first pixel switch is switched in such a way that the lighting period is increased by a length of time equivalent to a period in which the LED is OFF.

For example, when the image indicated in the image signal is displayed without the visible light signal being transmitted, the common switch is ON during one symbol period, and the pixel switch is ON only for the period depending on the average luminance, that is, the pixel value indicated in the image signal. When the average luminance is 75%, the common switch is ON in the first slot to the fourth slot of the symbol period. Furthermore, the pixel switch is ON in the first slot to the third slot of the symbol period. With this, the LED is ON in the first slot to the third slot during the symbol period, allowing the above-described pixel value to be represented. The LED is, however, OFF in the second slot in order to transmit the symbol "01." Thus, in the transmitting method in this embodiment, the pixel switch is switched in such a way that the lighting period of the LED is increased by a length of time equivalent to the length of the second slot in which the LED is OFF, that is, in such a way that the LED is ON in the fourth slot.

Furthermore, in the transmitting method in this embodiment, the pixel value of the pixel in the image is changed to increase the lighting period. For example, in the above-described case, the pixel value having the average luminance of 75% is changed to a pixel value having the average luminance of 100%. In the case where the average luminance is 100%, the LED attempts to be ON in the first slot to the fourth slot, but is OFF in the first slot for transmission of the symbol "01." Therefore, also when the visible light signal is transmitted, the LED can be ON with the original pixel value (the average luminance of 75%).

With this, the occurrence of breakup of the image due to transmission of the visible light signal can be reduced.

(Light Emission Control Shifted for each Pixel)

FIG. 174 is a diagram illustrating an example of a transmission signal in this embodiment.

When the transmitter in this embodiment transmits the same symbol (for example, "10") from a pixel A and a pixel around the pixel A (for example, a pixel B and a pixel C), the transmitter shifts the timing of light emission of these pixels as illustrated in FIG. 174. The transmitter, however, causes these pixels to emit light, without shifting the timing of the luminance rising edge of these pixels that is unique to the symbol. Note that the pixels A to C each correspond to a light source (specifically, an LED). When the symbol is "10," the timing of the luminance rising edge unique to the symbol is at the boundary between the third slot and the fourth slot. This timing is hereinafter referred to as a unique-to-symbol timing. The receiver identifies this unique-to-symbol timing and therefore can receive a symbol according to the timing.

As a result of the timing of light emission being shifted, a waveform indicating a pixel-to-pixel average luminance transition has a gradual rising or falling edge except the rising edge at the unique-to-symbol timing as illustrated in FIG. 174. In other words, the rising edge at the unique-to-symbol timing is steeper than rising edges at other timings. Therefore, the receiver gives priority to the steepest rising edge of a plurality of rising edges upon receiving a signal, and thus can identify an appropriate unique-to-symbol timing and consequently reduce the occurrence of reception errors.

Specifically, when the symbol "10" is transmitted from a predetermined pixel and the luminance of the predetermined pixel is a value intermediate between 25% and 75%, the transmitter increases or decreases an open interval of the pixel switch corresponding to the predetermined pixel. Furthermore, the transmitter adjusts, in an opposite way, an open interval of the pixel switch corresponding to the pixel around the predetermined pixel. Thus, errors can be reduced also by setting the open interval of each of the pixel switches in such a way that the luminance of the entirety including the predetermined pixel and the nearby pixel does not change. The open interval is an interval for which a pixel switch is ON.

Thus, the transmitting method in this embodiment further includes a second pixel switch control step. In this second pixel switch control step, a second pixel switch for turning ON a second light source included in the above-described light source group (the common line) and located around the first light source is turned ON, to cause the second light source to be ON only for a period in which the common switch is ON and the second pixel switch is ON, to transmit the visible light signal. The second light source is, for example, a light source located adjacent to the first light source.

In the first and second pixel switch control steps, when the first light source transmits a symbol included in the visible light signal and the second light source transmits a symbol included in the visible light signal simultaneously, and the symbol transmitted from the first light source and the symbol transmitted from the second light source are the same, among a plurality of timings at which the first pixel switch and the second pixel switch are turned ON and OFF for transmission of the symbol, a timing at which a luminance rising edge unique to the symbol is obtained is adjusted to be the same for the first pixel switch and for the second pixel switch, and a remaining timing is adjusted to be different between the first pixel switch and the second pixel switch, and the average luminance of the entirety of the first light source and the second light source in a period in which the symbol is transmitted is matched with predetermined luminance.

This allows the spatially averaged luminance to have a steep rising edge only at the timing at which the luminance rising edge unique to the symbol is obtained, as in the pixel-to-pixel average luminance transition illustrated in FIG. 174, with the result that the occurrence of reception errors can be reduced. Thus, the reception errors of the visible light signal at the receiver can be reduced.

When the symbol "10" is transmitted from a predetermined pixel and the luminance of the predetermined pixel is a value intermediate between 25% and 75%, the transmitter increases or decreases an open interval of the pixel switch corresponding to the predetermined pixel, in a first period. Furthermore, the transmitter adjusts, in an opposite way, an open interval of the pixel switch in a second period (for example, a frame) temporally before or after the first period. Thus, errors can be reduced also by setting the open interval of the pixel switch in such a way that temporal average luminance of the entirety of the predetermined pixel including the first period and the second period does not change.

In other words, in the above-described first pixel switch control step of the transmitting method in this embodiment, a symbol included in the visible light signal is transmitted in the first period, a symbol included in the visible light signal is transmitted in the second period subsequent to the first period, and the symbol transmitted in the first period and the symbol transmitted in the second are the same, for example. At this time, among a plurality of timings at which the first pixel switch is turned ON and OFF for transmission of the symbol, a timing at which a luminance rising edge unique to the symbol is obtained is adjusted to be the same in the first period and in the second period, and a remaining timing is adjusted to be different between the first period and the second period. The average luminance of the first light source in the entirety of the first period and the second period is matched with predetermined luminance. The first period and the second period may be a period for displaying a frame and a period for displaying the next frame, respectively. Furthermore, each of the first period and the second period may be a symbol period. Specifically, the first period and the second period may be a period for one symbol to be transmitted and a period for the next symbol to be transmitted, respectively.

This allows the temporally averaged luminance to have a steep rising edge only at the timing at which the luminance rising edge unique to the symbol is obtained, similarly to the pixel-to-pixel average luminance transition illustrated in FIG. 174, with the result that the occurrence of reception errors can be reduced. Thus, the reception errors of the visible light signal at the receiver can be reduced.

(Light Emission Control when Pixel Switch can be Driven at Double Speed)

FIG. 175 is a diagram illustrating an example of a transmission signal in this embodiment.

When the pixel switch can be turned ON and OFF in a cycle that is one half of the symbol period, that is, when the pixel switch can be driven at double speed, the light emission pattern may be the same as that in the V4PPM as illustrated in FIG. 175.

In other words, when the symbol period (a period in which a symbol is transmitted) is made up of four slots, the pixel switch control unit such as an LED driver circuit which controls the pixel switch is capable of controlling the pixel switch on a 2-slot basis. Specifically, the pixel switch control unit can keep the pixel switch ON for an arbitrary length of time in the 2-slot period from the beginning of the symbol period. Furthermore, the pixel switch control unit can keep the pixel switch ON for an arbitrary length of time in the 2-slot period from the beginning of the third slot in the symbol period.

Thus, in the transmitting method in this embodiment, the pixel value may be changed in a cycle that is one half of the above-described symbol period.

In this case, there is a risk that the level of precision of each switching of the pixel switch is lowered (the accuracy is reduced). Therefore, this is performed only when a transmission priority switch is ON so that a balance between the image quality and the quality of transmission can be set to the optimum.

(Blocks for Light Emission Control based on Pixel Value Adjustment)

FIG. 176 is a diagram illustrating an example of a transmitter in this embodiment.

FIG. 176 is a block diagram illustrating, in (a), a configuration of a device that only displays an image without transmitting the visible light signal, that is, a display device that displays an image on the above-described LED display. This display device includes, as illustrated in (a) of FIG. 176, an image and video input unit 1911, an Nx speed-up unit 1912, a common switch control unit 1913, and a pixel switch control unit 1914.

The image and video input unit 1911 outputs, to the Nx speed-up unit 1912, an image signal representing an image or video at a frame rate of 60 Hz, for example.

The Nx speed-up unit 1912 multiplies the frame rate of the image signal received from the image and video input unit 1911 by N (N>1), and outputs the resultant image signal. For example, the Nx speed-up unit 1912 multiplies the frame rate by 10 (N=10), that is, increases the frame rate to a frame rate of 600 Hz.

The common switch control unit 1913 switches the common switch based on images provided at the frame rate of 600 Hz. Likewise, the common switch control unit 1914 switches the pixel switch based on images provided at the frame rate of 600 Hz. Thus, as a result of the frame rate being increased by the Nx speed-up unit 1912, it is possible to prevent flicker which is caused by switching of a switch such as the common switch or the pixel switch. Furthermore, also when an image of the LED display is captured with the imaging device using a high-speed shutter, an image without defective pixels or flicker can be captured with the imaging device.

FIG. 176 is a block diagram illustrating, in (b), a configuration of a display device that not only displays an image but also transmits the above-described visible light signal, that is, the transmitter (the transmitting apparatus). This transmitter includes the image and video input unit 1911, the common switch control unit 1913, the pixel switch control unit 1914, a signal input unit 1915, and a pixel value adjustment unit 1916. The signal input unit 1915 outputs a visible light signal including a plurality of symbols to the pixel value adjustment unit 1916 at a symbol rate (a frequency) of 2400 symbols per second.

The pixel value adjustment unit 1916 copies the image received from the image and video input unit 1911, based on the symbol rate of the visible light signal, and adjusts the pixel value according to the above-described method. With this, the common switch control unit 1913 and the pixel switch control unit 1914 downstream to the pixel value adjustment unit 1916 can output the visible light signal without luminance of the image or video being changed.

For example, in the case of an example illustrated in FIG. 176, when the symbol rate of the visible light signal is 2400 symbols per second, the pixel value adjustment unit 1916 copies an image included in the image signal in such a way that the frame rate of the image signal is changed from 60 Hz to 4800 Hz. For example, assume that the value of a symbol included in the visible light signal is "00" and the pixel value (the luminance value) of a pixel included in the first image that has not been copied yet is 50%. In this case, the pixel value adjustment unit 1916 adjusts the pixel value in such a way that the first image that has been copied has a pixel value of 100% and the second image that has been copied has a pixel value of 50%. With this, as in the luminance change in the case of the symbol "00" illustrated in (c) of FIG. 175, AND-ing the common switch and the pixel switch results in luminance of 50%. Consequently, the visible light signal can be transmitted while the luminance remains equal to the luminance of the original image. Note that AND-ing the common switch and the pixel switch means that the light source (that is, the LED) corresponding to the common switch and the pixel switch is ON only for the period in which the common switch is ON and the pixel switch is ON.

Furthermore, in the transmitting method in this embodiment, the process of displaying an image and the process of transmitting a visible light signal do not need to be performed at the same time, that is, these processes may be performed in separate periods, i.e., a signal transmission period and an image display period.

Specifically, in the above-described first pixel switch control step in this embodiment, the first pixel switch is ON for the signal transmission period in which the common switch is switched according to the luminance change pattern. Moreover, the transmitting method in this embodiment may further include an image display step of displaying a pixel in an image to be displayed, by (i) keeping the common switch ON for an image display period different from the signal transmission period and (ii) turning ON the first pixel switch in the image display period according to the image, to cause the first light source to be ON only for a period in which the common switch is ON and the first pixel switch is ON.

With this, the process of displaying an image and the process of transmitting a visible light signal are performed in mutually different periods, and thus it is possible to easily display the image and transmit the visible light signal.

(Timing of Changing Power Supply)

Although a signal OFF interval is included in the case where the power line is changed, the power line is changed according to the transmission period of 4PPM symbols because no light emission in the last part of the 4PPM does not affect signal reception, and thus it is possible to change the power line without affecting the quality of signal reception.

Furthermore, it is possible to change the power line without affecting the quality of signal reception, by changing the power line in an LO period in the 4PPM as well. In this case, it is also possible to maintain the maximum luminance at a high level when the signal is transmitted.

(Timing of Drive Operation)

In this embodiment, the LED display may be driven at the timings illustrated in FIG. 177 to FIG. 179.

FIG. 177 to FIG. 179 are timing charts of when an LED display is driven by a light ID modulated signal according to the present disclosure.

For example, as illustrated in FIG. 178, since the LED cannot be turned ON with the luminance indicated in the image signal when the common switch (COM1) is OFF for transmission of the visible light signal (light ID) (time period t1), the LED is turned ON after the time period t1. With this, the image indicated by the image signal can be properly displayed without breakup while the visible light signal is properly transmitted.

(Summary)

FIG. 180A is a flowchart illustrating a transmission method according to an aspect of the present disclosure.

The transmitting method according to an aspect of the present disclosure is a transmitting method of transmitting a visible light signal by way of luminance change, and includes Step SC11 to Step SC13.

In Step SC11, a luminance change pattern is determined by modulating the visible light signal as in the above-described embodiments.

In Step SC12, a common switch for turning ON, in common, a plurality of light sources which are included in a light source group of a display and are each used for representing a pixel in an image is switched according to the luminance change pattern.

In Step S13, a first pixel switch (that is, the pixel switch) for turning ON a first light source among the plurality of light sources included in the light source group is turned ON, to cause the first light source to be ON only for a period in which the common switch is ON and the first pixel switch is ON, to transmit the visible light signal.

FIG. 180B is a block diagram illustrating a functional configuration of a transmitting apparatus according to an aspect of the present disclosure.

A transmitting apparatus C10 according to an aspect of the present disclosure is a transmitting apparatus (or a transmitter) that transmits a visible light signal by way of luminance change, and includes a determination unit C11, a common switch control unit C12, and a pixel switch control unit C13. The determination unit C11 determines a luminance change pattern by modulating the visible light signal as in the above-described embodiments. Note that this determination unit C11 is included in the signal input unit 1915 illustrated in FIG. 176, for example.

The common switch control unit C12 switches the common switch according to the luminance change pattern. This common switch is a switch for turning ON, in common, a plurality of light sources which are included in a light source group of a display and are each used for representing a pixel in an image.

The pixel switch control unit C13 turns ON a pixel switch which is for turning ON a light source to be controlled among the plurality of light sources included in the light source group, to cause the light source to be ON only for a period in which the common switch is ON and the pixel switch is ON, to transmit the visible light signal. Note that the light source to be controlled is the above-described first light source.

With this, a visible light signal can be properly transmitted from a display including a plurality of LEDs and the like as the light sources. Therefore, this enables communication between various devices including devices other than lightings. Furthermore, when the display is a display for displaying images under control of the common switch and the pixel switch, the visible light signal can be transmitted using the common switch and the pixel switch. Therefore, it is possible to easily transmit the visible light signal without a significant change in the structure for displaying images on the display (that is, the display device).

(Frame Configuration in Single Frame Transmission)

FIG. 181 is a diagram illustrating an example of a transmission signal in this embodiment.

A transmission frame includes, as illustrated in (a) of FIG. 181, a preamble (PRE), an ID length (IDLEN), an ID type (IDTYPE), content (ID/DATA), and a check code (CRC). A number of bits of each region is an example.

When a preamble such as that illustrated in (b) of FIG. 181 is used, the receiver can find a signal boundary by distinguishing the preamble from other part coded using the 4PPM, I-4PPM, or V4PPM.

It is possible to transmit variable-length content by selecting a length of the ID/DATA in the IDLEN as illustrated in (c) of FIG. 181.

The CRC is a check code for correcting or detecting an error in other parts than the PRE. The CRC length varies according to the length of a part to be checked so that the check ability can be kept at a certain level or higher. Furthermore, the use of a different check code depending on the length of a part to be checked allows an improvement in the check ability per CRC length.

(Frame Configuration in Multiple Frame Transmission)

FIG. 182 and FIG. 183 are diagrams each illustrating an example of a transmission signal in this embodiment.

A partition type (PTYPE) and a check code (CRC) are added to transmission data (BODY), resulting in Joined data. The Joined data is divided into a certain number of DATAPARTs to each of which a preamble (PRE) and an address (ADDR) are added before transmission.

PTYPE (or partition mode (PMODE)) indicates a BODY dividing method or a BODY meaning. As illustrated in (a) of FIG. 182, PTYPE is set to 2 bits, which allows the coding to be optimally performed by 4PPM. As illustrated in (b) of FIG. 182, a transmission time can be shortened by setting PTYPE to 1 bit.

The CRC is a check code for checking the PTYPE and the BODY. The code length of the CRC varies according to the length of a part to be checked as provided in FIG. 161 so that the check ability can be kept at a certain level or higher.

The preamble is determined as in FIG. 162 so that the length of time for transmission can be reduced while a variety of dividing patterns is provided.

The address is determined as in FIG. 163 so that the receiver can reconstruct data regardless of the order of reception of the frame.

FIG. 183 illustrates combinations of available Joined data length and the number of frames. The underlined combinations are used in the later-described case where the PTYPE indicates a single frame compatible mode.

(Configuration of BODY Field)

FIG. 184 is a diagram illustrating an example of a transmission signal in this embodiment.

When the BODY has a field configuration such as that in the illustration, it is possible to transmit an ID that is the same as or similar to that in the single frame transmission.

It is assumed that the same ID with the same IDTYPE represents the same meaning regardless of whether the transmission scheme is the single frame transmission or the multiple frame transmission and regardless of the combination of packets which are transmitted. This enables flexible signal transmission, for example, when data is continuously transmitted or when the length of time for reception is short.

The IDLEN indicates a length of the ID, and the remaining part is used to transmit PADDING. This part may be all 0 or 1, or may be used to transmit data that extends the ID, or may be a check code. The PADDING may be left-aligned.

With those in (b), (c), and (d) of FIG. 184, the length of time for transmission is shorter than that in (a) of FIG. 184. It is assumed that the length of the ID in this case is the maximum length that the ID can have.

In the case of (b) or (c) of FIG. 184, the bit number of the IDTYPE is an odd number which, however, can be an even number when the data is combined with the 1-bit PTYPE illustrated in (b) of FIG. 182, and thus the data can be efficiently encoded using the 4PPM.

In the case of (c) of FIG. 184, a longer ID can be transmitted.

In the case of (d) of FIG. 184, the variety of representable IDTYPEs is greater.

(PTYPE)

FIG. 185 is a diagram illustrating an example of a transmission signal in this embodiment.

When the PTYPE has a predetermined number of bits, the PTYPE indicates that the BODY is in the single frame compatible mode. With this, it is possible to transmit the same ID as that in the case of the single frame transmission.

For example, when PTYPE=00, the ID or IDTYPE corresponding to the PTYPE can be treated in the same or similar way as the ID or IDTYPE transmitted in the case of the single frame transmission. Thus, the management of the ID or IDTYPE can be facilitated.

When the PTYPE has a predetermined number of bits, the PTYPE indicates that the BODY is in a data stream mode. At this time, all the combinations of the number of transmission frames and the DATAPART length can be used, and it can be assumed that data having a different combination has a different meaning. The bit of the PTYPE may indicate whether the different combination has the same meaning or a different meaning. This enables flexible selection of a transmitting method.

For example, ID having a size that is not defined in the single frame transmission can be transmitted for PTYPE=01. Even if ID corresponding to PTYPE=01 is identical to ID of the single frame transmission, ID corresponding to PTYPE=01 can be dealt with as ID different from ID of the single frame transmission. Resultantly, the number of expressible IDs can be increased.

(Field Configuration in Single Frame Compatible Mode)

FIG. 186 is a diagram illustrating an example of a transmission signal of this embodiment.

For the use of the transmission signal in (a) of FIG. 184, in the single frame compatible mode, the transmission is performed most efficiently with a combination of a table in FIG. 186.

For the use of the transmission signal in (b), (c), or (d) of FIG. 184, a combination of the number of frames of 13 and the DATAPART length of 4 bits has good efficiency for the 32 bit ID, and a combination of the number of frames of 11 and the DATAPART length of 8 bits has good efficiency for the 64-bit ID.

When the transmission is performed only with the combination of the table, a combination different from the combination of the table is determined to be the reception error, so that the reception error rate can be lowered.

Summary of Embodiment 19

The transmitting method according to an aspect of the present disclosure is a transmitting method for transmitting a visible light signal by way of luminance change, and includes: a determining step of determining a luminance change pattern by modulating the visible light signal; a common switch control step of switching a common switch for turning ON, in common, a plurality of light sources which are included in a light source group of a display and are each used for representing a pixel in an image according to the luminance change pattern; and a first pixel switch control step of turning ON a first pixel switch for turning ON a first light source among the plurality of light sources included in the light source group, to cause the first light source to be ON only for a period in which the common switch is ON and the first pixel switch is ON, to transmit the visible light signal.

With this configuration, for example, as illustrated in FIG. 173 to FIG. 180B, a visible light signal can be properly transmitted from a display including a plurality of LEDs or the like as the light sources. Therefore, this enables communication between various devices including devices other than lightings. Furthermore, when the display is a display for displaying images under control of the common switch and the first pixel switch, the visible light signal can be transmitted using that common switch and that first pixel switch. Therefore, it is possible to easily transmit the visible light signal without a significant change in the structure for displaying images on the display.

Furthermore, in the above determining step, the luminance change pattern may be determined for each symbol period, and in the above first pixel switch control step, the first pixel switch may be switched in synchronization with the symbol period.

With this configuration, for example, as illustrated in FIG. 173, even when the symbol period is, for example, 1/2400 seconds, the visible light signal can be properly transmitted according to the symbol period.

Furthermore, in the above first pixel switch control step, when the image is displayed on the display, the first pixel switch may be switched to increase a lighting period, which is for representing a pixel value of a pixel in the image and corresponds to the first light source, by a length of time equivalent to a period in which the first light source is OFF for transmission of the visible light signal. For example, the above-described lighting period may be increased by changing the pixel value of the pixel in the image.

With this configuration, for example, as illustrated in FIG. 173 and FIG. 175, even in the case where the first light source is OFF for transmission of the visible light signal, the lighting period is increased, and thus it is possible to display the original image appropriately without breakup.

In addition, the pixel value may be changed in a cycle that is one half of the above-described symbol period.

With this configuration, for example, as illustrated in FIG. 175, displaying an image and transmitting a visible light signal can be performed appropriately.

The above-described transmitting method may further include the second pixel switch control step of turning ON the second pixel switch for turning ON the second light source located around the first light source included in the light source group to cause the second light source to be ON only for a period in which the common switch is ON and the second pixel switch is ON to transmit the visible light signal. In the first and second pixel switch control steps, when the first light source transmits a symbol included in the visible light signal and the second light source transmits a symbol included in the visible light signal simultaneously, and the symbol transmitted from the first light source and the symbol transmitted from the second light source are the same, among a plurality of timings at which the first pixel switch and the second pixel switch are turned ON and OFF for transmission of the symbol, a timing at which a luminance rising edge unique to the symbol is obtained may be adjusted to be the same for the first pixel switch and for the second pixel switch, and a remaining timing may be adjusted to be different between the first pixel switch and the second pixel switch, and the average luminance of the entirety of the first light source and the second light source in a period in which the symbol is transmitted may be matched with predetermined luminance.

This allows the spatially averaged luminance to have a steep rising edge only at the timing at which the luminance rising edge unique to the symbol is obtained, for example, as illustrated in FIG. 174, with the result that the occurrence of reception errors can be reduced.

In the above-described first pixel switch control step, when a symbol included in the visible light signal is transmitted in the first period and a symbol included in the visible light signal is transmitted in the second period subsequent to the first period, and the symbol transmitted in the first period and the symbol transmitted in the second are the same, among a plurality of timings at which the first pixel switch is turned ON and OFF for transmission of the symbol, a timing at which a luminance rising edge unique to the symbol is obtained may be adjusted to be the same in the first period and in the second period, and a remaining timing may be adjusted to be different between the first period and the second period. The average luminance of the first light source in the entirety of the first period and the second period may be matched with predetermined luminance.

This allows the temporally averaged luminance to have a steep rising edge only at the timing at which the luminance rising edge unique to the symbol is obtained, for example, as illustrated in FIG. 174, with the result that the occurrence of reception errors can be reduced.

In the above-described first pixel switch control step, the first pixel switch is ON for the signal transmission period in which the common switch is switched according to the luminance change pattern. The transmitting method may further include an image display step of displaying a pixel in an image to be displayed, by (i) keeping the common switch ON for an image display period different from the signal transmission period and (ii) turning ON the first pixel switch in the image display period according to the image, to cause the first light source to be ON only for a period in which the common switch is ON and the first pixel switch is ON.

With this configuration, the process of displaying an image and the process of transmitting a visible light signal are performed in mutually different periods, and thus it is possible to easily display the image and transmit the visible light signal.

Embodiment 20

In this embodiment, details or variations of a visible light signal in each of the above-described embodiments will be specifically described. Note that trends in camera are high resolution (4 K) and high frame rate (60 fps). The high frame rate leads to decrease in a frame scanning time. As a result, a reception distance decreases and a reception time increases. For that reason, it is necessary for a transmitter that transmits a visible light signal to decrease a packet transmission time. Decrease in a line scanning time leads to higher temporal resolution of reception. An exposure time is 1/8000 seconds. Since signal representation and light adjustment are simultaneously performed in 4PPM, a signal density is low and efficiency is low. Therefore, in the visible light signal in this embodiment, a signal part and a light adjustment part are separated, and a part necessary for reception is shortened.

FIG. 187 is a diagram illustrating an example of a structure of a visible light signal in this embodiment.

The visible light signal includes a plurality of combinations of signal parts and light adjustment parts, as illustrated in FIG. 187. A time length of each combination is, for example, 2 ms or less (frequency is 500 Hz or more).

FIG. 188 is a diagram illustrating an example of a detailed structure of a visible light signal in this embodiment.

The visible light signal includes data L (Data L), preamble (Preamble), data R (Data R) and a light adjustment part (Dimming). The signal part includes the data L, the preamble, and the data R.

The preamble indicates luminance values of High and Low alternately along a time axis. That is, the preamble indicates the luminance value of High for a time length $P_1$, indicates the luminance value of Low for a next time length $P_2$, indicates the luminance value of High for a next time length $P_3$, and indicates the luminance value of Low for a next time length $P_4$. Note that the time lengths $P_1$ to $P_4$ are, for example, 100 μs.

The data R indicates the luminance values of High and Low alternately along the time axis, and is placed immediately after the preamble. That is, the data R indicates the luminance value of High for a time length $D_{R1}$, indicates the luminance value of Low for a next time length $D_{R2}$, indicates the luminance value of High for a next time length $D_{R3}$, and indicates the luminance value of Low for a next time length $D_{R4}$. Note that the time lengths $D_{R1}$ to $D_{R4}$ are determined according to a mathematical expression corresponding to a signal to be transmitted. This mathematical expression is $D_{Ri}=120+20x_i$ ($i\in 1$ to 4, $x_i \in 0$ to 15). Note that numeral values such as 120 and 20 indicate time (μs). Here, these numerical values are an example.

The data L indicates the luminance values of High and Low alternately along the time axis, and is placed immediately before the preamble. That is, the data L indicates the luminance value of High for a time length $D_{L1}$, indicates the luminance value of Low for a next time length $D_{L2}$, indicates the luminance value of High for a next time length $D_{L3}$, and indicates the luminance value of Low for a next time length $D_{L4}$. Note that the time lengths $D_{L1}$ to $D_{L4}$ are determined according to a mathematical expression corresponding to a signal to be transmitted. This mathematical expression is $D_{Li}=120+20\times(15-x_i)$. Note that numerical values such as 120 and 20 indicate time (μs) as in the above-mentioned case. Here, these numerical values are an example.

Note that the signal to be transmitted includes 4×4=16 bits, and $x_i$ is a 4-bit signal of the signal to be transmitted. In a visible light signal, the numerical value of the $x_i$ (4-bit signal) is indicated by each of the time lengths $D_{R1}$ to $D_{R4}$ in the data R or the time lengths $D_{L1}$ to $D_{L4}$ in the data L. Out of 16 bits of the signal to be transmitted, 4 bits indicate an address, 8 bits indicate data, and 4 bits are used for error detection.

Here, the data R and the data L have a complementary relationship with respect to brightness. That is, when brightness of the data R is bright, brightness of the data L is dark, and conversely, when brightness of the data R is dark, brightness of the data L is bright. That is, the sum of the entire time length of the data R and the time length of the data L is constant regardless of the signal to be transmitted.

The light adjustment part is a signal for adjusting brightness (luminance) of the visible light signal, indicates the luminance value of High for a time length $C_1$, and indicates a signal of Low for a next time length $C_2$. The time lengths $C_1$ and $C_2$ are adjusted arbitrarily. Note that the light adjustment part may be included or may not be included in the visible light signal.

Also, in the example illustrated in FIG. 188, although the data R and the data L are included in the visible light signal, only either one of the data R and the data L may be included. When it is desired to make the visible light signal brighter, only brighter data of the data R and the data L may be transmitted. Also, the placement of the data R and the data L may be reversed. Also, when the data R is included, the time length $C_1$ of the light adjustment part is longer than, for example, 100 μs. When the data L is included, the time length $C_2$ of the light adjustment part is longer than, for example, 100 μs.

FIG. 189A is a diagram illustrating another example of a visible light signal in this embodiment.

In the visible light signal illustrated in FIG. 188, the signal to be transmitted is represented by each of the time length indicating the luminance value of High and the time length indicating the luminance value of Low. However, as illustrated in (a) of FIG. 189A, the signal to be transmitted may be represented only by the time length indicating the luminance value of Low. Note that (b) of FIG. 189A indicates the visible light signal of FIG. 188.

For example, as illustrated in (a) of FIG. 189A, in the preamble, all the time lengths indicating the luminance value of High are identical and relatively short, whereas the time lengths $P_1$ to $P_4$ indicating the luminance value of Low are each 100 μs, for example. In the data R, all the time lengths indicating the luminance value of High are identical and relatively short, whereas the time lengths $D_{R1}$ to $D_{R4}$ indicating the luminance value of Low are each adjusted according to the signal $x_i$. Note that in the preamble and the data R, the time length indicating the luminance value of High is, for example, 10 μs or less.

FIG. 189B is a diagram illustrating another example of a visible light signal in this embodiment.

For example, as illustrated in FIG. 189B, in the preamble, all time lengths indicating the luminance value of High are identical and relatively short, whereas the time lengths $P_1$ to $P_3$ indicating the luminance value of Low are, for example, 160 μs, 180 μs, and 160 μs, respectively. In the data R, all the time lengths indicating the luminance value of High are identical and relatively short, whereas the time lengths $D_{R1}$ to $D_{R4}$ indicating the luminance value of Low are each adjusted according to the signal $x_i$. Note that in the preamble and the data R, the time length indicating the luminance value of High is, for example, 10 μs or less.

FIG. 189C is a diagram illustrating a signal length of a visible light signal in this embodiment.

FIG. 190 is a diagram illustrating a comparison result of a luminance value between a visible light signal in this embodiment and a visible light signal of the standard IEC (International Electrotechnical Commission). Note that the standard IEC is specifically "VISIBLE LIGHT BEACON SYSTEM FOR MULTIMEDIA APPLICATIONS."

In the visible light signal in this embodiment (method of embodiment (one side of Data)), the maximum luminance of 82%, which is higher than the maximum luminance of the visible light signal of the standard IEC, can be obtained, and the minimum luminance of 18%, which is lower than the minimum luminance of the visible light signal of the standard IEC, can be obtained. Note that the maximum luminance of 82% and the minimum luminance of 18% are numerical values obtained from the visible light signal including only one of the data R and the data L in this embodiment.

FIG. 191 is a diagram illustrating a comparison result of a number of reception packets and reliability with respect to an angle of view between a visible light signal in this embodiment and a visible light signal of the standard IEC.

In the visible light signal in this embodiment (method of embodiment (both)), even when the angle of view becomes small, that is, even when a distance from a transmitter that transmits the visible light signal to a receiver becomes long, the number of reception packets is larger than in the visible light signal of the standard IEC, and high reliability can be obtained. Note that numerical values in the method of the embodiment (both) illustrated in FIG. 191 are numerical values obtained from a visible light signal including both data R and data L.

FIG. 192 is a diagram illustrating a comparison result of a number of reception packets and reliability with respect to noise between a visible light signal in this embodiment and a visible light signal of the standard IEC.

In the visible light signal in this embodiment (IEEE), regardless of noise (dispersion value of noise), the number of reception packets is larger than in the visible light signal of the standard IEC, and high reliability can be obtained.

FIG. 193 is a diagram illustrating a comparison result of a number of reception packets and reliability with respect to a reception side clock error between a visible light signal in this embodiment and a visible light signal of the standard IEC.

In the visible light signal in this embodiment (IEEE), in a wide range of the reception side clock error, the number of reception packets is larger than in the visible light signal of the standard IEC, and high reliability can be obtained. Note that the reception side clock error is a timing error at which an exposure line in an image sensor of a receiver starts exposure.

FIG. 194 is a diagram illustrating a structure of a signal to be transmitted in this embodiment.

The signal to be transmitted includes four 4-bit signals ($x_i$) (4×4=16 bits) as described above. For example, the signal to be transmitted includes signals $x_1$ to $x_4$. The signal $x_1$ includes bits $x_{11}$ to $x_{14}$, and the signal $x_2$ includes bits $x_{21}$ to $x_{24}$. The signal $x_3$ includes bits $x_{31}$ to $x_{34}$, and the signal $x_4$ includes bits $x_{41}$ to $x_{44}$. Here, the bit $x_{11}$, the bit $x_{21}$, the bit $x_{31}$, and the bit $x_{41}$ are likely to cause errors, whereas other bits are unlikely to cause errors. Therefore, the bit $x_{42}$ to the bit $x_{44}$ included in the signal $x_4$ are used for parity of the bit $x_{11}$ of the signal $x_1$, the bit $x_{21}$ of the signal $x_2$, and the bit $x_{31}$ of the signal $x_3$, respectively. The bit $x_{41}$ included in the signal $x_4$ is not used and always indicates 0. A mathematical expression illustrated in FIG. 194 is used for calculation of the bits $x_{42}$, $x_{43}$, and $x_{44}$. The bits $x_{42}$, $x_{43}$, and $x_{44}$ are respectively calculated by this mathematical expression, such as bit $x_{42}$=bit $x_{11}$, bit $x_{43}$=bit $x_{21}$, and bit $x_{44}$=bit $x_{31}$.

FIG. 195A is a diagram illustrating a method for receiving a visible light signal in this embodiment.

A receiver sequentially obtains the above-described signal part of the visible light signal. The signal part includes a 4-bit address (Addr) and an 8-bit data (Data). The receiver combines data of these signal parts to generate an ID including a plurality of pieces of data, and parity including one or more pieces of data (Parity).

FIG. 195B is a diagram illustrating rearrangement of a visible light signal in this embodiment.

FIG. 196 is a diagram illustrating another example of a visible light signal in this embodiment.

The visible light signal illustrated in FIG. 196 is configured by superimposing a high-frequency signal on the visible light signal illustrated in FIG. 188. A frequency of the high-frequency signal is, for example, 1 to several Gbps. This enables data transmission at a higher speed than the visible light signal illustrated in FIG. 188.

FIG. 197 is a diagram illustrating another example of a detailed structure of a visible light signal in this embodiment. Note that although the structure of the visible light signal illustrated in FIG. 197 is similar to the structure illustrated in FIG. 188, time lengths C1 and C2 of a light adjustment part in the visible light signal illustrated in FIG. 197 differ from time lengths C1 and C2 illustrated in FIG. 188.

FIG. 198 is a diagram illustrating another example of a detailed structure of a visible light signal in this embodiment. In this visible light signal illustrated in FIG. 198, data R and data L each include eight V4PPM symbols. A position at which a symbol Du rises or falls included in the data L is identical to a position at which a symbol $D_{Ri}$ rises or falls included in the data R. However, average luminance of the symbol $D_{Li}$ and average luminance of the symbol $D_{Ri}$ may be identical to or different from each other.

FIG. 199 is a diagram illustrating another example of a detailed structure of a visible light signal in this embodiment. This visible light signal illustrated in FIG. 199 is a signal for ID communication or low average luminance applications, and is identical to the visible light signal illustrated in FIG. 189B.

FIG. 200 is a diagram illustrating another example of a detailed structure of a visible light signal in this embodiment. In this visible light signal illustrated in FIG. 200, an even-numbered time length $D_{2i}$ and an odd-numbered time length $D_{2i+1}$ in data (Data) are identical to each other.

FIG. 201 is a diagram illustrating another example of a detailed structure of a visible light signal in this embodiment. Data in this visible light signal illustrated in FIG. 201 (Data) includes a plurality of symbols which are signals of pulse position modulation.

FIG. 202 is a diagram illustrating another example of a detailed structure of a visible light signal in this embodiment. This visible light signal illustrated in FIG. 202 is a signal for continuous communication, and is identical to the visible light signal illustrated in FIG. 198.

FIG. 203 to FIG. 211 are diagrams for describing a method for determining values of x1 to x4 of FIG. 197. Note that x1 to x4 illustrated in FIG. 203 to FIG. 211 are determined by a method similar to the method for determining values of symbols w1 to w4 (W1 to W4) illustrated in the following variations. However, each of x1 to x4 is a symbol including 4 bits, and differs from symbols w1 to w4 illustrated in the following variations in that parity is included in a first bit.

Variation 1

FIG. 212 is a diagram illustrating an example of a detailed structure of a visible light signal according to Variation 1 of this embodiment. This visible light signal according to Variation 1 is similar to the visible light signal of the above-described embodiment illustrated in FIG. 188, but is different from the visible light signal illustrated in FIG. 188 in a time length indicating a luminance value of High or Low. For example, in the visible light signal according to this variation, time lengths $P_2$ and $P_3$ of a preamble are 90 μs. In the visible light signal according to this variation, as in the above-described embodiment, time lengths $D_{R1}$ to $D_{R4}$ in data R are determined by a mathematical expression corresponding to a signal to be transmitted. However, the mathematical expression in this variation is $D_{Ri}$=120+30×wi (i∈1 to 4, wi∈0 to 7). Note that wi is a symbol including 3 bits, and is a signal to be transmitted indicating a value of some integer between 0 and 7. In the visible light signal according to this variation, as in the above embodiment, time lengths $D_{L1}$ to $D_{L4}$ in the data L are determined by a mathematical expression corresponding to the signal to be transmitted. However, the mathematical expression in this variation is $D_{Li}$=120+30×(7−wi).

In addition, the data R and the data L are included in the visible light signal in the example illustrated in FIG. 212, but only one of the data R and the data L may be included in the visible light signal. When it is desired to make the visible light signal brighter, only brighter data of the data R and the data L may be transmitted. The placement of the data R and the data L may be reversed.

FIG. 213 is a diagram illustrating another example of a visible light signal according to this variation.

As in the examples illustrated in (a) of FIG. 189A and FIG. 189B, the visible light signal according to Variation 1 may represent a signal to be transmitted only by a time length indicating a luminance value of Low.

For example, as illustrated in FIG. 213, in a preamble, a time length indicating a luminance value of High is, for example, less than 10 and time lengths $P_1$ to $P_3$ indicating the luminance value of Low are, for example, 160 μs, 180 μs, and 160 μs, respectively. In data (Data), the time length indicating the luminance value of High is less than 10 μs, and time length $D_1$ to $D_3$ indicating the luminance value of Low are each adjusted according to a signal wi. Specifically, a time length $D_i$ indicating the luminance value of Low is $D_i$=180+30×wi (i∈1 to 4, wi∈0 to 7).

FIG. 214 is a diagram illustrating still another example of a visible light signal according to this variation.

The visible light signal according to this variation may include a preamble and data as illustrated in FIG. 214. As in the preamble illustrated in FIG. 212, the preamble indicates luminance values of High and Low alternately along a time axis. Time lengths $P_1$ to $P_4$ in the preamble are 50 μs, 40 μs, 40 μs, and 50 μs, respectively. The data (Data) indicates the luminance values of High and Low alternately along the time axis. For example, data L indicates the luminance value of High for a time length $D_1$, indicates the luminance value of Low for a next time length $D_2$, indicates the luminance value of High for a next time length $D_3$, and indicates the luminance value of Low for a next time length $D_4$.

Here, a time length $D_{2i-1}+D_{21}$ is determined by a mathematical expression according to a signal to be transmitted. That is, the sum of the time length indicating the luminance value of High and the time length indicating the luminance value of Low following the luminance value of High is determined by the mathematical expression. This mathematical expression is, for example, $D_{2i-1}+D_{2i}=100+20\times x_i$ (i∈1 to N, $x_i$∈0 to 7, $D_{2i}$>50 μs, $D_{2i+1}$>50 μs).

FIG. 215 is a diagram illustrating an example of packet modulation.

A signal generating unit generates a visible light signal by a method for generating a visible light signal according to this variation. In the method for generating a visible light signal according to this variation, a packet is modulated (that is, converted) into the above-described signal to be transmitted wi. Note that the above-described signal generating unit may be included in a transmitter in each of the embodiments, and may not be included in the transmitter.

For example, as illustrated in FIG. 215, the signal generating unit converts a packet into a signal to be transmitted including numerical values indicated by symbols w1, w2, w3, and w4. These symbols w1, w2, w3, and w4 are symbols each including 3 bits from a first bit to a third bit, and indicates integers of 0 to 7 as illustrated in FIG. 212.

Here, in each of the symbols w1 to w4, a value of the first bit is b1, a value of the second bit is b2, and a value of the third bit is b3. Here, b1, b2, and b3 are 0 or 1. In this case, each of the numerical values W1 to W4 indicated by the symbols w1 to w4 is, for example, $b1\times2^0+b2\times2^1+b3\times2^2$.

The packet includes, as data, address data including bit 0 to 4 (A1 to A4), main data Da including bit 4 to 7 (Da1 to Da7), sub data Db including bit 3 to 4 (Db1 to Db4), and a value of a stop bit (S). Note that each of Da1 to Da7, A1 to A4, Db1 to Db4, and S indicates a bit value, that is, 0 or 1.

In other words, when modulating a packet into a signal to be transmitted, the signal generating unit assigns data included in the packet to either bit of the symbols w1, w2, w3, and w4. With this configuration, the packet is converted into a signal to be transmitted including numerical values indicated by the symbols w1, w2, w3, and w4.

When assigning the data included in the packet, specifically, the signal generating unit assigns at least part of the main data Da included in the packet (Da1 to Da4) to a first bit string including a first bit (bit 1) of each of the symbols w1 to w4. Furthermore, the signal generating unit assigns the value of the stop bit (S) included in the packet to the second bit (bit 2) of the symbol w1. Furthermore, the signal generating unit assigns part of the main data Da included in the packet (Da5 to Da7), or at least part of the address data included in the packet (A1 to A3) to a second bit string including a second bit (bit 3) of each of the symbols w2 to w4. Furthermore, the signal generating unit assigns at least part of the sub data Db included in packet (Db1 to Db3) and part of the sub data Db (Db4) or part of the address data (A4) to a third bit string including a third bit (bit 3) of each of the symbols w1 to w4.

Note that when all of third bits (bit 3) of the symbols w1 to w4 are 0, numerical values indicated by these symbols are kept 3 or less by the above-mentioned "$b1\times2^0+b2\times2^1+b3\times2^2$." Therefore, the time length $D_{Ri}$ can be decreased by the mathematical expression $D_{Ri}=120+30\times w_i$ (i∈1 to 4, $w_i$∈0 to 7) illustrated in FIG. 212. As a result, a time to transmit one packet can be decreased and the packet can be received even from more distant places.

FIG. 216 to FIG. 226 are diagrams each illustrating processing for generating a packet from source data.

The signal generating unit according to this variation determines whether to divide source data according to a bit length of the source data. The signal generating unit then performs processing based on a result of the determination to generate at least one packet from the source data. That is, the signal generating unit divides the source data into more packets as a bit length of the source data increases. Conversely, when the bit length of the source data is shorter than a predetermined bit length, the signal generating unit generates a packet without dividing the source data.

Thus, when the signal generating unit generates at least one packet from the source data, the signal generating unit converts each of the at least one packet into the above-described signal to be transmitted, that is, the symbols w1 to w4.

Note that in FIG. 216 to FIG. 226, Data indicates the source data, Dataa indicates main source data included in the source data, and Datab indicates sub source data included in the source data. Da (k) indicates the main source data itself, or a k-th part of a plurality of parts that constitute data including the main source data and parity. Similarly, Db (k) indicates the sub source data itself, or a k-th part of a plurality of parts that constitute data including the sub source data and parity. For example, Da (2) indicates a second part of the plurality of parts that constitute data including the main source data and parity. S indicates a start bit, and A indicates address data.

Uppermost notation illustrated within each block is a label for identifying data such as the source data, the main source data, the sub source data, the start bit, and the address data. A central numerical value illustrated within each block is a bit size (number of bits), and a lowermost numerical value is a value of each bit.

FIG. 216 is a diagram illustrating processing for dividing source data into one packet.

For example, when a bit length of the source data (Data) is 7 bits, the signal generating unit generates one packet without dividing the source data. Specifically, the source data includes 4-bit main source data Dataa (Da1 to Da4) and 3-bit sub source data Datab (Db1 to Db3) as main data Da (1) and sub data Db (1), respectively. In this case, the signal generating unit generates a packet by adding, to the source data, a start bit S (S=1) and 4-bit address data (A1 to A4) indicating "0000." Note that the start bit S=1 indicates that the packet including the start bit is an end packet.

The signal generating unit converts this packet to generate a symbol w1=(Da1, S=1, Db1), a symbol w2=(Da2, A1=0, Db2), a symbol w3=(Da3, A2=0, Db3), and a symbol w4=(Da4, A3=0, A4=0). Furthermore, the signal generating unit generates a signal to be transmitted including numerical values W1, W2, W3, and W4 indicated by the symbols w1, w2, w3, and w4, respectively.

Note that in this variation, wi is represented as a 3-bit symbol and as a decimal numerical value. Therefore, in this variation, for clear description, wi (w1 to w4) used as a decimal numerical value is notated as a numerical value Wi (W1 to W4).

FIG. 217 is a diagram illustrating processing for dividing source data into two packets.

For example, when a bit length of source data (Data) is 16 bits, the signal generating unit divides the source data to generate two pieces of intermediate data. Specifically, the source data includes 10-bit main source data Dataa and 6-bit sub source data Datab. In this case, the signal generating unit generates first intermediate data including the main source data Dataa and 1-bit parity corresponding to the main source data Dataa. The signal generating unit also generates second intermediate data including the sub source data Datab and 1-bit parity corresponding to the sub source data Datab.

Next, the signal generating unit divides the first intermediate data into 7-bit main data Da (1) and 4-bit main data Da (2). Furthermore, the signal generating unit divides the second intermediate data into 4-bit sub data Db (1) and 3-bit sub data Db (2). Note that the main data is one part of a plurality of parts that constitute data including the main source data and parity. Similarly, the sub data is one part of a plurality of parts that constitute data including the sub source data and parity.

Next, the signal generating unit generates a 12-bit first packet including a start bit S (S=0), the main data Da (1), and the sub data Db (1). With this configuration, the first packet that does not include address data is generated.

Furthermore, the signal generating unit generates a 12-bit second packet including a start bit S (S=1), 4-bit address data indicating "1000", the main data Da (2), and the sub data Db (2). Note that the start bit S=0 indicates that, out of a plurality of packets generated, a packet including the start bit is a packet which is not at an end. The start bit S=1 indicates that, out of a plurality of packets generated, a packet including the start bit is a packet which is at an end.

With this configuration, the source data is divided into the first packet and the second packet.

The signal generating unit converts the first packet to generate a symbol w1=(Da1, S=0, Db1), a symbol w2=(Da2, Da7, Db2), a symbol w3=(Da3, Da6, Db3), and a symbol w4=(Da4, Da5, Db4). Furthermore, the signal generating unit generates a signal to be transmitted including numerical values W1, W2, W3, and W4 indicated by the symbols w1, w2, w3, and w4, respectively.

Furthermore, the signal generating unit converts the second packet to generate a symbol w1=(Da1, S=1, Db1), a symbol w2=(Da2, A1=1, Db2), a symbol w3=(Da3, A2=0, Db3), and a symbol w4=(Da4, A3=0, A4=0). Furthermore, the signal generating unit generates a signal to be transmitted including numerical values W1, W2, W3, and W4 indicated by the symbols w1, w2, w3, and w4, respectively.

FIG. 218 is a diagram illustrating processing for dividing source data into three packets.

For example, when a bit length of source data (Data) is 17 bits, the signal generating unit divides the source data to generate two pieces of intermediate data. Specifically, the source data includes 10-bit main source data Dataa and 7-bit sub source data Datab. In this case, the signal generating unit generates first intermediate data including the main source data Dataa and 6-bit parity corresponding to the main source data Dataa. Furthermore, the signal generating unit generates second intermediate data including the sub source data Datab and 4-bit parity corresponding to the sub source data Datab. For example, the signal generating unit generates parity by cyclic redundancy check (CRC).

Next, the signal generating unit divides the first intermediate data into 6-bit main data Da (1) including parity, 6-bit main data Da (2), and 4-bit main data Da (3). Furthermore, the signal generating unit divides the second intermediate data into 4-bit sub data Db (1) including parity, 4-bit sub data Db (2), and 3-bit sub data Db (3).

Next, the signal generating unit generates a 12-bit first packet including a start bit S (S=0), 1-bit address data indicating "0", the main data Da (1), and the sub data Db (1).

Furthermore, the signal generating unit generates a 12-bit second packet including a start bit S (S=0), 1-bit address data indicating "1", the main data Da (2), and the sub data Db (2). Furthermore, the signal generating unit generates a 12-bit third packet including a start bit S (S=1), 4-bit address data indicating "0100", the main data Da (3), and the sub data Db (3).

With this configuration, the source data is divided into the first packet, the second packet, and the third packet.

The signal generating unit converts the first packet to generate a symbol w1=(Da1, S=0, Db1), a symbol w2=(Da2, A1=0, Db2), a symbol w3=(Da3, Da6, Db3), and a symbol w4=(Da4, Da5, Db4). Furthermore, the signal generating unit generates a signal to be transmitted including numerical values W1, W2, W3, and W4 indicated by the symbols w1, w2, w3, and w4, respectively.

Similarly, the signal generating unit converts the second packet to generate a symbol w1=(Da1, S=0, Db1), a symbol w2=(Da2, A1=1, Db2), a symbol w3=(Da3, Da6, Db3), and a symbol w4=(Da4, Da5, Db4). Furthermore, the signal generating unit generates a signal to be transmitted including numerical values W1, W2, W3, and W4 indicated by the symbols w1, w2, w3, and w4, respectively.

Similarly, the signal generating unit converts the third packet to generate a symbol w1=(Da1, S=1, Db1), a symbol w2=(Da2, A1=0, Db2), a symbol w3=(Da3, A2=1, Db3), and a symbol w4=(Da4, A3=0, A4=0). Furthermore, the signal generating unit generates a signal to be transmitted including numerical values W1, W2, W3, and W4 indicated by the symbols w1, w2, w3, and w4, respectively.

FIG. 219 is a diagram illustrating another example of processing for dividing source data into three packets.

In the example illustrated in FIG. 218, 6-bit or 4-bit parity has been generated by CRC, but 1-bit parity may be generated.

In this case, when a bit length of source data (Data) is 25 bits, the signal generating unit divides the source data to generate two pieces of intermediate data. Specifically, the source data includes 15-bit main source data Dataa and 10-bit sub source data Datab. In this case, the signal generating unit generates first intermediate data including the main source data Dataa and 1-bit parity corresponding to the main source data Dataa, and generates second intermediate data including the sub source data Datab and 1-bit parity corresponding to the sub source data Datab.

Next, the signal generating unit divides the first intermediate data into 6-bit main data Da (1) including parity, 6-bit main data Da (2), and 4-bit main data Da (3). Furthermore, the signal generating unit divides the second intermediate data into 4-bit sub data Db (1) including parity, 4-bit sub data Db (2), and 3-bit sub data Db (3).

Next, as in the example illustrated in FIG. 218, the signal generating unit generates a first packet, a second packet, and a third packet from the first intermediate data and the second intermediate data.

FIG. 220 is a diagram illustrating another example of processing for dividing source data into three packets.

In the example illustrated in FIG. 218, 6-bit parity has been generated by CRC for main source data Dataa, and 4-bit parity has been generated by CRC for sub source data Datab. However, parity may be generated by CRC for the entire main source data Dataa and sub source data Datab.

In this case, when a bit length of source data (Data) is 22 bits, the signal generating unit divides the source data to generate two pieces of intermediate data.

Specifically, the source data includes 15-bit main source data Dataa and 7-bit sub source data Datab. The signal generating unit generates first intermediate data including the main source data Dataa and 1-bit parity corresponding to the main source data Dataa. Furthermore, the signal generating unit generates 4-bit parity by CRC for the entire main source data Dataa and sub source data Datab. The signal generating unit then generates second intermediate data including the sub source data Datab and the 4-bit parity.

Next, the signal generating unit divides the first intermediate data into 6-bit main data Da (1) including parity, 6-bit main data Da (2), and 4-bit main data Da (3). Furthermore, the signal generating unit divides the second intermediate data into 4-bit sub data Db (1), 4-bit sub data Db (2) including part of the CRC parity, and 3-bit sub data Db (3) including remaining CRC parity.

Next, as in the example illustrated in FIG. 218, the signal generating unit generates a first packet, a second packet, and a third packet from the first intermediate data and the second intermediate data.

Note that among the specific examples of processing for dividing source data into three packets, processing illustrated in FIG. 218 is referred to as version 1, processing illustrated in FIG. 219 is referred to as version 2, and processing illustrated in FIG. 220 is referred to as version 3.

FIG. 221 is a diagram illustrating processing for dividing source data into four packets. FIG. 222 is a diagram illustrating processing for dividing source data into five packets.

As in the processing for dividing source data into three packets, that is, as in the processing illustrated in FIG. 218 to FIG. 220, the signal generating unit divides source data into four packets or five packets.

FIG. 223 is a diagram illustrating processing for dividing source data into six, seven or eight packets.

For example, when a bit length of source data (Data) is 31 bits, the signal generating unit divides the source data to generate two pieces of intermediate data. Specifically, the source data includes 16-bit main source data Dataa and 15-bit sub source data Datab. In this case, the signal generating unit generates first intermediate data including the main source data Dataa and 8-bit parity corresponding to the main source data Dataa. Furthermore, the signal generating unit generates second intermediate data including the sub source data Datab and 8-bit parity corresponding to the sub source data Datab. For example, the signal generating unit generates parity by Reed-Solomon codes.

Here, when 4 bits is handled as one symbol in Reed-Solomon codes, each bit length of the main source data Dataa and the sub source data Datab needs to be an integral multiple of 4 bits. However, the sub source data Datab is 15 bits as described above, which is 1 bit less than 16 bits that is an integral multiple of 4 bits.

Therefore, when generating the second intermediate data, the signal generating unit pads the sub source data Datab, and generates 8-bit parity corresponding to the padded 16-bit sub source data Datab by Reed-Solomon codes.

Next, the signal generating unit divides each of the first intermediate data and the second intermediate data into six parts (4 bits or 3 bits) by a method similar to the above-described method. The signal generating unit then generates a first packet including a start bit, 3-bit or 4-bit address data, first main data, and first sub data. Similarly, the signal generating unit generates second to sixth packets.

FIG. 224 is a diagram illustrating another example of processing for dividing source data into six, seven, or eight packets.

While parity has been generated by Reed-Solomon codes in the example illustrated in FIG. 223, parity may be generated by CRC.

For example, when a bit length of source data (Data) is 39 bits, the signal generating unit divides the source data to generate two pieces of intermediate data. Specifically, the source data includes 20-bit main source data Dataa and 19-bit sub source data Datab. In this case, the signal generating unit generates first intermediate data including the main source data Dataa and 4-bit parity corresponding to the main source data Dataa, and generates second intermediate data including the sub source data Datab and 4-bit parity corresponding to the sub source data Datab. For example, the signal generating unit generates parity by CRC.

Next, the signal generating unit divides each of the first intermediate data and the second intermediate data into six parts (4 bits or 3 bits) by a method similar to the above-described method. Then, the signal generating unit generates a first packet including a start bit, 3-bit or 4-bit address data, first main data, and first sub data. Similarly, the signal generating unit generates second to sixth packets.

Note that among the specific examples of processing for dividing source data into six, seven, or eight packets, processing illustrated in FIG. 223 is referred to as version 1, and processing illustrated in FIG. 224 is referred to as version 2.

FIG. 225 is a diagram illustrating processing for dividing source data into nine packets.

For example, when a bit length of source data (Data) is 55 bits, the signal generating unit divides the source data to generate nine packets from first to ninth packets. Note that in FIG. 225, first intermediate data and second intermediate data are omitted.

Specifically, the bit length of the source data (Data) is 55 bits, which is 1 bit less than 56 bits that is an integral multiple of 4 bits. Therefore, the signal generating unit pads the source data, and generates 16-bit parity corresponding to the padded 56-bit source data by Reed-Solomon codes.

Next, the signal generating unit divides entire data including the 16-bit parity and the 55-bit source data into nine pieces of data DaDb (1) to DaDb (9).

Each of the data DaDb (k) includes k-th 4-bit part included in the main source data Dataa and k-th 4-bit part included in the sub source data Datab. Here, k is any integer from 1 to 8. The data DaDb (9) includes ninth 4-bit part included in the main source data Dataa and ninth 3-bit part included in the sub source data Datab.

Next, the signal generating unit adds a start bit S and address data to each of the nine pieces of data DaDb (1) and DaDb (9) to generate first to ninth packets.

FIG. 226 is a diagram illustrating processing for dividing source data into either number of 10 to 16.

For example, when a bit length of source data (Data) is 7×(N−2) bits, the signal generating unit divides the source data to generate N packets from first to N-th packets. Here, N is any integer from 10 to 16. In FIG. 226, first intermediate data and second intermediate data are omitted.

Specifically, the signal generating unit generates 14-bit parity corresponding to 7×(N−2)-bit source data by Reed-Solomon codes. Note that in the Reed-Solomon codes, seven bits are handled as one symbol.

Next, the signal generating unit divides entire data including the 14-bit parity and the 7×(N−2)-bit source data into N pieces of data DaDb (1) to DaDb (N).

Each of the data DaDb (k) includes k-th 4-bit part included in the main source data Dataa and k-th 3-bit part included in the sub source data Datab. Note that k is any integer from 1 to (N−1).

Next, the signal generating unit adds a start bit S and address data to each of the nine pieces of data DaDb (1) to DaDb (N) to generate first to N-th packets.

FIG. 227 to FIG. 229 are diagrams each illustrating an example of a relationship among a number of divisions of source data, data size, and error correction code.

Specifically, FIG. 227 to FIG. 229 illustrate together the relationship in each process illustrated in FIG. 216 to FIG. 226. As described above, processing for dividing source data into three packets includes versions 1 to 3, and processing for dividing source data into six, seven, or eight packets includes version 1 and version 2. FIG. 227 illustrates, when there is a plurality of versions for the number of divisions, the relationship in version 1 of the plurality of versions. Similarly, FIG. 228 illustrates, when there is a plurality of versions for the number of divisions, the relationship in version 2 of the plurality of versions. Similarly, FIG. 229 illustrates, when there is a plurality of versions for the number of divisions, the relationship in version 3 of the plurality of versions.

This variation includes a short mode and a full mode. In the sheet mode, sub data in a packet is 0, and all bits of a third bit string illustrated in FIG. 215 are 0. In this case, numerical values W1 to W4 indicated by symbols w1 to w4 are controlled to 3 or less by the above-described "$b1\times2^0+b2\times2^1+b3\times2^2$." As a result, as illustrated in FIG. 212, time lengths $D_{R1}$ to $D_{R4}$ in data R are shortened because the time lengths $D_{R1}$ to $D_{R4}$ in data R are determined by $D_{Ri}=120+30\times wi$ ($i\in1$ to 4, $wi\in0$ to 7). In other words, in the short mode, a visible light signal per one packet can be shortened. By shortening the visible light signal per one packet, a receiver can receive the packet even from a distant place, and can extend a communication distance.

On the other hand, in the full mode, either bit of the third bit string illustrated in FIG. 215 is 1. In this case, a visible light signal is not shorted as in the short mode.

In this variation, as illustrated in FIG. 227 to FIG. 229, when the number of divisions is small, a visible light signal of the short mode can be generated. Note that a data size of the short mode in FIG. 227 to FIG. 229 indicates a number of bits of main source data (Dataa), whereas a data size of the full mode indicates a number of bits of source data (Data).

Summary of Embodiment 20

FIG. 230A is a flowchart illustrating a method for generating a visible light signal in this embodiment.

The method for generating a visible light signal in this embodiment is a method for generating a visible light signal transmitted by luminance change of a light source included in a transmitter, and includes Steps SD1 to SD3.

In Step SD1, a preamble is generated that is data in which first and second luminance values different from each other appear alternately along a time axis for a predetermined time length.

In Step SD2, in the data in which the first and second luminance values appear alternately along a time axis, first data is generated by determining time lengths in which the first and second luminance values continue by a first method according to a signal to be transmitted.

Finally, in Step SD3, the visible light signal is generated by combining the preamble and the first data.

For example, as illustrated in FIG. 188, the first and the second luminance values are High and Low, respectively, and the first data is data R or data L. By transmitting the visible light signal generated in this way, as illustrated in FIG. 191 to FIG. 193, a number of reception packets can be increased and reliability can be increased. As a result, communication between various devices can be enabled.

The method for generating a visible light signal may be a method for further generating second data that has a complementary relationship with brightness represented by the first data, in the data in which the first and second luminance values appear alternately along a time axis, by determining the time lengths in which the first and second luminance values continue, by a second method according to a signal to be transmitted. In generation of the visible light signal, the visible light signal may be generated by combining the preamble, the first data, and the second data in order of the first data, the preamble, and the second data.

For example, as illustrated in FIG. 188, the first and second luminance values are High and Low, respectively, and the first data and the second data are data R and data L, respectively.

In the case where a and b are constants, a numerical value included in the signal to be transmitted is n, and a constant that is the maximum value the numerical value n can take is m, then the first method may be a method for determining a time length in which the first or second luminance value continues in the first data by a+b×n, and the second method may be a method for determining a time length in which the first or second luminance value continues in the second data by a+b×(m−n).

For example, as illustrated in FIG. 188, a is 120 μs, b is 20 μs, n is either integer of from 0 to 15 (numerical value indicated by signal $x_i$), and m is 15.

In the complementary relationship, the sum of the time length in the entirety of the first data and the time length in the entirety of the second data may be constant.

Moreover, the method for generating a visible light signal may be a method for further generating a light adjustment part that is data for adjusting brightness represented by the visible light signal, and in generation of the visible light signal, the visible light signal may be generated by further combining the light adjustment part.

The light adjustment part is, for example, in FIG. 188, a signal (Dimming) indicating the luminance value of High for a time length $C_1$, and indicating the luminance value of Low for a time length $C_2$. With this structure, brightness of the visible light signal can be adjusted arbitrarily.

FIG. 230B is a block diagram illustrating a configuration of a signal generating unit in this embodiment.

A signal generating unit D10 in this embodiment is a signal generating unit that generates a visible light signal transmitted by luminance change of a light source included in a transmitter, and includes a preamble generator D11, a data generator D12, and a combiner D13.

The preamble generator D11 generates a preamble that is data in which first and second luminance values different from each other appear alternately along a time axis for a predetermined time length.

The data generator D12 generates, in data in which the first and second luminance values appear alternately along a time axis, first data by determining time lengths in which the first and second luminance values continue by a first method according to a signal to be transmitted.

The combiner D13 combines the preamble and the first data to generate the visible light signal.

By transmitting the visible light signal generated in this way, as illustrated in FIG. 191 to FIG. 193, a number of reception packets can be increased and reliability can be increased. As a result, communication between various devices can be enabled.

Summary of Variation 1 of Embodiment 20

As in Variation 1 of Embodiment 20, the method for generating a visible light signal may be a method for further determining whether to divide the source data according to a bit length of the source data and performing processing according to a result of the determination, thereby generating at least one packet from the source data. Then, each of the at least one packet may be converted into a signal to be transmitted.

In the conversion to a signal to be transmitted, as illustrated in FIG. 215, for each target packet included in the at least one packet, by assigning data included in the target packet to either bit of symbols w1, w2, w3, and w4 each including three bits from a first bit to a third bit, the target packet is converted into a signal to be transmitted including numerical values indicated by the symbols w1, w2, w3, and w4.

In the assignment of data, at least part of main data included in the target packet is assigned to a first bit string including the first bit of each of the symbols w1 to w4. A value of a stop bit included in the target packet is assigned to the second bit of the symbol w1. Part of main data included in the target packet or at least part of address data included in the target packet is assigned to a second bit string including the second bit of each of the symbols w2 to w4. Sub data included in the target packet is assigned to a third bit string including the third bit of each of the symbols w1 to w4.

Here, the stop bit indicates whether the target packet is at an end out of at least one generated packet. The address data indicates order of the target packet as an address out of at least one generated packet. Each of the main data and the sub data is data for restoring the source data.

In the case where a and b are constants and numerical values indicated by the symbols w1, w2, w3, and w4 are W1, W2, W3, and W4, respectively, for example, as illustrated in FIG. 212, the first method is a method for determining a time length in which the first or second luminance value in the first data continues by a+b×W1, a+b×W2, a+b×W3, and a+b×W4.

For example, it is assumed that, in each of the symbols w1 to w4, a value of the first bit is b1, a value of the second bit is b2, and a value of the third bit is b3. In this case, each of the values W1 to W4 respectively indicated by the symbols w1 to w4 is, for example, $b1\times2^0+b2\times2^1+b3\times2^2$. Therefore, in the symbols w1 to w4, the values W1 to W4 respectively indicated by the symbols w1 to w4 are larger when the second bit is 1 than when the first bit is 1. Also, the values W1 to W4 respectively indicated by the symbols w1 to w4 are larger when the third bit is 1 than when the second bit is 1. When these values W1 to W4 respectively indicated by the symbols w1 to w4 are large, the time length (e.g. $D_{Ri}$) in which each of the first and second luminance values continues becomes long, thereby inhibiting wrong detection of luminance of the visible light signal and reducing reception error. Conversely, when these values W1 to W4 respectively indicated by the symbols w1 to w4 are small, the time length in which each of the first and second luminance values continues becomes short, and thus wrong detection of luminance of the visible light signal is produced relatively easily.

Therefore, in Variation 1 of Embodiment 20, reduction of the reception error can be achieved by assigning with priority the stop bit and address important for receiving the source data to the second bit of the symbols w1 to w4. The symbol w1 defines the time length in which the luminance value of High or Low closest to the preamble continues. In other words, since the symbol w1 is closer to the preamble than the other symbols w2 to w4, the symbol w1 is more likely to be received appropriately than these other symbols. Therefore, in Variation 1 of Embodiment 20, reduction in the reception error can be further inhibited by assigning the stop bit to the second bit of the symbol w1.

In Variation 1 of Embodiment 20, the main data is assigned with priority to the first bit string in which wrong detection is produced relatively easily. However, when an error correction code (parity) is inserted into the main data, the reception error of the main data can be inhibited.

Furthermore, in Variation 1 of Embodiment 20, sub data is assigned to the third bit string including the third bit of the symbols w1 to w4. Therefore, when the sub data is 0, the time length in which each of the luminance values of High and Low defined by the symbols w1 to w4 continues can be shortened significantly. As a result, a so-called short mode can be implemented that can significantly shorten a transmission time of a visible light signal per one packet. In this short mode, since the transmission time is short as described above, packets can be easily received from a distant place. Therefore, the communication distance of visible light communication can be extended.

In Variation 1 of Embodiment 20, as illustrated in FIG. 217, in generation of at least one packet, two packets are generated by dividing source data into the two packets. In assignment of data, in the case where a packet that is not at an end out of the two packets is converted into a signal to be transmitted as a target packet, part of main data included in the packet that is not at an end is assigned to the second bit string, without assigning at least part of address data.

For example, address data is not included in a packet that is not at an end (Packet1) illustrated in FIG. 217. Then, 7-bit main data Da (1) is included in the packet that is not at an end. Therefore, as illustrated in FIG. 215, data Da1 to Da4 included in the 7-bit main data Da (1) is assigned to the first bit string, whereas data Da5 to Da7 is assigned to the second bit string.

Thus, in the case where source data is divided into two packets, address data is unnecessary for a packet that is not at an end, that is, for the first packet if a start bit (S=0) is included. Therefore, all bits of the second bit string can be used for main data, and data volume included in the packet can be increased.

In assignment of data in Variation 1 of Embodiment 20, a bit on a head side is used with priority for assignment of address data in arrangement order out of three bits included in the second bit string. In the case where all the address data is assigned to one or two bits on a head side of the second bit string, part of main data is assigned to one or two bits to which address data is not assigned in the second bit string. For example, in Packet 1 in FIG. 218, 1-bit address data A1 is assigned to one bit on a head side of the second bit string (second bit of the symbol w2). In this case, main data Da6 and Da5 are assigned to two bits to which address data is not assigned in the second bit string (second bit of each of the symbols w3 and w4).

With this structure, the second bit string can be shared between the address data and part of the main data, and flexibility of the packet structure can be increased.

In assignment of data in Variation 1 of Embodiment 20, in the case where all address data cannot be assigned to the second bit string, remaining part of the address data excluding part assigned to the second bit string is assigned to either bit of the third bit string. For example, in Packet 3 in FIG. 218, all 4-bit address data A1 to A4 cannot be assigned to the second bit string. In this case, remaining part A4 of the address data A1 to A4 excluding parts A1 to A3 assigned to the second bit string is assigned to a last bit of the third bit string (third bit of the symbol w4).

With this structure, the address data can be appropriately assigned to the symbols w1 to w4.

In assignment of data in Variation 1 of Embodiment 20, in the case where an end packet of at least one packet is converted into a signal to be transmitted as a target packet, address data is assigned to any one bit included in the second bit string and the third bit string. For example, a number of bits of address data of an end packet in FIG. 217 to FIG. 226 is 4. In this case, 4-bit address data A1 to A4 is assigned to a last bit of the second bit string and the third bit string (third bit of the symbol w4).

With this structure, the address data can be appropriately assigned to the symbols w1 to w4.

In generation of at least one packet in Variation 1 of Embodiment 20, by dividing source data into two packets, two pieces of divided source data is generated, and an error correction code for each of the two divided source data is generated. Then, two or more packets are generated using the two pieces of divided source data and the error correction code generated for each of the two pieces of divided source data. In generation of the error correction code for each of the two pieces of divided source data, in the case where a number of bits of either divided source data of the two pieces of divided source data is less than a number of bits needed for generation of the error correction code, padding is performed to the divided source data, and the error correction code for the padded divided source data is generated. For example, as illustrated in FIG. 223, when parity is generated by Reed-Solomon codes for Datab that is divided source data, in the case where the Datab is only 15 bits and less than 16 bits, padding is performed to the Datab, and parity is generated by Reed-Solomon codes to the padded divided source data (16 bits).

With this structure, even if the number of bits of the divided source data is less than the number of bits needed for generation of the error correction code, the appropriate error correction code can be generated.

In assignment of data in Variation 1 of Embodiment 20, in the case where sub data indicates 0, 0 is assigned to all bits included in the third bit string. With this structure, the short mode can be implemented and the communication distance of visible light communication can be extended.

Embodiment 21

FIG. 231 is a diagram illustrating a method for receiving a high-frequency visible light signal in this embodiment.

When receiving a high-frequency visible light signal, a receiver provides a guard time (guard interval) in rising and falling of the visible light signal, for example, as illustrated in (a) of FIG. 231. Then, without using the high-frequency signal in the guard time, the receiver copies the high-frequency signal received immediately before the guard time to compensate the high-frequency signal in the guard time. Note that the high-frequency signal to be superimposed on the visible light signal may be modulated by orthogonal frequency division multiplexing (OFDM).

When a high-frequency signal indicating the luminance value of High and a high-frequency signal indicating the luminance value of Low are separated from the high-frequency visible light signal, the receiver automatically adjusts gains for these high-frequency signals (automatic gain control). Accordingly, the gains for the high-frequency signals (luminance value) are unified.

FIG. 232A is a diagram illustrating another method for receiving a high-frequency visible light signal in this embodiment.

A receiver that receives a high-frequency visible light signal includes an image sensor as in each of the embodiments, and further includes a digital mirror device (DMD) element and a photosensor. The photosensor is a photo diode or an avalanche photodiode.

The receiver captures a transmitter (light source) that transmits a high-frequency visible light signal with an image sensor. With this configuration, the receiver obtains a bright line image including striped patterns of bright lines. These striped patterns of bright lines appear by luminance change in a signal other than the high-frequency signal in the high-frequency visible light signal, that is, the visible light signal illustrated in FIG. 188. The receiver specifies positions of the striped patterns of bright lines (x1, y1) and (x2, y2) in the bright line image. Then, the receiver specifies micro mirrors corresponding to the positions (x1, y1) and (x2, y2) in the DMD element. These micro mirrors receive light of the high-frequency visible light signal indicating the striped patterns of bright lines. Therefore, the receiver adjusts an angle of each micro mirror such that the photosensor receives only light reflected by the specified micro mirror out of the plurality of micro mirrors included in the DMD element. In other words, the receiver turns on the micro mirror corresponding to the position (x1, y1) such that the photosensor 1 receives only light reflected by the micro mirror. Furthermore, the receiver turns on the micro mirror corresponding to the position (x2, y2) such that the photosensor 2 receives only light reflected by the micro mirror. Then, the receiver turns off the micro mirrors other than these specified micro mirrors. With this configuration, the light reflected by the off micro mirror is absorbed into an optical absorber body (black body). Also, the on micro mirror allows the high-frequency visible light signal to be appropriately received by the photosensor. Note that an inclination angle (+0° or −0° of each micro mirror of the DMD element is switched by switching between on and off. When the micro mirror is on, the micro mirror outputs reflected light toward the photosensor, whereas when the micro mirror is off, the micro mirror outputs reflected light toward the optical absorber.

In addition, the receiver may include half mirrors and light emitting elements as illustrated in FIG. 232A. A light emitting element 1 transmits a visible light signal (or high-frequency visible light signal) by emitting light and changing in luminance. This light output from the light emitting element 1 is reflected by the half mirror, and is further reflected by the on micro mirror corresponding to the position (x1, y1) in the DMD element. As a result, the visible light signal from the light emitting element 1 is transmitted to the transmitter corresponding to the striped pattern of bright lines at the position (x1, y1). With this configuration, the receiver and the transmitter corresponding to the striped pattern of bright lines at the position (x1, y1) can perform two-way communication with each other. Similarly, light output from a light emitting element 2 is reflected by the half mirror, and is further reflected by the on micro mirror corresponding to the position (x2, y2) in the DMD element. As a result, the visible light signal from the light emitting element 2 is transmitted to the transmitter corresponding to the striped pattern of bright lines at the position (x2, y2). With this configuration, the receiver and the transmitter corresponding to the striped pattern of bright lines at the position (x2, y2) can perform two-way communication with each other.

With this configuration, even if there is a plurality of transmitters (light sources) to be captured by the image sensor, the receiver can perform two-way communication with these transmitters simultaneously and at high speed. For example, in the case where the receiver includes 100 photosensors capable of receiving light at 10 Gbps and these receivers communicate with 100 transmitters, a transmission speed of 1 Tbps can be achieved.

FIG. 232B is a diagram illustrating still another method for receiving a high-frequency visible light signal in this embodiment.

A receiver includes, for example, lenses L1 and L2, a plurality of half mirrors, a DMD element, an image sensor, an optical absorber (black body), a processor, a DMD controller, photosensors 1 and 2, and light emitting elements 1 and 2.

Such a receiver performs two-way communication with two vehicles by a principle similar to the example illustrated in FIG. 232A. The two vehicles transmit high-frequency visible light signals by outputting light from headlights and changing luminance of the headlights. One vehicle outputs normal light (light with constant luminance) from its headlight.

The image sensor receives those high-frequency visible light signals and the normal light through the lens L1. This provides a bright line image including striped patterns of bright lines generated by these high-frequency visible light signals, as in the example illustrated in FIG. 232A. The processor specifies positions of these striped patterns in the bright line image. The DMD controller specifies micro mirrors corresponding to these positions of the specified striped patterns from among a plurality of micro mirrors included in the DMD element, and turns on these micro mirrors.

This causes the high-frequency visible light signals that have passed through the lens L1 and the half mirror from the two vehicles to be reflected by the micro mirrors of the DMD element, and to travel to the lens L2. Meanwhile, since the normal light of the headlight of one vehicle does not produce any striped pattern of bright lines, even if the light passes through the lens L1 and the half mirror, the light is reflected by the off micro mirror of the DMD element. The light reflected by the off micro mirror is absorbed by the optical absorber (black body).

The high-frequency visible light signal that has passed through the lens L2 passes through the half mirror, and is received by the photosensor 1 or 2. This allows reception of the high-frequency visible light signal from each vehicle. When the light emitting elements 1 and 2 output visible light signals (or high-frequency visible light signals) to the half mirrors, the visible light signals are reflected by the half mirrors, pass through the lens L2, and are further reflected by the on micro mirrors in the DMD element. As a result, the visible light signals from the light emitting elements 1 and 2 are transmitted, through the half mirror and the lens L1, to the vehicles that have transmitted the high-frequency visible light signals. That is, the receiver can perform two-way communication with the plurality of vehicles that transmit the high-frequency visible light signals.

Thus, the receiver in this embodiment obtains a bright line image with an image sensor, and specifies a position of a striped pattern of bright lines in the bright line image. Then, the receiver specifies a micro mirror corresponding to the position of the striped pattern out of a plurality of micro mirrors included in a DMD element. Then, the receiver receives a high-frequency visible light signal with a photosensor by turning on the micro mirror. In addition, the receiver can transmit a visible light signal to a transmitter by outputting the visible light signal from a light emitting element and causing the on micro mirror to reflect the visible light signal.

Note that in the examples illustrated in FIG. 232A and FIG. 232B, the half mirror, the lens, and the like have been used as optical instruments, but any optical instrument can be used as long as the optical instrument has similar functions. Placement of the DMD element, the half mirror, the lens, and the like is one example, and any placement is allowed. While the receiver includes two sets of photosensors and light emitting elements in the examples illustrated in FIG. 232A and FIG. 232B, the receiver may include only one set, and may include three sets or more. One light emitting element may transmit a visible light signal to a plurality of on micro lenses. This allows the receiver to transmit an identical visible light signal simultaneously to a plurality of transmitters. The receiver may not include all components illustrated in FIG. 232A and FIG. 232B, but may include only part of these components.

FIG. 233 is a diagram illustrating a method for outputting a high-frequency signal in this embodiment.

A signal output device that outputs a high-frequency signal to be superimposed on the visible light signal illustrated in FIG. 188 includes, for example, a blue laser and a phosphor. That is, as in the example illustrated in FIG. 114A, the signal output device irradiates the phosphor with high-frequency blue laser light from the blue laser. This allows the signal output device to output high-frequency natural light as a high-frequency signal.

Embodiment 22

This embodiment will describe an autonomous aircraft using visible light communication in each of the embodiments (also referred to as drone).

FIG. 234 is a diagram for describing an autonomous aircraft in this embodiment.

An autonomous aircraft 1921 in this embodiment is housed within a surveillance camera 1922. For example, when the surveillance camera 1922 captures an image of a suspicious person, a door of the surveillance camera 1922 opens, the autonomous aircraft 1921 housed within the surveillance camera 1922 takes off from the surveillance camera 1922, and starts tracking of the suspicious person. The autonomous aircraft 1921 includes a small camera, and tracks the suspicious person such that the image of the suspicious person captured by the surveillance camera 1922 is also captured by the small camera. Upon detection that electric power for flight or the like is insufficient, the autonomous aircraft 1921 returns to the surveillance camera 1922 and is housed within the surveillance camera 1922. At this time, when another autonomous aircraft 1921 is housed in the surveillance camera 1922, this another autonomous aircraft 1921 starts tracking of the suspicious person instead of the power-short autonomous aircraft 1921. Electric power is supplied to the power-short autonomous aircraft 1921 from a wireless feeder device 1921*a* included in the surveillance camera 1922. Note that electric power is supplied from the wireless feeder device 1921*a*, for example, in accordance with the standard Qi.

The small camera of the autonomous aircraft 1921 and the surveillance camera 1922 can each receive the visible light signal in each of the embodiments, and can perform operations in response to this received visible light signal. In the case where at least one of the autonomous aircraft 1921 and the surveillance camera 1922 includes a transmitter of a visible light signal, visible light communication can be performed between the autonomous aircraft 1921 and the surveillance camera 1922. As a result, tracking of a suspicious person can be performed more efficiently.

Embodiment 23

This embodiment will describe a display method for implementing augmented reality (AR) using a light ID and the like.

FIG. 235 is a diagram illustrating an example in which a receiver in this embodiment displays an AR image.

A receiver 200 in this embodiment is a receiver including an image sensor and a display 201 in either embodiment of Embodiments 1 to 22 described above. For example, the receiver 200 is configured as a smart phone. Such a receiver 200 obtains a captured display image Pa that is the normal captured image, and an image for decoding that is the visible light communication image or the bright line image, by capturing a subject with the image sensor.

Specifically, the image sensor of the receiver 200 captures a transmitter 100 configured as a station name sign. The transmitter 100 is a transmitter in either embodiment of Embodiments 1 to 22 described above, and includes one or more light emitting elements (e.g. LED). The transmitter 100 changes in luminance by blinking one or more of the light emitting elements, and transmits light identification information (light ID) by the luminance change. This light ID is the visible light signal.

The receiver 200 captures the transmitter 100 for a normal exposure time to obtain the captured display image Pa in which the transmitter 100 is shown. The receiver 200 also captures the transmitter 100 for an exposure time for communication shorter than the normal exposure time to obtain the image for decoding. Here, the normal exposure time is an exposure time in the normal capturing mode, and the exposure time for communication is an exposure time in the visible light communications mode.

The receiver 200 decodes the image for decoding to obtain the light ID. That is, the receiver 200 receives the light ID from the transmitter 100. The receiver 200 transmits the light ID to a server. Then, the receiver 200 obtains, from the server, an AR image P1 and recognition information corresponding to the light ID. The receiver 200 recognizes a region corresponding to the recognition information out of the captured display image Pa as a target region. For example, the receiver 200 recognizes a region in which the station name sign that is the transmitter 100 is shown as a target region. Then, the receiver 200 superimposes the AR image P1 on the target region, and displays, on a display 201, the captured display image Pa on which the AR image P1 is superimposed. For example, in the case where "京都駅" is written in Japanese as a station name on a station name sign that is the transmitter 100, the receiver 200 obtains the AR image P1 on which the station name is written in English, that is, the AR image P1 on which "Kyoto Station" is written. In this case, since the AR image P1 is superimposed on the target region in the captured display image Pa, the captured display image Pa can be displayed such that the station name sign on which the station name is written in English appears to actually exist. As a result, when a user who cannot read Japanese but understand English looks at the captured display image Pa, the user can easily understand the station name written on the station name sign that is the transmitter 100.

For example, the recognition information may be an image to be recognized (e.g. image of the station name sign), and may be a characteristic point and characteristic amount of the image. The characteristic point and the characteristic amount are obtained, for example, by image processing such as scale-invariant feature transform (SIFT), speed-upped robust feature (SURF), oriented-BRIEF (ORB), and accelerated KAZE (AKAZE). Alternatively, the recognition information may be a white quadrangular image similar to the image to be recognized, and may further indicate an aspect ratio of the quadrangle. Alternatively, the identification information may be a random dot that appears in the image to be recognized. Furthermore, the recognition information may indicate a direction based on a predetermined direction, such as the white quadrangle or random dot. The predetermined direction is, for example, the gravity direction.

The receiver 200 recognizes a region corresponding to such recognition information from the captured display image Pa as a target region. Specifically, when the recognition information is an image, the receiver 200 recognizes a region similar to the image of the recognition information as a target region. Alternatively, when the recognition information is the characteristic point and the characteristic amount obtained by image processing, the receiver 200 performs the image processing on the captured display image Pa to perform characteristic point detection and characteristic amount extraction. Then, in the captured display image Pa, the receiver 200 recognizes, as a target region, a region having a characteristic point and a characteristic amount similar to the characteristic point and the characteristic amount which are recognition information. When the recognition information indicates a white quadrangle and a direction thereof, the receiver 200 first detects the gravity direction with an acceleration sensor included in the receiver 200. Then, from the captured display image Pa placed based on the gravity direction, the receiver 200 recognizes, as a target region, a region similar to the white quadrangle turned to a direction indicated by the recognition information.

Here, the recognition information may include reference information for specifying a reference region of the captured display image Pa, and target information indicating a relative position of the target region with respect to the reference region. Examples of the reference information include, as described above, the image to be recognized, characteristic point, characteristic amount, white quadrangle image, and random dot. In this case, when recognizing a target region, the receiver 200 first specifies the reference region from the captured display image Pa based on the reference information. Then, out of the captured display image Pa, the receiver 200 recognizes, as a target region, a region at the relative position indicated by the target information based on a position of the reference region. Note that the target information may indicate that the target region is located at the same position as the reference region. Thus, since the recognition information includes the reference information and the target information, the target region can be recognized in a wide range. The server can arbitrarily set a position on which the AR image is superimposed and inform the receiver 200 of the position.

The reference information may indicate that the reference region in the captured display image Pa is a region in the captured display image in which a display is shown. In this case, when the transmitter 100 is configured, for example, as a display such as a television, the target region can be recognized based on a region in which the display is shown.

In other words, the receiver 200 in this embodiment specifies a reference image and an image recognition method based on the light ID. The image recognition method is a method for recognizing the captured display image Pa, and for example, geometric characteristic amount extraction, spectrum characteristic amount extraction, or texture characteristic amount extraction. The reference image is data indicating a characteristic amount that serves as reference. The characteristic amount is, for example, a characteristic amount of a white outer frame of an image, and specifically may be data representing characteristics of the image by vector. The receiver 200 extracts the characteristic amount from the captured display image Pa by the image recognition method, and the receiver 200 compares the characteristic amount with the characteristic amount of the reference image to find out the reference region or target region from the captured display image Pa.

Also, the image recognition method may include, for example, a location method, a marker method, and a markerless method. The location method is a method that utilizes GPS positional information (that is, position of receiver 200), and the target region is recognized from the captured display image Pa based on the positional information. The marker method is a method for using a marker including white and black figures such as a two-dimensional bar code as a mark for specifying a target. That is, by this marker method, the target region is recognized based on the marker shown in the captured display image Pa. The markerless method is a method for extracting the characteristic point or characteristic amount from the captured display image Pa by image analysis on the captured display image Pa, and for specifying a position and region of the target based on the extracted characteristic point or characteristic amount. That is, in the case where the image recognition method is the markerless method, the image recognition method is the above-described geometric characteristic amount extraction, the spectrum characteristic amount extraction, or the texture characteristic amount extraction.

Such a receiver 200 may specify the reference image and the image recognition method by receiving the light ID from the transmitter 100 and obtaining, from the server, the reference image and the image recognition method associated with the light ID (hereinafter referred to as reception light ID). That is, a plurality of sets including the reference image and the image recognition method are stored in the server, and the plurality of sets is associated with the light IDs different from each other. This makes it possible to specify one set associated with the reception light ID from among the plurality of sets stored in the server. Therefore, the speed of image processing for superimposition of AR images can be improved. The receiver 200 may obtain the reference image or the like associated with the reception light ID by inquiring the server. The receiver 200 may obtain the reference image associated with the reception light ID from among the plurality of reference images the receiver 200 holds in advance.

For each light ID, the server may hold relative positional information associated with the light ID together with the reference image, the image recognition method, and the AR image. The relative positional information is, for example, information indicating a relative positional relationship between the reference region and the target region. With this configuration, when transmitting to the server the reception light ID for inquiry, the receiver 200 obtains the reference image, the image recognition method, the AR image, and the relative positional information associated with the reception light ID. In this case, the receiver 200 specifies the reference region from the captured display image Pa based on the reference image and the image recognition method. Then, the receiver 200 recognizes, as the target region, a region in a direction and distance indicated by the relative positional information from the position of the reference region. The receiver 200 then superimposes the AR image on the target region. Also, if there is no relative positional information, the receiver 200 may recognize the reference region as the target region and superimpose the AR image on the reference region. That is, instead of obtaining the relative positional information, the receiver 200 may hold in advance a program that displays the AR image based on the reference image, and for example, the receiver 200 may display the AR image within a white frame that is the reference region. In this case, the relative positional information is unnecessary.

Holding or obtaining the reference image, the relative positional information, the AR image, and the image recognition method includes the following four variations (1) to (4).

(1) The server holds a plurality of sets of the reference image, the relative positional information, the AR image, and the image recognition method. From among these sets, the receiver 200 obtains one set associated with the reception light ID.

(2) The server holds a plurality of sets of the reference image and the AR image. The receiver 200 uses the relative positional information and the image recognition method determined in advance, and the receiver 200 obtains one set associated with the reception light ID from among these sets. Alternatively, the receiver 200 may hold in advance a plurality of sets of the relative positional information and the image recognition method. The receiver 200 may then select one set associated with the reception light ID from among the plurality of sets. In this case, the receiver 200 may transmit the reception light ID to the server for inquiry, and obtain, from the server, information for specifying the relative positional information and the image recognition method corresponding to the reception light ID. Then, based on the information obtained from the server, the receiver 200 selects one set from among the plurality of sets, held in advance, of the relative positional information and the image recognition method. Alternatively, without inquiring the server, the receiver 200 may select one set associated with the reception light ID from among the plurality of sets, held in advance, of the relative positional information and the image recognition method.

(3) The receiver 200 holds a plurality of sets of the reference image, the relative positional information, the AR image, and the image recognition method. The receiver 200 selects one set from among these sets. As in the above-described (2), by inquiring the server, the receiver 200 may select one set, or may select one set associated with the reception light ID.

(4) The receiver 200 holds a plurality of sets of the reference image and the AR image, and selects one set associated with the reception light ID. The receiver 200 uses the image recognition method and the relative positional information determined in advance.

FIG. 236 is a diagram illustrating an example of a display system in this embodiment.

The display system in this embodiment includes, for example, a transmitter 100 which is the station name sign, a receiver 200, and a server 300.

The receiver 200 first receives a light ID from the transmitter 100 in order to display a captured display image on which an AR image is superimposed as described above. Next, the receiver 200 transmits the light ID to the server 300.

For each light ID, the server 300 holds the AR image and recognition information associated with the light ID. Then, upon receipt of the light ID from the receiver 200, the server 300 selects the AR image and the recognition information associated with the received light ID, and then transmits the selected AR image and the recognition information to the receiver 200. With this configuration, the receiver 200 receives the AR image and the recognition information transmitted from the server 300, and then displays the captured display image on which the AR image is superimposed.

FIG. 237 is a diagram illustrating another example of a display system in this embodiment.

The display system in this embodiment includes, for example, a transmitter 100 that is the station name sign, a receiver 200, a first server 301, and a second server 302.

The receiver 200 first receives a light ID from the transmitter 100 in order to display a captured display image on which an AR image is superimposed as described above. Next, the receiver 200 transmits the light ID to the first server 301.

Upon receipt of the light ID from the receiver 200, the first server 301 notifies the receiver 200 of a uniform resource locator (URL) and a key associated with the received light ID. The receiver 200 that has received such a notification accesses the second server 302 based on the URL and delivers the key to the second server 302.

For each key, the second server 302 holds an AR image and recognition information associated with the key. Then, on receipt of the key from the receiver 200, the second server 302 selects the AR image and recognition information associated with the key, and transmits the selected AR image and the recognition information to the receiver 200. With this configuration, the receiver 200 receives the AR image and the recognition information transmitted from the second server 302, and displays the captured display image on which the AR image is superimposed.

FIG. 238 is a diagram illustrating another example of a display system in this embodiment.

The display system in this embodiment includes, for example, a transmitter 100 that is the station name sign, a receiver 200, a first server 301, and a second server 302.

The receiver 200 first receives a light ID from the transmitter 100 in order to display a captured display image on which an AR image is superimposed as described above. Next, the receiver 200 transmits the light ID to the first server 301.

Upon receipt of the light ID from the receiver 200, the first server 301 notifies the second server 302 of a key associated with the received light ID.

For each key, the second server 302 holds an AR image and recognition information associated with the key. Then, upon receipt of the key from the first server 301, the second server 302 selects the AR image and the recognition information associated with the key, and transmits the selected AR image and the recognition information to the first server 301. Upon receipt of the AR image and the recognition information from the second server 302, the first server 301 transmits the AR image and the recognition information to the receiver 200. With this configuration, the receiver 200 receives the AR image and the recognition information transmitted from the first server 301, and displays the captured display image on which the AR image is superimposed.

Note that in the above example, the second server 302 has transmitted the AR image and the recognition information to the first server 301, but may transmit the AR image and the recognition information to the receiver 200, without transmission to the first server 301.

FIG. 239 is a flowchart illustrating an example of processing operation of a receiver 200 in this embodiment.

First, the receiver 200 starts imaging for the above-described normal exposure time and the exposure time for communication (Step S101). Then, the receiver 200 decodes an image for decoding obtained through imaging for the exposure time for communication to obtain a light ID (Step S102). Next, the receiver 200 transmits the light ID to a server (Step S103).

The receiver 200 obtains, from the server, an AR image and recognition information corresponding to the transmitted light ID (Step S104). Next, out of a captured display image obtained through imaging for the normal exposure time, the receiver 200 recognizes a region corresponding to the recognition information as a target region (Step S105). Then, the receiver 200 superimposes the AR image on the target region, and displays the captured display image on which the AR image is superimposed (Step S106).

Next, the receiver 200 determines whether to end imaging and display of the captured display image (Step S107). Here, when the receiver 200 determines not to end (Step S107: N), the receiver 200 further determines whether an acceleration level of the receiver 200 is equal to or greater than a threshold (Step S108). This acceleration level is measured by an acceleration sensor included in the receiver 200. Upon determination that the acceleration level is less than the threshold (Step S108: N), the receiver 200 executes processing from Step S105. With this configuration, even in the case where the captured display image displayed on a display 201 of the receiver 200 is shifted, the receiver 200 can cause the AR image to follow the target region of the captured display image. On the other hand, upon determination that the acceleration level is equal to or greater than the threshold (Step S108: Y), the receiver 200 executes processing from Step S102. With this configuration, in the case where the transmitter 100 stops being shown in the captured display image, it is possible to prevent the receiver 200 from recognizing by mistake a region in which a subject different from the transmitter 100 is shown as a target region.

Thus, in this embodiment, since the AR image is superimposed on the captured display image and displayed, an image valuable to a user can be displayed. Furthermore, the AR image can be superimposed on an appropriate target region with a processing load reduced.

That is, in general augmented reality (that is, AR), by comparing a captured display image with an enormous number of images to be recognized stored in advance, it is determined whether any image to be recognized is included in the captured display image. Then, when it is determined that an image to be recognized is included, an AR image corresponding to the image to be recognized is superimposed on the captured display image. At this time, the AR image is aligned based on the image to be recognized. Thus, general augmented reality has a problem that an enormous number of calculations is required and a processing load is heavy because the captured display image is compared with an enormous number of images to be recognized and detecting a position of the image to be recognized in the captured display image is needed in alignment.

However, in the display method in this embodiment, the light ID is obtained by decoding the image for decoding obtained by capturing of a subject. That is, the light ID transmitted from the transmitter which is a subject is received. Furthermore, the AR image and the recognition information corresponding to this light ID are obtained from the server. Therefore, the server does not need to compare the captured display image with an enormous number of images to be recognized. The server can select the AR image associated with the light ID in advance and transmit the AR image to a display device. This allows the amount of calculations to be reduced and the processing load to be reduced significantly. Furthermore, faster display processing of the AR image can be achieved.

Moreover, in this embodiment, the recognition information corresponding to the light ID is obtained from the server. The recognition information is information for recognizing a target region that is a region in which the AR image is to be superimposed on the captured display image. This recognition information may be, for example, information indicating that a white quadrangle is the target region. In this case, the target region can be recognized easily and the processing load can be further reduced. That is, the processing load can be further reduced according to details of the recognition information. In addition, since the server can arbitrarily set the details of the recognition information according to the light ID, balance between the processing load and recognition precision can be maintained appropriately.

Note that in this embodiment, after the receiver 200 transmits the light ID to the server, the receiver 200 obtains, from the server, the AR image and the recognition information corresponding to the light ID, but the receiver 200 may obtain in advance at least one of the AR image and the recognition information. In other words, the receiver 200 obtains from the server and stores a plurality of AR images and a plurality of pieces of recognition information together corresponding to a plurality of light IDs that may be received. Subsequently, upon receipt of the light ID, the receiver 200 selects an AR image and recognition information corresponding to the light ID from among a plurality of AR images and a plurality of pieces of recognition information stored in the receiver 200. With this configuration, faster display processing of the AR image can be achieved.

FIG. 240 is a diagram illustrating another example in which a receiver 200 in this embodiment displays an AR image.

A transmitter 100 is configured, for example, as an illumination device as illustrated in FIG. 240, and changes in luminance while illuminating a guide sign 101 of a facility to transmit a light ID. Since the guide sign 101 is illuminated by light from the transmitter 100, the guide sign 101 changes in luminance in a similar manner to the transmitter 100, and transmits the light ID.

The receiver 200 captures the guide sign 101 illuminated by the transmitter 100 to obtain a captured display image Pb and an image for decoding as in the above-described cases. The receiver 200 decodes the image for decoding to obtain the light ID. That is, the receiver 200 receives the light ID from the guide sign 101. The receiver 200 transmits the light ID to a server. Then, the receiver 200 obtains, from the server, an AR image P2 and recognition information corresponding to the light ID. Out of the captured display image Pb, the receiver 200 recognizes a region corresponding to the recognition information as a target region. For example, the receiver 200 recognizes a region in which a frame 102 in the guide sign 101 is shown as a target region. This frame 102 is a frame for indicating waiting time of a facility. Then, the receiver 200 superimposes the AR image P2 on the target region, and displays, on a display 201, the captured display image Pb on which the AR image P2 is superimposed. For example, the AR image P2 is an image including a character string "30 minutes." In this case, since the AR image P2 is superimposed on the target region in the captured display image Pb, the receiver 200 can display the captured display image Pb such that the guide sign 101 on which waiting time "30 minutes" is written appears to actually exist. With this configuration, without providing the guide sign 101 with a special display device, it is possible to notify a user of the receiver 200 of waiting time easily and plainly.

FIG. 241 is a diagram illustrating another example in which a receiver 200 in this embodiment displays an AR image.

Transmitters 100 include, for example, two illumination devices as illustrated in FIG. 241. The transmitters 100 change in luminance while illuminating a guide sign 104 of a facility to transmit a light ID. Since the guide sign 104 is illuminated by light from the transmitters 100, the guide sign 104 changes in luminance in a similar manner to the transmitters 100, and transmits the light ID. The guide sign 104 indicates names of a plurality of facilities, such as "ABC Land" and "Adventure Land", for example.

The receiver 200 captures the guide sign 104 illuminated by the transmitters 100 to obtain a captured display image Pc and an image for decoding as in the above-described cases. The receiver 200 decodes the image for decoding to obtain the light ID. That is, the receiver 200 receives the light ID from the guide sign 104. The receiver 200 transmits the light ID to a server. Then, the receiver 200 obtains, from the server, an AR image P3 and recognition information corresponding to the light ID. Out of the captured display image Pc, the receiver 200 recognizes a region corresponding to the recognition information as a target region. For example, the receiver 200 recognizes a region in which the guide sign 104 is shown as a target region. Then, the receiver 200 superimposes the AR image P3 on the target region, and displays, on a display 201, the captured display image Pc on which the AR image P3 is superimposed. For example, the AR image P3 is an image indicating names of a plurality of facilities. In this AR image P3, the name of a facility with longer waiting time is displayed in a smaller size, and conversely, the name of a facility with shorter waiting time is displayed in a larger size. In this case, since the AR image P3 is superimposed on the target region in the captured display image Pc, the receiver 200 can display the captured display image Pc such that the guide sign 104 on which each facility name with a size corresponding to waiting time is written appears to actually exist. With this configuration, without providing the guide sign 104 with a special display device, it is possible to notify a user of the receiver 200 of waiting time of each facility easily and plainly.

FIG. 242 is a diagram illustrating another example in which a receiver 200 in this embodiment displays an AR image.

Transmitters 100 include, for example, two illumination devices as illustrated in FIG. 242. The transmitters 100 change in luminance while illuminating a rampart 105 to transmit a light ID. Since the rampart 105 is illuminated by light from the transmitters 100, the rampart 105 changes in luminance in a similar manner to the transmitters 100, and transmits the light ID. For example, a small mark modeled on a character face is engraved on the rampart 105 as a hidden character 106.

The receiver 200 captures the rampart 105 illuminated by the transmitters 100 to obtain a captured display image Pd and an image for decoding as in the above-described cases. The receiver 200 decodes the image for decoding to obtain the light ID. That is, the receiver 200 receives the light ID from the rampart 105. The receiver 200 transmits the light ID to a server. Then, the receiver 200 obtains, from the server, an AR image P4 and recognition information corresponding to the light ID. Out of the captured display image Pd, the receiver 200 recognizes a region corresponding to the recognition information as a target region. For example, the receiver 200 recognizes, as a target region, a region in which a range including the hidden character 106 out of the rampart 105 is shown. Then, the receiver 200 superimposes the AR image P4 on the target region, and displays, on a display 201, the captured display image Pd on which the AR image P4 is superimposed. For example, the AR image P4 is an image modeled on a character face. This AR image P4 is an image sufficiently larger than the hidden character 106 shown in the captured display image Pd. In this case, since the AR image P4 is superimposed on the target region in the captured display image Pd, the receiver 200 can display the captured display image Pd such that the rampart 105 on which a big mark modeled on a character face is engraved appears to actually exist. With this configuration, it is possible to plainly notify a user of the receiver 200 of a position of the hidden character 106.

FIG. 243 is a diagram illustrating another example in which a receiver 200 in this embodiment displays an AR image.

Transmitters 100 include, for example, two illumination devices as illustrated in FIG. 243. The transmitters 100 change in luminance while illuminating a guide sign 107 of a facility to transmit a light ID. Since the guide sign 107 is illuminated by light from the transmitters 100, the guide sign 107 changes in luminance in a similar manner to the transmitters 100, and transmits the light ID. In addition, an infrared ray cutoff coating 108 is applied to a plurality of points at corners of the guide sign 107.

The receiver 200 captures the guide sign 107 illuminated by the transmitters 100 to obtain a captured display image Pe and an image for decoding as in the above-described cases. The receiver 200 decodes the image for decoding to obtain the light ID. That is, the receiver 200 receives the light ID from the guide sign 107. The receiver 200 transmits the light ID to a server. Then, the receiver 200 obtains, from the server, an AR image P5 and recognition information corresponding to the light ID. Out of the captured display image Pe, the receiver 200 recognizes a region corresponding to the recognition information as a target region. For example, the receiver 200 recognizes a region in which the guide sign 107 is shown as a target region.

Specifically, the recognition information indicates that a rectangle circumscribing the plurality of points of infrared ray cutoff coating 108 is a target region. The infrared ray cutoff coating 108 cuts off an infrared ray included in light emitted from the transmitters 100. Therefore, an image sensor of the receiver 200 recognizes the infrared ray cutoff coating 108 as an image darker than surroundings thereof. The receiver 200 recognizes a rectangle circumscribing the plurality of points of infrared ray cutoff coating 108 that each appear as a dark image as a target region.

Then, the receiver 200 superimposes an AR image P5 on the target region, and displays, on a display 201, the captured display image Pe on which the AR image P5 is superimposed. For example, the AR image P5 indicates a schedule of events to be performed in the facility of the guide sign 107. In this case, since the AR image P5 is superimposed on the target region in the captured display image Pe, the receiver 200 can display the captured display image Pe such that the guide sign 107 on which the event schedule is written appears to actually exist. With this configuration, without providing the guide sign 107 with a special display device, it is possible to plainly notify a user of the receiver 200 of the event schedule of the facility.

Note that an infrared ray reflective coating may be applied to the guide sign 107 instead of the infrared ray cutoff coating 108. The infrared ray reflective coating reflects an infrared ray included in light emitted from the transmitters 100. Therefore, the image sensor of the receiver 200 recognizes the infrared ray reflective coating as an image brighter than surroundings thereof. That is, in this case, the receiver 200 recognizes, as a target region, a rectangle circumscribing the plurality of points of infrared ray reflective coating that each appear as a bright image.

FIG. 244 is a diagram illustrating another example in which a receiver 200 in this embodiment displays an AR image.

A transmitter 100 is configured as a station name sign and placed near a station exit guide sign 110. Although the station exit guide sign 110 includes a light source and emits light, the station exit guide sign 110 does not transmit a light ID unlike the transmitter 100.

The receiver 200 captures the transmitter 100 and the station exit guide sign 110 to obtain a captured display image Ppre and an image for decoding Pdec. Since the transmitter 100 changes in luminance and the station exit guide sign 110 emits light, a bright line pattern region Pdec 1 corresponding to the transmitter 100 and a bright region Pdec 2 corresponding to the station exit guide sign 110 appear in the image for decoding Pdec. The bright line pattern region Pdec 1 is a region including a pattern of a plurality of bright lines that appears by exposure of a plurality of exposure lines included in an image sensor of the receiver 200 for an exposure time for communication.

Here, as described above, identification information includes reference information for specifying a reference region Pbas of the captured display image Ppre, and target information indicating a relative position of a target region Ptar with respect to the reference region Pbas. For example, the reference information indicates that a position of the reference region Pbas in the captured display image Ppre is identical to a position of the bright line pattern region Pdec 1 in the image for decoding Pdec. Furthermore, the target information indicates that a position of the target region is the position of the reference region.

Therefore, the receiver 200 specifies the reference region Pbas from the captured display image Ppre based on the reference information. That is, in the captured display image Ppre, the receiver 200 specifies a region at a position identical to a position of the bright line pattern region Pdec 1 in the image for decoding Pdec as the reference region Pbas. Furthermore, in the captured display image Ppre, the receiver 200 recognizes a region at a relative position indicated by the target information based on the position of the reference region Pbas as the target region Ptar. In the above example, since the target information indicates that the position of the target region Ptar is the position of the reference region Pbas, the receiver 200 recognizes the reference region Pbas in the captured display image Ppre as the target region Ptar.

Then, the receiver 200 superimposes an AR image P1 on the target region Ptar in the captured display image Ppre.

Thus, in the above example, the bright line pattern region Pdec 1 is used in order to recognize the target region Ptar. Meanwhile, in the case of recognizing a region in which the transmitter 100 is shown from only the captured display image Ppre as the target region Ptar, without using the bright line pattern region Pdec 1, false recognition may occur. In other words, of the captured display image Ppre, not a region in which the transmitter 100 is shown, but a region in which the station exit guide sign 110 is shown may be false-recognized as the target region Ptar. This is because an image of the transmitter 100 and an image of the station exit guide sign 110 in the captured display image Ppre are similar to each other. However, as in the above example, in the case where the bright line pattern region Pdec 1 is used, occurrence of false recognition can be prevented and the target region Ptar can be recognized accurately.

FIG. 245 is a diagram illustrating another example in which a receiver 200 in this embodiment displays an AR image.

In the example illustrated in FIG. 244, the transmitter 100 transmits the light ID by changing luminance of the entire station name sign, and the target information indicates that the position of the target region is the position of the reference region. However, in this embodiment, the transmitter 100 may transmit the light ID by changing luminance of a light emitting element placed in part of an outer frame of the station name sign, without changing luminance of the entire station name sign. The target information only needs to indicate a relative position of a target region Ptar with respect to a reference region Pbas. For example, the target information may indicate that the position of the target region Ptar is above the reference region Pbas (specifically, vertically upward).

In the example illustrated in FIG. 245, the transmitter 100 transmits the light ID by changing luminance of a plurality of light emitting elements arranged horizontally along a lower part of an outer frame of the station name sign. The target information indicates that the position of the target region Ptar is above the reference region Pbas.

In such a case, the receiver 200 specifies the reference region Pbas from the captured display image Ppre based on the reference information. That is, in the captured display image Ppre, the receiver 200 specifies a region at a position identical to the position of the bright line pattern region Pdec 1 in the image for decoding Pdec as the reference region Pbas. Specifically, the receiver 200 specifies the rectangular reference region Pbas that is long horizontally and short vertically. Furthermore, out of the captured display image Ppre, the receiver 200 recognizes a region at a relative position indicated by the target information based on the position of the reference region Pbas as the target region Ptar. That is, out of the captured display image Ppre, the receiver 200 recognizes a region above the reference region Pbas as the target region Ptar. Note that at this time, the receiver 200 specifies an upward direction of the reference region Pbas based on the gravity direction measured by an acceleration sensor included in the receiver 200.

Note that the target information may indicate not only the relative position of the target region Ptar but also a size, a shape, and an aspect ratio of the target region Ptar. In this case, the receiver 200 recognizes the target region Ptar with the size, the shape, and the aspect ratio indicated by the target information. The receiver 200 may determine the size of the target region Ptar based on the size of the reference region Pbas.

FIG. 246 is a flowchart illustrating another example of processing operation of a receiver 200 in this embodiment.

The receiver 200 executes processing of Steps S101 to S104 as in the example illustrated in FIG. 239.

Next, the receiver 200 specifies the bright line pattern region Pdec 1 from the image for decoding Pdec (Step S111). Next, the receiver 200 specifies the reference region Pbas corresponding to the bright line pattern region Pdec 1 from the captured display image Ppre (Step S112). Then, the receiver 200 recognizes the target region Ptar from the captured display image Ppre based on the recognition information (specifically, target information) and the reference region Pbas (Step S113).

Next, as in the example illustrated in FIG. 239, the receiver 200 superimposes the AR image on the target region Ptar in the captured display image Ppre, and displays the captured display image Ppre on which the AR image is superimposed (Step S106). Then, the receiver 200 determines whether to end imaging and display of the captured display image Ppre (Step S107). When the receiver 200 determines here not to end imaging and display (Step S107: N), the receiver 200 further determines whether the acceleration level of the receiver 200 is equal to or greater than the threshold (Step S114). This acceleration level is measured by the acceleration sensor included in the receiver 200. Upon determination that the acceleration level is less than the threshold (Step S114: N), the receiver 200 executes processing from Step S113. Accordingly, even in the case where the captured display image Ppre displayed on the display 201 of the receiver 200 is shifted, the receiver 200 can cause the AR image to follow the target region Ptar in the captured display image Ppre. On the other hand, upon determination that the acceleration level is equal to or greater than the threshold (Step S114: Y), the receiver 200 executes processing from Step S111 or Step S102. This can prevent false recognition of a region in which a subject different from the transmitter 100 (e.g. station exit guide sign 110) is shown as the target region Ptar.

FIG. 247 is a diagram illustrating another example in which a receiver 200 in this embodiment displays an AR image.

When an AR image P1 in a captured display image Ppre that is being displayed is tapped, the receiver 200 enlarges and displays the AR image P1. Alternatively, when the AR image P1 is tapped, the receiver 200 may display a new AR image that indicates information more detailed than information indicated in the AR image P1, instead of the AR image P1. In the case where the AR image P1 indicates one-page information of an informational magazine including a plurality of pages, the receiver 200 may display a new AR image indicating information on a next page to a page of the AR image P1 instead of the AR image P1. Alternatively, when the AR image P1 is tapped, the receiver 200 may display video related to the AR image P1 as a new AR image, instead of the AR image P1. At this time, the receiver 200 may display video in which an object (colored leaves in the example of FIG. 247) comes out of the target region Ptar as the AR image.

FIG. 248 is a diagram illustrating a captured display image Ppre and an image for decoding Pdec obtained through imaging by a receiver 200 in this embodiment.

While imaging, for example, as illustrated in (a1) of FIG. 248, the receiver 200 obtains captured images such as the captured display image Ppre and the image for decoding Pdec at a frame rate of 30 fps. Specifically, the receiver 200 alternately obtains the captured display image Ppre and the image for decoding Pdec, so as to obtain the captured display image Ppre "A" at time t1, the image for decoding Pdec at time t2, and the captured display image Ppre "B" at time t3.

While displaying the captured image, the receiver 200 displays only the captured display image Ppre out of the captured image, and does not display the image for decoding Pdec. That is, as illustrated in (a2) of FIG. 248, when obtaining the image for decoding Pdec, the receiver 200 displays the captured display image Ppre obtained immediately before, instead of the image for decoding Pdec. Specifically, the receiver 200 displays the obtained captured display image Ppre "A" at time t1, and displays again at time t2 the captured display image Ppre "A" obtained at time t1. With this configuration, the receiver 200 displays the captured display image Ppre at a frame rate of 15 fps.

Here, in the example illustrated in (a1) of FIG. 248, the receiver 200 alternately obtains the captured display image Ppre and the image for decoding Pdec, but a mode of obtaining these images in this embodiment is not limited to such a mode. That is, the receiver 200 may repeat continuous obtainment of N images for decoding Pdec (N is an integer equal to or greater than 1), and subsequent continuous obtainment of M captured display images Ppre (M is an integer equal to or greater than 1).

The receiver 200 needs to switch the captured image to be obtained between the captured display image Ppre and the image for decoding Pdec, and this switching may take time. Therefore, as illustrated in (b1) of FIG. 248, the receiver 200 may provide a switching period at switching between obtainment of the captured display image Ppre and obtainment of the image for decoding Pdec. Specifically, after obtaining the image for decoding Pdec at time t3, the receiver 200 executes processing for switching the captured image in the switching period between time t3 and t5, and obtains the captured display image Ppre "A" at time t5. Subsequently, the receiver 200 executes processing for switching the captured image in the switching period between time t5 and t7, and obtains the image for decoding Pdec at time t7.

In the case where the switching period is provided in this way, the receiver 200 displays the captured display image Ppre obtained immediately before in the switching period, as illustrated in (b2) of FIG. 248. Therefore, in this case, the frame rate of display of the captured display image Ppre in the receiver 200 is low, for example, 3 fps. In the case where the frame rate is low in this way, even if a user moves the receiver 200, the captured display image Ppre that is being displayed may not move in response to movement of the receiver 200. That is, the captured display image Ppre is not displayed as a live view. Therefore, the receiver 200 may move the captured display image Ppre in response to movement of the receiver 200.

FIG. 249 is a diagram illustrating an example of a captured display image Ppre displayed on a receiver 200 in this embodiment.

For example, as illustrated in (a) of FIG. 249, the receiver 200 displays, on a display 201, the captured display image Ppre obtained through imaging. Here, a user moves the receiver 200 leftward. At this time, in the case where a new captured display image Ppre is not obtained through imaging by the receiver 200, the receiver 200 moves rightward the captured display image Ppre that is being displayed, as illustrated in (b) of FIG. 249. More specifically, the receiver 200 includes an acceleration sensor, and in response to an acceleration level measured by the acceleration sensor, the receiver 200 moves the captured display image Ppre that is being displayed so as to be consistent with movement of the receiver 200. This allows the receiver 200 to pseudo-display the captured display image Ppre as a live view.

FIG. 250 is a flowchart illustrating another example of processing operation of a receiver 200 in this embodiment.

First, as in the above-described cases, the receiver 200 superimposes an AR image on a target region Ptar in a captured display image Ppre, and causes the AR image to follow the target region Ptar (Step S122). That is, the AR image that moves with the target region Ptar in the captured display image Ppre is displayed. Then, the receiver 200 determines whether to maintain display of the AR image (Step S122). Here, upon determination not to maintain display of the AR image (N in Step S122), when acquiring a new light ID through imaging, the receiver 200 superimposes a new AR image corresponding to the light ID on the captured display image Ppre and displays the resultant AR image (Step S123).

On the other hand, upon determination to maintain display of the AR image (Y in Step S122), the receiver 200 repeatedly executes processing from Step S121. During this, even if the receiver 200 obtains another AR image, the receiver 200 avoids displaying another AR image. Alternatively, even if the receiver 200 obtains a new image for decoding Pdec, the receiver 200 avoids obtaining a light ID by decoding the image for decoding Pdec. This allows reduction in power consumption for decoding.

Thus, maintaining display of the AR image can prevent the AR image that is being displayed from being eliminated or prevent the AR image from becoming difficult to see by display of another AR image. That is, this can make the AR image that is being displayed easy to see by a user.

For example, in Step S122, the receiver 200 determines to maintain display of the AR image until a predetermined period (certain period) elapses after the AR image is displayed. That is, when displaying the captured display image Ppre, the receiver 200 displays a first AR image for a predetermined display period while inhibiting display of a second AR image different from the first AR image that is the AR image superimposed in Step S121. During this display period, the receiver 200 may prohibit decoding of the newly obtained image for decoding Pdec.

This prevents, while a user is looking at the first AR image displayed once, the first AR image from being immediately replaced with the second AR image different from the first AR image. Furthermore, while display of the second AR image is inhibited, decoding of a newly obtained image for decoding Pdec is useless processing, and prohibiting the decoding can reduce power consumption.

Alternatively, in Step S122, the receiver 200 may include a face camera, and upon detection that a user's face is approaching based on an imaging result by the face camera, the receiver 200 may determine to maintain display of the AR image. That is, when displaying the captured display image Ppre, the receiver 200 further determines whether a user's face is approaching the receiver 200 through imaging by the face camera included in the receiver 200. Then, upon determination that a face is approaching, the receiver 200 displays a first AR image while inhibiting display of a second AR image different from the first AR image that is the AR image superimposed in Step S121.

Alternatively, in Step S122, the receiver 200 may include an acceleration sensor, and upon detection that a user's face is approaching based on a measurement result by the acceleration sensor, the receiver 200 may determine to maintain display of the AR image. That is, when displaying the captured display image Ppre, the receiver 200 further determines whether a user's face is approaching the receiver 200 by an acceleration level of the receiver 200 measured by the acceleration sensor. For example, in the case where the acceleration level of the receiver 200 measured by the acceleration sensor indicates a positive value in an outward direction perpendicular to the display 201 of the receiver 200, the receiver 200 determines that a user's face is approaching. Then, upon determination that a face is approaching, the receiver 200 displays a first augmented reality image that is the AR image superimposed in Step S121 while inhibiting display of a second AR image different from the first AR image.

This can prevent, when a user brings his or her face close to the receiver 200 in order to look at the first AR image, the first AR image from being replaced with the second AR image different from the first AR image.

Alternatively, in Step S122, when a lock button included in the receiver 200 is pressed, the receiver 200 may determine to maintain display of the AR image.

In Step S122, the receiver 200 determines not to maintain display of the AR image when the certain period (that is, display period) has elapsed. Even in the case where the certain period has not elapsed, when an acceleration level equal to or greater than a threshold is measured by the acceleration sensor, the receiver 200 determines not to maintain display of the AR image. That is, when displaying the captured display image Ppre, the receiver 200 further measures the acceleration level of the receiver 200 by the acceleration sensor in the display period, and then determines whether the measured acceleration level is equal to or greater than the threshold. Then, when it is determined that the acceleration level is equal to or greater than the threshold, the receiver 200 displays the second AR image instead of the first AR image in Step S123 by canceling inhibition of display of the second AR image.

With this configuration, when the acceleration level of a display device equal to or greater than the threshold is measured, inhibition of display of the second AR image is canceled. Therefore, for example, when a user moves the receiver 200 greatly in order to aim an image sensor at another subject, the second AR image can be displayed immediately.

FIG. 251 is a diagram illustrating another example in which a receiver 200 in this embodiment displays an AR image.

A transmitter 100 is, for example, configured as an illumination device as illustrated in FIG. 251, and transmits a light ID by changing in luminance while illuminating a stage 111 for a small doll. The stage 111, which is illuminated by light from the transmitter 100, changes in luminance in a similar manner to the transmitter 100, and transmits the light ID.

Two receivers 200 capture, from right and left, the stage 111 illuminated by the transmitter 100.

The left receiver 200 of the two receivers 200 captures, from left, the stage 111 illuminated by the transmitter 100 to obtain a captured display image Pf and an image for decoding, as in the above-described cases. The left receiver 200 decodes the image for decoding to obtain the light ID. That is, the left receiver 200 receives the light ID from the stage 111. The left receiver 200 transmits the light ID to a server. Then, the left receiver 200 obtains a three-dimensional AR image and recognition information corresponding to the light ID from the server. This three-dimensional AR image is, for example, an image for displaying a doll in three dimensions. Out of the captured display image Pf, the left receiver 200 recognizes a region corresponding to the recognition information as a target region. For example, the left receiver 200 recognizes an upper central region of the stage 111 as a target region.

Next, based on a direction of the stage 111 shown in the captured display image Pf, the left receiver 200 generates a two-dimensional AR image P6*a* corresponding to the direction from the three-dimensional AR image. Then, the left receiver 200 superimposes the two-dimensional AR image P6*a* on the target region, and displays, on a display 201, the captured display image Pf on which the AR image P6*a* is superimposed. In this case, since the two-dimensional AR image P6*a* is superimposed on the target region in the captured display image Pf, the left receiver 200 can display the captured display image Pf such that the doll appears to actually exist on the stage 111.

Similarly, the right receiver 200 of the two receivers 200 captures, from right, the stage 111 illuminated by the transmitter 100 to obtain a captured display image Pg and an image for decoding, as in the above-described cases. The right receiver 200 decodes the image for decoding to obtain the light ID. That is, the right receiver 200 receives the light ID from the stage 111. The right receiver 200 transmits the light ID to the server. Then, the right receiver 200 obtains a three-dimensional AR image and recognition information corresponding to the light ID from the server. Out of the captured display image Pg, the right receiver 200 recognizes a region corresponding to the recognition information as a target region. For example, the right receiver 200 recognizes an upper central region of the stage 111 as a target region.

Next, based on a direction of the stage 111 shown in the captured display image Pg, the right receiver 200 generates a two-dimensional AR image P6*b* corresponding to the direction from the three-dimensional AR image. Then, the right receiver 200 superimposes the two-dimensional AR image P6*b* on the target region, and displays, on the display 201, the captured display image Pg on which the AR image P6*b* is superimposed. In this case, since the two-dimensional AR image P6*b* is superimposed on the target region in the captured display image Pg, the right receiver 200 can display the captured display image Pg such that the doll appears to actually exist on the stage 111.

Thus, the two receivers 200 display the AR images P6*a* and P6*b* at an identical position above the stage 111. These AR images P6*a* and P6*b* are generated according to the directions of the receivers 200 such that the virtual doll appears to actually face predetermined directions. Therefore, even if captured from any direction of the stage 111, the captured display image can be displayed such that the doll appears to actually exist above the stage 111.

Note that in the above example, the receiver 200 has generated the two-dimensional AR image according to a positional relationship between the receiver 200 and the stage 111 from the three-dimensional AR image; however, the receiver 200 may obtain the two-dimensional AR image from a server. In other words, the receiver 200 transmits information indicating the positional relationship together with the light ID to the server, and obtains the two-dimensional AR image from the server, instead of the three-dimensional AR image. This can reduce burden of the receiver 200.

FIG. 252 is a diagram illustrating another example in which a receiver 200 in this embodiment displays an AR image.

A transmitter 100 is, for example, configured as an illumination device as illustrated in FIG. 252, and transmits a light ID by changing in luminance while illuminating a cylindrical structure 112. The structure 112, which is illuminated by light from the transmitter 100, changes in luminance in a similar manner to the transmitter 100, and transmits the light ID.

The receiver 200 captures the structure 112 illuminated by the transmitter 100 to obtain a captured display image Ph and an image for decoding, as in the above-described cases. The receiver 200 decodes the image for decoding to obtain the light ID. That is, the receiver 200 receives the light ID from the structure 112. The receiver 200 transmits the light ID to a server. Then, the receiver 200 obtains an AR image P7 and recognition information corresponding to the light ID from the server. Out of the captured display image Ph, the receiver 200 recognizes a region corresponding to the recognition information as a target region. For example, the receiver 200 recognizes a region in which a central portion of the structure 112 is shown as a target region. Then, the receiver 200 superimposes the AR image P7 on the target region, and displays, on a display 201, the captured display image Ph on which the AR image P7 is superimposed. For example, the AR image P7 is an image including a character string "ABCD", and the character string is distorted in accordance with a curved surface in the central portion of the structure 112. In this case, since the AR image P2 including the distorted character string is superimposed on the target region in the captured display image Ph, the receiver 200 can display the captured display image Ph such that the character string drawn on the structure 112 appears to actually exist.

FIG. 253 is a diagram illustrating another example in which a receiver 200 in this embodiment displays an AR image.

For example, as illustrated in FIG. 253, a transmitter 100 transmits a light ID by changing in luminance while illuminating a menu 113 of a restaurant. The menu 113, which is illuminated by light from the transmitter 100, changes in luminance in a similar manner to the transmitter 100, and transmits the light ID. The menu 113 indicates names of a plurality of dishes, such as "ABC soup", "XYZ salad", and "KLM lunch", for example.

The receiver 200 captures the menu 113 illuminated by the transmitter 100 to obtain a captured display image Pi and an image for decoding, as in the above-described cases. The receiver 200 decodes the image for decoding to obtain the light ID. That is, the receiver 200 receives the light ID from the menu 113. The receiver 200 transmits the light ID to a server. Then, the receiver 200 obtains an AR image P8 and recognition information corresponding to the light ID from the server. Out of the captured display images Pi, the receiver 200 recognizes a region corresponding to the recognition information as a target region. For example, the receiver 200 recognizes a region in which the menu 113 is shown as a target region. Then, the receiver 200 superimposes the AR image P8 on the target region, and displays, on a display 201, the captured display image Pi on which the AR image P8 is superimposed. For example, the AR image P8 is an image indicating foodstuffs used for the plurality of dishes with marks. For example, the AR image P8 indicates a mark modeled on an egg for the dish "XYZ salad" in which an egg is used, and a mark modeled on a pig for the dish "KLM lunch" in which pork is used. In this case, since the AR image P8 is superimposed on the target region in the captured display image Pi, the receiver 200 can display the captured display image Pi such that the menu 113 to which the foodstuff marks are added appears to actually exist. This allows the receiver 200 to notify a user of the receiver 200 of a foodstuff of each dish easily and plainly, without a special display device in the menu 113.

The receiver 200 may obtain a plurality of AR images, select an AR image suitable for a user from the plurality of AR images based on user information set by the user, and superimpose the selected AR image. For example, in the case where the user information indicates that the user exhibits an allergic reaction to eggs, the receiver 200 selects an AR image to which an egg mark is added to a dish in which eggs are used. In the case where the user information indicates that ingestion of pork is prohibited, the receiver 200 selects an AR image to which a pig mark is added to a dish in which pork is used. Alternatively, the receiver 200 may transmit the user information together with the light ID to the server, and obtain an AR image corresponding to the light ID and the user information from the server. This allows display, for each user, of a menu that calls attention to the user.

FIG. 254 is a diagram illustrating another example in which a receiver 200 in this embodiment displays an AR image.

A transmitter 100 is configured, for example, as a television as illustrated in FIG. 254, and changes in luminance while displaying video on a display to transmit a light ID. In addition, a normal television 114 is placed near the transmitter 100. The television 114, which displays video on a display, transmits no light ID.

The receiver 200 captures, for example, the television 114 together with the transmitter 100 to obtain a captured display image Pj and an image for decoding, as in the above-described cases. The receiver 200 decodes the image for decoding to obtain the light ID. That is, the receiver 200 receives the light ID from the transmitter 100. The receiver 200 transmits the light ID to a server. Then, the receiver 200 obtains an AR image P9 and recognition information corresponding to the light ID from the server. Out of the captured display image Pj, the receiver 200 recognizes a region corresponding to the recognition information as a target region.

For example, the receiver 200 uses a bright line pattern region of the image for decoding to recognize a lower portion of a region in which the transmitter 100 transmitting the light ID is shown in the captured display image Pj as a first target region. Note that at this time, reference information included in the recognition information indicates that a position of a reference region in the captured display image Pj is identical to a position of the bright line pattern region in the image for decoding. Furthermore, target information included in the recognition information indicates that there is a target region in a lower portion of the reference region. The receiver 200 recognizes the first target region by using such recognition information.

Furthermore, the receiver 200 recognizes a region of which a position is fixed in advance in a lower portion of the captured display image Pj as a second target region. The second target region is larger than the first target region. Note that the target information included in the recognition information further indicates not only a position of the first target region but also a position and size of the second target region as described above. The receiver 200 recognizes the second target region by using such recognition information.

Then, the receiver 200 superimposes the AR image P9 on the first target region and the second target region, and displays, on a display 201, the captured display image Pj on which the AR image P8 is superimposed. In superimposition of the AR image P9, the receiver 200 adjusts a size of the AR image P9 to a size of the first target region, and superimposes the size-adjusted AR image P9 on the first target region. Furthermore, the receiver 200 adjusts the size of the AR image P9 to a size of the second target region, and superimposes the size-adjusted AR image P9 on the second target region.

For example, the AR image P9 indicates subtitles for video of the transmitter 100. A language of the subtitles in the AR image P9 is a language according to user information registered with the receiver 200. That is, when transmitting the light ID to the server, the receiver 200 also transmits, to the server, the user information (e.g. information indicating user's nationality or language). Then, the receiver 200 obtains the AR image P9 indicating subtitles of the language according to the user information. Alternatively, the receiver 200 may obtain a plurality of AR images P9 indicating subtitles of languages different from each other, and select the AR image P9 to be used for superimposition from the plurality of AR images P9 according to the registered user information.

In other words, in the example illustrated in FIG. 254, the receiver 200 captures a plurality of displays that displays images as subjects to obtain the captured display image Pj and the image for decoding. Then, when recognizing a target region, in the captured display image Pj, the receiver 200 recognizes, as a target region, a region in which a transmission display appears that is a display transmitting the light ID (that is, transmitter 100) out of the plurality of displays. Next, the receiver 200 superimposes, on the target region, first subtitles corresponding to the image displayed on the transmission display as an AR image. Furthermore, the receiver 200 superimposes second subtitles that are subtitles obtained by enlarging the first subtitles on a region larger than the target region in the captured display images Pj.

This allows the receiver 200 to display the captured display image Pj such that subtitles appear to actually exist in video of the transmitter 100. Furthermore, since the receiver 200 also superimposes large subtitles on a lower portion of the captured display image Pj, even if subtitles added to the video of the transmitter 100 are small, the receiver 200 can display easy-to-see subtitles. Note that in the case where no subtitles are added to the video of the transmitter 100 and only large subtitles are superimposed on a lower portion of the captured display image Pj, it is difficult to determine whether the superimposed subtitles are subtitles for the video of the transmitter 100 or subtitles for video of the television 114. However, in this embodiment, since subtitles are also added to the video of the transmitter 100 that transmits the light ID, a user can easily determine which video the superimposed subtitles are for.

In display of the captured display image Pj, the receiver 200 may further determine whether sound information is included in information obtained from the server. Then, upon determination that sound information is included, the receiver 200 outputs sound indicated by the sound information with priority over the first and second subtitles. This can reduce burden under which a user reads subtitles because sound is output with priority While languages of subtitles differ depending on the user information (that is, user attribute) in the above example, video itself displayed on the transmitter 100 (that is, content) may differ. For example, in the case where video displayed on the transmitter 100 is news video and user information indicates that the user is a Japanese, the receiver 200 obtains news video broadcasted in Japan as an AR image. Then, the receiver 200 superimposes the news video on a region on which display of the transmitter 100 is shown (that is, target region). Meanwhile, in the case where the user information indicates that the user is an American, the receiver 200 obtains news video broadcasted in the Unites States as an AR image. Then, the receiver 200 superimposes the news video on the region on which display of the transmitter 100 is shown (that is, target region). This allows display of video suitable for the user. Note that the user information indicates, for example, nationality or language as user attribute, and the receiver 200 obtains the AR image based on the attribute.

FIG. 255 is a diagram illustrating an example of recognition information in this embodiment.

Even if recognition information is, for example, a characteristic point, a characteristic amount, and the like as described above, false recognition may occur. For example, transmitters 100*a* and 100*b* are each configured as a station name sign in a similar manner to the transmitter 100. Even if these transmitters 100*a* and 100*b* are station name signs different from each other, these transmitters 100*a* and 100*b*, which are located close to each other, may be false-recognized because of similarity.

Therefore, recognition information on each of the transmitters 100*a* and 100*b* may not indicate each characteristic point and each characteristic amount of the entire image of the transmitter 100*a* or 100*b*, but may indicate each characteristic point and each characteristic amount of only a characteristic portion of the image.

For example, a portion a1 of the transmitter 100*a* and a portion b1 of the transmitter 100*b* greatly differ from each other, and a portion a2 of the transmitter 100*a* and a portion b2 of the transmitter 100*b* greatly differ from each other. Therefore, in the case where the transmitters 100*a* and 100*b* are installed within a predetermined range (that is, short distance), the server holds a characteristic point and a characteristic amount of an image of each of the portion a1 and the portion a2 as recognition information corresponding to the transmitter 100*a*. Similarly, the server holds a characteristic point and a characteristic amount of an image of each of the portion b1 and the portion b2 as identification information corresponding to the transmitter 100*b*.

This allows the receiver 200, even in the case where the transmitters 100*a* and 100*b* similar to each other are located close to each other (in the case where the transmitters 100*a* and 100*b* are located within the predetermined range), to recognize the target region appropriately using the identification information.

FIG. 256 is a flowchart illustrating another example of processing operation of a receiver 200 in this embodiment.

First, the receiver 200 determines whether a user has visual impairment based on user information registered with the receiver 200 (Step S131). Here, upon determination that the user has visual impairment (Step S131: Y), the receiver 200 outputs, by sound, characters of an AR image displayed in superimposition (Step S132). On the other hand, upon determination that the user has no visual impairment (Step S131: N), the receiver 200 further determines whether the user has hearing impairment based on the user information (Step S133). Here, upon determination that the user has hearing impairment (Step S133: Y), the receiver 200 stops sound output (Step S134). At this time, the receiver 200 stops output of sound by all functions.

Note that upon determination in Step S133 that the user has visual impairment (Step S131: Y), the receiver 200 may execute processing of Step S133. That is, when the receiver 200 determines that the user has visual impairment and no hearing impairment, the receiver 200 may output, by sound, characters of the AR image displayed in superimposition.

FIG. 257 is a diagram illustrating an example in which a receiver 200 in this embodiment identifies bright line pattern regions.

First, the receiver 200 captures two transmitters that transmit light IDs to obtain images for decoding, and decodes the images for decoding to obtain the light IDs, as illustrated in (e) of FIG. 257. At this time, since each image for decoding includes two bright line pattern regions X and Y, the receiver 200 obtains the light ID of the transmitter corresponding to the bright line pattern region X, and the light ID of the transmitter corresponding to the bright line pattern region Y. The light ID of the transmitter corresponding to the bright line pattern region X includes, for example, numerical values (that is, data) corresponding to addresses 0 to 9, and indicates "5, 2, 8, 4, 3, 6, 1, 9, 4, 3." Similarly, the light ID of the transmitter corresponding to the bright line pattern region X includes, for example, numerical values corresponding to addresses 0 to 9, and indicates "5, 2, 7, 7, 1, 5, 3, 2, 7, 4."

Even if the receiver 200 has once obtained these light IDs, that is, even if these light IDs are already known, the receiver 200 may become confused about from which bright line pattern region each light ID has been obtained while imaging. In such a case, performing processing illustrated in (a) to (d) of FIG. 257 allows the receiver 200 to determine easily and quickly from which bright line pattern region each known light ID has been obtained.

Specifically, first, as illustrated in (a) of FIG. 257, the receiver 200 obtains an image for decoding Pdec 11 and decodes the image for decoding Pdec 11 to obtain numerical values at address 0 of the light IDs of the bright line pattern regions X and Y. For example, the numerical value at address 0 of the light ID of the bright line pattern region X is "5", whereas the numerical value at address 0 of the light ID of the bright line pattern region Y is also "5." Since the numerical values at address 0 of the light IDs are "5", at this time, it cannot be determined from which bright line pattern region the known light ID has been obtained.

Therefore, as illustrated in (b) of FIG. 257, the receiver 200 obtains an image for decoding Pdec 12 and decodes the image for decoding Pdec 12 to obtain the numerical values at address 1 of the light IDs of the bright line pattern regions X and Y. For example, the numerical value at address 1 of the light ID of the bright line pattern region X is "2", whereas the numerical value at address 1 of the light ID of the bright line pattern region Y is also "2." Since the numerical values at address 1 of the light IDs are "2", at this time, it cannot be determined from which bright line pattern region the known light ID has been obtained.

Therefore, as illustrated in (c) of FIG. 257, the receiver 200 further obtains an image for decoding Pdec 13 and decodes the image for decoding Pdec 13 to obtain the numerical values at address 2 of the light IDs of the bright line pattern regions X and Y. For example, the numerical value at address 2 of the light ID of the bright line pattern region X is "8", whereas the numerical value at address 2 of the light ID of the bright line pattern region Y is "7." At this time, it can be determined that the known light ID "5, 2, 8, 4, 3, 6, 1, 9, 4, 3" has been obtained from the bright line pattern region X, whereas it can be determined that the known light ID "5, 2, 7, 7, 1, 5, 3, 2, 7, 4" has been obtained from the bright line pattern region Y.

However, in order to increase reliability, the receiver 200 may further obtain the numerical values at address 3 of the light IDs, as illustrated in (d) of FIG. 257. That is, the receiver 200 obtains an image for decoding Pdec 14 and decodes the image for decoding Pdec 14 to obtain the numerical values at address 3 of the light IDs of the bright line pattern regions X and Y. For example, the numerical value at address 3 of the light ID of the bright line pattern region X is "4", whereas the numerical value at address 3 of the light ID of the bright line pattern region Y is "7." At this time, it can be determined that the known light ID "5, 2, 8, 4, 3, 6, 1, 9, 4, 3" has been obtained from the bright line pattern region X, whereas it can be determined that the known light ID "5, 2, 7, 7, 1, 5, 3, 2, 7, 4" has been obtained from the bright line pattern region Y. That is, since the light IDs of the bright line pattern regions X and Y can be identified not only by address 2 but also by address 3, reliability can be increased.

Thus, in this embodiment, the numerical values of at least one address are obtained again, without obtaining new numerical values (that is, data) at all the addresses of the light ID. This makes it possible to determine easily and quickly from which bright line pattern region the known light ID has been obtained.

Note that in the examples illustrated in (c) and (d) of FIG. 257, the numerical value obtained at the predetermined address matches the numerical value of the known light ID, but these numerical values may not match each other. For example, in the example illustrated in (d) of FIG. 257, the receiver 200 obtains "6" as a numerical value at address 3 of the light ID of the bright line pattern region Y. This numerical value "6" at address 3 differs from the numerical value "7" at address 3 of the known light ID "5, 2, 7, 7, 1, 5, 3, 2, 7, 4." However, since the numerical value "6" is close to the numerical value "7", the receiver 200 may determine that the known light ID "5, 2, 7, 7, 1, 5, 3, 2, 7, 4" has been obtained from the bright line pattern region Y. Note that the receiver may determine whether the numerical value "6" is close to the numerical value "7" depending on whether the numerical value "6" is within a range of the numerical value "7"±n (n is, for example, a number equal to or greater than 1).

FIG. 258 is a diagram illustrating another example of a receiver 200 in this embodiment.

While the receiver 200 has been configured as a smart phone in the above-described examples, the receiver 200 may be configured as a head-mounted display (also referred to as glass) including an image sensor as in the examples illustrated in FIG. 19 to FIG. 21.

Since such a receiver 200 consumes more electric power if a processing circuit for displaying the above AR images (hereinafter referred to as an AR processing circuit) is always in an activated state, the receiver 200 may activate the AR processing circuit when a predetermined signal is detected.

For example, the receiver 200 includes a touch sensor 202. When touching a user's finger or the like, the touch sensor 202 outputs a touch signal. Upon detection of the touch signal, the receiver 200 activates the AR processing circuit.

Alternatively, upon detection of an electromagnetic wave signal, such as Bluetooth® or Wi-Fi®, the receiver 200 may activate the AR processing circuit.

Alternatively, the receiver 200 may include an acceleration sensor, and when the acceleration sensor measures an acceleration level equal to or greater than a threshold in a direction opposite to the direction of gravity, the receiver 200 may activate the AR processing circuit. That is, upon detection of a signal indicating the acceleration level, the receiver 200 activates the AR processing circuit. For example, when a user thrusts up a nose pad portion of the receiver 200 configured as a glass by a fingertip upward from below, the receiver 200 detects the signal indicating the acceleration level and activates the AR processing circuit.

Alternatively, upon detection by GPS, a 9-axis sensor, or the like that an image sensor is aimed at the transmitter 100, the receiver 200 may activate the AR processing circuit. That is, upon detection of a signal indicating that the receiver 200 is aimed at a predetermined direction, the receiver 200 activates the AR processing circuit. In this case, when the transmitter 100 is the above-described station name sign in Japanese or the like, the receiver 200 superimposes the AR image indicating the English station name on the station name sign and displays the resultant image.

FIG. 259 is a flowchart illustrating another example of processing operation of a receiver 200 in this embodiment.

When the receiver 200 obtains a light ID from a transmitter 100 (Step S141), the receiver 200 receives mode designation information corresponding to the light ID to switch a noise cancellation mode (Step S142). Then, the receiver 200 determines whether to end mode switching processing (Step S143), and upon determination not to end the mode switching processing (Step S143: N), the receiver 200 repeatedly executes processing from Step S141. Switching of the noise cancellation mode is, for example, switching between a mode of eliminating noise such as engine noise in an aircraft (ON), and a mode of not eliminating the noise (OFF). Specifically, a user who carries the receiver 200 is holding, to an ear, an earphone connected to the receiver 200, and listening to sounds, such as music output from the receiver 200. When such a user boards an aircraft, the receiver 200 obtains a light ID. As a result, the receiver 200 switches the noise cancellation mode from OFF to ON. This allows the user, even within an aircraft, to listen to sounds that contain no noise such as engine noise. In addition, when the user goes out of the aircraft, the receiver 200 obtains a light ID. The receiver 200 that has obtained this light ID switches the noise cancellation mode from ON to OFF. Note that noise that is subjected to noise cancellation is not only engine noise but may be any noise, such as human voice.

FIG. 260 is a diagram illustrating an example of a transmission system including a plurality of transmitters in this embodiment.

This transmission system includes a plurality of transmitters 120 arranged in predetermined order. These transmitters 120 are transmitters in either embodiment of Embodiments 1 to 22 in a similar manner to the transmitter 100, and include one or more light emitting elements (e.g. LED). The leading transmitter 120 changes in luminance of the one or more light emitting elements at a predetermined frequency (carrier frequency) to transmit a light ID. Furthermore, the leading transmitter 120 outputs, to the following transmitter 120, a signal indicating the change in luminance as a synchronous signal. Upon receipt of the synchronous signal, the following transmitter 120 changes in luminance of the one or more light emitting elements in response to the synchronous signal to transmit the light ID. Furthermore, the following transmitter 120 outputs, to the next following transmitter 120, the signal indicating the change in luminance as a synchronous signal. This causes all the transmitters 120 included in the transmission system to transmit the light ID synchronously.

Here, the synchronous signal is delivered from the leading transmitter 120 to the following transmitter 120, is further delivered from the following transmitter 120 to the next following transmitter 120, and then reaches the last transmitter 120. It takes, for example, about 1 μs to deliver the synchronous signal. Therefore, in the case where the transmission system includes N transmitters 120 (N is an integer greater than or equal to 2), it takes 1×N μs until the synchronous signal reaches the last transmitter 120 from the leading transmitter 120. As a result, transmission timing of the light ID is shifted for N μs at the maximum. For example, if N transmitters 120 transmit the light ID at a frequency of 9.6 kHz and even if the receiver 200 attempts to receive the light ID at the frequency of 9.6 kHz, the receiver 200 receives the light ID shifted by N and thus the receiver 200 may be unable to receive the light ID correctly.

Therefore, in this embodiment, the leading transmitter 120 transmits the light ID early in accordance with a number of transmitters 120 included in the transmission system. For example, the leading transmitter 120 transmits the light ID at a frequency of 9.605 kHz. Meanwhile, the receiver 200 receives the light ID at a frequency of 9.6 kHz. At this time, even if the receiver 200 receives the light ID shifted by N since the frequency of the leading transmitter 120 is higher than the frequency of the receiver 200 by 0.005 kHz, occurrence of reception errors caused by the shift of the light ID can be prevented.

The leading transmitter 120 may control an adjustment amount of the frequency by having the synchronous signal fed back from the last transmitter 120. For example, the leading transmitter 120 measures time from the leading transmitter 120 itself outputting the synchronous signal until receiving the synchronous signal fed back from the last transmitter 120. Then, as the time increases, the leading transmitter 120 transmits the light ID at a frequency higher than a reference frequency (e.g. 9.6 kHz).

FIG. 261 is a diagram illustrating an example of a transmission system including a plurality of transmitters and a receiver in this embodiment.

This transmission system includes, for example, two transmitters 120 and a receiver 200. One transmitter 120 of the two transmitters 120 transmits a light ID at a frequency of 9.599 kHz. The other transmitter 120 transmits a light ID at a frequency of 9.601 kHz. In such a case, the two transmitters 120 notify the receiver 200 of the frequencies of the light IDs of the transmitters 120 by an electromagnetic wave signal.

Upon receipt of the notification of these frequencies, the receiver 200 attempts decoding at each of the notified frequencies. That is, the receiver 200 attempts to decode an image for decoding at the frequency of 9.599 kHz. If the light ID cannot be received by this attempt, the receiver 200 attempts to decode the image for decoding at the frequency of 9.601 kHz. Thus, the receiver 200 attempts to decode the image for decoding at each of the all notified frequencies. In other words, the receiver 200 performs round robin for the notified frequencies. Alternatively, the receiver 200 may attempt decoding at an average frequency of all the notified frequencies. That is, the receiver 200 attempts decoding at 9.6 kHz, which is an average frequency of 9.599 kHz and 9.601 kHz.

This allows reduction in an occurrence rate of reception errors caused by a difference in frequency between the receiver 200 and the transmitter 120.

FIG. 262A is a flowchart illustrating an example of processing operation of a receiver 200 in this embodiment.

First, the receiver 200 starts imaging (Step S151), and initializes a parameter N to 1 (Step S152). Next, the receiver 200 decodes an image for decoding obtained by the imaging at a frequency corresponding to the parameter N, and calculates an evaluation value for a decoding result (Step S153). For example, frequencies such as 9.6 kHz, 9.601 kHz, 9.599 kHz, and 9.602 kHz are associated in advance with the parameters N=1, 2, 3, 4, and 5, respectively. The evaluation value increases as the decoding result is more similar to a correct light ID.

Next, the receiver 200 determines whether the numerical value of the parameter N is identical to Nmax, which is a predetermined integer equal to or greater than 1 (Step S154). Here, upon determination that the numerical value of the parameter N is not identical to Nmax (Step S154: N), the receiver 200 increments the parameter N (Step S155), and repeatedly executes processing from Step S153. On the other hand, upon determination that the numerical value of the parameter N is identical to Nmax (Step S154: Y), the receiver 200 registers, with a server, the frequency at which the greatest evaluation value is calculated as an optimum frequency in association with place information indicating a place of the receiver 200. After the registration, the optimum frequency and the place information registered in this way are used for reception of a light ID of a receiver 200 that has moved to the place indicated by the place information. Also, the place information may be, for example, information indicating a position measured by GPS, and may be identification information of an access point (e.g. service set identifier: SSID) in a wireless local area network (LAN).

The receiver 200 that has registered the above information with the server displays, for example, the AR image described above in accordance with the light ID obtained by decoding at the optimum frequency.

FIG. 262B is a flowchart illustrating an example of processing operation of a receiver 200 in this embodiment.

After the registration is performed with the server illustrated in FIG. 262A, the receiver 200 transmits, to a server, place information indicating the place where the receiver 200 is present (Step S161). Next, the receiver 200 obtains the optimum frequency registered in association with the place information from the server (Step S162).

Next, the receiver 200 starts imaging (Step S163), and decodes the image for decoding obtained by the imaging at the optimum frequency obtained in Step S162 (Step S164). The receiver 200 displays, for example, the AR image described above in accordance with the light ID obtained by this decoding.

Thus, after registration with the server is performed, the receiver 200 can obtain the optimum frequency and receive the light ID, without executing processing illustrated in FIG. 262A. Note that when the receiver 200 fails to obtain the optimum frequency in Step S162, the receiver 200 may obtain the optimum frequency by executing processing illustrated in FIG. 262A.

Summary of Embodiment 23

FIG. 263A is a flowchart illustrating a display method in this embodiment.

The display method in this embodiment is a display method by which a display device that is the receiver 200 displays images, and includes Steps SL11 to SL16.

In Step SL11, the display device obtains a captured display image and an image for decoding by an image sensor capturing a subject. In Step SL12, the display device obtains a light ID by decoding the image for decoding. In Step SL13, the display device transmits the light ID to a server. In Step SL14, the display device obtains, from the server, an AR image and recognition information corresponding to the light ID. In Step SL15, out of the captured display image, the display device recognizes a region corresponding to the recognition information as a target region. In Step SL16, the display device displays the captured display image with the AR image superimposed on the target region.

With this configuration, since the AR image is superimposed and displayed on the captured display image, the display device can display an image valuable to a user. Furthermore, the display device can reduce processing load and superimpose the AR image on an appropriate target region.

That is, in general augmented reality (that is, AR), it is determined whether any image to be recognized is included in the captured display image by comparing the captured display image with an enormous number of images to be recognized stored in advance. Then, when it is determined that the image to be recognized is included, the AR image corresponding to the image to be recognized is superimposed on the captured display image. At this time, the AR image is aligned based on the image to be recognized. Thus, in general augmented reality, since the captured display image is compared with an enormous number of images to be recognized, and furthermore, since position detection of the image to be recognized in the captured display image is needed also in alignment, there is a problem of a large amount of calculations and a heavy processing load.

However, in the display method in this embodiment as also illustrated in FIG. 235 to FIG. 262B, the light ID is obtained by decoding the image for decoding obtained by capturing a subject. That is, the light ID transmitted from the transmitter that is a subject is received. Furthermore, the AR image and recognition information corresponding to this light ID are obtained from the server. Therefore, the server does not need to compare the captured display image with an enormous number of images to be recognized, can select the AR image associated with the light ID in advance, and transmit the selected AR image to the display device. With this configuration, the amount of calculations can be reduced and the processing load can be reduced significantly.

In the display method in this embodiment, the recognition information corresponding to this light ID is obtained from the server. The recognition information is information for recognizing the target region that is a region on which the AR image is to be superimposed in the captured display image. This recognition information may be, for example, information indicating that a white quadrangle is the target region. In this case, the target region can be recognized easily and the processing load can be further reduced. In other words, the processing load can be further reduced in accordance with details of the recognition information. In addition, since the server can set the details of the recognition information arbitrarily in accordance with the light ID, a balance between the processing load and recognition precision can be maintained appropriately.

Here, the recognition information is reference information for specifying the reference region in the captured display image. In recognition of the target region, the reference region may be specified from the captured display image based on the reference information, and the target region may be recognized by the position of the reference region in the captured display image.

Alternatively, the recognition information may include reference information for specifying a reference region in the captured display image, and target information indicating a relative position of the target region with respect to the reference region. In this case, in recognition of the target region, the reference region is specified from the captured display image based on the reference information, and a region in the relative position indicated by the target information based on a position of the reference region in the captured display image is recognized as the target region.

With this configuration, as illustrated in FIG. 244 and FIG. 245, flexibility of the position of the target region to be recognized in the captured display image can be expanded.

Meanwhile, the reference information may indicate that the position of the reference region in the captured display image is identical to the position of the bright line pattern region including a plurality of bright line patterns that appears by exposure of a plurality of exposure lines the image sensor has in the image for decoding.

With this configuration, as illustrated in FIG. 244 and FIG. 245, the target region can be recognized based on a region corresponding to the bright line pattern region in the captured display image.

Also, the reference information may indicate that the reference region in the captured display image is a region in which a display of the captured display image is shown.

With this configuration, as illustrated in FIG. 235, for example, when the station name sign is a display, the target region can be recognized based on a region in which the display is shown.

In display of the captured display image, a first AR image may be displayed in a display period determined in advance while inhibiting display of a second AR image different from the first AR image which is the above-described AR image.

This prevents the first AR image, while a user is looking at the first AR image displayed once, from being immediately replaced with the second AR image different from the first AR image, as illustrated in FIG. 250.

In display of the captured display image, decoding of a newly obtained image for decoding may be prohibited in the display period.

With this configuration, since decoding of a newly obtained image for decoding is useless processing when display of the second AR image is inhibited as illustrated in FIG. 250, prohibiting the decoding can reduce power consumption.

In display of the captured display image, in the display period, the acceleration level of the display device may further be measured by the acceleration sensor to determine whether the measured acceleration level is equal to or greater than a threshold. Then, when it is determined that the measured acceleration level is equal to or greater than the threshold, the second AR image may be displayed instead of the first AR image by canceling inhibition of display of the second AR image.

With this configuration, inhibition of display of the second AR image is canceled when the acceleration level of the display device equal to or greater than the threshold is measured, as illustrated in FIG. 250. Therefore, for example, when the user moves the display device greatly in order to aim the image sensor at another subject, the second AR image can be displayed immediately.

In display of the captured display image, it may further be determined through imaging with a face camera included in the display device whether a user's face is approaching the display device. When it is determined that a user's face is approaching, the first AR image may be displayed while inhibiting display of the second AR image different from the first AR image. Alternatively, in display of the captured display image, it may further be determined by the acceleration level of the display device measured by the acceleration sensor whether a user's face is approaching the display device. When it is determined that a user's face is approaching, the first AR image may be displayed while inhibiting display of the second AR image different from the first AR image.

This prevents the first AR image, while the user's face is approaching the display device in order to look at the first AR image, from being replaced with the second AR image different from the first AR image, as illustrated in FIG. 250.

As illustrated in FIG. 254, in acquisition of the captured display image and the image for decoding, a plurality of displays that each display an image may be captured as subjects to obtain the captured display image and the image for decoding. At this time, in recognition of the target region, out of the captured display image, a region in which a transmission display appears that is a display transmitting a light ID out of the plurality of displays is recognized as a target region. In display of the captured display image, first subtitles corresponding to an image displayed on the transmission display are superimposed on the target region as an AR image, and second subtitles that are subtitles obtained by enlarging the first subtitles are further superimposed on a region larger than the target region of the captured display image.

With this configuration, since the first subtitles are superimposed on the image of the transmission display, the user is allowed to easily understand which display image the first subtitles correspond to, out of the plurality of displays. Since the second subtitles obtained by enlarging the first subtitles are also displayed, even in the case where the first subtitles are small and hard to read, the subtitles can be made easy to read by displaying the second subtitles.

In display of the captured display image, it may further be determined whether sound information is included in information obtained from the server, and when it is determined that sound information is included, sound indicated by the sound information may be output with priority over the first and the second subtitles.

With this configuration, since sound is output with priority, a burden for the user to read subtitles can be reduced.

FIG. 263B is a block diagram illustrating a configuration of a display device in this embodiment.

A display device 10 in this embodiment is a display device that displays images, and includes an image sensor 11, a decoder 12, a transmission unit 13, an obtainer 14, a recognizer 15, and a display unit 16. Note that this display device 10 corresponds to the receiver 200.

The image sensor 11 captures a subject to obtain a captured display image and an image for decoding. The decoder 12 decodes the image for decoding to obtain a light ID. The transmission unit 13 transmits the light ID to a server. The obtainer 14 obtains, from the server, an AR image and recognition information corresponding to the light ID. Out of the captured display image, the recognizer 15 recognizes a region corresponding to the recognition information as a target region. The display unit 16 displays the captured display image with the AR image superimposed on the target region.

With this configuration, since the AR image is superimposed on the captured display image and displayed, the display device 10 can display an image valuable to a user. Furthermore, the display device 10 can reduce processing load and superimpose the AR image on an appropriate target region.

Note that in this embodiment, each component may include dedicated hardware, or may be implemented by executing a software program suitable for each component. Each component may be implemented by a program executor, such as a central processing unit (CPU) or a processor, reading and executing a software program recorded on a recording medium, such as a hard disk or a semiconductor memory. Here, software that implements the receiver 200, the display device 10, or the like of this embodiment is a program that causes a computer to execute each step included in the flow charts illustrated in FIG. 239, FIG. 246, FIG. 250, FIG. 256, FIG. 259, and FIG. 262A to FIG. 263A.

Variation 1 of Embodiment 23

Variation 1 of Embodiment 23, that is, Variation 1 of a display method of implementing AR using a light ID will be described below.

FIG. 264 is a diagram illustrating an example in which a receiver in Variation 1 of Embodiment 23 displays an AR image.

By capturing a subject with an image sensor of a receiver 200, the receiver 200 obtains a captured display image Pk that is the above-mentioned normal captured image, and an image for decoding that is the above-mentioned visible light communication image or bright line image.

Specifically, the image sensor of the receiver 200 captures a transmitter 100*c* configured as a robot, and a person 21 who is next to the transmitter 100*c*. The transmitter 100*c* is a transmitter in any one of Embodiments 1 to 22 described above, and includes one or more light emitting elements (e.g. LED) 131. This transmitter 100*c* changes in luminance by blinking one or more of the light emitting elements 131, and transmits a light ID (light identification information) by the luminance change. This light ID is the above-mentioned visible light signal.

The receiver 200 captures the transmitter 100*c* and the person 21 for a normal exposure time to obtain the captured display image Pk in which the transmitter 100*c* and the person 21 are shown. Furthermore, the receiver 200 captures the transmitter 100*c* and the person 21 for an exposure time for communication shorter than the normal exposure time to obtain an image for decoding.

The receiver 200 decodes the image for decoding to obtain the light ID. That is, the receiver 200 receives the light ID from the transmitter 100*c*. The receiver 200 transmits the light ID to a server. Then, the receiver 200 obtains, from the server, an AR image P10 and recognition information corresponding to the light ID. The receiver 200 recognizes a region corresponding to the recognition information in the captured display image Pk as a target region. For example, the receiver 200 recognizes a region on a right side of a region in which the robot that is the transmitter 100*c* is shown as a target region. Specifically, the receiver 200 specifies a distance between two markers 132*a* and 132*b* of the transmitter 100*c* shown in the captured display image Pk. Then, the receiver 200 recognizes a region having a width and a height corresponding to the distance as a target region. That is, the recognition information indicates shapes of the markers 132*a* and 132*b*, and a position and size of the target region based on these markers 132*a* and 132*b*.

Then, the receiver 200 superimposes the AR image P10 on the target region, and displays, on a display 201, the captured display image Pk on which the AR image P10 is superimposed. For example, the receiver 200 obtains the AR image P10 indicating another robot different from the transmitter 100*c*. In this case, since the AR image P10 is superimposed on the target region in the captured display image Pk, the captured display image Pk can be displayed such that another robot appears to actually exist next to the transmitter 100*c*. As a result, the person 21 can be shown in a photo together with another robot and the transmitter 100*c*, even if another robot does not actually exist.

FIG. 265 is a diagram illustrating another example in which a receiver 200 in Variation 1 of Embodiment 23 displays an AR image.

For example, as illustrated in FIG. 265, a transmitter 100 is configured as an image display device including a display panel, and changes in luminance while displaying a still image PS on the display panel to transmit a light ID. Note that the display panel is, for example, a liquid crystal display or an organic electroluminescence (EL) display.

The receiver 200 captures the transmitter 100 to obtain a captured display image Pm and an image for decoding, as in the above-described cases. The receiver 200 decodes the image for decoding to obtain the light ID. That is, the receiver 200 receives the light ID from the transmitter 100. The receiver 200 transmits the light ID to a server. Then, the receiver 200 obtains, from the server, an AR image P11 and recognition information corresponding to the light ID. The receiver 200 recognizes a region corresponding to the recognition information out of the captured display image Pm as a target region. For example, the receiver 200 recognizes a region in which the display panel in the transmitter 100 is shown as a target region. Then, the receiver 200 superimposes the AR image P11 on the target region, and displays, on a display 201, the captured display image Pm on which the AR image P11 is superimposed. For example, the AR image P11 is video having a picture identical or substantially identical to the still image PS displayed on the display panel of the transmitter 100 as a leading picture in display order. That is, the AR image P11 is video that begins to move from the still image PS.

In this case, since the AR image P11 is superimposed on the target region in the captured display image Pm, the receiver 200 can display the captured display image Pm such that the image display device displaying the video appears to actually exist.

FIG. 266 is a diagram illustrating another example in which a receiver 200 in Variation 1 of Embodiment 23 displays an AR image.

A transmitter 100 is configured, for example, as illustrated in FIG. 266, as a station name sign, and changes in luminance to transmit a light ID.

The receiver 200 captures the transmitter 100 from a position distant from the transmitter 100, as illustrated in (a) of FIG. 266. This allows the receiver 200 to obtain a captured display image Pn and an image for decoding, as in the above-described cases. The receiver 200 decodes the image for decoding to obtain the light ID. That is, the receiver 200 receives the light ID from the transmitter 100. The receiver 200 transmits the light ID to a server. Then, the receiver 200 obtains, from the server, AR images P12 to P14 and recognition information corresponding to the light ID. The receiver 200 recognizes two regions corresponding to the recognition information out of the captured display image Pn as first and second target regions. For example, the receiver 200 recognizes a region surrounding the transmitter 100 as a first target region. Then, the receiver 200 superimposes the AR image P12 on the first target region, and displays, on a display 201, the captured display image Pn on which the AR image P12 is superimposed. For example, the AR image P12 is an arrow that prompts a user of the receiver 200 to approach the transmitter 100.

In this case, since the AR image P12 is superimposed on the first target region of the captured display image Pn, the user approaches the transmitter 100 with the receiver 200 aiming at the transmitter 100. Such approach of the receiver 200 to the transmitter 100 enlarges a region of the transmitter 100 shown in the captured display image Pn (corresponding to the above-described reference region). When a size of the region becomes equal to or greater than a first threshold, for example, as illustrated in (b) of FIG. 266, the receiver 200 further superimposes the AR image P13 on the second target region that is a region in which the transmitter 100 is shown. That is, the receiver 200 displays, on the display 201, the captured display image Pn on which the AR images P12 and P13 are superimposed. For example, the AR image P13 is a message that notifies the user of an outline of surroundings of the station indicated on the station name sign. The AR image P13 is as large as the region of the transmitter 100 shown in the captured display image Pn.

Also in this case, since the AR image P12 that is an arrow is superimposed and displayed on the first target region in the captured display image Pn, the user approaches the transmitter 100 with the receiver 200 aiming at the transmitter 100. Such approach of the receiver 200 to the transmitter 100 further enlarges a region of the transmitter 100 shown in the captured display image Pn (corresponding to the reference region). When a size of the region becomes equal to or greater than a second threshold, for example, as illustrated in (c) of FIG. 266, the receiver 200 changes the AR image P13 superimposed on the second target region to the AR image P14. Furthermore, the receiver 200 deletes the AR image P12 superimposed on the first target region.

That is, the receiver 200 displays, on the display 201, the captured display image Pn on which the AR image P14 is superimposed. For example, the AR image P14 is a message that notifies the user of details of surroundings of the station indicated on the station name sign. The AR image P14 is as large as the region of the transmitter 100 shown in the captured display image Pn. The region size of the transmitter 100 increases as the receiver 200 approaches the transmitter 100. Therefore, the AR image P14 is larger than the AR image P13.

Thus, the receiver 200 enlarges the AR image and displays more information as the receiver 200 approaches the transmitter 100. Since the arrow that prompts the user to approach is displayed like the AR image P12, this allows the user to easily understand that the approach to the transmitter 100 will lead to display of more information.

FIG. 267 is a diagram illustrating another example in which a receiver 200 in Variation 1 of Embodiment 23 displays an AR image.

In the example illustrated in FIG. 266, when approaching the transmitter 100, the receiver 200 displays more information. However, regardless of a distance between the receiver 200 and the transmitter 100, the receiver 200 may display more information, for example, in a form of speech balloon.

Specifically, as illustrated in FIG. 267, the receiver 200 captures the transmitter 100 to obtain a captured display image Po and an image for decoding, as in the above-described cases. The receiver 200 decodes the image for decoding to obtain the light ID. That is, the receiver 200 receives the light ID from the transmitter 100. The receiver 200 transmits the light ID to a server. Then, the receiver 200 obtains, from the server, an AR image P15 and recognition information corresponding to the light ID. The receiver 200 recognizes a region corresponding to the recognition information out of the captured display image Po as a target region. For example, the receiver 200 recognizes a region surrounding the transmitter 100 as a target region. Then, the receiver 200 superimposes the AR image P15 on the target region, and displays, on a display 201, the captured display image Po on which the AR image P15 is superimposed. For example, the AR image P15 is a message that notifies a user of details of surroundings of the station indicated on the station name sign in a form of speech balloon.

In this case, since the AR image P15 is superimposed on the target region in the captured display image Po, even if the user of the receiver 200 does not approach the transmitter 100, the user can display more information on the receiver 200.

FIG. 268 is a diagram illustrating another example of a receiver 200 in Variation 1 of Embodiment 23.

While the receiver 200 is configured as a smart phone in the above-described examples, the receiver 200 may be configured as a head-mounted display (also referred to as glass) including an image sensor as in the examples illustrated in FIG. 19 to FIG. 21 and FIG. 258.

Such a receiver 200 decodes a region to be decoded of only part of an image for decoding to obtain a light ID. For example, the receiver 200 includes a gaze detecting camera 203 as illustrated in (a) of FIG. 268. The gaze detecting camera 203 captures an eye of a user who carries a head-mounted display that is the receiver 200. The receiver 200 detects the user's gaze based on an eye image obtained through imaging by this gaze detecting camera 203.

For example, as illustrated in (b) of FIG. 268, the receiver 200 displays a gaze frame 204 such that the gaze frame 204 appears in a region to which the detected gaze is directed out of the user's visual field. Therefore, this gaze frame 204 moves in response to movement of the user's gaze. Out of the image for decoding, the receiver 200 handles a region corresponding to an interior of the gaze frame 204 as a region to be decoded. That is, even if there is a bright line pattern region outside the region to be decoded out of the image for decoding, the receiver 200 does not decode the bright line pattern region, but decodes only the bright line pattern region within the region to be decoded. With this configuration, even in the case where the image for decoding includes a plurality of bright line pattern regions, all of these bright line pattern regions are not decoded, and thus the processing load can be reduced and display of unnecessary AR images can be prevented.

In the case where a plurality of bright line pattern regions that each output sound is included in the image for decoding, the receiver 200 may decode only the bright line pattern region within the region to be decoded, and output only sound corresponding to the bright line pattern region. Alternatively, the receiver 200 may decode each of the plurality of bright line pattern regions included in the image for decoding, output big sound corresponding to the bright line pattern region within the region to be decoded, and output small sound corresponding to the bright line pattern region outside the region to be decoded. In the case where there is a plurality of bright line pattern regions outside the region to be decoded, as the bright line pattern region is closer to the region to be decoded, the receiver 200 may output bigger sound corresponding to the bright line pattern region.

FIG. 269 is a diagram illustrating another example in which a receiver 200 in Variation 1 of Embodiment 23 displays an AR image.

For example, as illustrated in FIG. 269, a transmitter 100 is configured as an image display device including a display panel, and changes in luminance while displaying an image on the display panel to transmit a light ID.

The receiver 200 captures the transmitter 100 to obtain a captured display image Pp and an image for decoding, as in the above-described cases.

At this time, the receiver 200 specifies, from the captured display image Pp, a region at a position identical to a bright line pattern region in an image for decoding, the region being as large as the bright line pattern region. Then, the receiver 200 may display a scanning line P100 that moves repeatedly from one end toward the other end of the region.

While this scanning line P100 is displayed, the receiver 200 decodes the image for decoding to obtain the light ID, and transmits the light ID to a server. Then, the receiver 200 obtains an AR image and recognition information corresponding to the light ID from the server. Out of the captured display image Pp, the receiver 200 recognizes a region corresponding to the recognition information as a target region.

Upon recognition of such a target region, the receiver 200 ends display of the scanning line P100, superimposes the AR image on the target region, and then displays, on a display 201, the captured display image Pp on which the AR image is superimposed.

With this configuration, since the moving scanning line P100 is displayed after the transmitter 100 is captured until the AR image is displayed, it is possible to notify the user of processing such as reading of the light ID and the AR image being performed.

FIG. 270 is a diagram illustrating another example in which a receiver 200 in Variation 1 of Embodiment 23 displays an AR image.

Two transmitters 100 are each configured, for example, as illustrated in FIG. 270, as an image display device including a display panel, and change in luminance while displaying an identical still image PS on the display panel to transmit a light ID. Here, the two transmitters 100 change in luminance in aspects different from each other to transmit light IDs different from each other (e.g. light IDs "01" and "02").

As in the example illustrated in FIG. 265, the receiver 200 captures the two transmitters 100 to obtain a captured display image Pq and an image for decoding. The receiver 200 decodes the image for decoding to obtain the light IDs "01" and "02." That is, the receiver 200 receives the light ID "01" from one of the two transmitters 100, and receives the light ID "02" from the other one. The receiver 200 transmits these light IDs to a server. Then, the receiver 200 obtains, from the server, an AR image P16 and recognition information corresponding to the light ID "01." In addition, the receiver 200 obtains an AR image P17 and recognition information corresponding to the light ID "02" from the server.

Out of the captured display image Pq, the receiver 200 recognizes a region corresponding to the recognition information as a target region. For example, the receiver 200 recognizes regions in which the display panels of the two transmitters 100 are shown as target regions. Then, the receiver 200 superimposes the AR image P16 on the target region corresponding to the light ID "01", and superimposes the AR image P17 on the target region corresponding to the light ID "02." Then, the receiver 200 displays, on a display 201, the captured display image Pq on which the AR images P16 and P17 are superimposed. For example, the AR image P16 is video having a picture identical or substantially identical to the still image PS displayed on the display panel of the transmitter 100 corresponding to the light ID "01" as a leading picture in display order. The AR image P17 is video having a picture identical or substantially identical to the still image PS displayed on the display panel of the transmitter 100 corresponding to the light ID "02" as a leading picture in display order. That is, the leading pictures of the AR image P16 and the AR image P17, which are video, are identical to each other. However, the AR image P16 and the AR image P17 are video different from each other, and pictures other than the leading pictures differ from each other.

Therefore, since such an AR image P16 and AR image P17 are superimposed on the captured display image Pq, the receiver 200 can display the captured display image Pq such that the image display devices appear to actually exist, the image display devices displaying video different from each other, the video being reproduced from the identical picture.

FIG. 271 is a flowchart illustrating an example of processing operation of a receiver 200 in Variation 1 of Embodiment 23. The processing operation illustrated in this flowchart of FIG. 271 is, specifically in the case where there are two transmitters 100 illustrated in FIG. 265, an example of processing operation of the receiver 200 that captures these transmitters 100 individually.

First, the receiver 200 captures a first transmitter 100 as a first subject to obtain a first light ID (Step S201). Next, the receiver 200 recognizes the first subject from a captured display image (Step S202). That is, the receiver 200 obtains, from a server, a first AR image and first recognition information corresponding to the first light ID, and recognizes the first subject based on the first recognition information. Then, the receiver 200 starts, from the beginning, reproduction of first video that is the first AR image (Step S203). That is, the receiver 200 starts reproduction from a leading picture of the first video.

Here, the receiver 200 determines whether the first subject has deviated from the captured display image (Step S204). That is, the receiver 200 determines whether the first subject cannot be recognized any more from the captured display image. Upon determination here that the first subject has deviated from the captured display image (Step S204: Y), the receiver 200 suspends reproduction of the first video, which is the first AR image (Step S205).

Next, the receiver 200 determines whether a second light ID different from the first light ID obtained in Step S201 has been obtained, by capturing a second transmitter 100 different from the first transmitter 100 as a second subject (Step S206). Upon determination here that the second light ID has been obtained (Step S206: Y), the receiver 200 performs processing similar to Steps S202 and S203 after the first light ID has been obtained. That is, the receiver 200 recognizes the second subject from the captured display image (Step S207). Then, the receiver 200 starts, from the beginning, reproduction of second video that is a second AR image corresponding to the second light ID (Step S208). That is, the receiver 200 starts reproduction from a leading picture of the second video.

On the other hand, upon determination in Step S206 that the second light ID has not been obtained (Step S206: N), the receiver 200 determines whether the first subject has entered the captured display image again (Step S209). That is, the receiver 200 determines whether the first subject has been recognized again from the captured display image. Upon determination here that the first subject has entered the captured display image (Step S209: Y), the receiver 200 further determines whether a time determined in advance (that is, predetermined time) has elapsed (Step S210). That is, the receiver 200 determines whether the predetermined time has elapsed after the first subject has deviated from the captured display image until reentry. Upon determination here that the predetermined time has not elapsed (Step S210: Y), the receiver 200 starts reproduction from the middle of the suspended first video (Step S211). Note that a reproduction restart leading picture that is a picture of the first video that is first displayed when reproduction starts from the middle may be a picture of a next picture in display order of a picture lastly displayed when reproduction of the first video has been suspended. Alternatively, the reproduction restart leading picture may be a picture that is n frames before the lastly displayed picture in display order (n is an integer equal to or greater than 1).

On the other hand, upon determination that the predetermined time has elapsed (Step S210: N), the receiver 200 starts reproduction of the suspended first video from the beginning (Step S212).

While the receiver 200 superimposes the AR image on the target region in the captured display image in the above-described examples, brightness of the AR image may be adjusted at this time. That is, the receiver 200 determines whether brightness of the AR image obtained from the server matches brightness of the target region in the captured display image. Upon determination that brightness of the AR image does not match brightness of the target region, the receiver 200 adjusts brightness of the AR image to make brightness of the AR image match brightness of the target region. Then, the receiver 200 superimposes the AR image with brightness adjusted on the target region in the captured display image. This can make the superimposed AR image more similar to an image of an object that actually exists, and reduce uncomfortable feeling of the user to the AR image. Note that brightness of an AR image is spatial average brightness of the AR image, and brightness of a target region is also spatial average brightness of the target region.

As illustrated in FIG. 247, when an AR image is tapped, the receiver 200 may enlarge the AR image and display the enlarged AR image on the entire display 201. In the example illustrated in FIG. 247, the receiver 200 switches the tapped AR image to another AR image; however, regardless of tapping, the receiver 200 may switch the AR image automatically. For example, when a predetermined time period in which the AR image is displayed has elapsed, the receiver 200 switches the AR image to another AR image, and displays the switched AR image. At a time determined in advance, the receiver 200 switches the AR image that has been displayed until then to another AR image, and displays the switched AR image. This allows the user to look at the new AR image easily, without performing any operations.

Variation 2 of Embodiment 23

Variation 2 of Embodiment 23, that is, Variation 2 of a display method of implementing AR using a light ID will be described below.

FIG. 272 is a diagram illustrating an example of an assumed problem when a receiver 200 in Embodiment 23 or Variation 1 of Embodiment 23 displays an AR image.

For example, the receiver 200 in Embodiment 23 or Variation 1 of Embodiment 23 captures a subject at time t1. Note that the subject is a transmitter, such as a television, that transmits a light ID by luminance change, or a poster, a guide sign, a signboard, or the like illuminated by light from the transmitter. As a result, the receiver 200 displays, on a display 201, an entire image obtained by an effective pixel region of an image sensor (hereinafter referred to as an entire captured image) as a captured display image. At this time, out of the captured display image, the receiver 200 recognizes a region corresponding to recognition information obtained based on the light ID as a target region on which the AR image is to be superimposed. The target region is, for example, a region indicating an image of the transmitter, such as a television, or an image such as a poster. The receiver 200 superimposes the AR image on the target region in the captured display image, and displays, on the display 201, the captured display image on which the AR image is superimposed. Note that the AR image may be a still image or video, and may be a character string including one or more characters or symbols.

Here, when a user of the receiver 200 approaches the subject in order to display the enlarged AR image, at time t2, a region corresponding to the target region in the image sensor (hereinafter referred to as a recognition region) extends off the effective pixel region. Note that the recognition region is a region where an image of the target region in the captured display image is shown in the effective pixel region of the image sensor. That is, the effective pixel region and the recognition region in the image sensor correspond to the captured display image and the target region in the display 201, respectively.

Since the recognition region extends off the effective pixel region, the receiver 200 cannot recognize the target region in the captured display image and cannot display the AR image.

Therefore, the receiver 200 in this variation obtains an image wider than the captured display image displayed on the entire display 201 in angle of view as an entire captured image.

FIG. 273 is a diagram illustrating an example in which a receiver 200 in Variation 2 of Embodiment 23 displays an AR image.

An angle of view of an entire captured image of the receiver 200 according to this variation, that is, an angle of view of an effective pixel region of an image sensor is wider than an angle of view of the captured display image displayed on an entire display 201. Note that in the image sensor, a region corresponding to an image range displayed on the display 201 is hereinafter referred to as a display region.

For example, the receiver 200 captures a subject at time t1. As a result, out of the entire captured image obtained by the effective pixel region of the image sensor, the receiver 200 displays, on the display 201, only an image obtained by the display region narrower than the effective pixel region as a captured display image. At this time, as in the above-described cases, out of the entire captured image, the receiver 200 recognizes a region corresponding to recognition information obtained based on a light ID as a target region on which the AR image is to be superimposed. Then, the receiver 200 superimposes the AR image on the target region in the captured display image, and displays, on the display 201, the captured display image on which the AR image is superimposed.

Here, when a user of the receiver 200 approaches the subject in order to display the enlarged AR image, a recognition region in the image sensor is enlarged. Then, at time t2, the recognition region extends off the display region in the image sensor. That is, the image of the target region (e.g. an image of a poster) extends off the captured display image displayed on the display 201. However, the recognition region in the image sensor does not extend off the effective pixel region. That is, the receiver 200 obtains the entire captured image including the target region at time t2 as well. As a result, the receiver 200 can recognize the target region from the entire captured image, and superimposes, only on some region of the target region in the captured display image, part of the AR image corresponding to the region, and then displays a resultant image on the display 201.

This allows the AR image to be continuously displayed even if the user approaches the subject in order to display the enlarged AR image and the target region extends off the captured display image.

FIG. 274 is a flowchart illustrating an example of processing operation of a receiver 200 in Variation 2 of Embodiment 23.

The receiver 200 obtains an entire captured image and an image for decoding by an image sensor capturing a subject (Step S301). Next, the receiver 200 decodes the image for decoding to obtain a light ID (Step S302). Next, the receiver 200 transmits the light ID to a server (Step S303). Next, the receiver 200 obtains an AR image and recognition information corresponding to the light ID from the server (Step S304). Next, out of the entire captured image, the receiver 200 recognizes a region corresponding to the recognition information as a target region (Step S305).

Here, the receiver 200 determines whether a recognition region that is a region corresponding to an image of the target region in an effective pixel region of the image sensor extends off a display region (Step S306). When the receiver 200 determines here that the recognition region extends off the display region (Step S306: Yes), the receiver 200 displays, only in some region of the target region in the captured display image, part of the AR image corresponding to the region (Step S307). On the other hand, when the receiver 200 determines that the recognition region does not extend off the display region (Step S306: No), the receiver 200 superimposes the AR image on the target region in the captured display image, and displays the captured display image on which the AR image is superimposed (Step S308).

Then, the receiver 200 determines whether to end display processing of the AR image (Step S309), and when the receiver 200 determines not to end the display processing (Step S309: No), the receiver 200 repeatedly executes processing from Step S305.

FIG. 275 is a diagram illustrating another example in which a receiver 200 in Variation 2 of Embodiment 23 displays an AR image.

The receiver 200 may switch screen display of the AR image in accordance with a ratio of a size of a recognition region to the display region.

In the case where a horizontal width of the display region of an image sensor is w1, a vertical width is h1, a horizontal width of the recognition region is w2, and a vertical width is h2, then the receiver compares a larger ratio of a ratio (h2/h1) and a ratio (w2/w1) with a threshold.

For example, as in (screen display 1) of FIG. 275, when a captured display image with an AR image superimposed on a target region is displayed, the receiver 200 compares the larger ratio with a first threshold (e.g. 0.9). Then, when the larger ratio becomes 0.9 or more, the receiver 200 displays the AR image enlarged to an entire display 201, as in (screen display 2) of FIG. 275. Note that when the recognition region becomes larger than the display region and further becomes larger than an effective pixel region, the receiver 200 continuously displays the AR image enlarged to the entire display 201.

For example, as in (screen display 2) of FIG. 275, when the receiver 200 displays the AR image enlarged to the entire display 201, the receiver 200 compares the larger ratio with a second threshold (e.g. 0.7). The second threshold is smaller than the first threshold. Then, when the larger ratio becomes 0.7 or less, the receiver 200 displays the captured display image with the AR image superimposed on the target region, as in (screen display 1) of FIG. 275.

FIG. 276 is a flowchart illustrating another example of processing operation of a receiver 200 in Variation 2 of Embodiment 23.

The receiver 200 first performs light ID processing (Step S301*a*). This light ID processing is processing including Steps S301 to S304 illustrated in FIG. 274. Next, out of a captured display image, the receiver 200 recognizes a region corresponding to recognition information as a target region (Step S311). Then, the receiver 200 superimposes an AR image on the target region in the captured display image, and displays the captured display image on which the AR image is superimposed (Step S312).

Next, the receiver 200 determines whether a ratio of a recognition region, that is, a larger ratio of a ratio (h2/h1) and a ratio (w2/w1) is equal to or greater than a first threshold K (e.g. K=0.9) (Step S313). Here, when it is determined that the larger ratio is not equal to or greater than the first threshold K (Step S313: No), the receiver 200 repeatedly executes processing from Step S311. On the other hand, when it is determined that the larger ratio is equal to or greater than the first threshold K (Step S313: Yes), the receiver 200 displays the AR image enlarged to the entire display 201 (Step S314). At this time, the receiver 200 periodically switches power supply for an image sensor between on and off. Periodically turning off power supply for the image sensor can achieve power saving of the receiver 200.

Next, when power supply for the image sensor is periodically turned on, the receiver 200 determines whether the ratio of the recognition region is equal to or less than a second threshold L (e.g. L=0.7). When it is determined here that the ratio is not equal to or less than the second threshold L (Step S315: No), the receiver 200 repeatedly executes processing from step S314. On the other hand, when it is determined that the ratio is equal to or less than the second threshold L (Step S315: Yes), the receiver 200 superimposes the AR image on the target region in the captured display image, and displays the captured display image on which the AR image is superimposed (Step S316).

Then, the receiver 200 determines whether to end display processing of the AR image (Step S317), and when the receiver 200 determines not to end the display processing (Step S317: No), the receiver 200 repeatedly executes processing from Step S313.

Thus, by making the second threshold L smaller than the first threshold K, it is possible to prevent frequent switching of screen display of the receiver 200 between (screen display 1) and (screen display 2), and to stabilize the screen display.

Note that in the examples illustrated in FIG. 275 and FIG. 276, the display region and the effective pixel region may be identical to or different from each other. While the ratio of size of the recognition region to the display region has been used in these examples, when the display region differs from the effective pixel region, a ratio of size of the recognition region to the effective pixel region may be used instead of the display region.

FIG. 277 is a diagram illustrating another example in which a receiver 200 in Variation 2 of Embodiment 23 displays an AR image.

In the example illustrated in FIG. 277, an image sensor of the receiver 200 has an effective pixel region larger than a display region, as in the example illustrated in FIG. 273.

For example, the receiver 200 captures a subject at time t1. As a result, out of an entire captured image obtained by the effective pixel region of the image sensor, the receiver 200 displays, on a display 201, only an image obtained by the display region smaller than the effective pixel region as a captured display image. At this time, as in the above-described case, out of the entire captured image, the receiver 200 recognizes a region corresponding to recognition information obtained based on a light ID as a target region on which an AR image is to be superimposed. Then, the receiver 200 superimposes the AR image on the target region in the captured display image, and displays, on the display 201, the captured display image on which the AR image is superimposed.

Here, when a user changes a direction of the receiver 200 (specifically, image sensor), a recognition region in the image sensor moves, for example, in an upper left direction in FIG. 277, and extends off the display region at time t2. That is, an image of the target region (e.g. image of a poster) extends off the captured display image displayed on the display 201. However, the recognition region in the image sensor does not extend off the effective pixel region. That is, the receiver 200 obtains the entire captured image including the target region even at time t2. As a result, the receiver 200 can recognize the target region from the entire captured image, and superimposes, only on some region of the target region in the captured display image, part of the AR image corresponding to the region, and displays the resultant image on the display 201. Furthermore, the receiver 200 changes a size and position of part of the displayed AR image in response to movement of the recognition region in the image sensor, that is, to movement of the target region in the entire captured image.

When the recognition region extends off the display region as described above, the receiver 200 compares, with a threshold, a number of pixels corresponding to a distance between an edge of the effective pixel region and an edge of the display region (hereinafter referred to as a distance between regions).

For example, it is assumed that dh is a number of pixels corresponding to a shorter distance of a distance between an upper side of the effective pixel region and an upper side of the display region, and a distance between a lower side of the effective pixel region and a lower side of the display region (hereinafter referred to as a first distance). It is assumed that dw is a number of pixels corresponding to a shorter distance of a distance between a left side of the effective pixel region and a left side of the display region, and a distance between a right side of the effective pixel region and a right side of the display region (hereinafter referred to as a second distance). At this time, the distance between regions is a shorter distance of the first and second distances.

That is, the receiver 200 compares, with a threshold N, a smaller number of pixels of the number of pixels dw and the number of pixels dh. Then, when the smaller number of pixels becomes, for example, equal to or less than the threshold N at time t2, the receiver 200 fixes, without change, a size and position of part of the AR image in accordance with a position of the recognition region in the image sensor. That is, the receiver 200 switches screen display of the AR image. For example, the receiver 200 fixes a size and position of part of the AR image to be displayed to a size and position of part of the AR image displayed on the display 201 when the smaller number of pixels becomes the threshold N.

Therefore, even if the recognition region further moves and extends off the effective pixel region at time t3, the receiver 200 continues displaying part of the AR image as in the case of time t2. That is, as long as the smaller number of pixels of the number of pixels dw and the number of pixels dh is equal to or less than the threshold N, the receiver 200 continues to superimpose part of the AR image with the size and position fixed on the captured display image and display the resultant AR image as in the case of time t2.

In the example illustrated in FIG. 277, the receiver 200 has changed the size and position of part of the AR image to be displayed in accordance with movement of the recognition region in the image sensor; however, the receiver 200 may change display magnification and position of the entire AR image.

FIG. 278 is a diagram illustrating another example in which a receiver 200 in Variation 2 of Embodiment 23 displays an AR image. Specifically, FIG. 278 illustrates an example in which display magnification of an AR image is changed.

For example, as in the example illustrated in FIG. 277, when a user changes a direction of the receiver 200 (specifically, image sensor) from a state of time t1, a recognition region in an image sensor moves, for example, in an upper left direction in FIG. 278, and extends off a display region at time t2. That is, an image of a target region (e.g. image of a poster) extends off a captured display image displayed on a display 201. However, the recognition region in the image sensor does not extend off an effective pixel region. That is, the receiver 200 obtains an entire captured image including the target region even at time t2. As a result, the receiver 200 can recognize the target region from the entire captured image.

Therefore, in the example illustrated in FIG. 278, the receiver 200 changes display magnification of an AR image such that a size of the entire AR image matches a size of some region of the target region in the captured display image. That is, the receiver 200 reduces the AR image. Then, the receiver 200 superimposes the AR image with the display magnification changed (that is, reduced AR image) on the region, and displays the resultant image on the display 201. Furthermore, in response to movement of the recognition region in the image sensor, that is, to movement of the target region in the entire captured image, the receiver 200 changes the display magnification and position of the AR image to be displayed.

When the recognition region extends off the display region as described above, the receiver 200 compares, with a threshold N, a smaller number of pixels of the number of pixels dw and the number of pixels dh. When the smaller number of pixels becomes equal to or less than the threshold N, for example, at time t2, the receiver 200 fixes, without change, display magnification and position of the AR image in accordance with the position of the recognition region in the image sensor. That is, the receiver 200 switches screen display of the AR image. For example, the receiver 200 fixes the display magnification and position of the AR image to be displayed at a display magnification and position of the AR image displayed on the display 201 when the smaller number of pixels becomes the threshold N.

Therefore, even if the recognition region further moves and extends off the effective pixel region at time t3, the receiver 200 continues to display the AR image as at time t2. That is, as long as the smaller number of pixels of the number of pixels dw and the number of pixels dh is equal to or less than the threshold N, as in the case of time t2, the receiver 200 continues to superimpose the AR image with the display magnification and position fixed on the captured display image, and display the resultant image.

Note that while the smaller number of pixels of the number of pixels dw and the number of pixels dh has been compared with the threshold in the above-described example, a ratio of the smaller number of pixels may be compared with a threshold. The ratio of the number of pixels dw is, for example, a ratio of the number of pixels dw to the number of pixels w0 (dw/w0) in a horizontal direction of the effective pixel region. Similarly, the ratio of the number of pixels dh is, for example, a ratio of the number of pixels dh to the number of pixels h0 (dh/h0) in a vertical direction of the effective pixel region. Alternatively, instead of the number of pixels in the horizontal direction or vertical direction of the effective pixel region, the ratio of the numbers of pixels dw and dh may be represented by using the number of pixels in the horizontal direction or vertical direction of the display region. The threshold to be compared with the ratio of the numbers of pixels dw and dh is, for example, 0.05.

An angle of view of the smaller number of pixels of the number of pixel dw and the number of pixel dh may be compared with a threshold. When the number of pixels of a diagonal of the effective pixel region is m and an angle of view corresponding to the diagonal is θ (e.g. 55°), an angle of view corresponding to the number of pixels dw is θ×dw/m, and an angle of view corresponding to the number of pixels dh is θ×dh/m.

In the examples illustrated in FIG. 277 and FIG. 278, the receiver 200 has switched screen display of the AR image based on the distance between regions between the effective pixel region and the recognition region; however, the receiver 200 may switch screen display of the AR image based on a relationship between the display region and the recognition region.

FIG. 279 is a diagram illustrating another example in which a receiver 200 in Variation 2 of Embodiment 23 displays an AR image. Specifically, FIG. 279 illustrates an example of switching screen display of an AR image based on a relationship between a display region and a recognition region. Also, in the example illustrated in FIG. 279, an image sensor of the receiver 200 has an effective pixel region larger than the display region as in the example illustrated in FIG. 273.

For example, the receiver 200 captures a subject at time t1. As a result, out of an entire captured image obtained by the effective pixel region of the image sensor, the receiver 200 displays, on a display 201, only an image obtained by the display region smaller than the effective pixel region as a captured display image. At this time, as in the above-described cases, out of the entire captured image, the receiver 200 recognizes a region corresponding to recognition information obtained based on a light ID as a target region on which the AR image is to be superimposed. Then, the receiver 200 superimposes the AR image on the target region in the captured display image, and displays, on the display 201, the captured display image on which the AR image is superimposed.

When the user changes a direction of the receiver 200 here, the receiver 200 changes a position of the AR image to be displayed in response to movement of the recognition region in the image sensor. Then, for example, the recognition region in the image sensor moves, for example, in an upper left direction in FIG. 279, and at time t2, part of an edge of the recognition region matches part of an edge of the display region. That is, an image of the target region (e.g. an image such as a poster) is placed at a corner of the captured display image displayed on the display 201. As a result, the receiver 200 superimposes the AR image on the target region at the corner of the captured display image, and displays the resultant image on the display 201.

Then, when the recognition region further moves and extends off the display region, the receiver 200 fixes, without change, a size and position of the AR image displayed at time t2. That is, the receiver 200 switches screen display of the AR image.

Therefore, even if the recognition region further moves and extends off the effective pixel region at time t3, the receiver 200 continues to display the AR image as in the case of time t2. In other words, in the receiver 200, as long as the recognition region extends off the display region, the receiver 200 superimposes the AR image with the same size as that at time t2 on the same position as that at time t2 in the captured display image, and continues to display the resultant image.

Thus, in the example illustrated in FIG. 279, the receiver 200 switches screen display of the AR image depending on whether the recognition region extends off the display region. Instead of the display region, the receiver 200 may use a determination region that includes the display region, the determination region being larger than the display region and smaller than the effective pixel region. In this case, the receiver 200 switches screen display of the AR image depending on whether the recognition region extends off the determination region.

While screen display of the AR image has been described above with reference to FIG. 273 to FIG. 279, when the target region is no longer recognized from the entire captured image, the receiver 200 may superimpose the AR image with the size of the target region recognized immediately before, on the captured display image and display the resultant image.

FIG. 280 is a diagram illustrating another example in which a receiver 200 in Variation 2 of Embodiment 23 displays an AR image.

Note that in the example illustrated in FIG. 243, the receiver 200 captures the guide sign 107 illuminated by the transmitters 100 to obtain the captured display image Pe and the image for decoding as in the above-described case. The receiver 200 decodes the image for decoding to obtain the light ID. That is, the receiver 200 receives the light ID from the guide sign 107. However, in the case where an entire surface of the guide sign 107 has color that absorbs light (e.g. dark color), the surface is dark even if illuminated by the transmitters 100, and thus the receiver 200 may be unable to receive the light ID correctly. Alternatively, even if the entire surface of the guide sign 107 is a striped pattern like the image for decoding (that is, bright line image), the receiver 200 may be unable to receive the light ID correctly.

Therefore, as illustrated in FIG. 280, a reflecting plate 109 may be disposed near the guide sign 107. This allows the receiver 200 to receive light reflected by the reflecting plate 109 from the transmitters 100, that is, visible light transmitted from the transmitters 100 (specifically, light ID). As a result, the receiver 200 can appropriately receive the light ID and display the AR image P5.

Summary of Variations 1 and 2 of Embodiment 23

FIG. 281A is a flowchart illustrating a display method according to an aspect of the present disclosure.

The display method according to an aspect of the present disclosure includes Steps S41 to S43.

In Step S41, the captured image is obtained by capturing as a subject, with the imaging sensor, an object lit up by the transmitter that transmits a signal by luminance change of light. In Step S42, the signal is decoded from the captured image. In Step S43, video corresponding to the decoded signal is read from a memory, and the video is superimposed on the target region corresponding to the subject in the captured image and is displayed on a display. Here, in Step S43, the video is displayed from any image of a plurality of images included in the video, the any image being from among an image including the object and a predetermined number of a plurality of images which are before and after the image including the object in display time. For example, the predetermined number is 10 frames. Alternatively, the object is a still image, and in Step S43, the video is displayed from an image identical to the still image. Note that the image in which display of the video is started is not limited to the image identical to the still image. The image may be an image located before and after the image identical to the still image, that is, the image including the object, by a predetermined number of frames in display order. Also, the object is not limited to the still image but may be a doll or the like.

Note that the imaging sensor and the captured image are, for example, the image sensor and the entire captured image in Embodiment 23, respectively. The still image lit up may be a still image displayed on a display panel of an image display device, and may be an image such as a poster, a guide sign, or a signboard illuminated by light from the transmitter.

Such a display method may include a transmission step of transmitting the signal to a server, and a reception step of receiving the video corresponding to the signal from the server.

This enables, for example, as illustrated in FIG. 265, display of the video in virtual reality such that the still image appears to start moving, and display of an image valuable to a user.

The still image may include an outer frame of predetermined color, and the display method according to an aspect of the present disclosure may further include a recognition step of recognizing the target region from the captured image by the predetermined color. In this case, in Step S43, the video may be resized so as to become identical to the recognized target region in size, and the resized video may be superimposed on the target region in the captured image and displayed on the display. For example, the outer frame of predetermined color is a white or black rectangular frame surrounding the still image, and is indicated by the recognition information in Embodiment 23. Then, the AR image in Embodiment 23 is resized and superimposed as video.

This enables display of the video more realistically such that the video appears to actually exist as the subject.

Out of a captured region of the imaging sensor, only an image projected on a display region smaller than the captured region is displayed on the display. In this case, in Step S43, when a projection region on which the subject is projected in the captured region is larger than the display region, out of the projection region, an image obtained by a portion exceeding the display region may not be displayed on the display. Here, for example, as illustrated in FIG. 273, the captured region and the projection region are the effective pixel region and the recognition region of the image sensor, respectively.

With this configuration, for example, as illustrated in FIG. 273, even if part of an image obtained from the projection region (recognition region in FIG. 273) is not displayed on the display when the imaging sensor approaches the still image that is the subject, the entire still image that is the subject may be projected on the captured region. Therefore, in this case, the still image that is the subject can be appropriately recognized, and the video can be appropriately superimposed on the target region corresponding to the subject in the captured image.

For example, horizontal and vertical widths of the display region are w1 and h1, respectively, and horizontal and vertical widths of the projection region are w2 and h2, respectively. In this case, in Step S43, when a larger value of h2/h1 and w2/w1 is equal to or greater than a predetermined value, the video may be displayed on an entire screen of the display, and when the larger value of h2/h1 and w2/w1 is less than the predetermined value, the video may be superimposed on the target region in the captured image and displayed on the display.

With this configuration, for example, as illustrated in FIG. 275, when the imaging sensor approaches the still image that is the subject, the video is displayed on the entire screen, and thus the user does not need to bring the imaging sensor closer to the still image and display the larger video. This prevents the user from bringing the imaging sensor too close to the still image and the projection region (recognition region in FIG. 275) from extending off the captured region (effective pixel region), which disables signal decoding.

The display method according to an aspect of the present disclosure may further include a control step of turning off, when the video is displayed on the entire screen of the display, operation of the imaging sensor.

With this configuration, for example, as illustrated in Step S314 of FIG. 276, power consumption of the imaging sensor can be reduced by turning off the operation of the imaging sensor.

In Step S43, when the target region becomes unrecognizable from the captured image due to movement of the imaging sensor, the video may be displayed in size identical to size of the target region recognized immediately before the target region becomes unrecognizable. Note that the target region being unrecognizable from the captured image is a situation in which, for example, at least part of the target region corresponding to the still image that is the subject is not included in the captured image. Thus, when the target region is unrecognizable, for example, as in the case of time t3 of FIG. 279, the video is displayed in size identical to size of the target region recognized immediately before. Therefore, this can prevent at least part of the video from not being displayed due to movement of the imaging sensor.

In Step S43, when only part of the target region is included in a region of the captured image displayed on the display due to the movement of the imaging sensor, part of a spatial region of the video corresponding to the part of the target region may be superimposed on the part of the target region and displayed on the display. Note that the part of the spatial region of the video is part of pictures that constitute the video.

With this configuration, for example, as in the case of time t2 of FIG. 277, only the part of the spatial region of the video (AR image in FIG. 277) is displayed on the display. As a result, the user can be notified of the imaging sensor not being appropriately directed to the still image that is the subject.

In Step S43, when the target region becomes unrecognizable from the captured image due to movement of the imaging sensor, the part of the spatial region of the video corresponding to the part of the target region may be continuously displayed, the part of the spatial region of the video being displayed immediately before the target region becomes unrecognizable.

With this configuration, for example, as in the case of time t3 of FIG. 277, even when the user directs the imaging sensor in a direction different from a direction of the still image that is the subject, the part of the spatial region of the video (AR image in FIG. 277) is displayed continuously. As a result, this allows the user to easily understand the direction of the imaging sensor that enables display of the entire video.

In Step S43, when horizontal and vertical widths in a captured region of the imaging sensor are w0 and h0, respectively, and horizontal and vertical distances between a projection region on which the subject is projected in the captured region and the captured region are dh and dw, respectively, it may be determined that the target region is unrecognizable when a smaller value of dw/w0 and dh/h0 is equal to or less than a predetermined value. Note that the projection region is, for example, the recognition region illustrated in FIG. 277. Alternatively, in Step S43, it may be determined that the target region is unrecognizable when an angle of view is equal to or less than a predetermined value, the angle of view corresponding to a shorter distance of horizontal and vertical distances between a projection region on which the subject is projected on a captured region of the imaging sensor and the captured region.

This allows appropriate determination whether the target region is recognizable.

FIG. 281B is a block diagram illustrating a configuration of a display device according to an aspect of the present disclosure.

A display device A10 according to an aspect of the present disclosure includes an imaging sensor A11, a decoder A12, and a display controller A13.

The imaging sensor A11 captures, as a subject, a still image lit up by a transmitter that transmits a signal by luminance change of light to obtain a captured image.

The decoder A12 decodes the signal from the captured image.

The display controller A13 reads video corresponding to the decoded signal from a memory and superimposes the video on a target region corresponding to the subject in the captured image for display on a display. Here, the display controller A13 sequentially displays, out of a plurality of images included in the video, the plurality of images from a leading image identical to the still image.

With this configuration, advantageous effects similar to effects of the above-described display method can be produced.

The imaging sensor A11 may include a plurality of micro mirrors and a photosensor, and the display device A10 may further include an imaging controller that controls the imaging sensor. In this case, the imaging controller specifies a region including the signal out of the captured image as a signal region, and controls an angle of each of the plurality of micro mirrors corresponding to the specified signal region. Then, the imaging controller causes the photosensor to receive only light reflected by each of the plurality of micro mirrors with the angle being controlled.

With this configuration, for example, as illustrated in FIG. 232A, even if a high-frequency component is included in a visible light signal that is a signal represented by luminance change of light, the high-frequency component can be decoded correctly.

It should be noted that in the above embodiments and variations, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. For example, the program causes a computer to execute the display method illustrated in the flowcharts of FIG. 271, FIG. 274, 276, and FIG. 281A.

Though the display method according to one or more aspects has been described by way of the embodiments and variations above, the present disclosure is not limited to these embodiments. Modifications obtained by applying various changes conceivable by those skilled in the art to the embodiments and any combinations of structural elements in different embodiments and variations may also be included in the scope of the present disclosure without departing from the scope of the present disclosure.

Variation 3 of Embodiment 23

Variation 3 of Embodiment 23, that is, Variation 3 of a display method for implementing AR using a light ID will be described below.

FIG. 282 is a diagram illustrating an example of enlargement and movement of an AR image.

As in Embodiment 23 or Variation 1 or 2 of Embodiment 23 described above, a receiver 200 superimposes an AR image P21 on a target region in a captured display image Ppre, as illustrated in (a) of FIG. 282. Then, the receiver 200 displays, on a display 201, the captured display image Ppre on which the AR image P21 is superimposed. For example, the AR image P21 is video.

Here, as illustrated in (b) of FIG. 282, upon receipt of an instruction of size change, the receiver 200 changes the size of the AR image P21 in response to the instruction. For example, upon receipt of an instruction of enlargement, the receiver 200 enlarges the AR image P21 in response to the instruction. The instruction of size change is performed, for example, by pinch operation, double tap, or long pressing onto the AR image P21 performed by a user. Specifically, upon receipt of the instruction of enlargement to be performed by pinch out, the receiver 200 enlarges the AR image P21 in response to the instruction. Conversely, upon receipt of an instruction of reduction to be performed by pinch in, the receiver 200 reduces the AR image P21 in response to the instruction.

As illustrated in (c) of FIG. 282, upon receipt of an instruction of position change, the receiver 200 changes the position of the AR image P21 in response to the instruction. The instruction of position change is performed, for example, by swipe or the like onto the AR image performed by a user. Specifically, upon receipt of the instruction of position change to be performed by swipe, the receiver 200 changes the position of the AR image P21 in response to the instruction. That is, the AR image P21 moves.

With this operation, enlargement of the AR image, which is video, can make the AR image easier to see, and reduction or movement of the AR image, which is video, allows a region hidden behind the AR image in the captured display image Ppre to be displayed to a user.

FIG. 283 is a diagram illustrating an example of enlargement of an AR image.

As in Embodiment 23 or Variation 1 or 2 of Embodiment 23 described above, a receiver 200 superimposes an AR image P22 on a target region in a captured display image Ppre, as illustrated in (a) of FIG. 283. Then, the receiver 200 displays, on a display 201, the captured display image Ppre on which the AR image P22 is superimposed. For example, the AR image P22 is a still image in which a character string is written.

Here, as illustrated in (b) of FIG. 283, upon receipt of an instruction of size change, the receiver 200 changes the size of the AR image P22 in response to the instruction. For example, upon receipt of an instruction of enlargement, the receiver 200 enlarges the AR image P22 in response to the instruction. The instruction of size change is performed, for example, by pinch operation, double tap, or long pressing onto the AR image P22 by a user, as in the above-described case. Specifically, upon receipt of the instruction of enlargement to be performed by pinch out, the receiver 200 enlarges the AR image P22 in response to the instruction. The enlargement of the AR image P22 can make the character string written in the AR image P22 easy to read for a user.

As illustrated in (c) of FIG. 283, upon receipt of a further instruction of size change, the receiver 200 changes the size of the AR image P22 in response to the instruction. For example, upon receipt of a further instruction of enlargement, the receiver 200 further enlarges the AR image P22 in response to the instruction. The enlargement of the AR image P22 can make the character string written in the AR image P22 easier to read for a user.

Note that in the case where magnification of the AR image in response to the instruction of enlargement is equal to or greater than a threshold upon receipt of the instruction, the receiver 200 may obtain a high-resolution AR image. In this case, instead of the already displayed original AR image, the receiver 200 may enlarge and display the high-resolution AR image to the magnification. For example, the receiver 200 displays a 1920×1080-pixel AR image instead of a 640×480-pixel AR image. With this operation, the AR image can be enlarged such that the AR image appears to be actually captured as a subject, and the high-resolution image that cannot be obtained by optical zoom can be displayed.

FIG. 284 is a flowchart illustrating an example of processing operation regarding enlargement and movement of an AR image by a receiver 200.

First, as in Step S101 illustrated in the flowchart of FIG. 239, the receiver 200 starts imaging for a normal exposure time and an exposure time for communication (Step S401). When this imaging starts, a captured display image Ppre for the normal exposure time and an image for decoding (that is, bright line image) Pdec for the exposure time for communication are obtained periodically. Then, the receiver 200 decodes the image for decoding Pdec to obtain a light ID.

Next, the receiver 200 performs AR image superimposition processing including processing of Steps S102 to S106 illustrated in the flowchart of FIG. 239 (Step S402). When this AR image superimposition processing is performed, the AR image is superimposed on the captured display image Ppre and displayed. At this time, the receiver 200 decreases a light ID obtainment rate (Step S403). The light ID obtainment rate is a proportion of a number of images for decoding (that is, bright line images) Pdec in a number of captured images per unit time obtained through imaging started in Step S401. For example, when the light ID obtainment rate decreases, the number of images for decoding Pdec obtained per unit time becomes smaller than the number of captured display images Ppre obtained per unit time.

Next, the receiver 200 determines whether the instruction of size change has been received (Step S404). When it is determined here that the instruction of size change has been received (Step S404: Y), the receiver 200 further determines whether the instruction of size change is an instruction of enlargement (Step S405). When it is determined that the instruction of size change is the instruction of enlargement (Step S405: Y), the receiver 200 further determines whether it is necessary to obtain the AR image again (Step S406). For example, in the case where it is determined that magnification of the AR image in response to the instruction of enlargement is equal to or greater than a threshold, the receiver 200 determines that it is necessary to obtain the AR image again. Here, when it is determined that it is necessary to obtain the AR image again (Step S406: Y), the receiver 200 obtains a high-resolution AR image, for example, from a server, and replaces the superimposed and displayed AR image with the high-resolution AR image (Step S407).

Then, the receiver 200 changes the size of the AR image in response to the received instruction of size change (Step S408). That is, in the case where the high-resolution AR image is obtained in Step S407, the receiver 200 enlarges the high-resolution AR image. When it is determined in Step S406 that it is unnecessary to obtain the AR image again (Step S406: N), the receiver 200 enlarges the superimposed AR image. When it is determined in Step S405 that the instruction of size change is an instruction of reduction (Step S405: N), the receiver 200 reduces the superimposed and displayed AR image in response to the received instruction of size change, that is, instruction of reduction.

On the other hand, when it is determined in Step S404 that the instruction of size change has not been received (Step S404: N), the receiver 200 determines whether the instruction of position change has been received (Step S409). When it is determined here that the instruction of position change has been received (Step S409: Y), the receiver 200 changes the position of the superimposed and displayed AR image in response to the instruction of position change (Step S410). That is, the receiver 200 moves the AR image. On the other hand, when it is determined that the instruction of position change has not been received (Step S409: N), the receiver 200 repeatedly executes processing from Step S404.

When the size of the AR image is changed in Step S408, or when the position of the AR image is changed in Step S410, the receiver 200 determines whether the light ID periodically obtained from Step S401 is no longer obtained (Step S411). When it is determined here that the light ID is no longer obtained (Step S411: Y), the receiver 200 ends processing operation regarding enlargement and movement of the AR image. On the other hand, when it is determined that the light ID is still being obtained (Step S411: N), the receiver 200 repeatedly executes processing from Step S404.

FIG. 285 is a diagram illustrating an example of superimposition of an AR image by a receiver 200.

As described above, the receiver 200 superimposes an AR image P23 on a target region in a captured display image Ppre. Here, as illustrated in FIG. 285, the AR image P23 is configured such that, as each part of the AR image P23 is closer to an end of the AR image P23, transmittance in the part increases. Transmittance is a degree to which a target region is displayed through a superimposed image. For example, transmittance of the entire AR image of 100% means that, even if the AR image is superimposed on the target region in the captured display image, the AR image is not displayed and only the target region is displayed on the display 201. Conversely, transmittance of the entire AR image of 0% means that the target region in the captured display image is not displayed and only the AR image superimposed on the target region is displayed on the display 201.

For example, in the case where the AR image P23 is rectangular, transmittance in each part of the AR image P23 increases as the part is closer to an upper end, lower end, left end, or right end of the rectangle. More specifically, transmittance in these ends is 100%. There is a rectangular region with transmittance of 0% in a central portion of the AR image P23. The rectangular region is smaller than the AR image P23. In the rectangular region, for example, “Kyoto Station” is written in English. In other words, in a peripheral portion of the AR image P23, transmittance changes step by step from 0% to 100% like gradation.

The receiver 200 superimposes such an AR image P23 on the target region in the captured display image Ppre, as illustrated in FIG. 285. At this time, the receiver 200 resizes the AR image P23 to the size of the target region, and then superimposes the resized AR image P23 on the target region. For example, in the target region, there appears an image of a station name sign with the same background color as the rectangular region in the central portion of the AR image P23. Note that “Kyoto” is written in Japanese in the station name sign.

Here, as described above, transmittance in each part of the AR image P23 increases as the part is closer to an end of the AR image P23. Therefore, when the AR image P23 is superimposed on the target region, although the rectangular region in the central portion of the AR image P23 is displayed, an end of the AR image P23 is not displayed, and an end of the target region, that is, an end of the image of the station name sign is displayed.

This can make misalignment between the AR image P23 and the target region less conspicuous. That is, even if the AR image P23 is superimposed on the target region, movement of the receiver 200 or the like may cause misalignment between the AR image P23 and the target region. In this case, if transmittance of the entire AR image P23 is 0%, the end of the AR image P23 and the end of the target region are displayed, and misalignment therebetween will be conspicuous. However, in the AR image P23 in this variation, since transmittance of a part increases as the part is closer to the end, the end of the AR image P23 can be made hard to be displayed, and as a result, misalignment between the AR image P23 and the target region can be made less conspicuous. Moreover, since transmittance changes like gradation in the peripheral portion of the AR image P23, the AR image P23 being superimposed on the target region can be made less conspicuous.

FIG. 286 is a diagram illustrating an example of superimposition of an AR image by a receiver 200.

As described above, the receiver 200 superimposes an AR image P24 on a target region in a captured display image Ppre. Here, as illustrated in FIG. 286, a subject to be captured is, for example, a menu of a restaurant. This menu is enclosed in a white frame, and the white frame is further enclosed in a black frame. That is, the subject includes the menu, the white frame enclosing the menu, and the black frame enclosing the white frame.

The receiver 200 recognizes, as a target region, a region larger than an image of the white frame and smaller than an image of the black frame in the captured display image Ppre. Then, the receiver 200 resizes the AR image P24 to the size of the target region, and superimposes the resized AR image P24 on the target region.

With this configuration, even in the case where the superimposed AR image P24 is misaligned from the target region due to movement of the receiver 200 or the like, the AR image P24 can be continuously displayed with the AR image P24 being enclosed in the black frame. Therefore, misalignment between the AR image P24 and the target region can be made less conspicuous.

Note that in the example illustrated in FIG. 286, color of the frame is black or white, but the color of the frame is not limited to these colors but may be any color.

FIG. 287 is a diagram illustrating an example of superimposition of an AR image by a receiver 200.

For example, the receiver 200 captures, as a subject, a poster in which a castle lit up in the night sky is drawn. For example, this poster is illuminated by the transmitter 100 configured as a back light, and transmits a visible light signal (that is, light ID) by the back light. By capturing the poster, the receiver 200 obtains a captured display image Ppre including an image of the subject, which is the poster, and an AR image P25 corresponding to the light ID. Here, the AR image P25 has a shape identical to the image of the poster with a region on which the castle is drawn being taken out. That is, the region corresponding to the castle in the image of the poster in the AR image P25 is masked. Moreover, as in the AR image P23, the AR image P25 is configured such that, as each part of the AR image P25 is closer to an end of the AR image P25, transmittance in the part increases. In addition, fireworks set off in the night sky are displayed as video in a central portion of the AR image P25 where transmittance is 0%.

The receiver 200 resizes the size of such an AR image P25 to the size of the target region, which is the image of the subject, and superimposes the resized AR image P25 on the target region. As a result, the castle drawn on the poster is displayed not as an AR image but as the image of the subject, and video of fireworks is further displayed as an AR image.

With this configuration, the captured display image Ppre can be displayed such that fireworks appear to be actually set off in the poster. Transmittance in each part of the AR image P25 increases as the part is closer to an end of the AR image P25. Therefore, when the AR image P25 is superimposed on the target region, although the central portion of the AR image P25 is displayed, the end of the AR image P25 is not displayed, and the end of the target region is displayed. As a result, misalignment between the AR image P25 and the target region can be made less conspicuous. Moreover, since transmittance changes like gradation in a peripheral portion of the AR image P25, the AR image P25 being superimposed on the target region can be made less conspicuous.

FIG. 288 is a diagram illustrating an example of superimposition of an AR image by a receiver 200.

For example, the receiver 200 captures, as a subject, a transmitter 100 configured as a television. Specifically, this transmitter 100 displays, on a display, a castle lit up in the night sky and transmits a visible light signal (that is, light ID). By capturing the transmitter 100, the receiver 200 obtains a captured display image Ppre in which the transmitter 100 is shown, and an AR image P26 corresponding to the light ID. Here, the receiver 200 first displays the captured display image Ppre on a display 201. At this time, the receiver 200 also displays, on the display 201, a message m prompting a user to turn off light. Specifically, the message m is, for example, "turn off room illumination and darken the room."

When display of this message m causes the user to turn off light and darken the room in which the transmitter 100 is installed, the receiver 200 superimposes the AR image P26 on the captured display image Ppre and displays a resultant image. Here, the AR image P26 is identical to the captured display image Ppre in size, and a region corresponding to the castle of the captured display image Ppre in the AR image P26 is hollowed out. That is, the region corresponding to the castle of the captured display image Ppre in the AR image P26 is masked. Therefore, through the region, the castle of the captured display image Ppre can be shown to the user. As in the above-described case, transmittance may change step by step from 0% to 100% like gradation in a peripheral portion of the region in the AR image P26. In this case, misalignment between the captured display image Ppre and the AR image P26 can be made less conspicuous.

In the above example, superimposition of the AR image with high transmittance in the peripheral portion on the target region in the captured display image Ppre makes misalignment between the AR image and the target region less conspicuous. However, instead of such an AR image, an AR image identical to the captured display image Ppre in size may be superimposed on the captured display image Ppre, the whole AR image being translucent (that is, transmittance is 50%). Even in this case, misalignment between the AR image and the target region can be made less conspicuous. In the case where the captured display image Ppre is bright on the whole, an AR image with uniformly low transparency may be superimposed on the captured display image Ppre. Conversely, in the case where the captured display image Ppre is dark on the whole, an AR image with uniformly high transparency may be superimposed on the captured display image Ppre.

Note that an object such as fireworks in the AR image P25 and the AR image P26 may be represented by computer graphics (CG). This eliminates the need for masking. In the example illustrated in FIG. 288, the receiver 200 displays the message m to prompt a user to turn off light; however, the receiver 200 may turn off light automatically, without performing such a display. For example, the receiver 200 outputs a lights-out signal to an illumination device in which the transmitter 100 is set that is a television, by Bluetooth®, ZigBee, specified low power radio station, or the like. This causes the illumination device to be automatically turned off.

FIG. 289A is a diagram illustrating an example of a captured display image Ppre obtained through imaging by a receiver 200.

For example, a transmitter 100 is configured as a large display installed in a stadium. The transmitter 100 displays, for example, a message indicating that fast food and drink can be ordered by a light ID, and transmits a visible light signal (that is, light ID). When such a message is displayed, a user aims the receiver 200 at the transmitter 100 and captures the transmitter 100. That is, the receiver 200 captures, as a subject, the transmitter 100 configured as the large display installed in the stadium.

By capturing the transmitter 100, the receiver 200 obtains a captured display image Ppre and an image for decoding Pdec. Then, by decoding the image for decoding Pdec, the receiver 200 obtains the light ID and transmits the light ID and the captured display image Ppre to a server.

For each light ID, from installation information associated with the light ID, the server specifies installation information of the captured large display associated with the light ID transmitted from the receiver 200. For example, the installation information indicates a position and direction in which the large display is installed, a size of the large display, and the like. Moreover, based on the size and direction of the large display shown in the captured display image Ppre and the installation information of the large display, the server specifies a number of a seat where the captured display image Ppre is captured in the stadium. Then, the server displays, on the receiver 200, a menu screen including the seat number.

FIG. 289B is a diagram illustrating an example of a menu screen displayed on a display 201 of a receiver 200.

A menu screen m1 includes, for example, for each type of product, an entry field mal into which order quantity of the product is input, a seat field mb1 in which a seat number in a stadium specified by a server is indicated, and an order button mc1. A user operates the receiver 200 to input the order quantity of the desired product into the entry field mal corresponding to the product, and selects the order button mc1. With this operation, the order is decided and the receiver 200 transmits details of the order according to an input result to a server.

Upon receipt of the details of the order, the server instructs a staff member of the stadium to deliver the product of the order quantity according to the details of the order to the seat number specified as described above.

FIG. 290 is a flowchart illustrating an example of processing operation of a receiver 200 and a server.

The receiver 200 first captures a transmitter 100 configured as a large display of a stadium (Step S421). The receiver 200 decodes an image for decoding Pdec obtained by capturing the transmitter 100 to obtain a light ID transmitted from the transmitter 100 (Step S422). The receiver 200 transmits, to a server, the light ID obtained in Step S422 and a captured display image Ppre obtained by capturing the transmitter 100 in Step S421 (Step S423).

Upon receipt of the light ID and the captured display image Ppre (Step S424), based on the light ID, the server specifies installation information of the large display installed in the stadium (Step S425). For example, for each light ID, the server holds a table indicating the installation information of the large display associated with the light ID, and searches the table for the installation information associated with the light ID transmitted from the receiver 200 to specify the installation information.

Next, based on the specified installation information and a size and direction of the large display shown in the captured display image Ppre, the server specifies a seat number where the captured display image Ppre is obtained (that is, captured) in the stadium (Step S426). Then, the server transmits uniform resource locator (URL) of the menu screen m1 including the specified seat number to the receiver 200 (Step S427).

Upon receipt of the URL of the menu screen m1 transmitted from the server (Step S428), the receiver 200 accesses the URL and displays the menu screen m1 (Step S429). Here, the user operates the receiver 200 to input details of the order into the menu screen m1, and selects the order button mc1 to decide the order. This causes the receiver 200 to transmit the details of the order to the server (Step S430).

Upon receipt of the details of the order transmitted from the receiver 200, the server performs order receipt processing according to the details of the order (Step S431). At this time, for example, the server instructs a staff member of the stadium to deliver the order quantity of the product according to the details of the order to the seat number specified in Step S426.

Thus, since the seat number is specified based on the captured display image Ppre obtained through imaging performed by the receiver 200, the user of the receiver 200 does not need to take the trouble to input the seat number when placing an order for the product. Therefore, the user can omit input of the seat number and easily place an order for the product.

Note that in the above example, the server has specified the seat number; however, the receiver 200 may specify the seat number. In this case, the receiver 200 obtains the installation information from the server, and based on the installation information and the size and direction of the large display shown in the captured display image Ppre, the receiver 200 specifies the seat number.

FIG. 291 is a diagram for describing volume of sound reproduced by a receiver 1800*a*.

The receiver 1800*a* receives a light ID (visible light signal) transmitted from, for example, a transmitter 1800*b* configured as a street digital signage, as in the example illustrated in FIG. 123. Then, the receiver 1800*a* reproduces sound at the same timing as image reproduction by the transmitter 1800*b*. In other words, the receiver 1800*a* reproduces sound in synchronization with the image reproduced by the transmitter 1800*b*. Note that the receiver 1800*a* may reproduce, together with the sound, an image identical to the image reproduced by the transmitter 1800*b* (reproduced image), or an AR image related to the reproduced image (AR video).

Here, when reproducing the sound as described above, the receiver 1800*a* adjusts volume of the sound according to a distance to the transmitter 1800*b*. Specifically, as the distance to the transmitter 1800*b* increases, the receiver 1800*a* adjusts the volume lower. Conversely, as the distance to the transmitter 1800*b* decreases, the receiver 1800*a* adjusts the volume higher.

The receiver 1800*a* may specify the distance to the transmitter 1800*b* by using the global positioning system (GPS) or the like. Specifically, the receiver 1800*a* obtains, from the server or the like, positional information on the transmitter 1800*b* associated with the light ID, and further specifies the position of the receiver 1800*a* by GPS. Then, as the distance to the transmitter 1800*b*, the receiver 1800*a* specifies the distance between the position of the transmitter 1800*b* indicated by the positional information obtained from the server, and the specified position of the receiver 1800*a*. Note that instead of GPS, the receiver 1800*a* may specify the distance to the transmitter 1800*b* by using Bluetooth® or the like.

Alternatively, the receiver 1800*a* may specify the distance to the transmitter 1800*b* based on a size of the bright line pattern region in the image for decoding Pdec obtained through imaging. As in the examples illustrated in FIG. 245 and FIG. 246, the bright line pattern region is a region including a plurality of bright line patterns that appear by exposure, for an exposure time for communication, of a plurality of exposure lines included in the image sensor of the receiver 1800*a*. This bright line pattern region corresponds to a region in a display of the transmitter 1800*b* shown on the captured display image Ppre. Specifically, as the bright line pattern region is larger, the receiver 1800*a* specifies a shorter distance as the distance to the transmitter 1800*b*. Conversely, as the bright line pattern region is smaller, the receiver 1800*a* specifies a longer distance as the distance to the transmitter 1800*b*. Alternatively, the receiver 1800*a* may use distance data indicating a relationship between the size and the distance of the bright line pattern region, and in the distance data, the receiver 1800*a* may specify a distance associated with the size of the bright line pattern region in the captured display image Ppre as the distance to the transmitter 1800*b*. Note that the receiver 1800*a* may transmit the light ID received as described above to a server, and may obtain the distance data associated with the light ID from the server.

Thus, since the volume is adjusted according to the distance to the transmitter 1800*b*, a user of the receiver 1800*a* can hear the sound reproduced by the receiver 1800*a* such that the sound appears to be actually reproduced by the transmitter 1800*b*.

FIG. 292 is a diagram illustrating a relationship between a distance from a receiver 1800*a* to a transmitter 1800*b*, and volume.

For example, while the distance to the transmitter 1800*b* ranges from L1 [m] to L2 [m], the volume increases or decreases in proportion to the distance in a range from Vmin [dB] to Vmax [dB]. Specifically, when the distance to the transmitter 1800*b* increases from L1 [m] to L2 [m], the receiver 1800*a* decreases the volume linearly from Vmax [dB] to Vmin [dB]. Even if the distance to the transmitter 1800*b* becomes shorter than L1 [m], the receiver 1800*a* maintains the volume at Vmax [dB], and even if the distance to the transmitter 1800*b* becomes longer than L2 [m], the receiver 1800*a* maintains the volume at Vmin [dB].

Thus, the receiver 1800*a* stores maximum volume Vmax, a shortest distance L1 at which sound of the maximum volume Vmax is output, minimum volume Vmin, and a longest distance L2 at which sound of the minimum sound volume Vmin is output. Also, the receiver 1800*a* may change the maximum volume Vmax, minimum volume Vmin, shortest distance L1, and longest distance L2 depending on an attribute set in the receiver 1800*a*. For example, in the case where the attribute is user's age and the age indicates an advanced age, the receiver 1800*a* may make the maximum volume Vmax higher than reference maximum volume, and may make the minimum volume Vmin higher than reference minimum volume. Also, the attribute may be information indicating whether sound is output from a speaker or an earphone.

Thus, since the minimum volume Vmin is set in the receiver 1800*a*, it is possible to prevent a state in which sound cannot be heard because the receiver 1800*a* is too far from the transmitter 1800*b*. Moreover, since the maximum volume Vmax is set in the receiver 1800*a*, it is possible to prevent a state in which sound of volume higher than necessary is output because the receiver 1800*a* is too near to the transmitter 1800*b*.

FIG. 293 is a diagram illustrating an example of superimposition of an AR image by a receiver 200.

The receiver 200 captures a lit-up signboard. Here, the signboard is lit up by an illumination device that is the transmitter 100 transmitting a light ID. Therefore, by capturing the signboard, the receiver 200 obtains a captured display image Ppre and an image for decoding Pdec. Then, the receiver 200 decodes the image for decoding Pdec to obtain the light ID, and obtains, from a server, a plurality of AR images P27*a* to P27*c* and recognition information associated with the light ID. Based on the recognition information, the receiver 200 recognizes, as a target region, surroundings of a region m2 in which the signboard is shown in the captured display image Ppre.

Specifically, as illustrated in (a) of FIG. 293, the receiver 200 recognizes a region adjacent to a left side of the region m2 as a first target region, and the receiver 200 superimposes the AR image P27*a* on the first target region.

Next, as illustrated in (b) of FIG. 293, the receiver 200 recognizes a region including a lower side of the region m2 as a second target region, and the receiver 200 superimposes the AR image P27*b* on the second target region.

Next, as illustrated in (c) of FIG. 293, the receiver 200 recognizes a region adjacent to an upper side of the region m2 as a third target region, and the receiver 200 superimposes the AR image P27*c* on the third target region.

Here, each of the AR images P27*a* to P27*c* may be an image of an abominable snowman's character, for example, and may be video.

While obtaining the light ID continuously and repeatedly, the receiver 200 may switch a target region to be recognized to any one of the first to third target regions in order and at timing determined in advance. That is, the receiver 200 may switch the target region to be recognized in order of the first target region, the second target region, and the third target region. Alternatively, every time the receiver 200 obtains the light ID, the receiver 200 may switch the target region to be recognized to any one of the first to third target regions in order determined in advance. In other words, the receiver 200 first obtains the light ID, and while obtaining the light ID continuously and repeatedly, as illustrated in (a) of FIG. 293, the receiver 200 recognizes the first target region and superimposes the AR image P27*a* on the first target region. Then, when the receiver 200 cannot obtain the light ID any more, the receiver 200 hides the AR image P27*a*. Next, when the receiver 200 obtains the light ID again, while obtaining the light ID continuously and repeatedly, as illustrated in (b) of FIG. 293, the receiver 200 recognizes the second target region and superimposes the AR image P27*b* on the second target region. Then, when the receiver 200 cannot obtain the light ID any more again, the receiver 200 hides the AR image P27*b*. Next, when the receiver 200 obtains the light ID again, while obtaining the light ID continuously and repeatedly, as illustrated in (c) of FIG. 293, the receiver 200 recognizes the third target region and superimposes the AR image P27*c* on the third target region.

Thus, in the case where the receiver 200 switches the target region to be recognized every time the receiver 200 obtains the light ID, the receiver 200 may change color of the AR image to be displayed at a frequency of once in N times (N is an integer greater than or equal to 2). N times is a number of times the AR image is displayed, and for example, N times may be 200 times. More specifically, while the AR images P27*a* to P27*c* are all images of the same white character, for example, an AR image of a pink character is displayed once in 200 times. While the AR image of the pink character is displayed, when the receiver 200 receives operation on the AR image by a user, the receiver 200 may grant a point to the user.

Thus, by switching the target region on which the AR image is superimposed, or by changing color of the AR image at a predetermined frequency, capturing the signboard lit up by the transmitter 100 can attract user's interest and cause the user to repeatedly obtain the light ID.

FIG. 294 is a diagram illustrating an example of superimposition of an AR image by a receiver 200.

The receiver 200 has a function of, as so-called Way Finder, for example, capturing a mark M4 drawn on a floor at a position where a plurality of passages intersect within a building to present a route along which a user should travel. The building is, for example, a hotel, and the route presented is a route along which a user who has checked in goes to his or her room.

The mark M4 is lit up by an illumination device, which is the transmitter 100 transmitting a light ID by luminance change. Therefore, the receiver 200 captures the mark M4 to obtain a captured display image Ppre and an image for decoding Pdec. Then, the receiver 200 decodes the image for decoding Pdec to obtain the light ID, and transmits the light ID and terminal information of the receiver 200 to a server. The receiver 200 obtains, from the server, a plurality of AR images P28 and recognition information associated with the light ID and the terminal information. Note that, when the user checks in, the light ID and the terminal information are associated with the plurality of AR images P28 and the recognition information, and stored in the server.

Based on the recognition information, the receiver 200 recognizes a plurality of target regions in surroundings of a region m4 in which the mark M4 is shown in the captured display image Ppre. Then, as illustrated in FIG. 294, the receiver 200 superimposes and displays, for example, such an AR image P28 as an animal footprint on each of the plurality of target regions.

Specifically, the recognition information indicates a route that turns to the right at a position of the mark M4. Based on such recognition information, the receiver 200 specifies the route in the captured display image Ppre, and recognizes the plurality of target regions arranged along the route. This route is a route that goes to the region m4 from a lower portion of a display 201, and turns to the right at the region m4. The receiver 200 places the AR image P28 at each of the plurality of recognized target regions such that it appears that an animal has walked along the route.

Here, when specifying the route in the captured display image Ppre, the receiver 200 may use geomagnetism detected by a 9-axis sensor included in the receiver 200. In this case, the recognition information indicates a direction to go at the position of the mark M4 based on a direction of geomagnetism. For example, the recognition information indicates the west as the direction to go at the position of the mark M4. Based on such recognition information, the receiver 200 specifies a route that goes to the region m4 from the lower portion of the display 201 and goes to the west at the region m4 in the captured display image Ppre. Then, the receiver 200 recognizes the plurality of target regions arranged along the route. Note that the receiver 200 specifies the lower portion of the display 201 by detection of gravitational acceleration by the 9-axis sensor.

Thus, since the user's route is presented by the receiver 200, the user can easily reach a destination when advancing along the route. Also, since the route is displayed as the AR image in the captured display image Ppre, the route can be presented plainly to the user.

Note that by illuminating the mark M4 with short-pulse light, the illumination device, which is the transmitter 100, can appropriately transmit the light ID while controlling brightness. While the receiver 200 has captured the mark M4, the receiver 200 may capture the illumination device by using a camera disposed on a display 201 side (so-called selfie camera). The receiver 200 may also capture both the mark M4 and the illumination device.

FIG. 295 is a diagram for describing an example of how to calculate a line scanning time by a receiver 200.

When decoding an image for decoding Pdec, the receiver 200 uses a line scanning time for decoding. This line scanning time is a time after exposure of one exposure line included in an image sensor is started until exposure of a next exposure line is started. When this line scanning time is known, the receiver 200 uses the known line scanning time to decode the image for decoding Pdec. However, when the line scanning time is unknown, the receiver 200 calculates the line scanning time from the image for decoding Pdec.

For example, as illustrated in FIG. 295, the receiver 200 finds out a minimum-width line from among a plurality of bright lines and a plurality of dark lines that constitute bright line patterns in the image for decoding Pdec. Note that each bright line is a line on the image for decoding Pdec generated by each of one or more sequential exposure lines being exposed when luminance of the transmitter 100 is high. Meanwhile, each dark line is a line on the image for decoding Pdec generated by each of one or more sequential exposure lines being exposed when luminance of the transmitter 100 is low.

The receiver 200 specifies, when the minimum-width line is found, a number of lines, that is, a number of pixels of exposure lines corresponding to the minimum-width line. In the case where a carrier frequency at which the transmitter 100 changes in luminance for transmitting the light ID is 9.6 kHz, a time when luminance of the transmitter 100 is high or low is 104 μs at the shortest. Therefore, the receiver 200 divides 104 μs by the specified minimum-width number of pixels to calculate the line scanning time.

FIG. 296 is a diagram for describing an example of how to calculate a line scanning time by a receiver 200.

The receiver 200 may perform Fourier transform on a bright line pattern of an image for decoding Pdec and then calculate the line scanning time based on a spatial frequency obtained by the Fourier transform.

For example, as illustrated in FIG. 296, by the Fourier transform, the receiver 200 derives a spectrum indicating a relationship between the spatial frequency and intensity of a component of the spatial frequency in the image for decoding Pdec. Next, the receiver 200 sequentially selects each of a plurality of peaks indicated in the spectrum. Then, every time the receiver 200 selects the peak, the receiver 200 calculates the line scanning time in which the spatial frequency of the selected peak (e.g., spatial frequency f2 in FIG. 296) is obtained by a temporal frequency of 9.6 kHz as a line scanning time candidate. The frequency of 9.6 kHz is a carrier frequency of luminance change of the transmitter 100 as described above. With this, a plurality of line scanning time candidates is calculated. The receiver 200 selects a candidate of the maximum likelihood from among the plurality of line scanning time candidates as a line scanning time.

In order to select the maximum likelihood candidate, the receiver 200 calculates an allowable range of the line scanning time based on a frame rate in imaging and the number of exposure lines included in an image sensor. That is, the receiver 200 calculates a maximum value of the line scanning time by $1\times10^6$ [μs]/{(frame rate)×(number of exposure lines)}. Then, the receiver 200 determines a range from the maximum value x constant K (K<1) to the maximum value as the allowable range of the line scanning time. The constant K is, for example, 0.9 or 0.8.

The receiver 200 selects a candidate in this allowable range out of the plurality of line scanning time candidates as the maximum likelihood candidate, that is, the line scanning time.

Note that the receiver 200 may evaluate reliability of the calculated line scanning time depending on whether the line scanning time calculated in the example illustrated in FIG. 295 is within the allowable range.

FIG. 297 is a flowchart illustrating an example of how to calculate a line scanning time by a receiver 200.

The receiver 200 may calculate the line scanning time by attempting decoding of an image for decoding Pdec. Specifically, first, the receiver 200 starts imaging (Step S441). Next, the receiver 200 determines whether the line scanning time is known (Step S442). For example, the receiver 200 may notify a server of a type and model number of the receiver 200 and inquire about the line scanning time according to the type and model number to determine whether the line scanning time is known. Here, when it is determined that the line scanning time is known (Step S442: Y), the receiver 200 sets a number of times of reference obtainment of a light ID to n (n is an integer greater than or equal to 2, for example, n is 4) (Step S443). Next, the receiver 200 decodes the image for decoding Pdec by using the known line scanning time to obtain the light ID (Step S444). At this time, the receiver 200 decodes each of the plurality of images for decoding Pdec obtained sequentially by imaging started in Step S441 to obtain the plurality of light IDs. Here, the receiver 200 determines whether the number of times of reference obtainment (that is, n times) of the same light ID has been obtained (Step S445). When it is determined that n times has been obtained (Step S445: Y), the receiver 200 trusts the light ID, and starts processing using the light ID (e.g., superimposition of AR image) (Step S446). On the other hand, when it is determined that n times has not been obtained (Step S445: N), the receiver 200 does not trust the light ID and ends processing.

When it is determined in Step S442 that the line scanning time is unknown (Step S442: N), the receiver 200 sets the number of times of reference obtainment of the light ID to n+k (k is an integer greater than or equal to 1) (Step S447). In other words, when the line scanning time is unknown, the receiver 200 sets a larger number of times of reference obtainment than when the line scanning time is known. Next, the receiver 200 determines a provisional line scanning time (Step S448). Then, the receiver 200 decodes the image for decoding Pdec by using the provisional line scanning time to obtain the light ID (Step S449). At this time, as described above, the receiver 200 decodes each of the plurality of images for decoding Pdec obtained sequentially through imaging started in Step S441 to obtain the plurality of light IDs. Here, the receiver 200 determines whether the number of times of reference obtainment of the same light ID (that is, (n+k) times) has been obtained (Step S450).

When it is determined that (n+k) times has been obtained (Step S450: Y), the receiver 200 determines that the provisional line scanning time is a correct line scanning time. Then, the receiver 200 notifies the server of the type and model number of the receiver 200, and the line scanning time (Step S451). This causes the server to associate the type and model number of the receiver with the line scanning time suitable for the receiver, and to store the type and model number of the receiver and the line scanning time. Therefore, in the case where a different receiver of the same type and model number starts imaging, the different receiver can specify the line scanning time of the other receiver by inquiring of the server. That is, in determination in Step S442, the different receiver can determine that the line scanning time is known.

Then, the receiver 200 trusts the light ID obtained (n+k) times, and starts processing using the light ID (e.g. superimposition of AR image) (Step S446).

On the other hand, when it is determined in Step S450 that (n+k) times of the same light ID has not been obtained (Step S450: N), the receiver 200 further determines whether a termination condition is satisfied (Step S452). The termination condition is, for example, that a time determined in advance has elapsed from imaging start, and that the light ID has been obtained more times than the maximum number of times of obtainment. When it is determined that such a termination condition is satisfied (Step S452: Y), the receiver 200 ends processing. On the other hand, when it is determined that the termination condition is not satisfied (Step S452: N), the receiver 200 changes the provisional line scanning time (Step S453). Then, the receiver 200 repeatedly executes processing from Step S449 using the changed provisional line scanning time.

Thus, even if the line scanning time is unknown, the receiver 200 can calculate the line scanning time, as in the examples illustrated in FIG. 295 to FIG. 297. This allows the receiver 200, regardless of the type and model number of the receiver 200, to appropriately decode the image for decoding Pdec and to obtain the light ID.

FIG. 298 is a diagram illustrating an example of superimposition of an AR image by a receiver 200.

The receiver 200 captures a transmitter 100 configured as a television. For example, this transmitter 100 changes in luminance while displaying a TV program to periodically transmit a light ID and a time code. The time code is information indicating, every time the time code is transmitted, a time of the transmission, and may be, for example, a time packet illustrated in FIG. 126.

Through the imaging, the receiver 200 periodically obtains a captured display image Ppre and an image for decoding Pdec. Then, while displaying the periodically obtained captured display image Ppre on a display 201, the receiver 200 decodes the image for decoding Pdec to obtain the light ID and the time code. Next, the receiver 200 transmits the light ID to a server 300. Upon receipt of the light ID, the server 300 transmits, to the receiver 200, sound data, AR start time information, an AR image P29, and recognition information associated with the light ID.

When the sound data is obtained, the receiver 200 reproduces the sound data in synchronization with video of a TV program shown on the transmitter 100. That is, the sound data includes a plurality of pieces of sound unit data, and time codes are included in this plurality of pieces of sound unit data. Out of the sound data, the receiver 200 starts reproduction of a plurality of pieces of sound unit data from the sound unit data including a time code indicating the same time as the time code obtained from the transmitter 100 together with the light ID. This causes reproduction of the sound data to be synchronized with the video of the TV program. Note that such synchronization of sound with video may be performed by a method similar to sound synchronous reproduction illustrated in each figure after FIG. 123.

When the AR image P29 and the recognition information are obtained, the receiver 200 recognizes, as a target region, a region corresponding to the recognition information in the captured display image Ppre, and superimposes the AR image P29 on the target region. For example, the AR image P29 is an image indicating a crack of the display 201 of the receiver 200, and the target region is a region that goes across an image of the transmitter 100 in the captured display image Ppre.

Here, the receiver 200 displays the captured display image Ppre on which the AR image P29 is superimposed as described above at timing according to the AR start time information. The AR start time information is information indicating a time when the AR image P29 is displayed. That is, the receiver 200 displays the captured display image Ppre on which the AR image P29 is superimposed at timing at which the time code indicating the same time as the AR start time information is received, out of the time codes transmitted when needed from the transmitter 100. For example, the time indicated by the AR start time information is a time when a scene appears in a TV program in which a magician girl uses ice magic. Also, at this time, the receiver 200 may output sound of the crack of the AR image P29 from a speaker of the receiver 200 by reproducing the sound data. This allows the user to view the scene of the TV program with more realism.

Also, at the time indicated by the AR start time information, the receiver 200 may vibrate a vibrator included in the receiver 200, may cause a light source to emit light as a flash, and may cause the display 201 to be bright or blink instantaneously. Also, the AR image P29 may include not only an image indicating the crack but also an image indicating condensation of the display 201 being frozen.

FIG. 299 is a diagram illustrating an example of superimposition of an AR image by a receiver 200.

The receiver 200 captures a transmitter 100 configured, for example, as a toy wand. This transmitter 100 includes a light source, and the light source changes in luminance to transmit a light ID.

Through the imaging, the receiver 200 periodically obtains a captured display image Ppre and an image for decoding Pdec. Then, while displaying the periodically obtained captured display image Ppre on a display 201, the receiver 200 decodes the image for decoding Pdec to obtain the light ID. Next, the receiver 200 transmits the light ID to a server 300. Upon receipt of the light ID, the server 300 transmits, to the receiver 200, an AR image P30 and recognition information associated with the light ID.

Here, the recognition information further includes gesture information indicating a gesture (that is, operation) of a person who grasps the transmitter 100. The gesture information indicates, for example, a gesture of the person moving the transmitter 100 from right to left. The receiver 200 compares the gesture made by the person who grasps the transmitter 100 shown on each captured display image Ppre with the gesture indicated by the gesture information. Then, if these gestures agree with each other, for example, the receiver 200 superimposes a lot of star-shaped AR images P30 on the captured display image Ppre such that the AR images P30 are arranged along a locus of the transmitter 100 moving by the gesture.

FIG. 300 is a diagram illustrating an example of superimposition of an AR image by a receiver 200.

As in the above-described case, the receiver 200 captures a transmitter 100 configured, for example, as a toy wand.

By capturing the transmitter 100, the receiver 200 periodically obtains a captured display image Ppre and an image for decoding Pdec. Then, while displaying the periodically obtained captured display image Ppre on a display 201, the receiver 200 decodes the image for decoding Pdec to obtain the light ID. Next, the receiver 200 transmits the light ID to a server 300. Upon receipt of the light ID, the server 300 transmits, to the receiver 200, an AR image P31 and recognition information associated with the light ID.

Here, as in the above-described case, the recognition information includes gesture information indicating a gesture of a person who grasps the transmitter 100. The gesture information indicates, for example, a gesture of the person moving the transmitter 100 from right to left. The receiver 200 compares the gesture made by the person who grasps the transmitter 100 shown on each captured display image Ppre with the gesture indicated by the gesture information. Then, if these gestures agree with each other, for example, in the captured display image Ppre, the receiver 200 superimposes an AR image P31 indicating a dress costume on a target region that is a region in which the person who grasps the transmitter 100 is shown.

Thus, in the display method in this variation, gesture information corresponding to a light ID is obtained from a server. Next, it is determined whether movement of a subject indicated in periodically obtained captured display images agrees with movement indicated by gesture information obtained from the server. Then, if it is determined that the two movements agree with each other, a captured display image Ppre in which an AR image is superimposed is displayed.

This enables, for example, the AR image to be displayed in response to movement of a subject such as a person. That is, the AR image can be displayed at appropriate timing.

FIG. 301 is a diagram illustrating an example of an image for decoding Pdec obtained according to an orientation of a receiver 200.

For example, as illustrated in (a) of FIG. 301, the receiver 200 captures, in a landscape orientation, a transmitter 100 that transmits a light ID by luminance change. Note that the landscape orientation is an orientation in which a longitudinal direction of a display 201 of the receiver 200 is along a horizontal direction. Each exposure line of an image sensor included in the receiver 200 is orthogonal to the longitudinal direction of the display 201. An image for decoding Pdec including a bright line pattern region X with few bright lines is obtained through imaging described above. This bright line pattern region X in the image for decoding Pdec includes few bright lines. In other words, the bright line pattern region X includes few sections in which luminance changes to High or Low. Therefore, the receiver 200 may be unable to obtain a light ID appropriately by decoding the image for decoding Pdec.

Therefore, for example, as illustrated in (b) of FIG. 301, a user changes the orientation of the receiver 200 from landscape to portrait. Note that the portrait orientation is an orientation in which the longitudinal direction of the display 201 of the receiver 200 is along a vertical direction. When the receiver 200 in such an orientation captures the transmitter 100 that transmits the light ID, the receiver 200 can obtain the image for decoding Pdec including a bright line pattern region Y with a lot of bright lines.

Thus, since the light ID cannot be appropriately obtained in some cases depending on the orientation of the receiver 200, when the receiver 200 obtains the light ID, the orientation of the receiver 200 that is performing imaging is preferably changed as needed. When the orientation is changed, the receiver 200 can appropriately obtain the light ID at timing when the receiver 200 assumes an orientation easy to obtain the light ID.

FIG. 302 is a diagram illustrating another example of an image for decoding Pdec obtained according to an orientation of a receiver 200.

For example, a transmitter 100 is configured as a digital signage of a coffee shop, displays video regarding an advertisement of the coffee shop in a video display period, and transmits a light ID by luminance change in a light ID transmission period. That is, the transmitter 100 repeatedly and alternately executes display of video in the video display period and transmission of the light ID in the light ID transmission period.

The receiver 200 periodically obtains a captured display image Ppre and an image for decoding Pdec by capturing the transmitter 100. At this time, the image for decoding Pdec including the bright line pattern region may not be obtained by synchronization between a repetition cycle of the video display period of the transmitter 100 and the light ID transmission period, and a repetition cycle of obtainment of the captured display image Ppre and the image for decoding Pdec by the receiver 200. Furthermore, the image for decoding Pdec including the bright line pattern region may not be obtained depending on the orientation of the receiver 200.

For example, the receiver 200 captures the transmitter 100 in an orientation as illustrated in (a) of FIG. 302. That is, the receiver 200 approaches the transmitter 100 and captures the transmitter 100 such that an image of the transmitter 100 is projected on an entire image sensor of the receiver 200.

Here, when timing at which the receiver 200 obtains the captured display image Ppre is within the video display period of the transmitter 100, the receiver 200 appropriately obtains the captured display image Ppre in which the transmitter 100 is shown.

Even if timing at which the receiver 200 obtains the image for decoding Pdec extends over the video display period and the light ID transmission period of the transmitter 100, the receiver 200 can obtain the image for decoding Pdec including the bright line pattern region Z1.

That is, exposure of exposure lines included in the image sensor is sequentially started downward from an exposure line at a vertical upper end. Therefore, even if the receiver 200 starts exposure of the image sensor in the video display period in order to obtain the image for decoding Pdec, the receiver 200 cannot obtain the bright line pattern region. However, when the video display period switches to the light ID transmission period, the receiver 200 can obtain the bright line pattern region corresponding to each exposure line where exposure is performed in the light ID transmission period.

Here, the receiver 200 captures the transmitter 100 in an orientation as illustrated in (b) of FIG. 302. That is, the receiver 200 that is distant from the transmitter 100 captures the transmitter 100 such that an image of the transmitter 100 is projected only on an upper region of the image sensor of the receiver 200. At this time, as in the above-described case, when the timing at which the receiver 200 obtains the captured display image Ppre is within the video display period of the transmitter 100, the receiver 200 appropriately obtains the captured display image Ppre in which the transmitter 100 is shown. However, when the timing at which the receiver 200 obtains the image for decoding Pdec extends over the video display period and the light ID transmission period of the transmitter 100, the receiver 200 may not be able to obtain the image for decoding Pdec including the bright line pattern region. That is, even if the video display period of the transmitter 100 switches to the light ID transmission period, the image of the transmitter 100 that changes in luminance may not be projected on each exposure line that is on a lower region of the image sensor in which exposure is performed in the light ID transmission period. Therefore, the receiver 200 cannot obtain the image for decoding Pdec including the bright line pattern region.

Meanwhile, as illustrated in (c) of FIG. 302, the receiver 200, which is distant from the transmitter 100, captures the transmitter 100 such that the image of the transmitter 100 is projected only on a lower region of the image sensor of the receiver 200. At this time, as in the above-described case, when the timing at which the receiver 200 obtains the captured display image Ppre is within the video display period of the transmitter 100, the receiver 200 appropriately obtains the captured display image Ppre in which the transmitter 100 is shown. Furthermore, even if the timing at which the receiver 200 obtains the image for decoding Pdec extends over the video display period and the light ID transmission period of the transmitter 100, the receiver 200 may be able to obtain the image for decoding Pdec including the bright line pattern region. That is, when the video display period of the transmitter 100 switches to the light ID transmission period, the image of the transmitter 100 that changes in luminance is projected on each exposure line that is on a lower region of the image sensor in which exposure is performed in the light ID transmission period. Therefore, the receiver 200 can obtain the image for decoding Pdec including the bright line pattern region Z2.

Thus, since the light ID cannot be appropriately obtained in some cases depending on the orientation of the receiver 200, the receiver 200 may prompt a user to change the orientation of the receiver 200 when obtaining the light ID. That is, when imaging is started, the receiver 200 performs display or sound output of a message, for example, "move" or "shake" such that the orientation of the receiver 200 changes. With this operation, the receiver 200, which performs imaging while changing the orientation, can obtain the light ID appropriately.

FIG. 303 is a flowchart illustrating an example of processing operation of a receiver 200.

For example, the receiver 200 determines whether the receiver 200 is being shaken while imaging (Step S461). Specifically, the receiver 200 determines whether the receiver 200 is being shaken based on output of a 9-axis sensor included in the receiver 200. Upon determination here that the receiver 200 is being shaken during imaging (Step S461: Y), the receiver 200 increases the above-described light ID obtainment rate (Step S462). Specifically, the receiver 200 obtains all captured images per unit time obtained during imaging as images for decoding (that is, bright line images) Pdec, and the receiver 200 decodes each of all the obtained images for decoding. Alternatively, when all the captured images are obtained as captured display images Ppre, that is, when obtaining and decoding the images for decoding Pdec are stopped, the receiver 200 starts the obtaining and decoding.

On the other hand, upon determination that the receiver 200 is not being shaken during imaging (Step S461: N), the receiver 200 obtains the images for decoding Pdec at the low light ID obtainment rate (Step S463). Specifically, when the light ID obtainment rate is increased in Step S462 and is currently still high, since the current light ID obtainment rate is high, the receiver 200 decreases the light ID obtainment rate. This leads to reduction in a frequency at which the receiver 200 performs decoding processing on the images for decoding Pdec, and thus to reduction in power consumption.

Then, the receiver 200 determines whether a termination condition for terminating adjustment processing of the light ID obtainment rate is satisfied (Step S464). Upon determination that the termination condition is not satisfied (Step S464: N), the receiver 200 repeatedly executes processing from Step S461. On the other hand, upon determination that the termination condition is satisfied (Step S464: Y), the receiver 200 ends the adjustment processing of the light ID obtainment rate.

FIG. 304 is a diagram illustrating an example of switching processing of camera lenses by a receiver 200.

The receiver 200 may include a wide-angle lens 211 and a telephoto lens 212 as camera lenses. A captured image obtained by imaging using the wide-angle lens 211 is an image with a wide angle of view, and a subject is shown small in the image. Meanwhile, a captured image obtained by imaging using the telephoto lens 212 is an image with a narrow angle of view, and the subject is shown large in the image.

While performing imaging, the receiver 200 described above may switch the camera lens to be used for imaging by any one of methods A to E illustrated in FIG. 304.

In the method A, in the case of both normal imaging and receiving a light ID, the receiver 200 always uses the telephoto lens 212 for imaging. Here, the case of normal imaging is a case where all captured images are obtained through imaging as captured display images Ppre. The case of receiving a light ID is a case where captured display images Ppre and images for decoding Pdec are periodically obtained through imaging.

In the method B, in the case of normal imaging, the receiver 200 uses the wide-angle lens 211. Meanwhile, in the case of receiving a light ID, the receiver 200 uses the wide-angle lens 211 first. When a bright line pattern region is included in the image for decoding Pdec obtained when the wide-angle lens 211 is used, the receiver 200 switches the camera lens from the wide-angle lens 211 to the telephoto lens 212. After this switching, the receiver 200 can obtain the image for decoding Pdec with a narrow angle of view, that is, the image for decoding Pdec with the large bright line pattern region being shown.

In the method C, in the case of normal imaging, the receiver 200 uses the wide-angle lens 211. Meanwhile, in the case of receiving a light ID, the receiver 200 switches the camera lens between the wide-angle lens 211 and the telephoto lens 212. That is, the receiver 200 uses the wide-angle lens 211 to obtain the captured display image Ppre, whereas the receiver 200 uses the telephoto lens 212 to obtain the image for decoding Pdec.

In the method D, in the case of both normal imaging and receiving a light ID, the receiver 200 switches the camera lens between the wide-angle lens 211 and the telephoto lens 212 in response to user operation.

In the method E, in the case of receiving a light ID, the receiver 200 decodes the image for decoding Pdec obtained using the wide-angle lens 211. If the image for decoding Pdec is not decoded correctly, the receiver 200 switches the camera lens from the wide-angle lens 211 to the telephoto lens 212. Alternatively, the receiver 200 decodes the image for decoding Pdec obtained using the telephoto lens 212. If the image for decoding Pdec is not decoded correctly, the receiver 200 switches the camera lens from the telephoto lens 212 to the wide-angle lens 211. Note that when determining whether the image for decoding Pdec is decoded correctly, the receiver 200 first transmits, to the server, the light ID obtained by decoding the image for decoding Pdec. When the obtained light ID agrees with a light ID registered with the server, the server notifies the receiver 200 of agreement information indicating that the two light IDs agree with each other. When the obtained light ID does not agree with the light ID registered with the server, the server notifies the receiver 200 of disagreement information indicating that the two light IDs do not agree with each other. When information notified from the server is the agreement information, the receiver 200 determines that the image for decoding Pdec is decoded correctly. When the information notified from the server is the disagreement information, the receiver 200 determines that the image for decoding Pdec is not decoded correctly. Alternatively, in the case where the light ID obtained by decoding the image for decoding Pdec satisfies a condition determined in advance, the receiver 200 determines that the image for decoding Pdec is decoded correctly. On the other hand, in the case where the light ID does not satisfy the condition, the receiver 200 determines that the image for decoding Pdec is not decoded correctly.

Switching the camera lens in this way allows the appropriate image for decoding Pdec to be obtained.

FIG. 305 is a diagram illustrating an example of switching processing of cameras by a receiver 200.

For example, the receiver 200 includes an in-camera 213 and an out-camera (not illustrated in FIG. 305) as cameras. The in-camera 213 is also referred to as a face camera or a selfie camera, and is a camera placed on the same surface as a display 201 in the receiver 200. The out-camera is a camera disposed on a surface opposite to the surface of the display 201 in the receiver 200.

With the in-camera 213 directed upward, such a receiver 200 captures, by the in-camera 213, a transmitter 100 configured as an illumination device. Through this imaging, the receiver 200 obtains an image for decoding Pdec, and decodes the image for decoding Pdec to obtain a light ID transmitted from the transmitter 100.

Next, the receiver 200 transmits the obtained light ID to a server to obtain, from the server, an AR image and recognition information associated with the light ID. The receiver 200 starts processing for recognizing a target region corresponding to the recognition information from among captured display images Ppre obtained by the out-camera and the in-camera 213. Here, in the case where the receiver 200 cannot recognize the target region from the captured display images Ppre obtained by the out-camera and the in-camera 213, the receiver 200 prompts a user to move the receiver 200. The user prompted by the receiver 200 moves the receiver 200. Specifically, the user moves the receiver 200 such that the in-camera 213 and the out-camera are turned to directions of rear and front of the user, respectively. As a result, the receiver 200 recognizes the target region from the captured display image Ppre obtained by the out-camera. That is, the receiver 200 recognizes a region in which a person is shown as a target region, superimposes an AR image on the target region in the captured display image Ppre, and displays the captured display image Ppre on which the AR image is superimposed.

FIG. 306 is a flowchart illustrating an example of processing operation of a receiver 200 and a server.

The receiver 200 captures a transmitter 100, which is an illumination device, by an in-camera 213 to obtain a light ID transmitted from the transmitter 100, and then transmits the light ID to a server (Step S471). The server receives the light ID from the receiver 200 (Step S472), and estimates a position of the receiver 200 based on the light ID (Step S473). For example, for each light ID, the server has stored a table indicating a room, a building, space or the like in which the transmitter 100 transmitting the light ID is placed. Then, in the table, the server estimates the room or the like associated with the light ID transmitted from the receiver 200 as the position of the receiver 200. Furthermore, the server transmits an AR image and recognition information associated with the estimated position to the receiver 200 (Step S474).

The receiver 200 obtains the AR image and the recognition information transmitted from the server (Step S475). Here, the receiver 200 starts processing for recognizing a target region corresponding to the recognition information from captured display images Ppre obtained by the out-camera and the in-camera 213. Then, for example, the receiver 200 recognizes the target region from the captured display image Ppre obtained by the out-camera (Step S476). The receiver 200 superimposes the AR image on the target region in the captured display image Ppre, and then displays the captured display image Ppre on which the AR image is superimposed (Step S477).

Note that in the above example, when the receiver 200 obtains the AR image and the recognition information transmitted from the server, in Step S476, the receiver 200 has started processing for recognizing the target region from the captured display images Ppre obtained by the out-camera and the in-camera 213. However, in Step S476, the receiver 200 may start processing for recognizing the target region from the captured display image Ppre obtained by only the out-camera. In other words, the camera for obtaining the light ID (in-camera 213 in the above example) may always differ from the camera for obtaining the captured display image Ppre on which the AR image is superimposed (out-camera in the above example).

While the receiver 200 has captured the transmitter 100, which is an illumination device, by the in-camera 213 in the above example, the receiver 200 may capture a floor illuminated by the transmitter 100 by the out-camera. Even through such imaging by the out-camera, the receiver 200 can obtain the light ID transmitted from the transmitter 100.

FIG. 307 is a diagram illustrating an example of superimposition of an AR image by a receiver 200.

The receiver 200 captures a transmitter 100 configured, for example, as a microwave oven installed in a store such as a convenience store. This transmitter 100 includes a camera for capturing the interior of the microwave oven and an illumination device that illuminates the interior of the microwave oven. The transmitter 100 recognizes food and drink (that is, an object to be heated) put in the interior through imaging by the camera. When heating the food and drink, the transmitter 100 causes the illumination device to emit light and changes luminance of the illumination device to transmit a light ID indicating the recognized food and drink. Note that while this illumination device illuminates the interior of the microwave oven, the light of the illumination device is emitted outside from a transparent window of the microwave oven. Therefore, the light ID is transmitted outside the microwave oven through the window of the microwave oven from the illumination device.

Here, a user purchases food and drink at a convenience store, and in order to heat the food and drink, the user puts the food and drink in the transmitter 100, which is a microwave oven. At this time, the transmitter 100 recognize the food and drink by the camera, and starts heating the food and drink while transmitting the light ID indicating the recognized food and drink.

The receiver 200, by capturing the transmitter 100 that has started heating, obtains the light ID transmitted from the transmitter 100, and then transmits the light ID to a server. Next, the receiver 200 obtains, from the server, an AR image, sound data, and recognition information associated with the light ID.

The AR image includes an AR image P32*a*, which is video indicating a virtual state within the transmitter 100, an AR image P32*b* indicating in detail the food and drink put in the interior, an AR image P32*c* indicating by video steam coming out of the transmitter 100, and an AR image P32*d* indicating by video residual time to completion of heating the food and drink.

For example, the AR image P32*a* is video in which when the food and drink put in the interior of the microwave oven is a pizza, a turntable is rotating on which the pizza is placed, and a plurality of dwarfs is dancing around the pizza. The AR image P32*b* is, for example, when the food and drink put in the interior is a pizza, an image indicating a product name "pizza" and materials of the pizza.

Based on the recognition information, the receiver 200 recognizes a region in which the window of the transmitter 100 is shown in the captured display image Ppre as a target region for the AR image P32*a*. The receiver 200 then superimposes the AR image P32*a* on the target region. Furthermore, based on the recognition information, the receiver 200 recognizes a region above the region in which the transmitter 100 is shown in the captured display image Ppre as a target region for the AR image P32*b*. The receiver 200 then superimposes the AR image P32*b* on the target region. Furthermore, based on the recognition information, the receiver 200 recognizes, as a target region for the AR image P32*c*, a region between the target region for the AR image P32*a* and the target region for the AR image P32*b* in the captured display image Ppre. The receiver 200 then superimposes the AR image P32*c* on the target region. Furthermore, based on the recognition information, the receiver 200 recognizes a region below the region in which the transmitter 100 is shown in the captured display image Ppre as a target region for the AR image P32*d*. The receiver 200 then superimposes the AR image P32*d* on the target region.

Furthermore, the receiver 200 reproduces the sound data to output sound made when the food and drink is heated.

Since the AR images P32*a* to P32*d* described above are displayed and the sound is further output by the receiver 200, user's interest can be attracted to the receiver 200 until heating of the food and drink is completed. As a result, burden of the user waiting for completion of heating can be reduced. Since the AR image P32*c* indicating steam or the like is displayed and the sound made when the food and drink is heated is output, sizzling feeling can be provided to the user. Also, display of the AR image P32*d* allows the user to easily know the residual time to completion of heating the food and drink. Therefore, until heating is completed, for example, the user can read a book or the like displayed apart from the transmitter 100, which is a microwave oven, within the store. Also, when the residual time becomes 0, the receiver 200 may notify the user that heating is completed.

Note that in the above example, the AR image P32*a* has been video in which a turntable is rotating on which the pizza is placed, and a plurality of dwarfs is dancing around the pizza. However, the AR image P32*a* may be, for example, an image virtually indicating interior temperature distribution. The AR image P32*b* has been an image indicating the product name and material of food and drink put in the interior; however, the AR image P32*b* may be an image indicating nutritional information or calories. Alternatively, the AR image P32*b* may be an image indicating a discount coupon.

Thus, in the display method in this variation, a subject is a microwave oven including an illumination device, and the illumination device illuminates the interior of the microwave oven and changes in luminance to transmit a light ID outside the microwave oven. Then, in obtainment of a captured display image Ppre and an image for decoding Pdec, the captured display image Ppre and the image for decoding Pdec are obtained by capturing the microwave oven transmitting the light ID. In recognition of the target region, a window of the microwave oven shown in the captured display image Ppre is recognized as a target region. In display of the captured display image Ppre, the captured display image Ppre is displayed on which the AR image indicating state change in the interior is superimposed.

With this operation, since the state change in the interior of the microwave oven is displayed as an AR image, the state in the interior can be plainly informed to a user of the microwave oven.

FIG. 308 is a sequence diagram illustrating processing operation of a system including a receiver 200, a microwave oven, a relay server, and an electronic payment server. Note that as in the above-described case, the microwave oven includes a camera and an illumination device, and the microwave oven changes luminance of the illumination device to transmit a light ID. That is, the microwave oven has a function as a transmitter 100.

First, the microwave oven recognizes, by the camera, food and drink put in the interior (Step S481). Next, the microwave oven transmits the light ID indicating the recognized food and drink to the receiver 200 by luminance change of the illumination device.

The receiver 200 captures the microwave oven to receive the light ID transmitted from the microwave oven (Step S483), and transmits the light ID and card information to the relay server. The card information is information on a credit card or the like stored in advance in the receiver 200. The card information is information necessary for electronic payment.

The relay server, for each light ID, holds a table indicating an AR image, recognition information, and product information corresponding to the light ID. This product information indicates price or the like of the food and drink indicated by the light ID. When such a relay server receives the light ID and the card information transmitted from the receiver 200 (Step S485), the relay server finds out the product information associated with the light ID from the table. Then, the relay server transmits the product information and the card information to the electronic payment server (Step S486). When the electronic payment server receives the product information and the card information transmitted from the relay server (Step S487), based on the product information and the card information, the electronic payment server performs electronic payment processing (Step S488). Then, when the electronic payment processing is completed, the electronic payment server notifies the relay server of the completion (Step S489).

When the relay server checks the notification of the payment completion from the electronic payment server (Step S490), the relay server instructs the microwave oven to start heating the food and drink (Step S491). Furthermore, in the table, the relay server transmits the AR image and the recognition information associated with the light ID received in Step S485 to the receiver 200 (Step S493).

When the microwave oven receives, from the relay server, the instruction to start heating, the microwave oven starts heating of the food and drink put in the interior (Step S492). When the receiver 200 receives the AR image and the recognition information transmitted from the relay server, the receiver 200 recognizes a target region corresponding to the recognition information from a captured display image Ppre periodically obtained through imaging started from Step S483. Then, the receiver 200 superimposes the AR image on the target region (Step S494).

With this operation, after putting the food and drink in the interior of the microwave oven and capturing the food and drink, a user of the receiver 200 can easily finish payment and start heating the food and drink. Also, this can prohibit the user from heating food and drink in the case where payment cannot be made. Furthermore, when heating is started, for example, the AR image P32*a* illustrated in FIG. 307 can be displayed, and the user can be notified of the state in the interior.

FIG. 309 is a sequence diagram illustrating processing operation of a system including a point-of-sale (POS) terminal, a server, a receiver 200, and a microwave oven. Note that as in the above-described case, the microwave oven includes a camera and an illumination device, and changes luminance of the illumination device to transmit a light ID. That is, the microwave oven has a function as a transmitter 100. The POS terminal is a terminal installed in the same store as the microwave oven, such as a convenience store.

First, a user of the receiver 200 chooses food and drink, which is a product, at a store, and goes to a place where the POS terminal is installed in order to purchase the food and drink. A salesclerk of the store operates the POS terminal and receives price for the food and drink from the user. Through operation of the POS terminal by this salesclerk, the POS terminal obtains operational input data and sales information (Step S501). The sales information indicates, for example, a name, number, and price of the product, place of sale, and date and time of sale. The operational input data indicates, for example, user's gender, age, and the like input by the salesclerk. The POS terminal transmits the operational input data and the sales information to the server (Step S502). The server receives the operational input data and the sales information transmitted from the POS terminal (Step S503).

Meanwhile, the user of the receiver 200 pays the salesclerk price for the food and drink, and then puts the food and drink in the interior of the microwave oven in order to heat the food and drink. The microwave oven recognizes, by the camera, the food and drink put in the interior (Step S504). Next, the microwave oven transmits the light ID indicating the recognized food and drink to the receiver 200 by luminance change of the illumination device (Step S505). Then, the microwave oven starts heating the food and drink (Step S507).

The receiver 200 captures the microwave oven to receive the light ID transmitted from the microwave oven (Step S508). The receiver 200 then transmits the light ID and terminal information to the server (Step S509). The terminal information is information stored in advance in the receiver 200, and indicates, for example, a type of language displayed on a display 201 of the receiver 200 (e.g., English or Japanese).

The server is accessed from the receiver 200. When the server receives the light ID and the terminal information transmitted from the receiver 200, the server determines whether the access from the receiver 200 is first access (Step S510). The first access is access first made within predetermined time since processing of Step S503 is performed. When the server determines here that the access from the receiver 200 is first access (Step S510: Y), the server associates the operational input data with the terminal information, and stores the operational input data and the terminal information (Step S511).

Note that while the server has determined whether the access from the receiver 200 is first access, the server may determine whether a product indicated by the sales information agrees with the food and drink indicated by the light ID. In Step S511, the server may associate not only the operational input data with the terminal information, but also the server may associate the sales information with the operational input data and the terminal information, and may store resultant information.

Indoor Use

FIG. 310 is a diagram illustrating indoor use, such as use in an underground shopping center.

A receiver 200 receives a light ID transmitted from a transmitter 100 configured as an illumination device, and then estimates a current position of the receiver 200. Also, the receiver 200 displays the current position on a map and acts as a guide, or displays information on neighboring stores.

Since the transmitter 100 transmits disaster information and evacuation information in case of emergency, these pieces of information can be obtained even if communication is congested, a communication base station fails, or the receiver 200 is located in a place where an electromagnetic wave from the communication base station does not reach. This is effective in the case where emergency broadcast is missed or for a hearing-impaired person who cannot hear emergency broadcast.

That is, through imaging, the receiver 200 obtains the light ID transmitted from the transmitter 100, and further obtains, from a server, an AR image P33 and recognition information associated with the light ID. Then, the receiver 200 recognizes a target region corresponding to the recognition information in the captured display image Ppre obtained through the imaging described above. The receiver 200 then superimposes the arrow-shaped AR image P33 on the target region. This allows the receiver 200 to be used as the above-described Way Finder (refer to FIG. 294).

Display of Augmented Reality Object

FIG. 311 is a diagram illustrating how an augmented reality object is displayed.

A stage 2718*e* on which augmented reality is displayed is configured as the transmitter 100. The stage 2718*e* transmits information on the augmented reality object and a reference position at which the augmented reality object is displayed in light-emitting patterns and positional patterns of light-emitting sections 2718*a*, 2718*b*, 2718*c*, and 2718*d*.

Based on the received information, the receiver 200 superimposes an augmented reality object 2718*f*, which is an AR image, on a captured image, and displays the resultant image.

These general and specific aspects may be implemented using an apparatus, a system, a method, an integrated circuit, a computer program, or a computer-readable recording medium such as a CD-ROM, or any combination of apparatuses, systems, methods, integrated circuits, computer programs, or computer-readable recording media. Also, these general and specific aspects may be implemented in an aspect in which a computer program that executes a method according to an embodiment is stored in a recording medium of a server, and is distributed to a terminal from the server in response to a request from the terminal.

The display method of the present disclosure produces advantageous effects of displaying images valuable to a user, and can be used, for example, for a display device such as a smart phone, a glass, or a tablet.

What is claimed is:

1. A display method for displaying an image on a display device, the display method comprising:

obtaining a first image and a second image which includes light identification information by capturing a subject using an image sensor, the subject transmitting the light identification information by change in luminance;

decoding the second image to obtain the light identification information;

transmitting the light identification information to a server;

a plurality of sets of (i) an augmented reality image, (ii) recognition information, and (iii) identification information being stored in the server, out of the plurality of sets, obtaining, from the server, the augmented reality image and the recognition information included in each of the sets including the identification information that corresponds to the light identification information;

recognizing a target region in the first image using the obtained recognition information; and displaying the first display image with the obtained augmented reality image superimposed on the recognized target region, wherein:

the recognition information includes:

reference information for specifying a reference region in the first image; and target information indicating a relative position of the target region with respect to the reference region, and the recognizing of the target region includes:

specifying the reference region from the first image by matching the reference information and the first image; and recognizing the target region in the first image at the relative position from the reference region using the target information.

2. The display method according to claim 1, wherein the first image and the second image are obtained alternatively.

3. The display method according to claim 2, wherein a first exposure time of the image sensor to obtain the first image is longer than a second exposure time of the image sensor to obtain the second time in the obtaining of the first image and the second image, a plurality of bright lines appear in the second image by exposure of a plurality of exposure lines included in the image sensor using the second exposure time, the plurality of bright lines do not appear in the first image using the first exposure time.

4. The display method according to claim 3, wherein the reference information indicates that the position of the reference region in the first image is identical to a position of a bright line pattern region including the plurality of bright lines in the second image.

5. The display method according to claim 1, wherein the reference information indicates that the reference region in the first image is a region in which a display is shown in the first image.

6. The display method according to claim 5, wherein the reference region is an outer frame portion with predetermined color in an image displayed on the display.

7. The display method according to claim 1, wherein the displaying of the first image includes displaying a first augmented reality image, which is the augmented reality image, for a display period determined in advance while inhibiting display of a second augmented reality image different from the first augmented reality image.

8. The display method according to claim 7, wherein the displaying of the first image includes prohibiting decoding a new identification information in the display period.

9. The display method according to claim 8, wherein the displaying of the first image further includes:

measuring an acceleration level of the display device by an acceleration sensor which is included in the display device in the display period;

determining whether the measured acceleration level is equal to or greater than a threshold; and when it is determined that the measured acceleration level is equal to or greater than the threshold, displaying the second augmented reality image instead of the first augmented reality image by canceling the inhibition of the display of the second augmented reality image.

10. The display method according to claim 1, wherein the displaying of the first image further includes:

determining whether a face of a user is approaching the display device using a face camera included in the display device; and when it is determined that the face is approaching, displaying a first augmented reality image which is the augmented reality image while inhibiting display of a second augmented reality image different from the first augmented reality image.

11. The display method according to claim 1, wherein the displaying of the first image further includes:

determining whether a face of a user is approaching the display device with an acceleration level of the display device measured by an acceleration sensor which is included in the display device; and when it is determined that the face is approaching, displaying a first augmented reality image which is the augmented reality image while inhibiting display of a second augmented reality image different from the first augmented reality image.

12. The display method according to claim 1, wherein the obtaining obtains the first image and the second image by capturing a plurality of displays that display images as a plurality of subjects, the recognizing recognizes the target region in which one of the plurality of displays is shown, the one of the plurality of displays transmitting the light identification information, and displaying the first image includes:

superimposing, on the target region, a first subtitle corresponding to an image displayed on the one of the plurality of displays as the augmented reality image; and further superimposing a second subtitle that is a subtitle obtained by enlarging the first subtitle on a region larger than the target region in the first image.

13. The display method according to claim 12, wherein the displaying of the first image further includes:

determining whether sound information is included in information obtained from the server; and when it is determined that the sound information is included, outputting sound indicated by the sound information with priority over the first and second subtitles.

14. An apparatus comprising:

an image sensor that obtains a first image and a second image by capturing a subject, the subject transmitting light identification information by change in luminance;

a processor; and a memory storing thereon a computer program, which when executed by the processor, causes the processor to perform operations including:

decoding the second image to obtain the light identification information;

transmitting the light identification information to a server;

a plurality of sets of (i) an augmented reality image, (ii) recognition information, and (iii) identification information being stored in the server, out of the plurality of sets, obtaining, from the server, the augmented reality image and the recognition information included in each of the sets including the identification information that corresponds to the light identification information;

recognizing a target region using the recognition information; and displaying the first image with the augmented reality image superimposed on the target region, wherein:

the recognition information includes:

reference information for specifying a reference region in the first image; and target information indicating a relative position of the target region with respect to the reference region, and the recognizing of the target region includes:

specifying the reference region from the first image by matching the reference information and the first image; and recognizing the target region in the first image at the relative position from the reference region using the target information.

15. A non-transitory recording medium storing thereon a computer program, which when executed by a processor, causes the processor to perform operations including:

obtaining a first image and a second image by capturing a subject using an image sensor, the subject transmitting light identification information by change in luminance;

decoding the second image to obtain light identification information;

transmitting the light identification information to a server;

a plurality of sets of (i) an augmented reality image, (ii) recognition information, and (iii) identification information being stored in the server, out of the plurality of sets, obtaining, from the server, the augmented reality image and the recognition information included in each of the sets including the identification information that corresponds to the light identification information;

recognizing a target region using the recognition information; and displaying, on a display, the first image with the augmented reality image superimposed on the target region, wherein:

the recognition information includes:

reference information for specifying a reference region in the first image; and target information indicating a relative position of the target region with respect to the reference region, and the recognizing of the target region includes:

specifying the reference region from the first image by matching the reference information and the first image; and recognizing the target region in the first image at the relative position from the reference region using the target information.

* * * * *